US010965323B2

(12) United States Patent
Shinohara et al.

(10) Patent No.: US 10,965,323 B2
(45) **Date of Patent: *Mar. 30, 2021**

(54) TRANSMISSION METHOD AND RECEPTION DEVICE

(71) Applicant: SONY CORPORATION, Tokyo (JP)

(72) Inventors: Yuji Shinohara, Kanagawa (JP); Makiko Yamamoto, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/475,557

(22) PCT Filed: Feb. 6, 2018

(86) PCT No.: PCT/JP2018/003901

§ 371 (c)(1),
(2) Date: Jul. 2, 2019

(87) PCT Pub. No.: WO2018/150939

PCT Pub. Date: Aug. 23, 2018

(65) Prior Publication Data

US 2020/0036394 A1 Jan. 30, 2020

(30) Foreign Application Priority Data

Feb. 20, 2017 (JP) ............................ JP2017-028568
Mar. 23, 2017 (JP) ............................ JP2017-056767

(51) Int. Cl.
*G06F 11/10* (2006.01)
*G11C 29/52* (2006.01)
(Continued)

(52) U.S. Cl.
CPC ..... *H03M 13/271* (2013.01); *H03M 13/1165* (2013.01); *H03M 13/1185* (2013.01);
(Continued)

(58) Field of Classification Search
CPC ........... H03M 13/152; H03M 13/2778; H03M 13/116; H03M 13/2906; H03M 13/616;
(Continued)

(56) References Cited

U.S. PATENT DOCUMENTS 8,972,824 B1 3/2015 Northcott et al.
2004/0204804 A1 10/2004 Lee et al.
(Continued)

FOREIGN PATENT DOCUMENTS

CA 2973181 A1 7/2016
EP 3148090 A1 3/2017
(Continued)

OTHER PUBLICATIONS

"Digital Video Broadcasting (DVB); Frame Structure Channel Coding and Modulation for a Second Generation Digital Terrestrial Television Broadcasting System (DVB-T2)", ETSI EN 302 755 V1.3.1, Apr. 2012, 18 pages.
(Continued)

*Primary Examiner* — Guy J Lamarre
(74) *Attorney, Agent, or Firm* — Chip Law Group

(57) ABSTRACT

The present technology relates to a transmission method and a reception device capable of ensuring good communication quality in data transmission by using an LDPC code. In group-wise interleaving, an LDPC code with a code length N of 69120 bits is interleaved in units of bit groups of 360 bits. In group-wise deinterleaving, an arrangement of the LDPC code after the group-wise interleaving is returned to an original arrangement. The present technology can be applied, for example, to the case of performing data transmission by using an LDPC code or the like.

14 Claims, 201 Drawing Sheets

(51) Int. Cl.

| | |
|---|---|
| ***G11C 29/04*** | (2006.01) |
| ***H04L 1/00*** | (2006.01) |
| ***H03M 13/00*** | (2006.01) |
| ***H03M 13/11*** | (2006.01) |
| ***G06F 9/30*** | (2018.01) |
| ***H03M 13/27*** | (2006.01) |
| ***H03M 13/25*** | (2006.01) |

(52) U.S. Cl.
CPC ..... *H03M 13/255* (2013.01); *H03M 13/2792* (2013.01); *H03M 13/616* (2013.01)

(58) Field of Classification Search
CPC ......... H03M 13/2792; H03M 13/2707; H03M 13/255; H03M 13/1185; H03M 13/1148; H03M 13/1111; H03M 13/036
See application file for complete search history.

(56) References Cited

U.S. PATENT DOCUMENTS

| | | | | |
|---|---|---|---|---|
| 2016/0164540 | A1 | 6/2016 | Shinohara et al. | |
| 2016/0204804 | A1 | 7/2016 | Ikegaya et al. | |
| 2016/0218824 | A1 | 7/2016 | Kim et al. | |
| 2016/0233889 | A1 | 8/2016 | Shinohara et al. | |
| 2016/0365877 | A1* | 12/2016 | Ikegaya ............ | H03M 13/2906 |
| 2019/0181885 | A1 | 6/2019 | Ikegaya et al. | |
| 2019/0341938 | A1* | 11/2019 | Shinohara .......... | H03M 13/1111 |
| 2019/0349012 | A1* | 11/2019 | Shinohara ......... | H03M 13/2792 |
| 2019/0363736 | A1 | 11/2019 | Shinohara et al. | |
| 2020/0059251 | A1 | 2/2020 | Ikegaya et al. | |
| 2020/0099397 | A1* | 3/2020 | Shinohara ......... | H03M 13/2906 |

FOREIGN PATENT DOCUMENTS

| | | | |
|---|---|---|---|
| EP | 3247043 | A1 | 11/2017 |
| EP | 3584940 | A1 | 12/2019 |
| JP | 2015-130602 | A | 7/2015 |
| JP | 2015-170911 | A | 9/2015 |
| JP | 2018-137709 | A | 8/2018 |
| JP | 6601688 | B2 | 11/2019 |
| KR | 10-2017-0103780 | A | 9/2017 |
| KR | 10-2019-0119040 | A | 10/2019 |
| TW | 201834433 | A | 9/2018 |
| WO | 2015/133321 | A1 | 9/2015 |
| WO | 2015/178216 | A1 | 11/2015 |
| WO | 2016/114156 | A1 | 7/2016 |

OTHER PUBLICATIONS

Kim, et al., "Low-Density Parity-Check Codes for ATSC 3.0", IEEE Transaction on Broadcasting, vol. 62, No. 1, Mar. 2016, pp. 189-196.

International Search Report and Written Opinion of PCT Application No. PCT/JP2018/003901, dated Mar. 20, 2018, 07 pages of ISRWO.

"ATSC Standard: Physical Layer Protocol", Advanced Television Systems Committee, A/322, Sep. 7, 2016, pp. 1-258.

Micheal, et al., "Bit-Interleaved Coded Modulation (BICM) for ATSC 3.0", IEEE Transaction on Broadcasting, vol. 62, No. 1, Mar. 2016, pp. 181-188.

Kim, et al., "Low-Density Parity-Check Codes for ATSC 3.0", IEEE Transaction on Broadcasting, vol. 62, No. 1, Feb. 24, 2016, pp. 189-196.

"Frame structure channel coding and modulation for a second generation digital terrestrial television broadcasting system", Digital Video Broadcasting (DVB-T2), European Standard Telecommunications series, ETSI EN 302 755 V1.3.1, Apr. 2012, 18 pages.

Michael, et al., "Bit-Interleaved Coded Modulation (BICM) for ATSC 3.0",IEEE Transaction on Broadcasting, vol. 62, No. 1, Jan. 14, 2016, pp. 181-188.

Partial European Search Report of EP Application No. 18755111.4, dated Jan. 24, 2020, 22 pages.

"Physical Layer Protocol", Advanced Television Systems Committee (ATSC Standard), Document: A/322:2016, Sep. 7, 2016, 258 pages.

Kim, et al., "Low-Density Parity-Check Codes for ATSC 3.0", IEEE Transactions on Broadcasting, vol. 62, No. 1, Mar. 2016, pp. 189-196.

Extended European Search Report of EP Application No. 18755111.4, dated Jul. 1, 2020, 18 pages.

* cited by examiner

FIG. 3

$$H=\begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 13

NUMBER OF COLUMNS OF EACH COLUMN WEIGHT

| | N=64800 | | | | N=16200 | | | |
|---|---|---|---|---|---|---|---|---|
| Nominal ENCODING RATE | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | - | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | — | — | — | — |

STAIRCASE STRUCTURE OF
PARITY MATRIX

STAIRCASE STRUCTURE PORTION
OF Tanner Graph r1/4 16K 6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

Rate 2/16 N=69120 TYPE-A 1617 1754 1768 2501 6874 12486 12872 16244 18612 19698 21649 30954 33221 33723 34495 37587 38542 41510 42268 52159 59780
206 610 991 2665 4994 5681 12371 17343 25547 26291 26678 27791 27828 32437 33153 35429 39943 45246 46732 53342 60451
119 682 963 3339 6794 7021 7295 8856 8942 10842 11318 14050 14474 27281 28637 29963 37861 42536 43865 48803 59969
175 201 355 5418 7990 10567 10642 12987 16685 18463 21861 24307 25274 27515 39631 40166 43058 47429 55512 55519 59426
117 839 1043 1960 6896 19146 24022 26586 29342 29906 33129 33647 33883 34113 34550 38720 40247 45651 51156 53053 56614
135 236 257 7505 9412 12642 19752 20201 26010 28967 31146 37156 44685 45667 50066 51283 54365 55475 56501 58763 59121
109 840 1573 5523 19968 23924 24644 27064 29410 31276 31526 32173 38175 43570 43722 46655 46660 48353 54025 57319 59818
522 1236 1573 6563 11625 13846 17570 19547 22579 22584 29338 30497 33124 33152 35407 36364 37726 41426 53800 57130
504 1330 1481 13809 15761 20050 26339 27418 29630 32073 33762 34354 36966 43315 47773 47998 48824 50535 53437 55345
348 1244 1492 9626 9655 15638 22727 22971 28357 28841 31523 37543 41100 42372 48983 50354 51434 54574 55031 58193
742 1223 1459 20477 21731 23163 23587 30829 31144 32186 32235 32593 34130 40829 42217 42294 42753 44058 49940 51993
841 860 1534 5878 7083 7113 9658 10508 12871 12964 14023 21055 22680 23927 32701 35168 40986 42139 50708 55350
657 1018 1690 6454 7645 7698 8657 9615 16462 18030 19850 19857 33265 33552 42208 44424 46965 52762 55439 58299
14 511 1376 2586 6797 9409 9599 10784 13076 18509 27363 27667 30262 34043 37043 38143 40246 53811 58872 59250
315 863 1487 2067 7537 8749 10785 11820 15702 20232 22850 23540 30247 41182 44884 50601 52140 55970 57879 58514
256 1442 1534 2342 9734 10789 15334 15356 20334 20433 22923 23521 29391 30553 35406 35643 35701 37968 39541 58097
260 1238 1557 14167 15271 18046 20588 23444 25820 26660 30619 31625 33258 38554 40401 46471 53589 54904 56455 60016
591 885 1463 3411 14043 17083 17372 23029 23365 24691 25527 26389 28621 29999 40343 40359 40394 45685 46209 54887
1119 1411 1664 7879 17732 27000 28506 32237 32445 34100 34926 36470 42848 43126 44117 48780 49519 49592 51901 56580
147 1333 1560 6045 11526 14867 15647 19496 26626 27600 28044 30446 35920 37523 42907 42974 46452 52480 57061 60152
304 591 680 5557 6948 13550 19689 19697 22417 23237 25813 31836 32736 36321 36493 36671 46756 53311 59230 59248
586 777 1018 2393 2817 4057 8068 10632 12430 13193 16433 17344 24526 24902 27693 39301 39776 42300 45215 52149
684 1425 1732 2436 4279 7375 8493 10023 14908 20703 25656 25757 27251 27316 33211 35741 38872 42908 55079 58753
962 981 1773 2814 3799 6243 8163 12655 21226 31370 32506 35372 36697 47037 49095 55400 57506 58743 59678 60422
6229 6484 8795 8981 13576 28622 35526 36922 37284 42155 43443 44080 44446 46649 50824 52987 59033
2742 5176 10231 10336 16729 17273 18474 25875 28227 34891 39826 42595 48600 52542 53023 53372 57331
3512 4163 4725 8375 8585 19795 22844 28615 28649 29481 41484 41657 53255 54222 54229 57258 57647
3358 5239 9423 10858 15636 17937 20678 22427 31220 37069 38770 42079 47256 52442 55152 56964 59169
2243 10090 12309 15437 19426 23065 24872 36192 36336 36949 41387 49915 50155 54338 54422 56561 57984

FIG. 31

Rate 3/16 N=69120 TYPE-A 126 1125 1373 4698 5254 17832 23701 31126 33867 46596 46794 48392 49352 51151 52100 55162
794 1435 1552 4483 14668 16919 21871 36755 42132 43323 46650 47676 50412 53484 54886 55333
698 1356 1519 5555 6877 8407 8414 14248 17811 22998 28378 40695 46542 52817 53284 55968
457 493 1080 2261 4637 5314 9670 11171 12679 29201 35980 43792 44337 47131 49880 55301
467 721 1484 5326 8676 11727 15221 17477 21390 22224 27074 28845 37670 38917 40996 43851
305 389 526 9156 11091 12367 13337 14299 22072 25367 29827 30710 37688 44321 48351 54663
23 342 1426 5889 7362 8213 8512 10655 14549 15486 26010 30403 32196 36341 37705 45137
123 429 485 4093 6933 11291 11639 12558 20096 22292 24696 32438 34615 38061 40659 51577
920 1086 1257 8839 10010 13126 14367 18612 23252 23777 32883 32982 35684 40534 53318 55947
579 937 1593 2549 12702 17659 19393 20047 25145 27792 30322 33311 39737 42052 50294 53363
116 883 1067 9847 10660 12052 18157 20519 21191 24139 27132 27643 30745 33852 37692 37724
915 1154 1698 5197 5249 13741 25043 29802 31354 32707 33804 36856 39887 41245 42065 50240
317 1304 1770 12854 14018 14061 16657 24029 24408 34493 35322 35755 38593 47428 53811 55008
163 216 719 5541 13996 18754 19287 24293 38575 39520 43058 43395 45390 46665 50706 55269
42 415 1326 2553 7963 14878 17850 21757 22166 32986 39076 39267 46154 46790 52877 53780
593 1511 1515 13942 14258 14432 24537 38229 38251 40975 41350 43490 44880 45278 46574 51442
219 262 955 1978 10654 13021 16873 23340 27412 32762 40024 42723 45976 46603 47761 54095
632 944 1598 12924 17942 18478 26487 28036 42462 43513 44487 44584 48245 53274 54343 55453
501 912 1656 2009 6339 15581 20597 26886 32241 34471 37497 43009 45977 46587 46821 51187
610 713 1619 5176 6122 6445 8044 12220 14126 32911 38647 40715 45111 47872 50111 55027
258 445 1137 4517 5846 7644 15604 16606 16969 17622 20691 34589 35808 43692 45126 49527
612 854 1521 13045 14525 15821 21096 23774 24274 25855 26266 27296 30033 40847 44681 46072
714 876 1365 5836 10004 15778 17044 22417 26397 31508 32354 37917 42049 50828 50947 54052
1338 1595 1718 4722 4981 12275 13632 15276 15547 17668 21645 26616 29044 39417 39669 53539
687 721 1054 5918 10421 13356 15941 17657 20704 21564 23649 35798 36475 46109 46414 49845
734 1635 1666 9737 23679 24394 24784 26917 27334 28772 29454 35246 35512 37169 39638 44309
469 918 1212 3912 10712 13084 13906 14000 16602 18040 18697 25940 30677 44811 50590 52018
70 332 496 6421 19082 19665 25460 27377 27378 31086 36629 37104 37236 37771 38622 40678

Rate 4/16 N=69120 TYPE-A 561 825 1718 4745 7515 13041 13466 18039 19065 21821 32596 32708 35323 36399 36450
41124 43036 43218 43363 44875 49948
56 102 1779 2427 5381 8768 15336 26473 35717 38748 39066 45002 50720
694 1150 1533 2177 5801 6610 7601 16657 18949 33472 47746 49581 50668
90 1122 1472 2085 2593 4986 8200 9175 15502 44084 46057 48546 50487
521 619 708 6915 8978 14211 17426 23058 23463 27440 29822 33443 42871
449 912 1471 8058 9344 11928 20533 20600 20737 26557 26970 27616 33791
355 700 1528 6478 9588 10790 20992 33122 34283 41295 43439 46249 47763
997 1543 1679 5874 7973 7975 11113 28275 28812 29864 35070 36864 50676
85 326 1392 4186 10855 11005 12913 19263 22984 31733 33787 37567 48173
986 1144 1508 19864 28918 29117 33609 36452 47975 48432 48842 49274 51533
437 1190 1413 3814 6695 17541 22060 25845 28431 37453 38912 44170 49231
327 1171 1204 6952 11880 16469 25058 28956 31523 36770 40189 43422 46481
123 605 619 8118 8455 19550 20529 21762 21950 28485 30946 34755 34765
113 896 971 6400 27059 33383 34537 35827 38796 40582 42594 43098 48525
162 854 1015 2938 10659 12085 13040 32772 33023 35878 49674 51060 51333
100 452 1703 1932 4208 5127 12086 14549 16084 17890 20870 41364 48498
1569 1633 1666 12957 18611 22499 38418 38719 42135 46815 48274 50947 51387
119 691 1190 2457 3865 7468 12512 30782 31811 33508 36586 41789 47426
867 1117 1666 4376 13263 13466 33524 37440 38136 39800 41454 41620 42510
378 900 1754 16303 25369 27103 28360 30958 35316 44165 46682 47016 50004
1321 1549 1570 16276 17284 19431 23482 23920 27386 27517 46253 48617 50118
37 383 1418 15792 22551 28843 36532 36718 38805 39226 45671 47712 51769
150 787 1441 17828 19396 21576 21805 24048 31868 32891 42486 43020 45492
1095 1214 1744 2445 5773 10209 11526 29604 30121 36526 45786 47376 49366
412 448 1281 11164 14501 15538 15773 23305 31960 32721 40744 45731 50269
183 626 837 4491 12237 13705 15177 15973 21266 25374 41232 44147 50529
618 1550 1594 5474 9260 16552 18122 26061 30420 30922 32661 34390 43236
135 496 757 9327 15659 20738 24327 26688 29063 38993 46155 49532 50001
64 126 1714 5561 8921 11300 12688 14454 16857 19585 20528 24107 27252
528 687 1730 9735 11737 16396 19200 33712 34271 38241 42027 44471 45581
69 646 1447 8603 19706 22153 22398 23840 24638 27254 29107 30368 41419
673 845 1285 9100 11064 14804 15425 17357 27248 31223 32410 35444 48018
124 1531 1677 3672 3673 3786 8886 9557 10003 11053 13053 22458 25413
102 1154 1758 5721 6034 14567 17772 28670 33380 34284 35356 47480 48123
48 351 760 2078 9797 22956 26120 34119 39658 41039 45237 47861 49022
254 445 841 6835 18340 19021 20053 22874 32639 36679 42004 45696 49530
16 802 903 6218 16206 22068 23049 28201 30377 33947 44358 44739 49303
153 1542 1629 7992 29900 34931 36927 38651 39981 41085 41327 50185 51484
525 1291 1765 9425 20271 31229 37444 38996 39145 41711 43188 45203 51255
2 244 1648 12321 14991 17426 18456 20126 29915 32581 38880 39516 49013
23 452 705 9414 11862 13764 18179 35458 37892 40471 46041 46494 48746
509 1201 1328 8921 9867 10947 19476 22693 32636 34301 38356 39238 51797
246 249 1390 12438 13266 24060 33628 37130 42923 43298 43709 43721 45413
117 257 748 9419 9461 11350 12790 16724 33147 34168 34683 37884 42699
619 646 740 7468 7604 8152 16296 19120 27614 27748 40170 40289 49366
914 1360 1716 10817 17672 18919 26146 29631 40903 46716 49502 51576 51657
68 702 1552 10431 10925 12856 24516 26440 30834 31179 32277 35019 44108
588 880 1524 6641 9453 9653 13679 14488 20714 25865 42217 42637 48312
6380 12240 12558 12816 21460 24206 26129 28555 41616 51767
8889 16221 21629 23476 33954 40572 43494 44666 44985 49813
16938 17727 17913 18898 21754 32515 35686 36920 39898 43560
9170 11747 14681 22874 24537 24685 26989 28947 33592 34621
2427 10241 29649 30522 37700 37789 41656 44020 49801 51268

FIG. 34

Rate 5/16 N=69120 TYPE-A 152 1634 7484 23081 24142 26799 33620 40989 41902 44319 44378 45067
140 701 5137 7313 12672 16929 20359 27052 30236 33846 36254 46973
748 769 2891 7812 9964 15629 19104 20551 25796 28144 31518 34124
542 976 2279 18904 20877 24190 25903 28129 36804 41152 41957 46888
173 960 2926 11682 12304 13284 18037 22702 30255 33718 34073 37152
78 1487 4898 7472 8033 10631 11732 19334 24577 34586 38651 43639
594 1095 1857 2368 8909 17295 17546 21865 23257 31273 37013 41454
72 419 1596 7849 16093 23167 26923 31883 36092 40348 44500
866 1120 1568 1986 3532 20094 21663 26664 26970 33542 42578
868 917 1216 12018 15402 20691 24736 33133 36692 40276 46616
955 1070 1749 7988 10235 19174 22733 24283 27985 38200 44029
613 1729 1787 19542 21227 21376 31057 36104 36874 38078 42445
86 1555 1644 4633 14402 14997 25724 31382 31911 32224 43900
353 1132 1246 5544 7248 17887 25769 27008 28773 33188 44663
600 958 1376 6417 6814 17587 20680 25376 29522 31396 40526
179 528 1472 2481 5589 15696 20148 28040 29690 32370 42163
122 144 681 6613 11230 20862 26396 27737 35928 39396 42713
934 1256 1420 3881 4487 5830 7897 9587 17940 40333 41925
622 1458 1490 16541 18443 19401 24860 26981 28157 32875 38755
1017 1143 1511 2169 17322 24662 25971 29149 31450 31670 34779
935 1084 1534 2918 10596 11534 17476 27269 30344 31104 37975
173 532 1766 8001 10463 17002 19002 26759 31006 43466 47443
221 610 1795 9197 11770 12793 14875 30177 30610 42274 43888
188 439 1332 7030 9246 15150 26060 26541 27190 28259 36763
812 1643 1750 7446 7888 7995 18804 21646 28995 30727 39065
44 481 555 5618 9621 9873 19182 22059 42510 45343 46058
156 532 1799 6258 18733 19988 23237 27657 30835 34738 39503
1128 1553 1790 8372 11543 13764 17062 28627 38502 40796 42461
564 777 1286 3446 5566 12105 16038 18918 21802 25954 28137
1167 1178 1770 4151 11422 11833 16823 17799 19188 22517 29979
576 638 1364 12257 22028 24243 24297 31788 36398 38409 47211
334 592 940 2865 12075 12708 21452 31961 32150 35723 46278
1205 1267 1721 9293 18685 18917 23490 27678 37645 40114 45733
189 628 821 17066 19218 21462 25452 26858 38408 38941 42354
190 951 1019 5572 7135 15647 32613 33863 33981 35670 43727
84 1003 1597 12597 15567 21221 21891 23151 23964 24816 46178
756 1262 1345 6694 6893 9300 9497 17950 19082 35668 38447
848 948 1560 6591 12529 12535 20567 23882 34481 46531 46541
504 631 777 10585 12330 13822 15388 23332 27688 35955 38051
676 1484 1575 2215 5830 6049 13558 25034 33602 35663 41025
1298 1427 1732 13930 15611 19462 20975 23200 30460 30682 34883
1491 1593 1615 4289 7010 10264 21047 26704 27024 29658 46766
969 1730 1748 2217 7181 7623 15860 21332 28133 28998 36077
302 1216 1374 5177 6849 7239 10255 34952 37908 39911 41738
220 362 1491 5235 5439 22708 29228 29481 33272 36831 46487
4 728 1279 4579 8325 8505 27604 31437 33574 41716 45082
472 735 1558 4454 6957 14867 18307 22437 38304 42054 45307
85 466 851 3669 7119 32748 32845 41914 42595 42600 45101
52 553 824 2994 4569 12505 24738 33258 37121 43381 44753
37 495 1553 7684 8908 12412 15563 16461 17872 29292 30619
254 1057 1481 9971 18408 19815 28569 29164 39281 42723 45604
16 1213 1614 4352 8091 8847 10022 24394 35661 43800 44362
395 750 888 2582 3772 4151 26025 36367 42326 42673 47393
862 1379 1441 6413 25621 28378 34869 35491 41774 44165 45411
46 213 1597 2771 4694 4923 17101 17212 19347 22002 43226
1339 1544 1610 13522 14840 15355 29399 30125 33685 36350 37672

Rate 6/16 N=69120 TYPE-A 608 1394 3635 14404 15203 19848 22161 23175 26651 31945 41227
481 570 11088 11673 11866 17145 17247 17564 21607 25992 31286
1207 1257 1870 8472 8855 10511 15656 17064 22720 28352 30914
1171 1585 6218 7621 10121 11374 13184 22714 27207 27959 38572
244 548 2073 4937 7509 11840 12850 18762 25618 27902 37150
15 1352 7060 7886 8151 10574 14172 15258 24838 30827 35337
1009 1651 13300 13958 26240 29983 32340 40743 41553 42475 42873
638 1405 5544 6797 10001 14934 24766 35758 40719 41787 42342
1467 1481 3202 11324 14048 15217 17608 22544 26736 32073 33405
1274 1343 3576 4166 8712 10756 21175 26866 37021 40341 42064
1232 1590 4409 8705 13307 28481 30893 36031 36780 37697 39149
189 1678 9943 10774 11765 25520 26133 27351 27353 40664 41534
125 1421 5009 9365 12792 15933 16231 25975 27076 27997 32429
1361 1764 5376 11071 14456 16324 20318 26168 28445 30392 34235
1017 1303 3312 6738 7813 18149 25506 29032 36789 38742 43116
463 967 10876 13874 14303 16789 21656 26555 38738 39195 40668
630 1104 3029 3165 5157 12880 14175 16498 35121 38917 40944
716 1054 10011 11739 16913 19396 20892 23370 24392 27614 38467
1081 1238 2872 10259 13618 16943 17363 23570 29721 32411 38969
775 1002 2978 9202 16618 22697 30716 31750 36517 37294 40454
25 497 10687 13308 15302 17525 17539 21865 22279 24516 26992
781 878 6426 8551 12328 21375 27626 28192 29731 35423 35606
729 1734 3479 6850 14347 14776 21998 33617 34690 38597 38704
122 1378 1660 7448 7659 11900 13039 13796 19908
504 716 1551 5655 6245 8365 9825 16627 29100
88 900 1057 2620 16729 17278 17444 26106 26587
30 1697 1736 8718 11664 20885 27043 42569 42913
293 634 1188 4005 5266 6205 26756 30207 37757
254 755 1187 4631 13433 25055 28354 28583 30446
316 1381 1522 3131 4340 27284 28246 28282 43174
84 293 645 2148 7925 13104 25010 36836 39033
982 1486 1660 4287 5335 18350 26913 30774 31280
418 1028 1039 3334 4577 6553 7011 17259 31922
1324 1361 1690 5991 7740 16880 18479 25713 31823
735 1322 1727 8629 14655 15815 16762 23263 36859
19 928 1561 11161 12894 14226 21331 41128 41883
327 940 1004 13616 15894 31400 34106 34443 37957
576 953 1226 2122 4900 5002 10248 25476 30787
249 632 1240 5432 23019 29225 31719 36658 41360
980 1154 1783 4351 10245 23347 27442 28328 38555
581 863 1552 5057 7572 14544 20482 29482 31672
4 502 1450 4883 5176 6824 10430 32680 39581
81 761 1558 2269 5391 13213 24184 25523 39429
1085 1163 1244 7694 9125 17387 22223 26343 37933
204 1127 1483 18302 19939 20576 31599 32619 42911
345 387 591 8727 18080 20628 32251 34562 42821
957 1126 1133 4099 12272 15595 20906 23606 34564
409 1310 1335 2761 11952 26853 27941 29262 31647
329 818 1527 3890 5238 8742 15586 28739 43015
231 1158 1677 4314 15937 17526 18391 22963 39232
34 275 526 2975 4742 16109 17346 29145 37673
497 735 1261 7468 8769 17342 19763 32646 33497
879 1233 1633 11612 22941 23723 31969 35571 39510
886 954 1355 5532 8283 26965 29267 30820 40402
356 1199 1452 8833 14845 21722 23840 26539 27970
553 1570 1732 8249 16820 23181 23234 30754 40399

Rate 7/16 N=69120 TYPE-A 1012 3997 5398 5796 21940 23609 25002 28007 32214 33822 38194
1110 4016 5752 10837 15440 15952 17802 27468 32933 33191 35420
95 1953 6554 11381 12839 12880 22901 26742 26910 27621 37825
1146 2232 5658 13131 13785 16771 17466 20561 29400 32962 36879
2023 3420 5107 10789 12303 13316 14428 24912 35363 36348 38787
3283 3637 12474 14376 20459 22584 23093 28876 31485 31742 34849
1807 3890 4865 7562 9091 13778 18361 21934 24548 34267 38260
1613 3620 10165 11464 14071 20675 20803 26814 27593 29483 36485
849 3946 8585 9208 9939 14676 14990 19276 23459 30577 36838
1890 2583 5951 6003 11943 13641 16319 18379 22957 24644 33430
1936 3939 5267 6314 12665 19626 20457 22010 27958 30238 32976
2153 4318 6782 13048 17730 17923 24137 24741 25594 32852 33209
1869 4262 6616 13522 19266 19384 22769 28883 30389 35102 36019
3037 3116 7478 7841 10627 10908 14060 14163 23772 27946 37835
1668 3125 7485 8525 14659 22834 24080 24838 30890 33391 36788
1623 2836 6776 8549 11448 23281 32033 32729 33650 34069 34607
101 1420 5172 7475 11673 18807 21367 23095 26368 30888 37882
3874 3940 4823 16485 21601 21655 21885 25541 30177 31656 35067
592 643 4847 6870 7671 10412 25081 33412 33478 33495 35976
2578 2677 12592 17140 17185 21962 23206 23838 27624 32594 34828
3058 3443 4959 21179 22411 24033 26004 26489 26775 33816 36694
91 2998 10137 11957 12444 22330 24300 26008 26441 26521 38191
889 1840 8881 10228 12495 18162 22259 23385 25687 35853 38848
1332 3031 13482 14262 15897 23112 25954 28035 34898 36286 36991
2505 2599 10980 15245 20084 20114 24496 26309 31139 34090 37258
599 1778 8935 16154 19546 23537 24938 32059 32406 35564 37175
392 1777 4793 8050 10543 10668 14823 25252 32922 36658 37832
1680 2630 7190 7880 10894 20675 27523 33460 33733 34000 35829
532 3750 5075 10603 12466 19838 24231 24998 27647 35111 38617
1786 3066 11367 12452 13896 15346 24646 25509 26109 30358 37392
1027 1659 6483 16919 17636 18905 19741 30579 35934 36515 37617
2064 2354 14085 16460 21378 21719 22981 23329 31701 32057 32640
2009 4421 7595 8790 12803 17649 18527 24246 27584 28757 31794
364 646 9398 13898 17486 17709 20911 31493 31810 32019 33341
2246 3760 4911 19338 25792 27511 28689 30634 31928 34984 36605
3178 3544 8858 9336 9602 12290 16521 27872 28391 28422 36105
1981 2209 12718 20656 21253 22574 28653 29967 33692 36759 37871
787 1545 7652 8376 9628 9995 10289 16260 17606 22673 34564
795 4580 12749 16670 18727 19131 19449 26152 29165 30820 31678
1577 2980 8659 12301 13813 14838 20782 23068 30185 34308 34676
84 434 13572 21777 24581 28397 28490 32547 33282 34655 37579
2927 4440 8979 14992 19009 20435 23558 26280 31320 35106 37704
1974 2712 6552 8585 10051 14848 15186 22968 24285 25878 36054
585 1990 3457 5010 8808
9 2792 4678 22666 32922
342 507 861 18844 32947
554 3395 4094 8147 34616
356 2061 2801 20330 38214
425 2432 4573 7323 28157
73 1192 2618 7812 17947
842 1053 4088 10818 24053
1234 1249 4171 6645 37350
1498 2113 4175 6432 17014
524 2135 2205 6311 7502
191 954 3166 28938 31869
548 586 4101 12129 25819

Rate 8/16 N=69120 TYPE-A 772 2281 3473 15662 19233 22166 24358 31768 34191
3072 3151 3484 20863 23023 26841 27472 27784 29651
2021 3203 4955 5144 12966 13620 14648 18456 30842
1806 2504 3675 6095 15703 15906 16025 19622 24749
745 954 14959 19379 21307 27232 30747 31580 34498
1289 2798 3630 11125 14405 16833 17549 27047 34127
744 805 5289 15458 24911 26399 28735 32526 32568
732 2368 7341 7508 9188 15676 18894 28544 32643
932 1971 3577 13308 13857 23512 27614 30417 34011
509 2152 3819 15873 18472 18916 20285 21421 29629
2475 3045 7516 12450 19365 21118 22154 22988 29632
1826 1847 4147 15787 16852 18336 22299 30945 33813
265 2184 9121 12341 12405 18908 29587 31365 33794
2599 2683 4025 6139 8989 15158 18010 28167 31929
845 2103 6653 7355 12824 15366 16277 17519 23286
1399 2887 11163 25401 26413 26782 27209 28194 33477
921 2171 5580 5853 10183 11788 27575 31160 34061
1908 2156 5805 13283 14262 19954 21960 29163 32575
252 1729 10690 18304 18921 23512 23540 28800 29738
1471 2630 5594 8245 15787 25205 28758 30257 30851
348 1947 5694 17122 20090 21065 22347 29035 33466
737 1373 6599 6614 19068 26595 27778 28013 28882
364 430 6008 6607 8543 13936 23464 29610 31484
2229 2680 18999 20491 21334 26172 28296 28546 33400
1397 3104 5116 6493 6538 13889 25830 28978 32982
1620 2845 3850 10010 18108 18460 22770 23335 27961
498 2120 6084 9410 13331 14260 23516 23987 34035
1231 2804 7437 13770 20375 30750 32395 32396 34111
953 1902 5780 10797 22700 24101 26068 30912 32091
861 936 12129 19924 20120 21381 21388 21447 27204
731 2953 7262 17370 18981 22098 23033 28091 33702
490 583 7131 15101 16559 28310 28868 29782 32476
774 2299 4672 6318 8582 23242 31128 33233 33525
1180 1856 6398 11619 18864 23107 26863 27068 32107
1254 2724 9924 14935 17381 20494 28231 28315 29981
1421 1859 10349 13014 13756 16003 20857 21287 24049
894 1864 5740 6223 7764 10832 14172 16277 25480
401 1753 10617 11842 17705 25037 26925 28610 32447
836 1680 6209 10558 11877 18052 19470 19596 28767
1388 3186 6150 8082 8270 12210 22672 29391 33400
2539 2632 4691 6341 8535 18093 18920 20974 31393
1611 2540 4975 11114 13694 15237 15296 18284 29706
619 1682 11939 18221 23276 24770 25283 25410 32475
453 465 4205 7369 10207 12725 19737 20902 29125
1417 1526 17833 18009 18408 23118 28438 28886 34324
537 2396 6629 6707 6725 16691 17338 20424 23712
800 2808 6021 8438 10096 17394 21026 29668 33876
841 2257 10435 14237 16470 16753 23284 27020 30550
1524 2908 5865 10368 19372 26633 29011 30192 30678
32 1640 6508 11257 26512 26659 28075 30862 33427
1520 2860 15351 20014 20361 22955 23045 25940 29105
1848 3061 5809 6815 8987 17563 20524 22236 34381
1733 3082 5621 9635 12551 21520 21557 28829 31273
573 1926 3702 4446 7768 11703 12656 16747 32712
2705 2727 5610 6984 7075 9535 21223 23408 32966
1483 2888 5752 13993 22125 25473 27225 30868 34054

Rate 7/16 N=69120 TYPE-B 5189 9880 13538 15175 16621 16804 17705 17961 20733 21467 21989 22238 22463 22918 23828 24930 25118 29684 33583 37271
70 5848 12393 14052 14252 17346 17509 19994 20675 24493 25258 29167 29758 30689 33714 33848 33910 34528 36773 38204
460 3837 6795 6912 7428 10696 12315 13575 15357 21353 23908 24933 30574 32972 33778 34513 35079 35137 36858 38213
157 8681 9967 11922 12445 14847 16658 19556 22644 24339 25625 28151 28405 29858 30427 31235 32999 33392 33666 38766
3951 10022 12466 13163 13699 15100 16425 17314 22941 23114 23186 23320 31711 32091 32346 32880 33839 34080 35244 35281
1963 3894 4747 5005 9478 11504 11733 13851 15703 18601 19091 20025 23748 26876 28310 33966 36096 36785 38241 38311
1787 5475 7062 11439 11686 12094 13500 14948 16457 21418 23783 27664 29522 30557 30960 31551 31893 32108 32636 35190
420 1601 4105 10709 11003 19228 21225 21427 21627 22632 23597 24691 24876 27272 30053 30632 37024 37337 38287 38865
2010 2747 4310 4828 6790 6992 7149 7686 7839 9174 10122 12007 15980 17263 18970 21288 24460 33544 34955 36082
4728 5125 5485 6758 7027 7310 9319 12741 13418 14280 14608 18831 19770 20620 22885 24340 29811 30383 31190 31328
1394 1527 2639 3398 3525 5055 10589 14304 17665 24839 28525 29530 30637 30730 31979 32294 32322 36477 36553 38823
3045 9911 11773 12368 13334 18650 19865 21411 24014 25991 27310 27609 28086 28782 30162 34481 34903 35059 36026 36601
1245 1578 4372 7080 8475 13246 14436 15058 16006 16453 16536 20386 21253 25032 25217 27143 33582 34233 35898 37013
156 579 1835 2921 4288 5799 13536 17576 18882 19825 20721 21827 22488 23207 30595 30943 33676 34224 36783 37618
1761 2419 4684 5188 8865 11427 13523 22508 22588 22658 23319 24649 27740 28615 28701 30469 31004 31708 38366 38845
3458 4318 8330 11232 11559 12478 14158 14837 16062 22913 23562 27331 27356 27424 27568 27668 30979 34747 35621 36680
144 1310 2076 2897 8483 10803 15403 21321 24285 24473 28105 28715 28756 29235 30570 32778 33148 35641 37148 37821
4019 4750 6236 10250 10853 13526 15851 17279 18650 19259 20752 21209 21331 22157 22387 27086 29179 30736 32244 36708
20671 21714 26907 28806
10538 15159 29903 35695
7414 15003 28833 31718
28014 30364 31097 34164
118 7358 17504 27943
11617 12578 20090 33389
3664 4126 20256 31569
2510 3137 4580 13643
19359 19928 28120 34072
29 28234 33691 33901
1652 4422 9877 32434
9374 16809 26890 27786
6375 7463 20276 25951
877 5288 22733 32789
11506 11756 36420 37946
2188 3978 21657 24557
2467 13247 15618 38099
8086 19322 20602 26103
14418 28964 30852
8699 24256 28148

Rate 7/16 N=69120 ANOTHER TYPE-B 3781 6916 6934 11478 12245 13955 15314 15521 16710 18163 21883 24658 26586 27981 28648 31274 31994 34499 37654 38089 38646
3409 4491 5576 6779 8290 9295 10165 10287 12457 13052 15649 18861 22798 24303 27720 28767 31148 32645 33114 34014 34571
1346 3203 4376 8828 12144 12192 14471 15695 16838 16973 19039 20649 20772 22260 22370 23704 26220 30178 31953 32499 38758
1999 2724 2805 5711 5722 8176 8583 12845 13604 14529 16195 19312 19612 19892 22950 23697 24556 26319 27521 27582 31615
5209 8943 9877 10643 10853 11048 13651 17069 17210 19068 22040 23883 25579 28354 28597 29409 29457 31169 34228 36180 38572
271 910 4894 5838 7166 9457 12559 12752 16661 16732 19190 21313 21378 24410 25551 25708 28928 30537 30682 31552 37906
131 4378 6224 8143 9240 11696 14292 14520 19337 22025 26069 27418 29338 31791 32164 32573 33547 34934 36289 37163 37319
1756 4041 7413 9799 10173 10574 11704 12500 13043 14811 15087 15521 16177 18453 18681 28169 30555 31106 32511 34350 37236
589 2827 3183 4406 12246 13112 16739 17616 17952 20154 21240 21938 23145 24248 26189 27216 27386 31623 32819 36361 38005
1214 1245 1755 1940 6822 6895 7750 8687 11684 11802 12942 13362 16423 18240 19600 21676 23939 28782 35714 37597 38146
286 5126 6405 6586 9097 10975 12268 12805 14506 14744 17117 18827 26361 26441 27256 28757 29140 29568 31553 37795 38655
961 2442 3434 3890 4209 4320 6417 6430 7180 9265 20461 21026 27325 31207 33765 36370 36500 36977 38064 38244 38418
5836 8876 9094 9332 13613 13780 14565 15475 15887 16458 16489 16776 18723 21934 24271 24363 25696 27794 37030 38030
2707 3249 3740 7503 10158 11464 12834 14675 18245 18332 18888 20213 23130 25452 29019 30588 32027 34057 34209 38495
381 570 3671 10027 10746 11751 12139 18163 19455 19681 20051 23763 25300 26984 27021 28070 28763 30826 33291 37391
8609 10336 10568 11672 12691 13250 15095 15785 18246 20835 21516 24332 24612 25226 27732 28106 32122 32676 33437 36733
2063 3030 4285 4466 7200 10031 14609 15378 16363 20611 20757 21235 21420 22476 24313 24319 28117 29270 34947 38242
425 1528 3005 4946 5624 6809 11163 11656 14898 16555 19289 20411 22140 23168 27381 28648 31395 34424 37450 37775
7763 12513 14792 20465
3337 4306 13225 26639
3511 4168 7745 18770
3034 26440 31723 32582
2458 13276 28213 34317
4590 5331 9772 22678
6678 16422 17052 22284
4795 7956 23271 34038
5100 15330 23420 23750
20996 25124 29783 38015
3207 5296 6461 26697
16855 27613 31134 31686
645 9868 18039 29836
2837 27058 32786 37066
5648 25181 31874 35839
1831 21924 31081 33927
5649 7669 15910 33928
1748 10198 33744 35288
2171 17317 31053
11028 20243 35491

Rate 8/16 N=69120 TYPE-B 1850 4176 4190 7294 8168 8405 9258 9710 13440 16304 16600 18184 18834 19899 22513
25068 26659 27137 27232 29186 29667 30549 31428 33634
2477 2543 5094 8081 9573 10269 11276 11439 13016 13327 16717 18042 19362 19721
20089 20425 20503 21396 24677 24722 28703 32486 32759 33630
1930 2158 2315 2683 3818 4883 5252 5505 8760 9580 11867 13117 14566 15639 17273
18820 21069 24945 25667 26785 30678 31271 33003 33244
1279 1491 2038 2347 2432 4336 4905 6588 7507 7666 8775 9172 10405 12249 12270 12373
12936 13046 13364 15130 17597 22855 27548 32895
620 1897 3775 5552 6799 7621 10167 10172 10615 11367 12093 13241 15426 16623 19467
19792 22069 22370 24472 24594 25205 25954 27800 29422
582 1618 4673 5809 6318 6883 8051 12335 12409 13176 14078 15206 17580 18624 18876
19079 20786 21177 25894 26395 27377 27757 30167 31971
1157 2189 4160 4480 5055 8961 9171 9444 10533 11581 12904 14256 14620 15773 16232
17598 19756 21134 21443 22559 23258 25137 25555 28150
987 1258 1269 2394 4859 5642 5705 6093 6408 7734 8804 10657 11946 16132 20267 25402
26505 26548 27060 29767 29780 31915 31966 33590
1010 1363 1626 5283 6356 10961 12418 14332 14362 16288 16303 16592 17096 20115
20285 20478 21774 22165 22425 23198 25048 25596 31540 32841
895 2743 2912 4971 8803 11183 14500 14617 14638 16776 17901 18622 20244 20845 22214
25676 26161 26281 29978 30392 30922 31542 32038 32443
188 260 411 2823 5512 5645 10019 11856 12671 14273 14673 16091 16169 22333 22934
22945 23542 26503 27159 27279 28277 30114 31626 32722
357 516 3530 4317 8587 9491 10348 11330 13446 14533 15423 17003 17217 19127 20088
20750 21767 22386 24021 27749 29008 29376 30329 32940
2909 3036 4875 9967 10632 12069 12410 14004 14628 15605 15852 18231 18657 19705
20620 22241 29575 29656 31246 32190 32781 33489 33842 34492
4242 5461 5577 7662 11130 13663 17240 17773 18339 19400 22905 24219 25464 25890
26359 27121 27318 27840 30800 32587 32924 33427 33940 34058
421 2222 3457 5257 5600 10147 12754 17380 18854 20333 20345 20752 24578 25196 25638
25725 25822 27610 28006 28563 29632 29973 29991 34166
41 207 1043 4650 5387 6826 7261 8687 9092 10775 11446 12596 16613 19463 20923 24155
24927 25384 26064 27377 28094 32578 32639 34115
1050 5731 15820 16281 26130 29314
5980 6161 14479 22181 22537 32924
7828 9134 11297 17143 25449 29674
8299 10457 14486 21548 22510 32039
1527 7792 10424 19166 29302 29768
5823 13974 21254 21506 25658 29491
6285 9873 12846 14474 17005 29377
1740 4929 8285 20994 32271 34522
12862 16827 22427 23369 27051 30378
4787 10372 10408 12091 20349 26162
6659 22752 24697 28261 28917 32536
6788 15367 21778 28916 30324 33927
7181 12373 21912 24703 28680 34045
2238 4945 14336 19270 29574 33459
10283 15311 17440 24599 24867 28293
324 5264 5375 6581 24348 30288
3112 7656 23825
21624 22318 22633
5284 19790 22758
2700 4039 12576
17028 17520 19579
11914 17834 33989
2199 5502 7184
22 20701 26497

Rate 8/16 N=69120 ANOTHER TYPE-B 1194 2400 2789 3893 5030 5033 7851 10775 12793 13985 15133 16913 18431 18436 19931 20421 21073 23361 24493 26860 28864 34457
1818 2451 7250 7687 8756 9438 11365 12085 12956 14339 17179 17395 17695 21298 21870 23350 24405 25359 26180 28086 30345 32192
206 4671 5265 6393 7960 9628 9839 11216 11352 12190 15252 15310 16952 17066 19600 21722 22729 25154 26172 27666 28099 34330
769 3876 4330 7293 8230 8431 14839 14856 17227 18920 18964 22763 22860 23184 24350 25709 26099 27143 27330 28311 33058 33640
123 1567 3562 5478 8714 9355 10394 10413 12711 12949 16390 19491 25027 27126 28594 28897 28965 29846 31037 32273 33114 33164
2545 6567 9115 10916 11048 11526 11675 13251 13359 13758 14344 14795 15700 15994 16516 17918 19530 20572 27737 28087 30591 32277
485 1069 1561 1685 2841 3856 6096 6854 7715 10535 18860 19241 21526 23316 24224 24315 25631 29180 31725 33481 33719 33968
279 1102 5684 6114 8078 10368 10912 11442 11889 14611 15192 16193 16779 17454 21249 23471 23517 24226 25910 26237 28126 33541
774 3559 3708 3919 4588 5736 5816 6424 8253 9708 11379 12845 13139 18161 25545 27698 30011 32310 32388 32894 34141 34274
2136 3009 5250 5692 8090 12167 12227 13741 14201 14671 14674 14899 16619 19688 21509 22772 24361 24681 32835 33835 33878 33996
2410 3265 6681 7912 8316 9076 10257 11336 12959 13043 16289 16798 19530 20607 21636 22652 25743 27170 28501 30316 30381 34192
319 528 2926 3212 8888 9526 10802 16128 16206 17305 17542 17850 18019 21127 22494 23945 24080 24901 25540 27434 29640 33300
7616 9188 9326 10429 10455 11285 11787 13435 14037 16175 18470 19131 21639 21810 22423 24599 25018 28546 29069 29715 32689
1910 2775 3753 4013 6351 8865 12978 13683 14512 18254 18521 18897 19077 20010 21623 21634 24967 26045 31096 33597 33984
313 1368 2647 4352 5022 6109 9941 10298 12553 13196 14763 17155 18100 19718 20620 24301 25486 27909 30534 33259 34513
2174 2552 2756 2831 3660 3838 4124 6346 6923 11057 11348 11716 16473 18152 20008 21875 23400 25136 27305 28890 30208
2677 4884 5180 14655 18383 20722
3731 4560 16588 20888 22987 30500
2776 11584 13605 23303 26861 33705
4750 5877 15021 24513 25807 27249
1733 8791 26142 28266 28573 32676
2576 4916 22443 24303 29550 31838
1609 5086 19583 27560 28457 30786
1555 7025 9030 14979 29890 31128
2134 9879 15542 27554 31328 31506
15899 17881 18012 21037 30363 32843
4086 12709 15898 16296 22656 23283
1646 8284 8347 10975 17603 30820
1384 19111 23378 26081 27575 33447
4029 10225 10310 17309 23450 32464
7980 10708 15814 26794 30307 34137
938 1050 16505 21793 23756 27989
12080 17375 25097
4944 8065 26757
17431 31423 33965
2055 9209 32469
1478 9521 21387
29845 30046 33714
9682 12149 23918
11085 19303 21788

Rate 9/16 N=69120 TYPE-B 110 3064 6740 7801 10228 13445 17599 17891 17979 18044 19923 21848 23262 25585 25968 30124
1578 8914 9141 9731 10605 11690 12824 18127 18458 24648 24950 25150 26323 26514 27385 27460
3054 3640 3923 7332 10770 12215 14455 14849 15619 20870 22033 26427 28067 28560 29777 29780
1348 4248 5479 8902 9101 9356 10581 11614 12813 21554 22985 23701 24099 24575 24786 27370
3266 8358 16544 16689 16693 16823 17565 18543 19229 21121 23799 24981 25423 28997 29808 30202
320 1198 1549 5407 6080 8542 9352 12418 13391 14736 15012 18328 19398 23391 28117 28793
2114 3294 3770 5225 5556 5991 7075 7889 11145 11386 16561 18956 19034 23605 26085 27132
3623 4011 4225 5249 5489 5711 7240 9831 10458 14697 15420 16015 17782 23244 24215 24386
2624 2750 3871 8247 11135 13702 19290 22209 22975 23811 23931 24872 25154 25165 28375 30200
1060 1240 2040 2382 7723 9165 9656 10398 14517 16653 21241 22348 23476 27203 28443 28445
1070 1233 3416 6633 11736 12808 15454 16505 18720 20162 21425 21874 26069 26855 27292 27978
420 5524 10279 11218 12500 12913 15389 15824 19414 19588 21138 23846 26621 27907 28594 28781
151 1356 2323 3289 4501 10573 13667 14642 16127 17040 17475 18055 24061 26204 26567 29277
1410 3656 4080 6963 8834 10527 17490 17584 18065 19234 22211 22338 23746 24662 29863 30227
1924 2694 3285 8761 9693 11005 17592 21259 21322 21546 21555 24044 24173 26988 27640 28506
1069 6483 6554 9027 11655 12453 16595 17877 18350 18995 21304 21442 23836 25468 28820 29453
149 1621 2199 3141 8403 11974 14969 16197 18844 21027 21921 22266 22399 22691 25727 27721
3689 4839 7971 8419 10500 12308 13435 14487 16502 16622 17229 17468 22710 23904 25074 28508
1270 7007 9830 12698 14204 16075 17613 19391 21362 21726 21816 23014 23651 26419 26748 27195
96 1953 2456 2712 2809 3196 5939 10634 21828 24606 26169 26801 27391 28578 29725 30142
832 3394 4145 5375 6199 7122 7405 7706 10136 10792 15058 15860 21881 23908 25174 25837
730 1735 2917 4106 5004 5849 8194 8943 9136 17599 18456 20191 22798 27935 29559
6238 6776 6799 9142 11199 11867 15979 16830 18110 18396 21897 22590 24020 29578 29644
407 2138 4493 7979 8225 9467 11956 12940 15566 15809 16058 18211 22073 28314 28713
957 1552 1869 4388 7642 7904 13408 13453 16431 19327 21444 22188 25719 28511 29192
3617 8663 22378 28704
8598 12647 19278 22416
15176 16377 16644 22732
12463 12711 18341
11079 13446 29071
2446 4068 8542
10838 11660 27428
16403 21750 23199
9181 16572 18381

| | | |
|---|---|---|
| 4640 | 11480 | 24391 |
| 1083 | 7965 | 16573 |
| 13116 | 23916 | 24421 |
| 10129 | 16284 | 23855 |
| 1758 | 3843 | 21163 |
| 5626 | 13543 | 26708 |
| 14918 | 17713 | 21718 |
| 13556 | 20450 | 24679 |
| 3911 | 16778 | 29952 |
| 11735 | 13710 | 22611 |
| 5347 | 21681 | 22906 |
| 6912 | 12045 | 15866 |
| 713 | 15429 | 23281 |
| 7133 | 17440 | 28982 |
| 12355 | 17564 | 28059 |
| 7658 | 11158 | 29885 |
| 17610 | 18755 | 28852 |
| 7680 | 16212 | 30111 |
| 8812 | 10144 | 15718 |

FIG. 53

Rate 9/16 N=69120 ANOTHER TYPE-B 344 5260 5449 9663 11572 11933 15244 18579 18949 19398 22175 23672 25646 26228 28656 29695
94 6796 7678 7790 9294 13003 13506 17577 19909 21842 23240 24312 25607 25987 26138 30141
3065 9660 10194 11700 12775 17826 17987 18011 18139 24640 24992 25167 25574 26525 27409 27443
1518 3037 3662 7312 8949 9104 10654 10834 12255 15569 18449 20854 26340 26423 28075 29817
3919 4274 5506 8843 9351 12805 14505 14817 22069 23012 23697 24041 24857 27342 28623 29808
1366 3228 8386 9132 10558 11608 16663 16748 18548 21121 21582 23833 24567 25013 25403 29764
308 1250 6105 8501 13402 14997 16464 16818 17606 18331 19164 19334 23429 28729 29007 30169
1554 3279 5266 5459 5567 5975 7137 7853 9379 12396 14725 16695 19013 26100 27158 28072
2133 3771 4208 5514 5638 7263 9895 10454 11108 11387 15416 15975 18907 23647 24254 24409
2608 3636 3885 4012 5274 8303 11157 13722 14668 17777 22255 22941 23224 23929 24944 30207
1070 1235 2018 2770 7700 9196 10392 16689 19241 21249 23477 23848 25122 25188 28342 28421
2429 9607 14502 15391 18716 20177 21473 21901 22390 26796 27148 27280 28004 28402
998 1213 3439 6597 10328 11231 11688 12840 16477 19477 19575 21107 26074 26599
486 1371 3334 5527 12458 12880 15407 15875 18054 23790 27937 28635 28771 29282
120 2312 4476 10565 13656 14622 16086 17050 17477 17581 24038 26200 26615 29827
1348 3651 4047 6897 8889 10520 17523 18098 19120 22206 22293 23689 24682 30177
2079 2735 3279 8789 11028 17564 21316 21515 21532 24039 24130 26966 27697 28492
6469 6581 9021 9726 11535 12494 16590 17814 18338 19023 21298 21308 21437 28882
151 1046 2232 8476 11980 18863 21898 22338 22363 22712 23817 25461 25734 29400
1668 3131 10514 12275 13430 14485 14992 16193 16508 16629 17274 21073 25068 27722
3687 4793 7964 8450 9907 16051 17443 17599 19361 21676 22751 23868 27209 28484
143 1270 6994 12753 14256 21367 21805 21839 22983 23617 26439 26733 26876 30154
1992 2512 2731 2804 3245 5915 10631 15085 15832 24562 26149 27402 28617 29672
834 3370 4116 5323 6152 7121 7454 7716 10103 10818 21888 23912 25179 25823
741 1684 2871 4082 4984 5870 8192 8918 9090 17613 20205 22816 27968 29511
370 6780 8411 26549
5927 9312 11874 20454
4336 17108 18408 18897
6749 18091 26151
7902 18151 21999
15828 18958 24454
404 14744 15626
8591 14022 28659
2040 5109 11281
942 4875 29186
7636 13511 17003
4387 13433 30206
19971 22197 28180
1903 7945 21440
7599 12181 17498
9627 9781 29214
5913 19534 19715
17181 18814 22441
9332 10906 22747
11759 12446 13494

Rate 10/16 N=69120 TYPE-B 200 588 3305 4771 6288 8400 11092 11126 14245 14255 17022 17190 19241 20350 20451 21069 25243
80 2914 4126 5426 6129 7790 9546 12909 14660 17357 18278 19612 21168 22367 23314 24801 24907
1216 2713 4897 6540 7016 7787 8321 9717 9934 12295 18749 20344 21386 21682 21735 24205 24825
6784 8163 8691 8743 10045 10319 10767 11141 11756 12004 12463 13407 14682 15458 20771 21060 22914
463 1260 1897 2128 2908 5157 7851 14177 16187 17463 18212 18221 19212 21864 24198 25318 25450
794 835 1163 4551 4597 5792 6092 7809 8576 8862 10986 12164 13053 14459 15978 23829 25072
144 4258 4342 7326 8165 9627 11432 12552 17582 17621 18145 19201 19372 19718 21036 25147 25774
617 2639 2749 2898 3414 4305 4802 6183 8551 9850 13679 20759 22501 24244 24331 24631 25587
1622 2258 4257 6069 10343 10642 11003 12520 13993 17086 18236 18522 24679 25361 25371 25595
1826 3926 5021 5905 6192 6839 7678 9136 9188 9716 10986 11191 12551 14648 16169 16234
2175 2396 2473 8548 9753 12115 12208 13469 15438 16985 19350 20424 21357 22819 22830 25671
265 397 6675 7152 8074 13030 13161 13336 15843 16917 17930 18014 18660 19218 22236 24940
5744 6883 7780 7839 8485 10016 10548 12131 12158 16211 16793 18749 20570 21757 22255 24489
2082 4768 7025 8803 10237 10932 13885 14266 14370 14982 16411 18443 18773 19570 21420 23311
1040 1376 2823 2998 3789 6636 7755 9819 13705 13868 14176 16202 16247 24943 25196 25489
223 1967 3289 4541 7420 9881 11086 12868 13550 14760 15434 18287 19098 20909 22905 25887
1906 2049 2147 2756 2845 4773 8337 8832 9363 12375 13651 16366 17546 20486 21624 22664
1619 1955 2393 3078 3208 3593 5246 8565 10956 11335 11865 14837 15006 15544 18820 22687
2086 3409 3586 4269 6587 8650 10165 11241 15624 16728 17814 18392 18667 19859 21132 25339
382 1160 1912 3700 3783 12069 14672 16842 18053 19626 20724 21244 21792 22679 23873 24517
1217 1486 5139 6774 7413 10622 11571 11697 13406 13487 20713 22436 22610 22806 23522 23632
1225 2927 6221 6247 8197 9322 11826 11948 12230 13899 15820 16791 17444 23155 24543 24650
1056 2975 6018 7698 7736 7940 11870 12964 17498 17577 19541 20124 20705 22693 23151 25627
658 790 1559 3683 6060 9059 12347 12990 13095 16317 17801 18816 20050 20979 23584 25472
1133 3343 6895 7146 7261 8340 9115 11248 14543 16030 16291 17972 22369 22479 24388 25280
1907 4021 8277 17631
7807 8063 10076 24958
5455 8638 13801 18832
15525 24030 24978
7854 21083 21197
8416 15614 24639

Rate 10/16 N=69120 ANOTHER TYPE-B 271 1020 5185 7275 8003 11480 12855 14175 14467 15086 15696 16443 16565 18130 20056 24630 24862 25892
1339 1853 2850 3222 4490 4644 4818 5174 6072 6698 10681 12635 14197 16281 20247 22338 23417 24076
3129 3405 3651 4498 4751 4876 6253 8473 8938 9552 9761 12593 13222 13694 15200 16230 20806 20887
1055 2296 2308 3380 7113 9524 11765 16519 19064 19672 19895 20421 20498 21381 21565 21587 24283 25908
932 1729 2020 6611 7879 8243 8912 12436 14276 16021 18171 19185 20154 23285 23342 24000 24372 24391
802 1025 2896 5686 9630 10075 10956 13238 14133 16693 16799 17305 18117 18375 18739 22385 22805 23012
365 1160 2879 4714 8810 10702 11054 13219 13599 14592 15414 20406 20592 22774 24045 24529 24666 25074
113 1165 1947 3823 5944 9058 9129 11673 12560 13816 14978 15027 15095 19019 20354 22452 25588
1637 2422 3115 3487 7500 7590 15048 15512 16354 18274 18449 19120 20724 21135 23145 23732 25911
2845 5592 7719 8334 9489 9892 10722 15313 15721 16306 18219 18232 18387 18503 20614 24467 24761
114 903 1910 5652 7270 10269 14202 16169 18835 19131 19208 19475 20389 21871 22037 23766 25226
1391 2688 6776 9001 10533 11495 12445 12868 13853 14176 14195 14764 18050 19508 20450 21465 24422
1118 3116 4245 5978 7207 8450 10891 13765 14966 15115 16605 18300 18630 19680 22654 22905 23307
99 2340 2383 2766 5097 9097 12169 18669 18716 20237 21059 22426 22990 23495 24511 25416 25790
701 1693 2106 2697 4540 5298 6106 6380 6604 8683 9279 12937 13575 18789 20512 21598 22132
608 1473 2459 3522 3593 4295 5008 7004 7699 7786 14450 15096 15830 17286 19571 23907 25288
5399 5791 5815 6785 7837 9632 10181 13688 15504 15594 15783 18758 18900 19305 20550 25385 25404
355 819 1841 3868 6517 7054 8097 10246 11123 11573 13354 13565 13807 14072 24327 24620 25028
1296 1630 3750 5091 6496 6780 7154 8414 11468 15004 16441 16619 18374 19047 22090 24448 24606
1818 3512 7338 7994 8149 8875 9345 9985 10716 11568 13029 16063 16709 19295 19487 20368 24977
1024 2737 3819 5584 6314 7683 7965 9796 13695 13917 14267 16079 18133 18763 19880 20213 25354
509 3489 4746 5544 6877 7607 9237 11923 12548 13078 14148 14809 15479 18172 23026 23320 24011
565 3039 3652 4540 7101 9564 10165 10898 11473 12788 12884 13091 15654 17926 19344 21818 24494
1554 2393 2767 4498 4755 5179 5306 6509 9849 12108 12920 14191 14607 14854 18992 20294 21249
1680 2417 4122 7193 7727 8288 10235 10518 12601 15579 15606 17894 19077 20170 22807 25023 25075
5260 7065 8165 8835
925 1768 14353 17531
946 1215 1772 12359
816 8662 9026
2813 12966 16694
2230 11960 14896

Rate 11/16 N=69120 TYPE-B 983 2226 4091 5418 5824 6483 6914 8239 8364 10220 10322 15658 16928 17307 18061
1584 5655 6787 7213 7270 8585 8995 9294 9832 9982 11185 12221 12889 17573 19096
319 1077 1796 2421 6574 11763 13465 14527 15147 15218 16000 18284 20199 21095 21194
767 1018 3780 3826 4288 4855 7169 7431 9151 10097 10919 12050 13261 19816 20932
173 692 3552 5046 6523 6784 9542 10482 14658 14663 15168 16153 16410 17546 20989
2214 2286 2445 2856 3562 3615 3970 6065 7117 7989 8180 15971 20253 21312 21428
532 1361 1905 3577 5147 10409 11348 11660 15230 17283 18724 20190 20542 21159 21282
3242 5061 7587 7677 8614 8834 9130 9135 9331 13480 13544 14263 15438 20548 21174
1507 4159 4946 5215 5653 6385 7131 8049 10198 10499 12215 14105 16118 17016 21371
212 1856 1981 2056 6766 8123 10128 10957 11159 11237 12893 14064 17760 18933 19009
329 5552 5948 6484 10108 10127 10816 13210 14985 15110 15565 15969 17136 18504
20818
4753 5744 6511 7062 7355 8379 8817 13503 13650 14014 15393 15640 18127 18595 20426
1152 1707 4013 5932 8540 9077 11521 11923 11954 12529 13519 15641 16262 17874 19386
858 2355 2511 3125 5531 6472 8146 11423 11558 11760 13556 15194 20782 20988 21261
216 1722 2750 3809 6210 8233 9183 10734 11339 12321 12898 15902 17437 19085 21588
1560 1718 1757 2292 2349 3992 6943 7369 7806 10282 11373 13624 14608 17087 18011
1375 1640 2015 2539 2691 2967 4344 7125 9176 9435 12378 12520 12901 15704 18897
1703 2861 2986 3574 7208 8486 9412 9879 13027 13945 14873 15546 16516 18931 21070
309 1587 3118 5472 10035 13988 15019 15322 16373 17580 17728 18125 18872 19876
20457
984 991 1203 3159 4303 5734 8850 9626 12217 17227 17269 18695 18854 19580 19684
2429 6165 6828 7761 9761 9899 9942 10151 11198 11271 13184 14026 14560 18962 20570
876 1074 5177 5185 6415 6451 10856 11603 14590 14658 16293 17221 19273 19319 20447
557 607 2473 5002 6601 9876 10284 10809 13563 14849 15710 16798 17509 18927 21306
939 1271 3085 5054 5723 5959 7530 10912 13375 16696 18753 19673 20328 21068 21258
2802 3312 5015 6041 6943 7606 9375 12116 12868 12964 13374 13594 14978 16125 18621
3002 6512 6965 6967 8504 10777 11217 11931 12647 12686 12740 12900 12958 13870
17860
151 3874 4228 7837 10244 10589 14530 15323 16462 17711 18995 19363 19376 19540
20641
1249 2946 2959 3330 4264 7797 10652 11845 12987 15974 16536 17520 19851 20150 20172
4769 11033 14937
1431 2870 15158
9416 14905 20800
1708 9944 16952
1116 1179 20743
3665 8987 16223
655 11424 17411
42 2717 11613
2787 9015 15081
3718 7305 11822
18306 18499 18843
1208 4586 10578
9494 12676 13710
10580 15127 20614
4439 15646 19861
5255 12337 14649
2532 7552 10813
1591 7781 13020
7264 8634 17208
7462 10069 17710
1320 3382 6439
4057 9762 11401
1618 7604 19881
3858 16826 17768

Rate 11/16 N=69120 ANOTHER TYPE-B 5490 5926 6153 9501 10594 12266 13298 15737 15849 16368 18972 20100 21448
2883 3284 4934 6022 6970 7082 7565 9582 10633 13616 14218 16328 17327
175 521 2754 3971 5252 9283 9285 14281 16044 16969 17080 17577 21029
2415 4516 5139 6516 10793 11827 11855 14197 14510 15207 16311 17658 20663
80 3472 7951 8080 10234 12239 17853 18113 18604 19386 20179 20679 20725
988 2274 4092 5402 5870 6505 6901 8246 8386 15629 16943 17316 18097
5692 6810 7203 7269 8586 8944 9272 9798 10328 11207 12875 17544 19096
355 1581 1785 9970 11809 12194 13440 14564 15168 15223 18191 20182 21117
667 1018 1025 2413 3831 4298 4819 6560 12059 15977 19856 20922 21207
684 3795 5098 6508 7183 7421 9179 10113 10456 10891 13305 14643 17525
159 3554 3627 6834 7991 9511 14657 15156 15986 16186 16393 20958 21460
2207 2335 2460 2869 3555 3994 6085 7103 8180 17292 20216 20261 21348
499 1362 1881 3575 5138 11393 11691 15210 18752 20530 21177 21242
5077 7604 7627 8584 8821 9172 10386 13490 14242 15449 20528 21129
1507 3244 4191 4940 5204 6376 8096 9178 9336 10454 12190 13538
2082 5646 7082 10181 12858 14150 16128 17004 17819 18937 18971 21407
237 1809 2033 6763 8105 10113 10945 11139 11237 14068 14992 15995
330 5520 5994 6525 10099 10815 13203 15021 15569 17146 18507 20783
4741 5712 6488 7075 8380 10111 13532 14029 15626 18154 18562 20413
5868 7360 8541 8769 11577 11898 11953 13672 15406 16261 17845 19412
1145 1683 2373 2477 3994 5561 8112 9087 12486 13559 15649 21244
887 3164 6234 6422 11430 11562 11788 13538 15200 15956 20795 20985
219 1673 2743 3830 8271 9190 10706 11317 12300 12854 17422 19111
1575 1795 2309 2348 4018 6919 7343 7816 10267 11376 14604 21551
1371 1736 2555 2945 4351 7124 12516 13672 15681 17083 18027 18886
1657 2039 2680 2830 8469 9134 9431 9848 12366 12933 13065 18903
1698 2963 3555 7254 9376 13944 14837 15339 15552 16532 17600 21115
325 1586 3064 5498 10061 14027 15028 16349 17719 18177 19867 20401
990 1009 3173 4310 5642 8862 12180 17278 18682 18874 18888 19573
1213 6143 9641 9722 9924 11186 11264 13174 17240 18977 19716 20530
10313 14037
3209 14570
6831 19778
5185 12416
5204 7840
11612 19708
4659 5323 14616
3845 10823 20987
7315 18851 19284
393 9282 17957
6615 9927 19581
8762 10378 18285
126 979 14823
7406 16098 21548
5070 7514 17416
10867 16714 21080
541 1786 19439
909 7175 7837
6412 21072 21433
600 14981 18811
7068 8454 13564
8869 9382 12550
2959 12960 13342
3342 16081 18877
5024 6538 11481
6968 16526 21138

Rate 12/16 N=69120 TYPE-B 1507 1536 2244 4721 6374 7839 11001 12684 13196 13602 14245 14383 14398 16182 17248
623 696 1186 1370 4409 5237 5911 8278 9539 12139 12810 13422 15525 16232 16252
530 1953 3745 5512 6676 9069 9433 10683 11530 12263 12519 14931 15326 15581 16208
273 685 3132 5872 6388 7149 7316 7367 9041 11102 11211 12059 15189 15973 16435
814 1297 1896 6018 7801 8810 9701 9992 10314 13618 13771 14934 15198 16340 16742
58 803 2553 3967 6032 8374 9168 10047 10073 10909 12701 12748 13543 14111 17043
1082 1577 2108 2344 5035 5051 10038 10356 12156 12308 13815 15453 15830 16305 17234
1882 3731 5182 5554 6330 6605 7126 10195 10508 12151 12191 12241 12288 13755 16472
85 604 1278 3768 4831 6820 9471 10773 10873 12785 12973 13623 14562 14697 16811
928 1864 6027 7023 7644 8279 8580 9221 9417 9883 12032 12483 12734 14335 15842
2104 2752 4530 4820 5662 9197 9464 9972 10057 11079 12408 13005 13684 15507 16295
82 752 3374 4026 7265 8112 12236 12434 12460 13110 13495 15110 15299 15359 17221
1137 1411 1546 1614 1835 6053 6151 8618 9059 14057 14941 15670 16321 16965
447 1960 2369 2861 3047 3508 4077 4358 4370 5806 12517 13658 14371 14749
420 981 1657 2313 3353 4699 5094 5184 10076 10530 11521 13040 15960 16853
3572 3851 3870 5218 6400 6780 9167 9603 10328 10543 12892 13722 16910 16929
203 2588 4522 4692 5399 6840 7417 8896 9045 9188 10390 12507 12615 16386
543 1262 2536 4358 7658 7714 9392 11079 12283 12694 14734 16195 16317 16751
905 1059 3393 4347 4554 4758 5568 8652 9991 10717 10975 11146 12824 16373
1229 2308 4876 5329 5424 5906 6227 6667 7141 7697 12055 12969 13582 16638
697 1864 2560 4190 5097 5288 6565 9150 9282 9519 10727 12492 13292 16924
363 3152 3715 3722 4582 5050 8399 9413 9851 10305 12116 13471 15318 16018
338 2342 2404 4733 6189 6792 7251 7921 8509 8579 8729 11921 12900 15546
1630 1867 2018 3038 3202 6364 7648 8692 9496 9705 10433 13508 14583 16341
1041 2754 3015 3427 3512 4351 5174 6539 8100 8639 9912 11911 12666 14187
1134 1619 4758 5545 6842 7045 8421 10373 10390 12672 13484 15178 16697 16727
589 652 1174 2157 3951 4733 5278 5859 7619 9488 11665 12335 15516 16024
1457 1832 2525 3690 5093 6000 6276 7974 8652 9759 10434 15025 15267 16448
932 3328 3349 3511 4776 6266 6711 7761 8674 9748 11167 12134 12942 14354
1939 1979 3141 4238 6715 7148 7673 12025 12455 14829 14989 15081 16491 17242
1363 2451
1953 10230
6218 7655
9302 15856
10461 10503
9005 16075
878 14223 15181
3535 5327 14405
8116 8396 9828
2864 6306 14832
24 11009 16377
7064 11014 16139
4318 8353 14997
583 5626 10217
11196 13669 16585
6123 7518 9304
2258 8250 12082
7564 14195 15236
10104 10233 13778
2044 7801 11705
10906 11443 13227
1592 7853 14796
3054 8887 13077
6486 7003 9238
424 9055 13390
618 4077 11120

Rate 12/16 N=69120 ANOTHER TYPE-B 142 2165 3185 4195 5590 5742 7410 10850 12863 13660 14020 16831
397 3640 4105 7434 9470 9491 11337 11448 13018 13562 14133 16512
56 1940 2743 5216 6347 8608 9778 11569 12156 14913 15519 16598
791 4323 4700 5211 6469 8199 12509 13542 14292 14489 16171 16605
1818 3304 4541 5563 5792 6609 6684 7166 8280 13868 14456 15283
1293 5440 5814 6864 7396 7860 8007 8929 9766 10275 14026 16130
315 1405 1943 9455 10782 11634 12127 12159 12802 14565 16894 16955
553 777 857 3044 3415 3866 5269 5942 8716 9617 15845 16739
541 3047 4121 5219 5750 7341 8094 8377 10625 11751 14027 16778
114 2846 2917 5468 6412 7606 11745 12096 12808 12931 13150 17183
1757 1833 1954 2287 2852 3178 4890 5688 6571 13856 16191 17042
436 1494 2848 4085 9080 9348 12151 14977 16140 16443 16917 16995
1083 4047 6060 6867 7084 7325 8350 10757 11419 12374 16450 16904
1239 2629 3357 3945 4129 5112 6106 6439 7300 7470 9760 10841
1634 4538 5696 8145 8363 11300 12883 13607 14248 15134 15181 17123
161 1476 1584 5398 6524 8082 8757 8927 9018 10297 11238 12799
283 4460 4788 8081 8652 10590 11954 12024 12443 13684 14830 16639
3817 4569 5212 5225 5642 6709 8069 10835 11184 12541 14503 16342
4688 5857 7055 9256 9523 9555 10935 12296 13024 14271 14842 15510
950 1364 1886 2001 3202 4445 6861 7266 10005 10827 12503 17034
676 2506 5170 6505 9123 9223 9428 10841 12158 12720 16647 16796
160 1341 2169 3030 4986 6616 7382 8557 9035 9855 10304 13928
1275 1429 1905 3211 5541 5874 6259 8254 9098 11688 15281 17260
1092 1367 1825 2046 3468 5686 10019 10898 12575 13663 14429 15077
1321 1604 2153 2296 2364 7328 7554 7888 9903 10391 10427 15163
1346 2379 2878 5786 6798 7501 11153 11894 12245 12440 13244 16895
240 1276 2457 4404 8038 11188 12037 13089 14099 14497 15895 16362
799 813 2506 3447 4526 7075 9747 13800 14189 14949 15078 15106
988 4928 7720 7814 8950 9006 10522 13788 15213 15671 15755 16432
850 1927 4131 4155 5432 6209 7913 7946 8159 11227 11630 15452
14826 16365
11703 12119
712 13566
3116 11731
7615 15442
1992 5349
221 4010 5696
7888 12867 13468
3483 10904 13985
443 8895 11950
6009 10985 12686
2658 6385 13354
8724 15844 16946
5553 10363 16261
2195 5238 10663
598 14905 15764
1356 4805 10512
1933 5558 9695
2230 7616 10698
1298 2645 10290
4025 8617 14782
9819 10189 16907
1284 4501 8928
10113 10629 17016
947 10255 11116
2798 15081 15460

Rate 13/16 N=69120 TYPE-B 1031 4123 6253 6610 8007 8656 9181 9404 9596 11501 11654 11710 11994 12177
399 553 1442 2820 4402 4823 5011 5493 7070 8340 8500 9054 11201 11387
201 607 1428 2354 5358 5524 6617 6785 7708 10220 11970 12268 12339 12537
36 992 1930 4525 5837 6283 6887 7284 7489 7550 10329 11202 11399 12795
589 1564 1747 2960 3833 4502 7491 7746 8196 9567 9574 10187 10591 12947
804 1177 1414 3765 4745 7594 9126 9230 9251 10299 10336 11563 11844 12209
2774 2830 3918 4148 4963 5356 7125 7645 7868 8137 9119 9189 9206 12363
59 446 947 3622 5139 8115 9364 9548 9609 9750 10212 10937 11044 12668
715 1352 4538 5277 5729 6210 6418 6938 7090 7109 7386 9012 10737 11893
1583 2059 3398 3619 4277 6896 7484 7525 8284 9318 9817 10227 11636 12204
53 549 3010 5441 6090 9175 9336 9358 9839 10117 11307 11467 11507 12902
861 1054 1177 1201 1383 2538 4563 6451 6800 10540 11222 11757 12240 12732
330 1450 1798 2301 2652 3038 3187 3277 4324 4610 9395 10240 10796 11100
316 751 1226 1746 2124 2505 3497 3833 3891 7551 8696 9763 11978 12661
2677 2888 2904 3923 4804 5105 6855 7222 7893 7907 9674 10274 12683 12702
173 3397 3520 5131 5560 6666 6783 6893 7742 7842 9364 9442 12287
421 943 1893 1920 3273 4052 5758 5787 7043 11051 12141 12209 12500
679 792 2543 3243 3385 3576 4190 7501 8233 8302 9212 9522 12286
911 3651 4023 4462 4650 5336 5762 6506 8050 8381 9636 9724 12486
1373 1728 1911 4101 4913 5003 6859 7137 8035 9056 9378 9937 10184
515 2357 2779 2797 3163 3845 3976 6969 7704 9104 10102 11507 12700
270 1744 1804 3432 3782 4643 5946 6279 6549 7064 7393 11659 12002
261 1517 2269 3554 4762 5103 5460 6429 6464 8962 9651 10927 12268
782 1217 1395 2383 5754 6060 6540 7109 7286 7438 7846 9488 10119
2070 2247 2589 2644 3270 3875 4901 6475 8953 10090 10629 12496 12547
863 1190 1609 2971 3564 4148 5123 5262 6301 7797 7804 9517 11408
449 488 865 3549 3939 4410 4500 5700 7120 8778 9223 11660 12021
1107 1408 1883 2752 3818 4714 5979 6485 7314 7821 11290 11472 12325
713 2492 2507 2641 3576 4711 5021 5831 7334 8362 9094 9690 10778
1487 2344 5035 5336 5727 6495 9009 9345 11090 11261 11314 12383 12944
1038 1463 1472 2944 3202 5742 5793 6972 7853 8919 9808 10549 12619
134 957 2018 2140 2629 3884 5821 7319 8676 10305 10670 12031 12588
5294 9842
4396 6648
2863 5308
10467 11711
3412 6909
450 3919
5639 9801
298 4323
397 10223
4424 9051
2038 2376
5889 11321 12500
3590 4081 12684
3485 4016 9826
6 2869 8310
5983 9818 10877
2282 9346 11477
4931 6135 10473
300 2901 9937
3185 5215 7479
472 5845 5915
2476 7687 11934
3279 8782 11527
4350 7138 7144

Rate 13/16 N=69120 ANOTHER TYPE-B 27 138 512 3648 6422 7200 7557 7879 8302 10042 12340 12482
654 1411 2309 2394 2617 4009 5321 5725 6321 8138 11632 12041
920 1594 2256 2572 3039 3367 4787 4869 7115 8111 10119 11192
1556 1717 1827 2370 2446 3120 4228 4487 6608 6866 10373 10452
1151 1671 2238 3557 4755 5885 6265 7650 9526 9837 9946 10224
446 525 897 1165 8246 10195 10688 10768 10792 12143 12187 12955
1008 3306 3957 4122 4448 6200 7142 9087 9602 10049 11651 12175
399 5015 6604 7077 8014 8665 9207 9372 11161 11503 11677 11992
538 1475 2369 2818 4424 4805 5503 8325 8394 9038 11400
190 593 1430 5341 5541 6607 6796 10193 11986 12256 12326
56 1002 4503 5839 7278 7492 7732 10356 11205 11401 12563
597 1937 2970 4522 6295 6913 7515 7536 9519 10152 12803
793 1554 1755 3782 7529 7765 8204 9551 10336 10556 12947
1169 1414 3763 4723 9110 9224 9261 10325 11591 11864 12240
2800 3882 4166 4965 5362 7650 7862 9124 9130 9201 12351
481 965 2839 3617 7103 8066 8168 9724 10200 10932 12651
62 708 1338 5185 6408 9005 9369 9559 9608 11039 11887
3419 4514 5267 5727 6217 6933 7089 7104 7414 10746 12224
1556 2080 3630 4222 7467 7551 8302 9301 9736 10255 11640
553 3008 5461 6093 6897 9161 9340 9847 10143 11319 11456
60 1391 2546 9359 10530 11218 11515 11750 12251 12718 12916
835 1078 1157 1217 4537 4614 6476 6770 9393 10224 10768
350 1475 1774 2139 2271 2636 3051 3198 3305 4326 11083
311 1742 2486 3492 3819 3912 7554 8672 9776 11970 12655
754 1252 2676 2897 3921 5087 6844 7221 7889 12685 12688
2905 3413 4795 6889 7767 7808 7885 9380 9432 9657 10282
179 933 1916 3494 4062 5134 5560 6669 6785 12166 12295
402 1875 3265 5735 5778 7035 8294 9535 11028 12208 12518
655 813 2536 3263 3389 3565 4184 7498 8212 9204 12304
4021 4438 4647 5363 5778 6514 8050 8383 9641 9733 12479
906 1754 1917 3669 4083 4928 4973 6870 9048 9936 10173
506 1395 3160 3836 3961 6967 7145 8035 9374 10091 12696
3530 11498
2796 10372
8659 9088
4259 6291
11049 12016
270 11119
1751 8793
1882 5943
8569 11663
3543 7916
252 1030
9665 10929
1394 3968 5448
281 337 11360
1609 5754 9754
906 1195 8105
8990 10130 12550
6509 9483 10115
6141 7428 10545
8857 9027 10637
3631 4907 12244
6724 7578 12649
2266 2719 7243
838 1443 3616

Rate 14/16 N=69120 TYPE-B 387 648 945 3023 3889 4856 5002 5167 6868 7477 7590 8165 8354
42 406 1279 1968 3016 4196 4599 4996 5019 6350 6785 7051 8529
534 784 1034 1160 2530 5033 5171 5469 6167 6372 6913 7718 8621
944 2506 2806 3149 3559 5101 6076 6083 6092 6147 6866 7908 8155
308 1869 1888 2569 3297 4742 5232 5442 6135 6814 7284 8238 8405
34 464 667 899 2421 3425 5382 6258 6373 6399 6489 7367 7922
2276 3014 3525 3829 4135 4276 4611 4733 4738 4956 6025 7152 8155
1047 1370 2406 2819 4600 4991 5017 5590 6199 6483 6556 6834 7760
66 380 2033 3698 4068 6096 6223 6238 6757 7541 7641 7677 8595
562 697 782 808 921 1703 3032 4300 7027 7481 7839 8160 8526
236 962 1557 2023 2135 2190 2892 3072 4523 6254 6838 7209 7381
196 1167 1179 1426 1675 1763 2345 2560 2613 5024 5761 6522 7973
512 822 1778 1924 2610 3445 4570 4805 5263 5299 8439 8448 8464
1923 2270 3204 3698 4456 4522 4601 5161 5207 6260 6310 6441 6851
104 281 622 1276 2172 2334 2731 3417 3854 4698 8095 8195 8333
451 528 1269 2169 2274 2393 3853 5002 5543 6121 6351 7364 8139
1685 2675 2790 2953 3103 3560 4336 5372 5495 5568 6429 6492 8206
604 1190 1279 2427 2714 3283 3312 3855 4566 6045 6664 6788 8317
338 917 1873 2102 2561 2655 4635 4765 5370 6249 6724 7668 8456
184 1166 1583 1859 2376 2521 3093 4181 4713 4926 5146 6070 8004
175 1227 2367 3402 3628 3982 4265 4282 4355 5972 6434 7280 7765
801 922 1029 1531 1606 3170 3824 4358 4732 4849 5225 6759 8183
509 1507 1704 1765 2183 2574 3271 4050 4299 4964 5968 6324 7091
567 795 1376 2390 2767 3424 5195 6355 6726 7607 8346 8352
308 1060 1973 2364 2937 3526 4221 4745 5185 5845 6146 7762
323 590 732 917 2636 3008 3792 3990 4322 4893 5211 8014
471 1249 1674 1841 2567 3124 3130 4885 5575 7521 7648 8227
1582 1669 1772 2386 3340 3387 3881 4322 6018 6055 6488 7177
976 1003 2127 3575 3816 6225 7404 7499 7542 8237 8421 8630
675 961 1957 3825 3858 4646 5248 5801 5940 6533 7040 8037
79 639 1363 1436 1763 2570 3874 4876 6870 6886 7104 8399
20 297 1330 2264 3287 3534 4441 4746 6569 6971 6976 8179
482 1125 1589 2892 3759 3871 4635 6038 6214 6796 6816 7621
1127 3336 3867 3929 4269 4794 5054 5842 6471 6547 7039 8560
217 1521
1983 8283
3731 4402
208 6703
242 4988
4170 5038
4108 8035
3301 8543
3168 8249
5028 5838
3470 8597
2901 5264
2505 4505
934 5117
1712 5819
3165 7273
3274 6115
4576 6330 7327
5380 6732 8439
2474 3723 7782
384 2783 5846
1453 4436 6625

Rate 14/16 N=69120 ANOTHER TYPE-B 95 128 735 809 2382 2719 4381 4445 4500 5651 6000 6009 6400 7394
2222 2648 2825 4051 4054 4330 5281 5407 6228 6263 6861 7261 8175 8307
1954 2285 2329 2649 2954 3340 3544 4626 4776 5451 5603 6158 7148 7422
465 677 939 1007 1600 2226 3425 3645 4766 5036 5404 6247 6539 7760
442 1249 2489 2579 3259 4572 4608 4726 5439 6095 6378 8317 8378 8574
74 663 1080 1534 3128 3293 3730 4292 4521 4924 5148 6979 7633 8630
638 689 717 916 939 1607 2766 2992 4129 4543 5450 5845 6883 7205
598 659 812 1014 1066 1245 1731 2847 3656 3775 4960 4992 6300 7578
673 1149 1176 1436 2884 3475 3951 5169 5226 5591 5950 6603 7573 8426
127 629 1242 2196 3758 4017 6013 6128 6232 6538 7073 7307 7946 8166
388 401 1268 1814 2256 3549 4884 5615 6895 7107 7474 7544 7551 7825
523 2477 3119 3849 3901 3978 4486 4518 5258 5593 6899 7587 7912 8215
421 1000 2064 2070 2723 3941 4076 4640 5827 5846 6525 7719 8169
353 1017 1995 2566 2574 2651 4356 5860 6711 6970 7567 7727 8522
238 257 1225 2032 3000 3955 4116 4325 5462 5932 6285 6680 6994
365 523 2306 2379 4362 5344 5993 7473 7500 7861 8116 8431 8492
1119 1320 1993 2434 2783 3032 3758 4830 5154 5206 5339 5516 6453
1209 2599 2786 3404 4309 4487 4753 5051 5064 5100 5170 5558 7108
1551 1696 2789 3142 4097 4267 5178 5815 6165 7088 7731 7806 8269
60 1189 1720 3119 6403 6586 6603 7019 7623 7732 7934 8081 8157
500 1218 1227 1422 1558 1901 3610 4263 4273 4704 4730 5192 6489
146 377 437 1477 2328 2785 4195 6535 7595 7662 7718 7894 8601
36 453 1103 3738 4136 4580 6604 6917 7166 7538 8002 8105 8632
873 3043 3334 4506 4620 4638 5016 5608 6251 6383 6781 6795 8253
185 223 1023 2907 3101 3330 3654 4088 5876 6460 6482 7657 7838
540 583 1507 2890 2997 3820 4288 4571 5231 7105 7311 7401 7916
761 1368 2218 2456 2562 2701 4744 5161 5247 6038 6430 6551 6957
1003 1115 4045 4052 4491 5573 6070 6225 6528 6770 7087 8484 8526
945 1500 2141 2862 5895 5924 6589 6680 7360 7831 7920 7939 8188
282 686 1010 2301 2830 3248 4635 4810 4847 5099 5873 5905 6844
1796 3108 3214 3282 3746 4286 4995 6281 7235 7276 7773 8245 8328
1349 1762 1823 1935 2526 3184 3511 4531 6070 6697 6969 7190 7760
984 1410 2807 3035 3992 4082 4605 5097 5115 6391 6692 8362 8476
757 1281 1736 2103 4164 5905 6331 7278 7514 8213 8396 8440 8465
645 4414
1338 8195
1237 5945
1000 7040
1171 8124
68 2695
3561 5194
1561 3302
4487 6075
3508 8439
2166 2546
1368 1397
785 6326
657 4177
2314 4074
587 5476
1487 5944 6170
3645 6414 7448
1927 3790 6692
1176 4020 7527
1237 5395 6965
83 928 3291

LIST OF COLUMN WEIGHT DISTRIBUTION AND PERFORMANCE THRESHOLD:

| Rate | X1 | Y1 | K1 | X2 | Y2 | K2 | X3 | M1 | M2 | PERFORMANCE THRESHOLD (Es/N0) |
|---|---|---|---|---|---|---|---|---|---|---|
| 2/16 | 18 | 3 | 2520 | 17 | 3 | 6120 | 17 | 1800 | 58680 | -6.813095 |
| 3/16 | 13 | 3 | 11160 | 12 | 3 | 1800 | 12 | 1800 | 54360 | -4.865416 |
| 4/16 | 18 | 3 | 360 | 10 | 3 | 16920 | 10 | 1800 | 50040 | -3.416395 |
| 5/16 | 10 | 2 | 2520 | 8 | 3 | 19080 | 8 | 1800 | 45720 | -2.220124 |
| 6/16 | 9 | 2 | 8280 | 6 | 3 | 17640 | 9 | 1800 | 41400 | -1.188440 |
| 7/16 | 9 | 2 | 15480 | 2 | 3 | 14760 | 5 | 4680 | 34200 | -0.237234 |
| 8/16 | 7 | 2 | 22680 | 2 | 3 | 11880 | 3 | 3240 | 31320 | 0.603630 |

FIG. 91

| | Rate | X1 | KX1 | X2 | KX2 | Y1 | KY1 | Y2 | KY2 | M | PERFORMANCE THRESHOLD (Es/N0) |
|---|---|---|---|---|---|---|---|---|---|---|---|
| TYPE-B | 7/16 | – | 0 | 20 | 6480 | 4 | 6480 | 3 | 17280 | 38880 | −0.093497 |
| ANOTHER TYPE-B | 7/16 | 21 | 4320 | 20 | 2160 | 4 | 6480 | 3 | 17280 | 38880 | −0.095051 |
| TYPE-B | 8/16 | – | 0 | 24 | 5760 | 6 | 5760 | 3 | 23040 | 34560 | 0.668232 |
| ANOTHER TYPE-B | 8/16 | 22 | 4320 | 21 | 1440 | 6 | 5760 | 3 | 23040 | 34560 | 0.677172 |
| TYPE-B | 9/16 | 16 | 7560 | 15 | 1440 | 4 | 1080 | 3 | 28800 | 30240 | 1.428823 |
| ANOTHER TYPE-B | 9/16 | 16 | 3960 | 14 | 5040 | 4 | 1080 | 3 | 28800 | 30240 | 1.437271 |
| TYPE-B | 10/16 | 17 | 2880 | 16 | 6120 | 4 | 1080 | 3 | 33120 | 25920 | 2.16195 |
| ANOTHER TYPE-B | 10/16 | 18 | 2520 | 17 | 6480 | 4 | 1080 | 3 | 33120 | 25920 | 2.155295 |
| TYPE-B | 11/16 | – | 0 | 15 | 10080 | – | 0 | 3 | 37440 | 21600 | 2.911363 |
| ANOTHER TYPE-B | 11/16 | 13 | 4320 | 12 | 6480 | 2 | 2160 | 3 | 34560 | 21600 | 2.935036 |
| TYPE-B | 12/16 | 15 | 4320 | 14 | 6480 | 2 | 2160 | 3 | 38880 | 17280 | 3.683039 |
| ANOTHER TYPE-B | 12/16 | – | 0 | 12 | 10800 | 2 | 2160 | 3 | 38880 | 17280 | 3.712254 |
| TYPE-B | 13/16 | 14 | 5400 | 13 | 6120 | 2 | 3960 | 3 | 40680 | 12960 | 4.524858 |
| ANOTHER TYPE-B | 13/16 | 12 | 2880 | 11 | 8640 | 2 | 4320 | 3 | 40320 | 12960 | 4.552867 |
| TYPE-B | 14/16 | 13 | 8280 | 12 | 3960 | 2 | 6120 | 3 | 42120 | 8640 | 5.498004 |
| ANOTHER TYPE-B | 14/16 | 14 | 4320 | 13 | 7920 | 2 | 5760 | 3 | 42480 | 8640 | 5.492328 |

FIG. 92

| Input Data Cell y | Constellation Point $z_s$ |
|---|---|
| 00 | $(1+j1)/\sqrt{2}$ |
| 01 | $(-1+j1)/\sqrt{2}$ |
| 10 | $(+1-j1)/\sqrt{2}$ |
| 11 | $(-1-j1)/\sqrt{2}$ |

FIG. 93

| w/CR | 2/15 | 3/15 | 4/15 | 5/15 | 6/15 | 7/15 |
|---|---|---|---|---|---|---|
| w0 | 0. 7062+j0. 7075 | 0. 3620+j0. 5534 | 0. 3412+j0. 5241 | 0. 3192+j0. 5011 | 0. 5115+j1. 2092 | 0. 2592+j0. 4888 |
| w1 | 0. 7075+j0. 7062 | 0. 5534+j0. 3620 | 0. 5241+j0. 3412 | 0. 5011+j0. 3192 | 1. 2092+j0. 5115 | 0. 4888+j0. 2592 |
| w2 | 0. 7072+j0. 7077 | 0. 5940+j1. 1000 | 0. 5797+j1. 1282 | 0. 5575+j1. 1559 | 0. 2663+j0. 4530 | 0. 5072+j1. 1980 |
| w3 | 0. 7077+j0. 7072 | 1. 1000+j0. 5940 | 1. 1282+j0. 5797 | 1. 1559+j0. 5575 | 0. 4530+j0. 2663 | 1. 1980+j0. 5072 |

| w/CR | 8/15 | 9/15 | 10/15 | 11/15 | 12/15 | 13/15 |
|---|---|---|---|---|---|---|
| w0 | 0. 2535+j0. 4923 | 0. 2386+j0. 5296 | 0. 4487+j1. 1657 | 0. 9342+j0. 9847 | 0. 9555+j0. 9555 | 0. 9517+j0. 9511 |
| w1 | 0. 4923+j0. 2535 | 0. 5296+j0. 2386 | 1. 2080+j0. 5377 | 0. 9866+j0. 2903 | 0. 9555+j0. 2949 | 0. 9524+j0. 3061 |
| w2 | 0. 4927+j1. 2044 | 0. 4882+j1. 1934 | 0. 2213+j0. 4416 | 0. 2716+j0. 9325 | 0. 2949+j0. 9555 | 0. 3067+j0. 9524 |
| w3 | 1. 2044+j0. 4927 | 1. 1934+j0. 4882 | 0. 6186+j0. 2544 | 0. 2901+j0. 2695 | 0. 2949+j0. 2949 | 0. 3061+j0. 3067 |

FIG. 94

| u/CR | 2/15 | 3/15 | 4/15 | 5/15 | 6/15 | 7/15 |
|---|---|---|---|---|---|---|
| u0 | 0.3317 | 0.2382 | 0.1924 | 0.1313 | 0.1275 | 0.0951 |
| u1 | 0.3321 | 0.2556 | 0.1940 | 0.1311 | 0.1276 | 0.0949 |
| u2 | 0.3322 | 0.2749 | 0.2070 | 0.1269 | 0.1294 | 0.1319 |
| u3 | 0.3321 | 0.2558 | 0.2050 | 0.1271 | 0.1295 | 0.1322 |
| u4 | 0.3327 | 0.2748 | 0.3056 | 0.3516 | 0.3424 | 0.3170 |
| u5 | 0.3328 | 0.2949 | 0.3096 | 0.3504 | 0.3431 | 0.3174 |
| u6 | 0.3322 | 0.2749 | 0.2890 | 0.3569 | 0.3675 | 0.3936 |
| u7 | 0.3322 | 0.2558 | 0.2854 | 0.3581 | 0.3666 | 0.3921 |
| u8 | 0.9369 | 0.9486 | 0.7167 | 0.6295 | 0.6097 | 0.5786 |
| u9 | 0.9418 | 0.8348 | 0.7362 | 0.6301 | 0.6072 | 0.5789 |
| u10 | 0.9514 | 0.7810 | 0.7500 | 0.6953 | 0.7113 | 0.7205 |
| u11 | 0.9471 | 0.8348 | 0.7326 | 0.6903 | 0.7196 | 0.7456 |
| u12 | 0.9448 | 0.9463 | 0.9667 | 0.9753 | 0.9418 | 0.9299 |
| u13 | 0.9492 | 0.8336 | 0.9665 | 1.0185 | 1.0048 | 1.0084 |
| u14 | 0.9394 | 0.9459 | 1.1332 | 1.2021 | 1.2286 | 1.2349 |
| u15 | 0.9349 | 1.4299 | 1.4761 | 1.4981 | 1.5031 | 1.5118 |

| u/CR | 8/15 | 9/15 | 10/15 | 11/15 | 12/15 | 13/15 |
|---|---|---|---|---|---|---|
| u0 | 0.0773 | 0.0638 | 0.0592 | 0.0502 | 0.0354 | 0.0325 |
| u1 | 0.0773 | 0.0638 | 0.0594 | 0.0637 | 0.0921 | 0.0967 |
| u2 | 0.1614 | 0.1757 | 0.1780 | 0.1615 | 0.1602 | 0.1623 |
| u3 | 0.1614 | 0.1756 | 0.1790 | 0.1842 | 0.2185 | 0.2280 |
| u4 | 0.3086 | 0.3069 | 0.2996 | 0.2760 | 0.2910 | 0.2957 |
| u5 | 0.3085 | 0.3067 | 0.3041 | 0.3178 | 0.3530 | 0.3645 |
| u6 | 0.4159 | 0.4333 | 0.4241 | 0.4040 | 0.4264 | 0.4361 |
| u7 | 0.4163 | 0.4343 | 0.4404 | 0.4686 | 0.4947 | 0.5100 |
| u8 | 0.5810 | 0.5765 | 0.5561 | 0.5535 | 0.5763 | 0.5878 |
| u9 | 0.5872 | 0.5862 | 0.6008 | 0.6362 | 0.6531 | 0.6696 |
| u10 | 0.7213 | 0.7282 | 0.7141 | 0.7293 | 0.7417 | 0.7566 |
| u11 | 0.7604 | 0.7705 | 0.8043 | 0.8302 | 0.8324 | 0.8497 |
| u12 | 0.9212 | 0.9218 | 0.9261 | 0.9432 | 0.9386 | 0.9498 |
| u13 | 1.0349 | 1.0364 | 1.0639 | 1.0704 | 1.0529 | 1.0588 |
| u14 | 1.2281 | 1.2234 | 1.2285 | 1.2158 | 1.1917 | 1.1795 |
| u15 | 1.4800 | 1.4646 | 1.4309 | 1.3884 | 1.3675 | 1.3184 |

FIG. 95A

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 1 | 1 | 1 | 1 | 1 | 1 | 1 | 1 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 0 | 0 | 0 | 0 | 0 | 0 | 0 | 0 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Re(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 95B

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 1 | 1 | 1 | 1 | 1 | 1 | 1 | 1 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 0 | 0 | 0 | 0 | 0 | 0 | 0 | 0 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Im(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 96

| | | |
|---|---|---|
| $y_{0,q}$ | 1 | 0 |
| $Re(z_q)$ | -1 | 1 |

FIG. 97

| | | |
|---|---|---|
| $y_{1,q}$ | 1 | 0 |
| $Im(z_q)$ | -1 | 1 |

FIG. 98

| | | | | |
|---|---|---|---|---|
| $y_{0,q}$<br>$y_{2,q}$ | 1<br>0 | 1<br>1 | 0<br>1 | 0<br>0 |
| $Re(z_q)$ | -3 | -1 | 1 | 3 |

FIG. 99

| | | | | |
|---|---|---|---|---|
| $y_{1,q}$<br>$y_{3,q}$ | 1<br>0 | 1<br>1 | 0<br>1 | 0<br>0 |
| $Im(z_q)$ | -3 | -1 | 1 | 3 |

FIG. 100

| | | | | | | | | |
|---|---|---|---|---|---|---|---|---|
| $y_{0,q}$ | 1 | 1 | 1 | 1 | 0 | 0 | 0 | 0 |
| $y_{2,q}$ | 0 | 0 | 1 | 1 | 1 | 1 | 0 | 0 |
| $y_{4,q}$ | 0 | 1 | 1 | 0 | 0 | 1 | 1 | 0 |
| $Re(z_q)$ | −7 | −5 | −3 | −1 | 1 | 3 | 5 | 7 |

FIG. 101

| | | | | | | | | |
|---|---|---|---|---|---|---|---|---|
| $y_{1,q}$ | 1 | 1 | 1 | 1 | 0 | 0 | 0 | 0 |
| $y_{3,q}$ | 0 | 0 | 1 | 1 | 1 | 1 | 0 | 0 |
| $y_{5,q}$ | 0 | 1 | 1 | 0 | 0 | 1 | 1 | 0 |
| $Im(z_q)$ | −7 | −5 | −3 | −1 | 1 | 3 | 5 | 7 |

FIG. 102

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 0 | 0 | 0 | 0 | 0 | 0 | 0 | 0 |
| $y_{2,q}$ | 0 | 0 | 0 | 0 | 1 | 1 | 1 | 1 | 1 | 1 | 1 | 1 | 0 | 0 | 0 | 0 |
| $y_{4,q}$ | 0 | 0 | 1 | 1 | 1 | 1 | 0 | 0 | 0 | 0 | 1 | 1 | 1 | 1 | 0 | 0 |
| $y_{6,q}$ | 0 | 1 | 1 | 0 | 0 | 1 | 1 | 0 | 0 | 1 | 1 | 0 | 0 | 1 | 1 | 0 |
| $Re(z_q)$ | −15 | −13 | −11 | −9 | −7 | −5 | −3 | −1 | 1 | 3 | 5 | 7 | 9 | 11 | 13 | 15 |

FIG. 103

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 0 | 0 | 0 | 0 | 0 | 0 | 0 | 0 |
| $y_{3,q}$ | 0 | 0 | 0 | 0 | 1 | 1 | 1 | 1 | 1 | 1 | 1 | 1 | 0 | 0 | 0 | 0 |
| $y_{5,q}$ | 0 | 0 | 1 | 1 | 1 | 1 | 0 | 0 | 0 | 0 | 1 | 1 | 1 | 1 | 0 | 0 |
| $y_{7,q}$ | 0 | 1 | 1 | 0 | 0 | 1 | 1 | 0 | 0 | 1 | 1 | 0 | 0 | 1 | 1 | 0 |
| $Im(z_q)$ | −15 | −13 | −11 | −9 | −7 | −5 | −3 | −1 | 1 | 3 | 5 | 7 | 9 | 11 | 13 | 15 |

FIG. 104

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | −31 | −29 | −27 | −25 | −23 | −21 | −19 | −17 | −15 | −13 | −11 | −9 | −7 | −5 | −3 | −1 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | 1 | 3 | 5 | 7 | 9 | 11 | 13 | 15 | 17 | 19 | 21 | 23 | 25 | 27 | 29 | 31 |

FIG. 105

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | −31 | −29 | −27 | −25 | −23 | −21 | −19 | −17 | −15 | −13 | −11 | −9 | −7 | −5 | −3 | −1 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | 1 | 3 | 5 | 7 | 9 | 11 | 13 | 15 | 17 | 19 | 21 | 23 | 25 | 27 | 29 | 31 |

FIG. 106

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | −63 | −61 | −59 | −57 | −55 | −53 | −51 | −49 | −47 | −45 | −43 | −41 | −39 | −37 | −35 | −33 |

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | −31 | −29 | −27 | −25 | −23 | −21 | −19 | −17 | −15 | −13 | −11 | −9 | −7 | −5 | −3 | −1 |

| | | | | | | | | | | | | | | | | |
|---|---|---|---|---|---|---|---|---|---|---|---|---|---|---|---|---|
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 1 | 3 | 5 | 7 | 9 | 11 | 13 | 15 | 17 | 19 | 21 | 23 | 25 | 27 | 29 | 31 |

| | | | | | | | | | | | | | | | | |
|---|---|---|---|---|---|---|---|---|---|---|---|---|---|---|---|---|
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 33 | 35 | 37 | 39 | 41 | 43 | 45 | 47 | 49 | 51 | 53 | 55 | 57 | 59 | 61 | 63 |

FIG. 107

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | -63 | -61 | -59 | -57 | -55 | -53 | -51 | -49 | -47 | -45 | -43 | -41 | -39 | -37 | -35 | -33 |
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | -31 | -29 | -27 | -25 | -23 | -21 | -19 | -17 | -15 | -13 | -11 | -9 | -7 | -5 | -3 | -1 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | 1 | 3 | 5 | 7 | 9 | 11 | 13 | 15 | 17 | 19 | 21 | 23 | 25 | 27 | 29 | 31 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | 33 | 35 | 37 | 39 | 41 | 43 | 45 | 47 | 49 | 51 | 53 | 55 | 57 | 59 | 61 | 63 |

FIG. 108

| w/CR | 2/16 | 4/16 | 6/16 | 8/16 | 10/16 | 12/16 | 14/16 |
|---|---|---|---|---|---|---|---|
| w0 | 0.707107+j0.707107 | 0.707107+j0.707107 | 0.463340+j0.284191 | 0.457029+j0.264235 | 0.493628+j0.253004 | 0.418917+j0.217263 | 0.297592−j0.297592 |
| w1 | 0.707107+j0.707107 | 0.707107+j0.707107 | 0.284191+j0.463340 | 0.264235+j0.457029 | 0.253004+j0.493628 | 0.257080+j0.857759 | 0.297592−j0.954693 |
| w2 | 0.707107+j0.707107 | 0.707107+j0.707107 | 1.182750+j0.530940 | 1.210202+j0.506871 | 1.204042+j0.492548 | 1.144505+j0.432606 | 0.954693−j0.297592 |
| w3 | 0.707107+j0.707107 | 0.707107+j0.707107 | 0.530940+j1.182750 | 0.506871+j1.210202 | 0.492548+j1.204042 | 0.565817+j1.208627 | 0.954693−j0.954693 |

FIG. 109

| w/CR | 3/16 | 5/16 | 7/16 | 9/16 | 11/16 | 13/16 |
|---|---|---|---|---|---|---|
| w0 | 0.587870+j0.405339 | 0.453023+j0.268280 | 0.541390+j0.300280 | 0.608698+j0.348004 | 0.611105+j0.349327 | 0.700327+j0.329907 |
| w1 | 0.587870+j0.405339 | 0.453023+j0.268280 | 0.559888+j0.242973 | 0.673707+j0.198861 | 0.675905+j0.146781 | 0.886256+j0.139511 |
| w2 | 0.587870+j0.405339 | 0.453023+j0.268280 | 0.357657+j0.209444 | 0.301149+j0.169880 | 0.253839+j0.153788 | 0.447489+j0.131347 |
| w3 | 0.587870+j0.405339 | 0.453023+j0.268280 | 0.355982+j0.194677 | 0.302029+j0.151421 | 0.251152+j0.128725 | 0.198015+j0.101308 |
| w4 | 0.405339+j0.587870 | 0.268280+j0.453023 | 0.300280+j0.541390 | 0.348004+j0.608698 | 0.413770+j0.616005 | 0.449892+j0.566892 |
| w5 | 0.405339+j0.587870 | 0.268280+j0.453023 | 0.242973+j0.559888 | 0.198861+j0.673707 | 0.174887+j0.744087 | 0.142663+j0.668940 |
| w6 | 0.405339+j0.587870 | 0.268280+j0.453023 | 0.209444+j0.357657 | 0.169880+j0.301149 | 0.162356+j0.382221 | 0.343126+j0.358944 |
| w7 | 0.405339+j0.587870 | 0.268280+j0.453023 | 0.194677+j0.355982 | 0.151421+j0.302029 | 0.129870+j0.410674 | 0.121210+j0.363418 |
| w8 | 1.056554+j0.611394 | 1.209224+j0.511520 | 0.949854+j0.564434 | 0.885139+j0.562982 | 0.893898+j0.557416 | 0.888124+j0.602821 |
| w9 | 1.056554+j0.611394 | 1.209224+j0.511520 | 1.067076+j0.274552 | 1.019339+j0.225537 | 1.023624+j0.193508 | 1.233619+j0.212708 |
| w10 | 1.056554+j0.611394 | 1.209224+j0.511520 | 1.265348+j0.819022 | 1.259403+j0.843630 | 1.249726+j0.812443 | 1.087496+j0.892512 |
| w11 | 1.056554+j0.611394 | 1.209224+j0.511520 | 1.452789+j0.300853 | 1.486685+j0.292065 | 1.482463+j0.293106 | 1.394087+j0.581196 |
| w12 | 0.611394+j1.056554 | 0.511520+j1.209224 | 0.564434+j0.949854 | 0.562982+j0.885139 | 0.617897+j0.860530 | 0.583858+j0.843483 |
| w13 | 0.611394+j1.056554 | 0.511520+j1.209224 | 0.274552+j1.067076 | 0.225537+j1.019339 | 0.213691+j1.048661 | 0.194780+j0.874636 |
| w14 | 0.611394+j1.056554 | 0.511520+j1.209224 | 0.819022+j1.265348 | 0.843630+j1.259403 | 0.842216+j1.227794 | 0.673475+j1.228631 |
| w15 | 0.611394+j1.056554 | 0.511520+j1.209224 | 0.300853+j1.452789 | 0.292065+j1.486685 | 0.293803+j1.462746 | 0.230654+j1.362914 |

FIG. 110

| w/CR | 2/16 | 4/16 | 6/16 | 8/16 | 10/16 | 12/16 | 14/16 |
|---|---|---|---|---|---|---|---|
| w0 | 0.690825+j0.585348 | 0.457028+j0.264235 | 0.665630+j0.318830 | 0.581605+j0.334988 | 0.550392+j0.280156 | 0.573370+j0.309447 | 0.556205+j0.306313 |
| w1 | 0.690825+j0.585350 | 0.457029+j0.264235 | 0.579831+j0.315654 | 0.585635+j0.330968 | 0.681112+j0.368142 | 0.721702+j0.383496 | 0.898107+j0.361975 |
| w2 | 0.690827+j0.585349 | 0.457029+j0.264235 | 0.629024+j0.217617 | 0.638681+j0.156525 | 0.601303+j0.115703 | 0.663123+j0.174184 | 0.563112+j0.186592 |
| w3 | 0.690828+j0.585349 | 0.457029+j0.264235 | 0.621593+j0.216858 | 0.643156+j0.156558 | 0.768180+j0.154657 | 0.793387+j0.241027 | 0.740611+j0.219107 |
| w4 | 0.690826+j0.585350 | 0.457028+j0.264235 | 0.679831+j0.315654 | 0.682863+j0.340166 | 0.544087+j0.309183 | 0.623085+j0.369822 | 0.487423+j0.421234 |
| w5 | 0.690825+j0.585350 | 0.457028+j0.264235 | 0.574244+j0.311784 | 0.586628+j0.336691 | 0.849801+j0.400611 | 0.833503+j0.500103 | 0.632312+j0.498021 |
| w6 | 0.690827+j0.585349 | 0.457029+j0.264235 | 0.621593+j0.216858 | 0.641671+j0.154211 | 0.602332+j0.106466 | 0.685472+j0.083624 | 0.805376+j0.061678 |
| w7 | 0.690827+j0.585350 | 0.457029+j0.264235 | 0.614800+j0.218139 | 0.645888+j0.155218 | 0.779701+j0.111828 | 0.833828+j0.088747 | 0.761043+j0.074016 |
| w8 | 0.690824+j0.585350 | 0.457029+j0.264235 | 0.313766+j0.177284 | 0.256324+j0.154712 | 0.353688+j0.173948 | 0.421081+j0.189169 | 0.372292+j0.238687 |
| w9 | 0.690824+j0.585350 | 0.457028+j0.264235 | 0.314209+j0.177479 | 0.257740+j0.156093 | 0.142216+j0.108587 | 0.254956+j0.081408 | 0.234548+j0.177704 |
| w10 | 0.690828+j0.585350 | 0.457028+j0.284235 | 0.314479+j0.163373 | 0.253905+j0.133141 | 0.383183+j0.095256 | 0.509228+j0.088452 | 0.438984+j0.152224 |
| w11 | 0.690825+j0.585350 | 0.457029+j0.284235 | 0.314983+j0.163511 | 0.255461+j0.133228 | 0.131151+j0.032101 | 0.083721+j0.072510 | 0.071834+j0.148278 |
| w12 | 0.690825+j0.585350 | 0.457029+j0.264235 | 0.314209+j0.177479 | 0.257989+j0.155663 | 0.353498+j0.175656 | 0.411013+j0.203430 | 0.378135+j0.354399 |
| w13 | 0.690824+j0.585350 | 0.457029+j0.264235 | 0.314645+j0.177662 | 0.259423+j0.156052 | 0.141600+j0.108762 | 0.254446+j0.084768 | 0.234014+j0.058219 |
| w14 | 0.690826+j0.585350 | 0.457028+j0.264235 | 0.314983+j0.163611 | 0.255597+j0.133615 | 0.382409+j0.095366 | 0.515569+j0.071508 | 0.440778+j0.051628 |
| w15 | 0.690828+j0.585350 | 0.457029+j0.284235 | 0.315501+j0.163646 | 0.257175+j0.133701 | 0.130610+j0.092363 | 0.083440+j0.072578 | 0.084467+j0.052398 |
| w16 | 0.585350+j0.690825 | 0.264235+j0.457028 | 0.318830+j0.565830 | 0.279008+j0.600742 | 0.368353+j0.540097 | 0.327565+j0.525982 | 0.338331+j0.660788 |
| w17 | 0.585350+j0.690826 | 0.264235+j0.457029 | 0.315654+j0.579831 | 0.275622+j0.606499 | 0.419487+j0.605548 | 0.382772+j0.675704 | 0.418845+j0.776409 |
| w18 | 0.585351+j0.690826 | 0.264235+j0.457029 | 0.217617+j0.629024 | 0.168770+j0.701292 | 0.183651+j0.663634 | 0.175988+j0.682218 | 0.206362+j0.743684 |
| w19 | 0.585351+j0.690825 | 0.264235+j0.457029 | 0.218858+j0.621593 | 0.176024+j0.703042 | 0.192718+j0.682789 | 0.231037+j0.737121 | 0.278826+j0.886705 |
| w20 | 0.686360+j0.690826 | 0.264236+j0.457029 | 0.315664+j0.678831 | 0.281824+j0.601641 | 0.420648+j0.510710 | 0.403824+j0.473588 | 0.433186+j0.646786 |
| w21 | 0.585350+j0.690826 | 0.264235+j0.457029 | 0.311784+j0.574244 | 0.277986+j0.607168 | 0.478320+j0.574186 | 0.507078+j0.602578 | 0.542935+j0.632044 |
| w22 | 0.585351+j0.690825 | 0.264236+j0.457029 | 0.216858+j0.621593 | 0.162649+j0.708528 | 0.190091+j0.671539 | 0.091174+j0.613265 | 0.065905+j0.768425 |
| w23 | 0.585351+j0.690828 | 0.264235+j0.457029 | 0.218139+j0.614800 | 0.168978+j0.709408 | 0.130631+j0.694278 | 0.083021+j0.787928 | 0.090272+j0.923832 |
| w24 | 0.586349+j0.690828 | 0.264235+j0.457029 | 0.177284+j0.313766 | 0.164033+j0.346721 | 0.264460+j0.369220 | 0.263365+j0.373217 | 0.253830+j0.654022 |
| w25 | 0.585349+j0.690826 | 0.264235+j0.457029 | 0.177479+j0.314209 | 0.164869+j0.347827 | 0.149136+j0.318482 | 0.203539+j0.250430 | 0.176737+j0.283231 |
| w26 | 0.585350+j0.690826 | 0.264235+j0.457029 | 0.163373+j0.314479 | 0.128349+j0.362615 | 0.141602+j0.435973 | 0.109576+j0.442010 | 0.156460+j0.607057 |
| w27 | 0.585350+j0.690826 | 0.264235+j0.457029 | 0.163511+j0.314983 | 0.129783+j0.383810 | 0.099783+j0.370718 | 0.075318+j0.258488 | 0.058053+j0.271040 |
| w28 | 0.585350+j0.690826 | 0.264235+j0.457029 | 0.177479+j0.314209 | 0.165186+j0.349443 | 0.256602+j0.364260 | 0.293438+j0.350712 | 0.295727+j0.448465 |
| w29 | 0.585349+j0.690827 | 0.264235+j0.457029 | 0.177662+j0.314645 | 0.166055+j0.350586 | 0.145729+j0.314336 | 0.205632+j0.245612 | 0.182567+j0.384902 |
| w30 | 0.585351+j0.690826 | 0.264235+j0.457029 | 0.163511+j0.314983 | 0.128652+j0.386258 | 0.131228+j0.437877 | 0.073874+j0.448991 | 0.058840+j0.576445 |
| w31 | 0.585350+j0.690826 | 0.264235+j0.457029 | 0.183646+j0.315501 | 0.129002+j0.387499 | 0.095984+j0.371670 | 0.072444+j0.254684 | 0.061187+j0.420342 |
| w32 | 0.837320+j0.692111 | 1.210202+j0.506671 | 0.815484+j0.582869 | 0.675123+j0.541294 | 1.015875+j0.544614 | 1.013485+j0.559385 | 1.003447+j0.483696 |

FIG. 111

| | | | | | | | |
|---|---|---|---|---|---|---|---|
| w33 | 0.837320+j0.692111 | 1.210202+j0.506671 | 0.899840+j0.548599 | 0.857263+j0.493450 | 0.865222+j0.447384 | 0.861186+j0.469856 | 0.845625+j0.420872 |
| w34 | 0.837322+j0.692111 | 1.210202+j0.506671 | 1.041461+j0.244837 | 1.005462+j0.192113 | 1.128684+j0.334833 | 1.103180+j0.346451 | 1.062464+j0.293134 |
| w35 | 0.837322+j0.692111 | 1.210202+j0.506671 | 1.020188+j0.244325 | 0.959325+j0.206138 | 0.958829+j0.243316 | 0.944982+j0.285093 | 0.896494+j0.255193 |
| w36 | 0.837321+j0.692112 | 1.210202+j0.506671 | 0.899840+j0.548599 | 0.835873+j0.546548 | 0.880528+j0.680980 | 0.875464+j0.737255 | 0.913205+j0.665202 |
| w37 | 0.837320+j0.692112 | 1.210202+j0.506671 | 0.883121+j0.533505 | 0.820382+j0.497932 | 0.787015+j0.549425 | 0.745110+j0.618549 | 0.767362+j0.579003 |
| w38 | 0.837323+j0.692111 | 1.210202+j0.506671 | 1.020188+j0.244325 | 0.978080+j0.164900 | 1.176644+j0.123217 | 1.153123+j0.117857 | 1.090971+j0.096120 |
| w39 | 0.837322+j0.692112 | 1.210202+j0.506671 | 0.997866+j0.243471 | 0.934838+j0.182858 | 0.984649+j0.117137 | 0.983958+j0.099899 | 0.921093+j0.085363 |
| w40 | 0.837319+j0.692112 | 1.210202+j0.506671 | 1.151606+j0.765652 | 1.146306+j0.718300 | 1.215599+j0.899359 | 1.191952+j0.858928 | 1.187342+j0.536796 |
| w41 | 0.837318+j0.692112 | 1.210202+j0.506671 | 1.215021+j0.808778 | 1.291524+j0.653771 | 1.470603+j0.909385 | 1.423402+j0.781880 | 1.372857+j0.669123 |
| w42 | 0.837321+j0.692111 | 1.210202+j0.506671 | 1.352982+j0.268569 | 1.334471+j0.242999 | 1.345613+j0.437140 | 1.302908+j0.407617 | 1.251173+j0.323729 |
| w43 | 0.837320+j0.692112 | 1.210202+j0.506671 | 1.427958+j0.282898 | 1.395846+j0.389207 | 1.641491+j0.562622 | 1.553455+j0.483525 | 1.461132+j0.407370 |
| w44 | 0.007320+j0.892112 | 1.210202+j0.506671 | 1.215021+j0.000770 | 1.124003+j0.044001 | 1.036455+j0.904032 | 1.034030+j0.874552 | 1.000040+j0.742004 |
| w45 | 0.837319+j0.692113 | 1.210202+j0.506671 | 1.479822+j0.889013 | 1.534980+j0.981645 | 1.216171+j1.212847 | 1.241876+j1.044629 | 1.238054+j0.916396 |
| w46 | 0.837322+j0.692112 | 1.210202+j0.506671 | 1.427958+j0.282898 | 1.404319+j0.139223 | 1.412229+j0.146603 | 1.363208+j0.139162 | 1.281447+j0.108014 |
| w47 | 0.837321+j0.692112 | 1.210202+j0.506671 | 1.747630+j0.343683 | 1.784855+j0.324115 | 1.729269+j0.190765 | 1.625172+j0.163628 | 1.504307+j0.136707 |
| w48 | 0.692112+j0.837321 | 0.506671+j1.210202 | 0.562969+j0.915494 | 0.608985+j0.850637 | 0.620270+j0.894599 | 0.523910+j0.993510 | 0.639937+j0.977245 |
| w49 | 0.692111+j0.837321 | 0.506671+j1.210202 | 0.548599+j0.899840 | 0.551777+j0.870592 | 0.483840+j0.849621 | 0.443217+j0.829658 | 0.537002+j0.852344 |
| w50 | 0.692113+j0.837320 | 0.506671+j1.210202 | 0.244837+j1.041461 | 0.190467+j1.082774 | 0.232928+j0.985923 | 0.321209+j1.087223 | 0.455668+j1.065457 |
| w51 | 0.692113+j0.837321 | 0.506671+j1.210202 | 0.244325+j1.020188 | 0.244861+j1.048792 | 0.257181+j0.965383 | 0.273744+j0.893625 | 0.281384+j1.059541 |
| w52 | 0.692112+j0.837321 | 0.506671+j1.210202 | 0.548599+j0.899840 | 0.610952+j0.803882 | 0.694953+j0.796701 | 0.713545+j0.883461 | 0.792733+j0.832232 |
| w53 | 0.692112+j0.837322 | 0.506671+j1.210202 | 0.533505+j0.883121 | 0.555010+j0.811974 | 0.623283+j0.720032 | 0.805153+j0.738080 | 0.862410+j0.724582 |
| w54 | 0.692114+j0.837321 | 0.506671+j1.210202 | 0.244325+j1.020188 | 0.168637+j1.002744 | 0.107976+j0.949083 | 0.103346+j1.104617 | 0.105974+j1.274300 |
| w55 | 0.692113+j0.837321 | 0.506671+j1.210202 | 0.243471+j0.997866 | 0.205601+j0.980310 | 0.122236+j0.924613 | 0.083597+j0.827620 | 0.098152+j1.086542 |
| w56 | 0.692111+j0.837322 | 0.506671+j1.210202 | 0.765652+j1.151606 | 0.611871+j1.077059 | 0.834215+j1.095182 | 0.813510+j1.185738 | 0.775759+j1.108874 |
| w57 | 0.692110+j0.837322 | 0.506671+j1.210202 | 0.808778+j1.215021 | 0.708577+j1.212442 | 0.555938+j1.212930 | 0.741488+j1.425730 | 0.816189+j1.333815 |
| w58 | 0.692112+j0.837321 | 0.506671+j1.210202 | 0.268569+j1.352982 | 0.232238+j1.415900 | 0.134887+j1.326783 | 0.373428+j1.273967 | 0.549851+j1.233599 |
| w59 | 0.692112+j0.837321 | 0.506671+j1.210202 | 0.282988+j1.427958 | 0.447361+j1.368136 | 0.343747+j1.293003 | 0.452484+j1.534369 | 0.548193+j1.472735 |
| w60 | 0.692111+j0.837322 | 0.506671+j1.210202 | 0.808778+j1.215021 | 0.945797+j1.087632 | 0.842609+j1.029273 | 0.839816+j1.052224 | 0.952209+j0.936182 |
| w61 | 0.692111+j0.837322 | 0.506671+j1.210202 | 0.889012+j1.479822 | 1.096653+j1.408274 | 0.867471+j1.388566 | 1.003623+j1.251697 | 1.056456+j1.143504 |
| w62 | 0.692113+j0.837322 | 0.506671+j1.210202 | 0.282898+j1.427958 | 0.188583+j1.727023 | 0.174737+j1.871315 | 0.123520+j1.317668 | 0.318114+j1.324413 |
| w63 | 0.692113+j0.837322 | 0.506671+j1.210202 | 0.343683+j1.747630 | 0.657630+j1.731517 | 0.546701+j1.620153 | 0.151968+j1.509089 | 0.151901+j1.531081 |

FIG. 112

| u/CR | 3/16 | 5/16 | 7/16 | 9/16 | 11/16 | 13/16 |
|---|---|---|---|---|---|---|
| u0 | 0.964850 | 0.746358 | 0.682758 | 0.720492 | 0.718420 | 0.741203 |
| u1 | 0.964851 | 0.724327 | 0.689494 | 0.745635 | 0.785950 | 0.837561 |
| u2 | 0.964850 | 0.701244 | 0.614079 | 0.578601 | 0.566863 | 0.571567 |
| u3 | 0.964851 | 0.724852 | 0.608604 | 0.578878 | 0.591711 | 0.652725 |
| u4 | 0.964851 | 1.089143 | 1.229555 | 1.234916 | 1.228615 | 1.196834 |
| u5 | 0.964851 | 1.487807 | 1.519290 | 1.511816 | 1.446265 | 1.354509 |
| u6 | 0.964851 | 1.016430 | 0.952184 | 0.929933 | 0.919117 | 0.944049 |
| u7 | 0.964851 | 0.981269 | 1.010198 | 1.008385 | 1.055715 | 1.062656 |
| u8 | 0.262799 | 0.188668 | 0.119570 | 0.131917 | 0.179189 | 0.158838 |
| u9 | 0.262799 | 0.187756 | 0.119309 | 0.132245 | 0.179229 | 0.216557 |
| u10 | 0.262799 | 0.183302 | 0.122704 | 0.095129 | 0.060071 | 0.034740 |
| u11 | 0.262799 | 0.184133 | 0.122986 | 0.094858 | 0.060040 | 0.089245 |
| u12 | 0.262799 | 0.299163 | 0.361306 | 0.393581 | 0.431407 | 0.422770 |
| u13 | 0.262799 | 0.295502 | 0.360929 | 0.392102 | 0.437930 | 0.493766 |
| u14 | 0.262799 | 0.306233 | 0.349187 | 0.316988 | 0.303511 | 0.286845 |
| u15 | 0.262799 | 0.310441 | 0.349698 | 0.317410 | 0.304552 | 0.350258 |

FIG. 113A

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 1 | 1 | 1 | 1 | 1 | 1 | 1 | 1 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 0 | 0 | 0 | 0 | 0 | 0 | 0 | 0 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Re(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 113B

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 1 | 1 | 1 | 1 | 1 | 1 | 1 | 1 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 0 | 0 | 0 | 0 | 0 | 0 | 0 | 0 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Im(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 114

| u/CR | 2/16 | 4/16 | 6/16 | 8/16 | 10/16 | 12/16 | 14/16 |
|---|---|---|---|---|---|---|---|
| u0 | 0.951821 | 0.772242 | 0.670816 | 0.720040 | 0.687860 | 0.725026 | 0.776914 |
| u1 | 0.951821 | 0.755105 | 0.671187 | 0.717092 | 0.687453 | 0.682522 | 0.731844 |
| u2 | 0.951821 | 0.733323 | 0.684394 | 0.742371 | 0.784311 | 0.833407 | 0.872060 |
| u3 | 0.951821 | 0.748492 | 0.683930 | 0.746130 | 0.778844 | 0.779595 | 0.823606 |
| u4 | 0.951821 | 0.762565 | 0.601258 | 0.568017 | 0.529234 | 0.542187 | 0.605096 |
| u5 | 0.951821 | 0.741006 | 0.601273 | 0.568434 | 0.529245 | 0.530376 | 0.565319 |
| u6 | 0.951821 | 0.771170 | 0.594244 | 0.571550 | 0.587945 | 0.627093 | 0.688258 |
| u7 | 0.951821 | 0.797312 | 0.594239 | 0.571162 | 0.586065 | 0.601059 | 0.646057 |
| u8 | 0.951821 | 1.144458 | 1.253351 | 1.234492 | 1.288591 | 1.273237 | 1.213263 |
| u9 | 0.951821 | 1.153922 | 1.197825 | 1.174495 | 1.172818 | 1.182640 | 1.148415 |
| u10 | 0.951821 | 1.658369 | 1.695168 | 1.675628 | 1.610570 | 1.491684 | 1.361829 |
| u11 | 0.951821 | 1.306308 | 1.431932 | 1.433385 | 1.432017 | 1.374447 | 1.283388 |
| u12 | 0.951821 | 0.910861 | 0.932278 | 0.907903 | 0.905961 | 0.956192 | 0.974968 |
| u13 | 0.951821 | 0.864684 | 0.935172 | 0.914425 | 0.885027 | 0.892801 | 0.922447 |
| u14 | 0.951821 | 0.903549 | 0.990523 | 1.005079 | 1.064442 | 1.100380 | 1.087536 |
| u15 | 0.951821 | 0.940034 | 0.989938 | 0.980523 | 1.006622 | 1.025215 | 1.029882 |
| u16 | 0.306654 | 0.215961 | 0.115733 | 0.153556 | 0.169392 | 0.148680 | 0.177357 |
| u17 | 0.306654 | 0.220732 | 0.115734 | 0.153554 | 0.169393 | 0.148677 | 0.145054 |
| u18 | 0.306654 | 0.224176 | 0.115606 | 0.153573 | 0.172311 | 0.209035 | 0.243373 |
| u19 | 0.306654 | 0.219360 | 0.115605 | 0.153576 | 0.172310 | 0.209018 | 0.210474 |
| u20 | 0.306654 | 0.196638 | 0.116628 | 0.075094 | 0.056177 | 0.029660 | 0.047926 |
| u21 | 0.306654 | 0.200750 | 0.116629 | 0.075095 | 0.056177 | 0.029660 | 0.016211 |
| u22 | 0.306654 | 0.197697 | 0.116766 | 0.075098 | 0.057134 | 0.088798 | 0.112331 |
| u23 | 0.306654 | 0.193649 | 0.116765 | 0.075098 | 0.057134 | 0.088798 | 0.080421 |
| u24 | 0.306654 | 0.263498 | 0.361114 | 0.411488 | 0.400665 | 0.399082 | 0.451783 |
| u25 | 0.306654 | 0.268956 | 0.361058 | 0.411542 | 0.400670 | 0.397734 | 0.415679 |
| u26 | 0.306654 | 0.272340 | 0.359367 | 0.411127 | 0.427709 | 0.467702 | 0.526543 |
| u27 | 0.306654 | 0.266958 | 0.359424 | 0.411075 | 0.427698 | 0.463378 | 0.488786 |
| u28 | 0.306654 | 0.299845 | 0.342823 | 0.304005 | 0.283846 | 0.270711 | 0.310792 |
| u29 | 0.306654 | 0.305269 | 0.342769 | 0.303985 | 0.283843 | 0.270625 | 0.277078 |
| u30 | 0.306654 | 0.302366 | 0.344552 | 0.303827 | 0.293434 | 0.333743 | 0.380080 |
| u31 | 0.306654 | 0.296777 | 0.344606 | 0.303847 | 0.293437 | 0.333375 | 0.345309 |

FIG. 115

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 0 | 0 | 0 | 0 | 0 | 0 | 0 | 0 |
| $y_{4,s}$ | 0 | 0 | 0 | 0 | 0 | 0 | 0 | 0 | 1 | 1 | 1 | 1 | 1 | 1 | 1 | 1 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 1 | 1 | 1 | 1 | 1 | 1 | 1 | 1 | 1 | 1 | 1 | 1 | 1 | 1 | 1 | 1 |
| $y_{4,s}$ | 1 | 1 | 1 | 1 | 1 | 1 | 1 | 1 | 0 | 0 | 0 | 0 | 0 | 0 | 0 | 0 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-u_{0}$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 1 | 1 | 1 | 1 | 1 | 1 | 1 | 1 |
| $y_{4,s}$ | 0 | 0 | 0 | 0 | 0 | 0 | 0 | 0 | 1 | 1 | 1 | 1 | 1 | 1 | 1 | 1 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $u_{0}$ | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{15}$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 0 | 0 | 0 | 0 | 0 | 0 | 0 | 0 | 0 | 0 | 0 | 0 | 0 | 0 | 0 | 0 |
| $y_{4,s}$ | 1 | 1 | 1 | 1 | 1 | 1 | 1 | 1 | 0 | 0 | 0 | 0 | 0 | 0 | 0 | 0 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 116

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 0 | 0 | 0 | 0 | 0 | 0 | 0 | 0 |
| $y_{5,s}$ | 0 | 0 | 0 | 0 | 0 | 0 | 0 | 0 | 1 | 1 | 1 | 1 | 1 | 1 | 1 | 1 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 1 | 1 | 1 | 1 | 1 | 1 | 1 | 1 | 1 | 1 | 1 | 1 | 1 | 1 | 1 | 1 |
| $y_{5,s}$ | 1 | 1 | 1 | 1 | 1 | 1 | 1 | 1 | 0 | 0 | 0 | 0 | 0 | 0 | 0 | 0 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-u_{0}$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 1 | 1 | 1 | 1 | 1 | 1 | 1 | 1 |
| $y_{5,s}$ | 0 | 0 | 0 | 0 | 0 | 0 | 0 | 0 | 1 | 1 | 1 | 1 | 1 | 1 | 1 | 1 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $u_{0}$ | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{16}$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 0 | 0 | 0 | 0 | 0 | 0 | 0 | 0 | 0 | 0 | 0 | 0 | 0 | 0 | 0 | 0 |
| $y_{5,s}$ | 1 | 1 | 1 | 1 | 1 | 1 | 1 | 1 | 0 | 0 | 0 | 0 | 0 | 0 | 0 | 0 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 118

| Modulation | Rows in Part 1 $N_{part1}$ | Rows in Part 2 $N_{part2}$ | Columns m |
|---|---|---|---|
| QPSK | 69120 | 0 | 2 |
| 16QAM | 69120 | 0 | 4 |
| 64QAM | 69120 | 0 | 6 |
| 256QAM | 69120 | 0 | 8 |
| 1024QAM | 68400 | 720 | 10 |
| 4096QAM | 69120 | 0 | 12 |

FIG. 121

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 14 | 119 | 182 | 5 | 127 | 21 | 152 | 11 | 39 | 164 | 25 | 69 | 59 | 140 | 73 | 9 | 104 | 148 | 77 | 44 | 138 | 89 |
| 184 | 35 | 112 | 150 | 178 | 26 | 123 | 133 | 91 | 76 | 70 | 0 | 176 | 118 | 22 | 147 | 96 | 108 | 109 | 139 | 18 | 157 |
| 181 | 126 | 174 | 179 | 116 | 38 | 45 | 158 | 106 | 168 | 10 | 97 | 114 | 129 | 180 | 52 | 7 | 67 | 43 | 50 | 120 | 122 |
| 3 | 13 | 72 | 185 | 34 | 83 | 124 | 105 | 162 | 87 | 131 | 155 | 135 | 42 | 64 | 165 | 41 | 71 | 189 | 159 | 143 | 102 |
| 153 | 17 | 24 | 30 | 66 | 137 | 62 | 55 | 48 | 98 | 110 | 40 | 121 | 187 | 74 | 92 | 60 | 101 | 57 | 33 | 130 | 173 |
| 32 | 166 | 128 | 54 | 99 | 111 | 100 | 16 | 84 | 132 | 161 | 4 | 190 | 49 | 95 | 141 | 28 | 85 | 61 | 53 | 183 | 6 |
| 68 | 2 | 163 | 37 | 103 | 186 | 154 | 171 | 170 | 78 | 117 | 93 | 8 | 145 | 51 | 56 | 191 | 90 | 82 | 151 | 115 | 175 |
| 1 | 125 | 79 | 20 | 80 | 36 | 169 | 46 | 167 | 63 | 177 | 149 | 81 | 12 | 156 | 142 | 31 | 47 | 88 | 65 | 134 | 94 |
| 86 | 160 | 172 | 19 | 23 | 136 | 58 | 146 | 15 | 75 | 107 | 188 | 29 | 113 | 144 | 27 | | | | | | |

FIG. 122

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 121 | 28 | 49 | 4 | 21 | 191 | 90 | 101 | 188 | 126 | 8 | 131 | 81 | 150 | 141 | 152 | 17 | 82 | 61 | 119 | 125 | 145 |
| 153 | 45 | 108 | 22 | 94 | 48 | 29 | 12 | 59 | 140 | 75 | 169 | 183 | 157 | 142 | 158 | 113 | 79 | 89 | 186 | 112 | 80 |
| 56 | 120 | 166 | 15 | 43 | 2 | 62 | 115 | 38 | 123 | 73 | 179 | 155 | 171 | 185 | 5 | 168 | 172 | 190 | 106 | 174 | 96 |
| 116 | 91 | 30 | 147 | 19 | 149 | 37 | 175 | 124 | 156 | 14 | 144 | 86 | 110 | 40 | 68 | 162 | 66 | 130 | 74 | 165 | 180 |
| 13 | 177 | 122 | 23 | 109 | 95 | 42 | 117 | 65 | 3 | 111 | 18 | 32 | 52 | 97 | 184 | 54 | 46 | 167 | 136 | 1 | 134 |
| 189 | 187 | 16 | 36 | 84 | 132 | 170 | 34 | 57 | 24 | 137 | 100 | 39 | 127 | 6 | 102 | 10 | 25 | 114 | 146 | 53 | 99 |
| 85 | 35 | 78 | 148 | 9 | 143 | 139 | 92 | 173 | 27 | 11 | 26 | 104 | 176 | 98 | 129 | 51 | 103 | 160 | 71 | 154 | 118 |
| 67 | 33 | 181 | 87 | 77 | 47 | 159 | 178 | 83 | 70 | 164 | 44 | 69 | 88 | 63 | 161 | 182 | 133 | 20 | 41 | 64 | 76 |
| 31 | 50 | 128 | 105 | 0 | 135 | 55 | 72 | 93 | 151 | 107 | 163 | 60 | 138 | 7 | 58 | | | | | | |

FIG. 123

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 99 | 59 | 95 | 50 | 122 | 15 | 144 | 6 | 129 | 36 | 175 | 159 | 165 | 35 | 182 | 181 | 189 | 29 | 2 | 115 | 91 | 41 |
| 60 | 160 | 51 | 106 | 168 | 173 | 20 | 138 | 183 | 70 | 24 | 127 | 47 | 5 | 119 | 171 | 102 | 135 | 116 | 156 | 120 | 105 |
| 117 | 136 | 149 | 128 | 85 | 46 | 186 | 113 | 73 | 103 | 52 | 82 | 89 | 184 | 22 | 185 | 155 | 125 | 133 | 37 | 27 | 10 |
| 137 | 76 | 12 | 98 | 148 | 109 | 42 | 16 | 190 | 84 | 94 | 97 | 25 | 11 | 88 | 166 | 131 | 48 | 161 | 65 | 9 | 8 |
| 58 | 56 | 124 | 68 | 54 | 3 | 169 | 146 | 87 | 108 | 110 | 121 | 163 | 57 | 90 | 100 | 66 | 49 | 61 | 178 | 18 | 7 |
| 28 | 67 | 13 | 32 | 34 | 86 | 153 | 112 | 63 | 43 | 164 | 132 | 118 | 93 | 38 | 39 | 17 | 154 | 170 | 81 | 141 | 191 |
| 152 | 111 | 188 | 147 | 180 | 75 | 72 | 26 | 177 | 126 | 179 | 55 | 1 | 143 | 45 | 21 | 40 | 123 | 23 | 162 | 77 | 62 |
| 134 | 158 | 176 | 31 | 69 | 114 | 142 | 19 | 96 | 101 | 71 | 30 | 140 | 187 | 92 | 80 | 79 | 0 | 104 | 53 | 145 | 139 |
| 14 | 33 | 74 | 157 | 150 | 44 | 172 | 151 | 64 | 78 | 130 | 83 | 167 | 4 | 107 | 174 | | | | | | |

FIG. 124

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 170 | 45 | 67 | 94 | 110 | 153 | 19 | 38 | 112 | 176 | 49 | 138 | 35 | 114 | 184 | 159 | 17 | 41 | 47 | 189 | 65 | 125 |
| 154 | 57 | 83 | 6 | 97 | 167 | 51 | 59 | 23 | 81 | 54 | 46 | 168 | 178 | 148 | 5 | 122 | 129 | 155 | 179 | 95 | 102 |
| 8 | 119 | 29 | 113 | 14 | 60 | 43 | 66 | 55 | 103 | 111 | 88 | 56 | 7 | 118 | 63 | 134 | 108 | 61 | 187 | 124 | 31 |
| 133 | 22 | 79 | 52 | 36 | 144 | 89 | 177 | 40 | 116 | 121 | 135 | 163 | 92 | 117 | 162 | 149 | 106 | 173 | 181 | 11 | 164 |
| 185 | 99 | 18 | 158 | 16 | 12 | 48 | 9 | 123 | 147 | 145 | 169 | 130 | 183 | 28 | 151 | 71 | 126 | 69 | 165 | 21 | 13 |
| 15 | 62 | 80 | 182 | 76 | 90 | 180 | 50 | 127 | 131 | 109 | 3 | 115 | 120 | 161 | 82 | 34 | 78 | 128 | 142 | 136 | 75 |
| 86 | 137 | 26 | 25 | 44 | 91 | 42 | 73 | 140 | 146 | 152 | 27 | 101 | 93 | 20 | 166 | 171 | 100 | 70 | 84 | 53 | 186 |
| 24 | 98 | 4 | 37 | 141 | 190 | 68 | 150 | 1 | 72 | 39 | 87 | 188 | 191 | 156 | 33 | 30 | 160 | 143 | 64 | 132 | 77 |
| 0 | 58 | 174 | 157 | 105 | 175 | 10 | 172 | 104 | 2 | 96 | 139 | 32 | 85 | 107 | 74 | | | | | | |

FIG. 125

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 111 | 156 | 189 | 11 | 132 | 114 | 100 | 154 | 77 | 79 | 95 | 161 | 47 | 142 | 36 | 98 | 3 | 125 | 159 | 120 | 40 | 160 |
| 29 | 153 | 16 | 39 | 101 | 58 | 191 | 46 | 76 | 4 | 183 | 176 | 62 | 60 | 74 | 7 | 37 | 127 | 19 | 186 | 71 | 50 |
| 139 | 27 | 188 | 113 | 38 | 130 | 124 | 26 | 146 | 131 | 102 | 110 | 105 | 147 | 86 | 150 | 94 | 162 | 175 | 88 | 104 | 55 |
| 89 | 181 | 34 | 69 | 22 | 92 | 133 | 1 | 25 | 0 | 158 | 10 | 24 | 116 | 164 | 165 | 112 | 72 | 106 | 129 | 81 | 66 |
| 54 | 49 | 136 | 118 | 83 | 41 | 2 | 56 | 145 | 28 | 177 | 168 | 117 | 9 | 157 | 173 | 115 | 149 | 42 | 103 | 14 | 84 |
| 155 | 187 | 99 | 6 | 43 | 70 | 140 | 73 | 32 | 78 | 75 | 167 | 148 | 48 | 134 | 178 | 59 | 15 | 63 | 91 | 82 | 33 |
| 135 | 166 | 190 | 152 | 96 | 137 | 12 | 182 | 61 | 107 | 128 | 119 | 179 | 45 | 184 | 65 | 172 | 138 | 31 | 57 | 174 | 17 |
| 180 | 5 | 30 | 170 | 23 | 85 | 185 | 35 | 44 | 123 | 90 | 20 | 122 | 8 | 64 | 141 | 169 | 121 | 97 | 108 | 80 | 171 |
| 18 | 13 | 87 | 163 | 109 | 52 | 51 | 21 | 93 | 67 | 126 | 68 | 53 | 143 | 144 | 151 | | | | | | |

FIG. 133

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 154 | 106 | 99 | 177 | 191 | 55 | 189 | 181 | 22 | 62 | 80 | 114 | 110 | 141 | 83 | 103 | 169 | 156 | 130 | 186 | 92 | 45 |
| 68 | 126 | 112 | 185 | 160 | 158 | 17 | 145 | 162 | 127 | 152 | 174 | 134 | 18 | 157 | 120 | 3 | 29 | 13 | 135 | 173 | 86 |
| 73 | 150 | 46 | 153 | 33 | 61 | 142 | 102 | 171 | 168 | 78 | 77 | 139 | 85 | 176 | 163 | 128 | 101 | 42 | 2 | 14 | 38 |
| 10 | 125 | 90 | 30 | 63 | 172 | 47 | 108 | 89 | 0 | 32 | 94 | 23 | 34 | 59 | 35 | 129 | 12 | 146 | 8 | 60 | 27 |
| 147 | 180 | 100 | 87 | 184 | 167 | 36 | 79 | 138 | 4 | 95 | 148 | 72 | 54 | 91 | 182 | 28 | 133 | 164 | 175 | 123 | 107 |
| 137 | 88 | 44 | 116 | 69 | 7 | 31 | 124 | 144 | 105 | 170 | 6 | 165 | 15 | 161 | 24 | 58 | 70 | 11 | 56 | 143 | 111 |
| 104 | 74 | 67 | 109 | 82 | 21 | 52 | 9 | 71 | 48 | 26 | 117 | 50 | 149 | 140 | 20 | 57 | 136 | 113 | 64 | 151 | 190 |
| 131 | 19 | 51 | 96 | 76 | 1 | 97 | 40 | 53 | 84 | 166 | 75 | 159 | 98 | 81 | 49 | 66 | 188 | 118 | 39 | 132 | 187 |
| 25 | 119 | 41 | 122 | 16 | 5 | 93 | 115 | 178 | 65 | 121 | 37 | 155 | 183 | 43 | 179 | | | | | | |

FIG. 134

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 1 | 182 | 125 | 0 | 121 | 47 | 63 | 154 | 76 | 99 | 82 | 163 | 102 | 166 | 28 | 189 | 56 | 67 | 54 | 39 | 40 | 185 |
| 184 | 65 | 179 | 4 | 91 | 87 | 137 | 170 | 98 | 71 | 169 | 49 | 73 | 37 | 11 | 143 | 150 | 123 | 93 | 62 | 3 | 50 |
| 26 | 140 | 178 | 95 | 183 | 33 | 21 | 53 | 112 | 128 | 118 | 120 | 106 | 139 | 32 | 130 | 173 | 132 | 156 | 119 | 83 | 176 |
| 159 | 13 | 145 | 36 | 30 | 113 | 2 | 41 | 147 | 174 | 94 | 88 | 92 | 60 | 165 | 59 | 25 | 161 | 100 | 85 | 81 | 61 |
| 138 | 48 | 177 | 77 | 6 | 22 | 16 | 43 | 115 | 23 | 12 | 66 | 70 | 9 | 164 | 122 | 58 | 105 | 69 | 42 | 38 | 19 |
| 24 | 180 | 175 | 74 | 160 | 34 | 101 | 72 | 114 | 142 | 20 | 8 | 15 | 190 | 144 | 104 | 79 | 172 | 148 | 31 | 168 | 10 |
| 107 | 14 | 35 | 52 | 134 | 126 | 167 | 149 | 116 | 186 | 17 | 162 | 151 | 5 | 136 | 55 | 44 | 110 | 158 | 46 | 191 | 29 |
| 153 | 155 | 117 | 188 | 131 | 97 | 146 | 103 | 78 | 109 | 129 | 57 | 111 | 45 | 68 | 157 | 84 | 141 | 89 | 64 | 7 | 108 |
| 152 | 75 | 18 | 96 | 133 | 171 | 86 | 181 | 127 | 27 | 124 | 187 | 135 | 80 | 51 | 90 | | | | | | |

FIG. 135

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 35 | 75 | 166 | 145 | 143 | 184 | 62 | 96 | 54 | 63 | 157 | 103 | 32 | 43 | 126 | 187 | 144 | 91 | 78 | 44 | 39 | 109 |
| 185 | 102 | 10 | 68 | 29 | 42 | 149 | 83 | 133 | 94 | 130 | 27 | 171 | 19 | 51 | 165 | 148 | 28 | 36 | 33 | 173 | 136 |
| 87 | 82 | 100 | 49 | 120 | 152 | 161 | 162 | 147 | 71 | 137 | 57 | 8 | 53 | 132 | 151 | 163 | 123 | 47 | 92 | 90 | 60 |
| 99 | 79 | 59 | 108 | 115 | 72 | 0 | 12 | 140 | 160 | 61 | 180 | 74 | 37 | 86 | 117 | 191 | 101 | 52 | 15 | 80 | 156 |
| 127 | 81 | 131 | 141 | 142 | 31 | 95 | 4 | 73 | 64 | 16 | 18 | 146 | 70 | 181 | 7 | 89 | 124 | 77 | 67 | 116 | 21 |
| 34 | 41 | 105 | 113 | 97 | 2 | 6 | 55 | 17 | 65 | 38 | 48 | 158 | 159 | 179 | 5 | 30 | 183 | 170 | 135 | 125 | 20 |
| 106 | 186 | 182 | 188 | 114 | 1 | 14 | 3 | 134 | 178 | 189 | 167 | 40 | 119 | 22 | 190 | 58 | 23 | 155 | 138 | 98 | 84 |
| 11 | 110 | 88 | 46 | 177 | 175 | 25 | 150 | 118 | 121 | 129 | 168 | 13 | 128 | 104 | 69 | 112 | 169 | 9 | 45 | 174 | 93 |
| 26 | 56 | 76 | 50 | 154 | 139 | 66 | 85 | 153 | 107 | 111 | 172 | 176 | 164 | 24 | 122 | | | | | | |

FIG. 136

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 155 | 188 | 123 | 132 | 15 | 79 | 59 | 119 | 66 | 68 | 41 | 175 | 184 | 78 | 142 | 32 | 54 | 111 | 139 | 134 | 95 | 34 |
| 161 | 150 | 58 | 141 | 74 | 112 | 121 | 99 | 178 | 179 | 57 | 90 | 80 | 21 | 11 | 29 | 67 | 104 | 52 | 87 | 38 | 81 |
| 181 | 160 | 176 | 16 | 71 | 13 | 186 | 171 | 9 | 170 | 2 | 177 | 0 | 88 | 149 | 190 | 69 | 33 | 183 | 146 | 61 | 117 |
| 113 | 6 | 96 | 120 | 162 | 23 | 53 | 140 | 91 | 128 | 46 | 93 | 174 | 126 | 159 | 133 | 8 | 152 | 103 | 102 | 151 | 143 |
| 100 | 4 | 180 | 166 | 55 | 164 | 18 | 49 | 62 | 20 | 83 | 7 | 187 | 153 | 64 | 37 | 144 | 185 | 19 | 114 | 25 | 116 |
| 12 | 173 | 122 | 127 | 89 | 115 | 75 | 101 | 189 | 124 | 157 | 108 | 28 | 165 | 163 | 65 | 168 | 77 | 82 | 27 | 137 | 86 |
| 22 | 110 | 63 | 148 | 158 | 97 | 31 | 105 | 135 | 98 | 44 | 70 | 182 | 191 | 17 | 156 | 129 | 39 | 136 | 169 | 3 | 145 |
| 154 | 109 | 76 | 5 | 10 | 106 | 35 | 94 | 172 | 45 | 51 | 60 | 42 | 50 | 72 | 85 | 40 | 118 | 36 | 14 | 130 | 131 |
| 138 | 43 | 48 | 125 | 84 | 24 | 26 | 1 | 56 | 107 | 92 | 147 | 47 | 30 | 73 | 167 | | | | | | |

FIG. 137

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 152 | 87 | 170 | 33 | 48 | 95 | 2 | 184 | 145 | 51 | 94 | 164 | 38 | 90 | 158 | 70 | 124 | 128 | 66 | 111 | 79 | 42 |
| 45 | 141 | 83 | 73 | 57 | 119 | 20 | 67 | 31 | 179 | 123 | 183 | 26 | 188 | 15 | 163 | 1 | 133 | 105 | 72 | 81 | 153 |
| 69 | 182 | 101 | 180 | 185 | 190 | 77 | 6 | 127 | 138 | 75 | 59 | 24 | 175 | 30 | 186 | 139 | 56 | 100 | 176 | 147 | 189 |
| 116 | 131 | 25 | 5 | 16 | 117 | 74 | 50 | 171 | 114 | 76 | 44 | 107 | 135 | 71 | 181 | 13 | 43 | 122 | 78 | 4 | 58 |
| 35 | 63 | 187 | 98 | 37 | 169 | 148 | 7 | 10 | 49 | 80 | 161 | 167 | 28 | 142 | 46 | 97 | 92 | 121 | 112 | 88 | 102 |
| 106 | 173 | 19 | 27 | 41 | 172 | 91 | 191 | 34 | 118 | 108 | 136 | 166 | 155 | 96 | 3 | 165 | 103 | 84 | 109 | 104 | 53 |
| 23 | 0 | 178 | 17 | 86 | 9 | 168 | 134 | 110 | 18 | 32 | 146 | 129 | 159 | 55 | 154 | 126 | 40 | 151 | 174 | 60 | 52 |
| 22 | 149 | 156 | 113 | 143 | 11 | 93 | 62 | 177 | 64 | 61 | 160 | 150 | 65 | 130 | 82 | 29 | 115 | 137 | 36 | 8 | 157 |
| 54 | 89 | 99 | 120 | 68 | 21 | 140 | 14 | 39 | 132 | 125 | 12 | 85 | 162 | 47 | 144 | | | | | | |

FIG. 138

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 140 | 8 | 176 | 13 | 41 | 165 | 27 | 109 | 121 | 153 | 58 | 181 | 143 | 164 | 103 | 115 | 91 | 66 | 60 | 189 | 101 | 4 |
| 14 | 102 | 45 | 124 | 104 | 159 | 130 | 133 | 135 | 77 | 25 | 59 | 180 | 141 | 144 | 62 | 114 | 182 | 134 | 148 | 11 | 20 |
| 125 | 83 | 162 | 75 | 126 | 67 | 9 | 178 | 171 | 152 | 166 | 69 | 174 | 15 | 80 | 168 | 131 | 95 | 56 | 48 | 63 | 82 |
| 147 | 51 | 108 | 52 | 30 | 139 | 22 | 37 | 173 | 112 | 191 | 98 | 116 | 149 | 167 | 142 | 29 | 154 | 92 | 94 | 71 | 117 |
| 79 | 122 | 129 | 24 | 81 | 105 | 97 | 137 | 128 | 1 | 113 | 170 | 119 | 7 | 158 | 76 | 19 | 183 | 68 | 31 | 50 | 118 |
| 33 | 72 | 55 | 65 | 146 | 185 | 111 | 145 | 28 | 21 | 177 | 160 | 32 | 61 | 70 | 106 | 156 | 78 | 132 | 88 | 184 | 35 |
| 5 | 53 | 138 | 47 | 100 | 10 | 42 | 36 | 175 | 93 | 120 | 190 | 16 | 123 | 87 | 54 | 186 | 18 | 57 | 84 | 99 | 12 |
| 163 | 157 | 188 | 64 | 38 | 26 | 2 | 136 | 40 | 169 | 90 | 107 | 46 | 172 | 49 | 6 | 39 | 44 | 150 | 85 | 0 | 17 |
| 127 | 155 | 110 | 34 | 96 | 74 | 86 | 187 | 89 | 151 | 43 | 179 | 161 | 73 | 23 | 3 | | | | | | |

FIG. 139

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 10 | 61 | 30 | 88 | 33 | 60 | 1 | 102 | 45 | 103 | 119 | 181 | 82 | 112 | 12 | 67 | 69 | 171 | 108 | 26 | 145 | 156 |
| 81 | 152 | 8 | 16 | 68 | 13 | 99 | 183 | 146 | 27 | 158 | 147 | 132 | 118 | 180 | 120 | 173 | 59 | 186 | 49 | 7 | 17 |
| 35 | 104 | 129 | 75 | 54 | 72 | 18 | 48 | 15 | 177 | 191 | 51 | 24 | 93 | 106 | 22 | 71 | 29 | 141 | 32 | 143 | 128 |
| 175 | 86 | 190 | 74 | 36 | 43 | 144 | 46 | 63 | 65 | 133 | 31 | 87 | 44 | 20 | 117 | 76 | 187 | 80 | 101 | 151 | 47 |
| 130 | 116 | 162 | 127 | 153 | 100 | 94 | 2 | 41 | 138 | 125 | 131 | 11 | 50 | 40 | 21 | 184 | 167 | 172 | 85 | 160 | 105 |
| 73 | 38 | 157 | 53 | 39 | 97 | 107 | 165 | 168 | 89 | 148 | 126 | 3 | 4 | 114 | 161 | 155 | 182 | 136 | 149 | 111 | 98 |
| 113 | 139 | 92 | 109 | 174 | 185 | 95 | 56 | 135 | 37 | 163 | 154 | 0 | 96 | 78 | 122 | 5 | 179 | 140 | 83 | 123 | 77 |
| 9 | 19 | 66 | 42 | 137 | 14 | 23 | 159 | 189 | 110 | 142 | 84 | 169 | 166 | 52 | 91 | 164 | 28 | 124 | 121 | 70 | 115 |
| 90 | 170 | 58 | 6 | 178 | 176 | 64 | 188 | 57 | 34 | 79 | 62 | 25 | 134 | 150 | 55 | | | | | | |

FIG. 140

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 8 | 165 | 180 | 182 | 189 | 61 | 7 | 140 | 105 | 78 | 86 | 75 | 15 | 28 | 82 | 1 | 136 | 130 | 35 | 24 | 70 | 152 |
| 121 | 11 | 36 | 66 | 83 | 57 | 164 | 111 | 137 | 128 | 175 | 156 | 151 | 48 | 44 | 147 | 18 | 64 | 184 | 42 | 159 | 3 |
| 6 | 162 | 170 | 98 | 101 | 29 | 102 | 21 | 188 | 79 | 138 | 45 | 124 | 118 | 155 | 125 | 34 | 27 | 5 | 97 | 109 | 145 |
| 54 | 56 | 126 | 187 | 16 | 149 | 160 | 178 | 23 | 141 | 30 | 117 | 25 | 69 | 116 | 131 | 94 | 65 | 191 | 99 | 181 | 185 |
| 115 | 67 | 93 | 106 | 38 | 71 | 76 | 113 | 132 | 172 | 103 | 95 | 92 | 107 | 4 | 163 | 139 | 72 | 157 | 0 | 12 | 52 |
| 68 | 88 | 161 | 183 | 39 | 14 | 32 | 49 | 19 | 77 | 174 | 47 | 154 | 17 | 134 | 133 | 51 | 120 | 74 | 177 | 41 | 108 |
| 142 | 143 | 13 | 26 | 59 | 100 | 123 | 55 | 158 | 62 | 104 | 148 | 135 | 9 | 179 | 53 | 176 | 33 | 169 | 129 | 186 | 43 |
| 167 | 87 | 119 | 84 | 90 | 150 | 20 | 10 | 122 | 114 | 80 | 50 | 146 | 144 | 96 | 171 | 40 | 73 | 81 | 168 | 112 | 190 |
| 37 | 173 | 46 | 110 | 60 | 85 | 153 | 2 | 63 | 91 | 127 | 89 | 31 | 58 | 22 | 166 | | | | | | |

FIG. 141

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 17 | 84 | 125 | 70 | 134 | 63 | 68 | 162 | 61 | 31 | 74 | 137 | 7 | 138 | 5 | 60 | 76 | 105 | 160 | 12 | 114 | 81 |
| 155 | 112 | 153 | 191 | 82 | 146 | 118 | 108 | 58 | 159 | 43 | 161 | 149 | 96 | 71 | 30 | 145 | 174 | 67 | 77 | 47 | 94 |
| 48 | 156 | 151 | 141 | 131 | 176 | 183 | 41 | 35 | 83 | 164 | 55 | 169 | 98 | 187 | 124 | 100 | 54 | 104 | 40 | 2 | 72 |
| 8 | 85 | 182 | 103 | 6 | 37 | 107 | 39 | 42 | 123 | 57 | 106 | 13 | 150 | 129 | 46 | 109 | 188 | 45 | 113 | 44 | 90 |
| 20 | 165 | 142 | 110 | 22 | 28 | 173 | 38 | 52 | 16 | 34 | 0 | 3 | 144 | 27 | 49 | 139 | 177 | 132 | 184 | 25 | 87 |
| 152 | 119 | 158 | 78 | 186 | 167 | 97 | 24 | 99 | 69 | 120 | 122 | 133 | 163 | 21 | 51 | 101 | 185 | 111 | 26 | 18 | 10 |
| 33 | 170 | 95 | 65 | 14 | 130 | 157 | 59 | 115 | 127 | 92 | 56 | 1 | 80 | 66 | 126 | 178 | 147 | 75 | 179 | 171 | 53 |
| 146 | 88 | 4 | 128 | 121 | 86 | 117 | 19 | 23 | 168 | 181 | 11 | 102 | 93 | 73 | 140 | 89 | 136 | 9 | 180 | 62 | 36 |
| 79 | 91 | 190 | 143 | 29 | 154 | 32 | 64 | 166 | 116 | 15 | 189 | 175 | 50 | 135 | 172 | | | | | | |

FIG. 142

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 157 | 20 | 116 | 115 | 49 | 178 | 148 | 152 | 174 | 130 | 171 | 81 | 60 | 146 | 182 | 72 | 46 | 22 | 93 | 101 | 9 | 55 |
| 40 | 163 | 118 | 30 | 52 | 181 | 151 | 31 | 87 | 117 | 120 | 82 | 95 | 190 | 23 | 36 | 67 | 62 | 14 | 167 | 80 | 27 |
| 24 | 43 | 94 | 0 | 63 | 5 | 74 | 78 | 158 | 88 | 84 | 109 | 147 | 112 | 124 | 110 | 21 | 47 | 45 | 68 | 184 | 70 |
| 1 | 66 | 149 | 105 | 140 | 170 | 56 | 98 | 135 | 61 | 79 | 123 | 166 | 185 | 41 | 108 | 122 | 92 | 16 | 26 | 37 | 177 |
| 173 | 113 | 136 | 89 | 162 | 85 | 54 | 39 | 73 | 58 | 131 | 134 | 188 | 127 | 3 | 164 | 13 | 132 | 129 | 179 | 25 | 18 |
| 57 | 32 | 119 | 111 | 53 | 155 | 28 | 107 | 133 | 144 | 19 | 160 | 71 | 186 | 153 | 103 | 2 | 12 | 91 | 106 | 64 | 175 |
| 75 | 189 | 128 | 142 | 187 | 76 | 180 | 34 | 59 | 169 | 90 | 11 | 172 | 97 | 141 | 38 | 191 | 17 | 114 | 126 | 145 | 83 |
| 143 | 125 | 121 | 10 | 44 | 137 | 86 | 29 | 104 | 154 | 168 | 65 | 159 | 15 | 99 | 35 | 50 | 48 | 138 | 96 | 100 | 102 |
| 7 | 42 | 156 | 8 | 4 | 69 | 183 | 51 | 165 | 6 | 150 | 77 | 161 | 33 | 176 | 139 | | | | | | |

FIG. 143

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 42 | 168 | 36 | 37 | 152 | 118 | 14 | 83 | 105 | 131 | 26 | 120 | 92 | 130 | 158 | 132 | 49 | 72 | 137 | 100 | 88 | 24 |
| 53 | 142 | 110 | 102 | 74 | 188 | 113 | 121 | 12 | 173 | 5 | 126 | 127 | 3 | 93 | 46 | 164 | 109 | 151 | 2 | 98 | 153 |
| 116 | 89 | 101 | 136 | 35 | 80 | 0 | 133 | 183 | 162 | 185 | 56 | 17 | 87 | 117 | 184 | 54 | 70 | 176 | 91 | 134 | 51 |
| 38 | 73 | 165 | 99 | 169 | 43 | 167 | 86 | 11 | 144 | 78 | 58 | 64 | 13 | 119 | 33 | 166 | 6 | 75 | 31 | 15 | 28 |
| 125 | 148 | 27 | 114 | 82 | 45 | 55 | 191 | 160 | 115 | 1 | 69 | 187 | 122 | 177 | 32 | 172 | 52 | 112 | 171 | 124 | 180 |
| 85 | 150 | 7 | 57 | 60 | 94 | 181 | 29 | 97 | 128 | 19 | 149 | 175 | 50 | 140 | 10 | 174 | 68 | 59 | 39 | 106 | 44 |
| 62 | 71 | 18 | 107 | 156 | 159 | 146 | 48 | 81 | 111 | 96 | 103 | 34 | 161 | 141 | 154 | 76 | 61 | 135 | 20 | 84 | 77 |
| 108 | 23 | 145 | 182 | 170 | 139 | 157 | 47 | 9 | 63 | 123 | 138 | 155 | 79 | 4 | 30 | 143 | 25 | 90 | 66 | 147 | 186 |
| 179 | 129 | 21 | 65 | 41 | 95 | 67 | 22 | 163 | 190 | 16 | 8 | 104 | 189 | 40 | 178 | | | | | | |

FIG. 144

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 92 | 132 | 39 | 44 | 190 | 21 | 70 | 146 | 48 | 13 | 17 | 187 | 119 | 43 | 94 | 157 | 150 | 98 | 96 | 47 | 86 | 63 |
| 152 | 158 | 84 | 170 | 81 | 7 | 62 | 191 | 174 | 99 | 116 | 10 | 85 | 113 | 135 | 28 | 53 | 122 | 83 | 141 | 77 | 23 |
| 131 | 4 | 40 | 168 | 129 | 109 | 51 | 130 | 188 | 147 | 29 | 50 | 26 | 78 | 148 | 164 | 167 | 103 | 36 | 134 | 2 | 177 |
| 20 | 123 | 27 | 90 | 176 | 5 | 33 | 133 | 189 | 138 | 76 | 41 | 89 | 35 | 72 | 139 | 32 | 73 | 68 | 67 | 101 | 166 |
| 93 | 54 | 52 | 42 | 110 | 59 | 8 | 179 | 34 | 171 | 143 | 137 | 9 | 126 | 155 | 108 | 142 | 120 | 163 | 12 | 3 | 75 |
| 159 | 107 | 65 | 128 | 87 | 6 | 22 | 57 | 100 | 24 | 64 | 106 | 117 | 19 | 58 | 95 | 74 | 180 | 125 | 136 | 186 | 154 |
| 121 | 161 | 88 | 37 | 114 | 102 | 105 | 160 | 80 | 185 | 82 | 124 | 184 | 15 | 16 | 18 | 118 | 173 | 151 | 11 | 91 | 79 |
| 46 | 140 | 127 | 1 | 169 | 0 | 61 | 66 | 45 | 162 | 149 | 115 | 144 | 30 | 25 | 175 | 153 | 183 | 60 | 38 | 31 | 111 |
| 182 | 49 | 55 | 145 | 56 | 181 | 104 | 14 | 71 | 178 | 112 | 172 | 165 | 69 | 97 | 156 | | | | | | |

FIG. 145

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

| | | | | | | | | | | | | | | | | | | | | | |
|---|---|---|---|---|---|---|---|---|---|---|---|---|---|---|---|---|---|---|---|---|---|
| 133 | 96 | 46 | 148 | 78 | 109 | 149 | 161 | 55 | 39 | 183 | 54 | 186 | 73 | 150 | 180 | 189 | 190 | 22 | 135 | 12 | 80 |
| 42 | 130 | 164 | 70 | 126 | 107 | 57 | 67 | 15 | 157 | 52 | 88 | 5 | 23 | 123 | 66 | 53 | 147 | 177 | 60 | 131 | 108 |
| 171 | 191 | 44 | 140 | 98 | 154 | 37 | 118 | 176 | 92 | 124 | 138 | 132 | 167 | 173 | 13 | 79 | 32 | 145 | 14 | 113 | 30 |
| 2 | 0 | 165 | 182 | 153 | 24 | 144 | 87 | 82 | 75 | 141 | 89 | 137 | 33 | 100 | 106 | 128 | 168 | 29 | 36 | 172 | 11 |
| 111 | 68 | 16 | 10 | 34 | 188 | 35 | 160 | 77 | 83 | 178 | 58 | 59 | 7 | 56 | 110 | 104 | 61 | 76 | 85 | 121 | 93 |
| 19 | 134 | 179 | 155 | 163 | 115 | 185 | 125 | 112 | 71 | 8 | 119 | 18 | 47 | 151 | 26 | 103 | 122 | 9 | 170 | 146 | 99 |
| 49 | 72 | 102 | 31 | 40 | 43 | 158 | 142 | 4 | 69 | 139 | 28 | 174 | 101 | 84 | 129 | 156 | 74 | 62 | 91 | 159 | 41 |
| 38 | 45 | 136 | 169 | 21 | 51 | 181 | 97 | 166 | 175 | 90 | 27 | 86 | 65 | 105 | 143 | 127 | 17 | 6 | 116 | 94 | 117 |
| 48 | 50 | 25 | 64 | 95 | 63 | 184 | 152 | 120 | 1 | 187 | 162 | 114 | 3 | 81 | 20 | | | | | | |

FIG. 146

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 59 | 34 | 129 | 18 | 137 | 6 | 83 | 139 | 47 | 148 | 147 | 110 | 11 | 98 | 62 | 149 | 158 | 14 | 42 | 180 | 23 | 128 |
| 99 | 181 | 54 | 176 | 35 | 130 | 53 | 179 | 39 | 152 | 32 | 52 | 69 | 82 | 84 | 113 | 79 | 21 | 95 | 7 | 126 | 191 |
| 86 | 169 | 111 | 12 | 55 | 27 | 182 | 120 | 123 | 88 | 107 | 50 | 144 | 49 | 38 | 165 | 0 | 159 | 10 | 43 | 114 | 187 |
| 150 | 19 | 65 | 48 | 124 | 8 | 141 | 171 | 173 | 17 | 167 | 92 | 74 | 170 | 184 | 67 | 33 | 172 | 16 | 119 | 66 | 57 |
| 89 | 106 | 26 | 78 | 178 | 109 | 70 | 2 | 157 | 15 | 105 | 22 | 174 | 127 | 100 | 71 | 97 | 163 | 9 | 77 | 87 | 41 |
| 183 | 117 | 46 | 40 | 131 | 85 | 136 | 72 | 122 | 1 | 45 | 13 | 44 | 56 | 61 | 146 | 25 | 132 | 177 | 76 | 121 | 160 |
| 112 | 5 | 134 | 73 | 91 | 135 | 68 | 3 | 80 | 90 | 190 | 60 | 75 | 145 | 115 | 81 | 161 | 156 | 116 | 166 | 96 | 28 |
| 138 | 94 | 162 | 140 | 102 | 4 | 133 | 30 | 155 | 189 | 143 | 64 | 185 | 164 | 104 | 142 | 154 | 118 | 24 | 31 | 153 | 103 |
| 51 | 108 | 29 | 37 | 58 | 186 | 175 | 36 | 151 | 63 | 93 | 188 | 125 | 101 | 20 | 168 | | | | | | |

FIG. 147

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 61 | 110 | 123 | 127 | 148 | 162 | 131 | 71 | 176 | 22 | 157 | 0 | 151 | 155 | 112 | 189 | 36 | 181 | 10 | 46 | 133 | 75 |
| 80 | 88 | 6 | 165 | 97 | 54 | 31 | 174 | 49 | 139 | 98 | 4 | 170 | 26 | 50 | 16 | 141 | 187 | 13 | 109 | 106 | 120 |
| 72 | 32 | 63 | 59 | 79 | 172 | 83 | 100 | 92 | 24 | 56 | 130 | 167 | 81 | 103 | 111 | 158 | 159 | 153 | 175 | 8 | 41 |
| 136 | 70 | 33 | 45 | 84 | 150 | 39 | 166 | 164 | 99 | 126 | 190 | 134 | 40 | 87 | 64 | 154 | 140 | 116 | 184 | 115 | 183 |
| 30 | 35 | 7 | 42 | 146 | 86 | 58 | 12 | 14 | 149 | 89 | 179 | 128 | 160 | 95 | 171 | 74 | 25 | 29 | 119 | 143 | 178 |
| 28 | 21 | 23 | 90 | 188 | 96 | 173 | 93 | 147 | 191 | 18 | 62 | 2 | 132 | 20 | 11 | 17 | 135 | 152 | 67 | 73 | 108 |
| 76 | 91 | 156 | 104 | 48 | 121 | 94 | 125 | 38 | 65 | 177 | 68 | 37 | 124 | 78 | 118 | 186 | 34 | 185 | 113 | 169 | 9 |
| 69 | 82 | 163 | 114 | 145 | 168 | 44 | 52 | 105 | 51 | 137 | 1 | 161 | 3 | 55 | 182 | 101 | 57 | 43 | 77 | 5 | 47 |
| 144 | 180 | 66 | 53 | 19 | 117 | 60 | 138 | 142 | 107 | 122 | 85 | 27 | 129 | 15 | 102 | | | | | | |

FIG. 148

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 8 | 174 | 121 | 46 | 70 | 106 | 183 | 9 | 96 | 109 | 72 | 130 | 47 | 168 | 1 | 190 | 18 | 90 | 103 | 135 | 105 | 112 |
| 23 | 33 | 185 | 31 | 171 | 111 | 0 | 115 | 4 | 159 | 25 | 65 | 134 | 146 | 26 | 37 | 16 | 169 | 167 | 74 | 67 | 155 |
| 154 | 83 | 117 | 53 | 19 | 161 | 76 | 12 | 7 | 131 | 59 | 51 | 189 | 42 | 114 | 142 | 126 | 66 | 164 | 191 | 55 | 132 |
| 35 | 153 | 137 | 87 | 5 | 100 | 122 | 150 | 2 | 49 | 32 | 172 | 149 | 177 | 15 | 82 | 98 | 34 | 140 | 170 | 56 | 78 |
| 188 | 57 | 118 | 186 | 181 | 52 | 71 | 24 | 81 | 22 | 11 | 156 | 86 | 148 | 97 | 38 | 48 | 64 | 40 | 165 | 180 | 125 |
| 127 | 143 | 88 | 43 | 61 | 158 | 28 | 162 | 187 | 110 | 84 | 157 | 27 | 41 | 39 | 124 | 85 | 58 | 20 | 44 | 102 | 36 |
| 77 | 147 | 120 | 179 | 21 | 60 | 92 | 138 | 119 | 173 | 160 | 144 | 91 | 99 | 107 | 101 | 145 | 184 | 108 | 95 | 69 | 63 |
| 3 | 89 | 128 | 136 | 94 | 129 | 50 | 79 | 68 | 151 | 104 | 163 | 123 | 182 | 93 | 29 | 133 | 152 | 178 | 80 | 62 | 54 |
| 14 | 141 | 166 | 176 | 45 | 30 | 10 | 6 | 75 | 73 | 116 | 175 | 17 | 113 | 139 | 13 | | | | | | |

*FIG. 149*

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 179 | 91 | 101 | 128 | 169 | 69 | 185 | 35 | 156 | 168 | 132 | 163 | 46 | 28 | 5 | 41 | 162 | 112 | 108 | 130 | 153 | 79 |
| 118 | 102 | 125 | 176 | 71 | 20 | 115 | 98 | 124 | 75 | 103 | 21 | 164 | 173 | 9 | 36 | 56 | 134 | 24 | 16 | 159 | 34 |
| 15 | 42 | 104 | 54 | 120 | 76 | 60 | 33 | 127 | 88 | 133 | 137 | 61 | 19 | 3 | 170 | 87 | 190 | 13 | 141 | 188 | 106 |
| 113 | 67 | 145 | 146 | 111 | 74 | 89 | 62 | 175 | 49 | 32 | 99 | 93 | 107 | 171 | 66 | 80 | 155 | 100 | 152 | 4 | 10 |
| 126 | 109 | 181 | 154 | 105 | 48 | 136 | 161 | 183 | 97 | 31 | 12 | 8 | 184 | 47 | 142 | 18 | 14 | 117 | 73 | 84 | 70 |
| 68 | 0 | 23 | 96 | 165 | 29 | 122 | 81 | 17 | 131 | 44 | 157 | 26 | 25 | 189 | 83 | 178 | 37 | 123 | 82 | 191 | 39 |
| 7 | 72 | 160 | 64 | 143 | 149 | 138 | 65 | 58 | 119 | 63 | 166 | 114 | 95 | 172 | 43 | 140 | 57 | 158 | 186 | 86 | 174 |
| 92 | 45 | 139 | 144 | 147 | 148 | 151 | 59 | 30 | 85 | 40 | 51 | 187 | 78 | 38 | 150 | 129 | 121 | 27 | 94 | 52 | 177 |
| 110 | 182 | 55 | 22 | 167 | 90 | 77 | 6 | 11 | 1 | 116 | 53 | 2 | 50 | 135 | 180 | | | | | | |

FIG. 150

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 99 | 59 | 95 | 50 | 122 | 15 | 144 | 6 | 129 | 36 | 175 | 159 | 165 | 35 | 182 | 181 | 189 | 29 | 2 | 115 | 91 | 41 |
| 60 | 160 | 51 | 106 | 168 | 173 | 20 | 138 | 183 | 70 | 24 | 127 | 47 | 5 | 119 | 171 | 102 | 135 | 116 | 156 | 120 | 105 |
| 117 | 136 | 149 | 128 | 85 | 46 | 186 | 113 | 73 | 103 | 52 | 82 | 89 | 184 | 22 | 185 | 155 | 125 | 133 | 37 | 27 | 10 |
| 137 | 76 | 12 | 98 | 148 | 109 | 42 | 16 | 190 | 84 | 94 | 97 | 25 | 11 | 88 | 166 | 131 | 48 | 161 | 65 | 9 | 8 |
| 58 | 56 | 124 | 68 | 54 | 3 | 169 | 146 | 87 | 108 | 110 | 121 | 163 | 57 | 90 | 100 | 66 | 49 | 61 | 178 | 18 | 7 |
| 28 | 67 | 13 | 32 | 34 | 86 | 153 | 112 | 63 | 43 | 164 | 132 | 118 | 93 | 38 | 39 | 17 | 154 | 170 | 81 | 141 | 191 |
| 152 | 111 | 188 | 147 | 180 | 75 | 72 | 26 | 177 | 126 | 179 | 55 | 1 | 143 | 45 | 21 | 40 | 123 | 23 | 162 | 77 | 62 |
| 134 | 158 | 176 | 31 | 69 | 114 | 142 | 19 | 96 | 101 | 71 | 30 | 140 | 187 | 92 | 80 | 79 | 0 | 104 | 53 | 145 | 139 |
| 14 | 33 | 74 | 157 | 150 | 44 | 172 | 151 | 64 | 78 | 130 | 83 | 167 | 4 | 107 | 174 | | | | | | |

FIG. 151

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 16 | 133 | 14 | 114 | 145 | 191 | 53 | 80 | 166 | 68 | 21 | 184 | 73 | 165 | 147 | 89 | 180 | 55 | 135 | 94 | 189 | 78 |
| 103 | 115 | 72 | 24 | 105 | 188 | 84 | 148 | 85 | 32 | 1 | 131 | 34 | 134 | 41 | 167 | 81 | 54 | 142 | 141 | 75 | 155 |
| 122 | 140 | 13 | 17 | 8 | 23 | 61 | 49 | 51 | 74 | 181 | 162 | 143 | 42 | 71 | 123 | 161 | 177 | 110 | 149 | 126 | 0 |
| 63 | 178 | 35 | 175 | 186 | 52 | 43 | 139 | 112 | 10 | 40 | 150 | 182 | 164 | 64 | 83 | 174 | 38 | 47 | 30 | 2 | 116 |
| 25 | 128 | 160 | 144 | 99 | 5 | 187 | 176 | 82 | 60 | 18 | 185 | 104 | 169 | 39 | 183 | 137 | 22 | 109 | 96 | 151 | 46 |
| 33 | 29 | 65 | 132 | 95 | 31 | 136 | 159 | 170 | 168 | 67 | 79 | 93 | 111 | 90 | 97 | 113 | 92 | 76 | 58 | 127 | 26 |
| 27 | 156 | 3 | 6 | 28 | 77 | 125 | 173 | 98 | 138 | 172 | 86 | 45 | 118 | 171 | 62 | 179 | 100 | 19 | 163 | 50 | 57 |
| 56 | 36 | 102 | 121 | 117 | 154 | 119 | 66 | 20 | 91 | 130 | 69 | 44 | 70 | 153 | 152 | 158 | 88 | 108 | 12 | 59 | 4 |
| 11 | 120 | 87 | 101 | 37 | 129 | 146 | 9 | 106 | 48 | 7 | 15 | 124 | 190 | 107 | 157 | | | | | | |

FIG. 152

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 178 | 39 | 54 | 68 | 122 | 20 | 86 | 137 | 156 | 55 | 52 | 72 | 130 | 152 | 147 | 12 | 69 | 48 | 107 | 44 | 88 | 23 |
| 181 | 174 | 124 | 81 | 59 | 93 | 22 | 46 | 82 | 110 | 3 | 99 | 75 | 36 | 38 | 119 | 131 | 51 | 115 | 78 | 84 | 33 |
| 163 | 11 | 2 | 188 | 161 | 34 | 89 | 50 | 8 | 90 | 109 | 136 | 77 | 103 | 67 | 41 | 149 | 176 | 134 | 189 | 159 | 184 |
| 153 | 53 | 129 | 63 | 160 | 139 | 150 | 169 | 148 | 127 | 25 | 175 | 142 | 98 | 56 | 144 | 102 | 94 | 101 | 85 | 132 | 76 |
| 5 | 177 | 0 | 128 | 45 | 162 | 92 | 62 | 133 | 30 | 17 | 9 | 61 | 70 | 154 | 4 | 146 | 24 | 135 | 104 | 13 | 185 |
| 79 | 138 | 31 | 112 | 1 | 49 | 113 | 106 | 100 | 65 | 10 | 83 | 73 | 26 | 58 | 114 | 66 | 126 | 117 | 96 | 186 | 14 |
| 40 | 164 | 158 | 118 | 29 | 121 | 151 | 168 | 183 | 179 | 16 | 105 | 125 | 190 | 116 | 165 | 80 | 64 | 170 | 140 | 171 | 173 |
| 97 | 60 | 43 | 123 | 71 | 182 | 167 | 95 | 145 | 141 | 187 | 166 | 87 | 143 | 15 | 74 | 111 | 157 | 32 | 172 | 18 | 57 |
| 35 | 191 | 27 | 47 | 21 | 6 | 19 | 155 | 42 | 120 | 180 | 37 | 28 | 91 | 108 | 7 | | | | | | |

FIG. 153

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 139 | 112 | 159 | 99 | 87 | 70 | 175 | 161 | 51 | 56 | 174 | 143 | 12 | 36 | 77 | 60 | 155 | 167 | 160 | 73 | 127 | 82 |
| 123 | 145 | 8 | 76 | 164 | 178 | 144 | 86 | 7 | 124 | 27 | 187 | 130 | 162 | 191 | 182 | 16 | 106 | 141 | 38 | 72 | 179 |
| 111 | 29 | 59 | 183 | 66 | 52 | 43 | 121 | 20 | 11 | 190 | 92 | 55 | 166 | 94 | 138 | 1 | 122 | 171 | 119 | 109 | 58 |
| 23 | 31 | 163 | 53 | 13 | 188 | 100 | 158 | 156 | 136 | 34 | 118 | 185 | 10 | 25 | 126 | 104 | 30 | 83 | 47 | 146 | 63 |
| 134 | 39 | 21 | 44 | 151 | 28 | 22 | 79 | 110 | 71 | 90 | 2 | 103 | 42 | 35 | 5 | 57 | 4 | 0 | 107 | 37 | 54 |
| 18 | 128 | 148 | 129 | 26 | 75 | 120 | 19 | 116 | 117 | 147 | 114 | 48 | 96 | 61 | 46 | 88 | 67 | 135 | 65 | 180 | 9 |
| 74 | 176 | 6 | 149 | 49 | 50 | 125 | 64 | 169 | 168 | 157 | 153 | 24 | 108 | 89 | 98 | 33 | 132 | 93 | 40 | 154 | 62 |
| 142 | 41 | 69 | 105 | 189 | 115 | 152 | 45 | 133 | 3 | 95 | 17 | 186 | 184 | 85 | 165 | 32 | 173 | 113 | 172 | 78 | 181 |
| 150 | 170 | 102 | 97 | 140 | 81 | 91 | 15 | 137 | 101 | 80 | 68 | 14 | 177 | 131 | 84 | | | | | | |

FIG. 154

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 21 | 20 | 172 | 86 | 178 | 25 | 104 | 133 | 17 | 106 | 191 | 68 | 80 | 190 | 129 | 29 | 125 | 108 | 147 | 23 | 94 | 167 |
| 27 | 61 | 12 | 166 | 131 | 120 | 159 | 28 | 7 | 62 | 134 | 59 | 78 | 0 | 121 | 149 | 6 | 5 | 143 | 171 | 153 | 161 |
| 186 | 35 | 92 | 113 | 55 | 163 | 16 | 54 | 93 | 79 | 37 | 44 | 75 | 182 | 127 | 148 | 179 | 95 | 169 | 141 | 38 | 168 |
| 128 | 56 | 31 | 57 | 175 | 140 | 164 | 24 | 177 | 88 | 51 | 112 | 49 | 185 | 170 | 87 | 32 | 60 | 65 | 77 | 89 | 3 |
| 18 | 116 | 184 | 45 | 109 | 53 | 160 | 9 | 100 | 8 | 111 | 69 | 189 | 36 | 173 | 33 | 72 | 144 | 183 | 115 | 137 | 98 |
| 90 | 142 | 30 | 154 | 180 | 122 | 155 | 130 | 83 | 138 | 14 | 41 | 150 | 132 | 70 | 152 | 117 | 11 | 4 | 124 | 15 | 42 |
| 181 | 58 | 10 | 22 | 145 | 99 | 126 | 107 | 66 | 174 | 39 | 13 | 97 | 63 | 123 | 84 | 85 | 67 | 76 | 158 | 71 | 46 |
| 118 | 81 | 162 | 146 | 135 | 2 | 73 | 50 | 114 | 82 | 103 | 188 | 74 | 101 | 157 | 151 | 91 | 119 | 102 | 48 | 1 | 40 |
| 43 | 64 | 156 | 34 | 110 | 52 | 96 | 136 | 139 | 165 | 19 | 176 | 187 | 47 | 26 | 105 | | | | | | |

FIG. 155

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 160 | 7 | 29 | 39 | 110 | 189 | 140 | 143 | 163 | 130 | 173 | 71 | 191 | 106 | 60 | 62 | 149 | 135 | 9 | 147 | 124 | 152 |
| 55 | 116 | 85 | 112 | 14 | 20 | 79 | 103 | 156 | 167 | 19 | 45 | 73 | 26 | 159 | 44 | 86 | 76 | 56 | 12 | 109 | 117 |
| 128 | 67 | 150 | 151 | 31 | 27 | 133 | 17 | 120 | 153 | 108 | 180 | 52 | 187 | 98 | 63 | 176 | 186 | 179 | 113 | 161 | 32 |
| 24 | 111 | 41 | 95 | 38 | 10 | 154 | 97 | 141 | 2 | 127 | 40 | 105 | 34 | 11 | 185 | 155 | 61 | 114 | 74 | 158 | 162 |
| 5 | 177 | 43 | 51 | 148 | 137 | 28 | 181 | 171 | 13 | 104 | 42 | 168 | 93 | 172 | 144 | 80 | 123 | 89 | 81 | 68 | 75 |
| 78 | 121 | 53 | 65 | 122 | 142 | 157 | 107 | 136 | 66 | 90 | 23 | 8 | 1 | 77 | 54 | 125 | 174 | 35 | 88 | 82 | 134 |
| 101 | 131 | 33 | 50 | 87 | 36 | 15 | 47 | 83 | 18 | 6 | 21 | 30 | 94 | 72 | 145 | 138 | 184 | 69 | 84 | 58 | 49 |
| 16 | 48 | 70 | 183 | 3 | 92 | 25 | 115 | 0 | 182 | 139 | 91 | 146 | 102 | 96 | 100 | 119 | 129 | 178 | 46 | 37 | 57 |
| 118 | 126 | 59 | 165 | 170 | 190 | 188 | 175 | 166 | 99 | 4 | 22 | 132 | 164 | 64 | 169 | | | | | | |

FIG. 156

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 167 | 97 | 86 | 166 | 11 | 57 | 187 | 169 | 104 | 102 | 108 | 63 | 12 | 181 | 1 | 71 | 134 | 152 | 45 | 144 | 124 | 22 |
| 0 | 51 | 100 | 150 | 179 | 54 | 66 | 79 | 25 | 172 | 59 | 48 | 23 | 55 | 64 | 185 | 164 | 123 | 56 | 80 | 153 | 9 |
| 177 | 176 | 81 | 17 | 14 | 43 | 76 | 27 | 175 | 60 | 133 | 91 | 61 | 41 | 111 | 163 | 72 | 95 | 84 | 67 | 129 | 52 |
| 88 | 121 | 7 | 49 | 168 | 154 | 74 | 138 | 142 | 158 | 132 | 127 | 40 | 139 | 20 | 44 | 6 | 128 | 75 | 114 | 119 | 2 |
| 8 | 157 | 98 | 118 | 89 | 46 | 160 | 190 | 5 | 165 | 28 | 68 | 189 | 161 | 112 | 173 | 148 | 183 | 33 | 131 | 105 | 186 |
| 156 | 70 | 117 | 170 | 174 | 36 | 19 | 135 | 125 | 122 | 50 | 113 | 141 | 37 | 38 | 31 | 94 | 149 | 78 | 32 | 178 | 34 |
| 107 | 13 | 182 | 146 | 93 | 10 | 106 | 109 | 4 | 77 | 87 | 3 | 184 | 83 | 30 | 180 | 96 | 15 | 155 | 110 | 145 | 191 |
| 151 | 101 | 65 | 99 | 115 | 140 | 26 | 147 | 42 | 136 | 137 | 18 | 53 | 116 | 171 | 16 | 21 | 92 | 162 | 130 | 85 | 69 |
| 47 | 35 | 82 | 120 | 24 | 73 | 39 | 58 | 62 | 126 | 29 | 90 | 143 | 159 | 188 | 103 | | | | | | |

FIG. 157

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 74 | 151 | 79 | 49 | 174 | 180 | 133 | 106 | 116 | 16 | 163 | 62 | 164 | 45 | 167 | 128 | 176 | 2 | 126 | 136 | 63 | 28 |
| 118 | 173 | 19 | 46 | 93 | 121 | 162 | 88 | 0 | 147 | 131 | 54 | 117 | 138 | 69 | 182 | 68 | 143 | 78 | 15 | 7 | 59 |
| 109 | 32 | 10 | 179 | 165 | 90 | 73 | 71 | 171 | 135 | 123 | 125 | 31 | 22 | 70 | 185 | 155 | 60 | 120 | 113 | 41 | 154 |
| 177 | 85 | 64 | 55 | 26 | 129 | 84 | 38 | 166 | 44 | 30 | 183 | 189 | 191 | 124 | 77 | 80 | 98 | 190 | 167 | 140 | 52 |
| 153 | 43 | 25 | 188 | 103 | 152 | 137 | 76 | 149 | 34 | 172 | 122 | 40 | 168 | 141 | 96 | 142 | 58 | 110 | 65 | 9 | 36 |
| 42 | 50 | 184 | 105 | 156 | 127 | 8 | 61 | 146 | 169 | 181 | 5 | 87 | 150 | 91 | 17 | 18 | 24 | 112 | 81 | 170 | 95 |
| 29 | 100 | 130 | 48 | 159 | 72 | 75 | 160 | 27 | 108 | 148 | 66 | 144 | 97 | 57 | 115 | 114 | 1 | 132 | 4 | 21 | 92 |
| 11 | 107 | 175 | 67 | 145 | 14 | 186 | 20 | 51 | 39 | 3 | 86 | 89 | 47 | 53 | 102 | 82 | 139 | 23 | 104 | 157 | 99 |
| 158 | 12 | 161 | 35 | 178 | 37 | 134 | 83 | 94 | 101 | 111 | 119 | 6 | 33 | 13 | 56 | | | | | | |

FIG. 158

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 20 | 118 | 185 | 106 | 82 | 53 | 41 | 40 | 121 | 180 | 45 | 10 | 145 | 175 | 191 | 160 | 177 | 172 | 13 | 29 | 133 | 42 |
| 89 | 51 | 141 | 99 | 7 | 134 | 52 | 48 | 169 | 162 | 124 | 25 | 165 | 128 | 95 | 148 | 98 | 171 | 14 | 75 | 59 | 26 |
| 76 | 47 | 34 | 122 | 69 | 131 | 105 | 60 | 132 | 63 | 81 | 109 | 43 | 189 | 19 | 186 | 79 | 62 | 85 | 54 | 16 | 46 |
| 27 | 44 | 139 | 113 | 11 | 102 | 130 | 184 | 119 | 1 | 152 | 146 | 37 | 178 | 61 | 150 | 32 | 163 | 92 | 166 | 142 | 67 |
| 140 | 157 | 188 | 18 | 87 | 149 | 65 | 183 | 161 | 5 | 31 | 71 | 173 | 73 | 15 | 138 | 156 | 28 | 66 | 170 | 179 | 135 |
| 86 | 39 | 104 | 17 | 154 | 174 | 56 | 153 | 0 | 97 | 9 | 72 | 23 | 167 | 190 | 80 | 3 | 38 | 120 | 4 | 24 | 159 |
| 12 | 103 | 22 | 125 | 83 | 50 | 6 | 77 | 168 | 74 | 93 | 49 | 57 | 147 | 2 | 155 | 181 | 96 | 114 | 107 | 110 | 30 |
| 117 | 127 | 101 | 94 | 129 | 35 | 58 | 70 | 126 | 182 | 151 | 111 | 91 | 64 | 88 | 144 | 137 | 143 | 176 | 84 | 136 | 8 |
| 112 | 123 | 164 | 115 | 78 | 36 | 90 | 100 | 55 | 108 | 21 | 158 | 68 | 33 | 116 | 187 | | | | | | |

*FIG. 159*

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 42 | 43 | 190 | 119 | 183 | 103 | 51 | 28 | 171 | 20 | 18 | 25 | 85 | 22 | 157 | 99 | 174 | 5 | 53 | 62 | 150 | 128 |
| 38 | 153 | 37 | 148 | 39 | 24 | 118 | 102 | 184 | 49 | 111 | 48 | 87 | 76 | 81 | 40 | 55 | 82 | 70 | 105 | 66 | 115 |
| 14 | 86 | 88 | 135 | 168 | 139 | 56 | 80 | 93 | 95 | 165 | 13 | 4 | 100 | 29 | 104 | 11 | 72 | 116 | 83 | 112 | 67 |
| 186 | 169 | 8 | 57 | 44 | 17 | 164 | 31 | 96 | 84 | 2 | 125 | 59 | 3 | 6 | 173 | 149 | 78 | 27 | 160 | 156 | 187 |
| 34 | 129 | 154 | 79 | 52 | 117 | 110 | 0 | 7 | 113 | 137 | 26 | 47 | 12 | 178 | 46 | 136 | 97 | 15 | 188 | 101 | 58 |
| 35 | 71 | 32 | 16 | 109 | 163 | 134 | 75 | 68 | 98 | 132 | 90 | 124 | 189 | 121 | 123 | 170 | 158 | 159 | 77 | 108 | 63 |
| 180 | 36 | 74 | 127 | 21 | 146 | 147 | 54 | 155 | 10 | 144 | 130 | 60 | 1 | 141 | 23 | 177 | 133 | 50 | 126 | 167 | 151 |
| 161 | 191 | 91 | 114 | 162 | 30 | 181 | 182 | 9 | 94 | 69 | 176 | 65 | 142 | 152 | 175 | 73 | 140 | 41 | 179 | 172 | 145 |
| 64 | 19 | 138 | 131 | 166 | 33 | 107 | 185 | 106 | 122 | 120 | 92 | 45 | 143 | 61 | 89 | | | | | | |

FIG. 160

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 111 | 33 | 21 | 133 | 18 | 30 | 73 | 139 | 125 | 35 | 77 | 105 | 122 | 91 | 41 | 86 | 11 | 8 | 55 | 71 | 151 | 107 |
| 45 | 12 | 168 | 51 | 50 | 59 | 7 | 132 | 144 | 16 | 190 | 31 | 108 | 89 | 124 | 110 | 94 | 67 | 159 | 46 | 140 | 87 |
| 54 | 142 | 185 | 85 | 84 | 120 | 178 | 101 | 180 | 20 | 174 | 47 | 28 | 145 | 70 | 24 | 131 | 4 | 83 | 56 | 79 | 37 |
| 27 | 109 | 92 | 52 | 96 | 177 | 141 | 188 | 155 | 38 | 156 | 169 | 136 | 81 | 137 | 112 | 95 | 93 | 106 | 149 | 138 | 15 |
| 39 | 170 | 146 | 103 | 184 | 43 | 5 | 9 | 189 | 34 | 19 | 63 | 90 | 36 | 23 | 78 | 100 | 75 | 162 | 42 | 161 | 119 |
| 64 | 65 | 152 | 62 | 173 | 104 | 88 | 113 | 48 | 44 | 40 | 60 | 102 | 61 | 74 | 99 | 53 | 10 | 6 | 172 | 186 | 163 |
| 134 | 14 | 148 | 3 | 26 | 1 | 157 | 150 | 25 | 123 | 115 | 116 | 57 | 175 | 127 | 82 | 117 | 114 | 160 | 164 | 153 | 176 |
| 76 | 13 | 181 | 68 | 128 | 0 | 183 | 49 | 22 | 166 | 17 | 191 | 135 | 165 | 72 | 158 | 130 | 154 | 167 | 66 | 2 | 147 |
| 69 | 58 | 98 | 97 | 143 | 32 | 29 | 179 | 113 | 80 | 182 | 129 | 126 | 171 | 121 | 187 | | | | | | |

FIG. 161

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 148 | 32 | 94 | 31 | 146 | 15 | 41 | 7 | 79 | 58 | 52 | 167 | 154 | 4 | 161 | 38 | 64 | 127 | 131 | 78 | 34 | 125 |
| 171 | 173 | 133 | 122 | 50 | 95 | 129 | 57 | 71 | 37 | 137 | 69 | 82 | 107 | 26 | 10 | 140 | 156 | 47 | 178 | 163 | 117 |
| 139 | 174 | 143 | 138 | 111 | 11 | 166 | 43 | 141 | 114 | 45 | 39 | 177 | 103 | 96 | 123 | 63 | 23 | 18 | 20 | 187 | 27 |
| 66 | 130 | 65 | 142 | 5 | 135 | 113 | 90 | 121 | 54 | 190 | 134 | 153 | 147 | 92 | 157 | 3 | 97 | 102 | 106 | 172 | 91 |
| 46 | 89 | 56 | 184 | 115 | 99 | 62 | 93 | 100 | 88 | 152 | 109 | 124 | 182 | 70 | 74 | 159 | 165 | 60 | 183 | 185 | 164 |
| 175 | 108 | 176 | 2 | 118 | 72 | 151 | 0 | 51 | 33 | 28 | 80 | 14 | 128 | 179 | 84 | 77 | 42 | 55 | 160 | 119 | 110 |
| 86 | 22 | 101 | 13 | 170 | 36 | 104 | 189 | 191 | 169 | 112 | 12 | 29 | 30 | 162 | 136 | 24 | 68 | 9 | 81 | 120 | 145 |
| 180 | 144 | 73 | 21 | 44 | 1 | 16 | 67 | 19 | 158 | 188 | 181 | 61 | 35 | 8 | 53 | 168 | 150 | 105 | 59 | 87 | 6 |
| 126 | 75 | 85 | 17 | 83 | 98 | 48 | 132 | 40 | 76 | 49 | 25 | 149 | 186 | 155 | 116 | | | | | | |

FIG. 162

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 161 | 38 | 41 | 138 | 20 | 24 | 14 | 35 | 32 | 179 | 68 | 97 | 94 | 142 | 43 | 53 | 22 | 28 | 44 | 81 | 148 | 187 |
| 169 | 89 | 115 | 144 | 75 | 40 | 31 | 152 | 30 | 124 | 80 | 135 | 160 | 8 | 129 | 147 | 60 | 112 | 171 | 0 | 133 | 100 |
| 156 | 180 | 77 | 110 | 151 | 69 | 95 | 25 | 117 | 127 | 154 | 64 | 146 | 143 | 29 | 168 | 177 | 183 | 126 | 10 | 26 | 3 |
| 50 | 92 | 164 | 163 | 11 | 109 | 21 | 37 | 84 | 122 | 49 | 71 | 52 | 15 | 88 | 149 | 86 | 61 | 90 | 155 | 162 | 9 |
| 153 | 67 | 119 | 189 | 82 | 131 | 190 | 4 | 46 | 118 | 47 | 178 | 59 | 150 | 186 | 123 | 18 | 79 | 57 | 120 | 70 | 62 |
| 137 | 23 | 185 | 167 | 175 | 16 | 134 | 73 | 139 | 166 | 55 | 165 | 116 | 76 | 99 | 182 | 78 | 93 | 141 | 33 | 176 | 101 |
| 130 | 58 | 12 | 17 | 132 | 45 | 102 | 7 | 19 | 145 | 54 | 91 | 113 | 36 | 27 | 114 | 174 | 39 | 83 | 140 | 191 | 74 |
| 56 | 87 | 48 | 158 | 121 | 159 | 136 | 63 | 181 | 34 | 173 | 103 | 42 | 125 | 104 | 107 | 96 | 65 | 1 | 13 | 157 | 184 |
| 170 | 105 | 188 | 108 | 6 | 2 | 98 | 72 | 5 | 66 | 128 | 106 | 172 | 111 | 85 | 51 | | | | | | |

FIG. 163

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 57 | 73 | 173 | 63 | 179 | 186 | 148 | 181 | 160 | 163 | 4 | 109 | 137 | 99 | 118 | 15 | 5 | 115 | 44 | 153 | 185 | 40 |
| 12 | 169 | 2 | 37 | 188 | 97 | 65 | 67 | 117 | 90 | 66 | 135 | 154 | 159 | 146 | 86 | 61 | 182 | 59 | 83 | 91 | 175 |
| 58 | 138 | 93 | 43 | 98 | 22 | 152 | 96 | 45 | 120 | 180 | 10 | 116 | 170 | 162 | 68 | 3 | 13 | 41 | 131 | 21 | 172 |
| 55 | 24 | 1 | 79 | 106 | 189 | 52 | 184 | 112 | 53 | 136 | 166 | 29 | 62 | 107 | 128 | 71 | 111 | 187 | 161 | 101 | 49 |
| 155 | 28 | 94 | 70 | 48 | 0 | 33 | 157 | 151 | 25 | 89 | 88 | 114 | 134 | 75 | 87 | 142 | 6 | 27 | 64 | 69 | 19 |
| 150 | 38 | 35 | 130 | 127 | 76 | 102 | 123 | 158 | 129 | 133 | 110 | 141 | 95 | 7 | 126 | 85 | 108 | 174 | 190 | 165 | 156 |
| 171 | 54 | 17 | 121 | 103 | 14 | 36 | 105 | 82 | 8 | 178 | 51 | 23 | 84 | 167 | 30 | 100 | 42 | 72 | 149 | 92 | 77 |
| 104 | 183 | 39 | 125 | 80 | 143 | 144 | 56 | 119 | 16 | 132 | 139 | 191 | 50 | 164 | 122 | 46 | 140 | 31 | 176 | 60 | 26 |
| 32 | 11 | 177 | 124 | 74 | 145 | 20 | 34 | 18 | 81 | 168 | 9 | 78 | 113 | 147 | 47 | | | | | | |

FIG. 164

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

| | | | | | | | | | | | | | | | | | | | | | |
|---|---|---|---|---|---|---|---|---|---|---|---|---|---|---|---|---|---|---|---|---|---|
| 89 | 123 | 13 | 47 | 178 | 159 | 1 | 190 | 53 | 12 | 57 | 109 | 115 | 19 | 36 | 143 | 82 | 96 | 163 | 66 | 154 | 173 |
| 49 | 65 | 131 | 2 | 78 | 15 | 155 | 90 | 38 | 130 | 63 | 188 | 138 | 184 | 166 | 102 | 139 | 28 | 50 | 186 | 17 | 20 |
| 112 | 41 | 11 | 8 | 59 | 79 | 45 | 162 | 146 | 40 | 43 | 129 | 119 | 18 | 157 | 37 | 126 | 124 | 110 | 191 | 85 | 165 |
| 60 | 142 | 135 | 74 | 187 | 179 | 141 | 164 | 34 | 69 | 26 | 33 | 113 | 120 | 95 | 169 | 30 | 0 | 175 | 70 | 91 | 104 |
| 140 | 25 | 132 | 23 | 105 | 158 | 171 | 6 | 121 | 56 | 22 | 127 | 54 | 68 | 107 | 133 | 84 | 81 | 150 | 99 | 73 | 185 |
| 67 | 29 | 151 | 87 | 10 | 167 | 148 | 72 | 147 | 5 | 31 | 125 | 145 | 4 | 52 | 44 | 134 | 83 | 46 | 75 | 152 | 62 |
| 7 | 86 | 172 | 180 | 111 | 61 | 9 | 58 | 14 | 116 | 92 | 170 | 93 | 77 | 88 | 42 | 21 | 106 | 97 | 144 | 182 | 108 |
| 55 | 94 | 122 | 114 | 153 | 64 | 24 | 80 | 117 | 3 | 177 | 149 | 76 | 128 | 136 | 39 | 181 | 160 | 103 | 174 | 156 | 27 |
| 183 | 16 | 137 | 101 | 161 | 176 | 35 | 118 | 98 | 168 | 48 | 100 | 71 | 189 | 32 | 51 | | | | | | |

FIG. 165

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 116 | 157 | 105 | 191 | 110 | 149 | 0 | 186 | 88 | 165 | 141 | 179 | 160 | 121 | 35 | 170 | 97 | 7 | 181 | 31 | 130 | 123 |
| 184 | 34 | 101 | 167 | 68 | 135 | 18 | 91 | 159 | 81 | 53 | 36 | 164 | 139 | 61 | 162 | 79 | 4 | 176 | 127 | 42 | 148 |
| 147 | 150 | 55 | 109 | 132 | 124 | 9 | 66 | 14 | 128 | 134 | 27 | 29 | 59 | 153 | 22 | 120 | 13 | 187 | 112 | 69 | 163 |
| 11 | 70 | 58 | 15 | 25 | 102 | 188 | 182 | 156 | 20 | 17 | 10 | 32 | 76 | 5 | 28 | 46 | 166 | 140 | 143 | 65 | 63 |
| 107 | 119 | 87 | 145 | 62 | 108 | 189 | 114 | 71 | 78 | 122 | 93 | 37 | 12 | 137 | 118 | 56 | 67 | 98 | 113 | 173 | 169 |
| 39 | 51 | 177 | 1 | 84 | 40 | 158 | 2 | 144 | 73 | 43 | 82 | 92 | 16 | 133 | 129 | 99 | 86 | 57 | 47 | 183 | 171 |
| 131 | 33 | 26 | 168 | 155 | 178 | 175 | 64 | 52 | 100 | 142 | 90 | 8 | 106 | 45 | 19 | 24 | 80 | 146 | 136 | 125 | 95 |
| 172 | 104 | 154 | 138 | 6 | 85 | 94 | 74 | 151 | 44 | 174 | 115 | 185 | 89 | 23 | 190 | 111 | 72 | 180 | 54 | 77 | 75 |
| 117 | 126 | 49 | 103 | 48 | 60 | 83 | 3 | 21 | 50 | 161 | 30 | 96 | 152 | 41 | 38 | | | | | | |

FIG. 166

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 115 | 167 | 98 | 128 | 174 | 73 | 109 | 79 | 40 | 6 | 190 | 113 | 158 | 56 | 183 | 61 | 134 | 13 | 32 | 133 | 173 | 1 |
| 76 | 151 | 147 | 70 | 155 | 77 | 51 | 150 | 146 | 12 | 186 | 33 | 74 | 171 | 53 | 11 | 17 | 68 | 136 | 9 | 181 | 91 |
| 125 | 161 | 42 | 124 | 72 | 96 | 101 | 81 | 84 | 107 | 63 | 55 | 65 | 5 | 163 | 157 | 135 | 18 | 130 | 120 | 87 | 85 |
| 47 | 187 | 3 | 46 | 49 | 112 | 159 | 188 | 169 | 127 | 78 | 25 | 93 | 45 | 143 | 182 | 59 | 36 | 19 | 110 | 39 | 43 |
| 35 | 15 | 90 | 180 | 82 | 145 | 48 | 34 | 144 | 178 | 177 | 86 | 27 | 103 | 94 | 62 | 170 | 57 | 154 | 166 | 54 | 164 |
| 20 | 185 | 29 | 2 | 16 | 60 | 37 | 75 | 10 | 162 | 116 | 92 | 71 | 106 | 105 | 175 | 44 | 108 | 50 | 26 | 7 | 176 |
| 38 | 99 | 4 | 122 | 52 | 66 | 0 | 140 | 184 | 24 | 80 | 97 | 23 | 114 | 30 | 126 | 148 | 64 | 119 | 165 | 137 | 123 |
| 95 | 111 | 160 | 8 | 153 | 149 | 172 | 121 | 129 | 28 | 104 | 156 | 100 | 189 | 14 | 138 | 88 | 118 | 139 | 93 | 191 | 31 |
| 131 | 179 | 152 | 89 | 22 | 41 | 168 | 117 | 21 | 69 | 132 | 102 | 58 | 67 | 142 | 141 | | | | | | |

FIG. 167

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

| | | | | | | | | | | | | | | | | | | | | | |
|---|---|---|---|---|---|---|---|---|---|---|---|---|---|---|---|---|---|---|---|---|---|
| 31 | 178 | 143 | 125 | 159 | 168 | 34 | 127 | 158 | 157 | 21 | 124 | 153 | 162 | 59 | 156 | 165 | 40 | 108 | 43 | 98 | 119 |
| 33 | 13 | 175 | 166 | 117 | 25 | 63 | 111 | 74 | 1 | 38 | 169 | 131 | 100 | 164 | 0 | 171 | 101 | 151 | 113 | 20 | 185 |
| 17 | 86 | 146 | 11 | 12 | 19 | 145 | 85 | 3 | 80 | 133 | 93 | 10 | 72 | 152 | 172 | 140 | 45 | 115 | 79 | 161 | 39 |
| 99 | 5 | 37 | 110 | 155 | 170 | 123 | 70 | 52 | 81 | 65 | 160 | 132 | 103 | 9 | 88 | 15 | 130 | 71 | 129 | 177 | 128 |
| 121 | 150 | 36 | 35 | 163 | 83 | 142 | 105 | 48 | 64 | 82 | 46 | 148 | 138 | 147 | 149 | 27 | 56 | 47 | 50 | 42 | 54 |
| 182 | 23 | 97 | 89 | 167 | 141 | 75 | 32 | 118 | 44 | 96 | 66 | 73 | 190 | 181 | 191 | 92 | 53 | 87 | 176 | 102 | 144 |
| 28 | 134 | 77 | 184 | 189 | 67 | 187 | 174 | 49 | 94 | 68 | 18 | 186 | 26 | 120 | 62 | 136 | 24 | 4 | 16 | 61 | 179 |
| 106 | 95 | 135 | 41 | 173 | 154 | 78 | 2 | 22 | 139 | 76 | 58 | 90 | 137 | 114 | 126 | 51 | 84 | 14 | 91 | 183 | 180 |
| 112 | 122 | 30 | 29 | 69 | 107 | 116 | 55 | 8 | 104 | 6 | 60 | 57 | 7 | 109 | 188 | | | | | | |

FIG. 168

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 36 | 20 | 126 | 165 | 181 | 59 | 90 | 186 | 191 | 120 | 182 | 170 | 171 | 137 | 62 | 84 | 146 | 106 | 64 | 129 | 56 | 136 |
| 57 | 108 | 190 | 74 | 70 | 10 | 68 | 139 | 35 | 104 | 63 | 16 | 19 | 66 | 1 | 15 | 61 | 97 | 172 | 72 | 26 | 141 |
| 80 | 151 | 138 | 156 | 46 | 82 | 95 | 142 | 77 | 76 | 17 | 102 | 92 | 60 | 148 | 99 | 140 | 2 | 78 | 145 | 29 | 174 |
| 32 | 103 | 3 | 133 | 163 | 23 | 150 | 155 | 44 | 185 | 65 | 134 | 184 | 11 | 38 | 119 | 117 | 167 | 79 | 5 | 130 | 94 |
| 33 | 157 | 154 | 109 | 30 | 31 | 160 | 96 | 49 | 178 | 110 | 128 | 166 | 7 | 162 | 48 | 34 | 55 | 22 | 143 | 149 | 121 |
| 89 | 114 | 176 | 107 | 67 | 73 | 51 | 53 | 132 | 83 | 158 | 69 | 153 | 180 | 188 | 101 | 37 | 179 | 111 | 71 | 147 | 189 |
| 124 | 43 | 86 | 98 | 91 | 45 | 135 | 168 | 183 | 42 | 27 | 81 | 152 | 164 | 58 | 100 | 25 | 4 | 13 | 144 | 112 | 122 |
| 159 | 187 | 52 | 85 | 50 | 9 | 87 | 127 | 169 | 173 | 14 | 93 | 116 | 175 | 177 | 24 | 40 | 0 | 28 | 12 | 161 | 105 |
| 41 | 75 | 123 | 39 | 125 | 18 | 54 | 6 | 131 | 118 | 115 | 88 | 8 | 113 | 21 | 47 | | | | | | |

FIG. 169

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 12 | 183 | 40 | 66 | 35 | 155 | 137 | 58 | 108 | 93 | 47 | 78 | 56 | 122 | 51 | 114 | 10 | 164 | 148 | 190 | 53 | 76 |
| 75 | 11 | 46 | 2 | 174 | 146 | 119 | 170 | 98 | 22 | 116 | 28 | 67 | 63 | 59 | 154 | 94 | 105 | 187 | 9 | 97 | 166 |
| 19 | 125 | 189 | 185 | 178 | 115 | 123 | 150 | 60 | 77 | 86 | 69 | 26 | 145 | 143 | 134 | 124 | 111 | 162 | 141 | 80 | 34 |
| 138 | 130 | 45 | 33 | 127 | 37 | 91 | 84 | 102 | 13 | 16 | 172 | 61 | 182 | 57 | 55 | 101 | 142 | 117 | 87 | 131 | 188 |
| 191 | 113 | 39 | 54 | 74 | 72 | 29 | 48 | 161 | 139 | 151 | 180 | 1 | 160 | 103 | 173 | 15 | 52 | 186 | 133 | 71 | 132 |
| 31 | 135 | 70 | 81 | 24 | 112 | 6 | 175 | 96 | 3 | 79 | 156 | 109 | 8 | 153 | 90 | 177 | 49 | 99 | 128 | 21 | 7 |
| 158 | 89 | 92 | 126 | 32 | 121 | 100 | 88 | 163 | 136 | 20 | 83 | 17 | 42 | 95 | 129 | 118 | 43 | 157 | 50 | 5 | 179 |
| 140 | 147 | 62 | 38 | 176 | 149 | 159 | 44 | 106 | 152 | 65 | 14 | 168 | 184 | 0 | 107 | 167 | 36 | 73 | 110 | 165 | 120 |
| 104 | 23 | 25 | 82 | 27 | 41 | 181 | 169 | 85 | 144 | 4 | 18 | 171 | 30 | 68 | 64 | | | | | | |

FIG. 170

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 140 | 166 | 22 | 87 | 107 | 121 | 66 | 80 | 85 | 109 | 45 | 13 | 144 | 63 | 0 | 52 | 131 | 122 | 135 | 173 | 105 | 98 |
| 117 | 168 | 8 | 123 | 157 | 93 | 129 | 37 | 119 | 143 | 40 | 59 | 162 | 21 | 79 | 102 | 34 | 36 | 32 | 41 | 177 | 48 |
| 83 | 94 | 191 | 78 | 101 | 155 | 160 | 189 | 77 | 57 | 11 | 148 | 124 | 65 | 187 | 110 | 100 | 114 | 67 | 150 | 82 | 156 |
| 43 | 5 | 1 | 126 | 46 | 167 | 149 | 72 | 31 | 161 | 23 | 113 | 137 | 132 | 35 | 76 | 26 | 61 | 141 | 15 | 4 | 25 |
| 17 | 182 | 92 | 29 | 27 | 73 | 170 | 53 | 64 | 127 | 112 | 171 | 56 | 106 | 186 | 183 | 95 | 165 | 10 | 103 | 74 | 84 |
| 116 | 20 | 185 | 6 | 133 | 147 | 75 | 62 | 14 | 142 | 44 | 181 | 146 | 164 | 128 | 9 | 60 | 50 | 91 | 88 | 97 | 145 |
| 28 | 7 | 118 | 99 | 115 | 39 | 125 | 136 | 180 | 179 | 96 | 175 | 3 | 47 | 158 | 172 | 154 | 138 | 176 | 33 | 81 | 134 |
| 120 | 174 | 151 | 49 | 30 | 108 | 68 | 38 | 153 | 2 | 69 | 111 | 54 | 130 | 71 | 24 | 58 | 178 | 19 | 42 | 51 | 190 |
| 89 | 16 | 90 | 169 | 70 | 18 | 86 | 184 | 12 | 188 | 163 | 55 | 139 | 104 | 152 | 159 | | | | | | |

FIG. 171

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 128 | 120 | 91 | 121 | 189 | 30 | 127 | 35 | 76 | 26 | 144 | 45 | 178 | 93 | 14 | 31 | 123 | 155 | 19 | 28 | 152 | 174 |
| 177 | 168 | 56 | 169 | 95 | 7 | 96 | 133 | 136 | 146 | 172 | 187 | 90 | 44 | 98 | 150 | 40 | 20 | 104 | 191 | 37 | 61 |
| 42 | 43 | 27 | 159 | 163 | 100 | 164 | 151 | 111 | 102 | 165 | 132 | 138 | 180 | 22 | 70 | 184 | 62 | 167 | 134 | 60 | 160 |
| 175 | 157 | 153 | 77 | 87 | 185 | 116 | 115 | 176 | 78 | 5 | 39 | 88 | 33 | 126 | 13 | 71 | 188 | 171 | 135 | 21 | 16 |
| 143 | 51 | 99 | 182 | 85 | 129 | 162 | 66 | 0 | 55 | 73 | 117 | 75 | 181 | 179 | 53 | 170 | 1 | 125 | 69 | 80 | 83 |
| 57 | 38 | 103 | 109 | 137 | 63 | 74 | 9 | 15 | 118 | 67 | 2 | 113 | 124 | 114 | 6 | 154 | 141 | 50 | 149 | 4 | 46 |
| 8 | 130 | 94 | 34 | 23 | 54 | 145 | 81 | 58 | 82 | 139 | 156 | 108 | 140 | 166 | 36 | 183 | 110 | 101 | 161 | 84 | 119 |
| 92 | 3 | 142 | 186 | 158 | 173 | 147 | 49 | 10 | 32 | 65 | 89 | 86 | 131 | 18 | 47 | 107 | 79 | 72 | 25 | 68 | 122 |
| 29 | 11 | 41 | 190 | 59 | 52 | 97 | 148 | 12 | 24 | 105 | 17 | 106 | 48 | 64 | 112 | | | | | | |

FIG. 172

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 36 | 180 | 61 | 100 | 163 | 168 | 14 | 24 | 105 | 104 | 131 | 56 | 40 | 73 | 165 | 157 | 126 | 47 | 160 | 181 | 166 | 161 |
| 1 | 81 | 58 | 182 | 169 | 177 | 85 | 17 | 13 | 46 | 171 | 149 | 91 | 79 | 109 | 133 | 164 | 125 | 52 | 77 | 118 | 186 |
| 107 | 150 | 135 | 33 | 130 | 87 | 167 | 158 | 23 | 83 | 152 | 114 | 68 | 12 | 132 | 178 | 106 | 184 | 176 | 72 | 31 | 53 |
| 21 | 110 | 76 | 146 | 4 | 18 | 113 | 65 | 34 | 179 | 111 | 185 | 84 | 144 | 27 | 39 | 151 | 50 | 69 | 30 | 169 | 175 |
| 9 | 42 | 54 | 43 | 90 | 22 | 139 | 129 | 170 | 115 | 45 | 140 | 67 | 25 | 155 | 82 | 102 | 29 | 188 | 108 | 15 | 80 |
| 128 | 48 | 0 | 64 | 141 | 93 | 191 | 190 | 174 | 32 | 35 | 119 | 159 | 41 | 55 | 162 | 49 | 59 | 88 | 156 | 123 | 136 |
| 28 | 60 | 26 | 16 | 89 | 147 | 92 | 98 | 38 | 20 | 173 | 71 | 44 | 94 | 5 | 7 | 99 | 75 | 122 | 120 | 66 | 121 |
| 112 | 62 | 8 | 137 | 142 | 103 | 116 | 117 | 37 | 63 | 70 | 86 | 10 | 74 | 95 | 11 | 134 | 154 | 51 | 101 | 127 | 183 |
| 57 | 97 | 78 | 148 | 6 | 172 | 3 | 138 | 145 | 153 | 143 | 19 | 2 | 96 | 187 | 124 | | | | | | |

FIG. 173

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 92 | 83 | 138 | 67 | 27 | 88 | 13 | 26 | 73 | 16 | 187 | 18 | 76 | 28 | 79 | 130 | 91 | 58 | 140 | 38 | 6 | 43 |
| 17 | 168 | 141 | 96 | 70 | 147 | 112 | 164 | 97 | 161 | 139 | 65 | 78 | 95 | 146 | 3 | 32 | 158 | 24 | 0 | 94 | 120 |
| 176 | 128 | 59 | 81 | 21 | 102 | 190 | 8 | 114 | 113 | 29 | 45 | 103 | 56 | 54 | 173 | 177 | 12 | 174 | 108 | 169 | 148 |
| 123 | 129 | 150 | 77 | 157 | 184 | 61 | 127 | 121 | 156 | 104 | 111 | 68 | 160 | 107 | 117 | 124 | 84 | 35 | 10 | 90 | 106 |
| 144 | 66 | 64 | 15 | 46 | 125 | 44 | 37 | 20 | 135 | 53 | 71 | 152 | 183 | 162 | 50 | 167 | 11 | 142 | 149 | 131 | 191 |
| 166 | 31 | 185 | 134 | 19 | 178 | 52 | 188 | 2 | 75 | 110 | 145 | 41 | 159 | 136 | 100 | 9 | 62 | 60 | 34 | 116 | 23 |
| 42 | 105 | 40 | 118 | 186 | 4 | 5 | 182 | 170 | 87 | 1 | 22 | 55 | 126 | 63 | 14 | 25 | 153 | 98 | 49 | 33 | 69 |
| 179 | 171 | 93 | 36 | 133 | 57 | 151 | 82 | 72 | 163 | 86 | 47 | 119 | 48 | 99 | 30 | 189 | 115 | 165 | 101 | 80 | 175 |
| 132 | 89 | 39 | 181 | 85 | 51 | 154 | 137 | 7 | 180 | 155 | 74 | 109 | 122 | 172 | 143 | | | | | | |

FIG. 174

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 52 | 117 | 42 | 131 | 45 | 120 | 44 | 63 | 91 | 0 | 33 | 176 | 95 | 36 | 134 | 170 | 148 | 32 | 130 | 20 | 124 | 51 |
| 152 | 96 | 92 | 90 | 184 | 103 | 53 | 14 | 110 | 80 | 107 | 145 | 181 | 137 | 61 | 149 | 114 | 126 | 136 | 161 | 58 | 162 |
| 88 | 8 | 171 | 178 | 174 | 94 | 118 | 19 | 35 | 1 | 191 | 115 | 23 | 10 | 150 | 67 | 46 | 56 | 172 | 129 | 109 | 98 |
| 89 | 68 | 101 | 121 | 78 | 182 | 12 | 173 | 128 | 77 | 168 | 156 | 186 | 165 | 39 | 187 | 5 | 158 | 104 | 2 | 49 | 154 |
| 59 | 82 | 65 | 30 | 127 | 17 | 113 | 164 | 179 | 34 | 69 | 189 | 123 | 147 | 183 | 21 | 163 | 143 | 57 | 100 | 28 | 185 |
| 25 | 140 | 13 | 66 | 141 | 62 | 47 | 54 | 169 | 106 | 38 | 86 | 116 | 151 | 41 | 4 | 75 | 108 | 85 | 153 | 72 | 125 |
| 22 | 135 | 50 | 70 | 74 | 11 | 76 | 138 | 132 | 55 | 167 | 40 | 144 | 31 | 142 | 37 | 29 | 99 | 83 | 26 | 119 | 64 |
| 27 | 9 | 15 | 97 | 73 | 133 | 79 | 190 | 111 | 43 | 48 | 102 | 7 | 139 | 84 | 24 | 112 | 177 | 16 | 180 | 175 | 81 |
| 3 | 60 | 18 | 188 | 93 | 105 | 157 | 87 | 166 | 159 | 155 | 122 | 146 | 6 | 160 | 71 | | | | | | |

FIG. 175

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 60 | 117 | 182 | 104 | 53 | 26 | 11 | 121 | 71 | 32 | 179 | 34 | 38 | 145 | 166 | 65 | 137 | 7 | 124 | 58 | 90 | 29 |
| 144 | 116 | 91 | 88 | 98 | 161 | 83 | 177 | 85 | 154 | 146 | 178 | 123 | 76 | 75 | 3 | 64 | 151 | 99 | 118 | 57 | 106 |
| 16 | 61 | 162 | 19 | 12 | 94 | 39 | 93 | 92 | 73 | 82 | 138 | 108 | 139 | 130 | 163 | 152 | 159 | 168 | 189 | 102 | 134 |
| 101 | 66 | 4 | 171 | 170 | 188 | 107 | 23 | 180 | 35 | 175 | 18 | 89 | 181 | 17 | 97 | 62 | 56 | 52 | 128 | 40 | 25 |
| 191 | 74 | 95 | 143 | 5 | 8 | 1 | 132 | 133 | 135 | 184 | 33 | 37 | 45 | 127 | 122 | 136 | 190 | 158 | 72 | 77 | 114 |
| 46 | 55 | 105 | 78 | 183 | 103 | 22 | 20 | 24 | 155 | 86 | 63 | 79 | 164 | 13 | 174 | 2 | 14 | 47 | 126 | 84 | 165 |
| 59 | 142 | 87 | 153 | 112 | 43 | 156 | 50 | 6 | 0 | 81 | 51 | 21 | 9 | 148 | 111 | 147 | 48 | 31 | 36 | 129 | 167 |
| 150 | 70 | 42 | 15 | 110 | 119 | 109 | 125 | 80 | 27 | 131 | 49 | 140 | 187 | 96 | 120 | 100 | 141 | 160 | 186 | 185 | 68 |
| 69 | 28 | 176 | 169 | 44 | 173 | 149 | 54 | 115 | 113 | 67 | 10 | 157 | 41 | 30 | 172 | | | | | | |

FIG. 176

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

| | | | | | | | | | | | | | | | | | | | | | |
|---|---|---|---|---|---|---|---|---|---|---|---|---|---|---|---|---|---|---|---|---|---|
| 7 | 156 | 171 | 76 | 165 | 68 | 5 | 72 | 86 | 57 | 42 | 98 | 162 | 130 | 88 | 31 | 63 | 170 | 92 | 100 | 145 | 146 |
| 117 | 62 | 123 | 55 | 22 | 138 | 75 | 99 | 177 | 83 | 135 | 190 | 79 | 84 | 182 | 140 | 136 | 0 | 108 | 77 | 8 | 154 |
| 73 | 37 | 147 | 14 | 10 | 128 | 111 | 168 | 38 | 159 | 125 | 32 | 120 | 132 | 148 | 27 | 69 | 96 | 127 | 103 | 34 | 110 |
| 161 | 41 | 18 | 35 | 142 | 116 | 28 | 121 | 91 | 112 | 51 | 178 | 139 | 95 | 155 | 20 | 78 | 33 | 133 | 29 | 9 | 54 |
| 24 | 176 | 122 | 3 | 102 | 56 | 181 | 175 | 174 | 81 | 166 | 30 | 26 | 43 | 113 | 137 | 150 | 89 | 179 | 70 | 11 | 2 |
| 118 | 183 | 13 | 50 | 46 | 12 | 49 | 40 | 172 | 17 | 47 | 65 | 16 | 74 | 141 | 129 | 101 | 48 | 87 | 187 | 167 | 134 |
| 158 | 15 | 44 | 53 | 93 | 152 | 23 | 126 | 52 | 97 | 189 | 36 | 115 | 169 | 64 | 25 | 58 | 82 | 1 | 45 | 39 | 191 |
| 144 | 173 | 6 | 60 | 85 | 149 | 163 | 21 | 90 | 4 | 80 | 105 | 164 | 180 | 61 | 114 | 188 | 151 | 185 | 94 | 124 | 104 |
| 106 | 119 | 107 | 160 | 67 | 71 | 19 | 131 | 186 | 153 | 157 | 66 | 143 | 184 | 109 | 59 | | | | | | |

FIG. 177

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 134 | 124 | 102 | 133 | 161 | 34 | 18 | 17 | 119 | 172 | 43 | 25 | 130 | 84 | 46 | 167 | 23 | 100 | 31 | 121 | 30 | 15 |
| 99 | 127 | 62 | 20 | 143 | 103 | 139 | 171 | 13 | 42 | 1 | 26 | 76 | 159 | 27 | 82 | 48 | 146 | 22 | 156 | 188 | 69 |
| 86 | 177 | 129 | 160 | 33 | 67 | 176 | 148 | 168 | 158 | 169 | 0 | 155 | 118 | 154 | 110 | 96 | 191 | 4 | 36 | 39 | 56 |
| 112 | 14 | 145 | 182 | 3 | 88 | 126 | 91 | 105 | 174 | 128 | 157 | 125 | 74 | 116 | 61 | 52 | 187 | 117 | 98 | 73 | 95 |
| 92 | 181 | 111 | 65 | 63 | 152 | 163 | 147 | 66 | 178 | 87 | 179 | 64 | 93 | 144 | 83 | 140 | 8 | 78 | 2 | 131 | 115 |
| 123 | 47 | 94 | 186 | 28 | 68 | 21 | 135 | 37 | 151 | 11 | 104 | 77 | 81 | 35 | 71 | 162 | 97 | 41 | 58 | 190 | 101 |
| 153 | 85 | 166 | 7 | 173 | 44 | 29 | 10 | 49 | 54 | 150 | 32 | 50 | 51 | 45 | 183 | 107 | 113 | 137 | 80 | 79 | 175 |
| 142 | 141 | 138 | 40 | 122 | 75 | 120 | 53 | 59 | 60 | 184 | 5 | 38 | 6 | 164 | 189 | 24 | 16 | 72 | 19 | 109 | 106 |
| 114 | 108 | 185 | 165 | 149 | 9 | 57 | 170 | 12 | 90 | 180 | 89 | 132 | 136 | 55 | 70 | | | | | | |

*FIG. 178*

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 18 | 161 | 152 | 30 | 91 | 138 | 83 | 88 | 127 | 54 | 33 | 46 | 125 | 120 | 122 | 169 | 51 | 150 | 100 | 52 | 95 | 186 |
| 149 | 81 | 11 | 53 | 164 | 130 | 19 | 176 | 93 | 107 | 29 | 86 | 124 | 65 | 75 | 71 | 74 | 68 | 44 | 82 | 59 | 104 |
| 118 | 103 | 131 | 101 | 8 | 96 | 97 | 119 | 166 | 77 | 50 | 34 | 158 | 21 | 184 | 24 | 165 | 171 | 142 | 36 | 181 | 45 |
| 90 | 175 | 99 | 13 | 37 | 10 | 140 | 3 | 69 | 16 | 133 | 172 | 173 | 27 | 132 | 79 | 76 | 111 | 123 | 7 | 94 | 70 |
| 116 | 174 | 15 | 156 | 187 | 110 | 84 | 185 | 14 | 72 | 159 | 143 | 78 | 135 | 17 | 12 | 139 | 67 | 58 | 151 | 177 | 73 |
| 154 | 145 | 179 | 25 | 108 | 148 | 137 | 85 | 147 | 61 | 20 | 89 | 155 | 183 | 134 | 128 | 191 | 26 | 121 | 126 | 0 | 141 |
| 112 | 62 | 114 | 48 | 182 | 146 | 115 | 64 | 113 | 189 | 31 | 1 | 39 | 168 | 2 | 43 | 163 | 188 | 35 | 129 | 153 | 66 |
| 23 | 40 | 6 | 5 | 98 | 56 | 9 | 63 | 180 | 157 | 167 | 162 | 60 | 42 | 49 | 28 | 22 | 80 | 87 | 92 | 160 | 55 |
| 136 | 170 | 106 | 117 | 178 | 32 | 38 | 105 | 102 | 41 | 57 | 109 | 144 | 47 | 190 | 4 | | | | | | |

FIG. 179

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 172 | 48 | 104 | 60 | 184 | 162 | 86 | 185 | 11 | 132 | 155 | 50 | 146 | 178 | 5 | 28 | 133 | 169 | 106 | 90 | 174 | 95 |
| 42 | 10 | 78 | 177 | 21 | 112 | 54 | 153 | 136 | 12 | 115 | 108 | 92 | 152 | 180 | 151 | 13 | 62 | 25 | 51 | 191 | 84 |
| 167 | 139 | 96 | 111 | 130 | 150 | 7 | 143 | 144 | 117 | 124 | 27 | 38 | 72 | 6 | 128 | 36 | 39 | 26 | 156 | 32 | 127 |
| 181 | 122 | 52 | 131 | 68 | 140 | 173 | 182 | 154 | 190 | 137 | 61 | 2 | 138 | 43 | 110 | 29 | 116 | 176 | 30 | 57 | 189 |
| 14 | 4 | 65 | 80 | 33 | 75 | 135 | 20 | 103 | 98 | 56 | 179 | 129 | 105 | 113 | 71 | 160 | 85 | 55 | 0 | 166 | 59 |
| 183 | 142 | 19 | 22 | 63 | 125 | 165 | 88 | 87 | 93 | 168 | 77 | 45 | 69 | 175 | 100 | 145 | 31 | 91 | 141 | 114 | 157 |
| 119 | 16 | 1 | 34 | 15 | 147 | 46 | 188 | 70 | 74 | 109 | 126 | 18 | 64 | 89 | 134 | 9 | 161 | 158 | 44 | 3 | 47 |
| 148 | 187 | 81 | 164 | 121 | 35 | 23 | 24 | 159 | 82 | 40 | 94 | 67 | 163 | 170 | 58 | 97 | 8 | 83 | 53 | 118 | 149 |
| 73 | 107 | 123 | 79 | 41 | 99 | 186 | 101 | 49 | 120 | 66 | 76 | 17 | 171 | 102 | 37 | | | | | | |

FIG. 180

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

| | | | | | | | | | | | | | | | | | | | | | |
|---|---|---|---|---|---|---|---|---|---|---|---|---|---|---|---|---|---|---|---|---|---|
| 16 | 133 | 14 | 114 | 145 | 191 | 53 | 80 | 166 | 68 | 21 | 184 | 73 | 165 | 147 | 89 | 180 | 55 | 135 | 94 | 189 | 78 |
| 103 | 115 | 72 | 24 | 105 | 188 | 84 | 148 | 85 | 32 | 1 | 131 | 34 | 134 | 41 | 167 | 81 | 54 | 142 | 141 | 75 | 155 |
| 122 | 140 | 13 | 17 | 8 | 23 | 61 | 49 | 51 | 74 | 181 | 162 | 143 | 42 | 71 | 123 | 161 | 177 | 110 | 149 | 126 | 0 |
| 63 | 178 | 35 | 175 | 186 | 52 | 43 | 139 | 112 | 10 | 40 | 150 | 182 | 164 | 64 | 83 | 174 | 38 | 47 | 30 | 2 | 116 |
| 25 | 128 | 160 | 144 | 99 | 5 | 187 | 176 | 82 | 60 | 18 | 185 | 104 | 169 | 39 | 183 | 137 | 22 | 109 | 96 | 151 | 46 |
| 33 | 29 | 65 | 132 | 95 | 31 | 136 | 159 | 170 | 168 | 67 | 79 | 93 | 111 | 90 | 97 | 113 | 92 | 76 | 58 | 127 | 26 |
| 27 | 156 | 3 | 6 | 28 | 77 | 125 | 173 | 98 | 138 | 172 | 86 | 45 | 118 | 171 | 62 | 179 | 100 | 19 | 163 | 50 | 57 |
| 56 | 36 | 102 | 121 | 117 | 154 | 119 | 66 | 20 | 91 | 130 | 69 | 44 | 70 | 153 | 152 | 158 | 88 | 108 | 12 | 59 | 4 |
| 11 | 120 | 87 | 101 | 37 | 129 | 146 | 9 | 106 | 48 | 7 | 15 | 124 | 190 | 107 | 157 | | | | | | |

FIG. 181

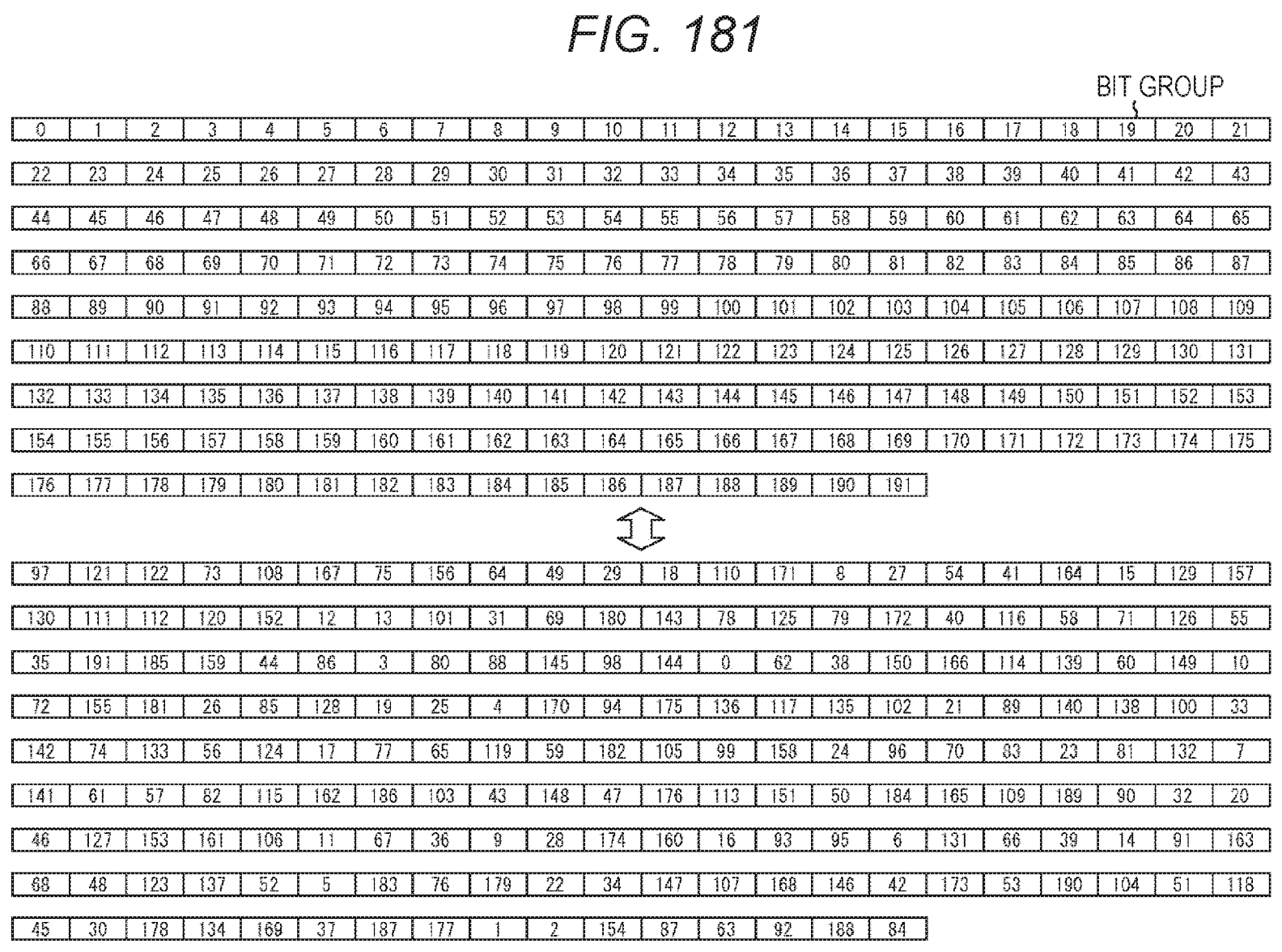

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 97 | 121 | 122 | 73 | 108 | 167 | 75 | 156 | 64 | 49 | 29 | 18 | 110 | 171 | 8 | 27 | 54 | 41 | 164 | 15 | 129 | 157 |
| 130 | 111 | 112 | 120 | 152 | 12 | 13 | 101 | 31 | 69 | 180 | 143 | 78 | 125 | 79 | 172 | 40 | 116 | 58 | 71 | 126 | 55 |
| 35 | 191 | 185 | 159 | 44 | 86 | 3 | 80 | 88 | 145 | 98 | 144 | 0 | 62 | 38 | 150 | 166 | 114 | 139 | 60 | 149 | 10 |
| 72 | 155 | 181 | 26 | 85 | 128 | 19 | 25 | 4 | 170 | 94 | 175 | 136 | 117 | 135 | 102 | 21 | 89 | 140 | 138 | 100 | 33 |
| 142 | 74 | 133 | 56 | 124 | 17 | 77 | 65 | 119 | 59 | 182 | 105 | 99 | 158 | 24 | 96 | 70 | 83 | 23 | 81 | 132 | 7 |
| 141 | 61 | 57 | 82 | 115 | 162 | 186 | 103 | 43 | 148 | 47 | 176 | 113 | 151 | 50 | 184 | 165 | 109 | 189 | 90 | 32 | 20 |
| 46 | 127 | 153 | 161 | 106 | 11 | 67 | 36 | 9 | 28 | 174 | 160 | 16 | 93 | 95 | 6 | 131 | 66 | 39 | 14 | 91 | 163 |
| 68 | 48 | 123 | 137 | 52 | 5 | 183 | 76 | 179 | 22 | 34 | 147 | 107 | 168 | 146 | 42 | 173 | 53 | 190 | 104 | 51 | 118 |
| 45 | 30 | 178 | 134 | 169 | 37 | 187 | 177 | 1 | 2 | 154 | 87 | 63 | 92 | 188 | 84 | | | | | | |

FIG. 182

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 47 | 85 | 118 | 136 | 166 | 98 | 72 | 163 | 63 | 116 | 162 | 169 | 114 | 124 | 144 | 110 | 46 | 152 | 104 | 88 | 99 | 106 |
| 181 | 109 | 3 | 10 | 172 | 107 | 33 | 100 | 191 | 75 | 157 | 79 | 52 | 128 | 6 | 12 | 139 | 30 | 68 | 111 | 83 | 5 |
| 119 | 1 | 97 | 56 | 38 | 117 | 78 | 80 | 155 | 141 | 185 | 20 | 161 | 123 | 28 | 180 | 77 | 50 | 29 | 64 | 41 | 121 |
| 53 | 36 | 48 | 127 | 44 | 22 | 35 | 165 | 59 | 147 | 187 | 153 | 89 | 154 | 18 | 55 | 90 | 69 | 19 | 148 | 129 | 188 |
| 24 | 8 | 102 | 151 | 11 | 74 | 105 | 81 | 92 | 70 | 101 | 7 | 132 | 120 | 112 | 145 | 57 | 96 | 42 | 45 | 91 | 71 |
| 149 | 164 | 51 | 130 | 95 | 140 | 178 | 9 | 135 | 34 | 175 | 21 | 32 | 25 | 67 | 17 | 61 | 58 | 134 | 43 | 122 | 2 |
| 16 | 183 | 54 | 86 | 4 | 39 | 60 | 184 | 171 | 94 | 179 | 13 | 115 | 49 | 143 | 158 | 168 | 159 | 87 | 73 | 156 | 15 |
| 93 | 125 | 126 | 131 | 40 | 66 | 138 | 76 | 173 | 65 | 27 | 170 | 186 | 182 | 103 | 108 | 82 | 37 | 174 | 167 | 142 | 26 |
| 160 | 84 | 62 | 190 | 176 | 31 | 150 | 189 | 113 | 137 | 14 | 23 | 0 | 146 | 177 | 133 | | | | | | |

FIG. 183

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 97 | 39 | 99 | 33 | 10 | 6 | 189 | 179 | 130 | 172 | 76 | 185 | 131 | 40 | 176 | 159 | 8 | 17 | 167 | 116 | 16 | 160 |
| 5 | 174 | 27 | 115 | 43 | 41 | 136 | 175 | 153 | 144 | 106 | 29 | 105 | 84 | 67 | 35 | 152 | 191 | 72 | 56 | 83 | 168 |
| 12 | 184 | 65 | 146 | 104 | 80 | 98 | 79 | 51 | 26 | 64 | 137 | 181 | 165 | 52 | 129 | 186 | 48 | 128 | 154 | 58 | 141 |
| 77 | 187 | 94 | 109 | 81 | 119 | 82 | 38 | 18 | 188 | 143 | 170 | 147 | 2 | 162 | 95 | 21 | 11 | 74 | 151 | 19 | 59 |
| 1 | 138 | 145 | 7 | 177 | 30 | 42 | 44 | 28 | 20 | 91 | 14 | 4 | 70 | 110 | 31 | 37 | 61 | 55 | 85 | 15 | 183 |
| 171 | 96 | 103 | 101 | 112 | 161 | 54 | 178 | 78 | 87 | 126 | 57 | 180 | 88 | 92 | 113 | 73 | 90 | 117 | 93 | 89 | 122 |
| 62 | 25 | 158 | 148 | 118 | 45 | 123 | 60 | 107 | 173 | 114 | 166 | 120 | 13 | 23 | 139 | 86 | 135 | 164 | 47 | 124 | 149 |
| 150 | 46 | 157 | 100 | 142 | 0 | 71 | 50 | 49 | 36 | 9 | 127 | 156 | 75 | 34 | 163 | 125 | 190 | 182 | 155 | 66 | 69 |
| 140 | 32 | 169 | 132 | 53 | 68 | 102 | 63 | 133 | 111 | 22 | 134 | 108 | 3 | 24 | 121 | | | | | | |

FIG. 185

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 138 | 38 | 106 | 76 | 172 | 27 | 150 | 95 | 44 | 187 | 64 | 18 | 28 | 98 | 180 | 101 | 149 | 146 | 126 | 26 | 93 | 178 |
| 186 | 70 | 104 | 131 | 19 | 45 | 102 | 122 | 152 | 66 | 63 | 173 | 9 | 55 | 25 | 1 | 154 | 85 | 5 | 51 | 43 | 82 |
| 86 | 151 | 148 | 48 | 190 | 179 | 62 | 60 | 94 | 174 | 142 | 39 | 169 | 170 | 47 | 125 | 33 | 128 | 162 | 2 | 129 | 57 |
| 79 | 118 | 114 | 69 | 78 | 167 | 11 | 136 | 99 | 155 | 90 | 21 | 119 | 10 | 52 | 91 | 115 | 185 | 6 | 110 | 88 | 96 |
| 181 | 143 | 0 | 160 | 124 | 130 | 183 | 71 | 121 | 182 | 68 | 191 | 3 | 32 | 40 | 189 | 41 | 156 | 35 | 159 | 58 | 89 |
| 29 | 67 | 17 | 109 | 30 | 111 | 12 | 46 | 65 | 177 | 53 | 77 | 74 | 56 | 184 | 15 | 141 | 135 | 54 | 163 | 14 | 145 |
| 139 | 134 | 59 | 147 | 87 | 107 | 7 | 61 | 36 | 113 | 103 | 188 | 24 | 165 | 137 | 22 | 42 | 49 | 83 | 73 | 50 | 161 |
| 20 | 166 | 127 | 157 | 108 | 171 | 37 | 72 | 176 | 112 | 123 | 144 | 34 | 175 | 168 | 117 | 80 | 81 | 8 | 31 | 133 | 92 |
| 164 | 132 | 97 | 158 | 84 | 100 | 140 | 16 | 105 | 23 | 75 | 13 | 153 | 116 | 4 | 120 | | | | | | |

FIG. 186

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 37 | 136 | 161 | 62 | 163 | 129 | 160 | 73 | 76 | 66 | 34 | 162 | 122 | 5 | 87 | 94 | 50 | 105 | 132 | 32 | 121 | 47 |
| 74 | 189 | 110 | 45 | 75 | 175 | 17 | 29 | 108 | 191 | 1 | 153 | 20 | 113 | 61 | 42 | 51 | 2 | 165 | 124 | 43 | 186 |
| 40 | 86 | 168 | 180 | 155 | 16 | 93 | 26 | 166 | 119 | 159 | 56 | 12 | 44 | 46 | 143 | 49 | 25 | 176 | 158 | 92 | 147 |
| 54 | 172 | 182 | 64 | 157 | 112 | 38 | 39 | 11 | 6 | 127 | 48 | 151 | 82 | 4 | 36 | 183 | 88 | 126 | 117 | 111 | 188 |
| 138 | 65 | 70 | 170 | 133 | 137 | 146 | 128 | 114 | 148 | 141 | 125 | 10 | 41 | 116 | 33 | 99 | 81 | 187 | 130 | 131 | 107 |
| 60 | 90 | 173 | 13 | 71 | 15 | 106 | 3 | 149 | 154 | 181 | 174 | 190 | 27 | 177 | 18 | 21 | 22 | 83 | 91 | 150 | 14 |
| 96 | 53 | 0 | 145 | 67 | 68 | 144 | 184 | 59 | 23 | 118 | 115 | 135 | 55 | 134 | 102 | 8 | 169 | 85 | 156 | 97 | 63 |
| 104 | 95 | 52 | 98 | 139 | 24 | 78 | 179 | 19 | 28 | 69 | 58 | 109 | 57 | 164 | 31 | 84 | 140 | 103 | 77 | 123 | 171 |
| 72 | 79 | 152 | 35 | 80 | 7 | 185 | 167 | 9 | 100 | 142 | 89 | 30 | 120 | 178 | 101 | | | | | | |

FIG. 187

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 148 | 189 | 3 | 121 | 80 | 135 | 7 | 96 | 46 | 109 | 190 | 111 | 118 | 23 | 5 | 149 | 19 | 140 | 106 | 36 | 161 | 71 |
| 6 | 176 | 160 | 76 | 8 | 168 | 171 | 173 | 40 | 37 | 25 | 50 | 164 | 108 | 139 | 31 | 127 | 142 | 163 | 177 | 24 | 20 |
| 157 | 83 | 116 | 42 | 73 | 69 | 88 | 184 | 147 | 136 | 187 | 49 | 45 | 35 | 170 | 62 | 63 | 181 | 117 | 123 | 122 | 72 |
| 55 | 53 | 133 | 159 | 94 | 175 | 179 | 158 | 97 | 93 | 13 | 130 | 144 | 81 | 68 | 2 | 64 | 155 | 119 | 43 | 143 | 1 |
| 112 | 18 | 146 | 172 | 132 | 191 | 134 | 61 | 138 | 9 | 178 | 103 | 15 | 47 | 154 | 17 | 152 | 153 | 107 | 115 | 39 | 166 |
| 33 | 104 | 56 | 52 | 60 | 131 | 141 | 78 | 186 | 162 | 54 | 0 | 85 | 12 | 86 | 77 | 126 | 34 | 180 | 10 | 87 | 38 |
| 4 | 26 | 79 | 27 | 98 | 66 | 75 | 67 | 110 | 101 | 128 | 16 | 22 | 28 | 151 | 21 | 99 | 74 | 11 | 100 | 65 | 58 |
| 150 | 145 | 14 | 59 | 102 | 51 | 48 | 113 | 92 | 167 | 188 | 174 | 156 | 114 | 82 | 125 | 124 | 70 | 137 | 90 | 30 | 44 |
| 57 | 105 | 95 | 165 | 29 | 89 | 41 | 169 | 120 | 91 | 32 | 183 | 129 | 182 | 185 | 84 | | | | | | |

FIG. 188

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 67 | 20 | 9 | 75 | 143 | 94 | 144 | 122 | 56 | 88 | 180 | 72 | 102 | 100 | 113 | 157 | 170 | 59 | 128 | 162 | 26 | 38 |
| 61 | 156 | 115 | 117 | 190 | 77 | 22 | 74 | 119 | 12 | 8 | 179 | 182 | 85 | 188 | 191 | 154 | 41 | 58 | 142 | 186 | 107 |
| 73 | 189 | 15 | 130 | 127 | 160 | 55 | 19 | 45 | 137 | 124 | 133 | 146 | 43 | 60 | 183 | 153 | 177 | 123 | 181 | 95 | 49 |
| 140 | 4 | 51 | 3 | 21 | 164 | 83 | 187 | 148 | 11 | 168 | 149 | 92 | 65 | 30 | 90 | 23 | 116 | 57 | 161 | 125 | 175 |
| 129 | 126 | 97 | 14 | 96 | 66 | 37 | 178 | 64 | 173 | 184 | 80 | 101 | 34 | 81 | 131 | 76 | 147 | 47 | 135 | 111 | 121 |
| 44 | 68 | 98 | 48 | 120 | 40 | 87 | 176 | 104 | 106 | 28 | 163 | 52 | 1 | 152 | 79 | 42 | 139 | 16 | 2 | 71 | 7 |
| 109 | 114 | 112 | 54 | 62 | 169 | 35 | 150 | 171 | 110 | 50 | 108 | 105 | 69 | 118 | 84 | 39 | 132 | 63 | 31 | 18 | 134 |
| 103 | 185 | 6 | 145 | 24 | 70 | 36 | 29 | 5 | 93 | 99 | 33 | 82 | 89 | 167 | 174 | 27 | 165 | 91 | 138 | 155 | 32 |
| 159 | 141 | 136 | 151 | 25 | 158 | 86 | 17 | 13 | 172 | 53 | 10 | 46 | 166 | 0 | 78 | | | | | | |

FIG. 189

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 84 | 126 | 45 | 76 | 121 | 91 | 52 | 162 | 79 | 187 | 134 | 108 | 47 | 16 | 72 | 119 | 43 | 107 | 98 | 135 | 147 | 110 |
| 0 | 60 | 4 | 61 | 117 | 24 | 167 | 65 | 40 | 55 | 73 | 112 | 85 | 35 | 156 | 95 | 137 | 171 | 9 | 11 | 54 | 131 |
| 138 | 157 | 152 | 111 | 183 | 161 | 41 | 69 | 21 | 94 | 113 | 8 | 153 | 39 | 57 | 143 | 86 | 12 | 188 | 184 | 15 | 30 |
| 118 | 136 | 64 | 169 | 148 | 22 | 6 | 68 | 168 | 78 | 105 | 101 | 190 | 3 | 59 | 124 | 170 | 62 | 87 | 46 | 28 | 29 |
| 186 | 2 | 25 | 177 | 140 | 53 | 154 | 37 | 18 | 189 | 93 | 114 | 33 | 1 | 158 | 122 | 103 | 5 | 104 | 80 | 166 | 34 |
| 106 | 51 | 10 | 180 | 139 | 125 | 178 | 100 | 13 | 70 | 142 | 185 | 159 | 50 | 66 | 102 | 150 | 127 | 160 | 92 | 81 | 173 |
| 115 | 144 | 145 | 128 | 74 | 88 | 20 | 116 | 179 | 96 | 17 | 155 | 175 | 75 | 165 | 7 | 191 | 149 | 44 | 23 | 99 | 48 |
| 163 | 42 | 63 | 164 | 90 | 120 | 27 | 31 | 14 | 19 | 32 | 174 | 26 | 67 | 89 | 97 | 56 | 146 | 82 | 133 | 129 | 109 |
| 71 | 58 | 130 | 182 | 123 | 176 | 49 | 36 | 181 | 38 | 141 | 151 | 83 | 77 | 172 | 132 | | | | | | |

FIG. 190

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 30 | 127 | 60 | 115 | 80 | 50 | 150 | 39 | 176 | 171 | 47 | 104 | 70 | 33 | 56 | 3 | 10 | 26 | 19 | 149 | 153 | 141 |
| 98 | 46 | 64 | 71 | 130 | 107 | 94 | 16 | 164 | 169 | 57 | 168 | 126 | 157 | 133 | 12 | 154 | 135 | 35 | 53 | 40 | 183 |
| 28 | 1 | 160 | 67 | 163 | 134 | 181 | 59 | 99 | 186 | 86 | 36 | 178 | 152 | 48 | 117 | 44 | 14 | 66 | 172 | 17 | 31 |
| 182 | 166 | 187 | 55 | 62 | 143 | 69 | 77 | 9 | 113 | 158 | 91 | 189 | 84 | 151 | 74 | 45 | 97 | 122 | 114 | 75 | 41 |
| 162 | 90 | 110 | 106 | 116 | 131 | 129 | 188 | 92 | 11 | 147 | 108 | 20 | 159 | 146 | 51 | 29 | 109 | 89 | 6 | 96 | 155 |
| 43 | 111 | 138 | 85 | 119 | 5 | 22 | 105 | 170 | 4 | 15 | 148 | 145 | 63 | 0 | 156 | 81 | 68 | 13 | 137 | 79 | 103 |
| 2 | 179 | 38 | 180 | 132 | 123 | 144 | 167 | 140 | 174 | 49 | 37 | 82 | 128 | 101 | 21 | 124 | 177 | 121 | 8 | 23 | 136 |
| 42 | 27 | 139 | 72 | 185 | 18 | 65 | 161 | 7 | 125 | 88 | 34 | 73 | 184 | 52 | 190 | 120 | 102 | 100 | 87 | 95 | 118 |
| 83 | 112 | 175 | 78 | 58 | 24 | 165 | 54 | 61 | 25 | 191 | 76 | 142 | 93 | 173 | 32 | | | | | | |

FIG. 191

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 166 | 161 | 43 | 77 | 177 | 54 | 162 | 185 | 127 | 62 | 6 | 64 | 30 | 12 | 27 | 89 | 130 | 116 | 190 | 28 | 38 | 135 |
| 149 | 164 | 48 | 173 | 175 | 71 | 132 | 68 | 5 | 111 | 158 | 24 | 59 | 26 | 145 | 118 | 51 | 37 | 178 | 69 | 189 | 163 |
| 133 | 98 | 53 | 29 | 169 | 188 | 17 | 180 | 155 | 73 | 45 | 22 | 107 | 104 | 76 | 143 | 70 | 88 | 99 | 124 | 126 | 34 |
| 80 | 10 | 168 | 66 | 72 | 123 | 63 | 140 | 176 | 49 | 65 | 50 | 52 | 122 | 4 | 181 | 121 | 57 | 18 | 101 | 42 | 179 |
| 100 | 157 | 165 | 106 | 156 | 95 | 170 | 174 | 117 | 109 | 102 | 186 | 148 | 3 | 134 | 96 | 67 | 150 | 151 | 153 | 11 | 83 |
| 1 | 105 | 25 | 144 | 8 | 108 | 84 | 78 | 97 | 141 | 60 | 16 | 112 | 7 | 82 | 93 | 46 | 137 | 35 | 103 | 61 | 113 |
| 129 | 20 | 119 | 92 | 31 | 154 | 115 | 56 | 44 | 90 | 14 | 131 | 160 | 2 | 36 | 21 | 23 | 110 | 152 | 187 | 0 | 184 |
| 41 | 183 | 120 | 146 | 47 | 114 | 32 | 81 | 75 | 39 | 91 | 136 | 167 | 172 | 58 | 147 | 125 | 86 | 138 | 94 | 33 | 79 |
| 159 | 87 | 55 | 171 | 85 | 182 | 191 | 9 | 19 | 74 | 13 | 142 | 40 | 139 | 15 | 128 | | | | | | |

FIG. 193

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 100 | 152 | 16 | 39 | 26 | 58 | 60 | 6 | 126 | 7 | 59 | 75 | 62 | 47 | 27 | 113 | 41 | 115 | 169 | 30 | 95 | 189 |
| 138 | 136 | 70 | 140 | 149 | 187 | 177 | 141 | 125 | 171 | 178 | 134 | 15 | 154 | 131 | 183 | 46 | 35 | 44 | 11 | 51 | 170 |
| 112 | 20 | 161 | 159 | 101 | 52 | 181 | 71 | 28 | 128 | 3 | 167 | 156 | 123 | 18 | 139 | 102 | 13 | 19 | 37 | 90 | 105 |
| 92 | 135 | 185 | 121 | 50 | 158 | 29 | 104 | 155 | 12 | 184 | 93 | 166 | 14 | 133 | 146 | 24 | 191 | 188 | 116 | 109 | 89 |
| 65 | 45 | 25 | 21 | 1 | 76 | 151 | 180 | 33 | 124 | 91 | 107 | 119 | 5 | 132 | 118 | 111 | 96 | 143 | 150 | 173 | 108 |
| 2 | 122 | 22 | 148 | 130 | 142 | 147 | 67 | 97 | 103 | 36 | 63 | 40 | 117 | 55 | 68 | 137 | 144 | 94 | 83 | 56 | 79 |
| 175 | 0 | 182 | 114 | 85 | 86 | 9 | 10 | 74 | 106 | 17 | 190 | 4 | 34 | 84 | 98 | 38 | 88 | 64 | 78 | 145 | 77 |
| 163 | 42 | 120 | 69 | 164 | 48 | 23 | 129 | 160 | 81 | 127 | 82 | 53 | 72 | 179 | 31 | 66 | 32 | 168 | 110 | 73 | 186 |
| 157 | 172 | 49 | 165 | 176 | 80 | 61 | 174 | 153 | 162 | 54 | 99 | 57 | 87 | 8 | 43 | | | | | | |

FIG. 194

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 21 | 5 | 2 | 24 | 12 | 28 | 52 | 118 | 129 | 3 | 122 | 149 | 105 | 16 | 136 | 99 | 133 | 171 | 84 | 79 | 59 | 62 |
| 155 | 78 | 134 | 20 | 1 | 51 | 22 | 161 | 173 | 46 | 172 | 162 | 55 | 148 | 70 | 57 | 121 | 86 | 131 | 114 | 31 | 72 |
| 104 | 120 | 164 | 127 | 83 | 179 | 187 | 7 | 108 | 40 | 73 | 144 | 48 | 68 | 60 | 190 | 135 | 61 | 116 | 106 | 19 | 35 |
| 143 | 180 | 102 | 76 | 182 | 117 | 93 | 191 | 165 | 23 | 80 | 146 | 153 | 42 | 53 | 139 | 124 | 64 | 167 | 96 | 138 | 132 |
| 158 | 90 | 110 | 82 | 39 | 175 | 170 | 66 | 145 | 94 | 119 | 130 | 98 | 63 | 87 | 32 | 160 | 34 | 151 | 77 | 95 | 109 |
| 56 | 113 | 147 | 50 | 38 | 15 | 156 | 11 | 169 | 185 | 183 | 92 | 186 | 107 | 10 | 101 | 33 | 4 | 150 | 41 | 81 | 89 |
| 166 | 0 | 30 | 54 | 168 | 26 | 140 | 74 | 100 | 9 | 111 | 126 | 43 | 112 | 25 | 88 | 44 | 189 | 37 | 178 | 141 | 49 |
| 13 | 29 | 8 | 69 | 154 | 45 | 97 | 47 | 36 | 75 | 137 | 6 | 115 | 188 | 85 | 174 | 17 | 142 | 18 | 91 | 163 | 157 |
| 177 | 103 | 125 | 71 | 14 | 181 | 65 | 184 | 176 | 159 | 128 | 152 | 58 | 27 | 123 | 67 | | | | | | |

FIG. 195

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 113 | 23 | 166 | 150 | 133 | 130 | 38 | 18 | 71 | 115 | 111 | 44 | 135 | 11 | 98 | 96 | 67 | 114 | 112 | 87 | 146 | 119 |
| 28 | 86 | 120 | 49 | 175 | 14 | 30 | 144 | 53 | 165 | 162 | 128 | 108 | 39 | 116 | 158 | 62 | 110 | 83 | 93 | 118 | 80 |
| 88 | 173 | 157 | 102 | 177 | 132 | 174 | 59 | 106 | 34 | 64 | 22 | 4 | 29 | 97 | 155 | 109 | 9 | 107 | 92 | 36 | 24 |
| 161 | 50 | 21 | 137 | 17 | 43 | 58 | 124 | 31 | 37 | 172 | 100 | 178 | 129 | 79 | 160 | 167 | 32 | 181 | 154 | 7 | 183 |
| 90 | 54 | 68 | 191 | 156 | 104 | 147 | 10 | 65 | 81 | 134 | 169 | 142 | 57 | 171 | 78 | 48 | 47 | 5 | 40 | 46 | 51 |
| 151 | 77 | 1 | 72 | 164 | 152 | 70 | 141 | 2 | 89 | 13 | 182 | 85 | 52 | 41 | 66 | 75 | 63 | 185 | 148 | 179 | 138 |
| 61 | 73 | 180 | 189 | 76 | 84 | 8 | 27 | 184 | 105 | 42 | 69 | 153 | 188 | 19 | 131 | 121 | 26 | 159 | 45 | 16 | 186 |
| 25 | 176 | 82 | 103 | 163 | 99 | 101 | 122 | 187 | 20 | 136 | 126 | 168 | 145 | 6 | 91 | 55 | 117 | 35 | 56 | 143 | 140 |
| 190 | 125 | 127 | 74 | 95 | 94 | 12 | 149 | 33 | 0 | 139 | 3 | 123 | 170 | 15 | 60 | | | | | | |

FIG. 196

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 131 | 148 | 141 | 17 | 53 | 138 | 45 | 97 | 112 | 111 | 77 | 184 | 129 | 135 | 27 | 122 | 2 | 123 | 156 | 128 | 80 | 116 |
| 40 | 89 | 84 | 41 | 105 | 42 | 39 | 187 | 145 | 18 | 54 | 44 | 183 | 57 | 136 | 13 | 65 | 162 | 51 | 178 | 59 | 104 |
| 163 | 70 | 87 | 152 | 94 | 126 | 23 | 169 | 9 | 179 | 177 | 139 | 130 | 38 | 35 | 20 | 86 | 180 | 48 | 108 | 47 | 133 |
| 167 | 75 | 168 | 25 | 67 | 185 | 91 | 165 | 157 | 158 | 110 | 127 | 82 | 58 | 50 | 64 | 76 | 31 | 159 | 8 | 79 | 78 |
| 146 | 71 | 69 | 3 | 36 | 155 | 160 | 21 | 29 | 49 | 28 | 150 | 81 | 154 | 149 | 182 | 24 | 30 | 72 | 109 | 173 | 33 |
| 113 | 43 | 55 | 189 | 132 | 176 | 120 | 172 | 166 | 143 | 90 | 125 | 7 | 5 | 66 | 12 | 98 | 83 | 10 | 62 | 11 | 175 |
| 85 | 0 | 63 | 181 | 188 | 74 | 171 | 117 | 106 | 61 | 153 | 174 | 147 | 93 | 190 | 34 | 142 | 100 | 6 | 1 | 140 | 191 |
| 161 | 19 | 151 | 14 | 73 | 99 | 121 | 119 | 92 | 95 | 115 | 118 | 186 | 60 | 144 | 22 | 32 | 52 | 164 | 15 | 88 | 46 |
| 114 | 101 | 124 | 26 | 96 | 4 | 107 | 103 | 16 | 37 | 102 | 56 | 170 | 68 | 134 | 137 | | | | | | |

FIG. 197

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 93 | 61 | 37 | 170 | 63 | 60 | 135 | 5 | 158 | 47 | 65 | 179 | 76 | 182 | 72 | 20 | 104 | 7 | 181 | 11 | 117 | 152 |
| 184 | 172 | 143 | 92 | 109 | 177 | 191 | 119 | 132 | 1 | 98 | 10 | 148 | 35 | 126 | 9 | 18 | 70 | 190 | 38 | 66 | 54 |
| 62 | 122 | 100 | 3 | 2 | 189 | 144 | 153 | 165 | 14 | 154 | 44 | 161 | 113 | 147 | 12 | 90 | 167 | 112 | 34 | 39 | 139 |
| 142 | 41 | 159 | 149 | 82 | 131 | 88 | 106 | 138 | 105 | 55 | 163 | 71 | 168 | 80 | 96 | 108 | 40 | 50 | 25 | 114 | 79 |
| 103 | 141 | 151 | 69 | 74 | 110 | 36 | 24 | 67 | 145 | 26 | 8 | 56 | 180 | 13 | 17 | 134 | 28 | 129 | 185 | 85 | 121 |
| 137 | 136 | 68 | 86 | 188 | 0 | 124 | 120 | 127 | 32 | 94 | 83 | 133 | 97 | 31 | 58 | 33 | 57 | 166 | 162 | 183 | 186 |
| 81 | 111 | 19 | 107 | 155 | 42 | 84 | 6 | 43 | 130 | 48 | 123 | 64 | 78 | 53 | 173 | 95 | 75 | 45 | 174 | 178 | 160 |
| 15 | 187 | 102 | 23 | 150 | 156 | 101 | 99 | 91 | 157 | 128 | 175 | 59 | 125 | 22 | 46 | 115 | 164 | 52 | 16 | 21 | 30 |
| 176 | 146 | 51 | 116 | 87 | 140 | 77 | 73 | 89 | 169 | 4 | 171 | 27 | 49 | 29 | 118 | | | | | | |

TRANSMISSION METHOD AND RECEPTION DEVICE

CROSS REFERENCE TO RELATED APPLICATIONS

This application is a U.S. National Phase of International Patent Application No. PCT/JP2018/003901 filed on Feb. 6, 2018, which claims priority benefit of Japanese Patent Application No. JP 2017-028568 filed in the Japan Patent Office on Feb. 20, 2017 and also claims priority benefit of Japanese Patent Application No. JP 2017-056767 filed in the Japan Patent Office on Mar. 23, 2017. Each of the above-referenced applications is hereby incorporated herein by reference in its entirety.

TECHNICAL FIELD

The present technology relates to a transmission method and a reception device, and more particularly, to a transmission method and a reception device that can ensure good communication quality, for example, in data transmission using an LDPC code.

BACKGROUND ART

Low density parity check (LDPC) codes have high error correction capability, and in recent years, have been widely adopted in transmission schemes such as digital broadcasting, for example, digital video broadcasting (DVB)-S.2, or DVB-T.2, DVB-C.2, in Europe or the like or advanced television systems committee (ATSC) 3.0 or the like in the United States or the like (refer to, for example, Non-Patent Document 1).

With recent researches, it has been found that, similarly to turbo codes and the like, in LDPC codes, performance close to the Shannon limit is obtained as the code length is increased. In addition, since the LDPC code has the property that the minimum distance is proportional to the code length, features that a block error probability characteristic is good and so-called error floor phenomenon observed in a decoding characteristic of turbo code or the like hardly occurs are also mentioned as an advantage.

CITATION LIST

Non-Patent Document

Non-Patent Document 1: ATSC Standard: Physical Layer Protocol (A/322), 7 Sep. 2016

SUMMARY OF THE INVENTION

Problems to be Solved by the Invention

In data transmission using an LDPC code, for example, the LDPC code becomes a symbol of quadrature modulation (digital modulation) such as quadrature phase shift keying (QPSK) (that is, the LDPC code is symbolized), and the symbol is mapped to a signal point of the quadrature modulation to be transmitted.

The data transmission using the LDPC code as described above has been spread in the worldwide, and it is required to ensure good communication (transmission) quality.

The present technology has been made in view of such a circumstance and is to ensure good communication quality in data transmission using an LDPC code.

Solutions to Problems

A first transmission method according to the present technology is a transmission method including: an encoding step of performing LDPC encoding on the basis of a check matrix of an LDPC code with a code length N of 69120 bits and an encoding rater of 2/16; a group-wise interleaving step of performing group-wise interleaving of interleaving the LDPC code in units of bit groups of 360 bits; and a mapping step of mapping the LDPC code in any one of 4096 signal points of 1D-non-uniform constellation (NUC) of 4096 QAM in units of 12 bits, in which in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 166, 161, 43, 77, 177, 54, 162, 185, 127, 62, 6, 64, 30, 12, 27, 89, 130, 116, 190, 28, 38, 135, 149, 164, 48, 173, 175, 71, 132, 68, 5, 111, 158, 24, 59, 26, 145, 118, 51, 37, 178, 69, 189, 163, 133, 98, 53, 29, 169, 188, 17, 180, 155, 73, 45, 22, 107, 104, 76, 143, 70, 88, 99, 124, 126, 34, 80, 10, 168, 66, 72, 123, 63, 140, 176, 49, 65, 50, 52, 122, 4, 181, 121, 57, 18, 101, 42, 179, 100, 157, 165, 106, 156, 95, 170, 174, 117, 109, 102, 186, 148, 3, 134, 96, 67, 150, 151, 153, 11, 83, 1, 105, 25, 144, 8, 108, 84, 78, 97, 141, 60, 16, 112, 7, 82, 93, 46, 137, 35, 103, 61, 113, 129, 20, 119, 92, 31, 154, 115, 56, 44, 90, 14, 131, 160, 2, 36, 21, 23, 110, 152, 187, 0, 184, 41, 183, 120, 146, 47, 114, 32, 81, 75, 39, 91, 136, 167, 172, 58, 147, 125, 86, 138, 94, 33, 79, 159, 87, 55, 171, 85, 182, 191, 9, 19, 74, 13, 142, 40, 139, 15, 128, the check matrix includes: an A matrix of M1 rows and K columns in an upper left of the check matrix, the A matrix being indicated by a predetermined value M1 and an information length K=N×r of the LDPC code; a B matrix of M1 rows and M1 columns, having a staircase structure adjacent to the right of the A matrix; a Z matrix of M1 rows and (N−K−M1) columns, which is a zero matrix adjacent to the right of the B matrix; a C matrix of (N−K−M1) rows and (K+M1) columns adjacent below the A matrix and the B matrix; and a D matrix of (N−K−M1) rows and (N−K−M1) columns, which is a unit matrix adjacent to the right of the C matrix, the predetermined value M1 is 1800, the A matrix and the C matrix are represented by a check matrix initial value table, and the check matrix initial value table is a table representing positions of elements of 1's of the A matrix and the C matrix every 360 columns, and is 1617 1754 1768 2501 6874 12486 12872 16244 18612 19698 21649 30954
33221 33723 34495 37587 38542 41510 42268 52159 59780
206 610 991 2665 4994 5681 12371 17343 25547 26291 26678 27791 27828
32437 33153 35429 39943 45246 46732 53342 60451
119 682 963 3339 6794 7021 7295 8856 8942 10842 11318 14050 14474 27281
28637 29963 37861 42536 43865 48803 59969
175 201 355 5418 7990 10567 10642 12987 16685 18463 21861 24307 25274
27515 39631 40166 43058 47429 55512 55519 59426
117 839 1043 1960 6896 19146 24022 26586 29342 29906 33129 33647 33883
34113 34550 38720 40247 45651 51156 53053 56614

-continued 135 236 257 7505 9412 12642 19752 20201 26010 28967 31146 37156 44685
45667 50066 51283 54365 55475 56501 58763 59121
109 840 1573 5523 19968 23924 24644 27064 29410 31276 31526 32173 38175
43570 43722 46655 46660 48353 54025 57319 59818
522 1236 1573 6563 11625 13846 17570 19547 22579 22584 29338 30497
33124 33152 35407 36364 37726 41426 53800 57130
504 1330 1481 13809 15761 20050 26339 27418 29630 32073 33762 34354
36966 43315 47773 47998 48824 50535 53437 55345
348 1244 1492 9626 9655 15638 22727 22971 28357 28841 31523 37543 41100
42372 48983 50354 51434 54574 55031 58193
742 1223 1459 20477 21731 23163 23587 30829 31144 32186 32235 32593
34130 40829 42217 42294 42753 44058 49940 51993
841 860 1534 5878 7083 7113 9658 10508 12871 12964 14023 21055 22680
23927 32701 35168 40986 42139 50708 55350
657 1018 1690 6454 7645 7698 8657 9615 16462 18030 19850 19857 33265
33552 42208 44424 48965 52762 55439 58299
14 511 1376 2586 6797 9409 9599 10784 13076 18509 27363 27667 30262
34043 37043 38143 40246 53811 58872 59250
315 883 1487 2067 7537 8749 10785 11820 15702 20232 22850 23540 30247
41182 44884 50601 52140 55970 57879 58514
256 1442 1534 2342 9734 10789 15334 15356 20334 20433 22923 23521 29391
30553 35406 35643 35701 37968 39541 58097
260 1238 1557 14167 15271 18046 20588 23444 25820 26660 30619 31625
33258 38554 40401 46471 53589 54904 56455 60016
591 885 1463 3411 14043 17083 17372 23029 23365 24691 25527 26389 28621
29999 40343 40359 40394 45685 46209 54887
1119 1411 1664 7879 17732 27000 28506 32237 32445 34100 34926 36470
42848 43126 44117 48780 49519 49592 51901 56580
147 1333 1560 6045 11526 14867 15647 19496 26626 27600 28044 30446
35920 37523 42907 42974 46452 52480 57061 60152
304 591 680 5557 6948 13550 19689 19697 22417 23237 25813 31836 32736
36321 36493 36671 46756 53311 59230 59248
586 777 1018 2393 2817 4057 8068 10632 12430 13193 16433 17344 24526
24902 27693 39301 39776 42300 45215 52149
684 1425 1732 2436 4279 7375 8493 10023 14908 20703 25656 25757 27251
27316 33211 35741 38872 42908 55079 58753
962 981 1773 2814 3799 6243 8163 12655 21226 31370 32506 35372 36697
47037 49095 55400 57506 58743 59678 60422
6229 6484 8795 8981 13576 28622 35526 36922 37284 42155 43443 44080
44446 46649 50824 52987 59033
2742 5176 10231 10336 16729 17273 18474 25875 28227 34891 39826 42595
48600 52542 53023 53372 57331
3512 4163 4725 8375 8585 19795 22844 28615 28649 29481 41484 41657
53255 54222 54229 57258 57647
3358 5239 9423 10858 15636 17937 20678 22427 31220 37069 38770 42079
47256 52442 55152 56964 59169
2243 10090 12309 15437 19426 23065 24872 36192 36336 36949 41387 49915
50155 54338 54422 56561 57984.

A first reception device according to the present technology is a reception device including a group-wise deinterleaving unit that returns an arrangement of an LDPC code after group-wise interleaving which is obtained from data transmitted from a transmission device to an original arrangement, in which the transmission device includes: an encoding unit that performs LDPC encoding on the basis of a check matrix of the LDPC code with a code length N of 69120 bits and an encoding rater of 2/16, a group-wise interleaving unit that performs group-wise interleaving of interleaving the LDPC code in units of bit groups of 360 bits; and a mapping unit that maps the LDPC code in any one of 4096 signal points of 1D-non-uniform constellation (NUC) of 4096 QAM in units of 12 bits, in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 166, 161, 43, 77, 177, 54, 162, 185, 127, 62, 6, 64, 30, 12, 27, 89, 130, 116, 190, 28, 38, 135, 149, 164, 48, 173, 175, 71, 132, 68, 5, 111, 158, 24, 59, 26, 145, 118, 51, 37, 178, 69, 189, 163, 133, 98, 53, 29, 169, 188, 17, 180, 155, 73, 45, 22, 107, 104, 76, 143, 70, 88, 99, 124, 126, 34, 80, 10, 168, 66, 72, 123, 63, 140, 176, 49, 65, 50, 52, 122, 4, 181, 121, 57, 18, 101, 42, 179, 100, 157, 165, 106, 156, 95, 170, 174, 117, 109, 102, 186, 148, 3, 134, 96, 67, 150, 151, 153, 11, 83, 1, 105, 25, 144, 8, 108, 84, 78, 97, 141, 60, 16, 112, 7, 82, 93, 46, 137, 35, 103, 61, 113, 129, 20, 119, 92, 31, 154, 115, 56, 44, 90, 14, 131, 160, 2, 36, 21, 23, 110, 152, 187, 0, 184, 41, 183, 120, 146, 47, 114, 32, 81, 75, 39, 91, 136, 167, 172, 58, 147, 125, 86, 138, 94, 33, 79, 159, 87, 55, 171, 85, 182, 191, 9, 19, 74, 13, 142, 40, 139, 15, 128, the check matrix includes: an A matrix of M1 rows and K columns in an upper left of the check matrix, the A matrix being indicated by a predetermined value M1 and an information length K=N×r of the LDPC code; a B matrix of M1 rows and M1 columns, having a staircase structure adjacent to the right of the A matrix; a Z matrix of M1 rows and (N−K−M1) columns, which is a zero matrix adjacent to the right of the B matrix; a C matrix of (N−K−M1) rows and (K+M1) columns adjacent below the A matrix and the B matrix; and a D matrix of (N−K−M1) rows and (N−K−M1) columns, which is a unit matrix adjacent to the right of the C matrix, the predetermined value M1 is 1800, the A matrix and the C matrix are represented by a check matrix initial value table, and the check matrix initial value table is a table representing positions of elements of 1's of the A matrix and the C matrix every 360 columns, and is 1617 1754 1768 2501 6874 12486 12872 16244 18612 19698 21649 30954
33221 33723 34495 37587 38542 41510 42268 52159 59780
206 610 991 2665 4994 5681 12371 17343 25547 26291 26678 27791 27828
32437 33153 35429 39943 45246 46732 53342 60451
119 682 963 3339 6794 7021 7295 8856 8942 10842 11318 14050 14474 27281
28637 29963 37861 42536 43865 48803 59969
175 201 355 5418 7990 10567 10642 12987 16685 18463 21861 24307 25274
27515 39631 40166 43058 47429 55512 55519 59426
117 839 1043 1960 6896 19146 24022 26586 29342 29906 33129 33647 33883
34113 34550 38720 40247 45651 51156 53053 56614
135 236 257 7505 9412 12642 19752 20201 26010 28967 31146 37156 44685
45667 50066 51283 54365 55475 56501 58763 59121
109 840 1573 5523 19968 23924 24644 27064 29410 31276 31526 32173 38175
43570 43722 46655 46660 48353 54025 57319 59818
522 1236 1573 6563 11625 13846 17570 19547 22579 22584 29338 30497
33124 33152 35407 36364 37726 41426 53800 57130
504 1330 1481 13809 15761 20050 26339 27418 29630 32073 33762 34354
36966 43315 47773 47998 48824 50535 53437 55345
348 1244 1492 9626 9655 15638 22727 22971 28357 28841 31523 37543 41100
42372 48983 50354 51434 54574 55031 58193
742 1223 1459 20477 21731 23163 23587 30829 31144 32186 32235 32593
34130 40829 42217 42294 42753 44058 49940 51993
841 860 1534 5878 7083 7113 9658 10508 12871 12964 14023 21055 22680
23927 32701 35168 40986 42139 50708 55350
657 1018 1690 6454 7645 7698 8657 9615 16462 18030 19850 19857 33265
33552 42208 44424 48965 52762 55439 58299
14 511 1376 2586 6797 9409 9599 10784 13076 18509 27363 27667 30262
34043 37043 38143 40246 53811 58872 59250
315 883 1487 2067 7537 8749 10785 11820 15702 20232 22850 23540 30247
41182 44884 50601 52140 55970 57879 58514
256 1442 1534 2342 9734 10789 15334 15356 20334 20433 22923 23521 29391
30553 35406 35643 35701 37968 39541 58097
260 1238 1557 14167 15271 18046 20588 23444 25820 26660 30619 31625
33258 38554 40401 46471 53589 54904 56455 60016
591 885 1463 3411 14043 17083 17372 23029 23365 24691 25527 26389 28621
29999 40343 40359 40394 45685 46209 54887
1119 1411 1664 7879 17732 27000 28506 32237 32445 34100 34926 36470
42848 43126 44117 48780 49519 49592 51901 56580
147 1333 1560 6045 11526 14867 15647 19496 26626 27600 28044 30446
35920 37523 42907 42974 46452 52480 57061 60152
304 591 680 5557 6948 13550 19689 19697 22417 23237 25813 31836 32736
36321 36493 36671 46756 53311 59230 59248
586 777 1018 2393 2817 4057 8068 10632 12430 13193 16433 17344 24526
24902 27693 39301 39776 42300 45215 52149
684 1425 1732 2436 4279 7375 8493 10023 14908 20703 25656 25757 27251
27316 33211 35741 38872 42908 55079 58753
962 981 1773 2814 3799 6243 8163 12655 21226 31370 32506 35372 36697
47037 49095 55400 57506 58743 59678 60422
6229 6484 8795 8981 13576 28622 35526 36922 37284 42155 43443 44080
44446 46649 50824 52987 59033
2742 5176 10231 10336 16729 17273 18474 25875 28227 34891 39826 42595
48600 52542 53023 53372 57331
3512 4163 4725 8375 8585 19795 22844 28615 28649 29481 41484 41657
53255 54222 54229 57258 57647
3358 5239 9423 10858 15636 17937 20678 22427 31220 37069 38770 42079
47256 52442 55152 56964 59169
2243 10090 12309 15437 19426 23065 24872 36192 36336 36949 41387 49915
50155 54338 54422 56561 57984.

A second transmission method according to the present technology is a transmission method including: an encoding step of performing LDPC encoding on the basis of a check matrix of an LDPC code with a code length N of 69120 bits and an encoding rater of 4/16; a group-wise interleaving step of performing group-wise interleaving of interleaving the LDPC code in units of bit groups of 360 bits; and a mapping step of mapping the LDPC code in any one of 4096 signal points of 1D-non-uniform constellation (NUC) of 4096 QAM in units of 12 bits, in which in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 191, 38, 101, 9, 62, 79, 127, 18, 51, 6, 95, 114, 35, 123, 31, 99, 133, 81, 136, 106, 5, 130, 159, 124, 146, 41, 110, 150, 185, 8, 158, 178, 119, 171, 121, 129, 164, 168, 111, 52, 177, 190, 85, 179, 142, 174, 46, 61, 176, 23, 163, 49, 28, 86, 2, 143, 120, 166, 13, 87, 27, 39, 115, 131, 92, 117, 187, 56, 11, 180, 118, 30, 149, 60, 71, 44, 103, 140, 48, 162, 125, 122, 126, 29, 153, 77, 72, 4, 7, 165, 25, 89, 26, 68, 20, 12, 141, 37, 139, 15, 36, 82, 21, 137, 80, 3, 57, 128, 42, 43, 47, 93, 147, 70, 50, 170, 54, 96, 17, 152, 24, 172, 10, 22, 45, 169, 83, 69, 134, 78, 64, 183, 76, 189, 184, 112, 109, 33, 88, 32, 105, 175, 94, 53, 1, 90, 66, 100, 19, 108, 104, 113, 58, 40, 144, 97, 138, 154, 148, 157, 67, 145, 102, 132, 173, 84, 167, 0, 98, 182, 156, 63, 135, 14, 181, 73, 75, 65, 161, 116, 186, 55, 34, 151, 91, 160, 107, 16, 188, 74, 155, 59, the check matrix includes: an A matrix of M1 rows and K columns in an upper left of the check matrix, the A matrix being indicated by a predetermined value M1 and an information length K=N×r of the LDPC code; a B matrix of M1 rows and M1 columns, having a staircase structure adjacent to the right of the A matrix; a Z matrix of M1 rows and (N−K−M1) columns, which is a zero matrix adjacent to the right of the B matrix; a C matrix of (N−K−M1) rows and (K+M1) columns adjacent below the A matrix and the B matrix; and a D matrix of (N−K−M1) rows and (N−K−M1) columns, which is a unit matrix adjacent to the right of the C matrix, the predetermined value M1 is 1800, the A matrix and the C matrix are represented by a check matrix initial value table, and the check matrix initial value table is a table representing positions of elements of 1's of the A matrix and the C matrix every 360 columns, and is 561 825 1718 4745 7515 13041 13466 18039 19065 21821 32596 32708 35323
36399 36450 41124 43036 43218 43363 44875 49948
56 102 1779 2427 5381 8768 15336 26473 35717 38748 39066 45002 50720
694 1150 1533 2177 5801 6610 7601 16657 18949 33472 47746 49581 50668
90 1122 1472 2085 2593 4986 8200 9175 15502 44084 46057 48546 50487
521 619 708 6915 8978 14211 17426 23058 23463 27440 29822 33443 42871
449 912 1471 8058 9344 11928 20533 20600 20737 26557 26970 27616 33791
355 700 1528 6478 9588 10790 20992 33122 34283 41295 43439 46249 47763
997 1543 1679 5874 7973 7975 11113 28275 28812 29864 35070 36864 50676
85 326 1392 4186 10855 11005 12913 19263 22984 31733 33787 37567 48173
986 1144 1508 19864 28918 29117 33609 36452 47975 48432 48842 49274
51533
437 1190 1413 3814 6695 17541 22060 25845 28431 37453 38912 44170 49231
327 1171 1204 6952 11880 16469 25058 28956 31523 36770 40189 43422
46481
123 605 619 8118 8455 19550 20529 21762 21950 28485 30946 34755 34765
113 896 971 6400 27059 33383 34537 35827 38796 40582 42594 43098 48525
162 854 1015 2938 10659 12085 13040 32772 33023 35878 49674 51060 51333
100 452 1703 1932 4208 5127 12086 14549 16084 17890 20870 41364 48498
1569 1633 1666 12957 18611 22499 38418 38719 42135 46815 48274 50947
51387
119 691 1190 2457 3865 7468 12512 30782 31811 33508 36586 41789 47426
867 1117 1666 4376 13263 13466 33524 37440 38136 39800 41454 41620
42510
378 900 1754 16303 25369 27103 28360 30958 35316 44165 46682 47016
50004
1321 1549 1570 16276 17284 19431 23482 23920 27386 27517 46253 48617
50118
37 383 1418 15792 22551 28843 36532 36718 38805 39226 45671 47712 51769
150 787 1441 17828 19396 21576 21805 24048 31868 32891 42486 43020
45492
1095 1214 1744 2445 5773 10209 11526 29604 30121 36526 45786 47376
49366
412 448 1281 11164 14501 15538 15773 23305 31960 32721 40744 45731
50269
183 626 837 4491 12237 13705 15177 15973 21266 25374 41232 44147 50529
618 1550 1594 5474 9260 16552 18122 26061 30420 30922 32661 34390 43236
135 496 757 9327 15659 20738 24327 26688 29063 38993 46155 49532 50001
64 126 1714 5561 8921 11300 12688 14454 16857 19585 20528 24107 27252
528 687 1730 9735 11737 16396 19200 33712 34271 38241 42027 44471 45581
69 646 1447 8603 19706 22153 22398 23840 24638 27254 29107 30368 41419
673 845 1285 9100 11064 14804 15425 17357 27248 31223 32410 35444 48018
124 1531 1677 3672 3673 3786 8886 9557 10003 11053 13053 22458 25413
102 1154 1758 5721 6034 14567 17772 28670 33380 34284 35356 47480 48123
48 351 760 2078 9797 22956 26120 34119 39658 41039 45237 47861 49022
254 445 841 6835 18340 19021 20053 22874 32639 36679 42004 45696 49530
16 802 903 6218 16206 22068 23049 28201 30377 33947 44358 44739 49303
153 1542 1629 7992 29900 34931 36927 38651 39981 41085 41327 50185
51484
525 1291 1765 9425 20271 31229 37444 38996 39145 41711 43188 45203
51255
2 244 1648 12321 14991 17426 18456 20126 29915 32581 38880 39516 49013
23 452 705 9414 11862 13764 18179 35458 37892 40471 46041 46494 48746
509 1201 1328 8921 9867 10947 19476 22693 32636 34301 38356 39238 51797
246 249 1390 12438 13266 24060 33628 37130 42923 43298 43709 43721
45413
117 257 748 9419 9461 11350 12790 16724 33147 34168 34683 37884 42699
619 646 740 7468 7604 8152 16296 19120 27614 27748 40170 40289 49366
914 1360 1716 10817 17672 18919 26146 29631 40903 46716 49502 51576
51657
68 702 1552 10431 10925 12856 24516 26440 30834 31179 32277 35019 44108
588 880 1524 6641 9453 9653 13679 14488 20714 25865 42217 42637 48312
6380 12240 12558 12816 21460 24206 26129 28555 41616 51767
8889 16221 21629 23476 33954 40572 43494 44666 44885 49813
16938 17727 17913 18898 21754 32515 35686 36920 39898 43560
9170 11747 14681 22874 24537 24685 26989 28947 33592 34621
2427 10241 29649 30522 37700 37789 41656 44020 49801 51268.

A second reception device according to the present technology is a reception device including a group-wise deinterleaving unit that returns an arrangement of an LDPC code after group-wise interleaving which is obtained from data transmitted from a transmission device to an original arrangement, in which the transmission device includes: an encoding unit that performs LDPC encoding on the basis of a check matrix of the LDPC code with a code length N of 69120 bits and an encoding rater of 4/16; a group-wise interleaving unit that performs group-wise interleaving of interleaving the LDPC code in units of bit groups of 360 bits; a mapping unit that maps the LDPC code in any one of 4096 signal points of 1D-non-uniform constellation (NUC) of 4096 QAM in units of 12 bits, in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 191, 38, 101, 9, 62, 79, 127, 18, 51, 6, 95, 114, 35, 123, 31, 99, 133, 81, 136, 106, 5, 130, 159, 124, 146, 41, 110, 150, 185, 8, 158, 178, 119, 171, 121, 129, 164, 168, 111, 52, 177, 190, 85, 179, 142, 174, 46, 61, 176, 23, 163, 49, 28, 86, 2, 143, 120, 166, 13, 87, 27, 39, 115, 131, 92, 117, 187, 56, 11, 180, 118, 30, 149, 60, 71, 44, 103, 140, 48, 162, 125, 122, 126, 29, 153, 77, 72, 4, 7, 165, 25, 89, 26, 68, 20, 12, 141, 37, 139, 15, 36, 82, 21, 137, 80, 3, 57, 128, 42, 43, 47, 93, 147, 70, 50, 170, 54, 96, 17, 152, 24, 172, 10, 22, 45, 169, 83, 69, 134, 78, 64, 183, 76, 189, 184, 112, 109, 33, 88, 32, 105, 175, 94, 53, 1, 90, 66, 100, 19, 108, 104, 113, 58, 40, 144, 97, 138, 154, 148, 157, 67, 145, 102, 132, 173, 84, 167, 0, 98, 182, 156, 63, 135, 14, 181, 73, 75, 65, 161, 116, 186, 55, 34, 151, 91, 160, 107, 16, 188, 74, 155, 59, the check matrix includes: an A matrix of M1 rows and K columns in an upper left of the check matrix, the A matrix being indicated by a predetermined value M1 and an information length K=N×r of the LDPC code; a B matrix of M1 rows and M1 columns, having a staircase structure adjacent to the right of the A matrix; a Z matrix of M1 rows and (N−K−M1) columns, which is a zero matrix adjacent to the right of the B matrix; a C matrix of (N−K−M1) rows and (K+M1) columns adjacent below the A matrix and the B matrix; and a D matrix of (N−K−M1) rows and (N−K−M1) columns, which is a unit matrix adjacent to the right of the C matrix, the predetermined value M1 is 1800, the A matrix and the C matrix are represented by a check matrix initial value table, and the check matrix initial value table is a table representing positions of elements of 1's of the A matrix and the C matrix every 360 columns, and is 561 825 1718 4745 7515 13041 13466 18039 19065 21821 32596 32708 35323
36399 36450 41124 43036 43218 43363 44875 49948
56 102 1779 2427 5381 8768 15336 26473 35717 38748 39066 45002 50720
694 1150 1533 2177 5801 6610 7601 16657 18949 33472 47746 49581 50668
90 1122 1472 2085 2593 4986 8200 9175 15502 44084 46057 48546 50487
521 619 708 6915 8978 14211 17426 23058 23463 27440 29822 33443 42871
449 912 1471 8058 9344 11928 20533 20600 20737 26557 26970 27616 33791
355 700 1528 6478 9588 10790 20992 33122 34283 41295 43439 46249 47763
997 1543 1679 5874 7973 7975 11113 28275 28812 29864 35070 36864 50676
85 326 1392 4186 10855 11005 12913 19263 22984 31733 33787 37567 48173
986 1144 1508 19864 28918 29117 33609 36452 47975 48432 48842 49274
51533
437 1190 1413 3814 6695 17541 22060 25845 28431 37453 38912 44170 49231
327 1171 1204 6952 11880 16469 25058 28956 31523 36770 40189 43422
46481
123 605 619 8118 8455 19550 20529 21762 21950 28485 30946 34755 34765
113 896 971 6400 27059 33383 34537 35827 38796 40582 42594 43098 48525
162 854 1015 2938 10659 12085 13040 32772 33023 35878 49674 51060 51333
100 452 1703 1932 4208 5127 12086 14549 16084 17890 20870 41364 48498
1569 1633 1666 12957 18611 22499 38418 38719 42135 46815 48274 50947
51387
119 691 1190 2457 3865 7468 12512 30782 31811 33508 36586 41789 47426
867 1117 1666 4376 13263 13466 33524 37440 38136 39800 41454 41620
42510
378 900 1754 16303 25369 27103 28360 30958 35316 44165 46682 47016
50004
1321 1549 1570 16276 17284 19431 23482 23920 27386 27517 46253 48617
50118
37 383 1418 15792 22551 28843 36532 36718 38805 39226 45671 47712 51769
150 787 1441 17828 19396 21576 21805 24048 31868 32891 42486 43020
45492
1095 1214 1744 2445 5773 10209 11526 29604 30121 36526 45786 47376
49366
412 448 1281 11164 14501 15538 15773 23305 31960 32721 40744 45731
50269
183 626 837 4491 12237 13705 15177 15973 21266 25374 41232 44147 50529
618 1550 1594 5474 9260 16552 18122 26061 30420 30922 32661 34390 43236
135 496 757 9327 15659 20738 24327 26688 29063 38993 46155 49532 50001
64 126 1714 5561 8921 11300 12688 14454 16857 19585 20528 24107 27252
528 687 1730 9735 11737 16396 19200 33712 34271 38241 42027 44471 45581
69 646 1447 8603 19706 22153 22398 23840 24638 27254 29107 30368 41419
673 845 1285 9100 11064 14804 15425 17357 27248 31223 32410 35444 48018
124 1531 1677 3672 3673 3786 8886 9557 10003 11053 13053 22458 25413
102 1154 1758 5721 6034 14567 17772 28670 33380 34284 35356 47480 48123
48 351 760 2078 9797 22956 26120 34119 39658 41039 45237 47861 49022
254 445 841 6835 18340 19021 20053 22874 32639 36679 42004 45696 49530
16 802 903 6218 16206 22068 23049 28201 30377 33947 44358 44739 49303
153 1542 1629 7992 29900 34931 36927 38651 39981 41085 41327 50185
51484
525 1291 1765 9425 20271 31229 37444 38996 39145 41711 43188 45203
51255
2 244 1648 12321 14991 17426 18456 20126 29915 32581 38880 39516 49013
23 452 705 9414 11862 13764 18179 35458 37892 40471 46041 46494 48746

-continued 509 1201 1328 8921 9867 10947 19476 22693 32636 34301 38356 39238 51797
246 249 1390 12438 13266 24060 33628 37130 42923 43298 43709 43721
45413
117 257 748 9419 9461 11350 12790 16724 33147 34168 34683 37884 42699
619 646 740 7468 7604 8152 16296 19120 27614 27748 40170 40289 49366
914 1360 1716 10817 17672 18919 26146 29631 40903 46716 49502 51576
51657
68 702 1552 10431 10925 12856 24516 26440 30834 31179 32277 35019 44108
588 880 1524 6641 9453 9653 13679 14488 20714 25865 42217 42637 48312
6380 12240 12558 12816 21460 24206 26129 28555 41616 51767
8889 16221 21629 23476 33954 40572 43494 44666 44885 49813
16938 17727 17913 18898 21754 32515 35686 36920 39898 43560
9170 11747 14681 22874 24537 24685 26989 28947 33592 34621
2427 10241 29649 30522 37700 37789 41656 44020 49801 51268.

A third transmission method according to the present technology is a transmission method including: an encoding step of performing LDPC encoding on the basis of a check matrix of an LDPC code with a code length N of 69120 bits and an encoding rater of 6/16; a group-wise interleaving step of performing group-wise interleaving of interleaving the LDPC code in units of bit groups of 360 bits; and a mapping step of mapping the LDPC code in any one of 4096 signal points of 1D-non-uniform constellation (NUC) of 4096 QAM in units of 12 bits, in which in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 100, 152, 16, 39, 26, 58, 60, 6, 126, 7, 59, 75, 62, 47, 27, 113, 41, 115, 169, 30, 95, 189, 138, 136, 70, 140, 149, 187, 177, 141, 125, 171, 178, 134, 15, 154, 131, 183, 46, 35, 44, 11, 51, 170, 112, 20, 161, 159, 101, 52, 181, 71, 28, 128, 3, 167, 156, 123, 18, 139, 102, 13, 19, 37, 90, 105, 92, 135, 185, 121, 50, 158, 29, 104, 155, 12, 184, 93, 166, 14, 133, 146, 24, 191, 188, 116, 109, 89, 65, 45, 25, 21, 1, 76, 151, 180, 33, 124, 91, 107, 119, 5, 132, 118, 111, 96, 143, 150, 173, 108, 2, 122, 22, 148, 130, 142, 147, 67, 97, 103, 36, 63, 40, 117, 55, 68, 137, 144, 94, 83, 56, 79, 175, 0, 182, 114, 85, 86, 9, 10, 74, 106, 17, 190, 4, 34, 84, 98, 38, 88, 64, 78, 145, 77, 163, 42, 120, 69, 164, 48, 23, 129, 160, 81, 127, 82, 53, 72, 179, 31, 66, 32, 168, 110, 73, 186, 157, 172, 49, 165, 176, 80, 61, 174, 153, 162, 54, 99, 57, 87, 8, 43, the check matrix includes: an A matrix of M1 rows and K columns in an upper left of the check matrix, the A matrix being indicated by a predetermined value M1 and an information length K=N×r of the LDPC code; a B matrix of M1 rows and M1 columns, having a staircase structure adjacent to the right of the A matrix; a Z matrix of M1 rows and (N−K−M1) columns, which is a zero matrix adjacent to the right of the B matrix; a C matrix of (N−K−M1) rows and (K+M1) columns adjacent below the A matrix and the B matrix; and a D matrix of (N−K−M1) rows and (N−K−M1) columns, which is a unit matrix adjacent to the right of the C matrix, the predetermined value M1 is 1800, the A matrix and the C matrix are represented by a check matrix initial value table, and the check matrix initial value table is a table representing positions of elements of 1's of the A matrix and the C matrix every 360 columns, and is 608 1394 3635 14404 15203 19848 22161 23175 26651 31945 41227
481 570 11088 11673 11866 17145 17247 17564 21607 25992 31286
1207 1257 1870 8472 8855 10511 15656 17064 22720 28352 30914
1171 1585 6218 7621 10121 11374 13184 22714 27207 27959 38572
244 548 2073 4937 7509 11840 12850 18762 25618 27902 37150

-continued 15 1352 7060 7886 8151 10574 14172 15258 24838 30827 35337
1009 1651 13300 13958 26240 29983 32340 40743 41553 42475 42873
638 1405 5544 6797 10001 14934 24766 35758 40719 41787 42342
1467 1481 3202 11324 14048 15217 17608 22544 26736 32073 33405
1274 1343 3576 4166 8712 10756 21175 26866 37021 40341 42064
1232 1590 4409 8705 13307 28481 30893 36031 36780 37697 39149
189 1678 9943 10774 11765 25520 26133 27351 27353 40664 41534
125 1421 5009 9365 12792 15933 16231 25975 27076 27997 32429
1361 1764 5376 11071 14456 16324 20318 26168 28445 30392 34235
1017 1303 3312 6738 7813 18149 25506 29032 36789 38742 43116
463 967 10876 13874 14303 16789 21656 26555 38738 39195 40668
630 1104 3029 3165 5157 12880 14175 16498 35121 38917 40944
716 1054 10011 11739 16913 19396 20892 23370 24392 27614 38467
1081 1238 2872 10259 13618 16943 17363 23570 29721 32411 38969
775 1002 2978 9202 16618 22697 30716 31750 36517 37294 40454
25 497 10687 13308 15302 17525 17539 21865 22279 24516 26992
781 878 6426 8551 12328 21375 27626 28192 29731 35423 35606
729 1734 3479 6850 14347 14776 21998 33617 34690 38597 38704
122 1378 1660 7448 7659 11900 13039 13796 19908
504 716 1551 5655 6245 8365 9825 16627 29100
88 900 1057 2620 16729 17278 17444 26106 26587
30 1697 1736 8718 11664 20885 27043 42569 42913
293 634 1188 4005 5266 6205 26756 30207 37757
254 755 1187 4631 13433 25055 28354 28583 30446
316 1381 1522 3131 4340 27284 28246 28282 43174
84 293 645 2148 7925 13104 25010 36836 39033
982 1486 1660 4287 5335 18350 26913 30774 31280
418 1028 1039 3334 4577 6553 7011 17259 31922
1324 1361 1690 5991 7740 16880 18479 25713 31823
735 1322 1727 8629 14655 15815 16762 23263 36859
19 928 1561 11161 12894 14226 21331 41128 41883
327 940 1004 13616 15894 31400 34106 34443 37957
576 953 1226 2122 4900 5002 10248 25476 30787
249 632 1240 5432 23019 29225 31719 36658 41360
980 1154 1783 4351 10245 23347 27442 28328 38555
581 863 1552 5057 7572 14544 20482 29482 31672
4 502 1450 4883 5176 6824 10430 32680 39581
81 761 1558 2269 5391 13213 24184 25523 39429
1085 1163 1244 7694 9125 17387 22223 26343 37933
204 1127 1483 18302 19939 20576 31599 32619 42911
345 387 591 8727 18080 20628 32251 34562 42821
957 1126 1133 4099 12272 15595 20906 23606 34564
409 1310 1335 2761 11952 26853 27941 29262 31647
329 818 1527 3890 5238 8742 15586 28739 43015
231 1158 1677 4314 15937 17526 18391 22963 39232
34 275 526 2975 4742 16109 17346 29145 37673
497 735 1261 7468 8769 17342 19763 32646 33497
879 1233 1633 11612 22941 23723 31969 35571 39510
886 954 1355 5532 8283 26965 29267 30820 40402
356 1199 1452 8833 14845 21722 23840 26539 27970
553 1570 1732 8249 16820 23181 23234 30754 40399
457 1304 1698 2774 11357 32906 34484 38700 41799
456 579 1155 23844 27261 29172 30980 35000 40984
301 1290 1782 6798 9735 23655 31040 35554 36366
228 483 561 12346 16698 32688 34518 38648 41677
35 184 997 4915 7077 9878 16772 26263 27270
181 193 1255 7548 17103 34511 36590 38107 42065
697 1024 1541 2164 15638 20061 32499 32667 32732
654 968 1632 3215 4901 6286 12414 13963 29636
89 150 450 5771 10863 29809 36886 37914 42983

-continued 517 1046 1153 5458 18093 25579 31084 37779 42050
345 914 1372 4548 6720 13678 13755 15422 41938
301 518 1107 3603 6076 9265 19580 41645 42621
155 1013 1441 10166 10545 22042 30084 33026 34505
899 1308 1766 22228 24520 24589 30833 32126 37147
177 230 349 6309 9642 25713 30455 34964 40524
802 1364 1703 3573 17317 20364 22849 24265 24925
3952 10609 11011 16296 31430 39995 40207 41606 42424
16548 19896 22579 23043 23126 24141 34331 34959 37990
12197 15244 22990 23110 25507 30011 37681 38902 39432
2292 11871 15562 22304 33059 35126 39158 41206 41866
3497 7847 11510 16212 19408 26780 27967 33953 34451.

A third reception device according to the present technology is a reception device including a group-wise deinterleaving unit that returns an arrangement of an LDPC code after group-wise interleaving which is obtained from data transmitted from a transmission device to an original arrangement, in which the transmission device includes: an encoding unit that performs LDPC encoding on the basis of a check matrix of the LDPC code with a code length N of 69120 bits and an encoding rater of 6/16; a group-wise interleaving unit that performs group-wise interleaving of interleaving the LDPC code in units of bit groups of 360 bits; and a mapping unit that maps the LDPC code in any one of 4096 signal points of 1D-non-uniform constellation (NUC) of 4096 QAM in units of 12 bits, in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 100, 152, 16, 39, 26, 58, 60, 6, 126, 7, 59, 75, 62, 47, 27, 113, 41, 115, 169, 30, 95, 189, 138, 136, 70, 140, 149, 187, 177, 141, 125, 171, 178, 134, 15, 154, 131, 183, 46, 35, 44, 11, 51, 170, 112, 20, 161, 159, 101, 52, 181, 71, 28, 128, 3, 167, 156, 123, 18, 139, 102, 13, 19, 37, 90, 105, 92, 135, 185, 121, 50, 158, 29, 104, 155, 12, 184, 93, 166, 14, 133, 146, 24, 191, 188, 116, 109, 89, 65, 45, 25, 21, 1, 76, 151, 180, 33, 124, 91, 107, 119, 5, 132, 118, 111, 96, 143, 150, 173, 108, 2, 122, 22, 148, 130, 142, 147, 67, 97, 103, 36, 63, 40, 117, 55, 68, 137, 144, 94, 83, 56, 79, 175, 0, 182, 114, 85, 86, 9, 10, 74, 106, 17, 190, 4, 34, 84, 98, 38, 88, 64, 78, 145, 77, 163, 42, 120, 69, 164, 48, 23, 129, 160, 81, 127, 82, 53, 72, 179, 31, 66, 32, 168, 110, 73, 186, 157, 172, 49, 165, 176, 80, 61, 174, 153, 162, 54, 99, 57, 87, 8, 43, the check matrix includes: an A matrix of M1 rows and K columns in an upper left of the check matrix, the A matrix being indicated by a predetermined value M1 and an information length K=N×r of the LDPC code; a B matrix of M1 rows and M1 columns, having a staircase structure adjacent to the right of the A matrix; a Z matrix of M1 rows and (N−K−M1) columns, which is a zero matrix adjacent to the right of the B matrix; a C matrix of (N−K−M1) rows and (K+M1) columns adjacent below the A matrix and the B matrix; and a D matrix of (N−K−M1) rows and (N−K−M1) columns, which is a unit matrix adjacent to the right of the C matrix, the predetermined value M1 is 1800, the A matrix and the C matrix are represented by a check matrix initial value table, and the check matrix initial value table is a table representing positions of elements of 1's of the A matrix and the C matrix every 360 columns, and is 608 1394 3635 14404 15203 19848 22161 23175 26651 31945 41227
481 570 11088 11673 11866 17145 17247 17564 21607 25992 31286
1207 1257 1870 8472 8855 10511 15656 17064 22720 28352 30914

-continued 1171 1585 6218 7621 10121 11374 13184 22714 27207 27959 38572
244 548 2073 4937 7509 11840 12850 18762 25618 27902 37150
15 1352 7060 7886 8151 10574 14172 15258 24838 30827 35337
1009 1651 13300 13958 26240 29983 32340 40743 41553 42475 42873
638 1405 5544 6797 10001 14934 24766 35758 40719 41787 42342
1467 1481 3202 11324 14048 15217 17608 22544 26736 32073 33405
1274 1343 3576 4166 8712 10756 21175 26866 37021 40341 42064
1232 1590 4409 8705 13307 28481 30893 36031 36780 37697 39149
189 1678 9943 10774 11765 25520 26133 27351 27353 40664 41534
125 1421 5009 9365 12792 15933 16231 25975 27076 27997 32429
1361 1764 5376 11071 14456 16324 20318 26168 28445 30392 34235
1017 1303 3312 6738 7813 18149 25506 29032 36789 38742 43116
463 967 10876 13874 14303 16789 21656 26555 38738 39195 40668
630 1104 3029 3165 5157 12880 14175 16498 35121 38917 40944
716 1054 10011 11739 16913 19396 20892 23370 24392 27614 38467
1081 1238 2872 10259 13618 16943 17363 23570 29721 32411 38969
775 1002 2978 9202 16618 22697 30716 31750 36517 37294 40454
25 497 10687 13308 15302 17525 17539 21865 22279 24516 26992
781 878 6426 8551 12328 21375 27626 28192 29731 35423 35606
729 1734 3479 6850 14347 14776 21998 33617 34690 38597 38704
122 1378 1660 7448 7659 11900 13039 13796 19908
504 716 1551 5655 6245 8365 9825 16627 29100
88 900 1057 2620 16729 17278 17444 26106 26587
30 1697 1736 8718 11664 20885 27043 42569 42913
293 634 1188 4005 5266 6205 26756 30207 37757
254 755 1187 4631 13433 25055 28354 28583 30446
316 1381 1522 3131 4340 27284 28246 28282 43174
84 293 645 2148 7925 13104 25010 36836 39033
982 1486 1660 4287 5335 18350 26913 30774 31280
418 1028 1039 3334 4577 6553 7011 17259 31922
1324 1361 1690 5991 7740 16880 18479 25713 31823
735 1322 1727 8629 14655 15815 16762 23263 36859
19 928 1561 11161 12894 14226 21331 41128 41883
327 940 1004 13616 15894 31400 34106 34443 37957
576 953 1226 2122 4900 5002 10248 25476 30787
249 632 1240 5432 23019 29225 31719 36658 41360
980 1154 1783 4351 10245 23347 27442 28328 38555
581 863 1552 5057 7572 14544 20482 29482 31672
4 502 1450 4883 5176 6824 10430 32680 39581
81 761 1558 2269 5391 13213 24184 25523 39429
1085 1163 1244 7694 9125 17387 22223 26343 37933
204 1127 1483 18302 19939 20576 31599 32619 42911
345 387 591 8727 18080 20628 32251 34562 42821
957 1126 1133 4099 12272 15595 20906 23606 34564
409 1310 1335 2761 11952 26853 27941 29262 31647
329 818 1527 3890 5238 8742 15586 28739 43015
231 1158 1677 4314 15937 17526 18391 22963 39232
34 275 526 2975 4742 16109 17346 29145 37673
497 735 1261 7468 8769 17342 19763 32646 33497
879 1233 1633 11612 22941 23723 31969 35571 39510
886 954 1355 5532 8283 26965 29267 30820 40402
356 1199 1452 8833 14845 21722 23840 26539 27970
553 1570 1732 8249 16820 23181 23234 30754 40399
457 1304 1698 2774 11357 32906 34484 38700 41799
456 579 1155 23844 27261 29172 30980 35000 40984
301 1290 1782 6798 9735 23655 31040 35554 36366
228 483 561 12346 16698 32688 34518 38648 41677
35 184 997 4915 7077 9878 16772 26263 27270
181 193 1255 7548 17103 34511 36590 38107 42065
697 1024 1541 2164 15638 20061 32499 32667 32732
654 968 1632 3215 4901 6286 12414 13963 29636
89 150 450 5771 10863 29809 36886 37914 42983
517 1046 1153 5458 18093 25579 31084 37779 42050
345 914 1372 4548 6720 13678 13755 15422 41938
301 518 1107 3603 6076 9265 19580 41645 42621
155 1013 1441 10166 10545 22042 30084 33026 34505
899 1308 1766 22228 24520 24589 30833 32126 37147
177 230 349 6309 9642 25713 30455 34964 40524
802 1364 1703 3573 17317 20364 22849 24265 24925
3952 10609 11011 16296 31430 39995 40207 41606 42424
16548 19896 22579 23043 23126 24141 34331 34959 37990
12197 15244 22990 23110 25507 30011 37681 38902 39432
2292 11871 15562 22304 33059 35126 39158 41206 41866
3497 7847 11510 16212 19408 26780 27967 33953 34451.

A fourth transmission method according to the present technology is a transmission method including: an encoding step of performing LDPC encoding on the basis of a check matrix of an LDPC code with a code length N of 69120 bits and an encoding rater of 8/16; a group-wise interleaving step of performing group-wise interleaving of interleaving the LDPC code in units of bit groups of 360 bits; and a mapping step of mapping the LDPC code in any one of 4096 signal points of 1D-non-uniform constellation (NUC) of 4096 QAM in units of 12 bits, in which in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 21, 5, 2, 24, 12, 28, 52, 118, 129, 3, 122, 149, 105, 16, 136, 99, 133, 171, 84, 79, 59, 62, 155, 78, 134, 20, 1, 51, 22, 161, 173, 46, 172, 162, 55, 148, 70, 57, 121, 86, 131, 114, 31, 72, 104, 120, 164, 127, 83, 179, 187, 7, 108, 40, 73, 144, 48, 68, 60, 190, 135, 61, 116, 106, 19, 35, 143, 180, 102, 76, 182, 117, 93, 191, 165, 23, 80, 146, 153, 42, 53, 139, 124, 64, 167, 96, 138, 132, 158, 90, 110, 82, 39, 175, 170, 66, 145, 94, 119, 130, 98, 63, 87, 32, 160, 34, 151, 77, 95, 109, 56, 113, 147, 50, 38, 15, 156, 11, 169, 185, 183, 92, 186, 107, 10, 101, 33, 4, 150, 41, 81, 89, 166, 0, 30, 54, 168, 26, 140, 74, 100, 9, 111, 126, 43, 112, 25, 88, 44, 189, 37, 178, 141, 49, 13, 29, 8, 69, 154, 45, 97, 47, 36, 75, 137, 6, 115, 188, 85, 174, 17, 142, 18, 91, 163, 157, 177, 103, 125, 71, 14, 181, 65, 184, 176, 159, 128, 152, 58, 27, 123, 67, the LDPC code includes information bits and parity bits, the check matrix includes an information matrix portion corresponding to the information bits and a parity matrix portion corresponding to the parity bits, the information matrix portion is represented by a check matrix initial value table, and the check matrix initial value table is a table representing positions of elements of 1's of the information matrix portion every 360 columns, and is 1850 4176 4190 7294 8168 8405 9258 9710 13440 16304 16600 18184 18834
19899 22513 25068 26659 27137 27232 29186 29667 30549 31428 33634
2477 2543 5094 8081 9573 10269 11276 11439 13016 13327 16717 18042
19362 19721 20089 20425 20503 21396 24677 24722 28703 32486 32759 33630
1930 2158 2315 2683 3818 4883 5252 5505 8760 9580 11867 13117 14566
15639 17273 18820 21069 24945 25667 26785 30678 31271 33003 33244
1279 1491 2038 2347 2432 4336 4905 6588 7507 7666 8775 9172 10405 12249
12270 12373 12936 13046 13364 15130 17597 22855 27548 32895
620 1897 3775 5552 6799 7621 10167 10172 10615 11367 12093 13241 15426
16623 19467 19792 22069 22370 24472 24594 25205 25954 27800 29422
582 1618 4673 5809 6318 6883 8051 12335 12409 13176 14078 15206 17580
18624 18876 19079 20786 21177 25894 26395 27377 27757 30167 31971
1157 2189 4160 4480 5055 8961 9171 9444 10533 11581 12904 14256 14620
15773 16232 17598 19756 21134 21443 22559 23258 25137 25555 28150
987 1258 1269 2394 4859 5642 5705 6093 6408 7734 8804 10657 11946 16132
20267 25402 26505 26548 27060 29767 29780 31915 31966 33590
1010 1363 1626 5283 6356 10961 12418 14332 14362 16288 16303 16592
17096 20115 20285 20478 21774 22165 22425 23198 25048 25596 31540 32841
895 2743 2912 4971 8803 11183 14500 14617 14638 16776 17901 18622 20244
20845 22214 25676 26161 26281 29978 30392 30922 31542 32038 32443
188 260 411 2823 5512 5645 10019 11856 12671 14273 14673 16091 16169
22333 22934 22945 23542 26503 27159 27279 28277 30114 31626 32722
357 516 3530 4317 8587 9491 10348 11330 13446 14533 15423 17003 17217
19127 20088 20750 21767 22386 24021 27749 29008 29376 30329 32940
2909 3036 4875 9967 10632 12069 12410 14004 14628 15605 15852 18231
18657 19705 20620 22241 29575 29656 31246 32190 32781 33489 33842 34492
4242 5461 5577 7662 11130 13663 17240 17773 18339 19400 22905 24219
25464 25890 26359 27121 27318 27840 30800 32587 32924 33427 33940 34058
421 2222 3457 5257 5600 10147 12754 17380 18854 20333 20345 20752 24578
25196 25638 25725 25822 27610 28006 28563 29632 29973 29991 34166
41 207 1043 4650 5387 6826 7261 8687 9092 10775 11446 12596 16613 19463
20923 24155 24927 25384 26064 27377 28094 32578 32639 34115
1050 5731 15820 16281 26130 29314
5980 6161 14479 22181 22537 32924
7828 9134 11297 17143 25449 29674
8299 10457 14486 21548 22510 32039
1527 7792 10424 19166 29302 29768
5823 13974 21254 21506 25658 29491
6285 9873 12846 14474 17005 29377
1740 4929 8285 20994 32271 34522
12862 16827 22427 23369 27051 30378
4787 10372 10408 12091 20349 26162
6659 22752 24697 28261 28917 32536
6788 15367 21778 28916 30324 33927
7181 12373 21912 24703 28680 34045
2238 4945 14336 19270 29574 33459
10283 15311 17440 24599 24867 28293
324 5264 5375 6581 24348 30288
3112 7656 23825
21624 22318 22633
5284 19790 22758
2700 4039 12576
17028 17520 19579
11914 17834 33989
2199 5502 7184
22 20701 26497
5551 27014 32876
4019 26547 28521
7580 10016 33855
4328 11674 34018

-continued

| |
|---|
| 8491 9956 10029 |
| 6167 11267 24914 |
| 5317 9049 29657 |
| 20717 28724 33012 |
| 16841 21647 31096 |
| 11931 16278 20287 |
| 9402 10557 11008 |
| 11826 15349 34420 |
| 14369 17031 20597 |
| 19164 27947 29775 |
| 15537 18796 33662 |
| 5404 21027 26757 |
| 6269 12671 24309 |
| 8601 29048 29262 |
| 10099 20323 21457 |
| 15952 17074 30434 |
| 7597 20987 33095 |
| 11298 24182 29217 |
| 12055 16250 16971 |
| 5350 9354 31390 |
| 8168 14168 18570 |
| 5448 13141 32381 |
| 3921 21113 28176 |
| 8756 19895 27917 |
| 9391 16617 25586 |
| 3357 18527 34238 |
| 2378 16840 28948 |
| 7470 27466 32928 |
| 8366 19376 30916 |
| 3116 7267 18016 |
| 15309 18445 21799 |
| 4731 23773 34546 |
| 260 4898 5180 |
| 8897 22266 29587 |
| 2539 23717 33142 |
| 19233 28750 29724 |
| 9937 15384 16599 |
| 10234 17089 26776 |
| 8869 9425 13658 |
| 6197 24086 31929 |
| 9237 20931 27785 |
| 10403 13822 16734 |
| 20038 21196 26868 |
| 13170 27813 28875 |
| 1110 20329 24508 |
| 11844 22662 28987 |
| 2891 2918 14512 |
| 15707 27399 34135 |
| 8687 20019 26178 |
| 6847 8903 16307 |
| 23737 23775 27776 |
| 17388 27970 31983. |

A fourth reception device according to the present technology is a reception device including a group-wise deinterleaving unit that returns an arrangement of an LDPC code after group-wise interleaving which is obtained from data transmitted from a transmission device to an original arrangement, in which the transmission device includes: an encoding unit that performs LDPC encoding on the basis of a check matrix of the LDPC code with a code length N of 69120 bits and an encoding rater of 8/16, a group-wise interleaving unit that performs group-wise interleaving of interleaving the LDPC code in units of bit groups of 360 bits; and a mapping unit that maps the LDPC code in any one of 4096 signal points of 1D-non-uniform constellation (NUC) of 4096 QAM in units of 12 bits, in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 21, 5, 2, 24, 12, 28, 52, 118, 129, 3, 122, 149, 105, 16, 136, 99, 133, 171, 84, 79, 59, 62, 155, 78, 134, 20, 1, 51, 22, 161, 173, 46, 172, 162, 55, 148, 70, 57, 121, 86, 131, 114, 31, 72, 104, 120, 164, 127, 83, 179, 187, 7, 108, 40, 73, 144, 48, 68, 60, 190, 135, 61, 116, 106, 19, 35, 143, 180, 102, 76, 182, 117, 93, 191, 165, 23, 80, 146, 153, 42, 53, 139, 124, 64, 167, 96, 138, 132, 158, 90, 110, 82, 39, 175, 170, 66, 145, 94, 119, 130, 98, 63, 87, 32, 160, 34, 151, 77, 95, 109, 56, 113, 147, 50, 38, 15, 156, 11, 169, 185, 183, 92, 186, 107, 10, 101, 33, 4, 150, 41, 81, 89, 166, 0, 30, 54, 168, 26, 140, 74, 100, 9, 111, 126, 43, 112, 25, 88, 44, 189, 37, 178, 141, 49, 13, 29, 8, 69, 154, 45, 97, 47, 36, 75, 137, 6, 115, 188, 85, 174, 17, 142, 18, 91, 163, 157, 177, 103, 125, 71, 14, 181, 65, 184, 176, 159, 128, 152, 58, 27, 123, 67, the LDPC code includes information bits and parity bits, the check matrix includes an information matrix portion corresponding to the information bits and a parity matrix portion corresponding to the parity bits, the information matrix portion is represented by a check matrix initial value table, and the check matrix initial value table is a table representing positions of elements of 1's of the information matrix portion every 360 columns, and is 1850 4176 4190 7294 8168 8405 9258 9710 13440 16304 16600 18184 18834
19899 22513 25068 26659 27137 27232 29186 29667 30549 31428 33634
2477 2543 5094 8081 9573 10269 11276 11439 13016 13327 16717 18042
19362 19721 20089 20425 20503 21396 24677 24722 28703 32486 32759 33630
1930 2158 2315 2683 3818 4883 5252 5505 8760 9580 11867 13117 14566
15639 17273 18820 21069 24945 25667 26785 30678 31271 33003 33244
1279 1491 2038 2347 2432 4336 4905 6588 7507 7666 8775 9172 10405 12249
12270 12373 12936 13046 13364 15130 17597 22855 27548 32895
620 1897 3775 5552 6799 7621 10167 10172 10615 11367 12093 13241 15426
16623 19467 19792 22069 22370 24472 24594 25205 25954 27800 29422
582 1618 4673 5809 6318 6883 8051 12335 12409 13176 14078 15206 17580
18624 18876 19079 20786 21177 25894 26395 27377 27757 30167 31971
1157 2189 4160 4480 5055 8961 9171 9444 10533 11581 12904 14256 14620
15773 16232 17598 19756 21134 21443 22559 23258 25137 25555 28150
987 1258 1269 2394 4859 5642 5705 6093 6408 7734 8804 10657 11946 16132
20267 25402 26505 26548 27060 29767 29780 31915 31966 33590
1010 1363 1626 5283 6356 10961 12418 14332 14362 16288 16303 16592
17096 20115 20285 20478 21774 22165 22425 23198 25048 25596 31540 32841
895 2743 2912 4971 8803 11183 14500 14617 14638 16776 17901 18622 20244
20845 22214 25676 26161 26281 29978 30392 30922 31542 32038 32443
188 260 411 2823 5512 5645 10019 11856 12671 14273 14673 16091 16169
22333 22934 22945 23542 26503 27159 27279 28277 30114 31626 32722
357 516 3530 4317 8587 9491 10348 11330 13446 14533 15423 17003 17217
19127 20088 20750 21767 22386 24021 27749 29008 29376 30329 32940
2909 3036 4875 9967 10632 12069 12410 14004 14628 15605 15852 18231
18657 19705 20620 22241 29575 29656 31246 32190 32781 33489 33842 34492
4242 5461 5577 7662 11130 13663 17240 17773 18339 19400 22905 24219
25464 25890 26359 27121 27318 27840 30800 32587 32924 33427 33940 34058
421 2222 3457 5257 5600 10147 12754 17380 18854 20333 20345 20752 24578
25196 25638 25725 25822 27610 28006 28563 29632 29973 29991 34166
41 207 1043 4650 5387 6826 7261 8687 9092 10775 11446 12596 16613 19463
20923 24155 24927 25384 26064 27377 28094 32578 32639 34115
1050 5731 15820 16281 26130 29314
5980 6161 14479 22181 22537 32924
7828 9134 11297 17143 25449 29674
8299 10457 14486 21548 22510 32039
1527 7792 10424 19166 29302 29768
5823 13974 21254 21506 25658 29491
6285 9873 12846 14474 17005 29377
1740 4929 8285 20994 32271 34522
12862 16827 22427 23369 27051 30378
4787 10372 10408 12091 20349 26162
6659 22752 24697 28261 28917 32536
6788 15367 21778 28916 30324 33927
7181 12373 21912 24703 28680 34045
2238 4945 14336 19270 29574 33459
10283 15311 17440 24599 24867 28293
324 5264 5375 6581 24348 30288
3112 7656 23825
21624 22318 22633
5284 19790 22758
2700 4039 12576
17028 17520 19579
11914 17834 33989
2199 5502 7184
22 20701 26497
5551 27014 32876
4019 26547 28521
7580 10016 33855
4328 11674 34018
8491 9956 10029
6167 11267 24914
5317 9049 29657
20717 28724 33012
16841 21647 31096
11931 16278 20287
9402 10557 11008
11826 15349 34420
14369 17031 20597
19164 27947 29775
15537 18796 33662
5404 21027 26757
6269 12671 24309
8601 29048 29262
10099 20323 21457
15952 17074 30434
7597 20987 33095
11298 24182 29217
12055 16250 16971
5350 9354 31390
8168 14168 18570

-continued

| |
|---|
| 5448 13141 32381 |
| 3921 21113 28176 |
| 8756 19895 27917 |
| 9391 16617 25586 |
| 3357 18527 34238 |
| 2378 16840 28948 |
| 7470 27466 32928 |
| 8366 19376 30916 |
| 3116 7267 18016 |
| 15309 18445 21799 |
| 4731 23773 34546 |
| 260 4898 5180 |
| 8897 22266 29587 |
| 2539 23717 33142 |
| 19233 28750 29724 |
| 9937 15384 16599 |
| 10234 17089 26776 |
| 8869 9425 13658 |
| 6197 24086 31929 |
| 9237 20931 27785 |
| 10403 13822 16734 |
| 20038 21196 26868 |
| 13170 27813 28875 |
| 1110 20329 24508 |
| 11844 22662 28987 |
| 2891 2918 14512 |
| 15707 27399 34135 |
| 8687 20019 26178 |
| 6847 8903 16307 |
| 23737 23775 27776 |
| 17388 27970 31983. |

A fifth transmission method according to the present technology is a transmission method including: an encoding step of performing LDPC encoding on the basis of a check matrix of an LDPC code with a code length N of 69120 bits and an encoding rate r of 10/16; a group-wise interleaving step of performing group-wise interleaving of interleaving the LDPC code in units of bit groups of 360 bits; and a mapping step of mapping the LDPC code in any one of 4096 signal points of 1D-non-uniform constellation (NUC) of 4096 QAM in units of 12 bits, in which in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 113, 23, 166, 150, 133, 130, 38, 18, 71, 115, 111, 44, 135, 11, 98, 96, 67, 114, 112, 87, 146, 119, 28, 86, 120, 49, 175, 14, 30, 144, 53, 165, 162, 128, 108, 39, 116, 158, 62, 110, 83, 93, 118, 80, 88, 173, 157, 102, 177, 132, 174, 59, 106, 34, 64, 22, 4, 29, 97, 155, 109, 9, 107, 92, 36, 24, 161, 50, 21, 137, 17, 43, 58, 124, 31, 37, 172, 100, 178, 129, 79, 160, 167, 32, 181, 154, 7, 183, 90, 54, 68, 191, 156, 104, 147, 10, 65, 81, 134, 169, 142, 57, 171, 78, 48, 47, 5, 40, 46, 51, 151, 77, 1, 72, 164, 152, 70, 141, 2, 89, 13, 182, 85, 52, 41, 66, 75, 63, 185, 148, 179, 138, 61, 73, 180, 189, 76, 84, 8, 27, 184, 105, 42, 69, 153, 188, 19, 131, 121, 26, 159, 45, 16, 186, 25, 176, 82, 103, 163, 99, 101, 122, 187, 20, 136, 126, 168, 145, 6, 91, 55, 117, 35, 56, 143, 140, 190, 125, 127, 74, 95, 94, 12, 149, 33, 0, 139, 3, 123, 170, 15, 60, the LDPC code includes information bits and parity bits, the check matrix includes an information matrix portion corresponding to the information bits and a parity matrix portion corresponding to the parity bits, the information matrix portion is represented by a check matrix initial value table, and the check matrix initial value table is a table representing positions of elements of 1's of the information matrix portion every 360 columns, and is

| |
|---|
| 200 588 3305 4771 6288 8400 11092 11126 14245 14255 17022 17190 19241 20350 20451 21069 25243 |
| 80 2914 4126 5426 6129 7790 9546 12909 14660 17357 18278 19612 21168 22367 23314 24801 24907 |
| 1216 2713 4897 6540 7016 7787 8321 9717 9934 12295 18749 20344 21386 21682 21735 24205 24825 |
| 6784 8163 8691 8743 10045 10319 10767 11141 11756 12004 12463 13407 14682 15458 20771 21060 22914 |
| 463 1260 1897 2128 2908 5157 7851 14177 16187 17463 18212 18221 19212 21864 24198 25318 25450 |
| 794 835 1163 4551 4597 5792 6092 7809 8576 8862 10986 12164 13053 14459 15978 23829 25072 |
| 144 4258 4342 7326 8165 9627 11432 12552 17582 17621 18145 19201 19372 19718 21036 25147 25774 |
| 617 2639 2749 2898 3414 4305 4802 6183 8551 9850 13679 20759 22501 24244 24331 24631 25587 |
| 1622 2258 4257 6069 10343 10642 11003 12520 13993 17086 18236 18522 24679 25361 25371 25595 |
| 1826 3926 5021 5905 6192 6839 7678 9136 9188 9716 10986 11191 12551 14648 16169 16234 |
| 2175 2396 2473 8548 9753 12115 12208 13469 15438 16985 19350 20424 |

-continued 21357 22819 22830 25671
265 397 6675 7152 8074 13030 13161 13336 15843 16917 17930 18014 18660
19218 22236 24940
5744 6883 7780 7839 8485 10016 10548 12131 12158 16211 16793 18749
20570 21757 22255 24489
2082 4768 7025 8803 10237 10932 13885 14266 14370 14982 16411 18443
18773 19570 21420 23311
1040 1376 2823 2998 3789 6636 7755 9819 13705 13868 14176 16202 16247
24943 25196 25489
223 1967 3289 4541 7420 9881 11086 12868 13550 14760 15434 18287 19098
20909 22905 25887
1906 2049 2147 2756 2845 4773 8337 8832 9363 12375 13651 16366 17546
20486 21624 22664
1619 1955 2393 3078 3208 3593 5246 8565 10956 11335 11865 14837 15006
15544 18820 22687
2086 3409 3586 4269 6587 8650 10165 11241 15624 16728 17814 18392 18667
19859 21132 25339
382 1160 1912 3700 3783 12069 14672 16842 18053 19626 20724 21244 21792 22679
23873 24517
1217 1486 5139 6774 7413 10622 11571 11697 13406 13487 20713 22436
22610 22806 23522 23632
1225 2927 6221 6247 8197 9322 11826 11948 12230 13899 15820 16791 17444
23155 24543 24650
1056 2975 6018 7698 7736 7940 11870 12964 17498 17577 19541 20124 20705
22693 23151 25627
658 790 1559 3683 6060 9059 12347 12990 13095 16317 17801 18816 20050
20979 23584 25472
1133 3343 6895 7146 7261 8340 9115 11248 14543 16030 16291 17972 22369
22479 24388 25280
1907 4021 8277 17631
7807 8063 10076 24958
5455 8638 13801 18832
15525 24030 24978
7854 21083 21197
8416 15614 24639
9382 13998 24091
1244 19468 24804
5100 14187 21263
12267 18441 22757
185 23294 23412
5136 24218 25509
6159 12323 19472
7490 9770 19813
1457 2204 4186
14200 15609 18700
4544 6337 17759
3697 13810 14537
10853 16611 23001
504 12709 23116
1338 21523 22880
1098 8530 23846
13699 19776 25783
3299 3629 16222
1821 2402 12416
11177 20793 24292
21580 24038 24094
11769 13819 13950
5388 9428 13527
20320 23996 24752
2923 14906 18768
911 10059 17607
1535 3090 22968
3398 8243 12265
9801 10001 20184
11839 15703 16757
1834 13797 14101
4469 11503 14694
4047 8684 23737
15682 21342 21898
7345 8077 22245
4108 20676 24406
8787 19625 22194
8536 15518 20879
3339 15738 19592
2916 13483 23680
3853 12107 18338
16962 21265 25429
10181 18667 25563
2867 21873 23535

-continued 8601 19728 23807
4484 17647 22060
6457 17641 23777
17432 18680 20224
3046 14453 19429
807 2064 12639
17630 20286 21847
13703 13720 24044
8382 9588 10339
18818 23311 24714
5397 13213 24988
4077 9348 21707
10628 15352 21292
1075 7625 18287
5771 20506 20926
13545 18180 21566
12022 19203 25134
86 12306 20066
7797 10752 15305
2986 4186 9128
9099 17285 24986
3530 17904 21836
2283 20216 25272
22562 24667 25143
1673 3837 5198
4188 13181 22061
17800 20341 22591
3466 4433 24958
145 7746 23940
4718 15618 19372
2735 11877 13719
3560 6483 10536
4167 7567 8558
4511 5862 16331
3268 6965 25578
5552 20627 24489
1425 2331 4414
3352 12606 19595
4653 8383 20029
9163 22097 24174
7324 16151 20228
280 4353 25404
5173 7657 25604
6910 13531 22225
18274 19994 21778.

A fifth reception device according to the present technology is a reception device including a group-wise deinterleaving unit that returns an arrangement of an LDPC code after group-wise interleaving which is obtained from data transmitted from a transmission device to an original arrangement, in which the transmission device includes: an encoding unit that performs LDPC encoding on the basis of a check matrix of the LDPC code with a code length N of 69120 bits and an encoding rate r of 10/16; a group-wise interleaving unit that performs group-wise interleaving of interleaving the LDPC code in units of bit groups of 360 bits; and a mapping unit that maps the LDPC code in any one of 4096 signal points of 1D-non-uniform constellation (NUC) of 4096 QAM in units of 12 bits, in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 113, 23, 166, 150, 133, 130, 38, 18, 71, 115, 111, 44, 135, 11, 98, 96, 67, 114, 112, 87, 146, 119, 28, 86, 120, 49, 175, 14, 30, 144, 53, 165, 162, 128, 108, 39, 116, 158, 62, 110, 83, 93, 118, 80, 88, 173, 157, 102, 177, 132, 174, 59, 106, 34, 64, 22, 4, 29, 97, 155, 109, 9, 107, 92, 36, 24, 161, 50, 21, 137, 17, 43, 58, 124, 31, 37, 172, 100, 178, 129, 79, 160, 167, 32, 181, 154, 7, 183, 90, 54, 68, 191, 156, 104, 147, 10, 65, 81, 134, 169, 142, 57, 171, 78, 48, 47, 5, 40, 46, 51, 151, 77, 1, 72, 164, 152, 70, 141, 2, 89, 13, 182, 85, 52, 41, 66, 75, 63, 185, 148, 179, 138, 61, 73, 180, 189, 76, 84, 8, 27, 184, 105, 42, 69, 153, 188, 19, 131, 121, 26, 159, 45, 16, 186, 25, 176, 82, 103, 163, 99, 101, 122, 187, 20, 136, 126, 168, 145, 6, 91, 55, 117, 35, 56, 143, 140, 190, 125, 127, 74, 95, 94, 12, 149, 33, 0, 139, 3, 123, 170, 15, 60, the LDPC code includes information bits and parity bits, the check matrix includes an information matrix portion corresponding to the information bits and a parity matrix portion corresponding to the parity bits, the information matrix portion is represented by a check matrix initial value table, and the check matrix initial value table is a table representing positions of elements of 1's of the information matrix portion every 360 columns, and is 200 588 3305 4771 6288 8400 11092 11126 14245 14255 17022 17190 19241
20350 20451 21069 25243
80 2914 4126 5426 6129 7790 9546 12909 14660 17357 18278 19612 21168
22367 23314 24801 24907
1216 2713 4897 6540 7016 7787 8321 9717 9934 12295 18749 20344 21386

-continued 21682 21735 24205 24825
6784 8163 8691 8743 10045 10319 10767 11141 11756 12004 12463 13407
14682 15458 20771 21060 22914
463 1260 1897 2128 2908 5157 7851 14177 16187 17463 18212 18221 19212
21864 24198 25318 25450
794 835 1163 4551 4597 5792 6092 7809 8576 8862 10986 12164 13053 14459
15978 23829 25072
144 4258 4342 7326 8165 9627 11432 12552 17582 17621 18145 19201 19372
19718 21036 25147 25774
617 2639 2749 2898 3414 4305 4802 6183 8551 9850 13679 20759 22501
24244 24331 24631 25587
1622 2258 4257 6069 10343 10642 11003 12520 13993 17086 18236 18522
24679 25361 25371 25595
1826 3926 5021 5905 6192 6839 7678 9136 9188 9716 10986 11191 12551
14648 16169 16234
2175 2396 2473 8548 9753 12115 12208 13469 15438 16985 19350 20424
21357 22819 22830 25671
265 397 6675 7152 8074 13030 13161 13336 15843 16917 17930 18014 18660
19218 22236 24940
5744 6883 7780 7839 8485 10016 10548 12131 12158 16211 16793 18749
20570 21757 22255 24489
2082 4768 7025 8803 10237 10932 13885 14266 14370 14982 16411 18443
18773 19570 21420 23311
1040 1376 2823 2998 3789 6636 7755 9819 13705 13868 14176 16202 16247
24943 25196 25489
223 1967 3289 4541 7420 9881 11086 12868 13550 14760 15434 18287 19098
20909 22905 25887
1906 2049 2147 2756 2845 4773 8337 8832 9363 12375 13651 16366 17546
20486 21624 22664
1619 1955 2393 3078 3208 3593 5246 8565 10956 11335 11865 14837 15006
15544 18820 22687
2086 3409 3586 4269 6587 8650 10165 11241 15624 16728 17814 18392 18667
19859 21132 25339
382 1160 1912 3700 3783 12069 14672 16842 18053 19626 20724 21244 21792
22679 23873 24517
1217 1486 5139 6774 7413 10622 11571 11697 13406 13487 20713 22436
22610 22806 23522 23632
1225 2927 6221 6247 8197 9322 11826 11948 12230 13899 15820 16791 17444
23155 24543 24650
1056 2975 6018 7698 7736 7940 11870 12964 17498 17577 19541 20124 20705
22693 23151 25627
658 790 1559 3683 6060 9059 12347 12990 13095 16317 17801 18816 20050
20979 23584 25472
1133 3343 6895 7146 7261 8340 9115 11248 14543 16030 16291 17972 22369
22479 24388 25280
1907 4021 8277 17631
7807 8063 10076 24958
5455 8638 13801 18832
15525 24030 24978
7854 21083 21197
8416 15614 24639
9382 13998 24091
1244 19468 24804
5100 14187 21263
12267 18441 22757
185 23294 23412
5136 24218 25509
6159 12323 19472
7490 9770 19813
1457 2204 4186
14200 15609 18700
4544 6337 17759
3697 13810 14537
10853 16611 23001
504 12709 23116
1338 21523 22880
1098 8530 23846
13699 19776 25783
3299 3629 16222
1821 2402 12416
11177 20793 24292
21580 24038 24094
11769 13819 13950
5388 9428 13527
20320 23996 24752
2923 14906 18768
911 10059 17607
1535 3090 22968
3398 8243 12265

-continued 9801 10001 20184
11839 15703 16757
1834 13797 14101
4469 11503 14694
4047 8684 23737
15682 21342 21898
7345 8077 22245
4108 20676 24406
8787 19625 22194
8536 15518 20879
3339 15738 19592
2916 13483 23680
3853 12107 18338
16962 21265 25429
10181 18667 25563
2867 21873 23535
8601 19728 23807
4484 17647 22060
6457 17641 23777
17432 18680 20224
3046 14453 19429
807 2064 12639
17630 20286 21847
13703 13720 24044
8382 9588 10339
18818 23311 24714
5397 13213 24988
4077 9348 21707
10628 15352 21292
1075 7625 18287
5771 20506 20926
13545 18180 21566
12022 19203 25134
86 12306 20066
7797 10752 15305
2986 4186 9128
9099 17285 24986
3530 17904 21836
2283 20216 25272
22562 24667 25143
1673 3837 5198
4188 13181 22061
17800 20341 22591
3466 4433 24958
145 7746 23940
4718 15618 19372
2735 11877 13719
3560 6483 10536
4167 7567 8558
4511 5862 16331
3268 6965 25578
5552 20627 24489
1425 2331 4414
3352 12606 19595
4653 8383 20029
9163 22097 24174
7324 16151 20228
280 4353 25404
5173 7657 25604
6910 13531 22225
18274 19994 21778.

A sixth transmission method according to the present technology is a transmission method including: an encoding step of performing LDPC encoding on the basis of a check matrix of an LDPC code with a code length N of 69120 bits and an encoding rate r of 12/16; a group-wise interleaving step of performing group-wise interleaving of interleaving the LDPC code in units of bit groups of 360 bits; and a mapping step of mapping the LDPC code in any one of 4096 signal points of 1D-non-uniform constellation (NUC) of 4096 QAM in units of 12 bits, in which in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 131, 148, 141, 17, 53, 138, 45, 97, 112, 111, 77, 184, 129, 135, 27, 122, 2, 123, 156, 128, 80, 116, 40, 89, 84, 41, 105, 42, 39, 187, 145, 18, 54, 44, 183, 57, 136, 13, 65, 162, 51, 178, 59, 104, 163, 70, 87, 152, 94, 126, 23, 169, 9, 179, 177, 139, 130, 38, 35, 20, 86, 180, 48, 108, 47, 133, 167, 75, 168, 25, 67, 185, 91, 165, 157, 158, 110, 127, 82, 58, 50, 64, 76, 31, 159, 8, 79, 78, 146, 71, 69, 3, 36, 155, 160, 21, 29, 49, 28, 150, 81, 154, 149, 182, 24, 30, 72, 109, 173, 33, 113, 43, 55, 189, 132, 176, 120, 172, 166, 143, 90, 125, 7, 5, 66, 12, 98, 83, 10, 62, 11, 175, 85, 0, 63, 181, 188, 74, 171, 117, 106, 61, 153, 174, 147, 93, 190, 34, 142, 100, 6, 1, 140, 191, 161, 19, 151, 14, 73, 99, 121, 119, 92, 95, 115, 118, 186, 60, 144, 22, 32, 52, 164, 15, 88, 46, 114, 101, 124, 26, 96, 4, 107, 103, 16, 37, 102, 56, 170, 68, 134, 137, the LDPC code includes information bits and parity bits, the check matrix includes an information matrix portion corresponding to the information bits and a parity matrix portion corresponding to the parity bits, the information matrix portion is represented by a check matrix initial value table, and the check matrix initial value table is a table representing positions of elements of 1's of the information matrix portion every 360 columns, and is 1507 1536 2244 4721 6374 7839 11001 12684 13196 13602 14245 14383 14398
16182 17248
623 696 1186 1370 4409 5237 5911 8278 9539 12139 12810 13422 15525
16232 16252
530 1953 3745 5512 6676 9069 9433 10683 11530 12263 12519 14931 15326
15581 16208
273 685 3132 5872 6388 7149 7316 7367 9041 11102 11211 12059 15189
15973 16435
814 1297 1896 6018 7801 8810 9701 9992 10314 13618 13771 14934 15198
16340 16742
58 803 2553 3967 6032 8374 9168 10047 10073 10909 12701 12748 13543
14111 17043
1082 1577 2108 2344 5035 5051 10038 10356 12156 12308 13815 15453 15830
16305 17234
1882 3731 5182 5554 6330 6605 7126 10195 10508 12151 12191 12241 12288
13755 16472
85 604 1278 3768 4831 6820 9471 10773 10873 12785 12973 13623 14562
14697 16811
928 1864 6027 7023 7644 8279 8580 9221 9417 9883 12032 12483 12734
14335 15842
2104 2752 4530 4820 5662 9197 9464 9972 10057 11079 12408 13005 13684
15507 16295
82 752 3374 4026 7265 8112 12236 12434 12460 13110 13495 15110 15299
15359 17221
1137 1411 1546 1614 1835 6053 6151 8618 9059 14057 14941 15670 16321
16965
447 1960 2369 2861 3047 3508 4077 4358 4370 5806 12517 13658 14371
14749
420 981 1657 2313 3353 4699 5094 5184 10076 10530 11521 13040 15960
16853
3572 3851 3870 5218 6400 6780 9167 9603 10328 10543 12892 13722 16910
16929
203 2588 4522 4692 5399 6840 7417 8896 9045 9188 10390 12507 12615
16386
543 1262 2536 4358 7658 7714 9392 11079 12283 12694 14734 16195 16317
16751
905 1059 3393 4347 4554 4758 5568 8652 9991 10717 10975 11146 12824
16373
1229 2308 4876 5329 5424 5906 6227 6667 7141 7697 12055 12969 13582
16638
697 1864 2560 4190 5097 5288 6565 9150 9282 9519 10727 12492 13292
16924
363 3152 3715 3722 4582 5050 8399 9413 9851 10305 12116 13471 15318
16018
338 2342 2404 4733 6189 6792 7251 7921 8509 8579 8729 11921 12900 15546
1630 1867 2018 3038 3202 6364 7648 8692 9496 9705 10433 13508 14583
16341
1041 2754 3015 3427 3512 4351 5174 6539 8100 8639 9912 11911 12666
14187
1134 1619 4758 5545 6842 7045 8421 10373 10390 12672 13484 15178 16697
16727
589 652 1174 2157 3951 4733 5278 5859 7619 9488 11665 12335 15516 16024
1457 1832 2525 3690 5093 6000 6276 7974 8652 9759 10434 15025 15267
16448
932 3328 3349 3511 4776 6266 6711 7761 8674 9748 11167 12134 12942
14354
1939 1979 3141 4238 6715 7148 7673 12025 12455 14829 14989 15081 16491
17242
1363 2451
1953 10230
6218 7655
9302 15856
10461 10503
9005 16075
878 14223 15181
3535 5327 14405
8116 8396 9828
2864 6306 14832
24 11009 16377
7064 11014 16139
4318 8353 14997
583 5626 10217
11196 13669 16585
6123 7518 9304
2258 8250 12082

-continued 7564 14195 15236
10104 10233 13778
2044 7801 11705
10906 11443 13227
1592 7853 14796
3054 8887 13077
6486 7003 9238
424 9055 13390
618 4077 11120
11159 13405 16070
2927 8689 17210
723 5842 12062
4817 9269 10820
208 6947 12903
2987 10116 11520
3522 6321 15637
148 3087 12764
262 1613 14121
7236 10798 11759
3193 4958 11292
7537 12439 15202
8000 9580 17269
9665 9691 15654
5946 14246 16040
4283 8145 10944
1082 1829 11267
1272 6119 13182
20 11943 14128
4591 8403 16530
2212 13724 13933
2079 10365 14633
1269 11307 16370
2467 4744 10714
6256 7915 9724
8799 11433 16880
459 6799 10102
3795 6930 13350
1295 13018 14967
3542 7310 10974
6905 15080 16105
2673 3143 12349
4698 4801 14770
7512 15844 15965
3276 4069 10099
1893 4676 6679
1985 7244 10163
6333 12760 12912
852 5954 11771
6958 9242 10613
5651 10089 12309
4124 7455 13224
503 6787 10720
10594 12717 14007
4501 5311 8067
4507 5620 13932
9133 11025 13866
5021 16201 16217
6166 7438 17185
1324 5671 11586
2266 6335 7716
512 9515 11595
869 6096 13886
10049 12536 14474
470 8286 8306
1268 5478 6424
8178 8817 14506
11460 15128 16761
6364 10121 16806
9347 15211 16915
1587 3591 15546
17 4132 17071
1677 8810 15764
3862 7633 13685
3855 11931 12792
2652 13909 17080
5581 13919 16126
7129 8976 11152
6662 7845 13424
9751 9965 13847

-continued

| |
|---|
| 3662 9308 9534 |
| 4283 7474 7682 |
| 2418 8774 13433 |
| 508 3864 6859 |
| 12098 13920 15326 |
| 1129 3271 16892 |
| 5072 8819 10323 |
| 4749 4984 6390 |
| 212 13603 14893 |
| 4966 8895 9320 |
| 1012 3677 5711 |
| 6654 9969 15178 |
| 4596 5147 5905 |
| 1541 4149 15594 |
| 8005 8604 15147 |
| 2519 10882 11961 |
| 190 8417 13600 |
| 3543 4639 14618. |

A sixth reception device according to the present technology is a reception device including a group-wise deinterleaving unit that returns an arrangement of an LDPC code after group-wise interleaving which is obtained from data transmitted from a transmission device to an original arrangement, in which the transmission device includes: an encoding unit that performs LDPC encoding on the basis of a check matrix of the LDPC code with a code length N of 69120 bits and an encoding rate r of 12/16; a group-wise interleaving unit that performs group-wise interleaving of interleaving the LDPC code in units of bit groups of 360 bits; and a mapping unit that maps the LDPC code in any one of 4096 signal points of 1D-non-uniform constellation (NUC) of 4096 QAM in units of 12 bits, in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 131, 148, 141, 17, 53, 138, 45, 97, 112, 111, 77, 184, 129, 135, 27, 122, 2, 123, 156, 128, 80, 116, 40, 89, 84, 41, 105, 42, 39, 187, 145, 18, 54, 44, 183, 57, 136, 13, 65, 162, 51, 178, 59, 104, 163, 70, 87, 152, 94, 126, 23, 169, 9, 179, 177, 139, 130, 38, 35, 20, 86, 180, 48, 108, 47, 133, 167, 75, 168, 25, 67, 185, 91, 165, 157, 158, 110, 127, 82, 58, 50, 64, 76, 31, 159, 8, 79, 78, 146, 71, 69, 3, 36, 155, 160, 21, 29, 49, 28, 150, 81, 154, 149, 182, 24, 30, 72, 109, 173, 33, 113, 43, 55, 189, 132, 176, 120, 172, 166, 143, 90, 125, 7, 5, 66, 12, 98, 83, 10, 62, 11, 175, 85, 0, 63, 181, 188, 74, 171, 117, 106, 61, 153, 174, 147, 93, 190, 34, 142, 100, 6, 1, 140, 191, 161, 19, 151, 14, 73, 99, 121, 119, 92, 95, 115, 118, 186, 60, 144, 22, 32, 52, 164, 15, 88, 46, 114, 101, 124, 26, 96, 4, 107, 103, 16, 37, 102, 56, 170, 68, 134, 137, the LDPC code includes information bits and parity bits, the check matrix includes an information matrix portion corresponding to the information bits and a parity matrix portion corresponding to the parity bits, the information matrix portion is represented by a check matrix initial value table, and the check matrix initial value table is a table representing positions of elements of 1's of the information matrix portion every 360 columns, and is

| |
|---|
| 1507 1536 2244 4721 6374 7839 11001 12684 13196 13602 14245 14383 14398 16182 17248 |
| 623 696 1186 1370 4409 5237 5911 8278 9539 12139 12810 13422 15525 16232 16252 |
| 530 1953 3745 5512 6676 9069 9433 10683 11530 12263 12519 14931 15326 15581 16208 |
| 273 685 3132 5872 6388 7149 7316 7367 9041 11102 11211 12059 15189 15973 16435 |
| 814 1297 1896 6018 7801 8810 9701 9992 10314 13618 13771 14934 15198 16340 16742 |
| 58 803 2553 3967 6032 8374 9168 10047 10073 10909 12701 12748 13543 14111 17043 |
| 1082 1577 2108 2344 5035 5051 10038 10356 12156 12308 13815 15453 15830 16305 17234 |
| 1882 3731 5182 5554 6330 6605 7126 10195 10508 12151 12191 12241 12288 13755 16472 |
| 85 604 1278 3768 4831 6820 9471 10773 10873 12785 12973 13623 14562 14697 16811 |
| 928 1864 6027 7023 7644 8279 8580 9221 9417 9883 12032 12483 12734 14335 15842 |
| 2104 2752 4530 4820 5662 9197 9464 9972 10057 11079 12408 13005 13684 15507 16295 |
| 82 752 3374 4026 7265 8112 12236 12434 12460 13110 13495 15110 15299 15359 17221 |
| 1137 1411 1546 1614 1835 6053 6151 8618 9059 14057 14941 15670 16321 16965 |
| 447 1960 2369 2861 3047 3508 4077 4358 4370 5806 12517 13658 14371 14749 |
| 420 981 1657 2313 3353 4699 5094 5184 10076 10530 11521 13040 15960 16853 |
| 3572 3851 3870 5218 6400 6780 9167 9603 10328 10543 12892 13722 16910 16929 |
| 203 2588 4522 4692 5399 6840 7417 8896 9045 9188 10390 12507 12615 16386 |
| 543 1262 2536 4358 7658 7714 9392 11079 12283 12694 14734 16195 16317 16751 |
| 905 1059 3393 4347 4554 4758 5568 8652 9991 10717 10975 11146 12824 16373 |
| 1229 2308 4876 5329 5424 5906 6227 6667 7141 7697 12055 12969 13582 16638 |
| 697 1864 2560 4190 5097 5288 6565 9150 9282 9519 10727 12492 13292 16924 |
| 363 3152 3715 3722 4582 5050 8399 9413 9851 10305 12116 13471 15318 16018 |
| 338 2342 2404 4733 6189 6792 7251 7921 8509 8579 8729 11921 12900 15546 |
| 1630 1867 2018 3038 3202 6364 7648 8692 9496 9705 10433 13508 14583 16341 |
| 1041 2754 3015 3427 3512 4351 5174 6539 8100 8639 9912 11911 12666 14187 |
| 1134 1619 4758 5545 6842 7045 8421 10373 10390 12672 13484 15178 16697 16727 |
| 589 652 1174 2157 3951 4733 5278 5859 7619 9488 11665 12335 15516 16024 |
| 1457 1832 2525 3690 5093 6000 6276 7974 8652 9759 10434 15025 15267 16448 |
| 932 3328 3349 3511 4776 6266 6711 7761 8674 9748 11167 12134 12942 14354 |
| 1939 1979 3141 4238 6715 7148 7673 12025 12455 14829 14989 15081 16491 17242 |
| 1363 2451 |
| 1953 10230 |

-continued 6218 7655
9302 15856
10461 10503
9005 16075
878 14223 15181
3535 5327 14405
8116 8396 9828
2864 6306 14832
24 11009 16377
7064 11014 16139
4318 8353 14997
583 5626 10217
11196 13669 16585
6123 7518 9304
2258 8250 12082
7564 14195 15236
10104 10233 13778
2044 7801 11705
10906 11443 13227
1592 7853 14796
3054 8887 13077
6486 7003 9238
424 9055 13390
618 4077 11120
11159 13405 16070
2927 8689 17210
723 5842 12062
4817 9269 10820
208 6947 12903
2987 10116 11520
3522 6321 15637
148 3087 12764
262 1613 14121
7236 10798 11759
3193 4958 11292
7537 12439 15202
8000 9580 17269
9665 9691 15654
5946 14246 16040
4283 8145 10944
1082 1829 11267
1272 6119 13182
20 11943 14128
4591 8403 16530
2212 13724 13933
2079 10365 14633
1269 11307 16370
2467 4744 10714
6256 7915 9724
8799 11433 16880
459 6799 10102
3795 6930 13350
1295 13018 14967
3542 7310 10974
6905 15080 16105
2673 3143 12349
4698 4801 14770
7512 15844 15965
3276 4069 10099
1893 4676 6679
1985 7244 10163
6333 12760 12912
852 5954 11771
6958 9242 10613
5651 10089 12309
4124 7455 13224
503 6787 10720
10594 12717 14007
4501 5311 8067
4507 5620 13932
9133 11025 13866
5021 16201 16217
6166 7438 17185
1324 5671 11586
2266 6335 7716
512 9515 11595
869 6096 13886
10049 12536 14474
470 8286 8306

-continued 1268 5478 6424
8178 8817 14506
11460 15128 16761
6364 10121 16806
9347 15211 16915
1587 3591 15546
17 4132 17071
1677 8810 15764
3862 7633 13685
3855 11931 12792
2652 13909 17080
5581 13919 16126
7129 8976 11152
6662 7845 13424
9751 9965 13847
3662 9308 9534
4283 7474 7682
2418 8774 13433
508 3864 6859
12098 13920 15326
1129 3271 16892
5072 8819 10323
4749 4984 6390
212 13603 14893
4966 8895 9320
1012 3677 5711
6654 9969 15178
4596 5147 5905
1541 4149 15594
8005 8604 15147
2519 10882 11961
190 8417 13600
3543 4639 14618.

A seventh transmission method according to the present technology is a transmission method including: an encoding step of performing LDPC encoding on the basis of a check matrix of an LDPC code with a code length N of 69120 bits and an encoding rate r of 14/16; a group-wise interleaving step of performing group-wise interleaving of interleaving the LDPC code in units of bit groups of 360 bits; and a mapping step of mapping the LDPC code in any one of 4096 signal points of 1D-non-uniform constellation (NUC) of 4096 QAM in units of 12 bits, in which in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 93, 61, 37, 170, 63, 60, 135, 5, 158, 47, 65, 179, 76, 182, 72, 20, 104, 7, 181, 11, 117, 152, 184, 172, 143, 92, 109, 177, 191, 119, 132, 1, 98, 10, 148, 35, 126, 9, 18, 70, 190, 38, 66, 54, 62, 122, 100, 3, 2, 189, 144, 153, 165, 14, 154, 44, 161, 113, 147, 12, 90, 167, 112, 34, 39, 139, 142, 41, 159, 149, 82, 131, 88, 106, 138, 105, 55, 163, 71, 168, 80, 96, 108, 40, 50, 25, 114, 79, 103, 141, 151, 69, 74, 110, 36, 24, 67, 145, 26, 8, 56, 180, 13, 17, 134, 28, 129, 185, 85, 121, 137, 136, 68, 86, 188, 0, 124, 120, 127, 32, 94, 83, 133, 97, 31, 58, 33, 57, 166, 162, 183, 186, 81, 111, 19, 107, 155, 42, 84, 6, 43, 130, 48, 123, 64, 78, 53, 173, 95, 75, 45, 174, 178, 160, 15, 187, 102, 23, 150, 156, 101, 99, 91, 157, 128, 175, 59, 125, 22, 46, 115, 164, 52, 16, 21, 30, 176, 146, 51, 116, 87, 140, 77, 73, 89, 169, 4, 171, 27, 49, 29, 118, the LDPC code includes information bits and parity bits, the check matrix includes an information matrix portion corresponding to the information bits and a parity matrix portion corresponding to the parity bits, the information matrix portion is represented by a check matrix initial value table, and the check matrix initial value table is a table representing positions of elements of 1's of the information matrix portion every 360 columns, and is 387 648 945 3023 3889 4856 5002 5167 6868 7477 7590 8165 8354
42 406 1279 1968 3016 4196 4599 4996 5019 6350 6785 7051 8529
534 784 1034 1160 2530 5033 5171 5469 6167 6372 6913 7718 8621
944 2506 2806 3149 3559 5101 6076 6083 6092 6147 6866 7908 8155
308 1869 1888 2569 3297 4742 5232 5442 6135 6814 7284 8238 8405
34 464 667 899 2421 3425 5382 6258 6373 6399 6489 7367 7922
2276 3014 3525 3829 4135 4276 4611 4733 4738 4956 6025 7152 8155
1047 1370 2406 2819 4600 4991 5017 5590 6199 6483 6556 6834 7760
66 380 2033 3698 4068 6096 6223 6238 6757 7541 7641 7677 8595
562 697 782 808 921 1703 3032 4300 7027 7481 7839 8160 8526
236 962 1557 2023 2135 2190 2892 3072 4523 6254 6838 7209 7381
196 1167 1179 1426 1675 1763 2345 2560 2613 5024 5761 6522 7973
512 822 1778 1924 2610 3445 4570 4805 5263 5299 8439 8448 8464
1923 2270 3204 3698 4456 4522 4601 5161 5207 6260 6310 6441 6851
104 281 622 1276 2172 2334 2731 3417 3854 4698 8095 8195 8333
451 528 1269 2169 2274 2393 3853 5002 5543 6121 6351 7364 8139
1685 2675 2790 2953 3103 3560 4336 5372 5495 5568 6429 6492 8206
604 1190 1279 2427 2714 3283 3312 3855 4566 6045 6664 6788 8317
338 917 1873 2102 2561 2655 4635 4765 5370 6249 6724 7668 8456
184 1166 1583 1859 2376 2521 3093 4181 4713 4926 5146 6070 8004
175 1227 2367 3402 3628 3982 4265 4282 4355 5972 6434 7280 7765
801 922 1029 1531 1606 3170 3824 4358 4732 4849 5225 6759 8183
509 1507 1704 1765 2183 2574 3271 4050 4299 4964 5968 6324 7091
567 795 1376 2390 2767 3424 5195 6355 6726 7607 8346 8352
308 1060 1973 2364 2937 3526 4221 4745 5185 5845 6146 7762
323 590 732 917 2636 3008 3792 3990 4322 4893 5211 8014
471 1249 1674 1841 2567 3124 3130 4885 5575 7521 7648 8227
1582 1669 1772 2386 3340 3387 3881 4322 6018 6055 6488 7177
976 1003 2127 3575 3816 6225 7404 7499 7542 8237 8421 8630
675 961 1957 3825 3858 4646 5248 5801 5940 6533 7040 8037
79 639 1363 1436 1763 2570 3874 4876 6870 6886 7104 8399
20 297 1330 2264 3287 3534 4441 4746 6569 6971 6976 8179
482 1125 1589 2892 3759 3871 4635 6038 6214 6796 6816 7621
1127 3336 3867 3929 4269 4794 5054 5842 6471 6547 7039 8560
217 1521
1983 8283
3731 4402
208 6703
242 4988
4170 5038
4108 8035
3301 8543

-continued 3168 8249
5028 5838
3470 8597
2901 5264
2505 4505
934 5117
1712 5819
3165 7273
3274 6115
4576 6330 7327
5380 6732 8439
2474 3723 7782
384 2783 5846
1453 4436 6625
3220 4261 4835
163 3117 7554
502 2119 4059
2200 4263 4930
2378 6294 7713
743 5501 6809
1364 6062 7808
4680 6468 7895
3469 3602 7304
1609 5386 5647
267 2921 3206
2565 3020 6269
1651 5224 5718
1128 5058 8579
286 3396 7660
1497 5171 6519
1894 6349 7924
1306 7744 8083
3096 3438 3836
2556 7409 8570
3273 4245 7935
1633 2023 3125
584 4914 6062
2015 2915 3435
1457 6366 6461
23 3576 8132
5322 6300 6520
5715 7113 7822
2044 5053 6607
63 5432 7850
5353 6355 8637
346 590 2648
4780 5997 6991
2556 2583 6537
661 2497 8350
7610 8307 8441
671 860 5986
1133 3158 5891
4360 5802 6547
4782 5688 6955
447 5030 6268
1501 5163 7232
1133 2743 3214
959 4100 7554
5712 7643 8385
1442 3180 8008
697 3078 8421
137 922 5123
597 2879 6340
824 2071 7882
1827 4411 5941
3846 5970 6398
1561 1580 7668
4335 6936 8042
4504 5309 6737
1846 3273 3333
272 4885 6718
1835 4761 6931
2141 3760 5129
3975 5012 6504
1258 2822 6030
242 4947 7668
559 6100 8425
1655 1962 4401
2369 2476 2765

-continued 114 156 3195
1651 4154 4448
4669 6064 7317
4988 5567 6697
2963 5578 5679
2064 2286 7790
289 4639 7582
1258 4312 5340
2428 4219 7268
1752 2321 6806
118 7302 8603
4170 4280 4445
2207 5067 7257
2 55 7413
1141 4791 7149
3407 5649 8075
2773 3198 3720
6970 7222 8633
2498 4764 5281
1048 2093 5031
2500 2851 8396
1694 3795 6666
2565 3343 4688
4228 4374 5947
2267 6745 7172
175 2662 3926
90 1517 6056
4069 5439 7648
1679 3394 4707
2136 4553 8265
482 2100 2302
3306 3729 8063
5263 7710 8240
1001 1335 4500
576 6736 7250
181 3601 3755
5899 7515 7714
1181 5332 7197
542 1150 1196
1386 2156 5873
656 3019 3213
263 1117 5957
4495 5904 6462
2547 2786 4215
4954 5848 6225
940 4478 7633
2124 3347 7069.

A seventh reception device according to the present technology is a reception device including a group-wise deinterleaving unit that returns an arrangement of an LDPC code after group-wise interleaving which is obtained from data transmitted from a transmission device to an original arrangement, in which the transmission device includes: an encoding unit that performs LDPC encoding on the basis of a check matrix of the LDPC code with a code length N of 69120 bits and an encoding rate r of 14/16; a group-wise interleaving unit that performs group-wise interleaving of interleaving the LDPC code in units of bit groups of 360 bits; and a mapping unit that maps the LDPC code in any one of 4096 signal points of 1D-non-uniform constellation (NUC) of 4096 QAM in units of 12 bits, in the group-wise interleaving, the (i+1)-th bit group from a lead of the LDPC code is set as a bit group i, and an arrangement of bit groups 0 to 191 of the 69120-bit LDPC code is interleaved into an arrangement of a bit group 93, 61, 37, 170, 63, 60, 135, 5, 158, 47, 65, 179, 76, 182, 72, 20, 104, 7, 181, 11, 117, 152, 184, 172, 143, 92, 109, 177, 191, 119, 132, 1, 98, 10, 148, 35, 126, 9, 18, 70, 190, 38, 66, 54, 62, 122, 100, 3, 2, 189, 144, 153, 165, 14, 154, 44, 161, 113, 147, 12, 90, 167, 112, 34, 39, 139, 142, 41, 159, 149, 82, 131, 88, 106, 138, 105, 55, 163, 71, 168, 80, 96, 108, 40, 50, 25, 114, 79, 103, 141, 151, 69, 74, 110, 36, 24, 67, 145, 26, 8, 56, 180, 13, 17, 134, 28, 129, 185, 85, 121, 137, 136, 68, 86, 188, 0, 124, 120, 127, 32, 94, 83, 133, 97, 31, 58, 33, 57, 166, 162, 183, 186, 81, 111, 19, 107, 155, 42, 84, 6, 43, 130, 48, 123, 64, 78, 53, 173, 95, 75, 45, 174, 178, 160, 15, 187, 102, 23, 150, 156, 101, 99, 91, 157, 128, 175, 59, 125, 22, 46, 115, 164, 52, 16, 21, 30, 176, 146, 51, 116, 87, 140, 77, 73, 89, 169, 4, 171, 27, 49, 29, 118, the LDPC code includes information bits and parity bits, the check matrix includes an information matrix portion corresponding to the information bits and a parity matrix portion corresponding to the parity bits, the information matrix portion is represented by a check matrix initial value table, and the check matrix initial value table is a table representing positions of elements of 1's of the information matrix portion every 360 columns, and is 387 648 945 3023 3889 4856 5002 5167 6868 7477 7590 8165 8354
42 406 1279 1968 3016 4196 4599 4996 5019 6350 6785 7051 8529
534 784 1034 1160 2530 5033 5171 5469 6167 6372 6913 7718 8621
944 2506 2806 3149 3559 5101 6076 6083 6092 6147 6866 7908 8155
308 1869 1888 2569 3297 4742 5232 5442 6135 6814 7284 8238 8405
34 464 667 899 2421 3425 5382 6258 6373 6399 6489 7367 7922
2276 3014 3525 3829 4135 4276 4611 4733 4738 4956 6025 7152 8155
1047 1370 2406 2819 4600 4991 5017 5590 6199 6483 6556 6834 7760
66 380 2033 3698 4068 6096 6223 6238 6757 7541 7641 7677 8595
562 697 782 808 921 1703 3032 4300 7027 7481 7839 8160 8526
236 962 1557 2023 2135 2190 2892 3072 4523 6254 6838 7209 7381
196 1167 1179 1426 1675 1763 2345 2560 2613 5024 5761 6522 7973
512 822 1778 1924 2610 3445 4570 4805 5263 5299 8439 8448 8464
1923 2270 3204 3698 4456 4522 4601 5161 5207 6260 6310 6441 6851
104 281 622 1276 2172 2334 2731 3417 3854 4698 8095 8195 8333
451 528 1269 2169 2274 2393 3853 5002 5543 6121 6351 7364 8139
1685 2675 2790 2953 3103 3560 4336 5372 5495 5568 6429 6492 8206
604 1190 1279 2427 2714 3283 3312 3855 4566 6045 6664 6788 8317
338 917 1873 2102 2561 2655 4635 4765 5370 6249 6724 7668 8456
184 1166 1583 1859 2376 2521 3093 4181 4713 4926 5146 6070 8004
175 1227 2367 3402 3628 3982 4265 4282 4355 5972 6434 7280 7765
801 922 1029 1531 1606 3170 3824 4358 4732 4849 5225 6759 8183
509 1507 1704 1765 2183 2574 3271 4050 4299 4964 5968 6324 7091
567 795 1376 2390 2767 3424 5195 6355 6726 7607 8346 8352
308 1060 1973 2364 2937 3526 4221 4745 5185 5845 6146 7762
323 590 732 917 2636 3008 3792 3990 4322 4893 5211 8014
471 1249 1674 1841 2567 3124 3130 4885 5575 7521 7648 8227
1582 1669 1772 2386 3340 3387 3881 4322 6018 6055 6488 7177
976 1003 2127 3575 3816 6225 7404 7499 7542 8237 8421 8630
675 961 1957 3825 3858 4646 5248 5801 5940 6533 7040 8037
79 639 1363 1436 1763 2570 3874 4876 6870 6886 7104 8399
20 297 1330 2264 3287 3534 4441 4746 6569 6971 6976 8179
482 1125 1589 2892 3759 3871 4635 6038 6214 6796 6816 7621
1127 3336 3867 3929 4269 4794 5054 5842 6471 6547 7039 8560
217 1521
1983 8283
3731 4402
208 6703
242 4988
4170 5038
4108 8035
3301 8543
3168 8249
5028 5838
3470 8597
2901 5264
2505 4505
934 5117
1712 5819
3165 7273
3274 6115
4576 6330 7327
5380 6732 8439
2474 3723 7782
384 2783 5846
1453 4436 6625
3220 4261 4835
163 3117 7554
502 2119 4059
2200 4263 4930
2378 6294 7713

-continued 743 5501 6809
1364 6062 7808
4680 6468 7895
3469 3602 7304
1609 5386 5647
267 2921 3206
2565 3020 6269
1651 5224 5718
1128 5058 8579
286 3396 7660
1497 5171 6519
1894 6349 7924
1306 7744 8083
3096 3438 3836
2556 7409 8570
3273 4245 7935
1633 2023 3125
584 4914 6062
2015 2915 3435
1457 6366 6461
23 3576 8132
5322 6300 6520
5715 7113 7822
2044 5053 6607
63 5432 7850
5353 6355 8637
346 590 2648
4780 5997 6991
2556 2583 6537
661 2497 8350
7610 8307 8441
671 860 5986
1133 3158 5891
4360 5802 6547
4782 5688 6955
447 5030 6268
1501 5163 7232
1133 2743 3214
959 4100 7554
5712 7643 8385
1442 3180 8008
697 3078 8421
137 922 5123
597 2879 6340
824 2071 7882
1827 4411 5941
3846 5970 6398
1561 1580 7668
4335 6936 8042
4504 5309 6737
1846 3273 3333
272 4885 6718
1835 4761 6931
2141 3760 5129
3975 5012 6504
1258 2822 6030
242 4947 7668
559 6100 8425
1655 1962 4401
2369 2476 2765
114 156 3195
1651 4154 4448
4669 6064 7317
4988 5567 6697
2963 5578 5679
2064 2286 7790
289 4639 7582
1258 4312 5340
2428 4219 7268
1752 2321 6806
118 7302 8603
4170 4280 4445
2207 5067 7257
2 55 7413
1141 4791 7149
3407 5649 8075
2773 3198 3720
6970 7222 8633
2498 4764 5281

-continued

| |
|---|
| 1048 2093 5031 |
| 2500 2851 8396 |
| 1694 3795 6666 |
| 2565 3343 4688 |
| 4228 4374 5947 |
| 2267 6745 7172 |
| 175 2662 3926 |
| 90 1517 6056 |
| 4069 5439 7648 |
| 1679 3394 4707 |
| 2136 4553 8265 |
| 482 2100 2302 |
| 3306 3729 8063 |
| 5263 7710 8240 |
| 1001 1335 4500 |
| 576 6736 7250 |
| 181 3601 3755 |
| 5899 7515 7714 |
| 1181 5332 7197 |
| 542 1150 1196 |
| 1386 2156 5873 |
| 656 3019 3213 |
| 263 1117 5957 |
| 4495 5904 6462 |
| 2547 2786 4215 |
| 4954 5848 6225 |
| 940 4478 7633 |
| 2124 3347 7069. |

In the first transmission method according to the present technology, the LDPC encoding is performed on the basis of the check matrix of the LDPC code with a code length N of 69120 bits and an encoding rate r of 2/16, and the group-wise interleaving of interleaving the LDPC code in units of a bit group of 360 bits is performed. Then, the LDPC code is mapped to any one of 4096 signal points of 1D-non-uniform constellation (NUC) of 4096 QAM in units of 12 bits. In the group-wise interleaving, the (i+1)-th bit group from the lead of the LDPC code is set as a bit group i, and the arrangement of bit groups 0 to 191 of the 69120-bit LDPC code is interleaved into the arrangement of the bit group 166, 161, 43, 77, 177, 54, 162, 185, 127, 62, 6, 64, 30, 12, 27, 89, 130, 116, 190, 28, 38, 135, 149, 164, 48, 173, 175, 71, 132, 68, 5, 111, 158, 24, 59, 26, 145, 118, 51, 37, 178, 69, 189, 163, 133, 98, 53, 29, 169, 188, 17, 180, 155, 73, 45, 22, 107, 104, 76, 143, 70, 88, 99, 124, 126, 34, 80, 10, 168, 66, 72, 123, 63, 140, 176, 49, 65, 50, 52, 122, 4, 181, 121, 57, 18, 101, 42, 179, 100, 157, 165, 106, 156, 95, 170, 174, 117, 109, 102, 186, 148, 3, 134, 96, 67, 150, 151, 153, 11, 83, 1, 105, 25, 144, 8, 108, 84, 78, 97, 141, 60, 16, 112, 7, 82, 93, 46, 137, 35, 103, 61, 113, 129, 20, 119, 92, 31, 154, 115, 56, 44, 90, 14, 131, 160, 2, 36, 21, 23, 110, 152, 187, 0, 184, 41, 183, 120, 146, 47, 114, 32, 81, 75, 39, 91, 136, 167, 172, 58, 147, 125, 86, 138, 94, 33, 79, 159, 87, 55, 171, 85, 182, 191, 9, 19, 74, 13, 142, 40, 139, 15, 128.

The check matrix initial value table defining the check matrix is as described above.

In the first reception device according to the present technology, the arrangement of the LDPC code after the group-wise interleaving obtained from the data transmitted from the transmission device that performs the first transmission method is returned to the original arrangement.

In the second transmission method according to the present technology, the LDPC encoding is performed on the basis of the check matrix of the LDPC code with a code length N of 69120 bits and an encoding rate r of 4/16, and the group-wise interleaving of interleaving the LDPC code in units of a bit group of 360 bits is performed. Then, the LDPC code is mapped to any one of 4096 signal points of 1D-non-uniform constellation (NUC) of 4096 QAM in units of 12 bits. In the group-wise interleaving, the (i+1)-th bit group from the lead of the LDPC code is set as a bit group i, and the arrangement of bit groups 0 to 191 of the 69120-bit LDPC code is interleaved into the arrangement of the bit group 191, 38, 101, 9, 62, 79, 127, 18, 51, 6, 95, 114, 35, 123, 31, 99, 133, 81, 136, 106, 5, 130, 159, 124, 146, 41, 110, 150, 185, 8, 158, 178, 119, 171, 121, 129, 164, 168, 111, 52, 177, 190, 85, 179, 142, 174, 46, 61, 176, 23, 163, 49, 28, 86, 2, 143, 120, 166, 13, 87, 27, 39, 115, 131, 92, 117, 187, 56, 11, 180, 118, 30, 149, 60, 71, 44, 103, 140, 48, 162, 125, 122, 126, 29, 153, 77, 72, 4, 7, 165, 25, 89, 26, 68, 20, 12, 141, 37, 139, 15, 36, 82, 21, 137, 80, 3, 57, 128, 42, 43, 47, 93, 147, 70, 50, 170, 54, 96, 17, 152, 24, 172, 10, 22, 45, 169, 83, 69, 134, 78, 64, 183, 76, 189, 184, 112, 109, 33, 88, 32, 105, 175, 94, 53, 1, 90, 66, 100, 19, 108, 104, 113, 58, 40, 144, 97, 138, 154, 148, 157, 67, 145, 102, 132, 173, 84, 167, 0, 98, 182, 156, 63, 135, 14, 181, 73, 75, 65, 161, 116, 186, 55, 34, 151, 91, 160, 107, 16, 188, 74, 155, 59.

The check matrix initial value table defining the check matrix is as described above.

In the second reception device according to the present technology, the arrangement of the LDPC code after the group-wise interleaving obtained from the data transmitted from the transmission device that performs the second transmission method is returned to the original arrangement.

In the third transmission method according to the present technology, the LDPC encoding is performed on the basis of the check matrix of the LDPC code with a code length N of 69120 bits and an encoding rate r of 6/16, and the group-wise interleaving of interleaving the LDPC code in units of a bit group of 360 bits is performed. Then, the LDPC code is mapped to any one of 4096 signal points of 1D-non-uniform constellation (NUC) of 4096 QAM in units of 12 bits. In the group-wise interleaving, the (i+1)-th bit group from the lead of the LDPC code is set as a bit group i, and the arrangement of bit groups 0 to 191 of the 69120-bit LDPC code is interleaved into the arrangement of the bit group 100, 152, 16, 39, 26, 58, 60, 6, 126, 7, 59, 75, 62, 47, 27, 113, 41, 115, 169, 30, 95, 189, 138, 136, 70, 140, 149, 187, 177, 141, 125, 171, 178, 134, 15, 154, 131, 183, 46, 35, 44, 11, 51, 170, 112, 20, 161, 159, 101, 52, 181, 71, 28, 128, 3, 167, 156, 123, 18, 139, 102, 13, 19, 37, 90, 105, 92, 135, 185, 121, 50, 158, 29, 104, 155, 12, 184, 93, 166, 14, 133, 146, 24, 191, 188, 116, 109, 89, 65, 45, 25, 21, 1, 76, 151, 180, 33, 124, 91, 107, 119, 5, 132, 118, 111, 96, 143, 150, 173, 108, 2, 122, 22, 148, 130, 142, 147, 67, 97, 103, 36, 63, 40, 117, 55, 68, 137, 144, 94, 83, 56, 79, 175, 0, 182, 114, 85, 86, 9, 10, 74, 106, 17, 190, 4, 34, 84, 98, 38, 88, 64, 78, 145, 77, 163, 42, 120, 69, 164, 48, 23, 129, 160, 81, 127, 82, 53, 72, 179, 31, 66, 32, 168, 110, 73, 186, 157, 172, 49, 165, 176, 80, 61, 174, 153, 162, 54, 99, 57, 87, 8, 43.

The check matrix initial value table defining the check matrix is as described above.

In the third reception device according to the present technology, the arrangement of the LDPC code after the group-wise interleaving obtained from the data transmitted from the transmission device that performs the third transmission method is returned to the original arrangement.

In the fourth transmission method according to the present technology, the LDPC encoding is performed on the basis of the check matrix of the LDPC code with a code length N of 69120 bits and an encoding rate r of 8/16, and the group-wise interleaving of interleaving the LDPC code in units of a bit group of 360 bits is performed. Then, the LDPC code is mapped to any one of 4096 signal points of 1D-non-uniform constellation (NUC) of 4096 QAM in units of 12 bits. In the group-wise interleaving, the (i+1)-th bit group from the lead of the LDPC code is set as a bit group i, and the arrangement of bit groups 0 to 191 of the 69120-bit LDPC code is interleaved into the arrangement of the bit group 21, 5, 2, 24, 12, 28, 52, 118, 129, 3, 122, 149, 105, 16, 136, 99, 133, 171, 84, 79, 59, 62, 155, 78, 134, 20, 1, 51, 22, 161, 173, 46, 172, 162, 55, 148, 70, 57, 121, 86, 131, 114, 31, 72, 104, 120, 164, 127, 83, 179, 187, 7, 108, 40, 73, 144, 48, 68, 60, 190, 135, 61, 116, 106, 19, 35, 143, 180, 102, 76, 182, 117, 93, 191, 165, 23, 80, 146, 153, 42, 53, 139, 124, 64, 167, 96, 138, 132, 158, 90, 110, 82, 39, 175, 170, 66, 145, 94, 119, 130, 98, 63, 87, 32, 160, 34, 151, 77, 95, 109, 56, 113, 147, 50, 38, 15, 156, 11, 169, 185, 183, 92, 186, 107, 10, 101, 33, 4, 150, 41, 81, 89, 166, 0, 30, 54, 168, 26, 140, 74, 100, 9, 111, 126, 43, 112, 25, 88, 44, 189, 37, 178, 141, 49, 13, 29, 8, 69, 154, 45, 97, 47, 36, 75, 137, 6, 115, 188, 85, 174, 17, 142, 18, 91, 163, 157, 177, 103, 125, 71, 14, 181, 65, 184, 176, 159, 128, 152, 58, 27, 123, 67.

The check matrix initial value table defining the check matrix is as described above.

In the fourth reception device according to the present technology, the arrangement of the LDPC code after the group-wise interleaving obtained from the data transmitted from the transmission device that performs the fourth transmission method is returned to the original arrangement.

In the fifth transmission method according to the present technology, the LDPC encoding is performed on the basis of the check matrix of the LDPC code with a code length N of 69120 bits and an encoding rate r of 10/16, and the group-wise interleaving of interleaving the LDPC code in units of a bit group of 360 bits is performed. Then, the LDPC code is mapped to any one of 4096 signal points of 1D-non-uniform constellation (NUC) of 4096 QAM in units of 12 bits. In the group-wise interleaving, the (i+1)-th bit group from the lead of the LDPC code is set as a bit group i, and the arrangement of bit groups 0 to 191 of the 69120-bit LDPC code is interleaved into the arrangement of the bit group 113, 23, 166, 150, 133, 130, 38, 18, 71, 115, 111, 44, 135, 11, 98, 96, 67, 114, 112, 87, 146, 119, 28, 86, 120, 49, 175, 14, 30, 144, 53, 165, 162, 128, 108, 39, 116, 158, 62, 110, 83, 93, 118, 80, 88, 173, 157, 102, 177, 132, 174, 59, 106, 34, 64, 22, 4, 29, 97, 155, 109, 9, 107, 92, 36, 24, 161, 50, 21, 137, 17, 43, 58, 124, 31, 37, 172, 100, 178, 129, 79, 160, 167, 32, 181, 154, 7, 183, 90, 54, 68, 191, 156, 104, 147, 10, 65, 81, 134, 169, 142, 57, 171, 78, 48, 47, 5, 40, 46, 51, 151, 77, 1, 72, 164, 152, 70, 141, 2, 89, 13, 182, 85, 52, 41, 66, 75, 63, 185, 148, 179, 138, 61, 73, 180, 189, 76, 84, 8, 27, 184, 105, 42, 69, 153, 188, 19, 131, 121, 26, 159, 45, 16, 186, 25, 176, 82, 103, 163, 99, 101, 122, 187, 20, 136, 126, 168, 145, 6, 91, 55, 117, 35, 56, 143, 140, 190, 125, 127, 74, 95, 94, 12, 149, 33, 0, 139, 3, 123, 170, 15, 60.

The check matrix initial value table defining the check matrix is as described above.

In the fifth reception device according to the present technology, the arrangement of the LDPC code after the group-wise interleaving obtained from the data transmitted from the transmission device that performs the fifth transmission method is returned to the original arrangement.

In the sixth transmission method according to the present technology, the LDPC encoding is performed on the basis of the check matrix of the LDPC code with a code length N of 69120 bits and an encoding rate r of 12/16, and the group-wise interleaving of interleaving the LDPC code in units of a bit group of 360 bits is performed. Then, the LDPC code is mapped to any one of 4096 signal points of 1D-non-uniform constellation (NUC) of 4096 QAM in units of 12 bits. In the group-wise interleaving, the (i+1)-th bit group from the lead of the LDPC code is set as a bit group i, and the arrangement of bit groups 0 to 191 of the 69120-bit LDPC code is interleaved into the arrangement of the bit group 131, 148, 141, 17, 53, 138, 45, 97, 112, 111, 77, 184, 129, 135, 27, 122, 2, 123, 156, 128, 80, 116, 40, 89, 84, 41, 105, 42, 39, 187, 145, 18, 54, 44, 183, 57, 136, 13, 65, 162, 51, 178, 59, 104, 163, 70, 87, 152, 94, 126, 23, 169, 9, 179, 177, 139, 130, 38, 35, 20, 86, 180, 48, 108, 47, 133, 167, 75, 168, 25, 67, 185, 91, 165, 157, 158, 110, 127, 82, 58, 50, 64, 76, 31, 159, 8, 79, 78, 146, 71, 69, 3, 36, 155, 160, 21, 29, 49, 28, 150, 81, 154, 149, 182, 24, 30, 72, 109, 173, 33, 113, 43, 55, 189, 132, 176, 120, 172, 166, 143, 90, 125, 7, 5, 66, 12, 98, 83, 10, 62, 11, 175, 85, 0, 63, 181, 188, 74, 171, 117, 106, 61, 153, 174, 147, 93, 190, 34, 142, 100, 6, 1, 140, 191, 161, 19, 151, 14, 73, 99, 121, 119, 92, 95, 115, 118, 186, 60, 144, 22, 32, 52, 164, 15, 88, 46, 114, 101, 124, 26, 96, 4, 107, 103, 16, 37, 102, 56, 170, 68, 134, 137.

The check matrix initial value table defining the check matrix is as described above.

In the sixth reception device according to the present technology, the arrangement of the LDPC code after the group-wise interleaving obtained from the data transmitted from the transmission device that performs the sixth transmission method is returned to the original arrangement.

In the seventh transmission method according to the present technology, the LDPC encoding is performed on the basis of the check matrix of the LDPC code with a code length N of 69120 bits and an encoding rate r of 14/16, and the group-wise interleaving of interleaving the LDPC code in units of a bit group of 360 bits is performed. Then, the LDPC code is mapped to any one of 4096 signal points of 1D-non-uniform constellation (NUC) of 4096 QAM in units of 12 bits. In the group-wise interleaving, the (i+1)-th bit group from the lead of the LDPC code is set as a bit group i, and the arrangement of bit groups 0 to 191 of the 69120-bit LDPC code is interleaved into the arrangement of the bit group 93, 61, 37, 170, 63, 60, 135, 5, 158, 47, 65, 179, 76, 182, 72, 20, 104, 7, 181, 11, 117, 152, 184, 172, 143, 92, 109, 177, 191, 119, 132, 1, 98, 10, 148, 35, 126, 9, 18, 70, 190, 38, 66, 54, 62, 122, 100, 3, 2, 189, 144, 153, 165, 14, 154, 44, 161, 113, 147, 12, 90, 167, 112, 34, 39, 139, 142, 41, 159, 149, 82, 131, 88, 106, 138, 105, 55, 163, 71, 168, 80, 96, 108, 40, 50, 25, 114, 79, 103, 141, 151, 69, 74, 110, 36, 24, 67, 145, 26, 8, 56, 180, 13, 17, 134, 28, 129, 185, 85, 121, 137, 136, 68, 86, 188, 0, 124, 120, 127, 32, 94, 83, 133, 97, 31, 58, 33, 57, 166, 162, 183, 186, 81, 111, 19, 107, 155, 42, 84, 6, 43, 130, 48, 123, 64, 78, 53, 173, 95, 75, 45, 174, 178, 160, 15, 187, 102, 23, 150, 156, 101, 99, 91, 157, 128, 175, 59, 125, 22, 46, 115, 164, 52, 16, 21, 30, 176, 146, 51, 116, 87, 140, 77, 73, 89, 169, 4, 171, 27, 49, 29, 118.

The check matrix initial value table defining the check matrix is as described above.

In the seventh reception device according to the present technology, the arrangement of the LDPC code after the group-wise interleaving obtained from the data transmitted from the transmission device that performs the seventh transmission method is returned to the original arrangement.

Note that the reception device may be an independent device or an internal block constituting one device.

Effects of the Invention

According to the present technology, it is possible to ensure good communication quality in data transmission using an LDPC code.

In addition, the effects described herein are not necessarily limited and may be any effects to be described in the present disclosure.

BRIEF DESCRIPTION OF DRAWINGS

FIG. 3 is a diagram illustrating an example of a check matrix of an LDPC code.

FIG. 13 is a diagram illustrating a check matrix of an LDPC code defined in the DVB-T.2 standard.

FIG. 30 is a diagram illustrating an example of a check matrix initial value table of a type-A code with r=2/16 with N=69120 bits.

FIG. 31 is a diagram illustrating an example of a check matrix initial value table of a type-A code with r=3/16 with N=69120 bits.

FIG. 32 is a diagram illustrating an example of a check matrix initial value table of a type-A code with r=3/16 with N=69120 bits.

FIG. 33 is a diagram illustrating an example of a check matrix initial value table of a type-A code with r=4/16 with N=69120 bits.

FIG. 34 is a diagram illustrating an example of a check matrix initial value table of a type-A code with r=5/16 with N=69120 bits.

FIG. 35 is a diagram illustrating an example of a check matrix initial value table of a type-A code with r=5/16 with N=69120 bits.

FIG. 36 is a diagram illustrating an example of a check matrix initial value table of a type-A code with r=6/16 with N=69120 bits.

FIG. 37 is a diagram illustrating an example of a check matrix initial value table of a type-A code with r=6/16 with N=69120 bits.

FIG. 38 is a diagram illustrating an example of a check matrix initial value table of a type-A code with r=7/16 with N=69120 bits.

FIG. 39 is a diagram illustrating an example of a check matrix initial value table of a type-A code with r=7/16 with N=69120 bits.

FIG. 40 is a diagram illustrating an example of a check matrix initial value table of a type-A code with r=8/16 with N=69120 bits.

FIG. 41 is a diagram illustrating an example of a check matrix initial value table of a type-A code with r=8/16 with N=69120 bits.

FIG. 42 is a diagram illustrating an example of a check matrix initial value table of a type-B code with r=7/16 with N=69120 bits.

FIG. 43 is a diagram illustrating an example of a check matrix initial value table of a type-B code with r=7/16 with N=69120 bits.

FIG. 44 is a diagram illustrating another example of a check matrix initial value table of a type-B code with r=7/16 with N=69120 bits.

FIG. 45 is a diagram illustrating another example of a check matrix initial value table of a type-B code with r=7/16 with N=69120 bits.

FIG. 46 is a diagram illustrating an example of a check matrix initial value table of a type-B code with r=8/16 with N=69120 bits.

FIG. 47 is a diagram illustrating an example of a check matrix initial value table of a type-B code with r=8/16 with N=69120 bits.

FIG. 48 is a diagram illustrating another example of a check matrix initial value table of a type-B code with r=8/16, where N=69120 bits.

FIG. 49 is a diagram illustrating another example of a check matrix initial value table of a type-B code with r=8/16, where N=69120 bits.

FIG. 50 is a diagram illustrating an example of a check matrix initial value table of a type-B code with r=9/16 with N=69120 bits.

FIG. 51 is a diagram illustrating an example of a check matrix initial value table of a type-B code with r=9/16 with N=69120 bits.

FIG. 52 is a diagram illustrating an example of a check matrix initial value table of a type-B code with r=9/16 with N=69120 bits.

FIG. 53 is a diagram illustrating another example of a check matrix initial value table of a type-B code with r=9/16, where N=69120 bits.

FIG. 54 is a diagram illustrating another example of a check matrix initial value table of a type-B code with r=9/16, where N=69120 bits.

FIG. 55 is a diagram illustrating another example of a check matrix initial value table of a type-B code with r=9/16 with N=69120 bits.

FIG. 56 is a diagram illustrating an example of a check matrix initial value table of a type-B code with r=10/16 with N=69120 bits.

FIG. 57 is a diagram illustrating an example of a check matrix initial value table of a type-B code with r=10/16 with N=69120 bits.

FIG. 58 is a diagram illustrating an example of a check matrix initial value table of a type-B code with r=10/16 with N=69120 bits.

FIG. 59 is a diagram illustrating another example of a check matrix initial value table of a type-B code with r=10/16 with N=69120 bits.

FIG. 60 is a diagram illustrating another example of a check matrix initial value table of a type-B code with r=10/16, where N=69120 bits.

FIG. 61 is a diagram illustrating another example of a check matrix initial value table of a type-B code with r=10/16 with N=69120 bits.

FIG. 62 is a diagram illustrating an example of a check matrix initial value table of a type-B code with r=11/16 and N=69120 bits.

FIG. 63 is a diagram illustrating an example of a check matrix initial value table of a type-B code with r=11/16 and N=69120 bits.

FIG. 64 is a diagram illustrating an example of a check matrix initial value table of a type-B code with r=11/16 and N=69120 bits.

FIG. 65 is a diagram illustrating another example of a check matrix initial value table of a type-B code with r=11/16 and N=69120 bits.

FIG. 66 is a diagram illustrating another example of a check matrix initial value table of a type-B code with r=11/16 and N=69120 bits.

FIG. 67 is a diagram illustrating another example of a check matrix initial value table of a type-B code with r=11/16 and N=69120 bits.

FIG. 68 is a diagram illustrating an example of a check matrix initial value table of a type-B code with r=12/16 with N=69120 bits.

FIG. 69 is a diagram illustrating an example of a check matrix initial value table of a type-B code with r=12/16 with N=69120 bits.

FIG. 70 is a diagram illustrating an example of a check matrix initial value table of a type-B code with r=12/16 with N=69120 bits.

FIG. 71 is a diagram illustrating another example of a check matrix initial value table of a type-B code with r=12/16 with N=69120 bits.

FIG. 72 is a diagram illustrating another example of a check matrix initial value table of a type-B code with r=12/16 with N=69120 bits.

FIG. 73 is a diagram illustrating another example of a check matrix initial value table of a type-B code with r=12/16 with N=69120 bits.

FIG. 74 is a diagram illustrating an example of a check matrix initial value table of a type-B code with r=13/16 with N=69120 bits.

FIG. 75 is a diagram illustrating an example of a check matrix initial value table of a type-B code with r=13/16 with N=69120 bits.

FIG. 76 is a diagram illustrating an example of a check matrix initial value table of a type-B code with r=13/16 with N=69120 bits.

FIG. 77 is a diagram illustrating another example of a check matrix initial value table of a type-B code with r=13/16 with N=69120 bits.

FIG. 78 is a diagram illustrating another example of a check matrix initial value table of a type-B code with r=13/16 with N=69120 bits.

FIG. 79 is a diagram illustrating another example of a check matrix initial value table of a type-B code with r=13/16 with N=69120 bits.

FIG. 80 is a diagram illustrating an example of a check matrix initial value table of a type-B code with r=14/16 with N=69120 bits.

FIG. 81 is a diagram illustrating an example of a check matrix initial value table of a type-B code with r=14/16 with N=69120 bits.

FIG. 82 is a diagram illustrating an example of a check matrix initial value table of a type-B code with r=14/16 with N=69120 bits.

FIG. 83 is a diagram illustrating another example of a check matrix initial value table of a type-B code with r=14/16 with N=69120 bits.

FIG. 84 is a diagram illustrating another example of a check matrix initial value table of a type-B code with r=14/16 with N=69120 bits.

FIG. 85 is a diagram illustrating another example of a check matrix initial value table of a type-B code with r=14/16 with N=69120 bits.

FIG. 89 is a diagram illustrating a check matrix of a type-A scheme.

FIG. 91 is a diagram illustrating a check matrix of a type-B scheme.

FIG. 92 is a diagram illustrating an example of coordinates of a signal point of UC in a case where the modulation scheme is QPSK.

FIG. 93 is a diagram illustrating an example of coordinates of 2D-NUC signal points in a case where the modulation scheme is 16 QAM.

FIG. 94 is a diagram illustrating an example of coordinates of a signal point of 1D-NUC in a case where the modulation scheme is 1024 QAM.

FIGS. 95A and 95B are diagrams illustrating a relationship between a symbol y and a position vector u of 1024 QAM.

FIG. 96 is a diagram illustrating an example of coordinates $z_q$ of a signal point of QPSK-UC.

FIG. 97 is a diagram illustrating an example of coordinates $z_q$ of a signal point of QPSK-UC.

FIG. 98 is a diagram illustrating an example of coordinates $z_q$ of a signal point of 16 QAM-UC.

FIG. 99 is a diagram illustrating an example of coordinates $z_q$ of a signal point of 16 QAM-UC.

FIG. 100 is a diagram illustrating an example of coordinates $z_q$ of a signal point of 64 QAM-UC.

FIG. 101 is a diagram illustrating an example of coordinates $z_q$ of a signal point of 64 QAM-UC.

FIG. 102 is a diagram illustrating an example of coordinates $z_q$ of a signal point of 256 QAM-UC.

FIG. 103 is a diagram illustrating an example of coordinates $z_q$ of a signal point of 256 QAM-UC.

FIG. 104 is a diagram illustrating an example of coordinates $z_q$ of a signal point of 1024 QAM-UC.

FIG. 105 is a diagram illustrating an example of coordinates $z_q$ of a signal point of 1024 QAM-UC.

FIG. 106 is a diagram illustrating an example of coordinates $z_q$ of a signal point of 4096 QAM-UC.

FIG. 107 is a diagram illustrating an example of coordinates $z_q$ of a signal point of 4096 QAM-UC.

FIG. 108 is a diagram illustrating an example of coordinates $z_s$ of a signal point of 16 QAM-2D-NUC.

FIG. 109 is a diagram illustrating an example of coordinates $z_s$ of a signal point of 64 QAM-2D-NUC.

FIG. 110 is a diagram illustrating an example of coordinates $z_s$ of a signal point of 256 QAM-2D-NUC.

FIG. 111 is a diagram illustrating an example of coordinates $z_s$ of a signal point of 256 QAM-2D-NUC.

FIG. 112 is a diagram illustrating an example of coordinates $z_s$ of a signal point of 1024 QAM-1D-NUC.

FIGS. 113A and 113B are diagrams illustrating a relationship between a symbol y of 1024 QAM and a position vector u.

FIG. 114 is a diagram illustrating an example of coordinates $z_s$ of a signal point of 4096 QAM-1D-NUC.

FIG. 115 is a diagram illustrating a relationship between a symbol y and a position vector u of 4096 QAM.

FIG. 116 is a diagram illustrating a relationship between a symbol y and a position vector u of 4096 QAM.

FIG. 118 is a diagram illustrating block interleaving performed by the block interleaver 25.

FIG. 120 is a diagram illustrating Example 1 of a GW pattern for an LDPC code with a code length N of 69120 bits.

FIG. 121 is a diagram illustrating Example 2 of a GW pattern for an LDPC code with a code length N of 69120 bits.

FIG. 122 is a diagram illustrating Example 3 of a GW pattern for an LDPC code with a code length N of 69120 bits.

FIG. 123 is a diagram illustrating Example 4 of a GW pattern for an LDPC code with a code length N of 69120 bits.

FIG. 124 is a diagram illustrating Example 5 of a GW pattern for an LDPC code with a code length N of 69120 bits.

FIG. 125 is a diagram illustrating Example 6 of a GW pattern for an LDPC code with a code length N of 69120 bits.

FIG. 126 is a diagram illustrating Example 7 of a GW pattern for an LDPC code with a code length N of 69120 bits.

FIG. 127 is a diagram illustrating Example 8 of a GW pattern for an LDPC code with a code length N of 69120 bits.

FIG. 128 is a diagram illustrating Example 9 of a GW pattern for an LDPC code with a code length N of 69120 bits.

FIG. 129 is a diagram illustrating Example 10 of a GW pattern for an LDPC code with a code length N of 69120 bits.

FIG. 130 is a diagram illustrating Example 11 of a GW pattern for an LDPC code with a code length N of 69120 bits.

FIG. 131 is a diagram illustrating Example 12 of a GW pattern for an LDPC code with a code length N of 69120 bits.

Figure 132:
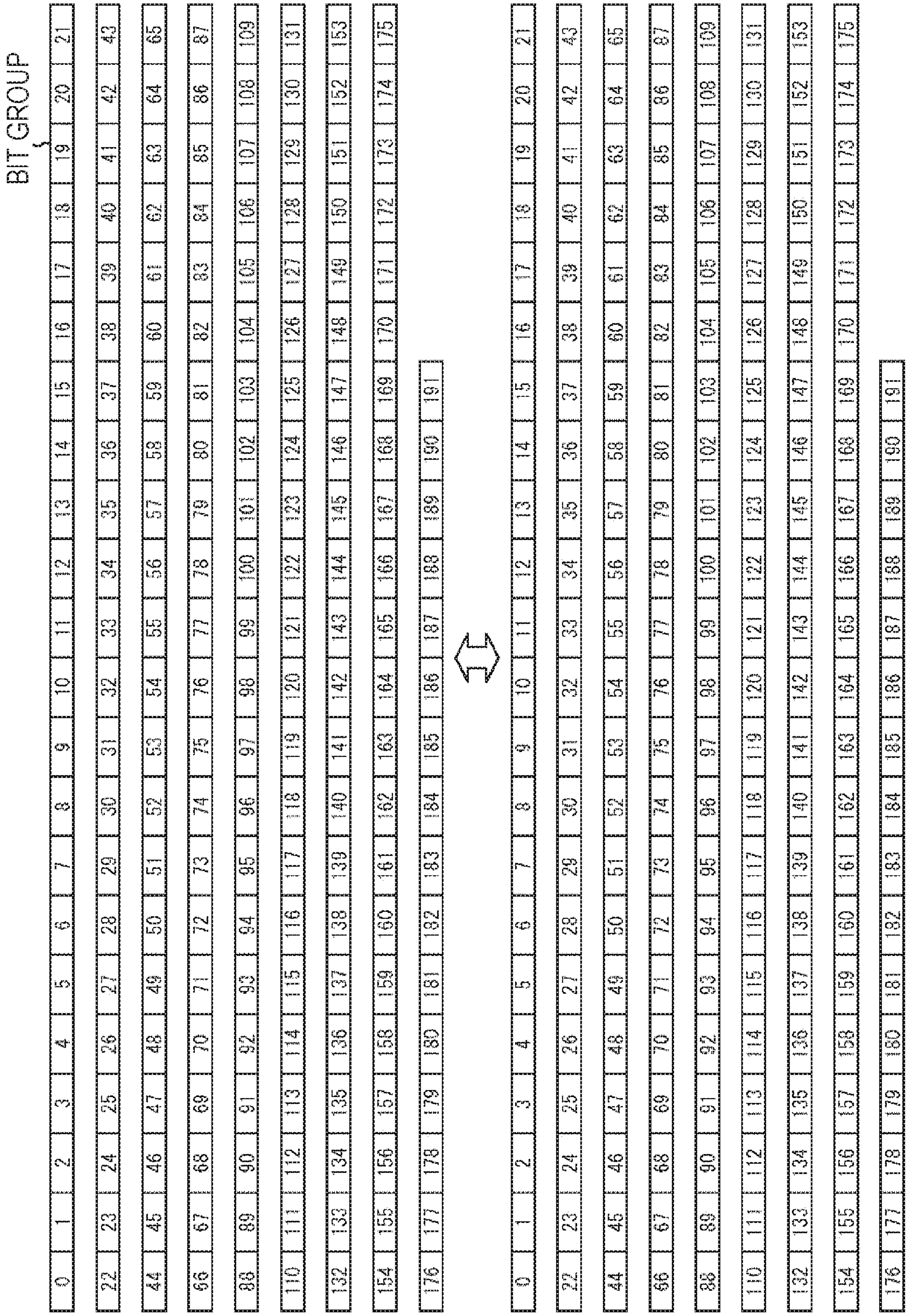

FIG. 132 is a diagram illustrating Example 13 of a GW pattern for an LDPC code with a code length N of 69120 bits.

FIG. 133 is a diagram illustrating Example 14 of a GW pattern for an LDPC code with a code length N of 69120 bits.

FIG. 134 is a diagram illustrating Example 15 of a GW pattern for an LDPC code with a code length N of 69120 bits.

FIG. 135 is a diagram illustrating Example 16 of a GW pattern for an LDPC code with a code length N of 69120 bits.

FIG. 136 is a diagram illustrating Example 17 of a GW pattern for an LDPC code with a code length N of 69120 bits.

FIG. 137 is a diagram illustrating Example 18 of a GW pattern for an LDPC code with a code length N of 69120 bits.

FIG. 138 is a diagram illustrating Example 19 of a GW pattern for an LDPC code with a code length N of 69120 bits.

FIG. 139 is a diagram illustrating Example 20 of a GW pattern for an LDPC code with a code length N of 69120 bits.

FIG. 140 is a diagram illustrating Example 21 of a GW pattern for an LDPC code with a code length N of 69120 bits.

FIG. 141 is a diagram illustrating Example 22 of a GW pattern for an LDPC code with a code length N of 69120 bits.

FIG. 142 is a diagram illustrating Example 23 of a GW pattern for an LDPC code with a code length N of 69120 bits.

FIG. 143 is a diagram illustrating Example 24 of a GW pattern for an LDPC code with a code length N of 69120 bits.

FIG. 144 is a diagram illustrating Example 25 of a GW pattern for an LDPC code with a code length N of 69120 bits.

FIG. 145 is a diagram illustrating Example 26 of a GW pattern for an LDPC code with a code length N of 69120 bits.

FIG. 146 is a diagram illustrating Example 27 of a GW pattern for an LDPC code with a code length N of 69120 bits.

FIG. 147 is a diagram illustrating Example 28 of a GW pattern for an LDPC code with a code length N of 69120 bits.

FIG. 148 is a diagram illustrating Example 29 of a GW pattern for an LDPC code with a code length N of 69120 bits.

FIG. 149 is a diagram illustrating Example 30 of a GW pattern for an LDPC code with a code length N of 69120 bits.

FIG. 150 is a diagram illustrating Example 31 of a GW pattern for an LDPC code with a code length N of 69120 bits.

FIG. 151 is a diagram illustrating Example 32 of a GW pattern for an LDPC code with a code length N of 69120 bits.

FIG. 152 is a diagram illustrating Example 33 of a GW pattern for an LDPC code with a code length N of 69120 bits.

FIG. 153 is a diagram illustrating Example 34 of a GW pattern for an LDPC code with a code length N of 69120 bits.

FIG. 154 is a diagram illustrating Example 35 of a GW pattern for an LDPC code with a code length N of 69120 bits.

FIG. 155 is a diagram illustrating Example 36 of a GW pattern for an LDPC code with a code length N of 69120 bits.

FIG. 156 is a diagram illustrating Example 37 of a GW pattern for an LDPC code with a code length N of 69120 bits.

FIG. 157 is a diagram illustrating Example 38 of a GW pattern for an LDPC code with a code length N of 69120 bits.

FIG. 158 is a diagram illustrating Example 39 of a GW pattern for an LDPC code with a code length N of 69120 bits.

FIG. 159 is a diagram illustrating Example 40 of a GW pattern for an LDPC code with a code length N of 69120 bits.

FIG. 160 is a diagram illustrating Example 41 of a GW pattern for an LDPC code with a code length N of 69120 bits.

FIG. 161 is a diagram illustrating Example 42 of a GW pattern for an LDPC code with a code length N of 69120 bits.

FIG. 162 is a diagram illustrating Example 43 of a GW pattern for an LDPC code with a code length N of 69120 bits.

FIG. 163 is a diagram illustrating Example 44 of a GW pattern for an LDPC code with a code length N of 69120 bits.

FIG. 164 is a diagram illustrating Example 45 of a GW pattern for an LDPC code with a code length N of 69120 bits.

FIG. 165 is a diagram illustrating Example 46 of a GW pattern for an LDPC code with a code length N of 69120 bits.

FIG. 166 is a diagram illustrating Example 47 of a GW pattern for an LDPC code with a code length N of 69120 bits.

FIG. 167 is a diagram illustrating Example 48 of a GW pattern for an LDPC code with a code length N of 69120 bits.

FIG. 168 is a diagram illustrating Example 49 of a GW pattern for an LDPC code with a code length N of 69120 bits.

FIG. 169 is a diagram illustrating Example 50 of a GW pattern for an LDPC code with a code length N of 69120 bits.

FIG. 170 is a diagram illustrating Example 51 of a GW pattern for an LDPC code with a code length N of 69120 bits.

FIG. 171 is a diagram illustrating Example 52 of a GW pattern for an LDPC code with a code length N of 69120 bits.

FIG. 172 is a diagram illustrating Example 53 of a GW pattern for an LDPC code with a code length N of 69120 bits.

FIG. 173 is a diagram illustrating Example 54 of a GW pattern for an LDPC code with a code length N of 69120 bits.

FIG. 174 is a diagram illustrating Example 55 of a GW pattern for an LDPC code with a code length N of 69120 bits.

FIG. 175 is a diagram illustrating Example 56 of a GW pattern for an LDPC code with a code length N of 69120 bits.

FIG. 176 is a diagram illustrating Example 57 of a GW pattern for an LDPC code with a code length N of 69120 bits.

FIG. 177 is a diagram illustrating Example 58 of a GW pattern for an LDPC code with a code length N of 69120 bits.

FIG. 178 is a diagram illustrating Example 59 of a GW pattern for an LDPC code with a code length N of 69120 bits.

FIG. 179 is a diagram illustrating Example 60 of a GW pattern for an LDPC code with a code length N of 69120 bits.

FIG. 180 is a diagram illustrating Example 61 of a GW pattern for an LDPC code with a code length N of 69120 bits.

FIG. 181 is a diagram illustrating Example 62 of a GW pattern for an LDPC code with a code length N of 69120 bits.

FIG. 182 is a diagram illustrating Example 63 of a GW pattern for an LDPC code with a code length N of 69120 bits.

FIG. 183 is a diagram illustrating Example 64 of a GW pattern for an LDPC code with a code length N of 69120 bits.

Figure 184:
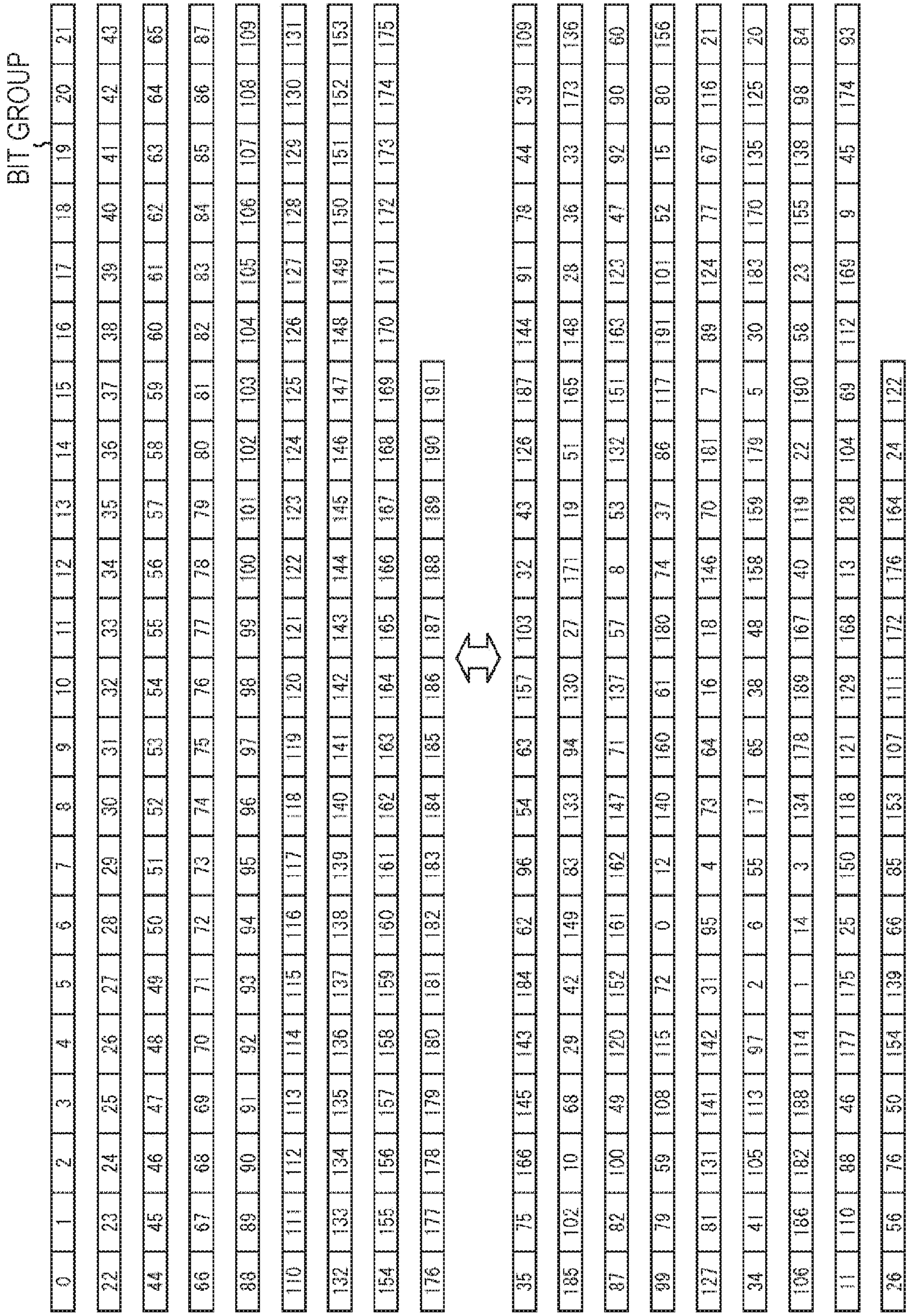

FIG. 184 is a diagram illustrating Example 65 of a GW pattern for an LDPC code with a code length N of 69120 bits.

FIG. 185 is a diagram illustrating Example 66 of a GW pattern for an LDPC code with a code length N of 69120 bits.

FIG. 186 is a diagram illustrating Example 67 of a GW pattern for an LDPC code with a code length N of 69120 bits.

FIG. 187 is a diagram illustrating Example 68 of a GW pattern for an LDPC code with a code length N of 69120 bits.

FIG. 188 is a diagram illustrating Example 69 of a GW pattern for an LDPC code with a code length N of 69120 bits.

FIG. 189 is a diagram illustrating Example 70 of a GW pattern for an LDPC code with a code length N of 69120 bits.

FIG. 190 is a diagram illustrating Example 71 of a GW pattern for an LDPC code with a code length N of 69120 bits.

FIG. 191 is a diagram illustrating Example 72 of a GW pattern for an LDPC code with a code length N of 69120 bits.

Figure 192:
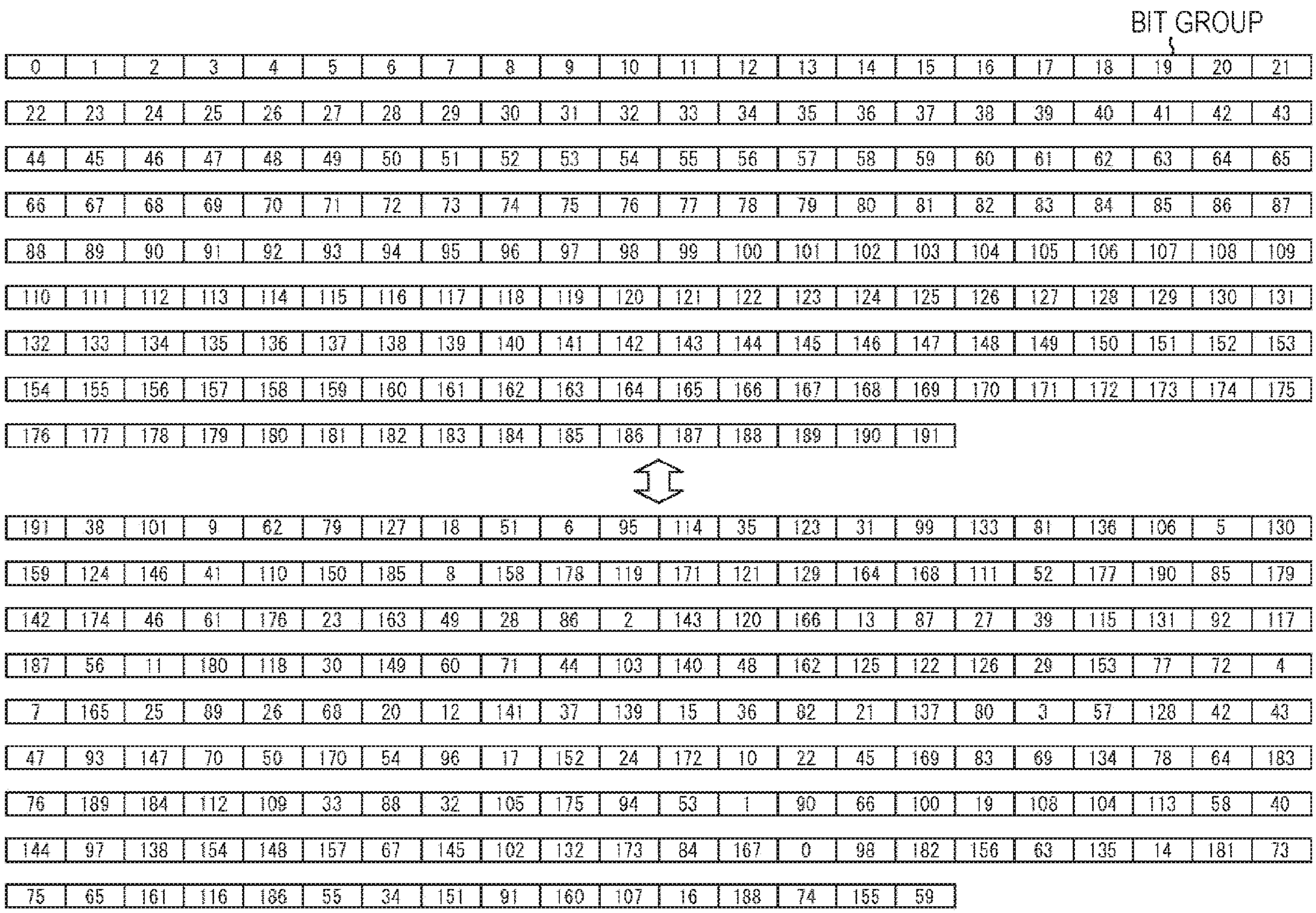

FIG. 192 is a diagram illustrating Example 73 of a GW pattern for an LDPC code with a code length N of 69120 bits.

FIG. 193 is a diagram illustrating Example 74 of a GW pattern for an LDPC code with a code length N of 69120 bits.

FIG. 194 is a diagram illustrating Example 75 of a GW pattern for an LDPC code with a code length N of 69120 bits.

FIG. 195 is a diagram illustrating Example 76 of a GW pattern for an LDPC code with a code length N of 69120 bits.

FIG. 196 is a diagram illustrating Example 77 of a GW pattern for an LDPC code with a code length N of 69120 bits.

FIG. 197 is a diagram illustrating Example 78 of a GW pattern for an LDPC code with a code length N of 69120 bits.

Figure 198:
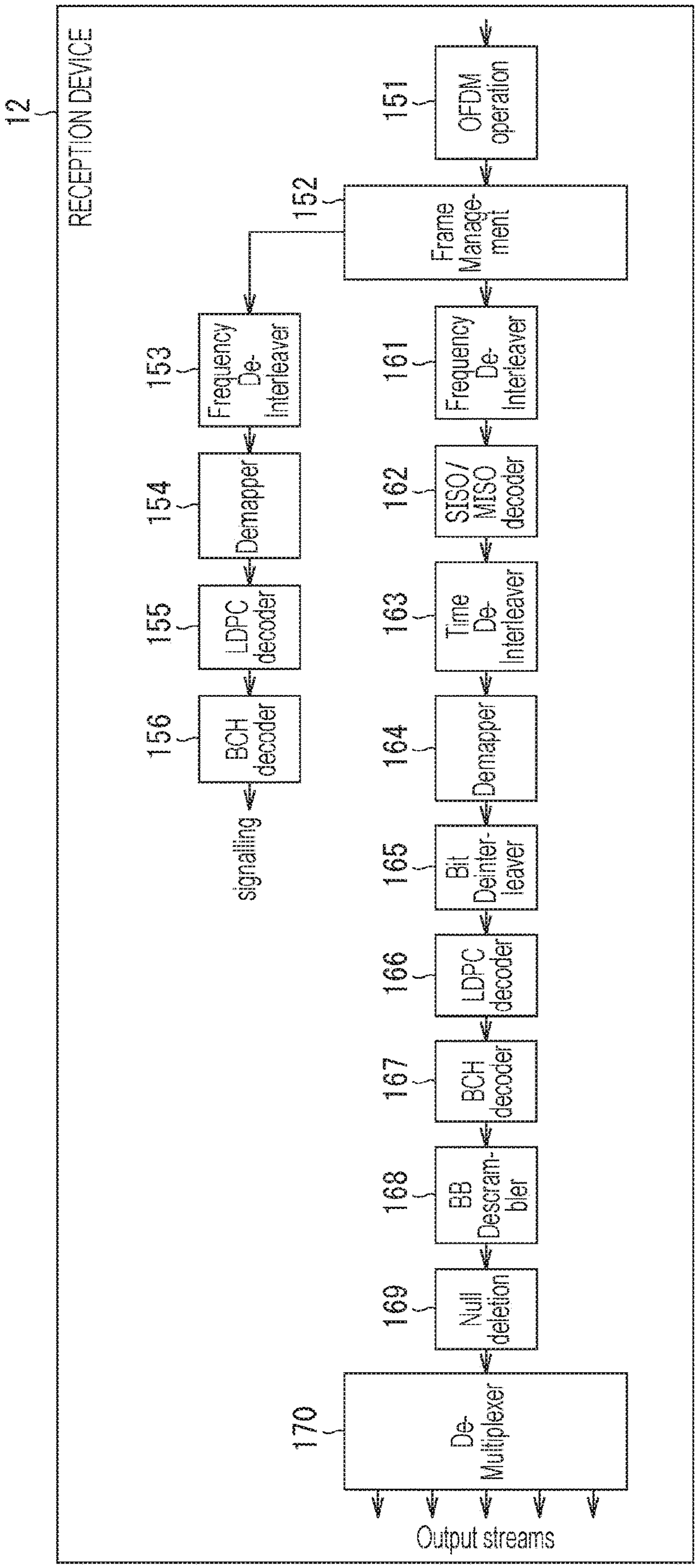

FIG. 198 is a block diagram illustrating a configuration example of a reception device 12.

Figure 199:
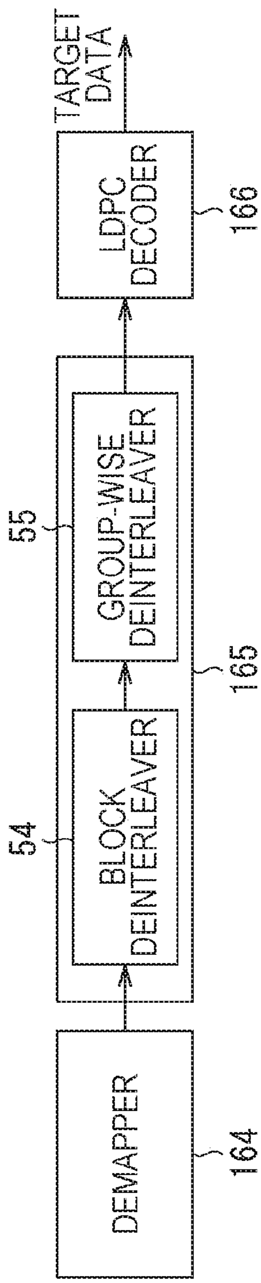

FIG. 199 is a block diagram illustrating a configuration example of a bit deinterleaver 165.

Figure 200:
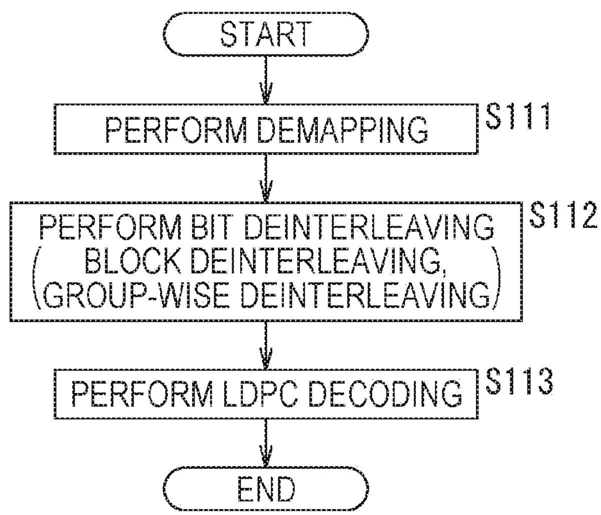

FIG. 200 is a flowchart illustrating an example of processing performed by a demapper 164, a bit deinterleaver 165, and an LDPC decoder 166.

Figure 201:
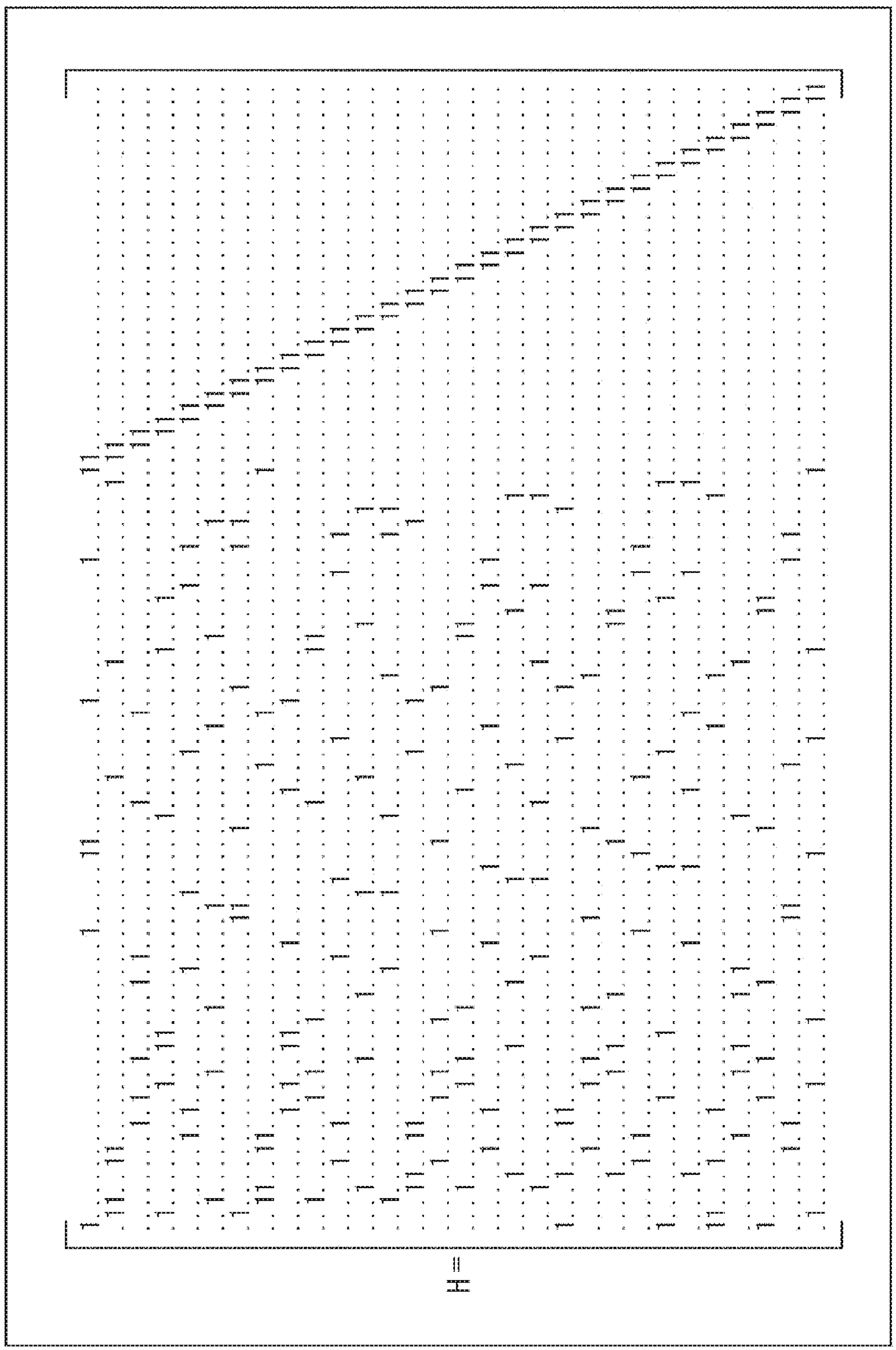

FIG. 201 is a diagram illustrating an example of a check matrix of an LDPC code.

Figure 202:
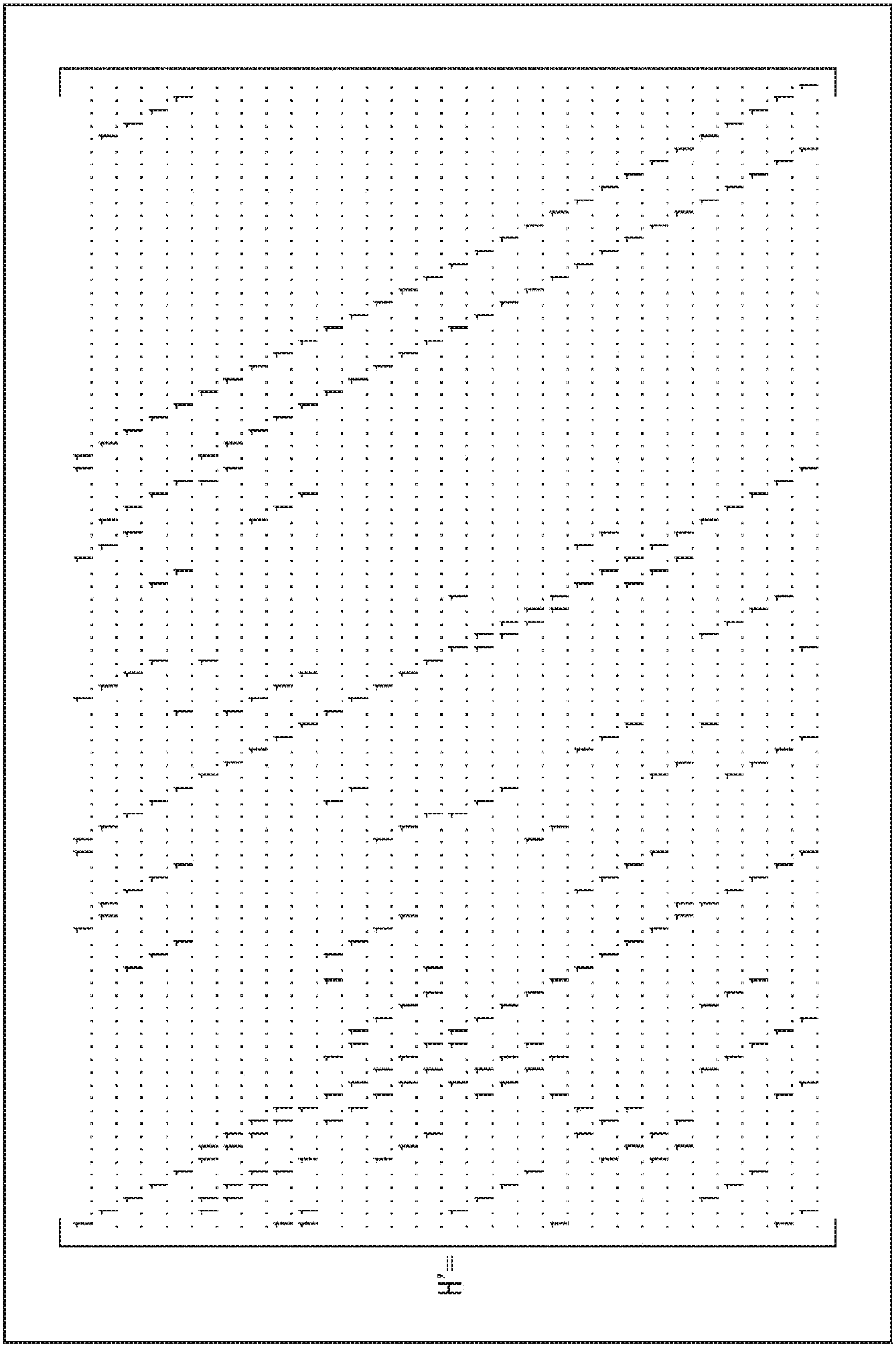

FIG. 202 is a diagram illustrating an example of a matrix (transformed check matrix) obtained by performing row permutation and column permutation on a check matrix.

Figure 203:
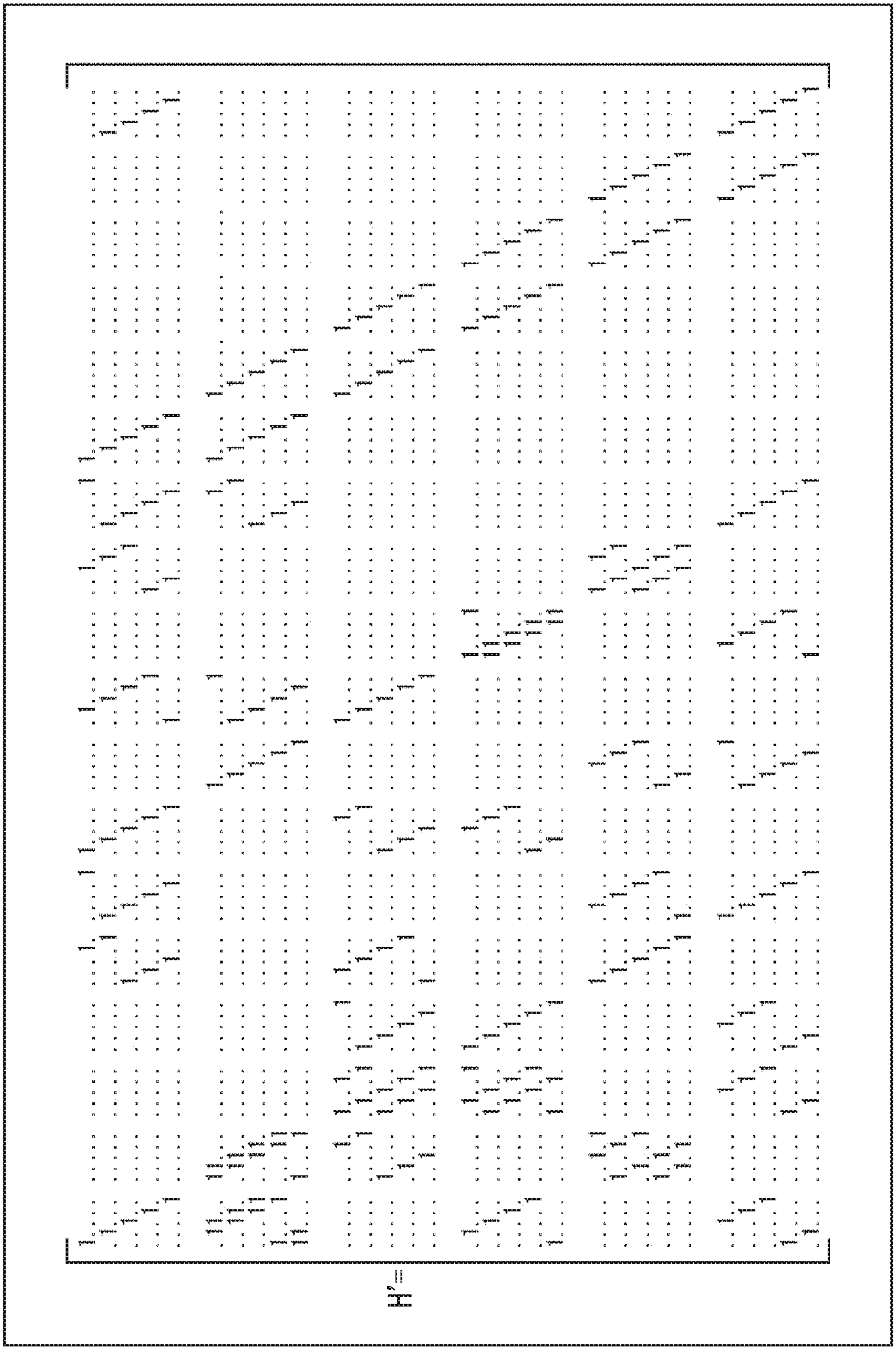

FIG. 203 is a diagram illustrating an example of a transformed check matrix divided into 5×5 units.

Figure 204:
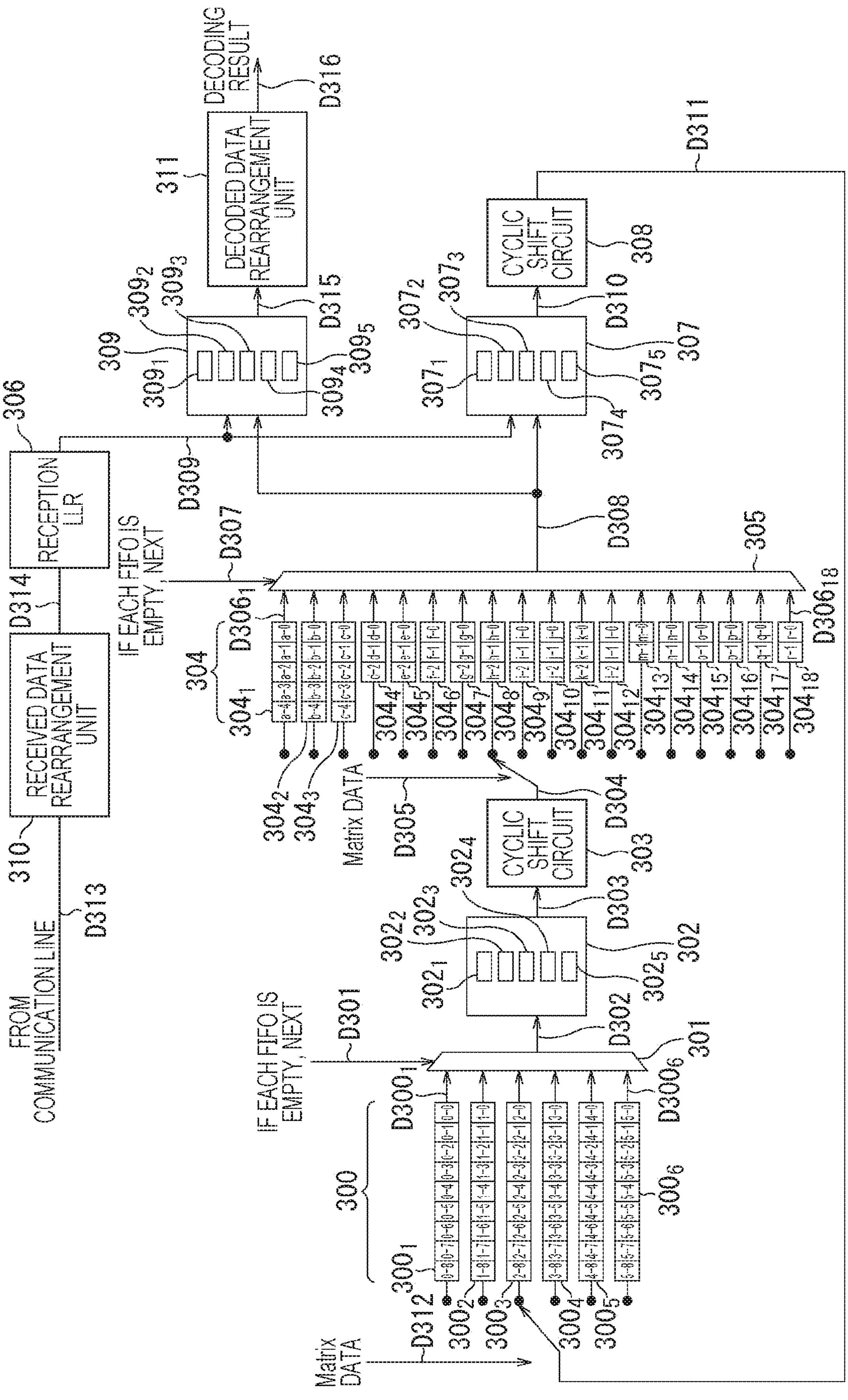

FIG. 204 is a block diagram illustrating a configuration example of a decoding device that performs P node operations collectively.

Figure 205:
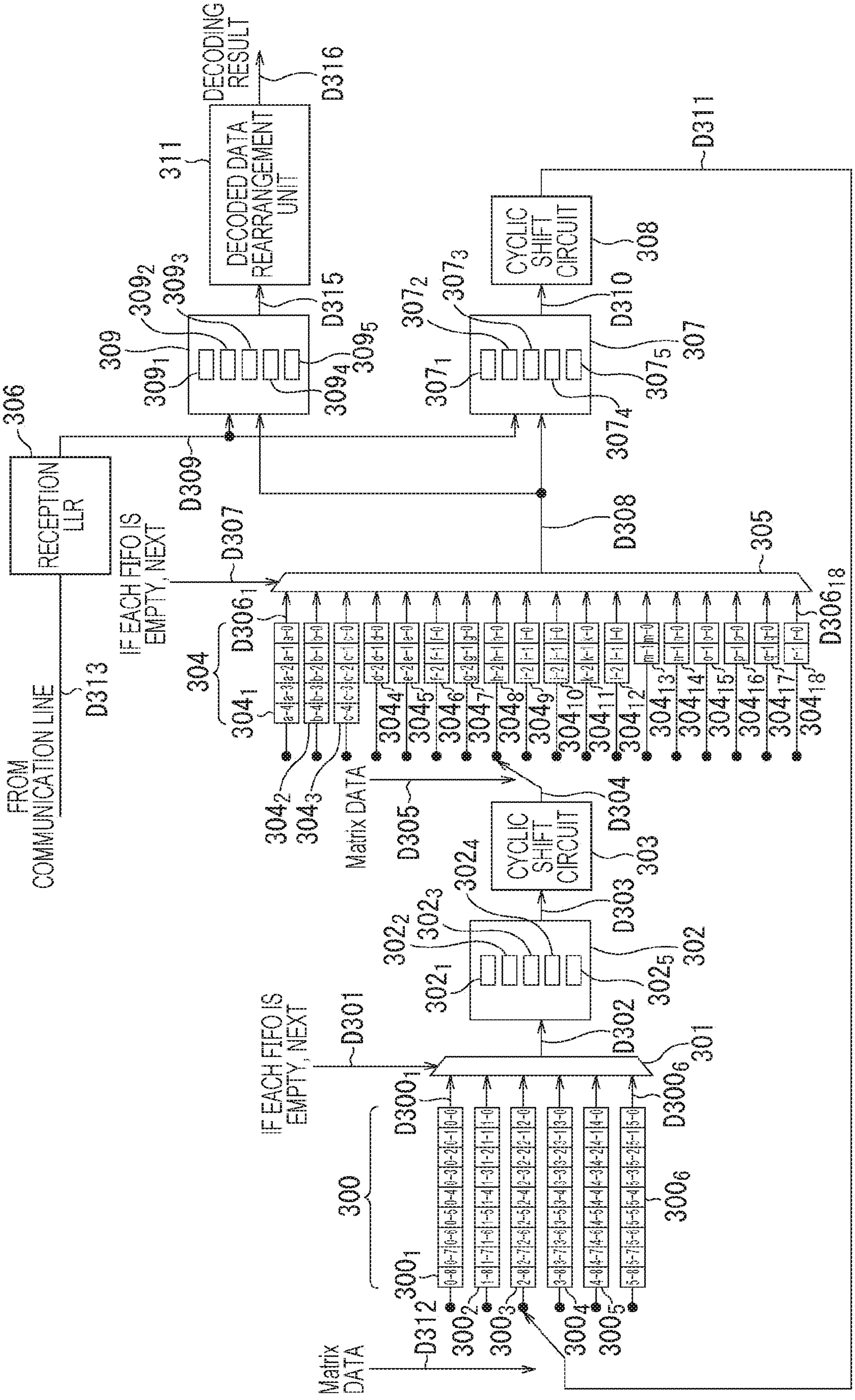

FIG. 205 is a block diagram illustrating a configuration example of an LDPC decoder 166.

Figure 206:
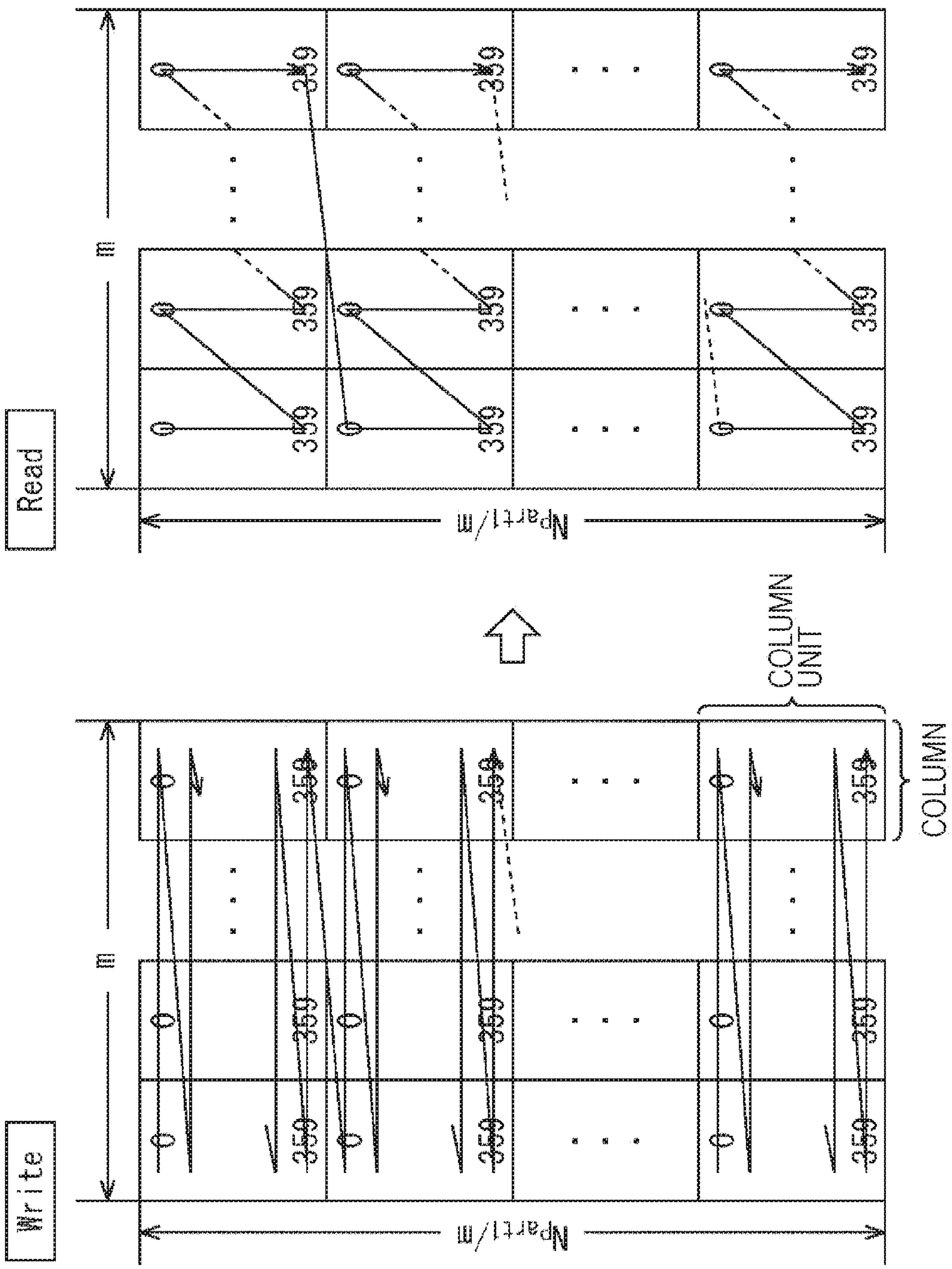

FIG. 206 is a diagram illustrating block deinterleaving performed by a block deinterleaver 54.

Figure 207:
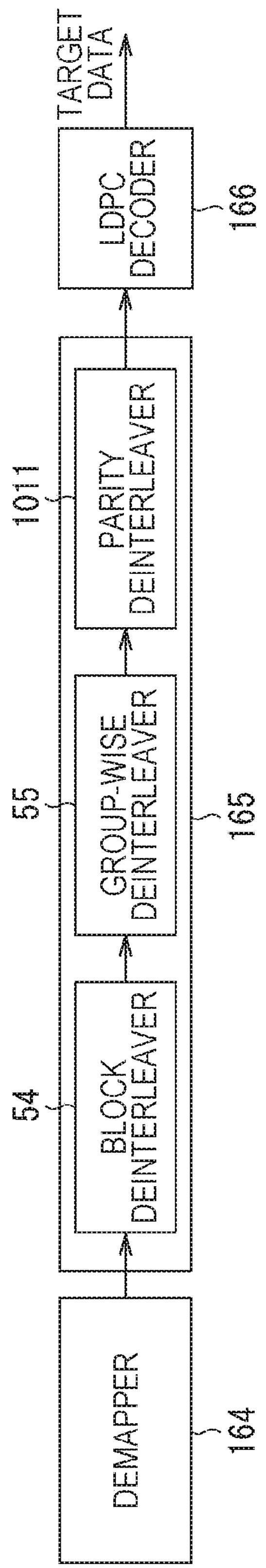

FIG. 207 is a block diagram illustrating another configuration example of a bit deinterleaver 165.

Figure 208:
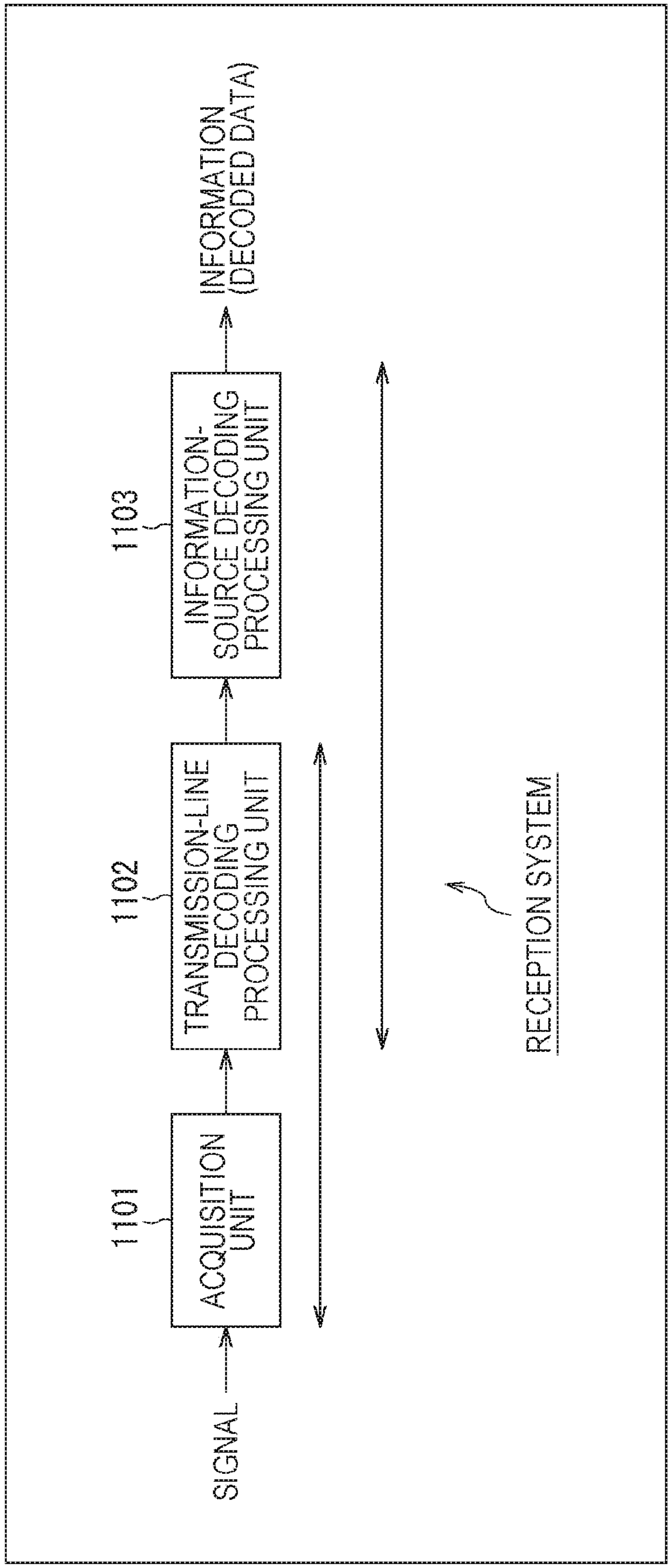

FIG. 208 is a block diagram illustrating a first configuration example of a reception system to which a reception device 12 can be applied.

Figure 209:
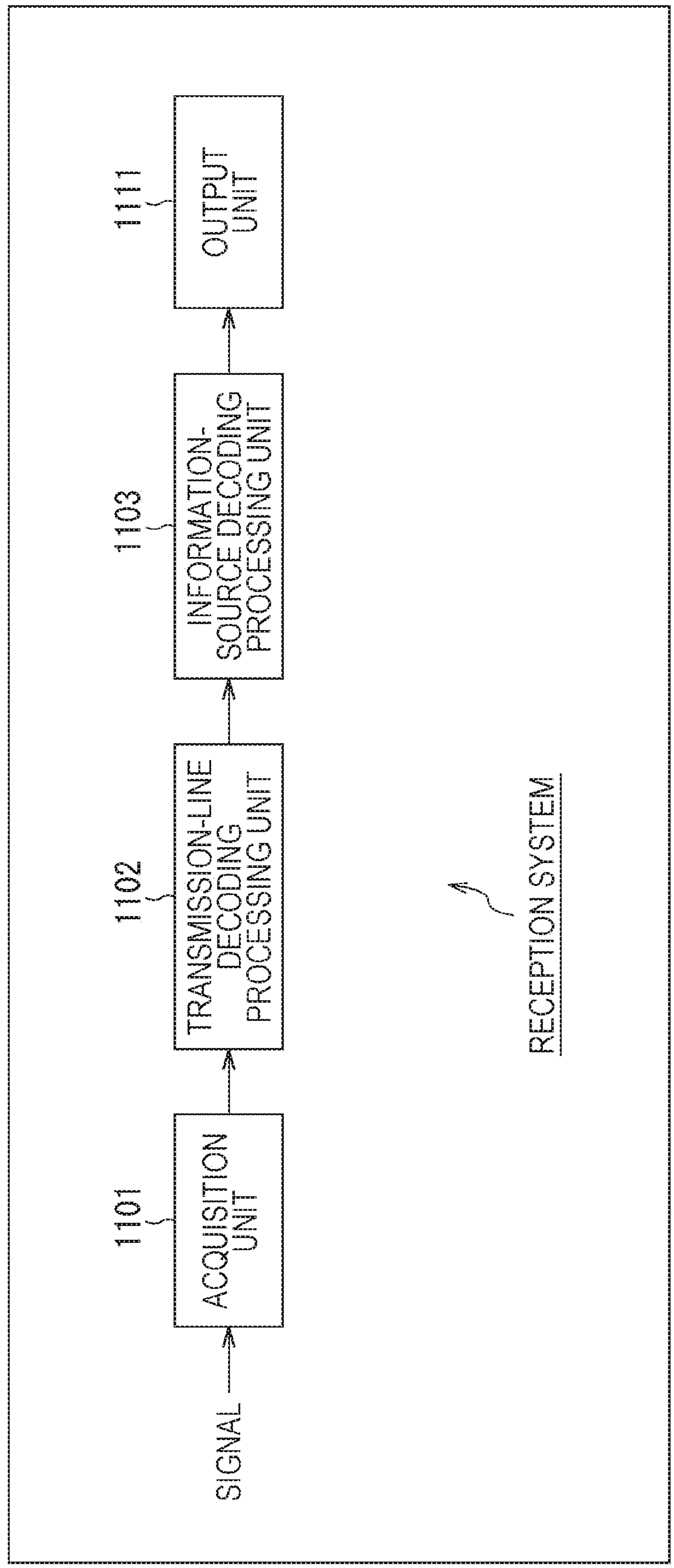

FIG. 209 is a block diagram illustrating a second configuration example of a reception system to which a reception device 12 can be applied.

Figure 210:
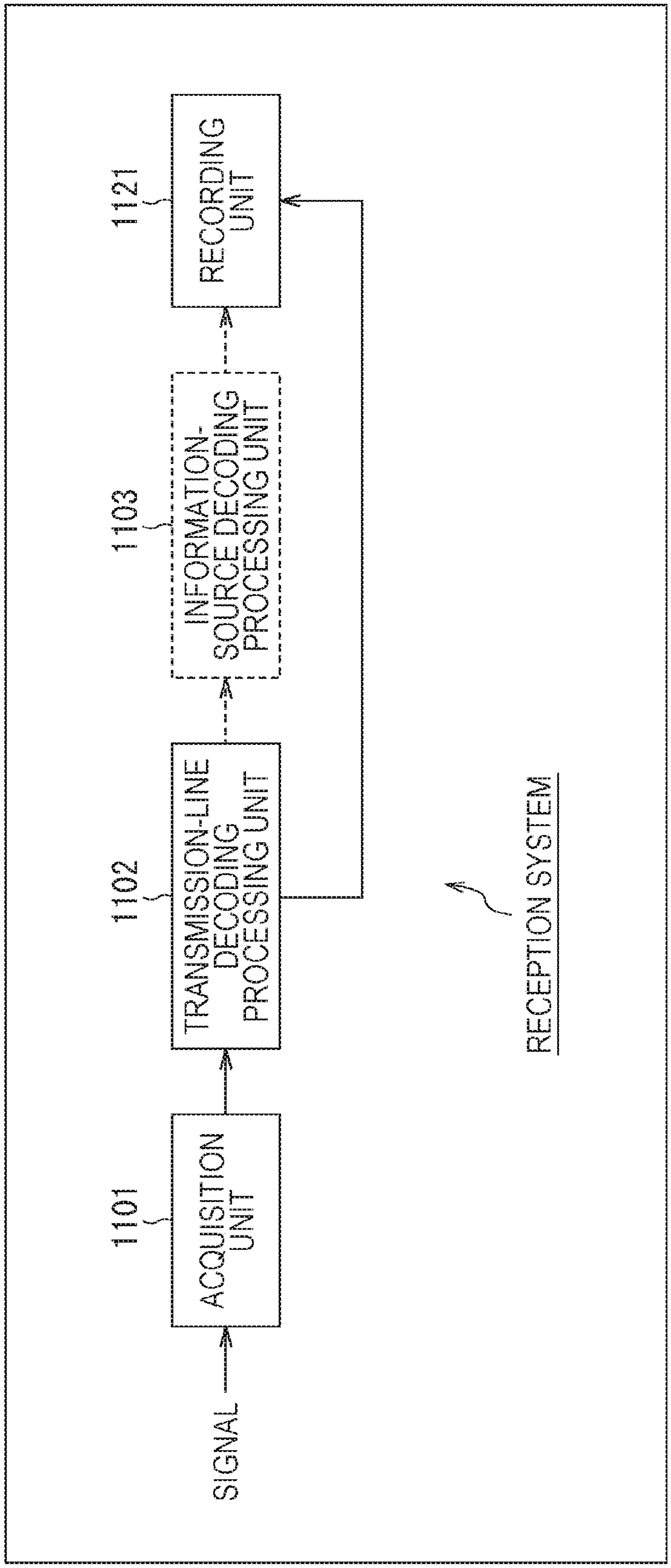

FIG. 210 is a block diagram illustrating a third configuration example of a reception system to which a reception device 12 can be applied.

Figure 211:
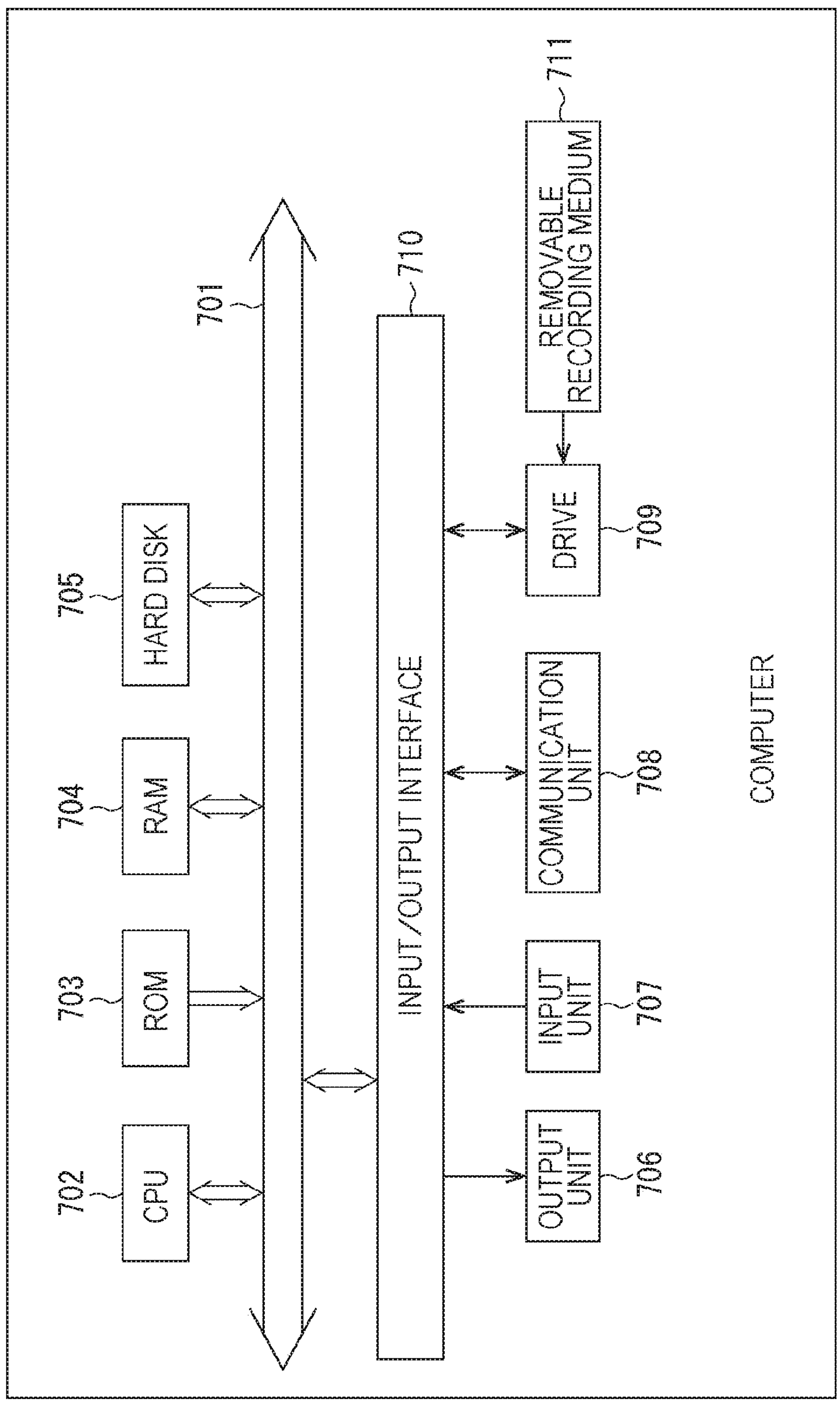

FIG. 211 is a block diagram illustrating a configuration example of an embodiment of a computer to which the present technology is applied.

MODE FOR CARRYING OUT THE INVENTION

Hereinafter, before embodiments of the present technology are described, an LDPC code will be described.

<LDPC Code>

Note that, although the LDPC code is a linear code and needs not to be binary, the LDPC code will be described herein as binary.

An LDPC code is most characterized in that a parity check matrix defining the LDPC code is sparse. Herein, a sparse matrix is a matrix of which the number of 1's of matrix elements is very small (a matrix of which most elements are 0).

Figure 1:
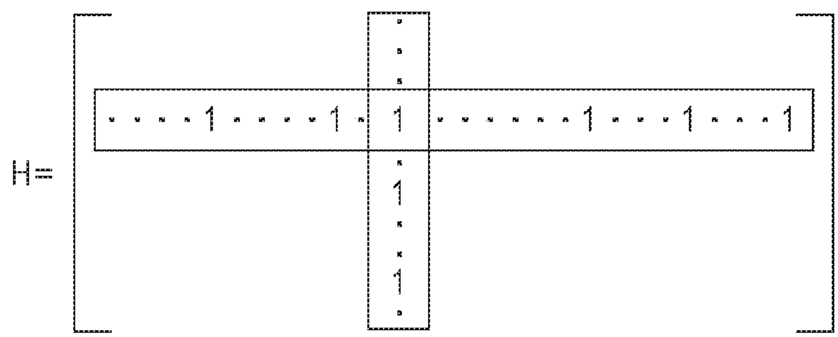
FIG. 1 is a diagram illustrating a check matrix H of an LDPC code.

FIG. 1 is a diagram illustrating an example of a check matrix H of an LDPC code.

In the check matrix H of FIG. 1, the weight (column weight) (number of 1's) of each column is "3", and the weight (row weight) of each row is "6".

In encoding (LDPC encoding) with an LDPC code, a code word (LDPC code) is generated, for example, by generating a generation matrix G on the basis of the check matrix H and multiplying the generation matrix G with binary information bits.

Specifically, the encoding device that performs the LDPC encoding first calculates a generation matrix G which satisfies the formula $GH^T=0$ between the generation matrix G and the transposed matrix $H^T$ of the check matrix H. Herein, in a case where the generation matrix G is a K×N matrix, the encoding device multiplies the generation matrix G by a bit string (vector u) of information bits including K bits to generate a code word c (=uG) including N bits. The code word (LDPC code) generated by the encoding device is received at the reception side via a predetermined communication line.

The decoding of the LDPC code is an algorithm, referred to as probabilistic decoding, proposed by Gallager and can be performed by a message passing algorithm with probabilistic propagation (belief propagation) on a so-called Tanner graph including a variable node (also called a message node) and a check node. Herein, hereinafter, as appropriate, the variable node and the check node are also simply referred to as nodes.

Figure 2:
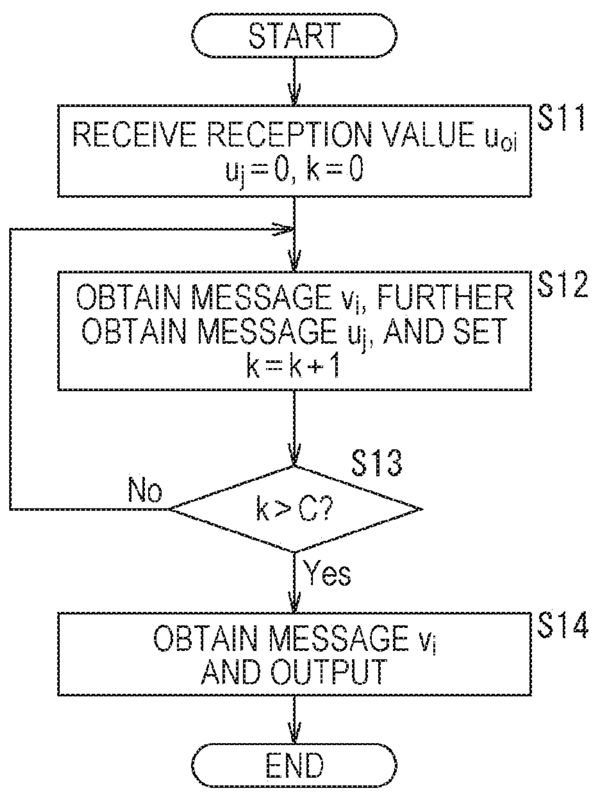
FIG. 2 is a flowchart illustrating a decoding procedure of an LDPC code.

FIG. 2 is a flowchart illustrating a procedure of the decoding of the LDPC code.

In addition, hereinafter, as appropriate, a real value (received LLR) represented by "0" likeliness of the value of the i-th code bit of the LDPC code (1 code word) received by the reception side in a log likelihood ratio is also referred to as a reception value $u_{0i}$. In addition, a message output from the check node is denoted by $u_j$, and a message output from the variable node is denoted by $v_i$.

First, in the decoding of the LDPC code, as illustrated in FIG. 2, an LDPC code is received in step S11, and a message (check node message) $u_j$ is reset to "0", and a variable k which has an integer as a counter for repeated processing is reset to "0". Then, the process proceeds to step S12. In step S12, on the basis of the reception value $u_{0i}$ obtained by receiving the LDPC code, a message (variable node message) $v_i$ is obtained by performing an operation (variable node operation) expressed by Formula (1), and in addition, on the basis of the message $v_i$, a message $u_j$ is obtained by performing an operation (check node operation) expressed by Formula (2).

[Formula 1]

$$v_i = u_{0i} + \sum_{j=1}^{d_v-1} u_j \tag{1}$$

[Formula 2]

$$\tanh\left(\frac{u_j}{2}\right) = \prod_{i=1}^{d_c-1} \tanh\left(\frac{V_i}{2}\right) \tag{2}$$

Herein, $d_v$ and $d_c$ in Formula (1) and Formula (2) are parameters that can be arbitrarily selected to indicate the number of "1s" in the vertical direction (column) and the horizontal direction (row) of the check matrix H, respectively. For example, in the case of an LDPC code ((3, 6) LDPC code) for a check matrix H with a column weight of 3 and a row weight of 6 as illustrated in FIG. 1, $d_v=3$ and $d_c=6$.

In addition, in each of the variable node operation of Formula (1) and the check node operation of Formula (2), since a message input from a branch (edge) (a line connecting a variable node and a check node) which is to output the message is not a target of operation, the range of the operation is 1 to $d_{v-1}$ or 1 to $d_{c-1}$. In addition, actually, a table of a function $R(v_1, v_2)$ expressed by Formula (3) defined by one output for two inputs $v_1$ and $v_2$ is generated in advance, and the check node operation of Formula (2) is performed by using the table continuously (recursively) as expressed by Formula (4).

[Formula 3]

$$x=2\tan h^{-1}\{\tan h(v_1/2)\tan h(v_2/2)\}=R(v_1,v_2) \tag{3}$$

[Formula 4]

$$u_j=R(v_1,R(v_2,R(v_3,\ \ldots\ R(v_{d_c-2},v_{d_c-1})))) \tag{4}$$

In step S12, furthermore, the variable k is incremented by "1", and the process proceeds to step S13. In step S13, it is determined whether or not the variable k is larger than a predetermined number C of times of repetition of the decoding. In a case where it is determined in step S13 that the variable k is not larger than C, the process returns to step S12, and similar processing is repeated.

In addition, in a case where it is determined in step S13 that the variable k is larger than C, the process proceeds to step S14, and a message $v_i$ as a decoding result to be finally output is obtained and output by performing the operation expressed by Formula (5). The decoding process of the LDPC code is ended.

[Formula 5]

$$v_i=u_{0i}+\sum_{j=1}^{d_v}u_j \tag{5}$$

Herein, unlike the variable node operation of Formula (1), the operation of Formula (5) is performed by using messages u from all the branches connected to the variable node.

FIG. 3 is a diagram illustrating an example of a check matrix H of a (3, 6) LDPC code (an encoding rate of 1/2 and a code length of 12).

In the check matrix H of FIG. 3, similarly to FIG. 1, the column weight is 3 and the row weight is 6.

Figure 4:
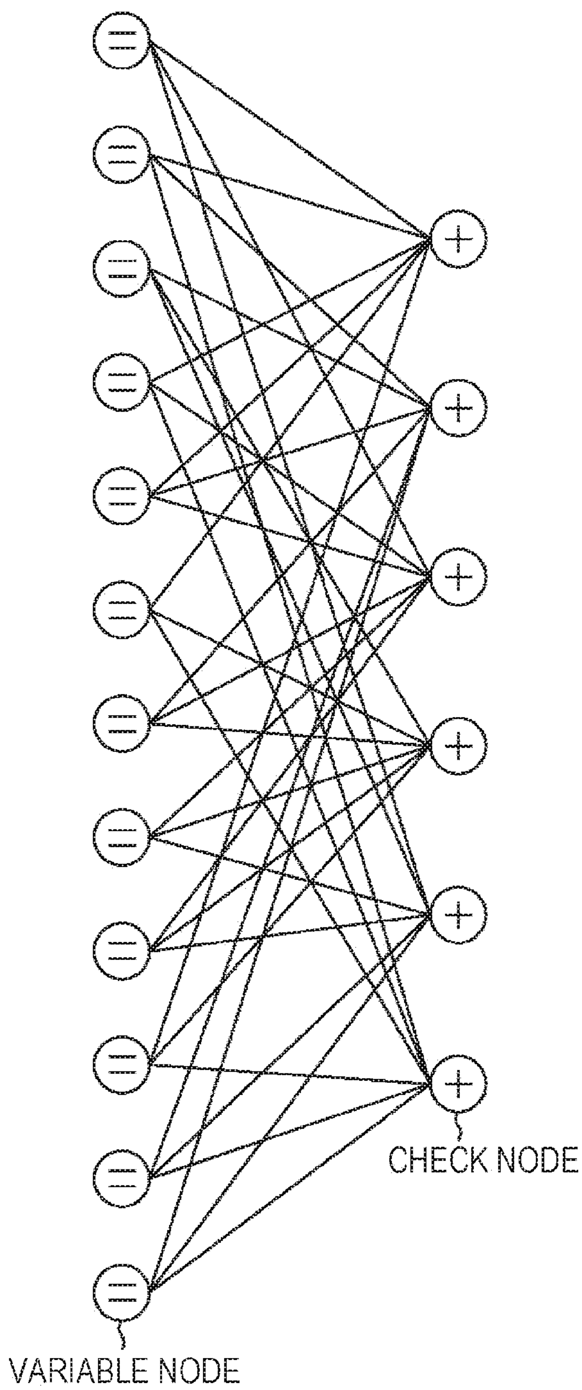
FIG. 4 is a diagram illustrating an example of a Tanner graph of a check matrix.

FIG. 4 is a diagram illustrating a Tanner graph of the check matrix H of FIG. 3.

Herein, in FIG. 4, a check node is indicated by plus "+", and a variable node is indicated by equal "=". The check nodes and variable nodes correspond to the rows and columns of the check matrix H, respectively. The connection between the check node and the variable node is a branch (edge) and corresponds to "1" of an element of the check matrix.

That is, in a case where the element of the j-th row and the i-th column of the check matrix is 1, in FIG. 4, the i-th variable node ("=" node) from the top and the j-th check node ("+" node) from the top are connected by branches. The branch indicates that the code bit corresponding to the variable node has a constraint corresponding to the check node.

In a sum product algorithm which is a decoding method of an LDPC code, a variable node operation and a check node operation are repeatedly performed.

Figure 5:
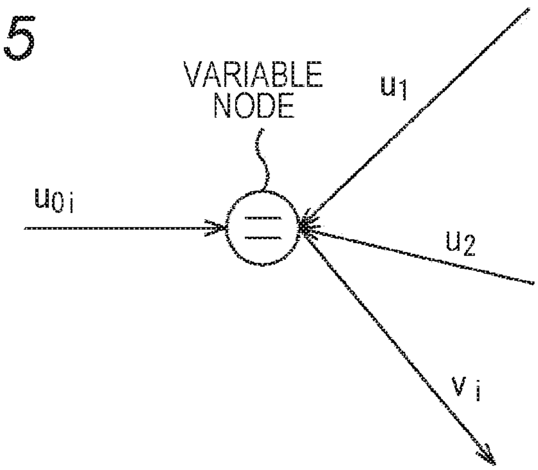
FIG. 5 is a diagram illustrating an example of a variable node.

FIG. 5 is a diagram illustrating the variable node operation performed by the variable node.

In the variable node, a message $v_i$ corresponding to the branch to be calculated is obtained by the variable node operation of Formula (1) using messages $u_1$ and $u_2$ from the remaining branches connected to the variable node and a reception value $u_{0i}$. The messages corresponding to the other branches are obtained in a similar manner.

Figure 6:
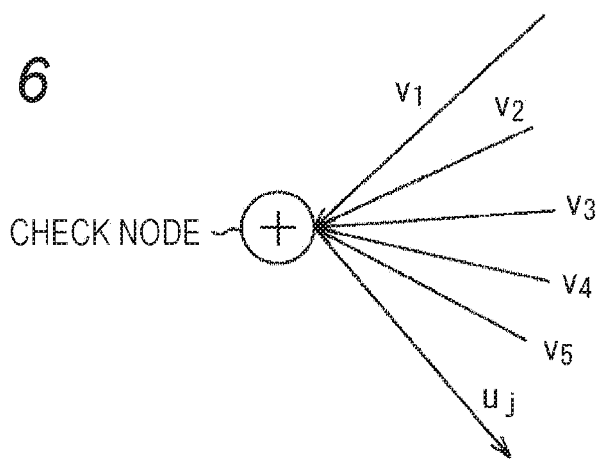
FIG. 6 is a diagram illustrating an example of a check node.

FIG. 6 is a diagram illustrating a check node operation performed by the check node.

Herein, the check node operation of Formula (2) can be written as Formula (6) by using the relationship of the formula $a\times b=\exp\{\ln(|a|)+(|b|)\}\times\mathrm{sign}(a)\times\mathrm{sign}(b)$. However, sign (x) is 1 when $x\geq 0$, and $-1$ when $x<0$.

[Formula 6]

$$\begin{aligned} u_j &= 2\tanh^{-1}\left(\prod_{i=1}^{d_c-1}\tanh\left(\frac{v_i}{2}\right)\right) \\ &= 2\tanh^{-1}\left[\exp\left\{\sum_{i=1}^{d_c-1}\ln\left(\left|\tanh\left(\frac{v_i}{2}\right)\right|\right)\right\}\times\prod_{i=1}^{d_c-1}\mathrm{sign}\left(\tanh\left(\frac{v_i}{2}\right)\right)\right] \\ &= 2\tanh^{-1}\left[\exp\left\{-\left(\sum_{i=1}^{d_c-1}-\ln\left(\tanh\left(\frac{|v_i|}{2}\right)\right)\right)\right\}\right]\times\prod_{i=1}^{d_c-1}\mathrm{sign}(v_i) \end{aligned} \tag{6}$$

When $x\geq 0$, if the function $\phi(x)$ is defined as the formula $\phi(x)=\ln(\tan h(x/2))$, the formula $\phi^{-1}(x)=2\tan h^{-1}(e^{-x})$ is satisfied, and thus, Formula (6) can be transformed into Formula (7).

[Formula 7]

$$u_j=\phi^{-1}\left(\sum_{i=1}^{d_c-1}\phi(|v_i|)\right)\times\prod_{i=1}^{d_c-1}\mathrm{sign}(v_i) \tag{7}$$

In the check node, the check node operation of Formula (2) is performed according to Formula (7).

That is, in the check node, as illustrated in FIG. 6, the message $u_j$ corresponding to the branch to be calculated can be obtained by the check node operation of Formula (7) using messages $v_1$, $v_2$, $v_3$, $v_4$, and $v_5$ from the remaining branches connected to the check node. The messages corresponding to the other branches are obtained in a similar manner.

In addition, the function $\phi(x)$ of Formula (7) can be expressed by the formula $\phi(x)=\ln((e^x+1)/(e^{x-1}))$, and when $x>0$, $\phi(x)=\phi^{-1}(x)$. When the functions $\phi(x)$ and $\phi^{-1}(x)$ are implemented by hardware, the functions may be implemented by using a look up table (LUT), but both become the same LUT.

<Configuration Example of Transmission System to which the Present Technology is Applied>

Figure 7:
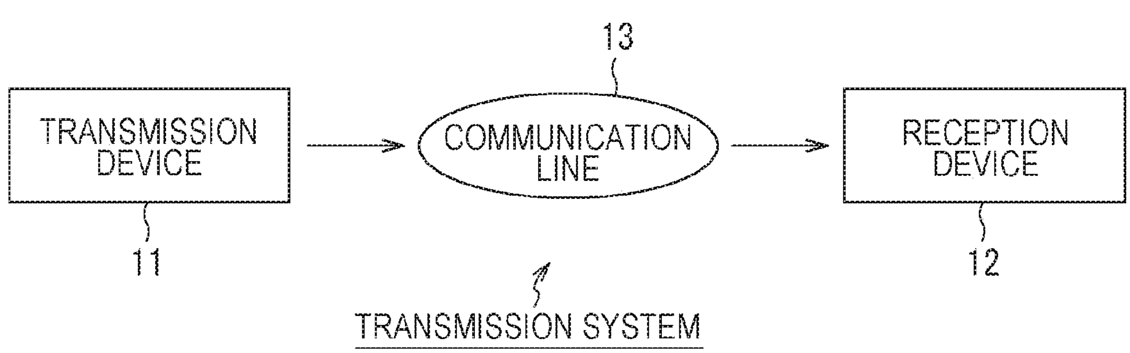
FIG. 7 is a diagram illustrating a configuration example of an embodiment of a transmission system to which the present technology is applied.

FIG. 7 is a diagram illustrating a configuration example of an embodiment of a transmission system (herein, a system is a logical aggregation of a plurality of devices, regardless of whether or not devices of respective configurations exist in the same housing) to which the present technology is applied.

In FIG. 7, the transmission system includes a transmission device 11 and a reception device 12.

The transmission device 11 performs transmitting (broadcasting) (transferring) of, for example, a program of television broadcasting or the like. That is, the transmission device 11 encodes a target data to be transmitted, for example, an image data, an audio data, or the like as the program into an LDPC code and transmits the LDPC code via a communication line 13 such as a satellite line, a terrestrial wave line, or a cable (wired line).

The reception device 12 receives the LDPC code transmitted from the transmission device 11 via the communication line 13, decodes the LDPC code to a target data, and outputs the decoded data.

Herein, it is known that the LDPC code used in the transmission system of FIG. 7 exhibits extremely high capability in an additive white gaussian noise (AWGN) transmission line.

On the other hand, in the communication line 13, there may occur a burst error and erasure. For example, in a case where the communication line 13 is a terrestrial wave line, particularly, in an orthogonal frequency division multiplexing (OFDM) system, in a multi-path environment where a desired to undesired ratios (D/U) is 0 dB ("undesired=echo" power is equal to "desired=main path" power), the power of a specific symbol may be 0 (erasure) depending on the delay of echo (paths other than the main path).

In addition, even in a flutter (a transmission line in which a delay is 0 and an echo with Doppler frequency is added), in a case where the D/U is 0 dB, there may occur a case where the power of the entire symbol of the OFDM at a specific time may be 0 (erasure) due to the Doppler frequency.

Furthermore, there may occur a burst error due to a wiring condition from a reception unit (not illustrated) such as an antenna that receives a signal from the transmission device 11 to the reception device 12 on the side of the reception device 12 or instability of the power supply of the reception device 12.

On the other hand, in the decoding of the LDPC code, in the columns of the check matrix H and hence the variable nodes corresponding to the code bits of the LDPC code, as illustrated in FIG. 5, since the variable node operation of Formula (1) along with the addition of (the reception value $u_{0i}$ of) the code bit of the LDPC code is performed, if an error occurs in the code bit used for the variable node operation, the accuracy of the message to be obtained is lowered.

Then, in the decoding of the LDPC code, in the check node, since the check node operation of Formula (7) is performed by using the message obtained by the variable node connected to the check node, if the number of check nodes at which a plurality of the connected variable nodes (the code bits of the LDPC code corresponding to the variable nodes) simultaneously causes errors (including erasures) is increased, the decoding performance is deteriorated.

That is, for example, if two or more of the variable nodes connected to the check node simultaneously cause erasures, a message indicating that the probability having a value of 0 and the probability having a value of 1 are equal probability is returned to the all the variable nodes. In this case, the check node returning a message indicating equal probability does not contribute to one decoding process (one set of the variable node operation and the check node operation), and as a result, it requires a large number of repetitions of the decoding process. Therefore, the decoding performance is deteriorated, and the power consumption of the reception device 12 that decodes the LDPC code is increased.

Therefore, in the transmission system of FIG. 7, it is possible to improve the resistance to burst errors and erasure while maintaining the performance in the AWGN transmission line (AWGN channel).

<Configuration Example of Transmission Device 11>

Figure 8:
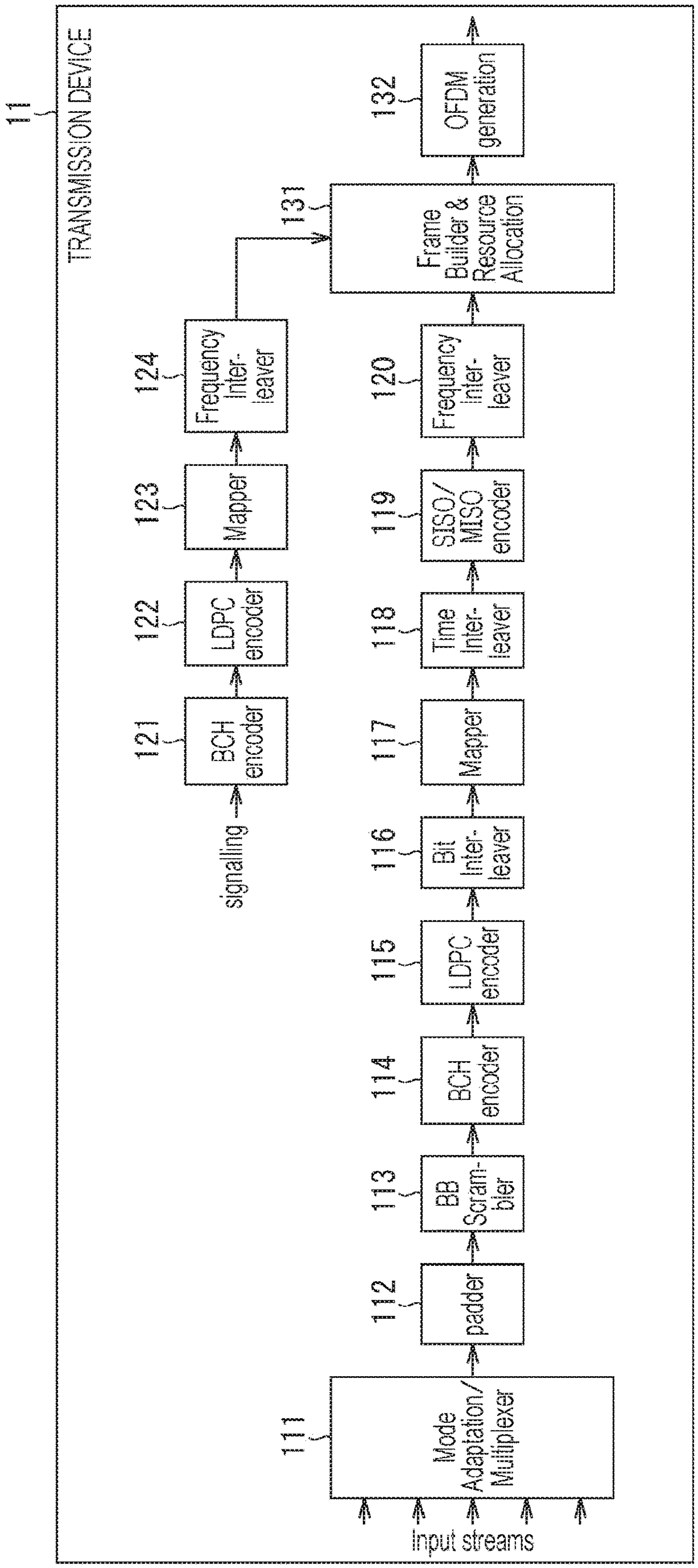
FIG. 8 is a block diagram illustrating a configuration example of a transmission device 11.

FIG. 8 is a block diagram illustrating a configuration example of the transmission device 11 of FIG. 7.

In the transmission device 11, one or more input streams as a target data are supplied to a mode adaptation/multiplexer 111.

The mode adaptation/multiplexer 111 performs processing such as mode selection and multiplexing of one or more input streams supplied to the mode adaptation/multiplexer as necessary and supplies the data obtained as a result thereof to a padder 112.

The padder 112 performs necessary zero-padding (null inserting) on the data from the mode adaptation/multiplexer 111 and supplies the data obtained as a result thereof to a BB scrambler 113.

The BB scrambler 113 performs base-band (BB) Scrambling on the data from the padder 112 and supplies the data obtained as a result thereof to a BCH encoder 114.

The BCH encoder 114 performs BCH encoding on the data from the BB scrambler 113 and supplies the data obtained as a result thereof to an LDPC encoder 115 as an LDPC target data to be subjected to LDPC encoding.

The LDPC encoder 115 performs, on the LDPC target data from the BCH encoder 114, LDPC encoding according to a check matrix or the like in which, for example, a parity matrix which is a portion corresponding to parity bits of an LDPC code has a staircase structure (dual diagonal structure) and outputs an LDPC code in which the LDPC target data is set as an information bit.

That is, the LDPC encoder 115 performs LDPC encoding to encode the LDPC target data into the LDPC code (corresponding to the check matrix) defined in a predetermined DVB-S.2, DVB-T.2, DVB-C.2, ATSC 3.0 standard, or the like and other LDPC codes, for example, and outputs the LDPC code obtained as a result thereof.

Herein, the LDPC code defined in the DVB-S 0.2 or ATSC 3.0 standard and the LDPC code to be adopted in the ATSC 3.0 standard are irregular repeat accumulate (IRA) codes, and (a portion or all of) the parity matrix in the check matrix of the LDPC code has a staircase structure. The parity matrix and the staircase structure will be described later. In addition, the IRA codes are disclosed in, for example, "Irregular Repeat-Accumulate Codes," H. Jin, A. Khandekar, and R. J. McEliece, in Proceedings of 2nd International Symposium on Turbo codes and Related Topics, pp. 1-8, September 2000.

The LDPC code output from the LDPC encoder 115 is supplied to a bit interleaver 116.

The bit interleaver 116 performs bit interleaving described later on the LDPC code from the LDPC encoder 115 and supplies the LDPC code after the bit interleaving to a mapper 117.

The mapper 117 maps the LDPC code from the bit interleaver 116 to a signal point indicating one symbol of quadrature modulation in units of code bits of one or more bits of the LDPC code (in units of a symbol) and performs quadrature modulation (multiple value modulation).

That is, the mapper 117 performs quadrature modulation by mapping the LDPC code from the bit interleaver 116 to signal points determined in a modulation scheme, in which the quadrature modulation of the LDPC code is to be performed, on a constellation which is an IQ plane defined by an I-axis indicating an I component in phase with the carrier wave and a Q-axis indicating a Q component perpendicular to the carrier wave.

In a case where the number of signal points of constellation used in the modulation scheme of the quadrature modulation performed by the mapper 117 is $2^m$, in the mapper 117, the code bits of m bits of the LDPC code are used as a symbol (one symbol), and the LDPC code from the bit interleaver 116 is mapped to a signal point indicating a symbol among $2^m$ signal points in units of a symbol.

Herein, as a modulation scheme of the quadrature modulation performed by the mapper 117, for example, there may be exemplified a modulation scheme defined in the DVB-S.2 standard, the ATSC3.0 standard, or the like, other modulation schemes, that is, for example, binary phase shift keying (BPSK), quadrature phase shift keying (QPSK), 8 phase-shift keying (PSK), 16 amplitude phase-shift keying (APSK), 32 APSK, 16 quadrature amplitude modulation (QAM), 64 QAM, 256 QAM, 1024 QAM, 4096 QAM, 4 pulse amplitude modulation (PAM) and the like. In the mapper 117, which modulation scheme is used to perform the quadrature modulation is set in advance, for example, in accordance with the operation of the operator of the transmission device 11 or the like.

The data (the mapping result of mapping the symbols to the signal points) obtained by the processing in the mapper 117 is supplied to a time interleaver 118.

The time interleaver 118 performs time interleaving (interleaving in the time direction) on the data from the mapper 117 in units of a symbol and supplies the data obtained as a result thereof to a single input single output/multiple input single output (SISO/MISO) encoder 119].

The SISO/MISO encoder 119 performs space-time encoding on the data from the time interleaver 118 and supplies the data to a frequency interleaver 120.

The frequency interleaver 120 performs frequency interleaving (interleaving in the frequency direction) on the data from the SISO/MISO encoder 119 in units of a symbol and supplies the data to a frame builder & resource allocation unit 131.

On the other hand, for example, control data (signaling) for transmission control such as base band (BB) signaling (BB leader) is supplied to the BCH encoder 121.

The BCH encoder 121 performs BCH encoding on the control data supplied there to the BCH encoder in a similar manner to the BCH encoder 114 and supplies the data obtained as a result thereof to the LDPC encoder 122.

The LDPC encoder 122 performs LDPC encoding on the data from the BCH encoder 121 as an LDPC target data in a similar manner to the LDPC encoder 115 and supplies the LDPC code obtained as a result thereof to the mapper 123.

Similarly to the mapper 117, the mapper 123 maps the LDPC code from the LDPC encoder 122 to a signal point indicating one symbol of quadrature modulation in units of code bits of one or more bits of the LDPC code (in units of a symbol) to per quadrature modulation and supplies the data obtained as a result thereof to frequency interleaver 124.

Similarly to the frequency interleaver 120, the frequency interleaver 124 performs frequency interleaving on the data from the mapper 123 in units of a symbol and supplies the data to the frame builder & resource allocation unit 131.

The frame builder & resource allocation unit 131 inserts symbols of pilots at necessary positions of data (symbols) from the frequency interleavers 120 and 124, configures a frame (for example, a physical layer (PL) frame, a T2 frame, a C2 frame, or the like) configured by a predetermined number of the symbols from the data (symbols) obtained as a result thereof, and supplied the frame to an OFDM generation unit (OFDM generation) 132.

The OFDM generation unit 132 generates an OFDM signal corresponding to the frame from the frame from the frame builder & resource allocation unit 131 and transmits the OFDM signal via the communication line 13 (FIG. 7).

In addition, the transmission device 11 may be configured without providing a portion of the blocks illustrated in FIG. 8 of, for example, the time interleaver 118, the SISO/MISO encoder 119, the frequency interleaver 120, the frequency interleaver 124, and the like.

<Configuration Example of Bit Interleaver 116>

Figure 9:
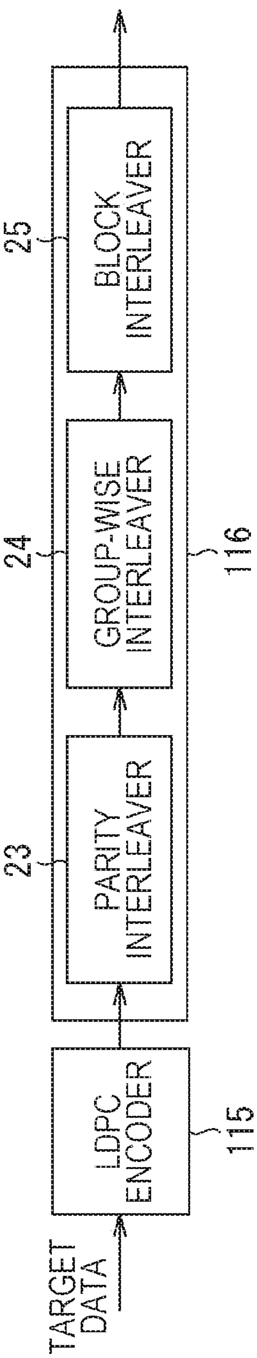
FIG. 9 is a block diagram illustrating a configuration example of a bit interleaver 116.

FIG. 9 is a block diagram illustrating a configuration example of the bit interleaver 116 of FIG. 8.

The bit interleaver 116 has a function of interleaving data, and includes a parity interleaver 23, a group-wise interleaver 24, and a block interleaver 25.

The parity interleaver 23 performs parity interleaving in which the parity bits of the LDPC code from the LDPC encoder 115 are interleaved at the positions of other parity bits and supplies the LDPC code after the parity interleaving to the group-wise interleaver 24.

The group-wise interleaver 24 performs group-wise interleaving on the LDPC code from the parity interleaver 23 and supplies the LDPC code after the group-wise interleaving to the block interleaver 25.

Herein, in the group-wise interleaving, 360 bits of one division obtained by dividing the LDPC codes corresponding to one code in units of 360 bits which are equal to the unit size P described later from the lead thereof are set as a bit group, and the LDPC codes from the parity interleaver 23 are interleaved in units of bit groups.

As compared with the case where the group-wise interleaving is not performed, in the case where the group-wise interleaving is performed, the error rate can be improved, and as a result, good communication quality can be ensured in the data transmission.

The block interleaver 25 performs the block interleaving to demultiplex the LDPC code from the group-wise interleaver 24 and symbolizes the LDPC code corresponding to, for example, one code with m-bit symbols which is a unit of mapping to supply the symbol to the mapper 117 (FIG. 8).

Herein, in the block interleaving, with respect to a storage area where columns, of which the number is equal to the number of bits m of the symbol, as the storage area for storing a predetermined number of bits, for example, in the column (vertical) direction are arranged in the row (horizontal) direction, the LDPC code from the group-wise interleaver 24 is written in the column direction and read in the row direction, so that the LDPC code is symbolized with the m-bit symbols.

<Check Matrix of LDPC Code>

Figure 10:
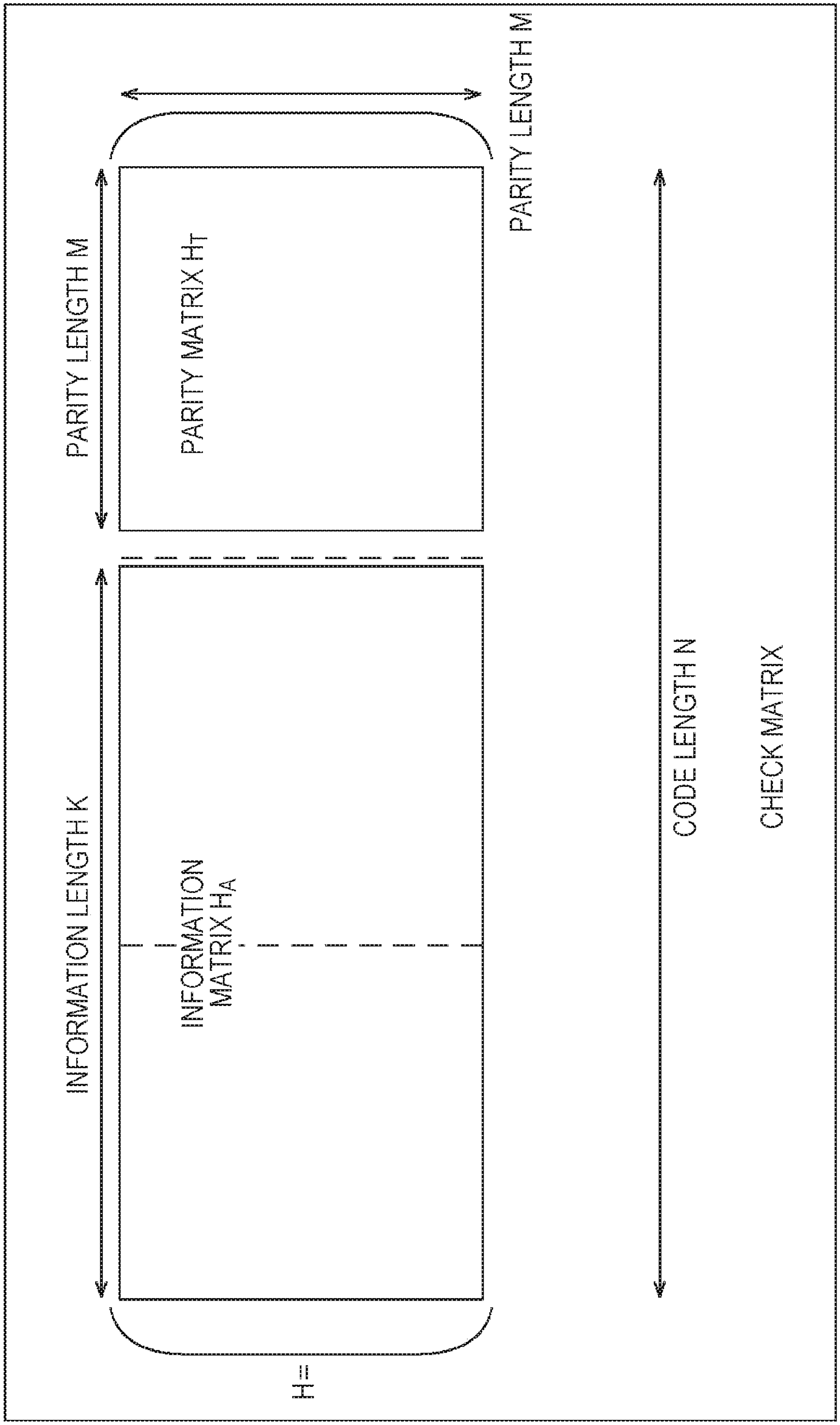
FIG. 10 is a diagram illustrating an example of a check matrix.

FIG. 10 is a diagram illustrating an example of a check matrix H used for LDPC encoding in the LDPC encoder 115 of FIG. 8.

The check matrix H has a low-density generation matrix (LDGM) structure and can be indicated by an information matrix $H_A$ of a portion corresponding to information bits among code bits of the LDPC code and a parity matrix $H_T$ corresponding to parity bits with a formula $H=[H_A|H_T]$ (a matrix in which elements of the information matrix $H_A$ are elements on the left and elements of the parity matrix $H_T$ are elements on the right).

Herein, the number of bits of the information bits and the number of bits of the parity bits among the code bits of the LDPC code (one code word) of one code are referred to as an information length K and a parity length M, respectively, and the number of bits of the code bits of one LDPC code (one code word) is referred to as a code length N (=K+M).

The information length K and the parity length M for an LDPC code with a certain code length N are determined by the encoding rate. In addition, the check matrix H becomes an M×N (rows×columns) matrix (M-row N-column matrix). Then, the information matrix $H_A$ becomes an M×K matrix, and the parity matrix $H_T$ becomes an M×M matrix.

Figure 11:
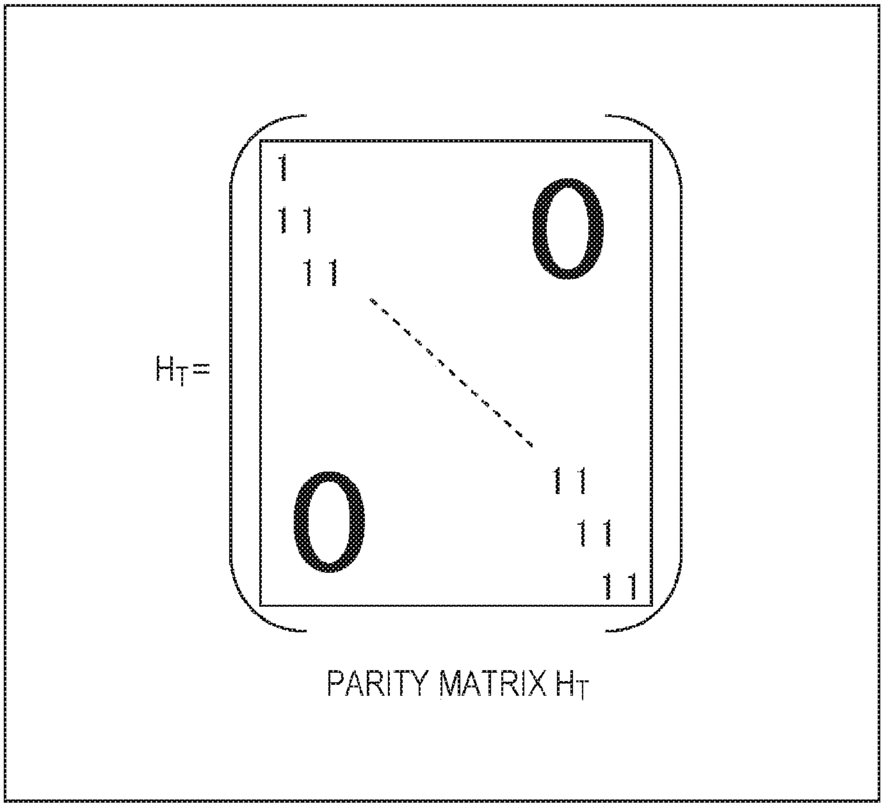
FIG. 11 is a diagram illustrating an example of a parity matrix.

FIG. 11 is a diagram illustrating an example of a parity matrix $H_T$ of a check matrix H used for LDPC encoding in the LDPC encoder 115 of FIG. 8.

As the parity matrix $H_T$ of the check matrix H used for LDPC encoding in the LDPC encoder 115, for example, a parity matrix $H_T$ similar to that of the check matrix H of the LDPC code defined in the DVB-T.2 standard or the like can be adopted.

As illustrated in FIG. 11, the parity matrix $H_T$ of the check matrix H of the LDPC code defined in the DVB-T.2 standard or the like is a matrix (lower bidiagonal matrix) having a staircase structure in which the elements of 1 are arranged in a staircase shape. The row weight of the parity matrix $H_T$ is 1 for the first row and 2 for all the remaining rows. In addition, the column weight is 1 for the last one column and 2 for all remaining columns.

As described above, the LDPC code of the check matrix H in which the parity matrix $H_T$ has a staircase structure can be easily generated by using the check matrix H.

That is, an LDPC code (one code word) is indicated by a row vector c, and a column vector obtained by transposing the row vector is indicated as $c^T$. In addition, in the row vector c which is an LDPC code, a portion of information bits is indicated by a row vector A, and a portion of parity bits is indicated by a row vector T.

In this case, the row vector c can be indicated by the row vector A as information bits and the row vector T as parity bits with a formula c=[A|T] (elements of the row vector A are elements of the left and elements of the row vector T are the elements on the right).

The check matrix H and the row vector c=[A|T] as the LDPC code need to satisfy a formula $Hc^T=0$, and in a case where the parity matrix $H_T$ of the check matrix $H=[H_A|H_T]$ has the staircase structure illustrated in FIG. 11, a row vector T as the parity bits constituting the row vector c=[A|T] satisfying the formula $Hc^T=0$ can be obtained sequentially (in order) by setting the elements of each row to 0 in order from the element of the first row of the column $Hc^T$ in the formula $Hc^T=0$.

Figure 12:
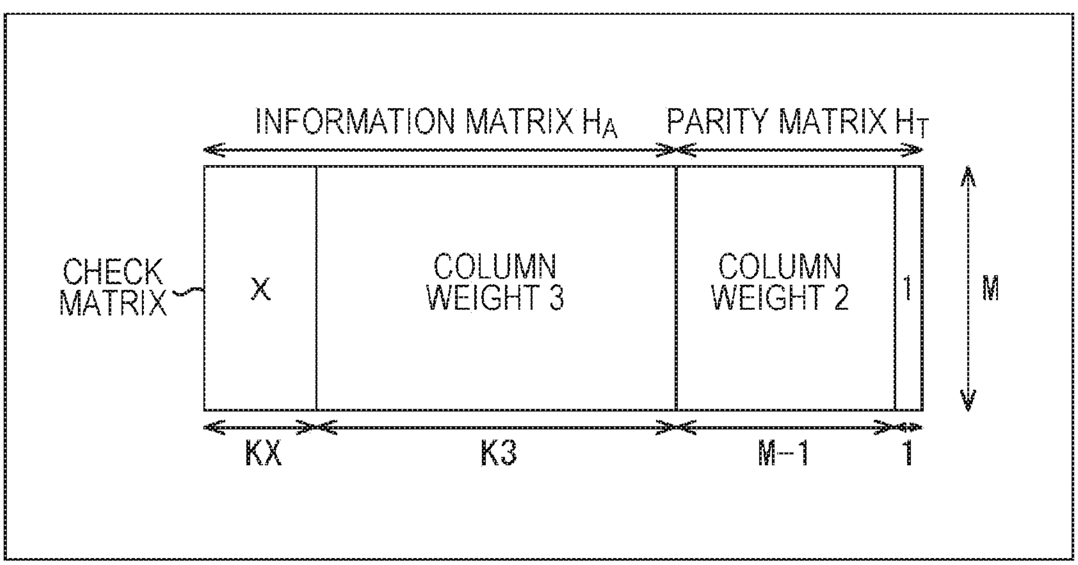
FIG. 12 is a diagram illustrating a check matrix of an LDPC code defined in the DVB-T.2 standard.

FIG. 12 is a diagram illustrating a check matrix H of an LDPC code defined in the DVB-T.2 standard or the like.

For the KX columns from the first column of the check matrix H of the LDPC code defined in the DVB-T.2 standard or the like, the column weight is X. For the subsequent K3 column, the column weight is 3. For the subsequent (M−1) column, the column weight is 2. For the last 1 column, the column weight is 1.

Herein, KX+K3+M−1+1 is equal to the code length N.

FIG. 13 is a diagram illustrating the number of columns KX, K3 and M and the column weight X for each encoding rate r of the LDPC code defined in the DVB-T.2 standard or the like.

In the DVB-T.2 standard or the like, LDPC codes with a code length N of 64800 bits and 16200 bits are defined.

Then, for the LDPC code with a code length N of 64800 bits, 11 encoding rates (nominal rate) of 1/4, 1/3, 2/5, 1/2, 3/5, 2/3, 3/4, 4/5, 5/6, 8/9, and 9/10 are defined, and for the LDPC code with a code length N of 16200 bits, 10 encoding rates of 1/4, 1/3, 2/5, 1/2, 3/5, 2/3, 3/4, 4/5, 5/6, and 8/9 are defined.

Herein, hereinafter, the code length N of 64800 bits is also referred to as 64 k bits, and the code length N of 16200 bits is also referred to as 16 k bits.

For an LDPC code, the error rate tends to be lower for code bits corresponding to columns with larger column weights of the check matrix H.

In the check matrix H defined in the DVB-T.2 standard or the like illustrated in FIGS. 12 and 13, the column weight tends to be larger at a column closer to the lead side (left side), and thus, for an LDPC code corresponding to the check matrix H, a code bit closer to the lead is invulnerable to errors (more resistant to errors), and a code bit closer to the last is more vulnerable to errors.

<Parity Interleaving>

The parity interleaving by the parity interleaver 23 of FIG. 9 will be described with reference to FIGS. 14, 15A, 15B, and 16.

Figure 14:
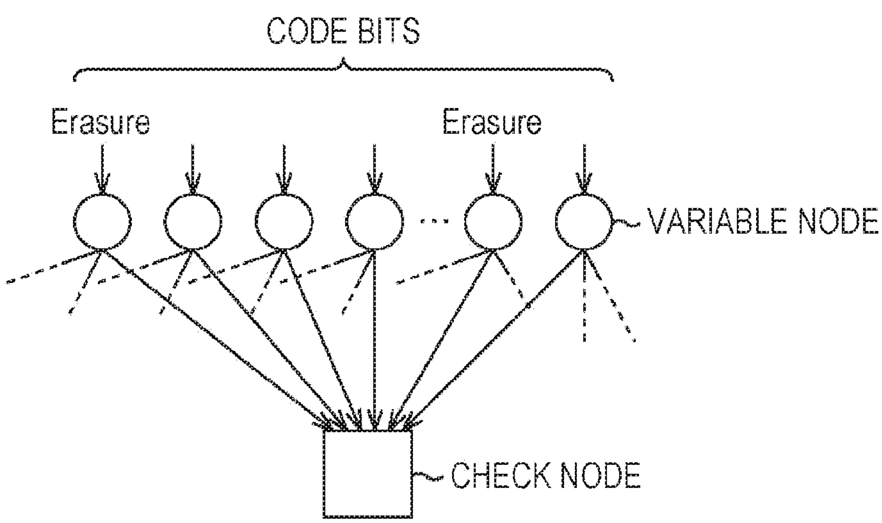
FIG. 14 is a diagram illustrating an example of a Tanner graph for decoding of an LDPC code.

FIG. 14 is a diagram illustrating an example of (a portion of) a Tanner graph of a check matrix of an LDPC code.

As illustrated in FIG. 14, if a plurality such as two of (code bits corresponding to) the variable nodes connected to the check node simultaneously causes errors such as erasures, a message indicating that the probability having a value of 0 and the probability having a value of 1 are equal probability is returned to the all the variable node connected to the check node. For this reason, if a plurality of variable nodes connected to the same check node simultaneously becomes erasures or the like, the decoding performance is deteriorated.

By the way, similarly to the LDPC code defined in the DVB-T.2 standard or the like, the LDPC code output from the LDPC encoder 115 in FIG. 8 is, for example, an IRA code, and as illustrated in FIG. 11, the parity matrix $H_T$ of the check matrix H has a staircase structure.

Figure 15A:
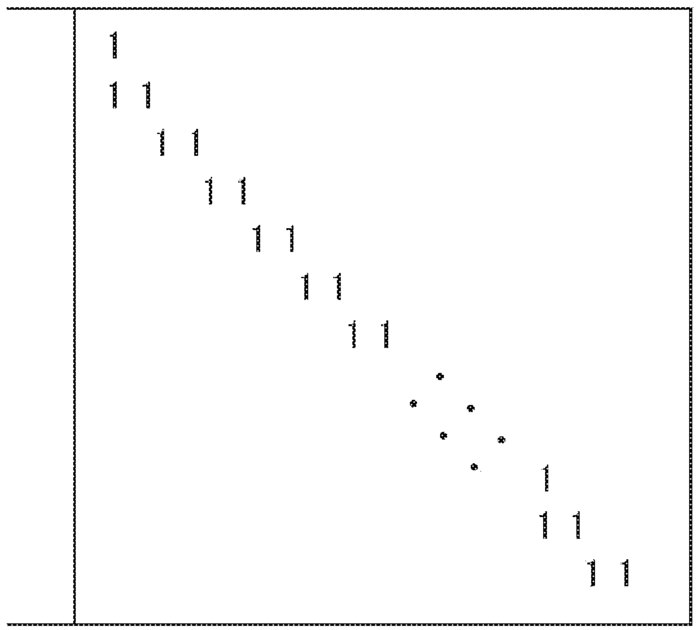
FIGS. 15A and 15B are diagrams illustrating an example of a parity matrix HT having a staircase structure and a Tanner graph corresponding to the parity matrix HT.
Figure 15B:
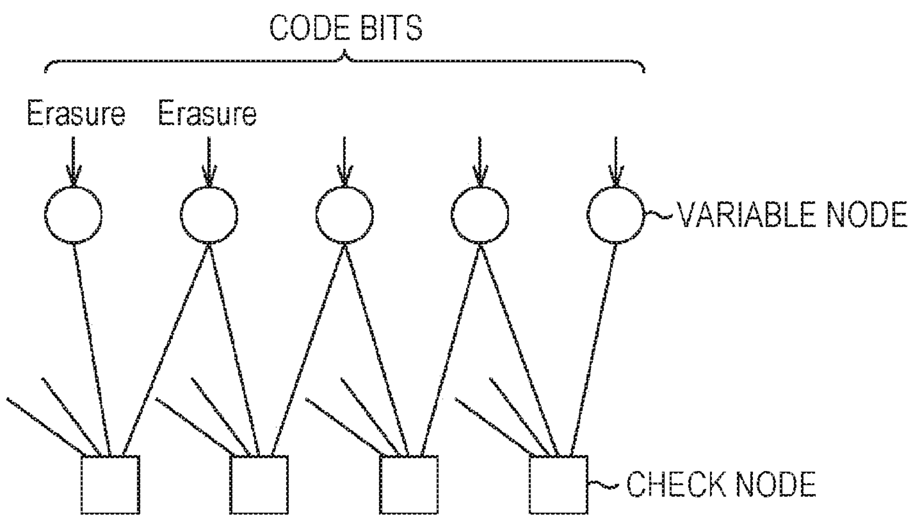

FIGS. 15A and 15B are diagrams illustrating an example of a parity matrix HT having a staircase structure as illustrated in FIG. 11 and a Tanner graph corresponding to the parity matrix HT.

FIG. 15A illustrates an example of the parity matrix HT having a staircase structure, and FIG. 15B illustrates a Tanner graph corresponding to the parity matrix HT of FIG. 15A.

In the parity matrix $H_T$ having a staircase structure, in each row, one element is adjacent (except for the first row). For this reason, in the Tanner graph of the parity matrix $H_T$, two adjacent variable nodes corresponding to the column of two adjacent elements in which the value of the parity matrix $H_T$ is 1 are connected to the same check node.

Therefore, when the parity bits corresponding to the above adjacent two variable nodes are simultaneously in an erroneous state due to the burst error, the erasure, or the like, since the check node connected to the two variable nodes (the variable nodes obtaining the message by using the parity bits) corresponding to the two parity bits that are in the erroneous state returns the message indicating that the probability having a value of 0 and the probability having a value of 1 are equal probability to the variable node connected to that check node, the decoding performance is deteriorated. Then, if a burst length (the number of bits of the parity bits that are continuously in an erroneous state) becomes large, the number of check nodes returning the message indicating the equal probability is increased, and thus, the decoding performance is further deteriorated.

Therefore, the parity interleaver 23 (FIG. 9) performs the parity interleaving in which the parity bits of the LDPC code from the LDPC encoder 115 are interleaved at the positions of other parity bits in order to prevent the deterioration in the decoding performance described above.

Figure 16:
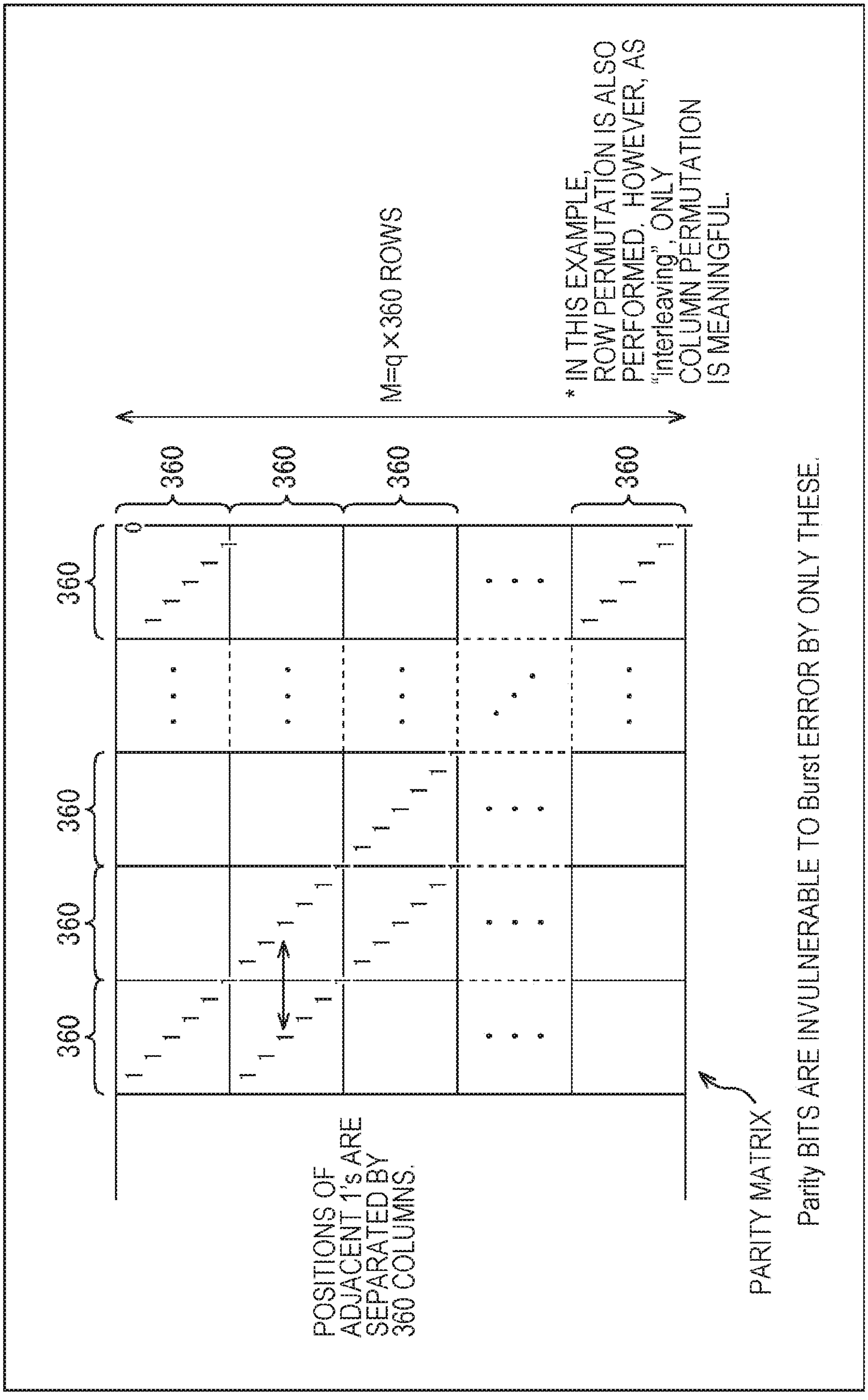
FIG. 16 is a diagram illustrating an example of a parity matrix HT of a check matrix H corresponding to an LDPC code after parity interleaving.

FIG. 16 is a diagram illustrating a parity matrix $H_T$ of the check matrix H corresponding to the LDPC code after the parity interleaving performed by the parity interleaver 23 of FIG. 9.

Herein, the information matrix $H_A$ of the check matrix H corresponding to the LDPC code output from the LDPC encoder 115 has a cyclic structure similarly to the information matrix of the check matrix H corresponding to the LDPC code defined in the DVB-T.2 standard or the like.

The cyclic structure denotes a structure in which a certain column matches a column obtained by cyclically shifting another column and also includes a structure in which for example, for each of the P columns, the positions of 1's in each row of the P columns become the positions obtained by cyclically shifting the first column of the P columns in the column direction by a predetermined value such as a value proportional to the value q obtained by dividing the parity length M. Hereinafter, the P columns in the cyclic structure are appropriately referred to as a unit size.

As the LDPC code defined in the DVB-T.2 standard or the like, there are two types of LDPC codes with a code length N of 64800 bits, 16200 bits, and the like as described with reference to FIGS. 12 and 13, and for any one of the two types of the LDPC codes, the unit size P is defined as 360, which is one of the divisors of the parity length M except for 1 and M.

In addition, the parity length M is a value other than a prime number indicated by the formula $M=q\times P=q\times 360$ by using a value q that varies depending on the encoding rate. Therefore, similarly to the unit size P, the value q is also one of the divisors of the parity length M except for the divisors of 1 and M and can be obtained by dividing the parity length M by the unit size P (a product of P and q which are divisors of the parity length M becomes the parity length M).

As described above, if it is assumed that the information length is denoted by K, an integer of 0 or more and less than P is denoted by x, and an integer of 0 or more and less than q is denoted by y, the parity interleaver 23 allows the (K+qx+y+1)-th code bit among the code bits of the LDPC code of N bits to be interleaved at the position of the (K+Py+x+1)-th code bit.

Since the (K+qx+y+1)-th code bit and the (K+Py+x+1)-th code bit are the (K+1)-th and subsequent code bits, the (K+qx+y+1)-th code bit and the (K+Py+x+1)-th code bit are both parity bits, and thus, according to the interleaving, the positions of the parity bits of the LDPC code are moved.

According to such parity interleaving, since (the parity bits corresponding to) the variable nodes connected to the same check node are separated by a unit size P, that is, 360 bits herein, in a case where the burst length is less than 360 bits, it is possible to avoid a situation in which a plurality of the variable nodes connected to the same check node simultaneously causes errors, and as a result, it is possible to improve the resistance to the burst error.

In addition, the LDPC code after the parity interleaving in which the (K+qx+y+1)-th code bit is interleaved at the position of the (K+Py+x+1)-th code bit matches the LDPC code of a check matrix (hereinafter, also referred to as a transformed check matrix) obtained by performing the column permutation in which the (K+qx+y+1)-th column is replaced with the (K+Py+x+1)-th column in the original check matrix H.

In addition, as illustrated in FIG. 16, a pseudo-cyclic structure occurs in units of P columns (360 columns in FIG. 16) in the parity matrix of the transformed check matrix.

Herein, the pseudo-cyclic structure denotes a structure in which a part excluding a portion has a cyclic structure.

In the transformed check matrix obtained by performing the column permutation corresponding to the parity interleaving on the check matrix of the LDPC code defined in the DVB-T.2 standard or the like, the number of elements of 1 is less than 1 (to become the element of 0) in a portion (a shift matrix to be described later) of 360 rows×360 columns of the upper right corner of the transformed check matrix, and from the point of view, the structure is not a (perfect) cyclic structure but a pseudo-cyclic structure.

The transformed check matrix for the check matrix of the LDPC code output from the LDPC encoder 115 has a pseudo-cyclic structure, similarly to the transformed check matrix for the check matrix of the LDPC code defined in, for example, the DVB-T.2 standard or the like.

In addition, the transformed check matrix of FIG. 16 is a matrix in which the permutation (row permutation) for allowing the transformed check matrix to be configured as a configuration matrix to be described later, in addition to the column permutation corresponding to the parity interleaving, is performed on the original check matrix H.

Figure 17:
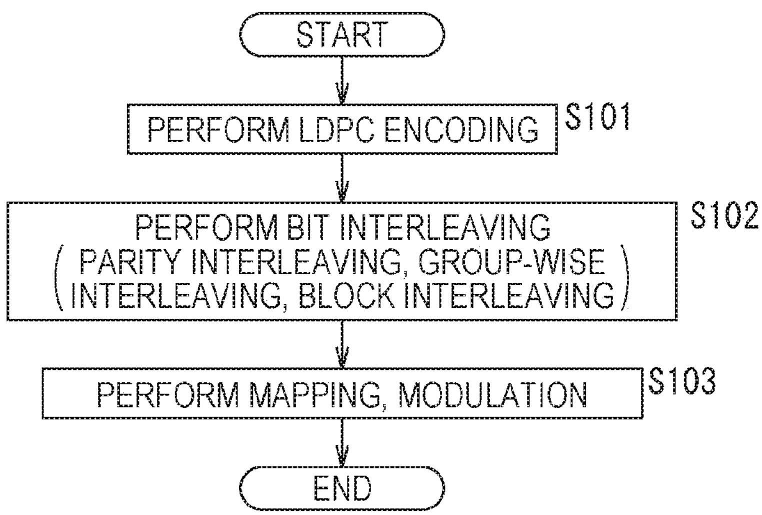
FIG. 17 is a flowchart illustrating an example of processing performed by a bit interleaver 116 and a mapper 117.

FIG. 17 is a flowchart illustrating processing performed by the LDPC encoder 115, the bit interleaver 116, and the mapper 117 of FIG. 8.

After waiting for the LDPC target data to be supplied from the BCH encoder 114, in step S101, the LDPC encoder 115 encodes the LDPC target data into the LDPC code and supplies the LDPC code to the bit interleaver 116, and the process proceeds to step S102.

In step S102, the bit interleaver 116 performs bit interleaving on the LDPC code from the LDPC encoder 115 and supplies a symbol obtained by the bit interleaving to the mapper 117, and the process proceeds to step S103.

That is, in step S102, in the bit interleaver 116 (FIG. 9), the parity interleaver 23 performs parity interleaving on the LDPC code from the LDPC encoder 115 and supplies the LDPC code after the parity interleaving to the group-wise interleaver 24.

The group-wise interleaver 24 performs group-wise interleaving on the LDPC code from the parity interleaver 23 and supplies the code obtained as a result thereof to the block interleaver 25.

The block interleaver 25 performs block interleaving on the LDPC code after the group-wise interleaving by the group-wise interleaver 24 and supplies m-bit symbols obtained as a result thereof to a mapper 117.

In step S103, the mapper 117 maps the symbols from the block interleaver 25 to any one of $2^m$ signal points determined by the modulation scheme of the quadrature modulation performed by the mapper 117 and performs quadrature modulation, and supplies the data obtained as a result thereof to the time interleaver 118.

As described above, by performing the parity interleaving or the group-wise interleaving, it is possible to improve the error rate in the case of transmitting a plurality of the code bits of the LDPC code as one symbol.

Herein, in FIG. 9, for the convenience of description, the parity interleaver 23, which is a block for performing parity interleaving, and the group-wise interleaver 24, which is a block for performing group-wise interleaving, are separately configured. However, the parity interleaver 23 and the group-wise interleaver 24 can be integrally configured.

That is, both of the parity interleaving and the group-wise interleaving can be performed by writing and reading of the code bits in the memory, and the address can be indicated by a matrix transforming the address (writing address) for performing the writing of the code bits (write address) to the address (read address) for performing the reading the code bits.

Therefore, if a matrix is obtained by multiplying the matrix indicating the parity interleaving and the matrix indicating group-wise interleaving, the parity interleaving is performed by converting the code bits according to the matrix, and in addition, the result of group-wise interleaving of the LDPC code after the parity interleaving can be obtained.

Furthermore, in addition to the parity interleaver 23 and the group-wise interleaver 24, the block interleaver 25 can also be integrally configured.

That is, the block interleaving performed by the block interleaver 25 can also be indicated by a matrix for converting the write address of the memory storing the LDPC code into the read address.

Therefore, if a matrix is obtained by multiplying the matrix indicating the parity interleaving, the matrix indicating the group-wise interleaving, and the matrix indicating the block interleaving, the parity interleaving, the group-wise interleaving, and the block Interleaving can be performed collectively according to the matrix.

In addition, it can be assumed that one or the amount of parity interleaving and group-wise interleaving is not performed.

<Configuration Example of LDPC Encoder 115>

Figure 18:
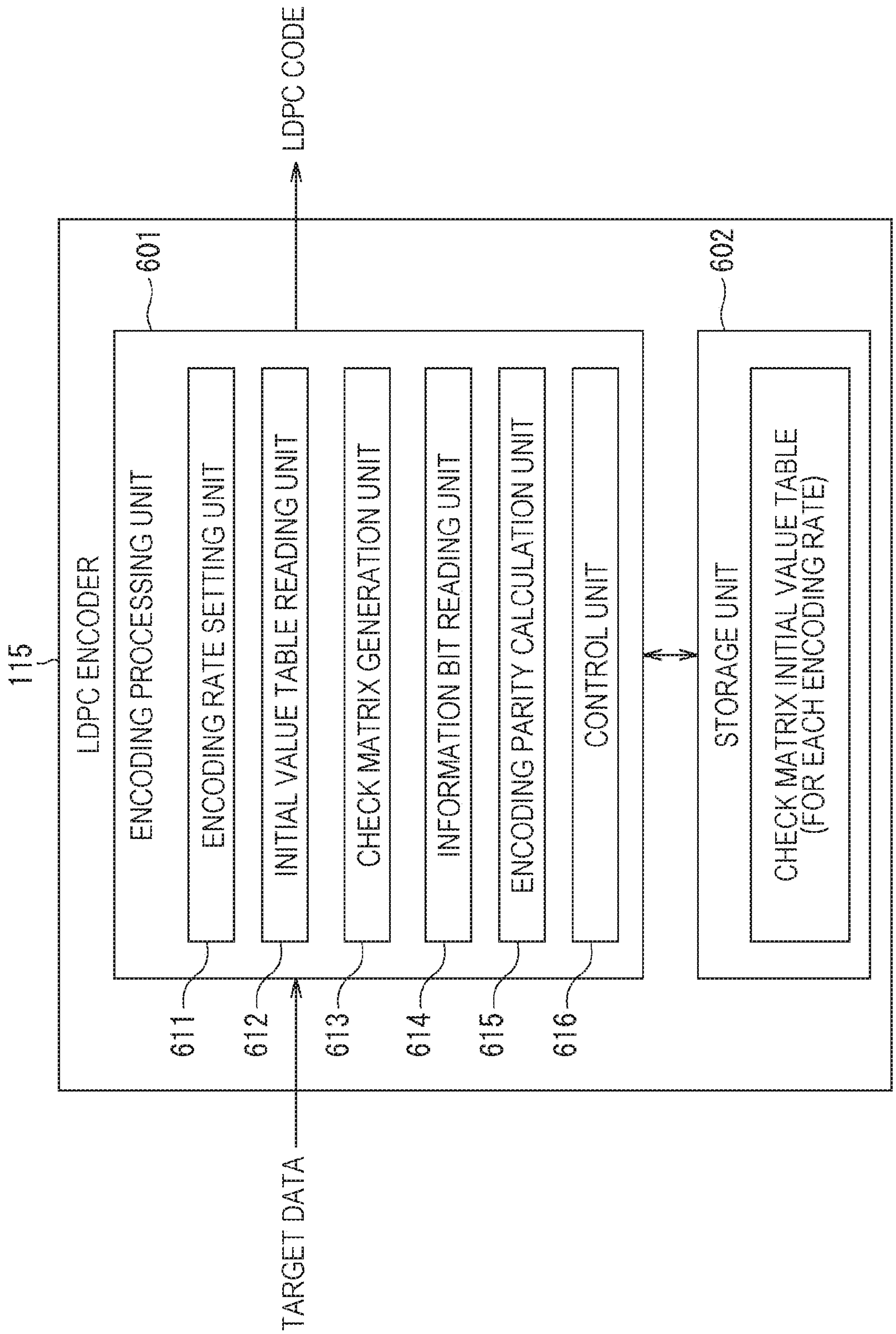
FIG. 18 is a block diagram illustrating a configuration example of an LDPC encoder 115.

FIG. 18 is a block diagram illustrating a configuration example of the LDPC encoder 115 of FIG. 8.

Note that the LDPC encoder 122 of FIG. 8 is also configured in a similar manner.

As described with reference to FIGS. 12 and 13, in the DVB-T.2 standard or the like, LDPC codes having two types of a code length N of 64800 bits and 16200 bits are defined.

Then, for the LDPC code with a code length N of 64800 bits, 11 encoding rates of 1/4, 1/3, 2/5, 1/2, 3/5, 2/3, 3/4, 4/5, 5/6, 8/9, and 9/10 are defined, and for the LDPC code with a code length N of 16200 bits, 10 encoding rates of 1/4, 1/3, 2/5, 1/2, 3/5, 2/3, 3/4, 4/5, 5/6, and 8/9 are defined (FIGS. 12 and 13).

The LDPC encoder 115 can perform encoding (error correction coding) by the LDPC code of each encoding rate with a code length N of, for example, 64800 bits or 16200 bits according to the check matrix H prepared for each code length N and for each encoding rate.

Besides, the LDPC encoder 115 can perform LDPC encoding according to a check matrix H of an LDPC code with an arbitrary encoding rate r and an arbitrary code length N.

The LDPC encoder 115 includes an encoding processing unit 601 and a storage unit 602.

The encoding processing unit 601 includes an encoding rate setting unit 611, an initial value table reading unit 612, a check matrix generation unit 613, an information bit reading unit 614, an encoding parity calculation unit 615, and a control unit 616 and performs LDPC encoding of the LDPC target data supplied to the LDPC encoder 115 and supplies the LDPC code obtained as a result thereof to the bit interleaver 116 (FIG. 8).

That is, the encoding rate setting unit 611 sets the code length N and the encoding rate r of the LDPC code and other specific information for specifying the LDPC code, for example, according to the operator's operation or the like.

The initial value table reading unit 612 reads a check matrix initial value table, described later, indicating a check matrix of the LDPC code specified by the specific information set by the encoding rate setting unit 611 from the storage unit 602.

The check matrix generation unit 613 generates a check matrix H on the basis of the check matrix initial value table read by the initial value table reading unit 612 and stores the check matrix H in the storage unit 602. For example, the check matrix generation unit 613 arranges the elements of 1 of the information matrices $H_A$ corresponding to the information length K (=code length N-parity length M) according to the code length N and the encoding rate r set by the encoding rate setting unit 611 in the column direction in a cycle of 360 columns (unit size P) to generate the check matrix H and stores the check matrix H in the storage unit 602.

The information bit reading unit 614 reads (extracts) information bits for the information length K from the LDPC target data supplied to the LDPC encoder 115.

The encoding parity calculation unit 615 reads the check matrix H generated by the check matrix generation unit 613 from the storage unit 602 and calculates the parity bits for the information bits read by the information bit reading unit 614 by using the check matrix H on the basis of a predetermined formula to generate the code word (LDPC code).

The control unit 616 controls each block constituting the encoding processing unit 601.

A plurality of the check matrix initial value tables and the like corresponding to a plurality of the encoding rates and the like illustrated in FIGS. 12 and 13 for each of the code lengths N of, for example, 64800 bits and 16200 bits are stored in the storage unit 602. In addition, the storage unit 602 temporarily stores data necessary for the processing of the encoding processing unit 601.

Figures 19, 20:
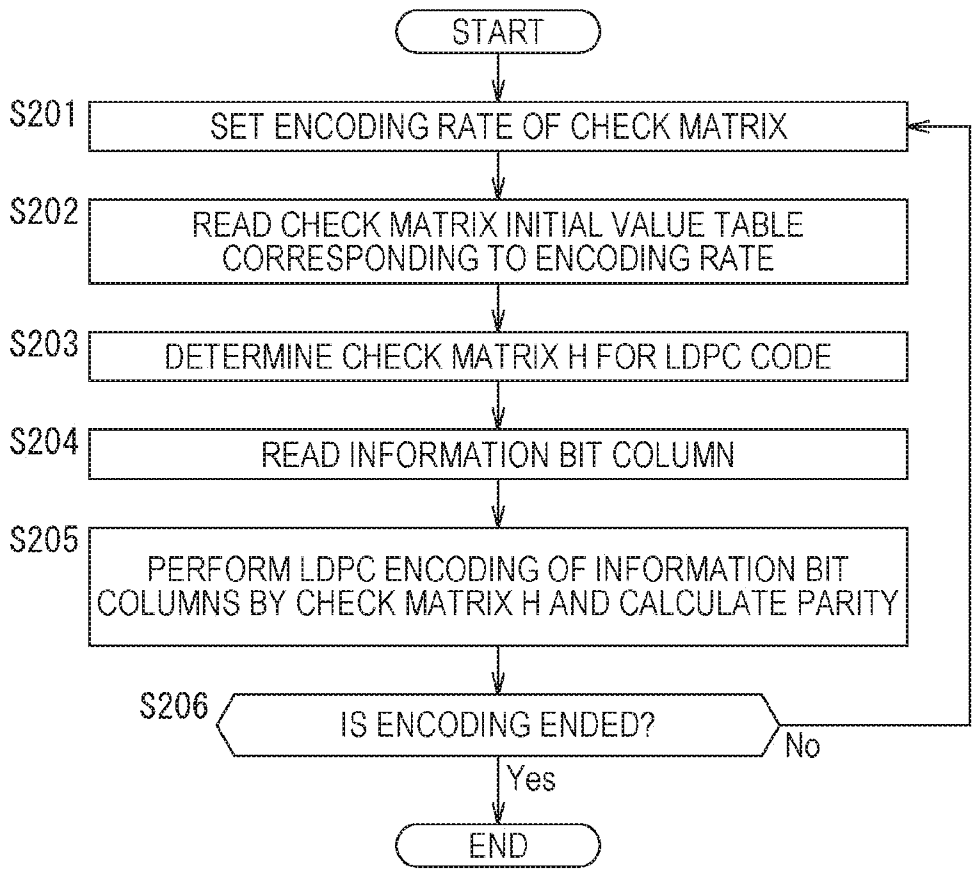
FIG. 19 is a flowchart illustrating an example of processing of an LDPC encoder 115.
FIG. 20 is a diagram illustrating an example of a check matrix initial value table with an encoding rate of 1/4 and a code length of 16200.

FIG. 19 is a flowchart for describing an example of processing of the LDPC encoder 115 of FIG. 18.

In step S201, the encoding rate setting unit 611 sets the code length N and the encoding rate r, which are to be subjected to LDPC encoding, and other specific information for specifying the LDPC code.

In step S202, the initial value table reading unit 612 reads, from the storage unit 602, a predetermined check matrix initial value table specified by the code length N, the encoding rate r, and the like as the specific information set by the encoding rate setting unit 611.

In step S203, the check matrix generation unit 613 obtains (generates) the check matrix H of the LDPC code with a code length N and an encoding rate r set by the encoding rate setting unit 611 by using the check matrix initial value table read from the storage unit 602 by the initial value table reading unit 612 and supplies and stores the check matrix H in the storage unit 602.

In step S204, the information bit reading unit 614 reads, from the LDPC target data supplied to the LDPC encoder 115, the information bits with the information length K (=N×r) corresponding to the code length N and the encoding rate r set by the encoding rate setting unit 611 and reads the check matrix H obtained by the check matrix generation unit 613 from the storage unit 602 and supplies the information bits and the check matrix H to the encoding parity calculation unit 615.

In step S205, the encoding parity calculation unit 615 sequentially calculates the parity bits of the code word c that satisfies Formula (8) by using the information bits and the check matrix H from the information bit reading unit 614.

$$Hc^T=0 \quad (8)$$

In Formula (8), c indicates a row vector as a code word (LDPC code), and $c^T$ indicates transposition of the row vector c.

Herein, as described above, in a case where a portion of the information bits of the row vector c as the LDPC code (one code word) is indicated by the row vector A and a portion of the parity bit is indicated by the row vector T, the row vector c can be indicated by the formula c=[A|T] by the row vector A as the information bits and the row vector T as the parity bits.

The check matrix H and the row vector c=[A|T] as the LDPC code need to satisfy the formula $Hc^T=0$, and in a case where the parity matrix $H_T$ of the check matrix $H=[H_A|H_T]$ has the staircase structure illustrated in FIG. 11, a row vector T as the parity bits constituting the row vector c=[A|T] satisfying the formula $Hc^T=0$ can be obtained sequentially by setting elements of each row to 0 in order from the element of the first row of the column vector $Hc^T$ in the formula $Hc^T=0$.

The encoding parity calculation unit 615 obtains the parity bits T for the information bits A from the information bit reading unit 614 and outputs the code word c=[A|T] indicated by the information bits A and the parity bits T as an LDPC encoding result of information bits A.

After that, in step S206, the control unit 616 determines whether or not the LDPC encoding is ended. In a case where it is determined in step S206 that the LDPC encoding is not ended, that is, for example, in a case where there is still an LDPC target data to be subjected to the LDPC encoding, the process returns to step S201 (or step S204), and the processes of S201 (or step S204) to S206 are repeated.

In addition, in a case where it is determined in step S206 that the LDPC encoding is ended, that is, for example, in a case where there is no LDPC target data to be subjected to the LDPC encoding, the LDPC encoder 115 ends the process.

For the LDPC encoder 115, the check matrix initial value table (representing the check matrix) of LDPC codes with various code lengths N and encoding rates r can be prepared in advance. The LDPC encoder 115 can perform the LDPC encoding on the LDPC codes with various code lengths N and encoding rates r by using the check matrix H generated from the check matrix initial value table prepared in advance.

<Example of Check Matrix Initial Value Table>

The check matrix initial value table is a table representing positions of elements of 1's of, for example, the information matrix $H_A$ (FIG. 10) corresponding to the information length K according to the code length N and the encoding rate r of the LDPC code (LDPC code defined by the check matrix H) every 360 columns (unit size P) and is generated in advance every check matrix H with each code length N and each encoding rate r.

That is, the check matrix initial value table indicates at least the positions of the elements of 1 of the information matrix $H_A$ every 360 columns (unit size P).

In addition, as the check matrix H, there are a check matrix in which the entire portions of the parity matrix $H_T$ have a staircase structure and a check matrix in which a portion of the parity matrix $H_T$ has a staircase structure and the remaining portions becomes a diagonal matrix (unit matrix).

Hereinafter, a representation scheme of a check matrix initial value table indicating a check matrix in which a portion of the parity matrix $H_T$ has a staircase structure and the remaining portion is a diagonal matrix is also referred to as a type-A scheme. In addition, a representation scheme of a check matrix initial value table indicating a check matrix in which the entire parity matrix $H_T$ have a staircase structure is also referred to as a type-B scheme.

In addition, an LDPC code for a check matrix represented by a check matrix initial value table of the type-A scheme is also referred to as a type-A code, and an LDPC code for a check matrix represented by a check matrix initial value table of the type-B scheme is also referred to as a type-B code.

The notations "type A" and "type B" are notations in accordance with the ATSC 3.0 standard. For example, in the ATSC 3.0, both of the type-A code and the type-B code are adopted.

In addition, in the DVB-T.2 and the like, the type-B code is adopted.

FIG. 20 is a diagram illustrating an example of the check matrix initial value table of the type-B scheme.

That is, FIG. 20 illustrates a check matrix initial value table (representing the check matrix H) of type-B code with a code length N of 16200 bits and an encoding rate (encoding rate on the notation of the DVB-T.2) r of 1/4 defined in the DVB-T.2 standard.

The check matrix generation unit 613 (FIG. 18) obtains the check matrix H as follows by using the check matrix initial value table of the type-B scheme.

Figure 21:
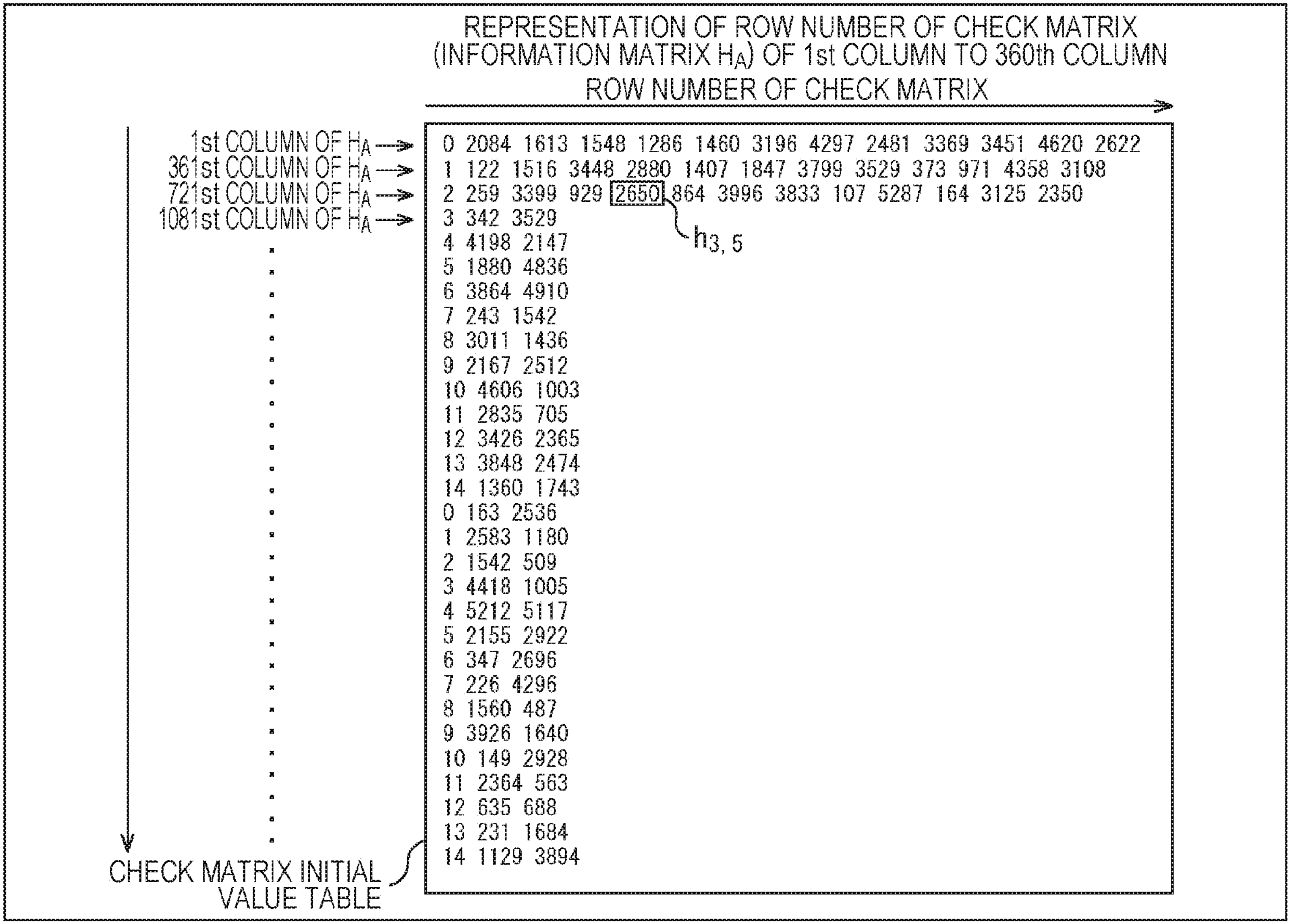
FIG. 21 is a diagram illustrating a method of obtaining a check matrix H from a check matrix initial value table.

FIG. 21 is a diagram illustrating a method of obtaining the check matrix H from the check matrix initial value table of the type-B scheme.

That is, FIG. 21 illustrates the check matrix initial value table of the type-B code with a code length N of 16200 bits and an encoding rate r of 2/3 is defined in the DVB-T.2 standard.

The check matrix initial value table of the type-B scheme is a table indicating the positions of the elements of 1 of the entire information matrix $H_A$ corresponding to the information length K according to the code length N and the encoding rate r of the LDPC code every 360 columns (unit size P), and in the i-th row, the row number (row number when the row number of the first row of the check matrix H is set to 0) of the elements of 1's in the (1+360×(i−1))-th column of the check matrix H is arranged by the number of column weights of the (1+360×(i−1))-th column.

Herein, since the parity matrix HT (FIG. 10) corresponding to the parity length M of the check matrix H of the type-B scheme is determined to have a staircase structure as illustrated in FIGS. 15A and 15B, if the information matrix HA (FIG. 10) corresponding to the information length K can be obtained by the check matrix initial value table, the check matrix H can be obtained.

The number of rows (k+1) of the check matrix initial value table of the type-B scheme differs depending on the information length K.

A relationship of Formula (9) is satisfied between the information length K and the number of rows (k+1) of the check matrix initial value table.

$$K=(k+1)\times 360 \quad (9)$$

Herein, 360 in Formula (9) is the unit size P described with reference to FIG. 16.

In the check matrix initial value table of FIG. 21, 13 numerical values are arranged in the rows of from the first row to the third row, and 3 numerical values are arranged in the rows of from the fourth row to the (k+1)-th row (the 30th row in FIG. 21).

Therefore, the column weights of the check matrix H obtained from the check matrix initial value table of FIG. 21 are 13 for the columns of from the first column to the (1+360×(3−1)−1)-th column and 3 for the columns of from the (1+3 60×(3−1))-th column to the K-th column.

The first row of the check matrix initial value table of FIG. 21 is 0, 2084, 1613, 1548, 1286, 1460, 3196, 4297, 2481, 3369, 3451, 4620, 2622, which indicates that, in the first column of the check matrix H, the elements of the rows of which the row numbers are 0, 2084, 1613, 1548, 1286, 1460, 3196, 4297, 2481, 3369, 3451, 4620, and 2622 are 1 (and the other elements are 0).

In addition, the second row of the check matrix initial value table of FIG. 21 is 1, 122, 1516, 3448, 2880, 1407, 1847, 3799, 3529, 373, 971, 4358, 3108, which indicates that, in the 361 (=1+360×(2−1))-th column of the check matrix H, the elements of the rows of which the row numbers are 1, 122, 1516, 3448, 2880, 1407, 1847, 3799, 3529, 373, 971, 4358, 3108 are 1.

As described above, the check matrix initial value table indicates the positions of the elements of 1 of the information matrix $H_A$ of the check matrix H every 360 columns.

The columns other than the (1+360×(i−1))-th column of the check matrix H, that is, each column from the (2+360×(i−1))-th column to the (360×i)-th column are arranged by cyclically shifting the elements of 1's of the (1+360×(i−1))-th column determined by the check matrix initial value table in the downward direction (downward direction of the column) according to the parity length M.

That is, for example, the (2+360×(i−1))-th column is obtained by cyclically shifting the (1+360×(i−1))-th column by M/360 (=q) in the downward direction, and the next (3+360×(i−1))-th column is obtained by cyclically shifting the (1+360×(i−1))-th column by 2×M/360 (=2×q) in the downward direction (by cyclically shifting the (2+360×(i−1))-th column by M/360 (=q) in the downward direction).

Now, if the numerical value of the j-th column (j-th from the left) in the i-th row (i-th from the top) of the check matrix initial value table is denoted as $h_{i,j}$ and the row number of the element of 1 of the j-th in the w-th column of the check matrix H is denoted by $H_{w-j}$, the row number $H_{w-j}$ of the element of 1 in the w-th column other than the (1+360×(i−1))-th column of the check matrix H can be obtained by Formula (10).

$$H_{w-j}=\text{mod}\ \{h_{i,j}+\text{mod}((w-1),P)\times q,M) \tag{10}$$

Herein, mod(x,y) denotes the remainder of dividing x by y.

In addition, P is the unit size described above, and in the present embodiment, for example, P is 360, similarly to the DVB-T.2 standard or the like and the ATSC 3.0 standard. Furthermore, q is a value M/360 obtained by dividing the parity length M by the unit size P (=360).

The check matrix generation unit 613 (FIG. 18) specifies the row number of the element of 1 in the (1+360×(i−1))-th column of the check matrix H by using the check matrix initial value table.

In addition, the check matrix generation unit 613 (FIG. 18) obtains the row number Hw−j of the element of 1 in the w-th column other than the (1+360×(i−1))-th column of the check matrix H according to Formula (10) and generates a check matrix H in which the element of the row number obtained as described above is 1.

Figures 22, 23:
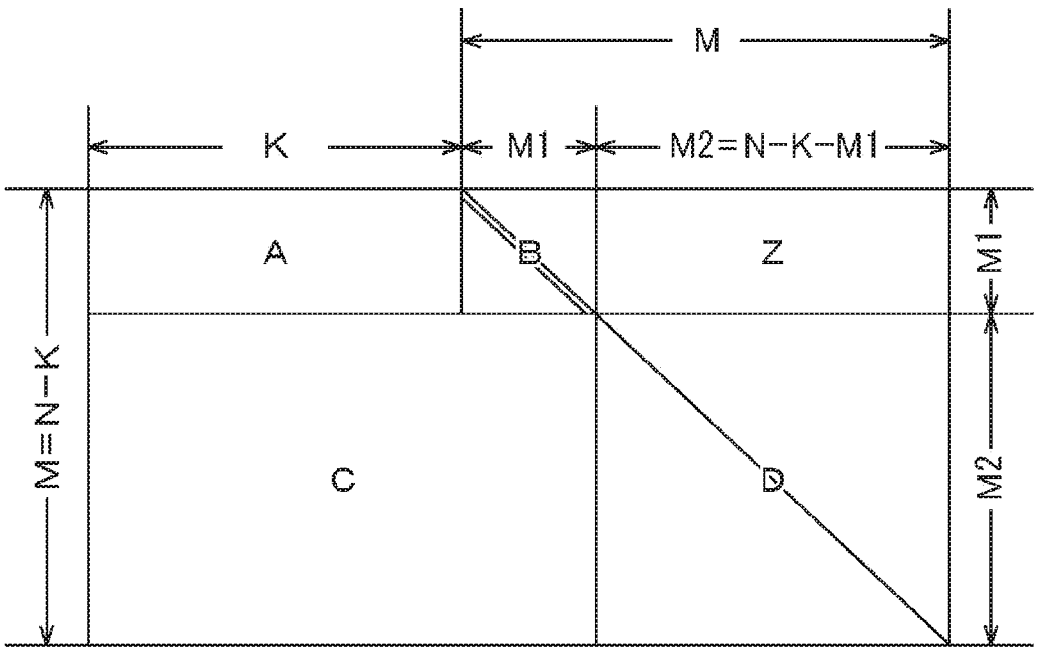
FIG. 22 is a diagram illustrating a structure of a check matrix.
FIG. 23 is a diagram illustrating an example of a check matrix initial value table.

FIG. 22 illustrates the structure of a check matrix H of the type-A scheme.

The check matrix of the type-A scheme includes an A matrix, a B matrix, a C matrix, a D matrix, and a Z matrix.

The A matrix is a matrix to the upper left of the check matrix H of M1 rows and K columns indicated by a predetermined value M1 and information length K=code length N×encoding rate r of LDPC code.

The B matrix is a matrix having a staircase structure adjacent to the right of the A matrix of M1 rows and M1 columns.

The C matrix is an adjacent matrix below the A matrix and the B matrix of (N−K−M1) rows and (K+M1) columns.

The D matrix is a unit matrix adjacent to the right of the C matrix of (N−K−M1) rows and (N−K−M1) columns.

The Z matrix is a zero matrix (0 matrix) adjacent to the right of the B matrix of M1 rows and (N−K−M1) columns.

In the check matrix H of the type-A scheme configured by the A matrix to the D matrix and the Z matrix in this manner, a portion of the A matrix and the C matrix constitute an information matrix, and the B matrix, the remaining portion of the C matrix, the D matrix, and the Z matrix constitute the parity matrix.

In addition, since the B matrix is a matrix having a staircase structure and the D matrix is a unit matrix, a portion (a portion of the B matrix) of the parity matrix of the check matrix H of the type-A scheme has a staircase structure, and the remaining portion (portion of the D matrix) is a diagonal matrix (unit matrix).

The A matrix and C matrix have a cyclic structure every columns of the unit size P (for example, 360 columns), similarly to the information matrix of the check matrix H of the type-B scheme, and the check matrix initial value table of the type-A scheme indicates the positions of the elements of 1 of the A matrix and the C matrix every 360 columns.

Herein, as described above, since the A matrix and a portion of the C matrix constitute the information matrix, it can be said that the check matrix initial table of the type-A scheme indicating the positions of the elements of 1 of the A matrix and C matrix every 360 columns indicates at least the positions of the elements of 1 of the information matrix every 360 columns.

In addition, since the check matrix initial value table of the type-A scheme indicates the positions of the elements of 1 of the A matrix and the C matrix every 360 columns, it can also be said that the positions of the elements of 1 of a portion (remaining portion of the C matrix) of the check matrix are indicated every 360 columns.

FIG. 23 is a diagram illustrating an example of the check matrix initial value table of the type-A scheme.

That is, FIG. 23 illustrates an example of the check matrix initial value table indicating the check matrix H with a code length N of 35 bits and an encoding rate r of 2/7.

The check matrix initial value table of the type-A scheme is a table indicating the positions of the elements of 1 of the A matrix and the C matrix every unit size P, and in the i-th row, the row number (row number when the row number of the first row of the check matrix H is set to 0) of element of 1 in the (1+P×(i−1))-th column of the check matrix H is arranged by the number of column weights of the (1+P×(i−1))-th column.

Note that, herein, for simplifying the description, the unit size P is assumed to be, for example 5.

With respect to the check matrix H of the type-A scheme, there are M1, M2, Q1, and Q2 as parameters.

M1 (FIG. 22) is a parameter for determining the size of the B matrix and takes a value which is a multiple of the unit size P. By adjusting M1, the performance of the LDPC code is changed to be adjusted to a predetermined value at the time of determining the check matrix H. Herein, it is assumed that 15 which is three times the unit size P=5 is adopted as M1.

M2 (FIG. 22) takes a value M-M1 obtained by subtracting M1 from the parity length M.

Herein, since the information length K is N×r=35×2/7=10 and the parity length M is NK=35−10=25, M2 becomes M−M1=25−15=10.

Q1 is obtained according to the formula Q1=M1/P and indicates the number of shifts (the number of rows) of cyclic shifts in the A matrix.

That is, the columns other than the (1+P×(i−1))-th column of the A matrix of the check matrix H of the type-A scheme, that is, the columns from the (2+P×(i−1))-th column to the P×i-th column are arranged by cyclically shifting the element of 1 of the (1+P×(i−1))-th column determined by the check matrix initial value table in the downward direction (downward direction of the column), and Q1 indicates the number of shifts of the cyclically shifting in the A matrix.

Q2 is obtained according to the formula Q2=M2/P and indicates the number of shifts (the number of rows) of the cyclically shifting in the C matrix.

That is, columns other than the (1+P×(i−1))-th column of the C matrix of the check matrix H of the type-A scheme, that is, the columns from the (2+P×(i−1))-th column to the P×i-th column are cyclically shifted the element of 1 of the (1+P×(i−1))-th column determined by the check matrix initial value table in the downward direction (downward direction of the column), and Q2 indicates the number of shifts of the cyclically shifting in the C matrix.

Herein, in the Q1, M1/P=15/5=3, and in the Q2, M2/P=10/5=2.

In the check matrix initial value table of FIG. 23, three numerical values are arranged in the first and second rows, and one numerical value is arranged in the third to fifth rows. According to such arrangement of the numerical values, the column weights of the A matrix and the C matrix of the check matrix H obtained from the check matrix initial value table of FIG. 23 are 3 from the 1 (=1+5×(1−1))-th column to the 10 (=5×2)-th column and are 1 from the 11 (=1+5×(3−1))-th column to the 25 (=5×5)-th column.

That is, the first row of the check matrix initial value table of FIG. 23 is 2, 6, and, 18, which indicate that the elements of the rows with row numbers 2, 6, and 18 in the first column of the check matrix H are 1 (and that the other elements are 0).

Herein, in this case, since the A matrix (FIG. 22) is a matrix of 15 rows and 10 columns (M1 rows and K columns), and the C matrix (FIG. 22) is a matrix of 10 rows and 25 columns ((NK−M1) rows and (K+M1) columns), the rows with row numbers 0 to 14 of the check matrix H are rows of the A matrix, and the rows with row numbers 15 to 24 of the check matrix H are rows of the C matrix.

Therefore, the rows #2 and #6 among the rows with row numbers 2, 6, and 18 (hereinafter, described as rows #2, #6 and #18) are rows of the A matrix, and the rows #18 is a row of the C matrix.

The second row of the check matrix initial value table of FIG. 23 is 2, 10, and 19, which indicate that the elements of #2, #10, and #19 are 1 in the 6 (=1+5×(2−1))-th column of the check matrix H.

Herein, in the 6 (=1+5×(2−1))-th column of the check matrix H, the rows #2 and #10 among the rows #2, #10, and #19 are rows of A matrix, and the row #19 is a row of the C matrix.

The third row of the check matrix initial value table of FIG. 23 is 22, which indicates that the element of the row #22 is 1 in the (=1+5×(3−1))-th column of the check matrix H.

Herein, in the 11 (=1+5×(3−1))-th column of the check matrix H, the row #22 is a row of the C matrix.

Similarly, 19 of the fourth row of the check matrix initial value table of FIG. 23 indicates that the element of the row #19 is 1 in the 16 (=1+5×(4−1))-th column of the check matrix H, and 15 of the fifth row of the check matrix initial value table of FIG. 23 indicates that the element of the row #15 is 1 in the 21 (=1+5×(5−1))-th column of the check matrix H.

As described above, the check matrix initial value table indicates the positions of the elements of 1 of the A matrix and the C matrix of the check matrix H every unit size P=5 columns.

The columns other than the (1+5×(i−1))-th columns of the A matrix and the C matrix of the check matrix H, that is, each column from the (2+5×(i−1))-th column to the (5×i)-th column are arranged by cyclically shifting the element of 1 of the (1+5×(i−1))-th column determined by the check matrix initial value table in the downward direction (downward direction of the column) according to the parameters Q1 and Q2.

That is, for example, the (2+5×(i−1))-th column of the A matrix is obtained by cyclically shifting the (1+5×(i−1))-th column by Q1 (=3) in the downward direction, and the next (3+5×(i−1))-th column is obtained by cyclically shifting the (1+5×(i−1))-th column by 2×Q1 (=2×3) in the downward direction (by cyclically shifting the ((2+5×(i−1))-th column by Q1 in the downward direction).

In addition, for example, the (2+5×(i−1))-th column of the C matrix is obtained by cyclically shifting the (1+5×(i−1))-th column by Q2 (=2) in the downward direction, and the next (3+5×(i−1))-th column is obtained by cyclically shifting the (1+5×(i−1))-th column by 2×Q2 (=2×2) in the downward direction (by cyclically shifting the (2+5×(i−1))-th column by Q2 in the downward direction).

Figure 24:
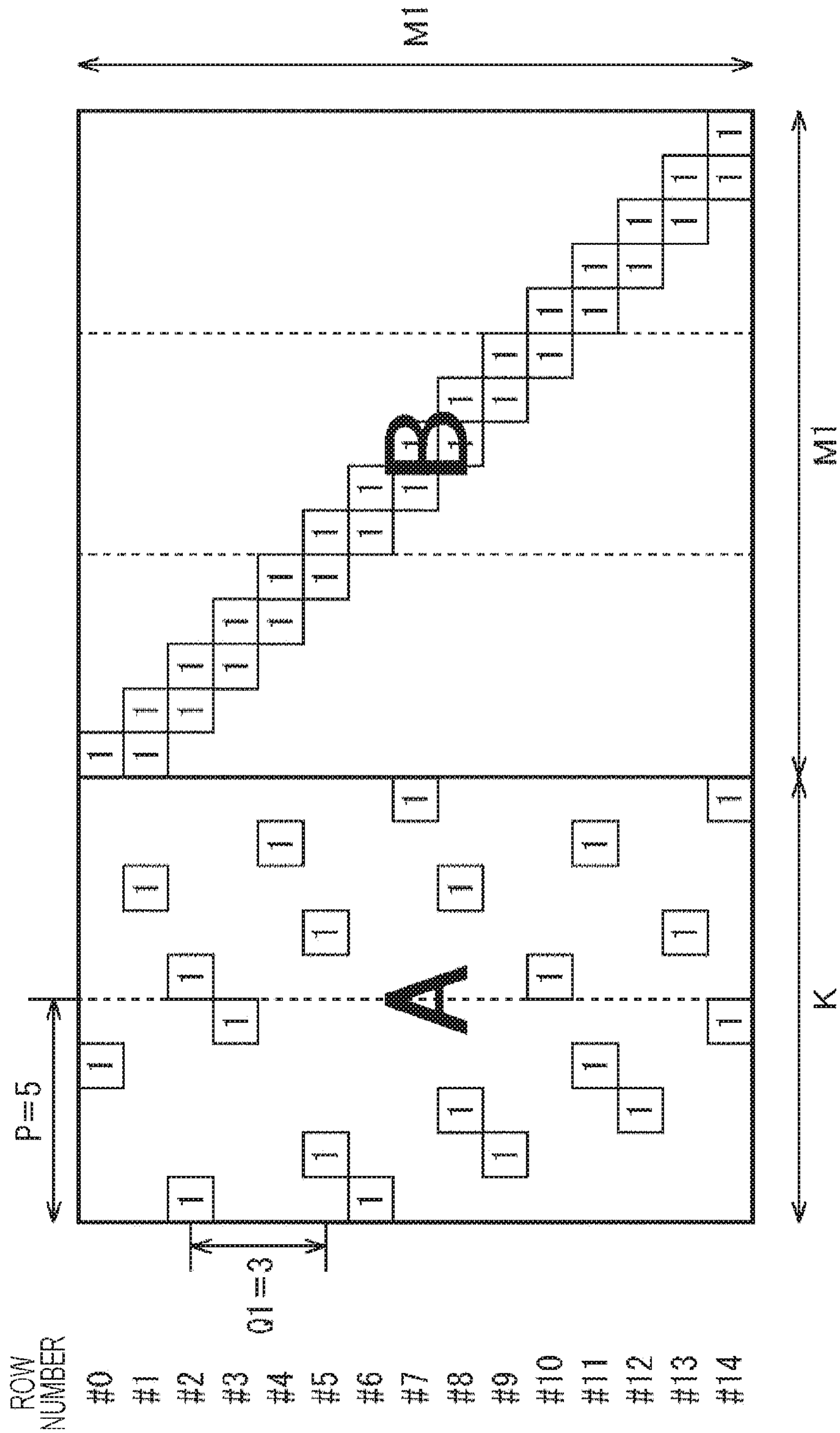
FIG. 24 is a diagram illustrating an A matrix generated from a check matrix initial value table.

FIG. 24 is a diagram illustrating an A matrix generated from the check matrix initial value table of FIG. 23.

In the A matrix of FIG. 24, according to the first row of the check matrix initial value table of FIG. 23, the elements of the rows #2 and #6 in the 1 (=1+5×(1−1))-th column become 1.

Then, each row from the 2 (=2+5×(1−1))-th row to the 5 (=5+5×(1−1))-th row is obtained by cyclically shifting the previous row by Q1=3 in the downward direction.

Furthermore, in the A matrix of FIG. 24, according to the second row of the check matrix initial value table of FIG. 23, the elements of the rows #2 and #10 in the 6 (=1+5×(2−1))-th column become 1.

Then, each column from the 7 (=2+5×(2−1))-th column to the 10 (=5+5×(2−1))-th column is obtained by cyclically shifting the previous column by Q1=3 in the downward direction.

Figure 25:
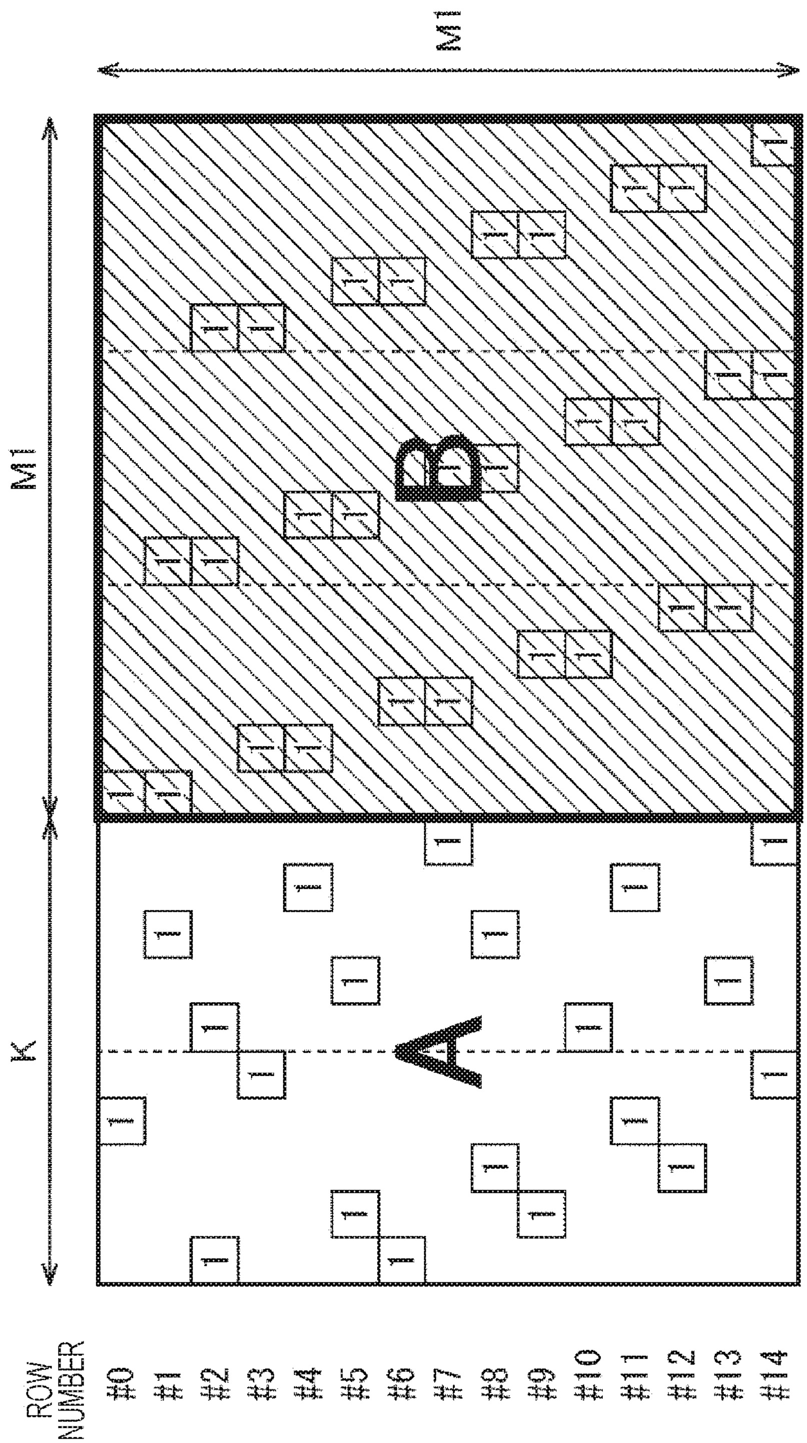
FIG. 25 is a diagram illustrating parity interleaving of a B matrix.

FIG. 25 is a diagram illustrating the parity interleaving of the B matrix.

The check matrix generation unit 613 (FIG. 18) generates an A matrix by using the check matrix initial value table, and arranges a B matrix having a staircase structure next to the A matrix. Then, the check matrix generation unit 613 regards the B matrix as a parity matrix, and performs the parity interleaving so that adjacent elements of 1 of the B matrix having a staircase structure are separated by the unit size P=5 in the row direction.

FIG. 25 illustrates the A matrix and the B matrix after the parity interleaving of the B matrix of FIG. 24.

Figure 26:
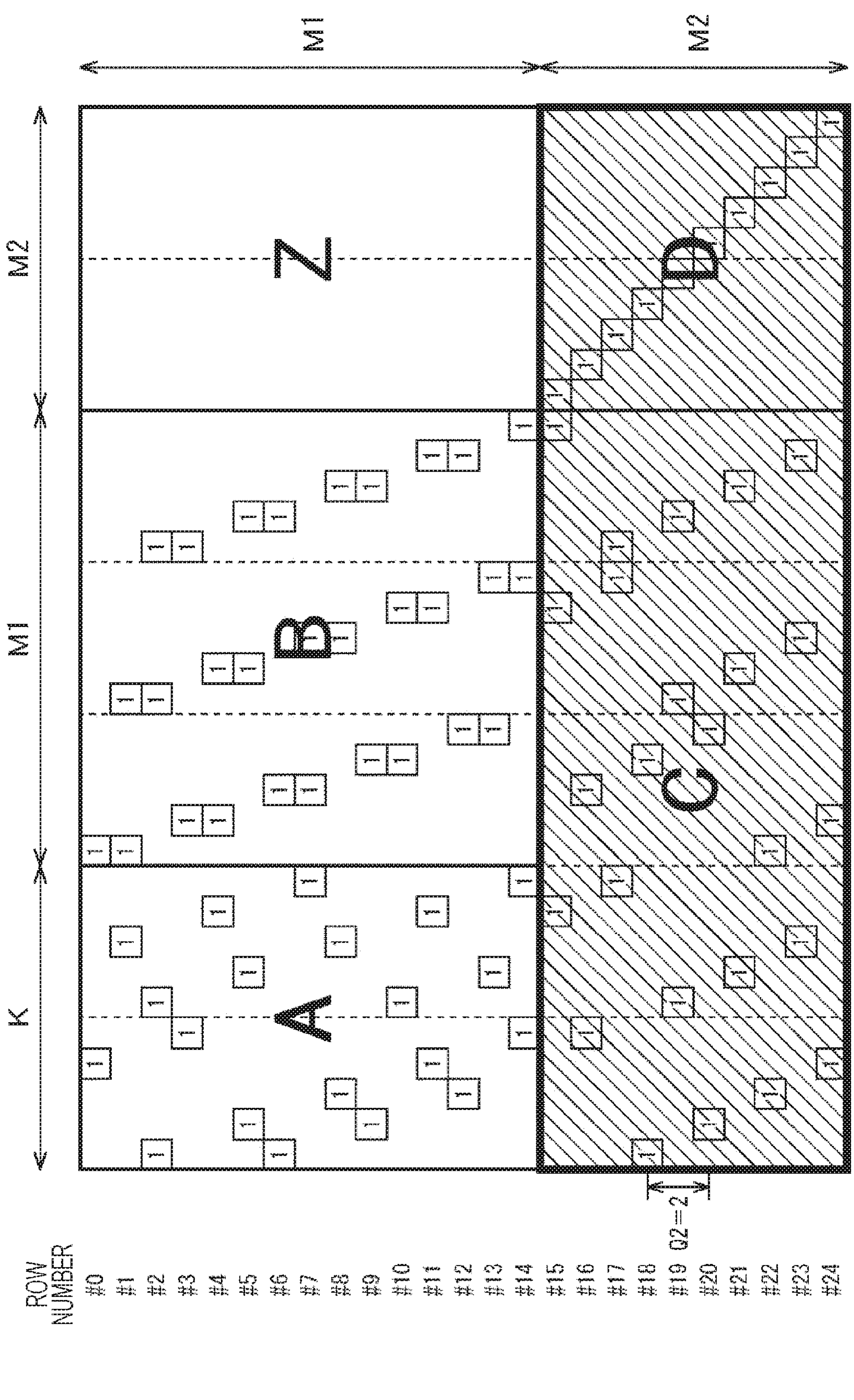
FIG. 26 is a diagram illustrating a C matrix generated from a check matrix initial value table.

FIG. 26 is a diagram illustrating the C matrix generated from the check matrix initial value table of FIG. 23.

In the C matrix of FIG. 26, according to the first row of the check matrix initial value table of FIG. 23, the element of the row #18 of the 1 (=1+5×(1−1))-th column of the check matrix H becomes 1.

Then, each column from the 2 (=2+5×(1−1))-th column to the 5 (=5+5×(1−1))-th column of the C matrix is obtained by cyclically shifting the previous column by Q2=2 in the downward direction.

Furthermore, in the C matrix of FIG. 26, according to the second to fifth rows of the check matrix initial value table of FIG. 23, the elements of the row #19 in the 6 (=1+5×(2−1))-th column of the check matrix H, the row #22 in the 11 (=1+5×(3−1))-th column, the row #19 in the 16 (=1+5×(4−1))-th column, and the row #15 in the 21 (=1+5×(5−1))-th column become 1.

Then, each column from the 7 (=2+5×(2−1))-th column to the 10 (=5+5×(2−1))-th column, each column from the 12 (=2+5×(3−1))-th column to the 15 (=5+5×(3−1))-th column, each column from the 17 (=2+5×(4−1))-th column to 20 (=5+5×(4−1)-th column, and each row from the 22 (=2+5×(5−1))-th column to the 25 (=5+5×(5−1))-th column are obtained by cyclically shifting the previous column by Q2=2 in the downward direction.

The check matrix generation unit 613 (FIG. 18) generates the C matrix using the check matrix initial value table and arranges the C matrix below the A matrix and the B matrix (after the parity interleaving).

In addition, the check matrix generation unit 613 arranges the Z matrix next to the right of the B matrix and arranges the D matrix next to the right of the C matrix to generate the check matrix H illustrated in FIG. 26.

Figure 27:
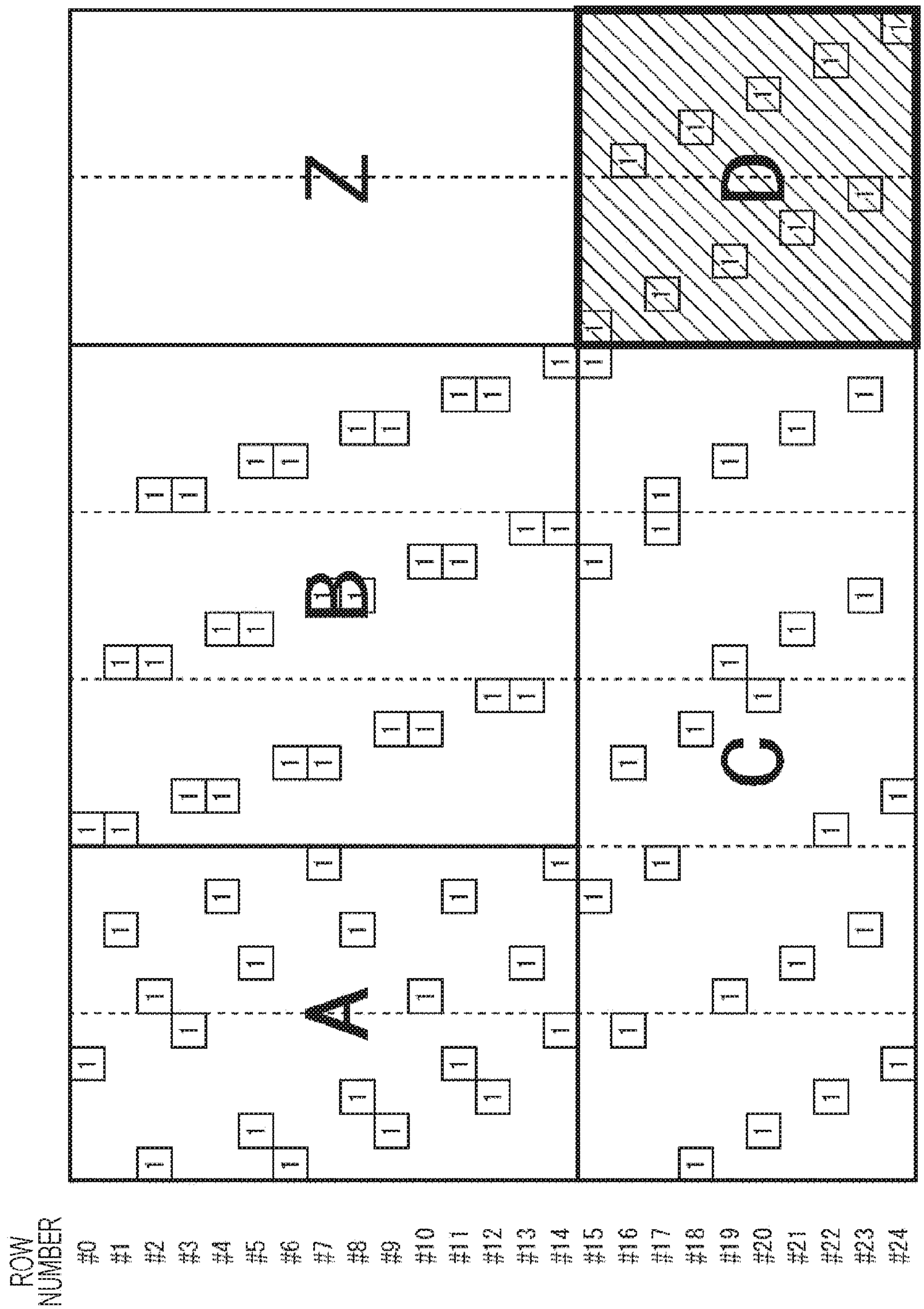
FIG. 27 illustrates parity interleaving of a D matrix.

FIG. 27 is a diagram illustrating the parity interleaving of the D matrix.

After the check matrix generation unit 613 generates the check matrix H of FIG. 26, the D matrix is regarded as a parity matrix, and the parity interleaving (only of the D matrix) is performed so that the elements of 1 of the odd rows and the next even rows of the D matrix of the unit matrix are separated by a unit size P=5 in the row direction.

FIG. 27 illustrates the check matrix H after the parity interleaving of the D matrix is performed on the check matrix H of FIG. 26.

The LDPC encoder 115 (encoding parity calculation unit 615 (FIG. 18)) performs, for example, the LDPC encoding (generation of the LDPC code) by using the check matrix H of FIG. 27.

Herein, the LDPC code generated by using the check matrix H of FIG. 27 becomes an LDPC code subjected to the parity interleaving, and thus, for the LDPC code generated by using the check matrix H of FIG. 27, it is not necessary to perform the parity interleaving in the parity interleaver 23 (FIG. 9). That is, since the LDPC code generated by using the check matrix H after performing the parity interleaving of the D matrix becomes an LDPC code subjected to the parity interleaving, the parity interleaving in the parity interleaver 23 for such an LDPC code is skipped.

Figure 28:
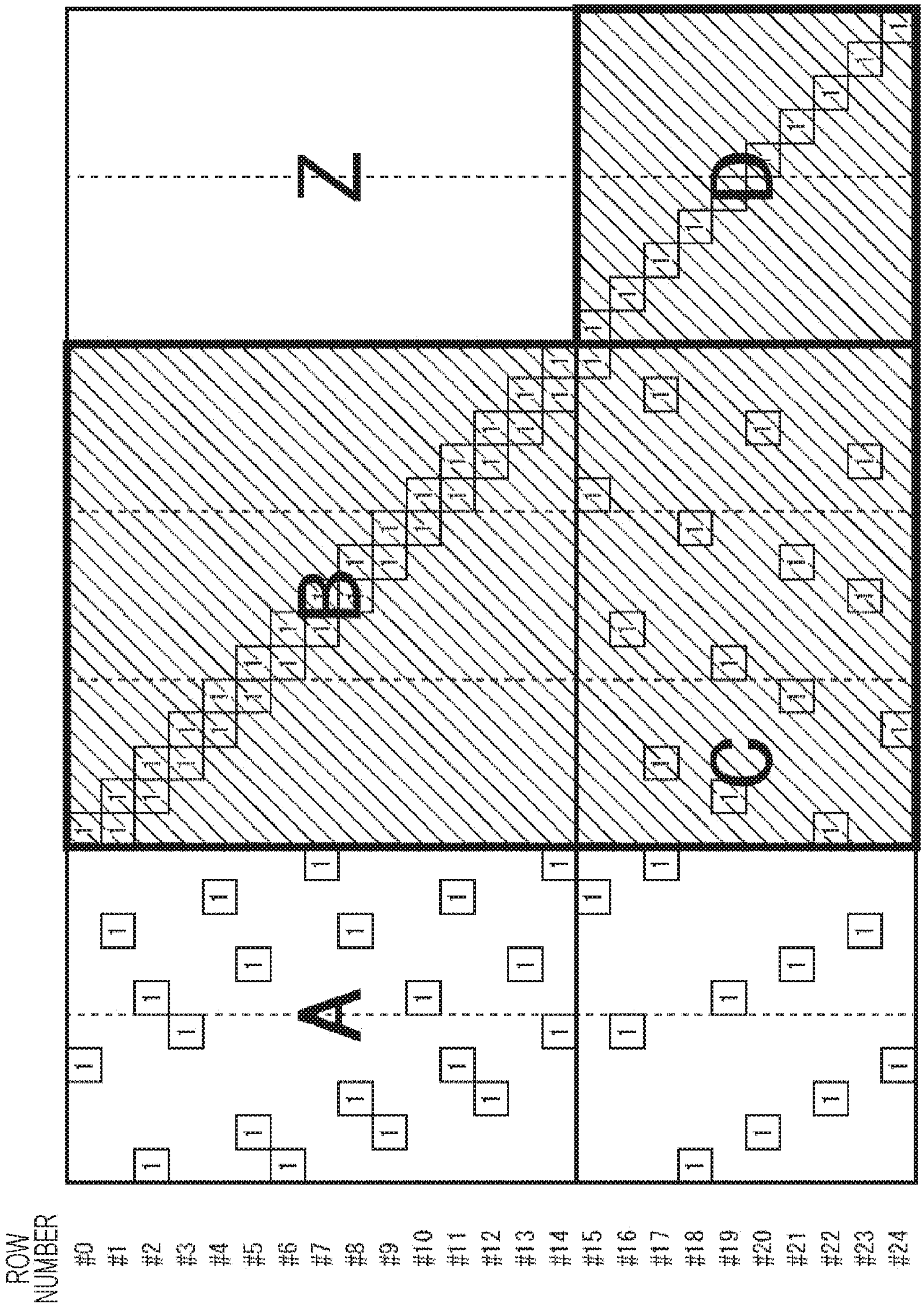
FIG. 28 is a diagram illustrating a check matrix in which column permutation is performed as parity deinterleaving to return parity interleaving to original parity interleaving.

FIG. 28 illustrates is a diagram illustrating the check matrix H obtained by performing the column permutation as the parity deinterleaving for returning the parity interleaving to the original parity interleaving on the B matrix, a portion of the C matrix (a portion of the C matrix located below the B matrix), and the D matrix of the check matrix H of FIG. 27.

The LDPC encoder 115 can perform the LDPC encoding (generation of the LDPC code) by using the check matrix H of FIG. 28.

In a case where the LDPC encoding is performed by using the check matrix H of FIG. 28, according to the LDPC encoding, an LDPC code which has not been subjected to the parity interleaving can be obtained. Therefore, in a case where the LDPC encoding is performed by using the check matrix H of FIG. 28, the parity interleaving is performed in the parity interleaver 23 (FIG. 9).

Figure 29:
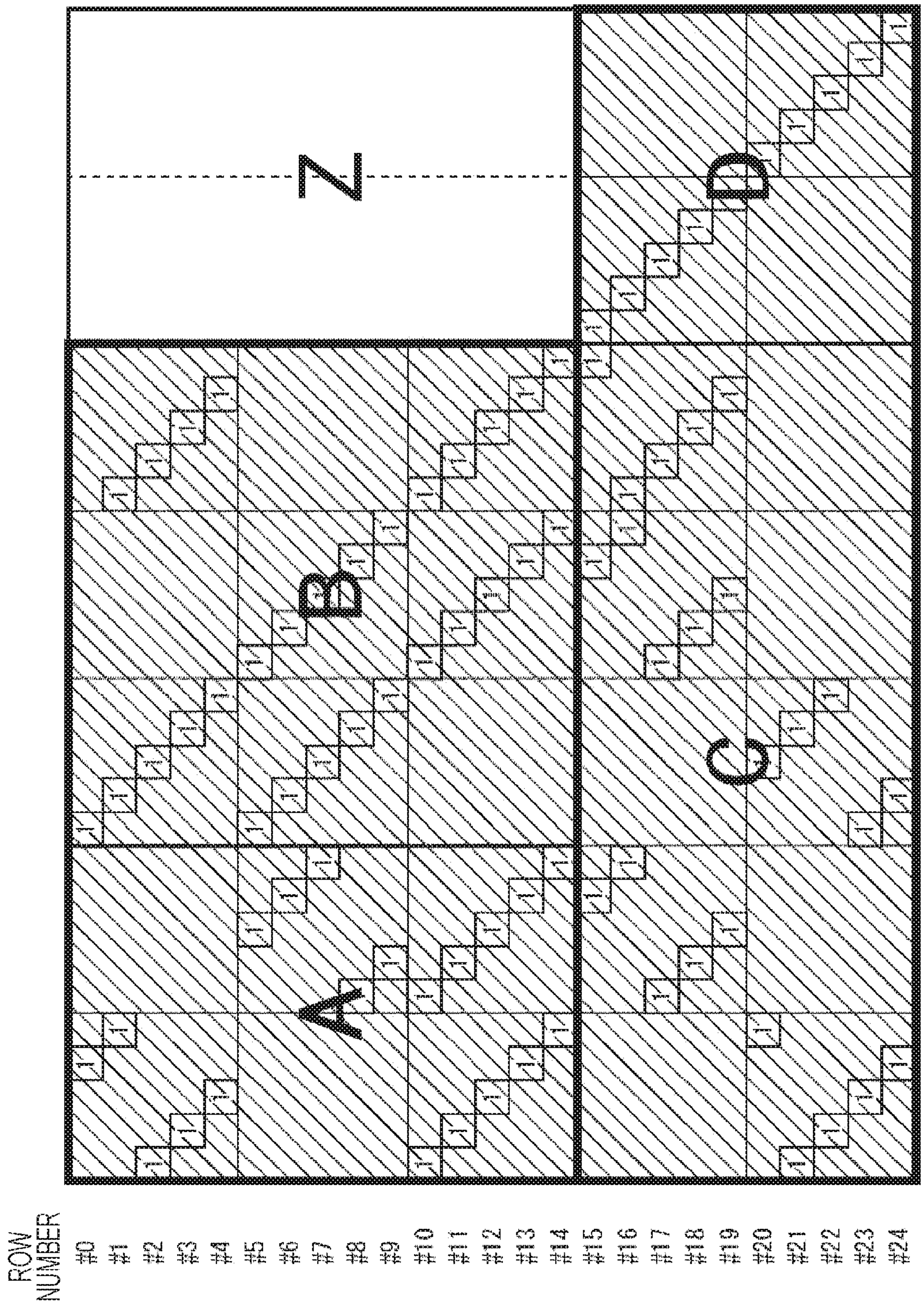
FIG. 29 is a diagram illustrating a transformed check matrix obtained by performing row permutation on a check matrix.

FIG. 29 is a diagram illustrating a transformed check matrix H obtained by performing row permutation on the check matrix H of FIG. 27.

As described later, the transformed check matrix is a matrix represented by a combination of P×P unit matrices, quasi-unit matrices in which one or more of 1's of the unit matrix become 0, shift matrices obtained by cyclically shifting the unit matrix or the quasi-unit matrix, sum matrices, each of which is a sum of two or more of the unit matrices, the quasi-unit matrices, or the shift matrices, and P×P zero matrices.

By using the transformed check matrix for the decoding of the LDPC code, it is possible to adopt an architecture for simultaneously performing P check node operations and variable node operations in the decoding of the LDPC code, as described later.

<New LDPC Code>

In data transmission using an LDPC code, as one of methods to ensure a good communication quality, there is a method of using an LDPC code with high-performance.

In the following, a new high performance LDPC code (hereinafter, also referred to as a new LDPC code) will be described.

As the new LDPC code, for example, a type-A code or a type-B code corresponding to the check matrix H having a cyclic structure may be adopted with a unit size P of 360 similar to that of DVB-T.2, ATSC 3.0, or the like.

The LDPC encoder 115 (FIGS. 8 and 18) can perform the LDPC encoding on a new LDPC code by using the check matrix initial value table (the check matrix H obtained from the new LDPC code) of the new LDPC with a code length N of being longer than 64 k bits, for example, 69120 bits and an encoding rate r of any one of for example, 2/16, 3/16, 4/16, 5/16, 6/16, 7/16, 8/16, 9/16, 10/16, 11/16, 12/16, 13/16, or 14/16, as follows.

In this case, the check matrix initial value table of the new LDPC code is stored in the storage unit 602 of the LDPC encoder 115 (FIG. 8).

FIG. 30 is a diagram illustrating an example of the check matrix initial value table (of type-A scheme) indicating a check matrix H of a type-A code (hereinafter, also referred to as a type-A code with r=2/16) as a new LDPC code with a code length N of 69120 bits and an encoding rate r of 2/16.

Figure 32:
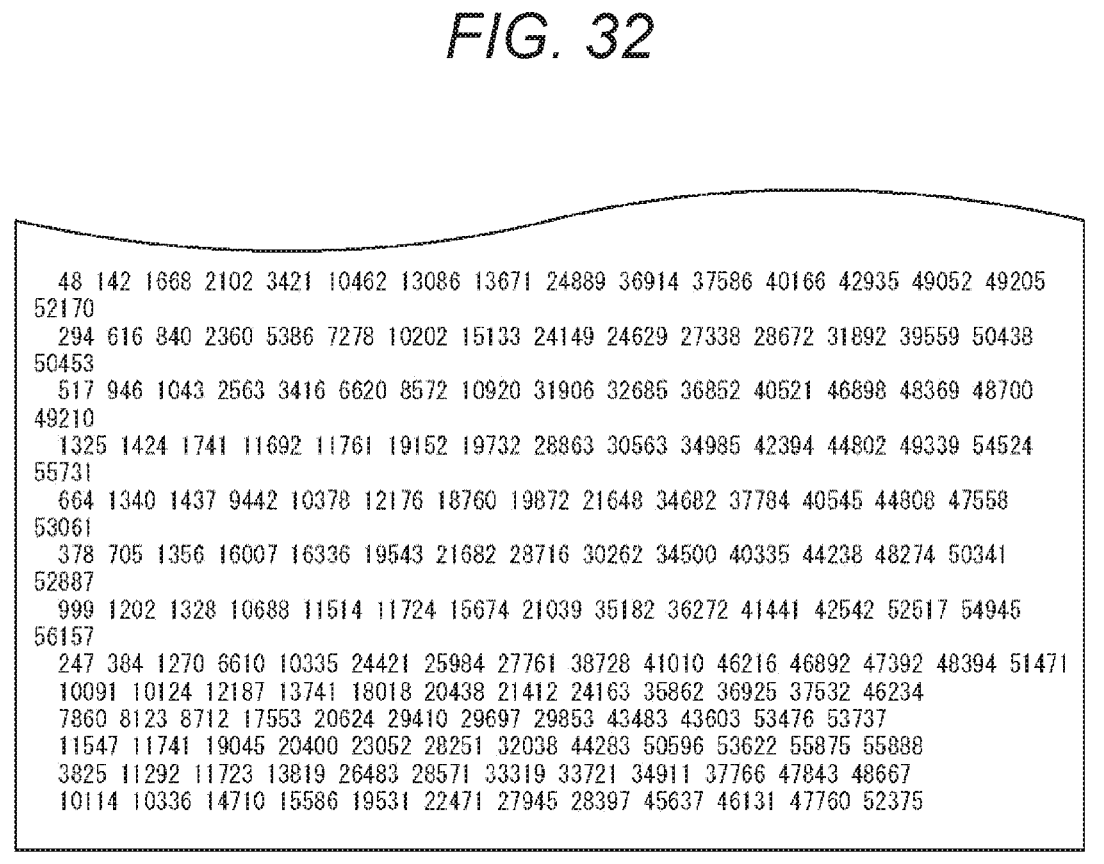

FIGS. 31 and 32 are diagrams illustrating an example of the check matrix initial value table indicating a check matrix H of a type-A code (hereinafter, also referred to as a type-A code with r=3/16) as a new LDPC code with a code length N of 69120 bits and an encoding rate r of 3/16.

Note that FIG. 32 is a diagram following FIG. 31.

FIG. 33 is a diagram illustrating an example of the check matrix initial value table (of type-A scheme) indicating a check matrix H of a type-A code (hereinafter, also referred to as a type-A code with r=4/16) as a new LDPC code with a code length N of 69120 bits and an encoding rate r of 4/16.

Figure 35:
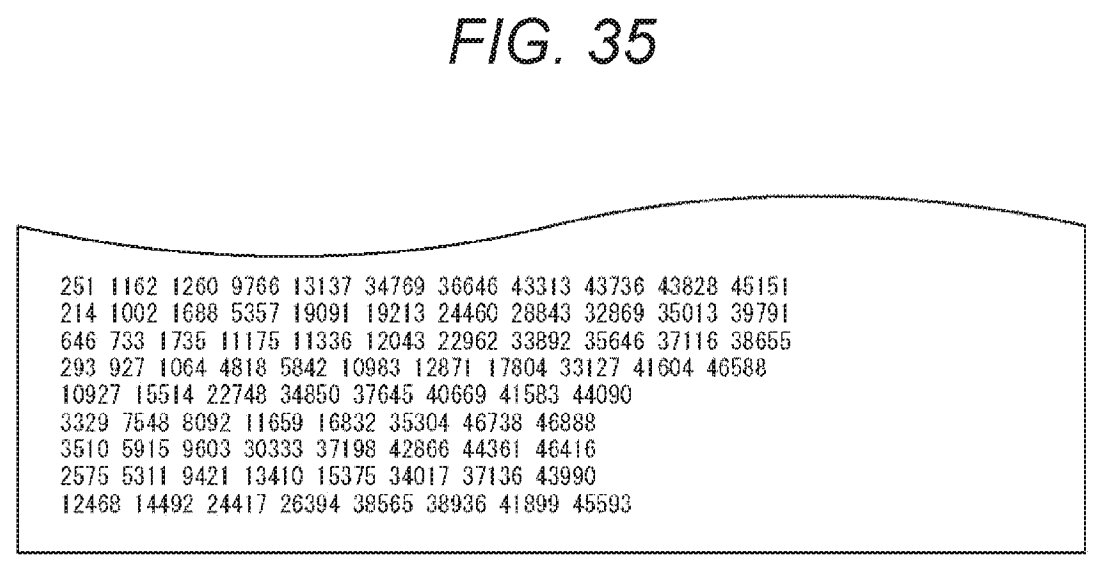

FIGS. 34 and 35 are diagrams illustrating an example of the check matrix initial value table indicating a check matrix H of a type-A code (hereinafter, also referred to as a type-A code with r=5/16) as a new LDPC code with a code length N of 69120 bits and an encoding rate r of 5/16.

Note that FIG. 35 is a diagram following FIG. 34.

FIGS. 36 and 37 are diagrams illustrating an example of the check matrix initial value table indicating a check matrix H of a type-A code (hereinafter, also referred to as a type-A code with r=6/16) as a new LDPC code with a code length N of 69120 bits and an encoding rate r of 6/16.

Note that FIG. 37 is a diagram following FIG. 36.

Figure 39:
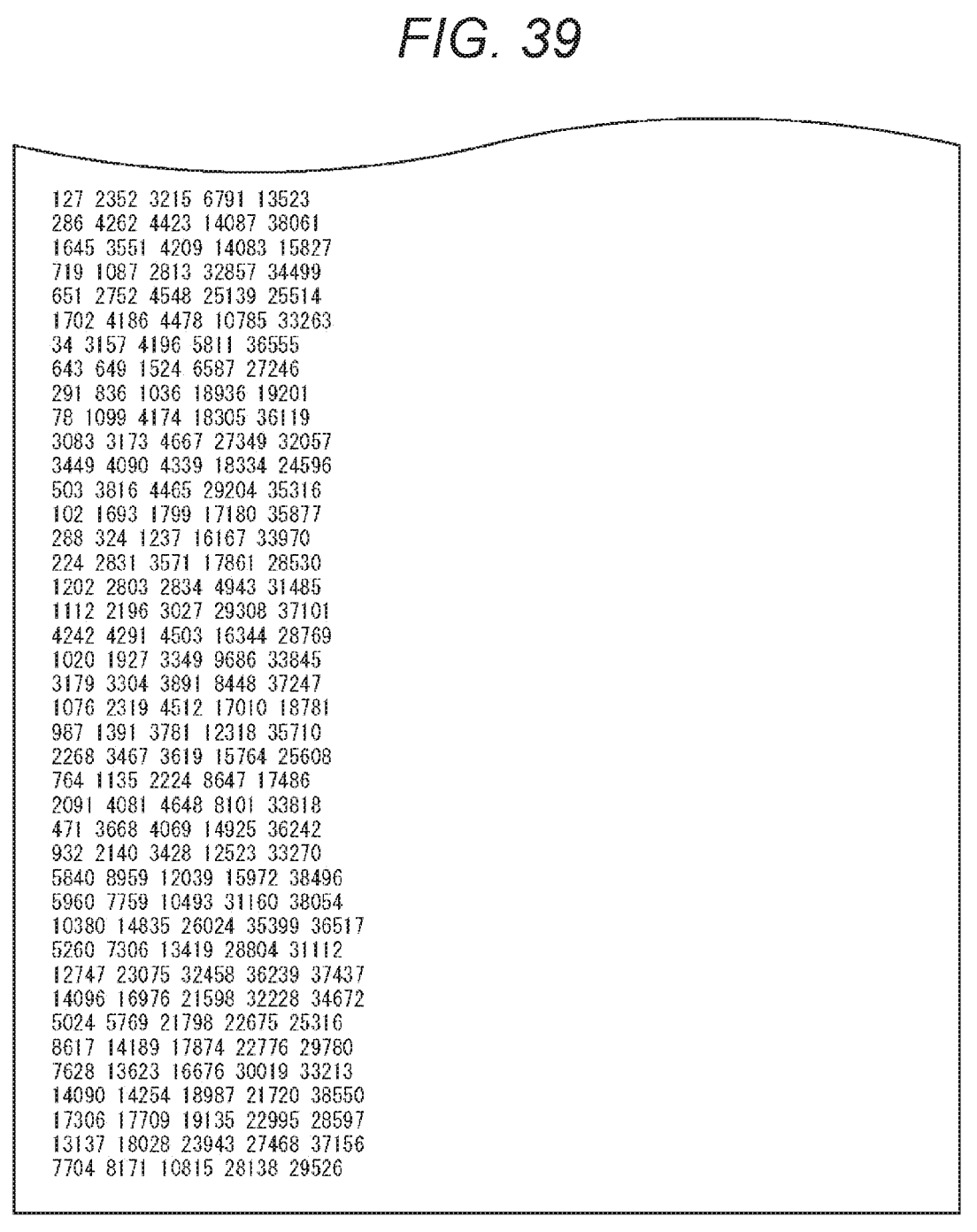

FIGS. 38 and 39 are diagrams illustrating an example of the check matrix initial value table indicating a check matrix H of a type-A code (hereinafter, also referred to as a type-A code with r=7/16) as a new LDPC code with a code length N of 69120 bits and an encoding rate r of 7/16.

Note that FIG. 39 is a diagram following FIG. 38.

Figure 41:
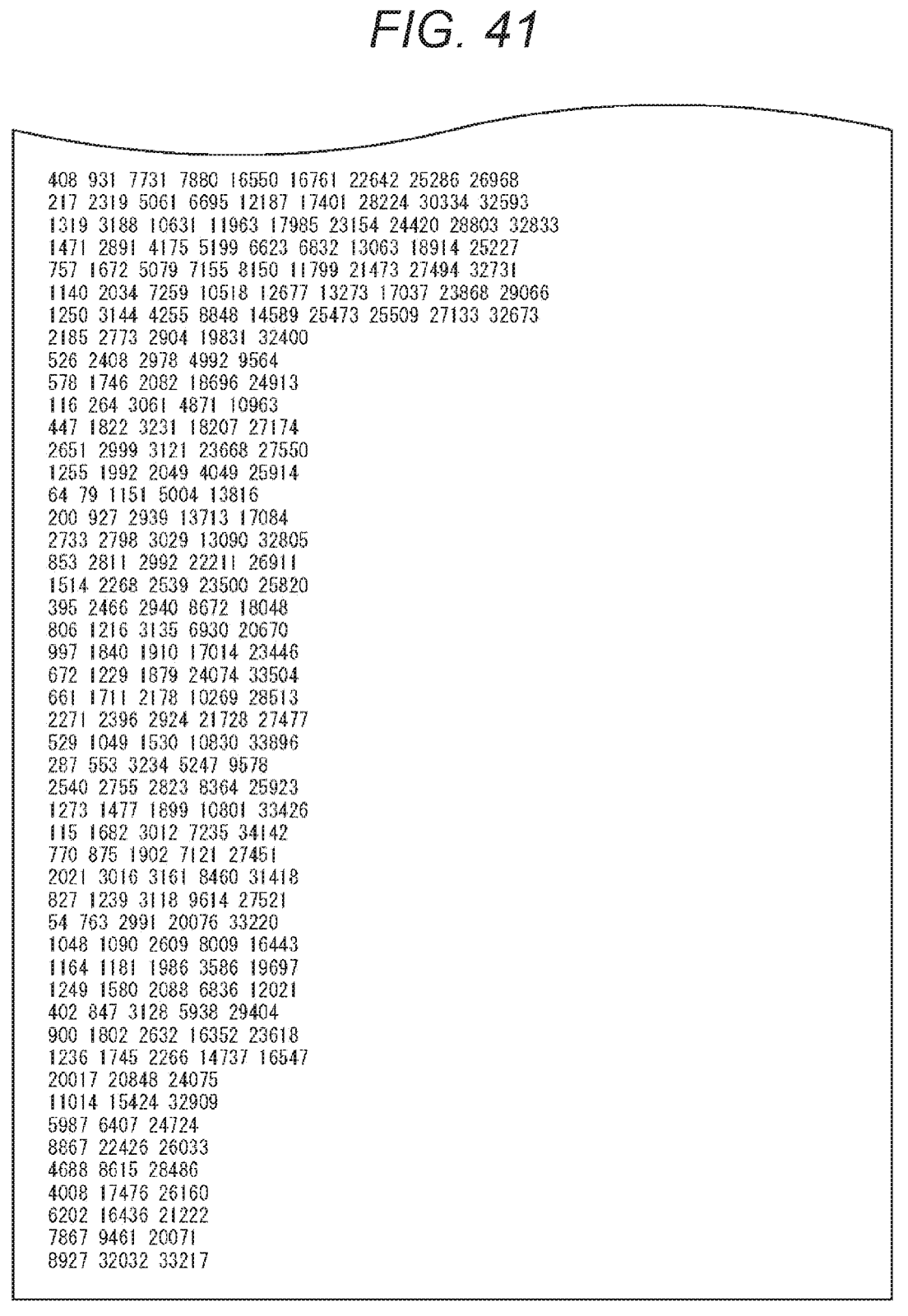

FIGS. 40 and 41 are diagrams illustrating an example of the check matrix initial value table indicating a check matrix H of a type-A code (hereinafter, also referred to as a type-A code with r=8/16) as a new LDPC code with a code length N of 69120 bits and an encoding rate r of 8/16.

Note that FIG. 41 is a diagram following FIG. 40.

Figure 43:
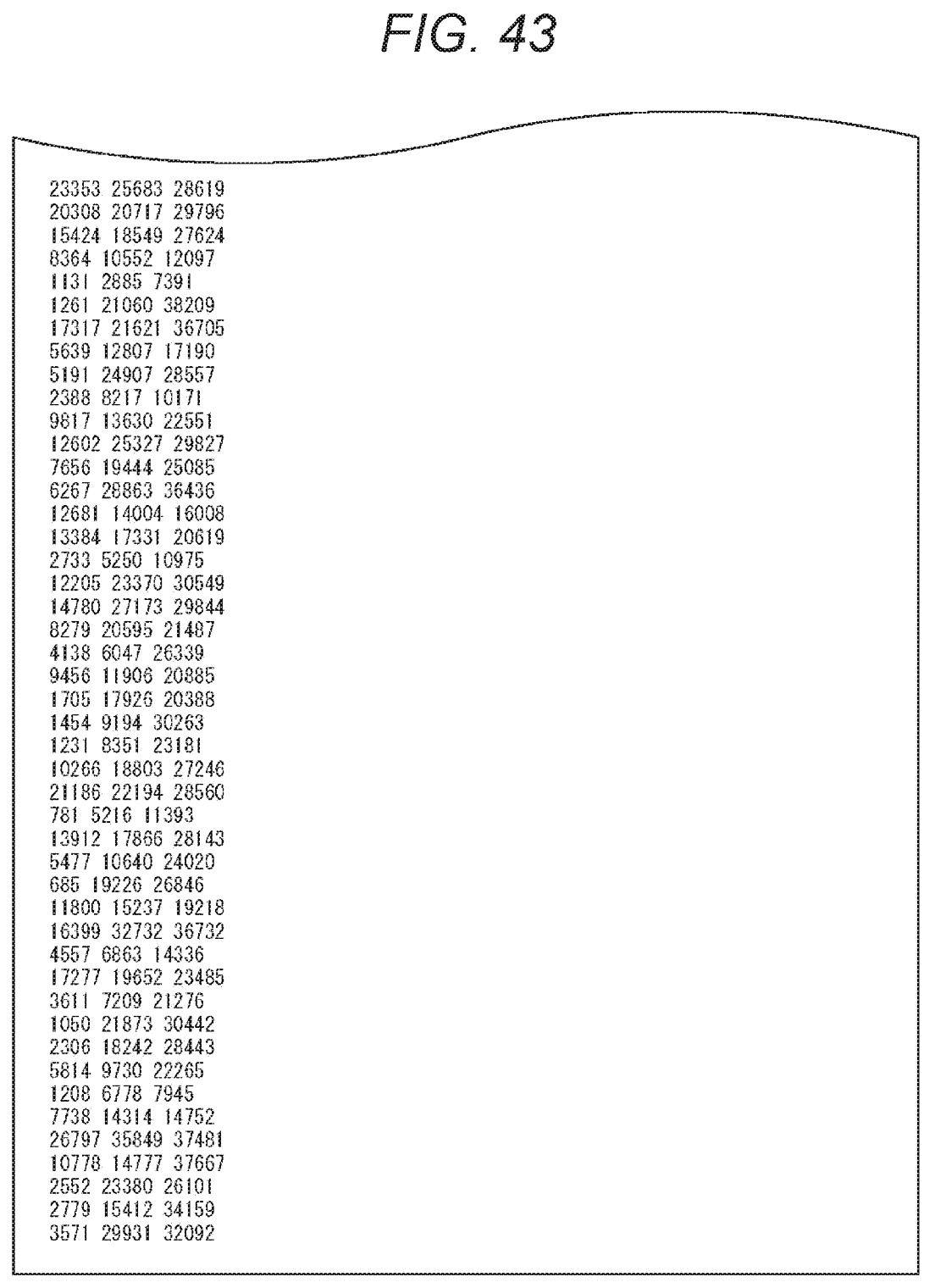

FIGS. 42 and 43 are diagrams illustrating an example of the check matrix initial value table indicating a check matrix H of a type-B code (hereinafter, also referred to as a type-B code with r=7/16) as a new LDPC code with a code length N of 69120 bits and an encoding rate r of 7/16.

Note that FIG. 43 is a diagram following FIG. 42.

Figure 45:
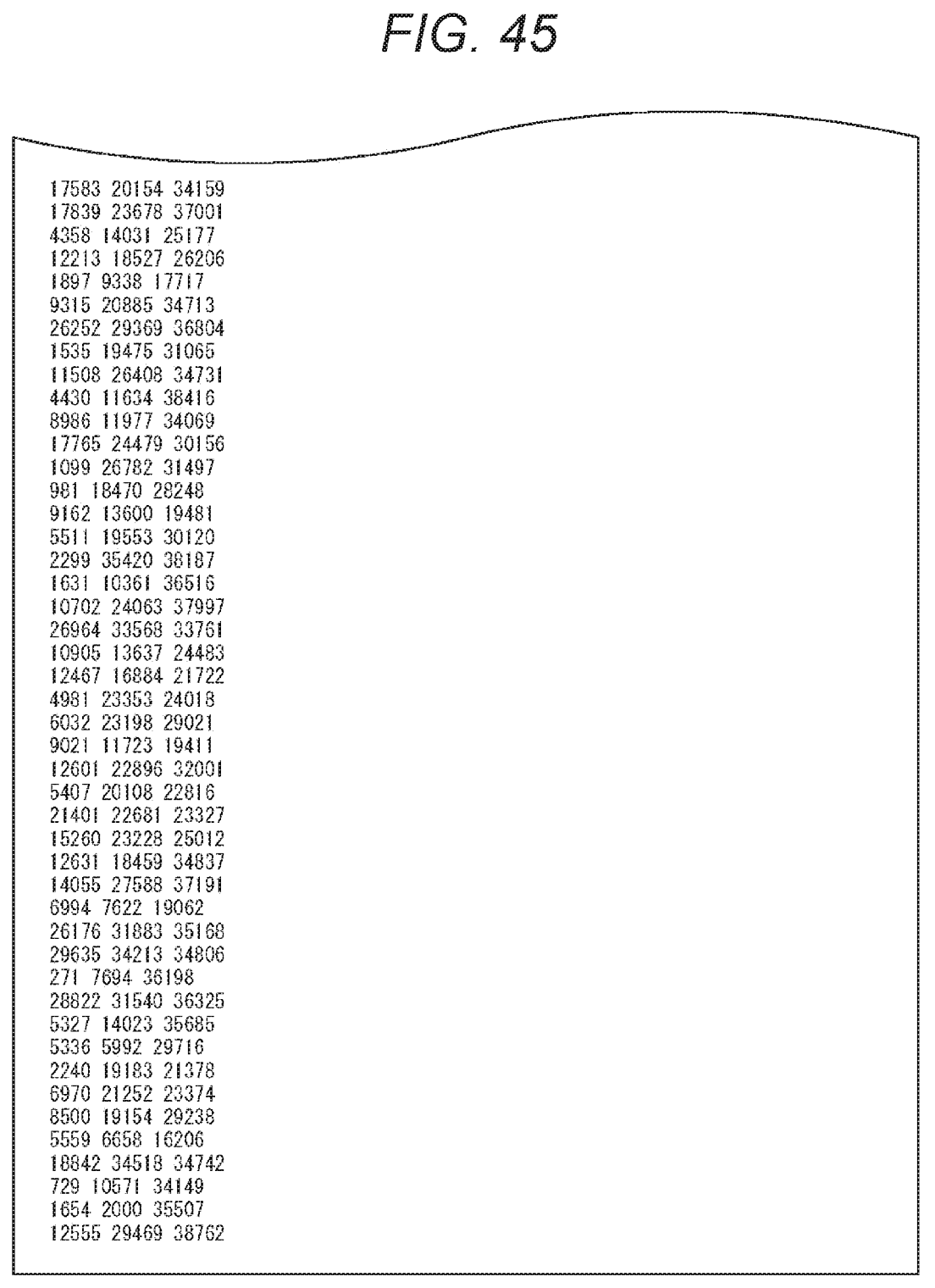

FIGS. 44 and 45 are diagrams illustrating another example of the check matrix initial value table indicating a check matrix H of the type-B code with r=7/16.

Note that FIG. 45 is a diagram following FIG. 44. The type-B code with r=7/16 obtained from (the check matrix H indicated by) the check matrix initial value table of FIGS. 44 and 45 is hereinafter also referred to as another type-B code with r=7/16.

FIGS. 46 and 47 are diagrams illustrating an example of the check matrix initial value table indicating a check matrix H of a type-B code (hereinafter, also referred to as a type-B code with r=8/16) as a new LDPC code with a code length N of 69120 bits and an encoding rate r of 8/16.

Note that FIG. 47 is a diagram following FIG. 46.

Figure 49:
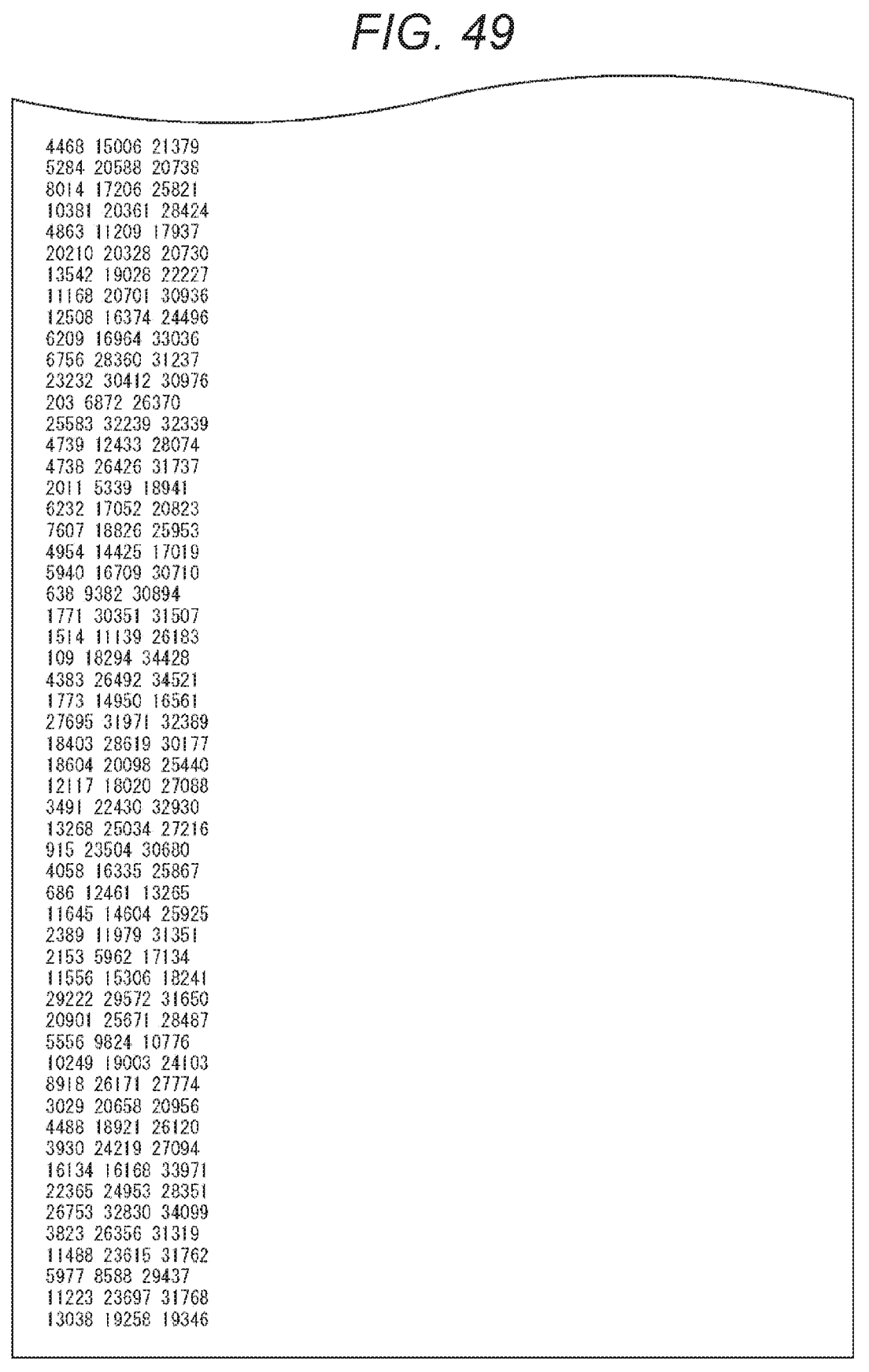

FIGS. 48 and 49 are diagrams illustrating another example of a check matrix initial value table indicating a check matrix H of a type-B code with r=8/16.

Note that FIG. 49 is a diagram following FIG. 48. Hereinafter, the type-B code with r=8/16 obtained from the check matrix initial value table of FIGS. 48 and 49 is also referred to as another type-B code with r=8/16.

Figure 51:
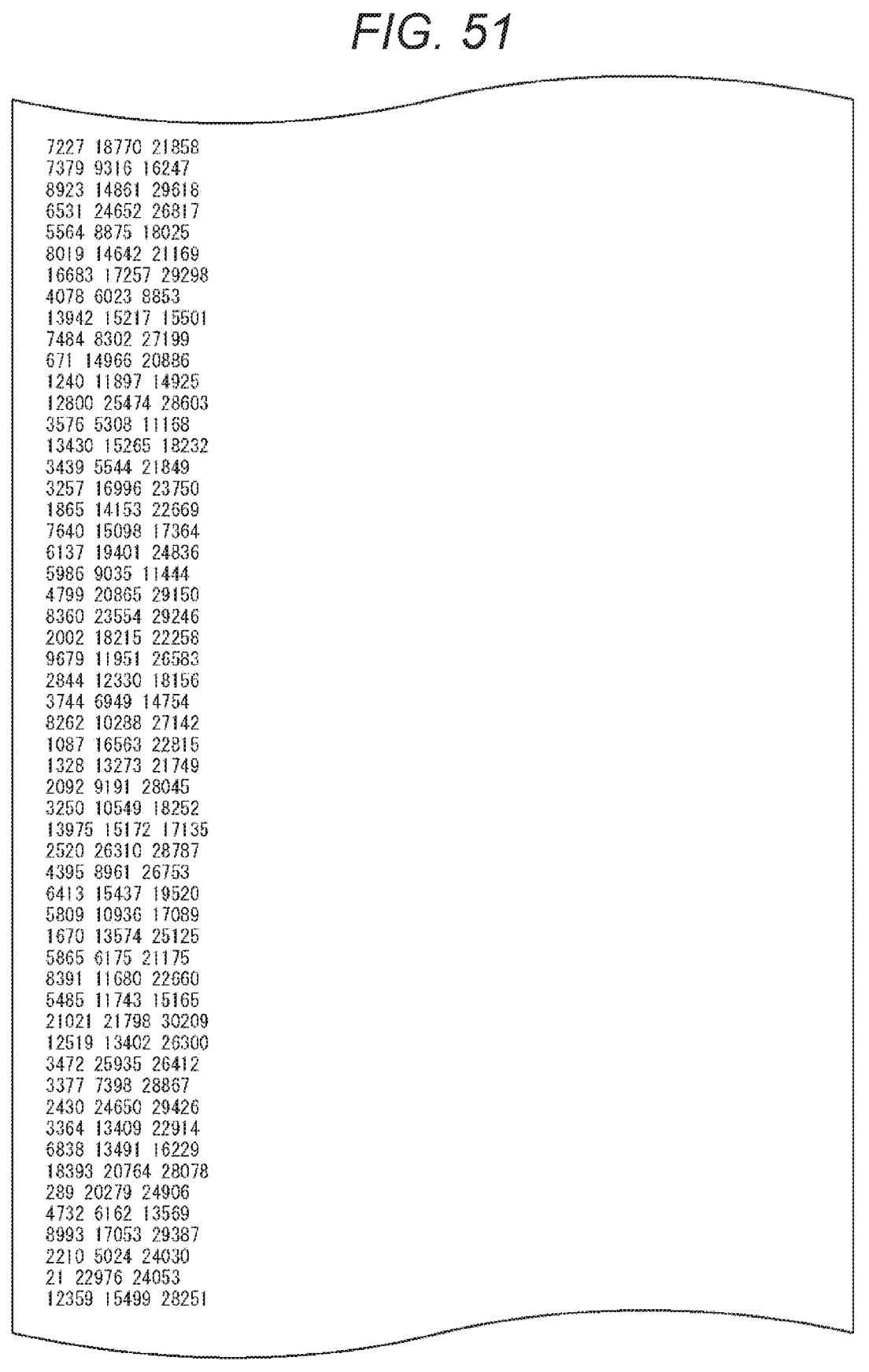

FIGS. 50, 51, and 52 are diagrams illustrating an example of a check matrix initial value table indicating a check matrix H of a type-B code (hereinafter, also referred to as type-B code with r=9/16) as a new LDPC code with a code length N of 69120 bits and an encoding rate r of 9/16.

Note that FIG. 51 is a diagram following FIG. 50, and FIG. 52 is a diagram following FIG. 51.

Figure 54:
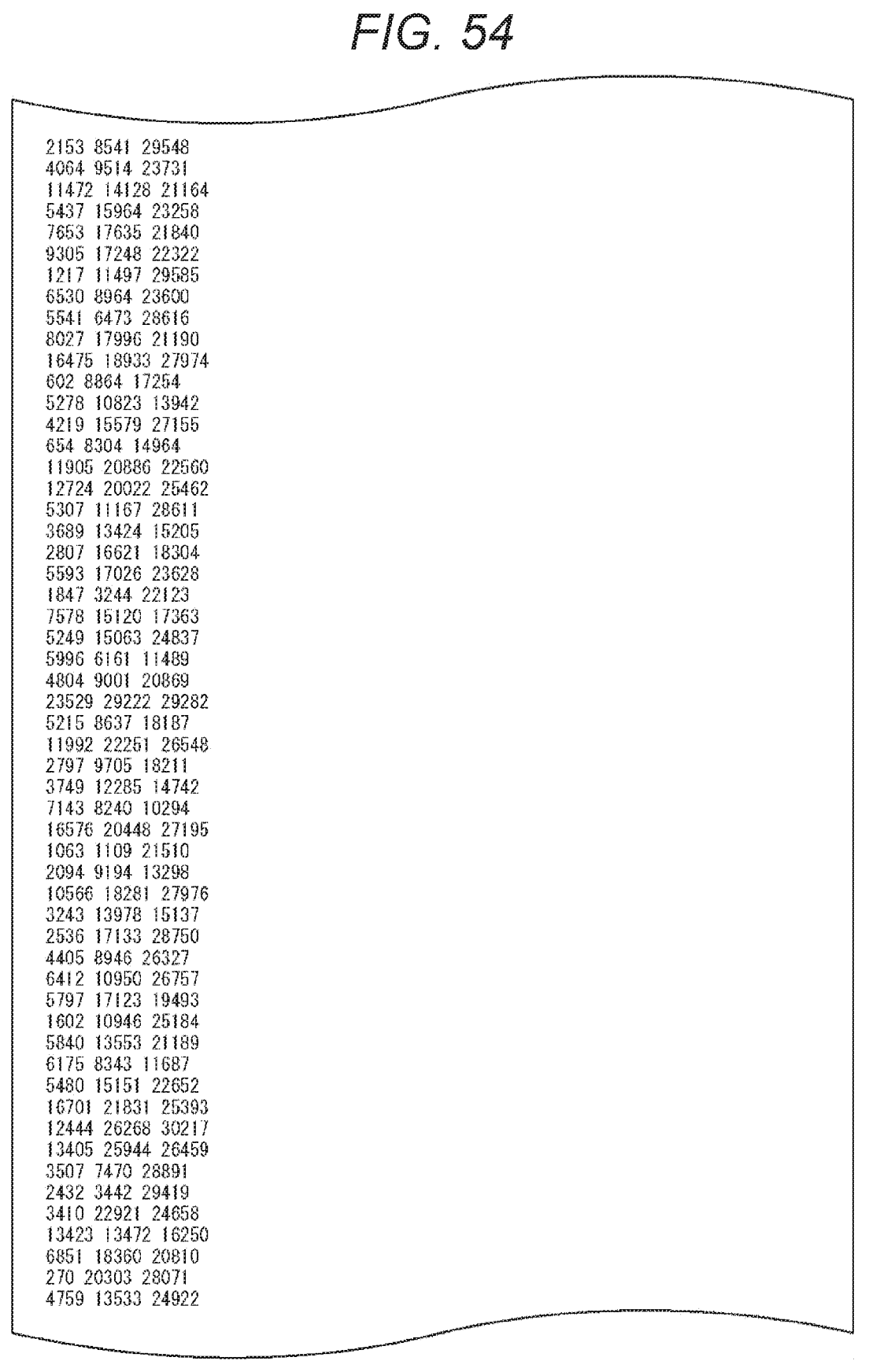
Figure 55:
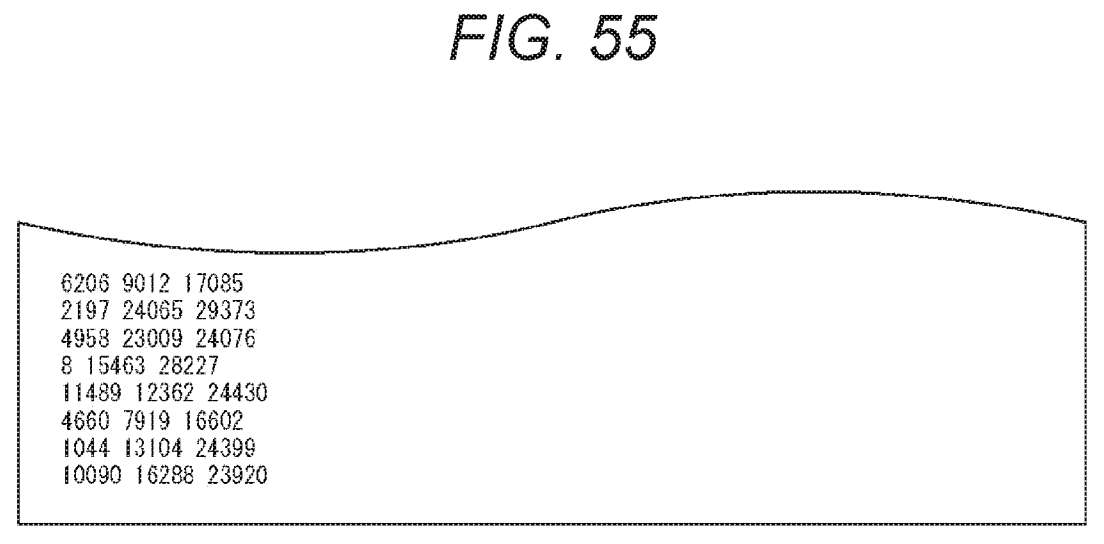

FIGS. 53, 54 and 55 are diagrams illustrating other examples of the check matrix initial value tables indicating check matrix H of type-B code with r=9/16.

Note that FIG. 54 is a diagram following FIG. 53, and FIG. 55 is a diagram following FIG. 54. Hereinafter, the type-B code with r=9/16 obtained from the check matrix initial value table of FIGS. 53 to 55 is also referred to as another type-B code with r=9/16.

FIGS. 56, 57, and 58 are diagrams illustrating an example of a check matrix initial value table indicating a check matrix H of a type-B code (hereinafter, also referred to as a type-B code with r=10/16) as a new LDPC code with a code length N of 69120 bits and an encoding rate r of 10/16.

Note that FIG. 57 is a diagram following FIG. 56, and FIG. 58 is a diagram following FIG. 57.

Figure 60:
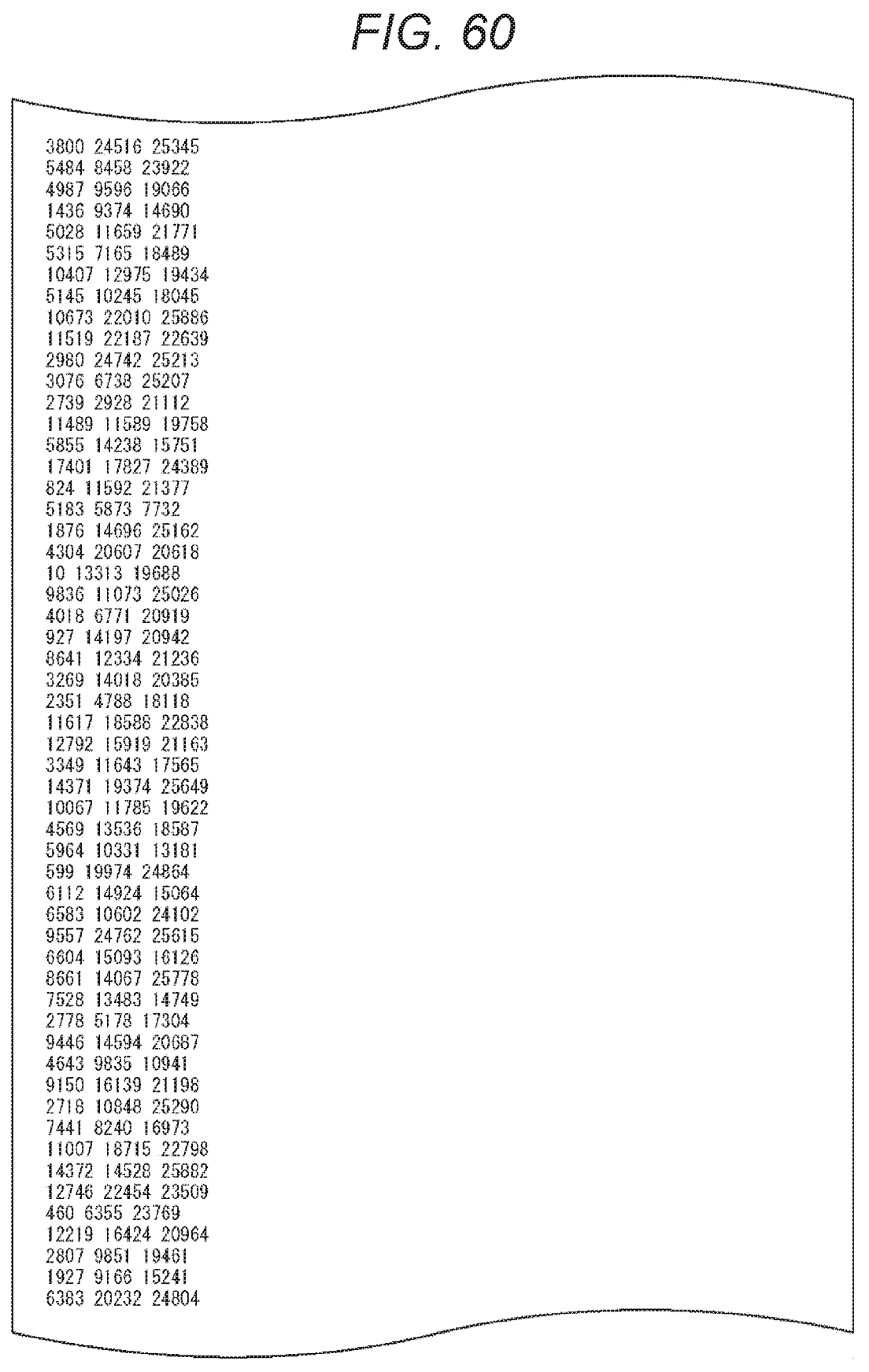
Figure 61:
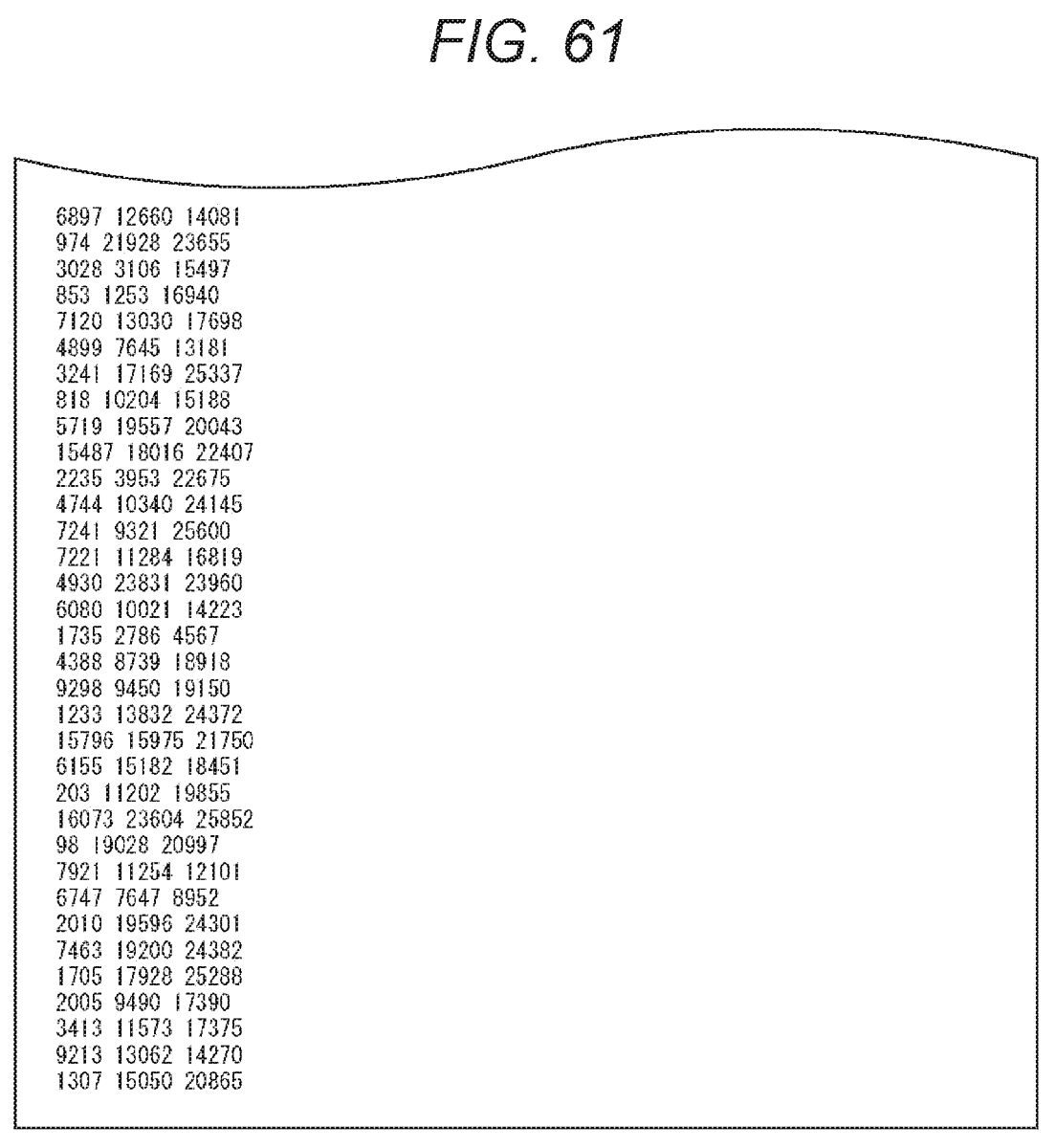

FIGS. 59, 60, and 61 are diagrams illustrating another example of a check matrix initial value table indicating a check matrix H of a type-B code with r=10/16.

Note that FIG. 60 is a diagram following FIG. 59, and FIG. 61 is a diagram following FIG. 60. Hereinafter, the type-B code with r=10/16 obtained from the check matrix initial value table of FIGS. 59 to 61 is also referred to as another type-B code with r=10/16.

Figure 63:
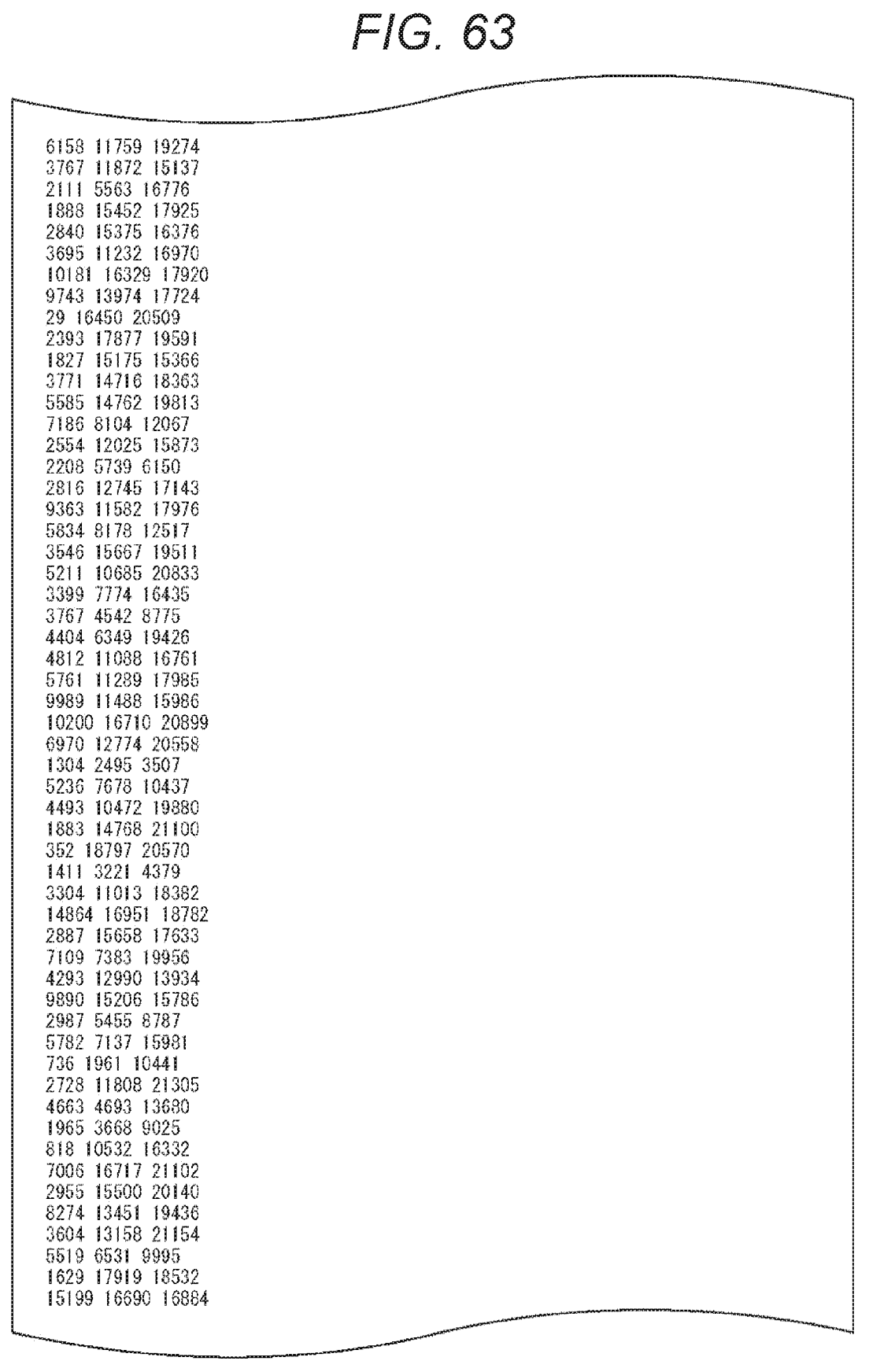
Figure 64:
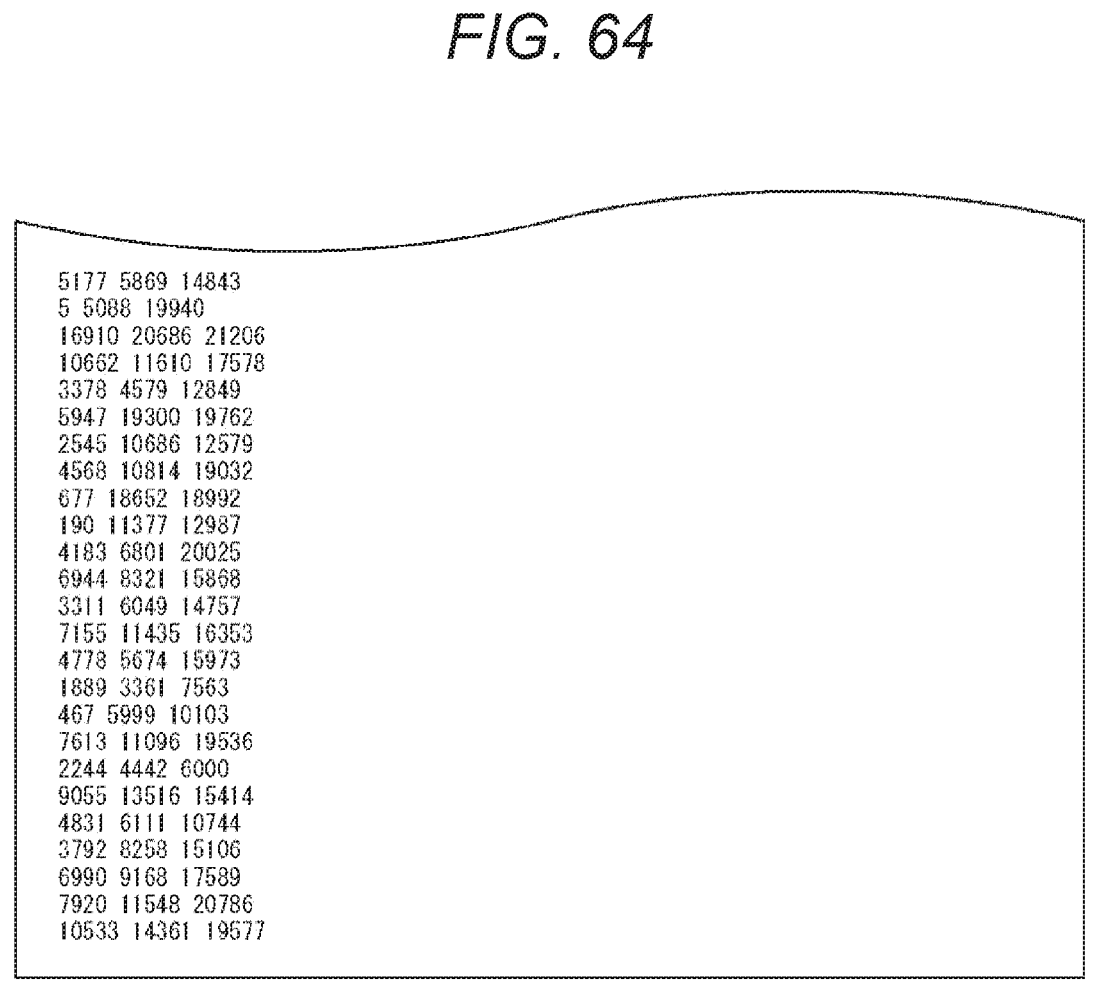

FIGS. 62, 63, and 64 are diagrams illustrating an example of a check matrix initial value table indicating a check matrix H of a type-B code (hereinafter, also referred to as a type-B code with r=11/16) as a new LDPC code with a code length N of 69120 bits and an encoding rate r of 11/16.

Note that FIG. 63 is a diagram following FIG. 62, and FIG. 64 is a diagram following FIG. 63.

Figure 66:
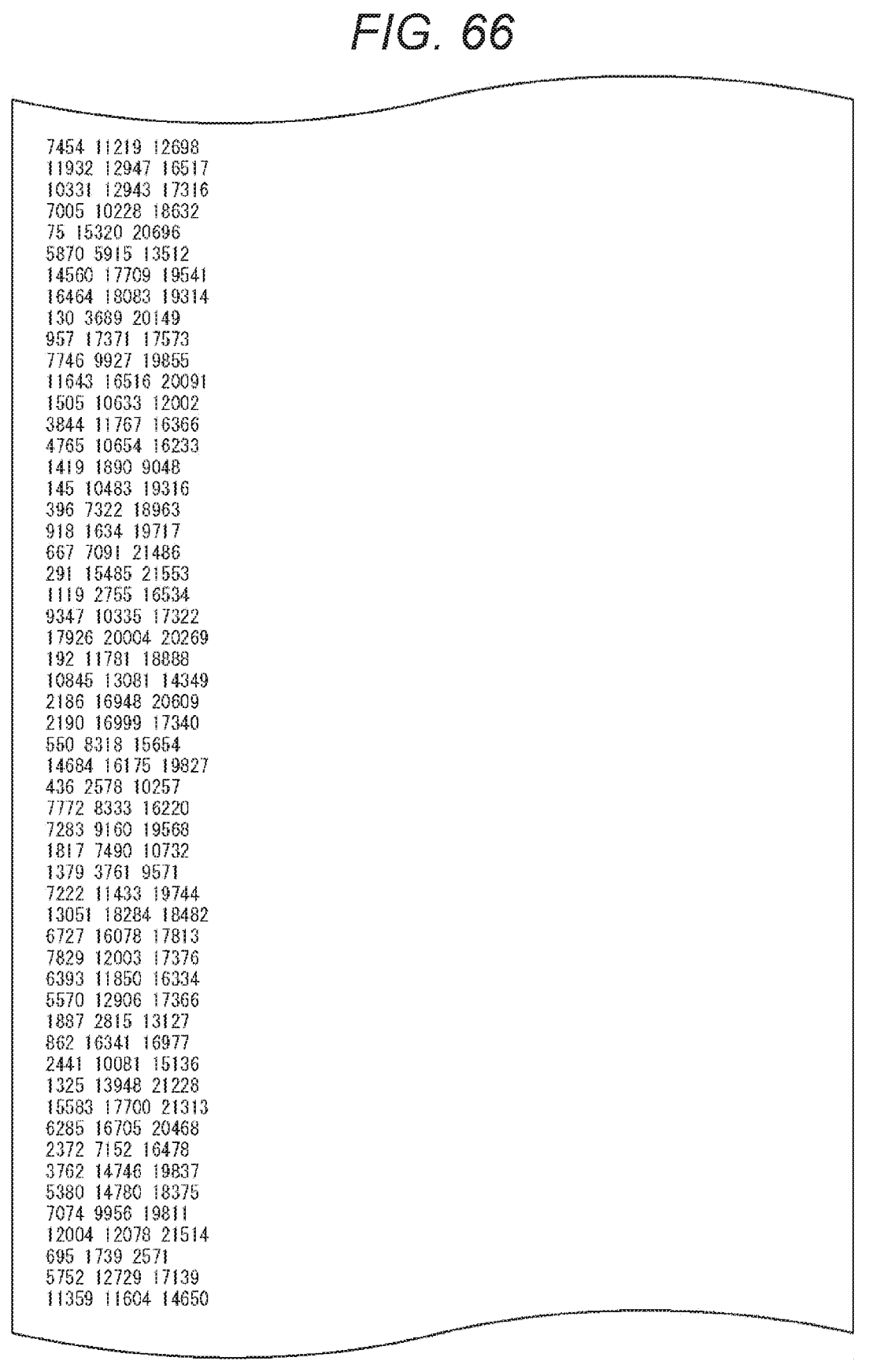
Figure 67:
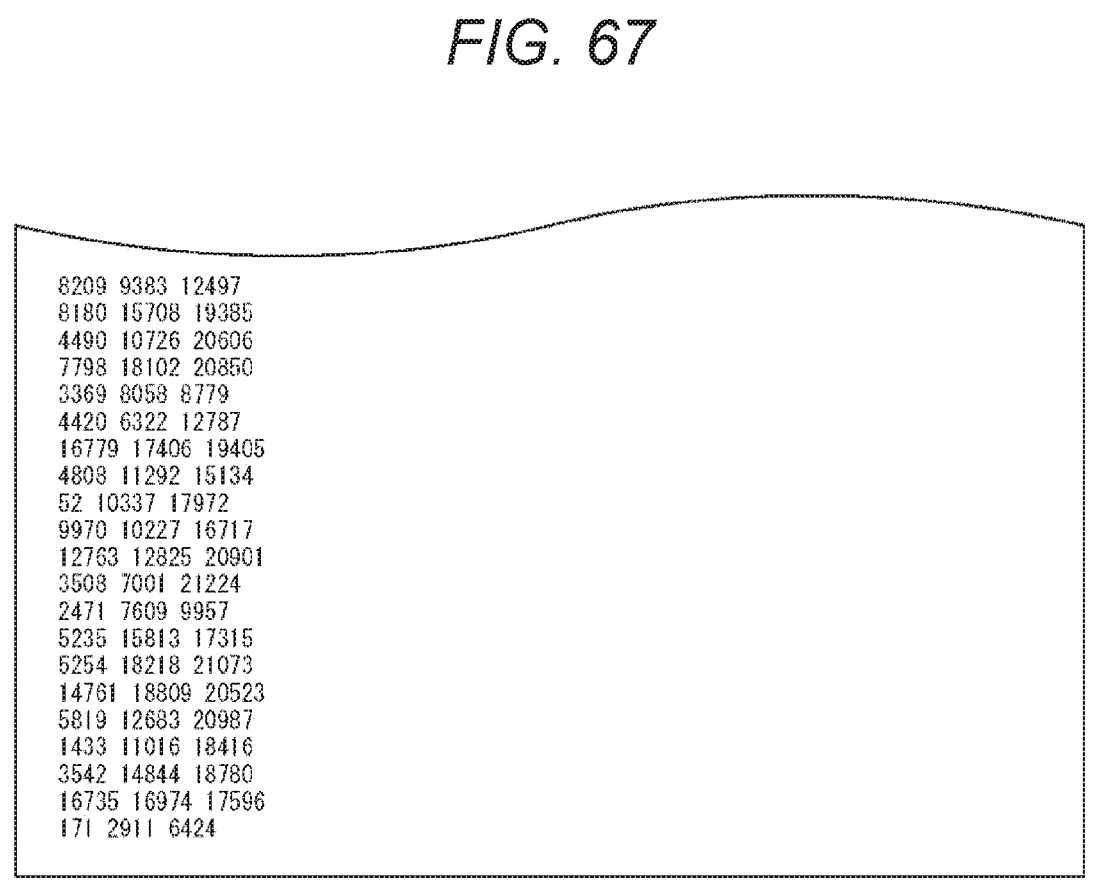

FIGS. 65, 66 and 67 are diagrams illustrating other examples of a check matrix initial value table indicating a check matrix H of a type-B code with r=11/16.

Note that FIG. 66 is a diagram following FIG. 65, and FIG. 67 is a diagram following FIG. 66. Hereinafter, the type-B code with r=11/16 obtained from the check matrix initial value table of FIGS. 65 to 67 is also referred to as another type-B code with r=11/16.

FIGS. 68, 69, and 70 are diagrams illustrating an example of a check matrix initial value table indicating a check matrix H of a type-B code (hereinafter, also referred to as a type-B code with r=12/16) as a new LDPC code with a code length N of 69120 bits and an encoding rate r of 12/16.

Note that FIG. 69 is a diagram following FIG. 68, and FIG. 70 is a diagram following FIG. 69.

Figure 72:
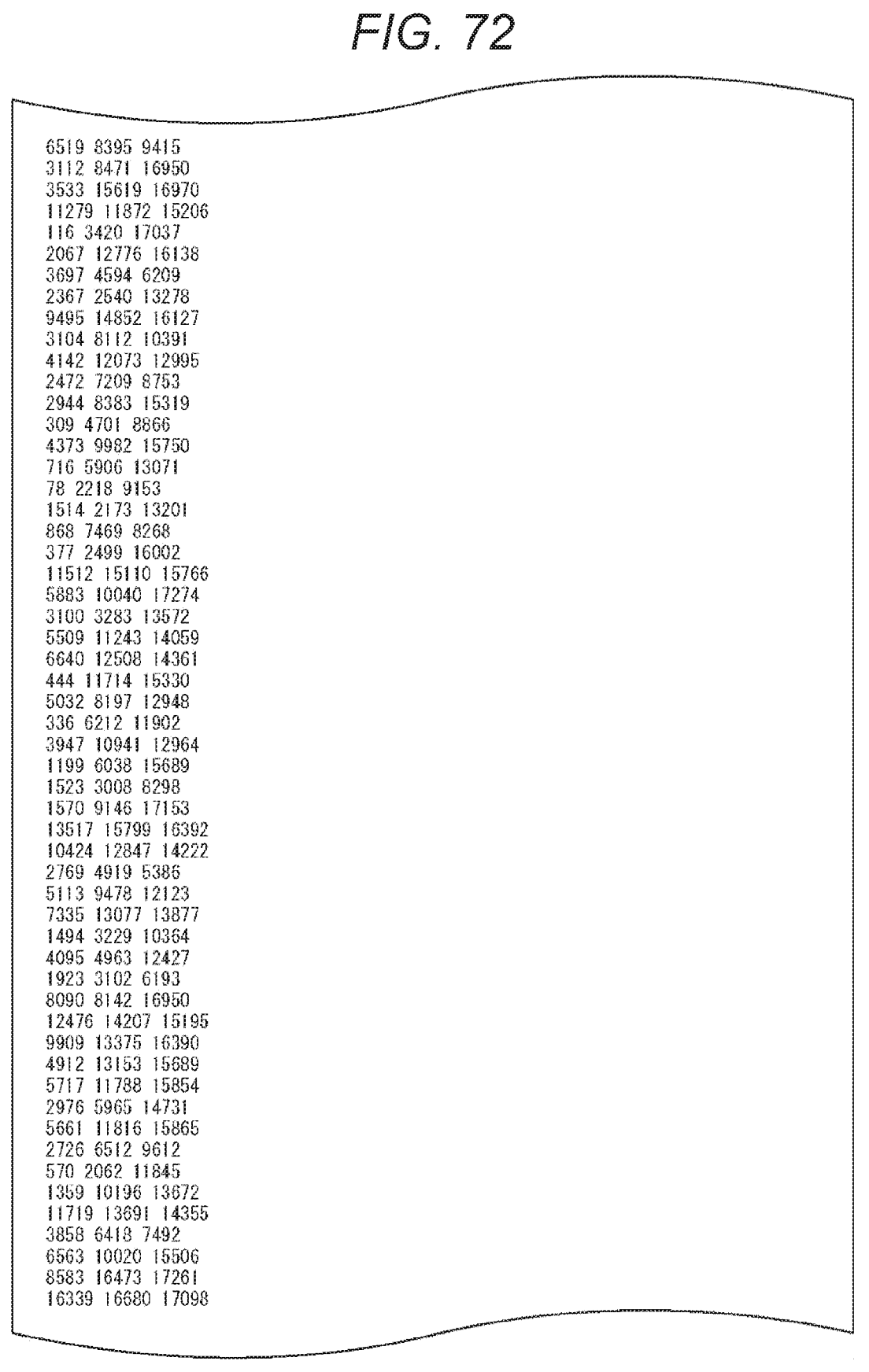
Figure 73:
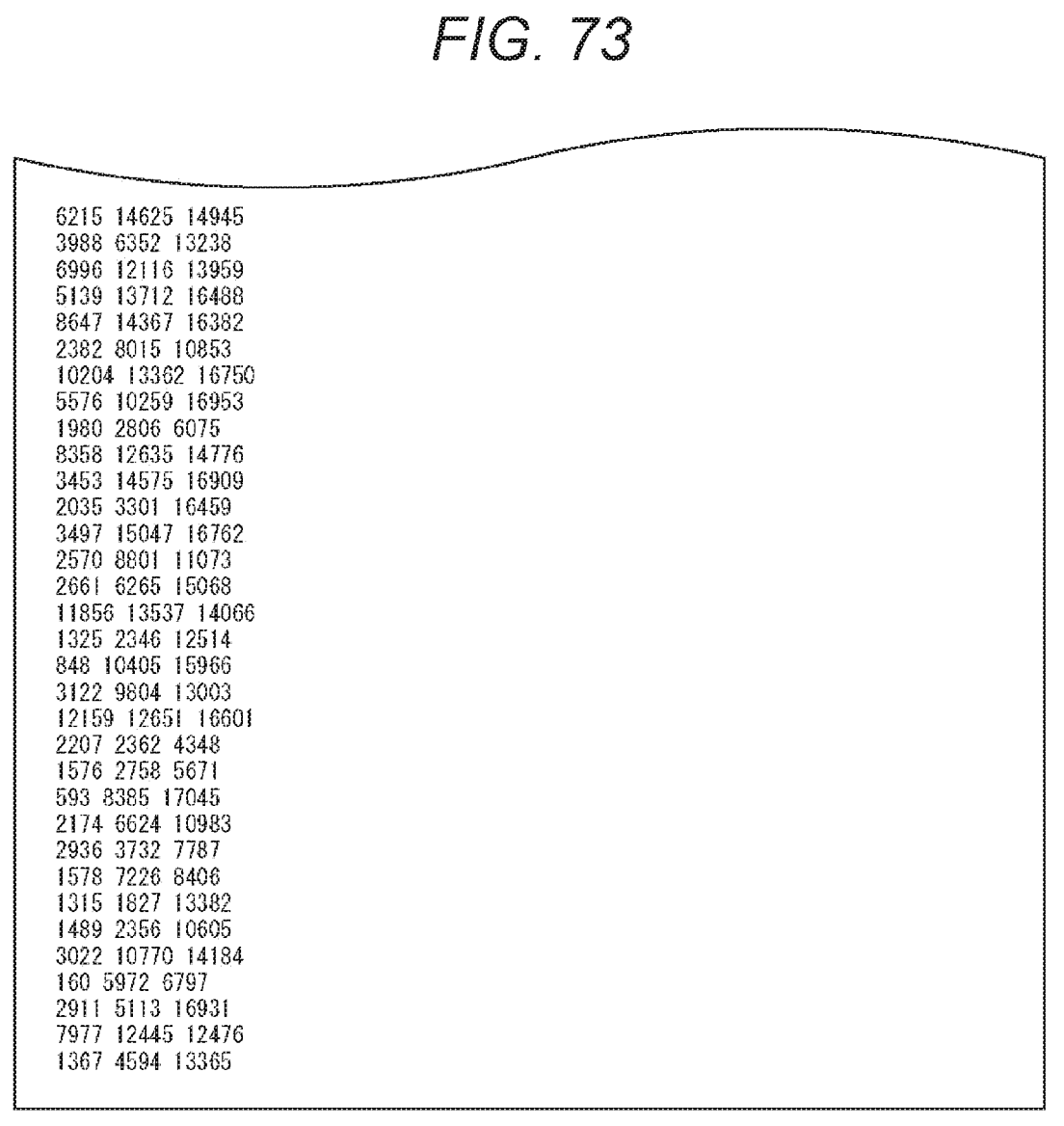

FIGS. 71, 72, and 73 are diagrams illustrating another example of a check matrix initial value table indicating a check matrix H of a type-B code with r=12/16.

Note that FIG. 72 is a diagram following FIG. 71, and FIG. 73 is a diagram following FIG. 72. Hereinafter, the type-B code with r=12/16 obtained from the check matrix initial value table of FIGS. 71 to 73 is also referred to as another type-B code with r=12/16.

Figure 75:
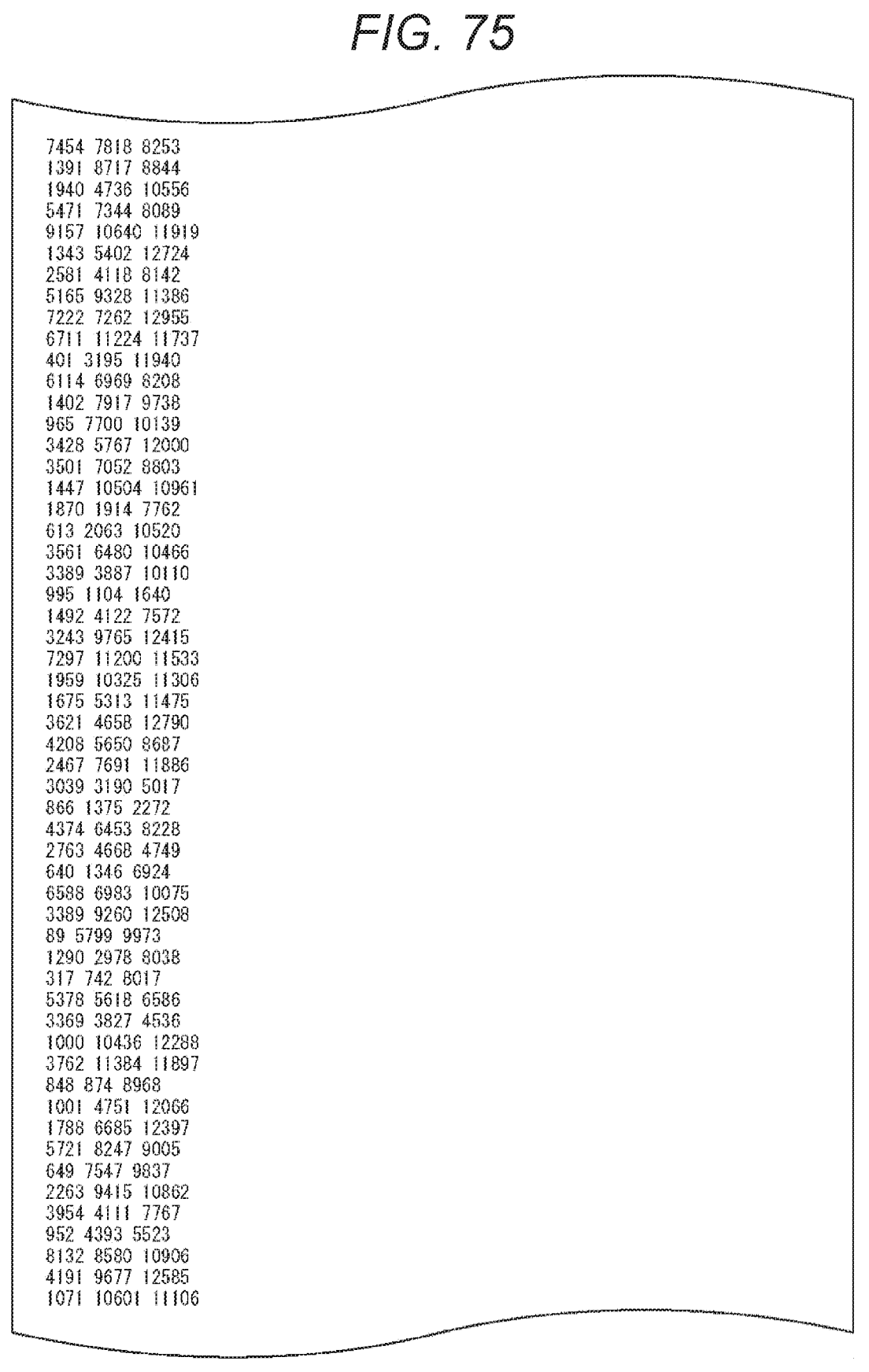
Figure 76:
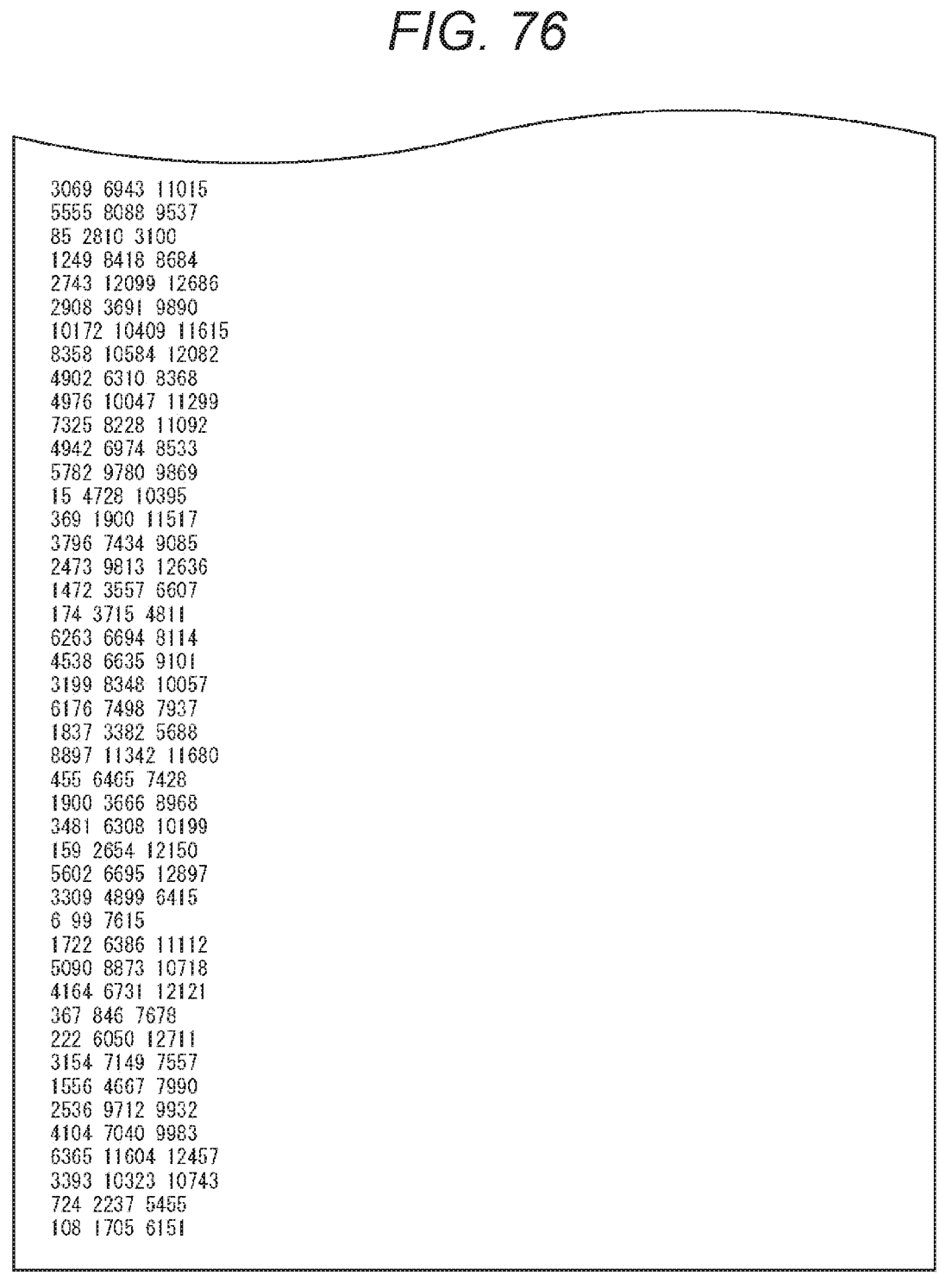

FIGS. 74, 75, and 76 are diagrams illustrating an example of a check matrix initial value table indicating a check matrix H of a type-B code (hereinafter, also referred to as a type-B code with r=13/16) as a new LDPC code with a code length N of 69120 bits and an encoding rate r of 13/16.

Note that FIG. 75 is a diagram following FIG. 74, and FIG. 76 is a diagram following FIG. 75.

Figure 78:
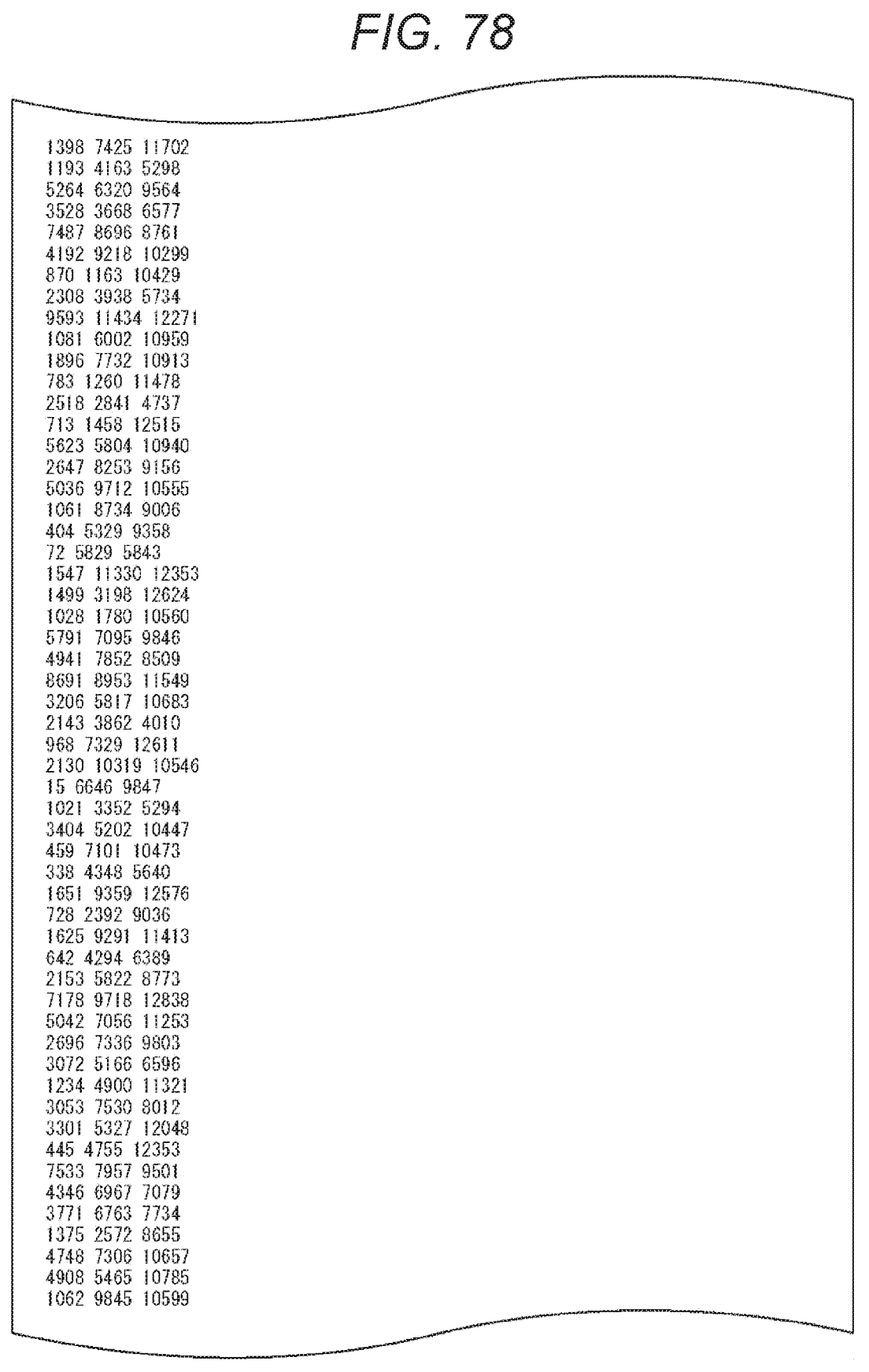
Figure 79:
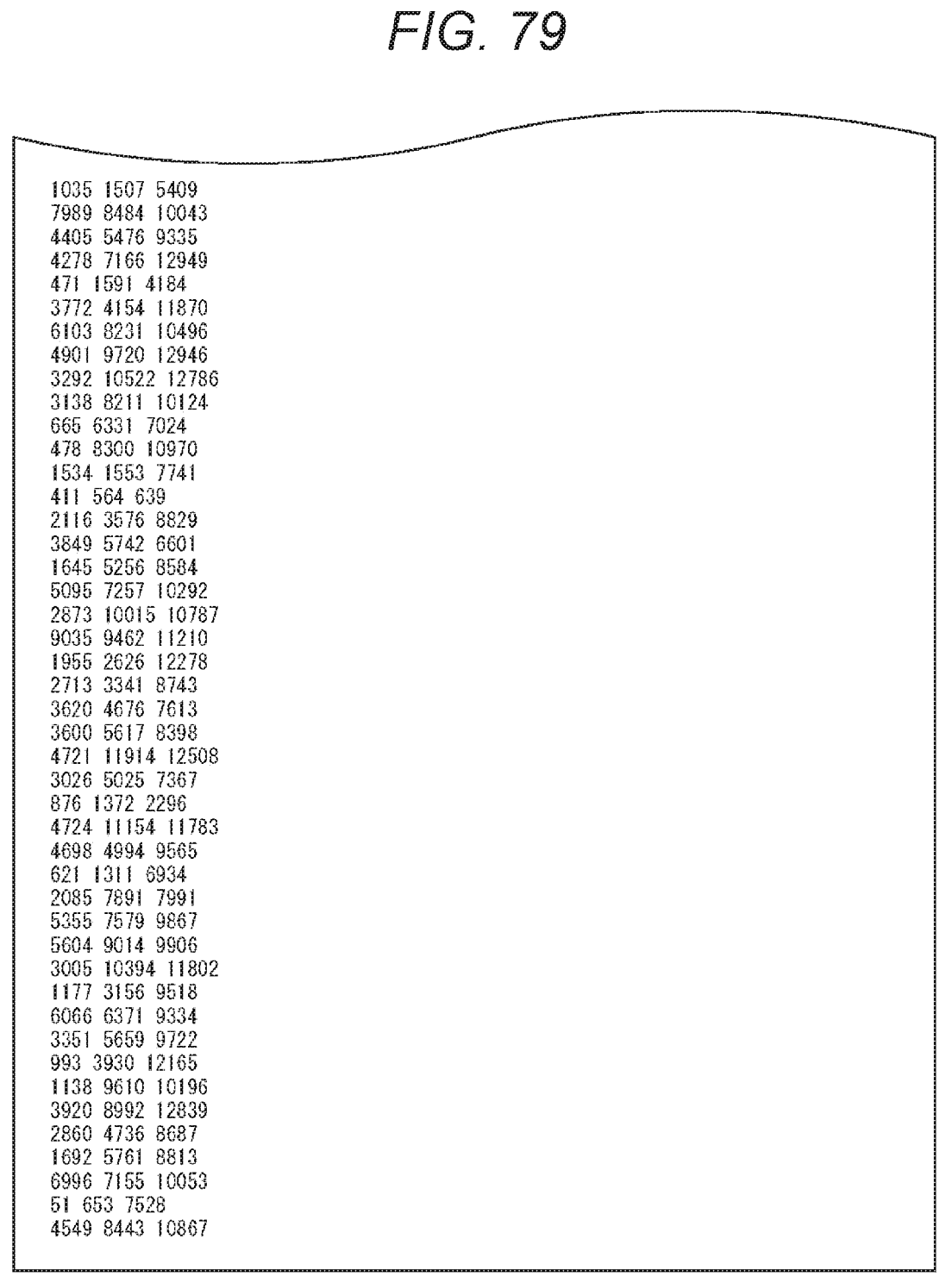

FIGS. 77, 78, and 79 are diagrams illustrating another example of a check matrix initial value table indicating a check matrix H of a type-B code with r=13/16.

Note that FIG. 78 is a diagram following FIG. 77, and FIG. 79 is a diagram following FIG. 78. Hereinafter, the type-B code with r=13/16 obtained from the check matrix initial value table of FIGS. 77 to 79 is also referred to as another type-B code with r=13/16.

FIGS. 80, 81, and 82 are diagrams illustrating an example of a check matrix initial value table indicating a check matrix H of a type-B code (hereinafter, also referred to as a type-B code with r=14/16) as a new LDPC code with a code length N of 69120 bits and an encoding rate r of 14/16.

Note that FIG. 81 is a diagram following FIG. 80, and FIG. 82 is a diagram following FIG. 81.

Figure 84:
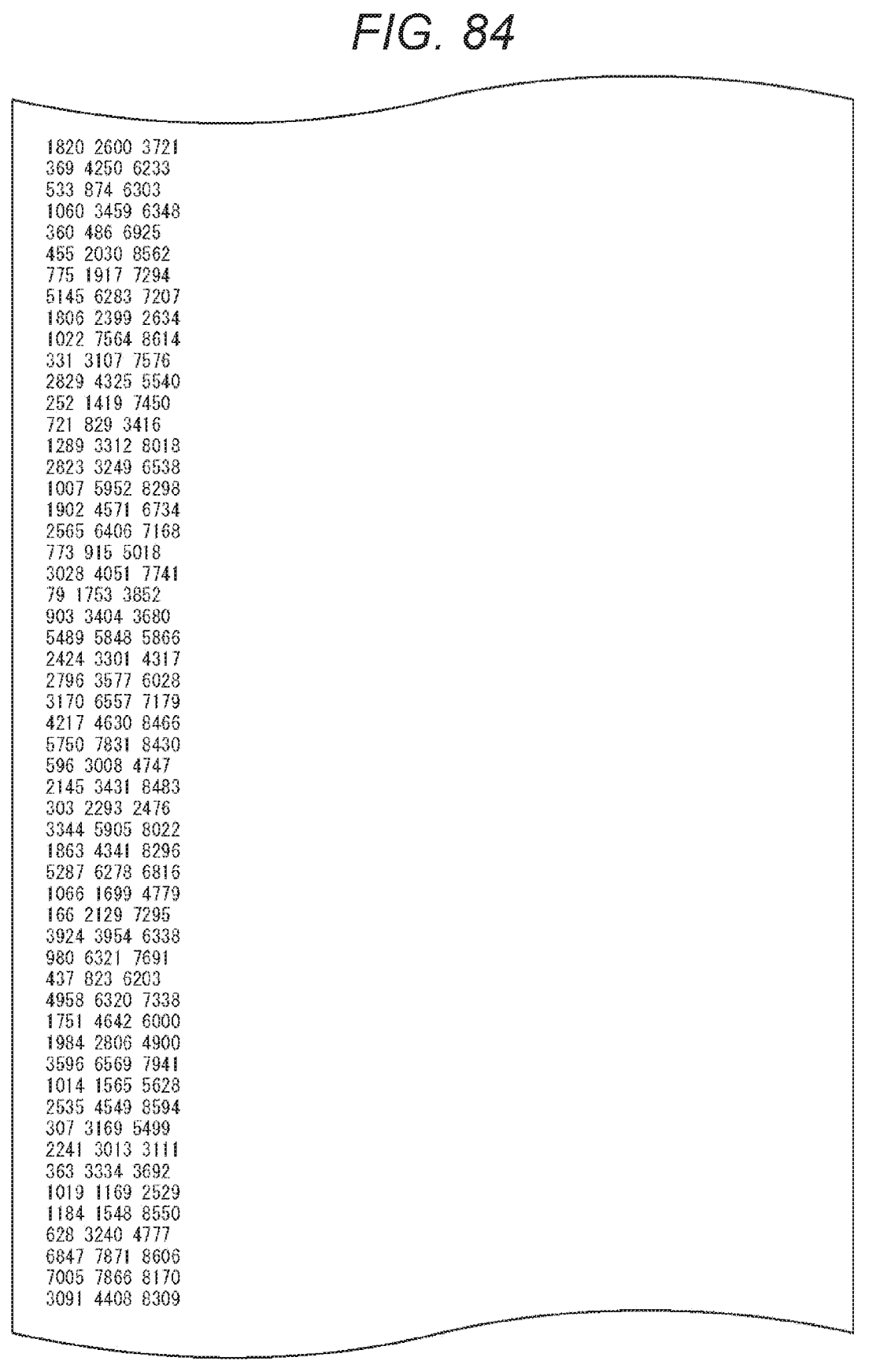
Figure 85:
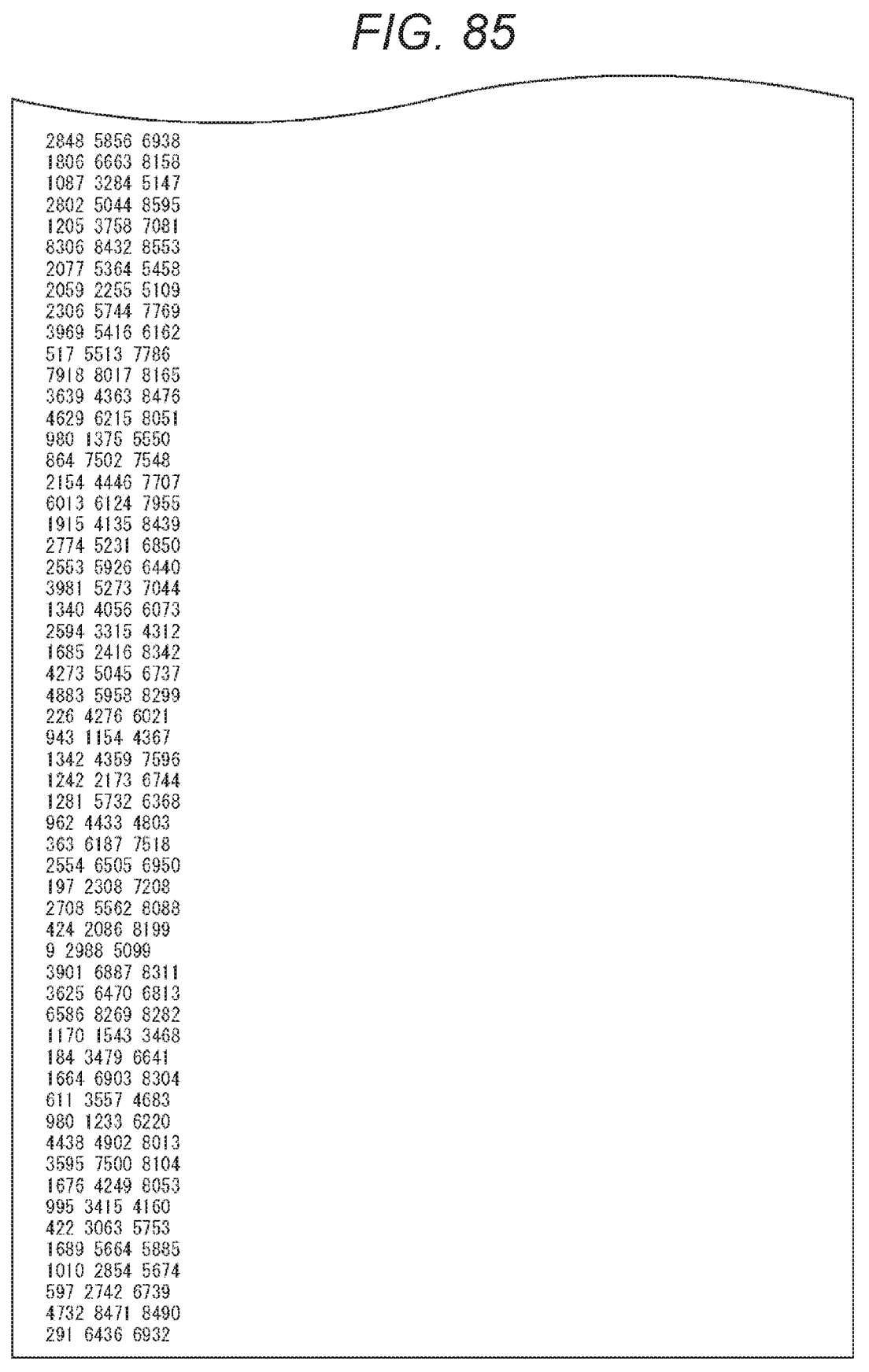

FIGS. 83, 84 and 85 are diagrams illustrating other examples of a check matrix initial value table indicating check matrix H of a type-B code with r=14/16.

Note that FIG. 84 is a diagram following FIG. 83, and FIG. 85 is a diagram following FIG. 84. Hereinafter, the type-B code with r=14/16 obtained from the check matrix initial value table of FIGS. 83 to 85 is also referred to as another type-B code with r=14/16.

The new LDPC code has become a high-performance LDPC code.

Herein, the high-performance LDPC code is an LDPC code obtained from an appropriate check matrix H.

An appropriate check matrix H is a check matrix that satisfies a predetermined condition which allows a bit error rate (BER) (and frame error rate (FER)) to be smaller, for example, when the LDPC code obtained from the check matrix H is transmitted at a low $E_s/N_0$ or $E_b/N_o$ (signal power to noise power ratio per bit).

The appropriate check matrix H can be obtained, for example, by performing simulation to measure the BER when the LDPC code obtained from various check matrices satisfying the predetermined condition is transmitted at a low $E_s/N_o$.

As the predetermined condition to be satisfied by the appropriate check matrix H, there is, for example, a condition that the analysis result obtained by an analysis method for the performance of a code called density evolution is good, a condition that a loop of elements of 1 called 'Cycle 4' does not exist, or the like.

Herein, it is known that the decoding performance of the LDPC code is deteriorated if the elements of 1 are densely packed in the information matrix $H_A$ as in the Cycle 4, and thus, it is desirable that the Cycle 4 does not exist in the check matrix H.

In the check matrix H, the minimum value of the length (loop length) of a loop formed by elements of 1 is referred to as a girth. The absence of the Cycle 4 denotes that the girth is greater than four.

In addition, the predetermined condition to be satisfied by the appropriate check matrix H can be appropriately determined from the point of view of the improvement in the decoding performance of the LDPC code, the facilitation (simplification) of the decoding processing of the LDPC code, and the like.

Figure 86:
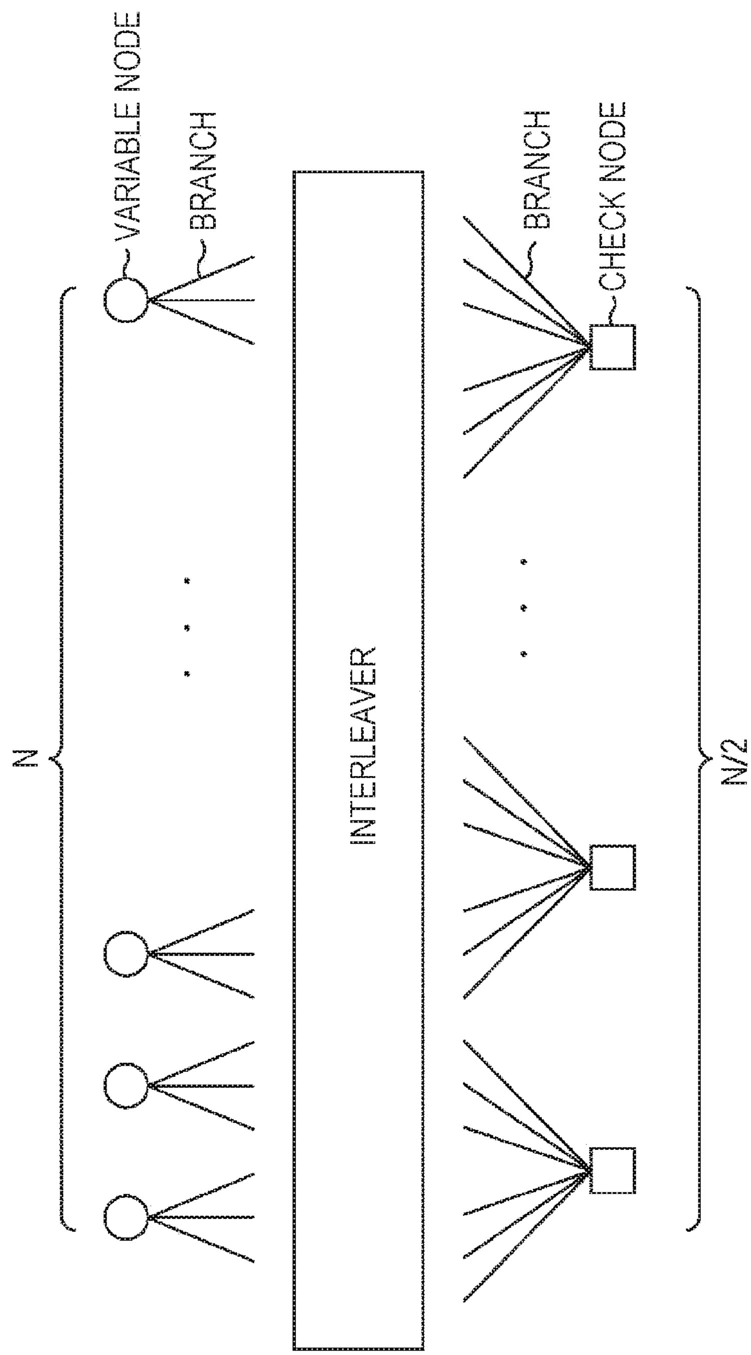
FIG. 86 is a diagram illustrating an example of a Tanner graph of an ensemble of a degree sequence with a column weight of 3 and a row weight of 6.
Figure 87:
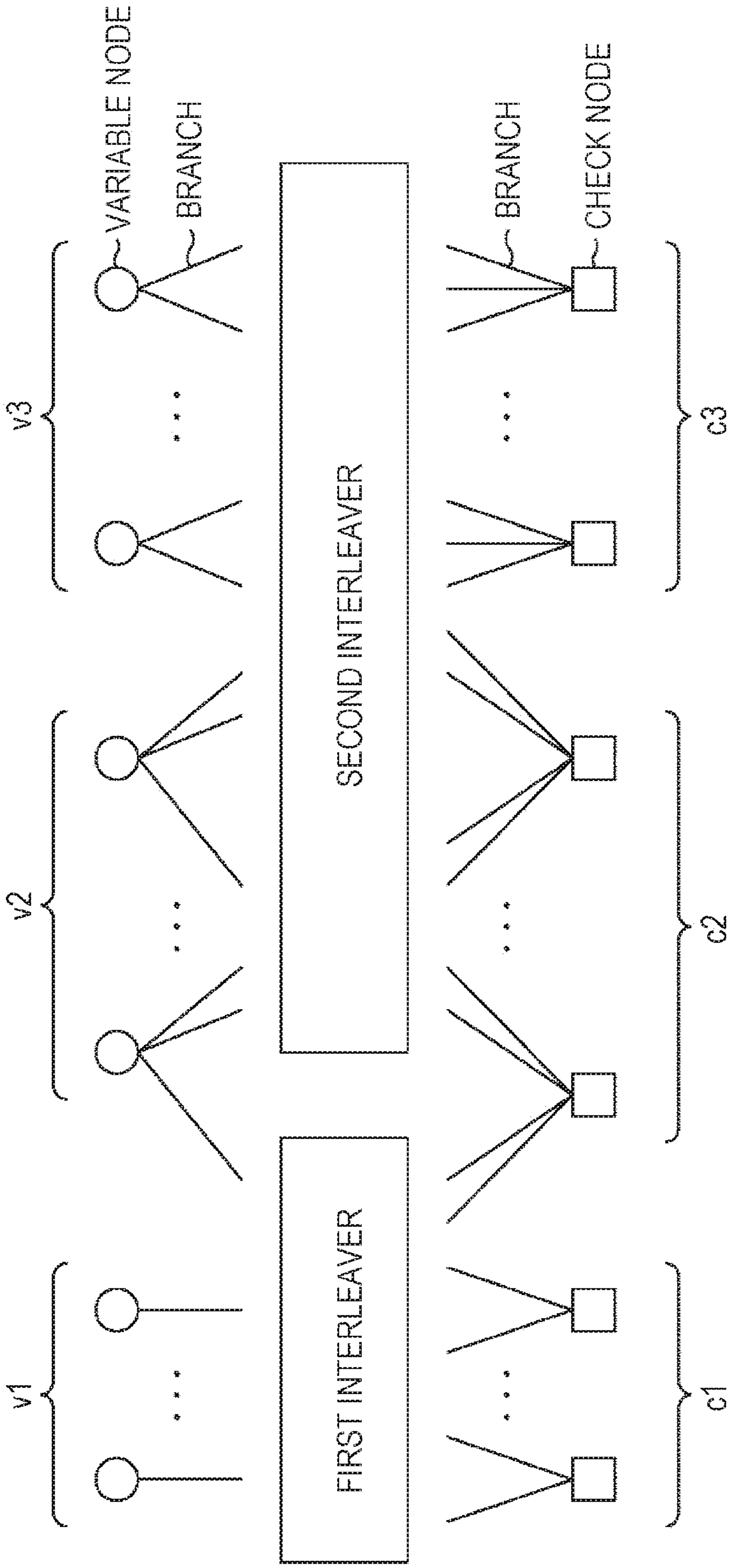
FIG. 87 is a diagram illustrating an example of a Tanner graph of a multi-edge type ensemble.

FIGS. 86 and 87 are diagrams for describing density evolution in which an analysis result is obtained as a predetermined condition that an appropriate check matrix H is to satisfy.

The density evolution is a code analysis method of calculating an expectation value of an error probability for the entire LDPC code (ensemble) with a code length N of ∞ characterized by the later-described degree sequence.

For example, on an AWGN channel, if the variance value of noise is increased from 0, the expectation value of the error probability of a certain ensemble is initially 0, but if the variance value of noise is greater than or equal to a certain threshold, the expectation value of the error probability of the ensemble is not 0.

According to the density evolution, it can be determined whether or not the performance (appropriateness of the check matrix) of the ensemble is high by comparing a threshold (hereinafter, also referred to as performance threshold) of the variance value of noise, where the expectation value of the error probability is not 0.

In addition, for a specific LDPC code, if an ensemble to which the LDPC code belongs is determined and density evolution is performed on the ensemble, the performance of the LDPC code can be roughly predicted.

Therefore, if a high-performance ensemble is found, a high-performance LDPC code can be found among the LDPC codes belonging to the ensemble.

Herein, the above-described degree sequence indicates at which degree of ratio the variable nodes or check nodes having weights of respective values are present with respect to the code length N of the LDPC code.

For example, a regular (3, 6) LDPC code with an encoding rate of 1/2 belongs to the ensemble characterized by the degree sequence where the weight (column weight) of all the variable nodes is 3 and the weight (row weight) of all the check nodes is 6.

FIG. 86 illustrates a Tanner graph of such an ensemble.

In the Tanner graph of FIG. 86, there exist only N variable nodes indicated by circles (○) in the figure, of which the number is equal to the code length N, and there exist only N/2 check nodes indicated by squares (□) in the figure, of which the number is equal to the value obtained by multiplying the code length N by the encoding rate 1/2.

Three branches (edges) equal to the column weights are connected to each variable node, and thus, there are a total of 3N branches connected to the N variable nodes.

In addition, six branches equal to the row weights are connected to each check node, and thus, there are a total of 3N branches connected to the N/2 check nodes.

Furthermore, in the Tanner graph of FIG. 86, there is one interleaver.

The interleaver randomly rearranges the 3N branches connected to the N variable nodes, and each branch after the rearrangement is connected to any one of the 3N branches connected to the N/2 check nodes.

In the interleaver, there are only (3N)! (=(3N)×(3N−1)× . . . ×1) rearrangement patterns for rearranging the 3N branches connected to the N variable nodes. Therefore, an ensemble characterized by the degree sequence that the weight of all the variable nodes is 3 and the weight of all the check nodes is 6 is a set of (3N)! LDPC codes.

In the simulation for obtaining a high-performance LDPC code (appropriate check matrix), an ensemble of a multi-edge type was used in the density evolution.

In the multi-edge type, an interleaver, through which branches connected to the variable node and branches connected to the check node pass, are divided into a plurality of (multi edge) ones, so that the characterization of the ensemble is more strictly performed.

FIG. 87 illustrates an example of a Tanner graph of a multi-edge type ensemble.

In the Tanner graph of FIG. 87, there are two interleavers of a first interleaver and a second interleaver.

In addition, in the Tanner graph in FIG. 87, there exist only v1 variable nodes, each of which has one branch connected to the first interleaver and no branch connected to the second interleaver, there exist only v2 variable nodes, each of which has one branch connected to the first interleaver and two branches connected to the second interleaver, and there exist only v3 variable nodes, each of which has no branch connected to the first interleaver and two branches connected to the second interleaver.

Furthermore, in the Tanner graph in FIG. 87, there exist only c1 variable nodes, each of which has two branches connected to the first interleaver and no branch connected to the second interleaver, there exist only c2 variable nodes, each of which has two branches connected to the first interleaver and two branches connected to the second interleaver, and there exist only c3 variable nodes, each of which has no branch connected to the first interleaver and three branches connected to the second interleaver.

Herein, the density evolution and implementation thereof are disclosed in, for example, "On the Design of Low-Density Parity-Check Codes within 0.0045 dB of the Shannon Limit", S. Y. Chung, G. D. Forney, T. J. Richardson, R. Urbanke, IEEE Communications Leggers, VOL. 0.5, NO. 2, February 2001.

In the simulation for obtaining (the check matrix of) the new LDPC code, the ensemble of which the performance threshold was $E_b/N_0$ (signal power to noise power ratio per bit) at which the BER started to fall (becomes smaller) due to the multi-edge type density evolution became a predetermined value or less was found, the LDPC code reducing the BER of the case of using one or more quadrature modulations such as QPSK among the LDPC codes belonging to the ensemble was selected as a good LDPC code.

The new LDPC code (a check matrix initial value table indicating a check matrix thereof) was obtained by the above simulation.

Therefore, according to the new LDPC code, good communication quality can be ensured in the data transmission.

Figure 88:
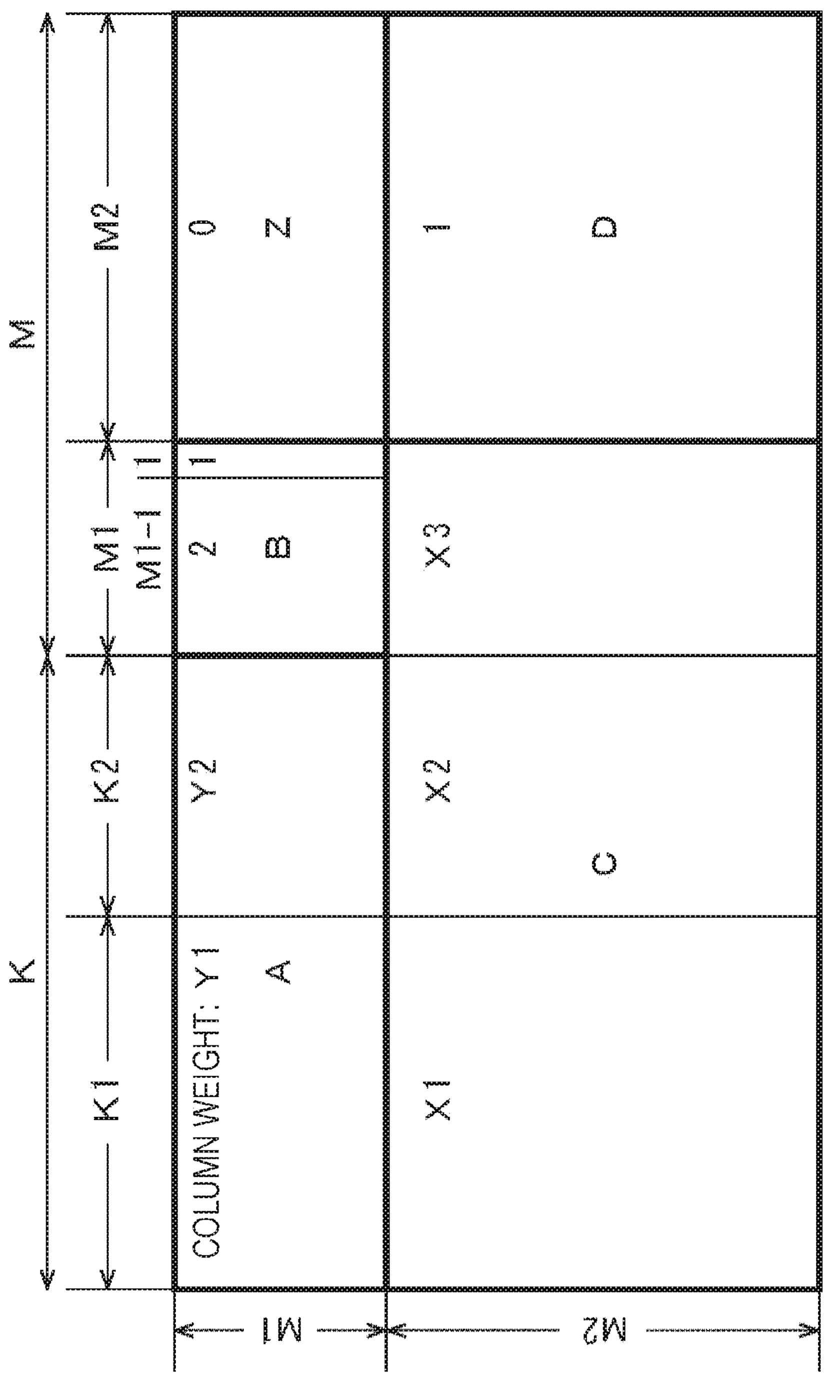
FIG. 88 is a diagram illustrating a check matrix of a type-A scheme.

FIG. 88 is a diagram illustrating column weights of a check matrix H of a type-A code as a new LDPC code.

With respect to the check matrix H of the type-A code, as illustrated in FIG. 88, the column weight of the K1 columns from the first column of the A matrix is indicated as Y1, the column weight of the subsequent K2 columns of the A matrix is indicated as Y2, the column weight of the K1 columns from the first column of the C matrix is indicated as X1, the column weight of the subsequent K2 columns of the C matrix is indicated as X2, and the column weight of the further subsequent M1 columns of the C matrix is indicated as X3.

In addition, K1+K2 is equal to the information length K, and M1+M2 is equal to the parity length M. Therefore, K1+K2+M1+M2 is equal to the code length N=69120 bits.

In addition, with respect to the check matrix H of the type-A code, the column weight of the M1−1 columns from the first column of the B matrix is indicated as 2, and the column weight of the M1-th column (last column) of the B matrix is indicated as 1. Furthermore, the column weight of the D matrix is 1, and the column weight of the Z matrix is 0.

FIG. 89 is a diagram illustrating parameters of the check matrix H of the type-A code (represented by the check matrix initial value table) in FIGS. 30 to 41.

X1, Y1, K1, X2, Y2, K2, X3, M1, and M2 as parameters of the check matrix H of the type-A codes of r=2/16, 3/16, 4/16, 5/16, 6/16, 7/16, and 8/16 and the performance threshold are as illustrated in FIG. 89.

The parameters X1, Y1, K1 (or K2), X2, Y2, X3, and M1 (or M2) are set so as to further improve the performance (for example, the error rate or the like) of the LDPC code.

Figure 90:
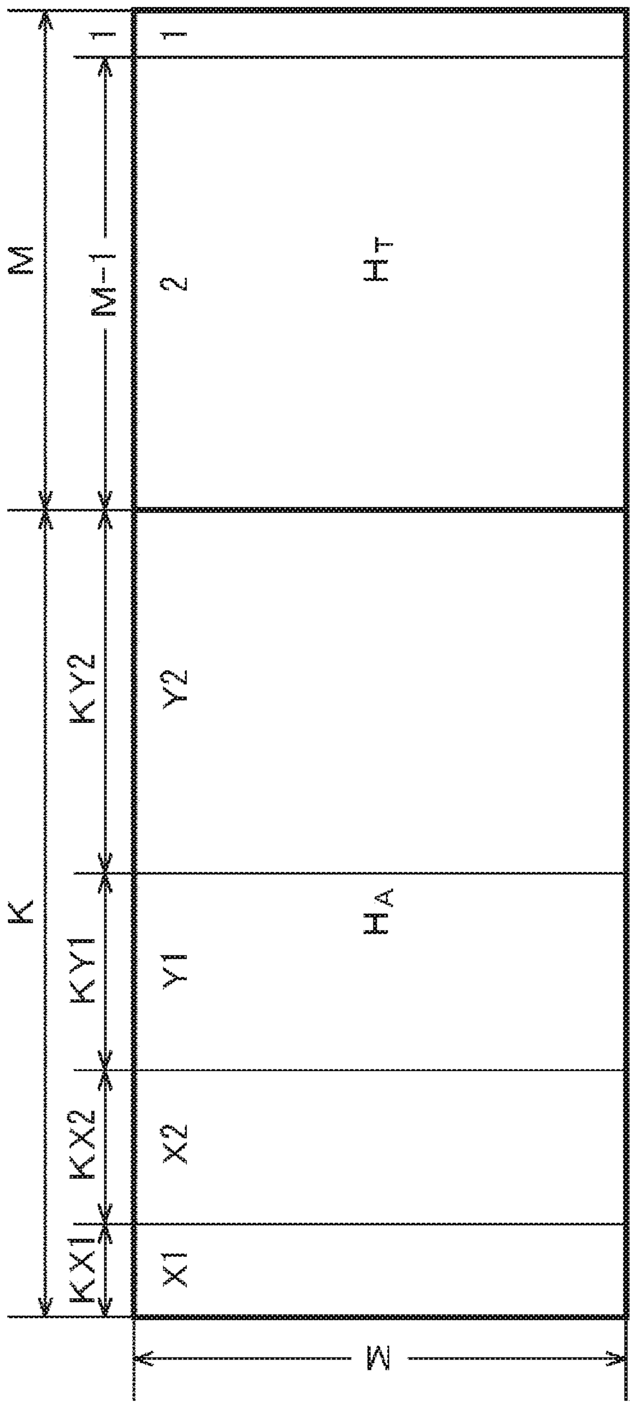
FIG. 90 is a diagram illustrating a check matrix of a type-B scheme.

FIG. 90 is a diagram illustrating column weights of a check matrix H of a type-B code as a new LDPC code.

With respect to the check matrix H of the type-B code, as illustrated in FIG. 90, the column weight of the KX1 columns from the first column is indicated as X1, the column weight of the subsequent KX2 columns is indicated as X2, the column weight of the subsequent KY1 columns is indicated as Y1, and the column weight of the subsequent KY2 columns is indicated as Y2.

Note that KX1+KX2+KY1+KY2 is equal to the information length K, and KX1+KX2+KY1+KY2+M is equal to the code length N=69120 bits.

In addition, for the check matrix H of the type-B code, the column weight of the M−1 columns excluding the last column among the last M columns is 2, and the column weight of the last column is 1.

FIG. 91 is a diagram illustrating parameters of the check matrix H of the type-B code (represented by the check matrix initial value table) in FIGS. 42 to 85.

X1, KX1, X2, KX2, Y1, KY1, Y2, KY2, M as parameters of the check matrix H of the type-B codes of r=7/16, 8/16, 9/16, 10/16, 11/16, 12/16, 13/16, and 14/16 and other type-B codes and the performance threshold are as illustrated in FIG. 91.

The parameters X1, KX1, X2, KX2, Y1, KY1, Y2, and KY2 are set so as to further improve the performance of the LDPC code.

According to the new LDPC code, a good BER/FER is realized, and a capacity (transmission line capacity) close to the Shannon limit is realized.

<Constellation>

FIGS. 92, 93, 94, 95A, 95B, 96, 97, 98, 99, 100, 101, 102, 103, 104, 105, 107, 108, 109, 110, 111, 112, 113A, 113B, 114, 115, and 116 illustrate examples of constellations that can be adopted in the transmission system of FIG. 7.

In the transmission system of FIG. 7, for example, a constellation used in MODCOD can be set for the MODCOD which is a combination of a modulation scheme (MODulation) and an LDPC code (CODe).

For one MODCOD, one or more constellations can be set.

The constellation includes uniform constellation (UC) in which the arrangement of signal points is uniform and non-uniform constellation (NUC) in which the arrangement of signal points is not uniform.

In addition, the NUC includes, for example, a constellation called 1-dimensional (M2-QAM) non-uniform constellation (1D-NUC), a constellation called 2-dimensional (QQAM) non-uniform constellation (2D-NUC), and the like.

In general, the 1D-NUC improves BER over the UC, and the 2D-NUC improves BER over the 1D-NUC.

The constellation with a modulation scheme of QPSK becomes UC. For example, the UC or the 2D-NUC can be adopted as the constellation with a modulation scheme of 16 QAM, 64 QAM, 256 QAM, or the like, and for example, the UC or the 1D-NUC can be adopted as the constellation with a modulation scheme of 1024 QAM, 4096 QAM, or the like.

In the transmission system of FIG. 7, for example, the constellations defined by ATSC 3.0, DVB-C.2, or the like, and various other constellations that improve the error rate can be used.

That is, in a case where the modulation scheme is QPSK, for example, the same UC can be used for each encoding rate r of the LDPC code.

In addition, in a case where the modulation scheme is 16 QAM, 64 QAM, or 256 QAM, for example, the same UC can be used for each encoding rate r of the LDPC code. Furthermore, in a case where the modulation scheme is 16 QAM, 64 QAM, or 256 QAM, for example, different 2D-NUCs can be used for each encoding rate r of the LDPC code.

In addition, in a case where the modulation scheme is 1024 QAM or 4096 QAM, for example, the same UC can be used for each encoding rate r of the LDPC code. Furthermore, in a case where the modulation scheme is 1024 QAM or 4096 QAM, for example, different 1D-NUC can be used for each encoding rate r of the LDPC code.

Herein, the UC of QPSK is also described as QPSK-UC, and the UC of $2^m$ QAM is also described as $2^m$ QAM-UC.

In addition, the 1D-NUC of $2^m$ QAM and the 2D-NUC of $2^m$ QAM are also described as $2^m$ QAM-1D-NUC and $2^m$ QAM-2D-NUC, respectively.

Hereinafter, some of the constellations defined in ATSC 3.0 will be described.

FIG. 92 is a diagram illustrating the coordinates of signal points of QPSK-UC used for all encoding rates of an LDPC code defined in ATSC 3.0 in a case where the modulation scheme is QPSK.

In FIG. 92, "Input Data Cell y" indicates a 2-bit symbol to be mapped to QPSK-UC, and "Constellation point $z_s$" indicates the coordinates of a signal point $z_s$. Note that the index s of the signal point $z_s$ (as well as the index q of the signal point $z_q$ described later) indicates the discrete time of the symbols (time interval between one symbol and the next symbol).

In FIG. 92, the coordinates of the signal point $z_s$ are expressed in the form of a complex number, and j indicates an imaginary unit ($\sqrt{(-1)}$).

FIG. 93 is a diagram illustrating the coordinates of the signal point of the 16 QAM-2D-NUC used for the encoding rate r(CR)=2/15, 3/15, 4/15, 5/15, 6/15, 7/15, 8/15, 9/15, 10/15, 11/15, 12/15, and 13/15 of the LDPC code defined in ATSC 3.0 in a case where the modulation scheme is 16 QAM.

In FIG. 93, similarly to FIG. 92, the coordinates of the signal point $z_s$ are expressed in the form of a complex number, and j indicates an imaginary unit.

In FIG. 93, w #k indicates the coordinates of the signal point in the first quadrant of the constellation.

In the 2D-NUC, a signal point in the second quadrant of the constellation is placed at a position where the signal point in the first quadrant is moved symmetrically with respect to the Q-axis, and a signal point in the third quadrant of the constellation is placed at a position where the signal point in the first quadrant is moved symmetrically with respect to the origin. Then, a signal point in the fourth quadrant of the constellation is placed at a position where the signal point in the first quadrant is moved symmetrically with respect to the I-axis.

Herein, in a case where the modulation scheme is $2^m$ QAM, m bits are set as one symbol, and the one symbol is mapped to a signal point corresponding to the symbols.

An m-bit symbol can be represented, for example, by an integer value of 0 to $2^m-1$. However, if $b=2^m/4$, the symbols y(0), y(1), . . . , and $y(2^m-1)$ represented by an integer value of 0 to $2^m-1$ can be classified into four of the symbols y(0) to y(b−1), the symbols y(b) to y(2b−1), the symbols y(2b) to y(3b−1), and the symbols y(3b) to y(4b−1).

In FIG. 93, the suffix k of w #k has an integer value in the range of 0 to b−1, and w #k indicates the coordinates of the signal point corresponding to the symbol y(k) in the range of the symbols y(0) to y(b−1).

Then, the coordinates of the signal point corresponding to the symbol y(k+b) in the range of the symbols y(b) to y(2b−1) are indicated by −conj(w #k), and the coordinates of the signal point corresponding to the symbol y(k+2b) in the range of the symbols y(2b) to y(3b−1) are indicated by conj(w #k). In addition, the coordinates of the signal point corresponding to the symbol y(k+3b) in the range of the symbols y(3b) to y(4b−1) are indicated by −w #k.

Herein, conj(w #k) indicates a complex conjugate of w #k.

For example, in a case where the modulation scheme is 16 QAM, the symbols y(0), y(1), . . . , and y(15) with m=4 bits are classified into four ranges of the symbols y(0) to y(3), symbols y(4) to y(7), symbols y(8) to y(11), and symbols y(12) to y(15) with b=24/4=4.

Then, since, for example, the symbol y(12) among the symbols y(0) to y(15) is the symbol y(k+3b)=y(0+3×4) in the range of the symbols y(3b) to y(4b−1)) and k=0, the coordinates of the signal point corresponding to the symbol y(12) are −w #k=−w0.

Now, assuming that the encoding rate r(CR) of the LDPC code is, for example, 9/15, according to FIG. 93, w0 of the case where the modulation scheme is 16 QAM and the encoding rate r is 9/15 is 0.2386+j0.5296, the coordinate −w0 of the signal point corresponding to the symbol y(12) is −(0.2386+j0.5296).

FIG. 94 is a diagram illustrating an example of the coordinate of the signal point of the 1024 QAM-1D-NUC used for the encoding rate r(CR)=2/15, 3/15, 4/15, 5/15, 6/15, 7/15, 8/15, 9/15, 10/15, 11/15, 12/15, and 13/15 of the LDPC code defined in ATSC 3.0 in a case where the modulation scheme is 1024 QAM.

In FIG. 94, u #k indicates the real part $Re(z_s)$ and the imaginary part $Im(z_s)$ of a complex number as the coordinates of the signal point $z_s$ of 1D-NUC and are the components of a vector u=(u0, u1, . . . , u #V−1) referred to as a position vector. The number V of components u #k of the position vector u is given by the formula $V=\sqrt{(2^m)}/2$.

FIGS. 95A and 95B are diagrams illustrating a relationship between a symbol y of 1024 QAM and (components u #k of) a position vector u.

Now, it is assumed that a 10-bit symbol y of the 1024 QAM is represented by $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, and $y_{9,s}$ from the leading bit (most significant bit) thereof.

FIG. 95A illustrates the correspondence between the even-numbered 5 bits $y_{1,s}$, $y_{3,s}$, $y_{5,s}$, $y_{7,s}$, and $y_{9,s}$ of the symbol y and the u #k indicating the real part $Re(z_s)$ of (the coordinates of) the signal point $z_s$ corresponding to the symbol y.

FIG. 95B illustrates the correspondence between the odd-numbered 5 bits $y_{0,s}$, $y_{2,s}$, $y_{4,s}$, $y_{6,s}$, and $y_{8,s}$ of the symbol y and the u #k indicating the imaginary part $Im(z_s)$ of the signal point $z_s$ corresponding to the symbol y.

In a case where the 10-bit symbol y=($y_{0,s}$, $y_{1,s}$, $y_{2,s}$, $y_{3,s}$, $y_{4,s}$, $y_{5,s}$, $y_{6,s}$, $y_{7,s}$, $y_{8,s}$, $y_{9,s}$) of the 1024 QAM is, for example, (0, 0, 1, 0, 0, 1, 1, 1, 0, 0), the odd-numbered 5 bits ($y_{0,s}$, $y_{2,s}$, $y_{4,s}$, $y_{6,s}$, $y_{8,s}$) is (0, 1, 0, 1, 0), and the even-numbered 5 bits ($y_{1,s}$, $y_{3,s}$, $y_{5,s}$, $y_{7,s}$, $y_{9,s}$) is (0, 0, 1, 1, 0).

In FIG. 95A, the even-numbered 5 bits (0, 0, 1, 1, 0) are associated with u11, and thus, the real part $Re(z_s)$ of the signal point $z_s$ corresponding to the symbol y=(0, 0, 1, 0, 0, 1, 1, 1, 0, 0) becomes u11.

In FIG. 95B, the odd-numbered 5 bits (0, 1, 0, 1, 0) are associated with u3, and thus, the imaginary part $Im(z_s)$ of the signal point $z_s$ corresponding to the symbol y=(0, 0, 1, 0, 0, 1, 1, 1, 0, 0) becomes u3.

On the other hand, assuming that the encoding rate r of the LDPC code is, for example, 6/15, according to FIG. 94 described above, for the 1D-NUC used in a case where the modulation scheme is 1024 QAM and the encoding rate r(CR) of the LDPC code is 6/15, u3 is 0.1295, and u11 is 0.7196.

Therefore, the real part $Re(z_s)$ of the signal point $z_s$ corresponding to the symbol y=(0, 0, 1, 0, 0, 1, 1, 1, 0, 0) becomes u11=0.7196, and the imaginary part $Im(z_s)$ becomes u3=0.1295. As a result, the coordinates of the signal point $z_s$ corresponding to the symbol y=(0, 0, 1, 0, 0, 1, 1, 1, 0, 0) are indicated by 0.7196+j0.1295.

In addition, the signal points of the 1D-NUC are arranged in a lattice on a straight line parallel to the I-axis or a straight line parallel to the Q-axis on the constellation. However, the interval between signal points is not constant. In addition, the average power of the signal points on the constellation can be normalized in the transmission of (the data mapped to) the signal points. Assuming that $P_{ave}$ indicates the root mean square of absolute values of all (the coordinates of) the signal points on the constellation, the normalization can be performed by multiplying each signal point $z_s$ on the constellation by the reciprocal $1/(\sqrt{P_{ave}})$ of the square root $\sqrt{P_{ave}}$ of the root mean square $P_{ave}$.

The transmission system of FIG. 7 can use the constellation defined in ATSC 3.0 as described above.

FIGS. 96 to 107 illustrate coordinates of signal points of UC defined in DVB-C.2.

That is, FIG. 96 is a diagram illustrating a real part $Re(z_q)$ of coordinates $z_q$ of a signal point of QPSK-UC (UC in QPSK) defined in DVB-C.2. FIG. 97 is a diagram illustrating an imaginary part $Im(z_q)$ of the coordinates $z_q$ of the signal point of the QPSK-UC defined in DVB-C.2.

FIG. 98 is a diagram illustrating a real part $Re(z_q)$ of coordinates $z_q$ of a signal point of 16 QAM-UC (UC in 16 QAM) defined in DVB-C.2. FIG. 99 is a diagram illustrating an imaginary part $Im(z_q)$ of the coordinates $z_q$ of the signal point of the 16 QAM-UC defined in DVB-C.2.

FIG. 100 is a diagram illustrating a real part $Re(z_q)$ of coordinates $z_q$ of a signal point of 64 QAM-UC (UC in 64 QAM) defined in DVB-C.2. FIG. 101 is a diagram illustrating an imaginary part $Im(z_q)$ of the coordinates $z_q$ of the signal point of the 64 QAM-UC defined in DVB-C.2.

FIG. 102 is a diagram illustrating a real part $Re(z_q)$ of coordinates $z_q$ of a signal point of 256 QAM-UC (UC in 256 QAM) defined in DVB-C.2. FIG. 103 is a diagram illustrating an imaginary part $Im(z_q)$ of the coordinates $z_q$ of the signal point of the 256 QAM-UC defined in DVB-C.2.

FIG. 104 is a diagram illustrating a real part $Re(z_q)$ of coordinates $z_q$ of a signal point of 1024 QAM-UC (UC in 1024 QAM) defined in DVB-C.2. FIG. 105 is a diagram illustrating an imaginary part $Im(z_q)$ of the coordinates $z_q$ of the signal point of the 1024 QAM-UC defined in DVB-C.2.

FIG. 106 is a diagram illustrating a real part $Re(z_q)$ of coordinates $z_q$ of a signal point of 4096 QAM-UC (UC in 4096 QAM) defined in DVB-C.2. FIG. 107 is a diagram illustrating an imaginary part $Im(z_q)$ of the coordinates $z_q$ of the signal point of the 4096 QAM-UC signal point defined in DVB-C.2.

Note that, in FIGS. 96 to 107, $y_{i,q}$ indicate the (i+1)-th bit from the lead of the m-bit (for example, 2 bits in QPSK) symbol of the $2^m$ QAM. In addition, the average power of the signal points on the constellation can be normalized in the transmission of (the data mapped to) the signal points of the UC. Assuming that $P_{ave}$ indicates the root mean square of absolute values of all (the coordinates of) the signal points on the constellation, the normalization can be performed by multiplying each signal point $z_q$ on the constellation by the reciprocal $1/(\sqrt{P_{ave}})$ of the square root $\sqrt{P_{ave}}$ of the root mean square $P_{ave}$.

In the transmission system of FIG. 7, the UC defined in DVB-C.2 as described above can be used.

That is, UC illustrated in FIGS. 96 to 107 can be used for each of new the LDPC codes (corresponding to the check matrix initial value table) with a code length N of 69120 bits and an encoding rate r of 2/16, 3/16, 4/16, 5/16, 6/16, 7/16, 8/16, 9/16, 10/16, 11/16, 12/16, 13/16, and 14/16 illustrated in FIGS. 30 to 85.

FIGS. 108, 109, 110, 111, 112, 113A, 113B, 114, 115, and 116 are diagrams illustrating examples of the coordinates of another NUC signal point that can be used for each of the new LDPC codes with a code length N of 69120 bits and an encoding rate r of 2/16, 3/16, 4/16, 5/16, 6/16, 7/16, 8/16, 9/16, 10/16, 11/16, 12/16, 13/16, 14/16 of FIGS. 30 to 85.

That is, FIG. 108 is a diagram illustrating an example of the coordinates of the signal point of the 16 QAM-2D-NUC that can be used for each of the new LDPC codes with an encoding rate r(CR) of 2/16, 4/16, 6/16, 8/16, 10/16, 12/16, and 14/16 among the new LDPC codes with a code length N of 69120 of FIGS. 30 to 85.

FIG. 109 is a diagram illustrating an example of the coordinates of the signal point of the 64 QAM-2D-NUC that can be used for each of the new LDPC codes with an encoding rate r(CR) of 3/16, 5/16, 7/16, 9/16, 11/16, and 13/16 among the new LDPC codes with a code length N of 69120 of FIGS. 30 to 85.

FIGS. 110 and 111 are diagrams illustrating examples of the coordinates of the signal point of the 256 QAM-2D-NUC that can be used for each of the new LDPC codes with an encoding rate r(CR) of 2/16, 4/16, 6/16, 8/16, 10/16, 12/16, and 14/16 among the new LDPC codes with a code length N of 69120 of FIGS. 30 to 85.

Note that FIG. 111 is a diagram following FIG. 110.

In FIGS. 108 to 111, similarly to FIG. 93, the coordinates of the signal point $z_s$ are expressed in the form of complex numbers, and j indicates an imaginary unit.

In FIGS. 108 to 111, similarly to FIG. 93, w #k indicates the coordinates of the signal point in the first quadrant of the constellation.

Herein, as described with reference to FIG. 93, an m-bit symbol is represented by an integer value of 0 to $2^m-1$, and if $b=2^m/4$, the symbols y(0), y(1), . . . , and $y(2^m-1)$ represented by an integer value of 0 to $2^m-1$ can be classified into four of the symbols y(0) to y(b−1), the symbols y(b) to y(2b−1), the symbols y(2b) to y(3b−1), and the symbols y(3b) to y(4b−1).

In FIGS. 108 to 111, similarly to FIG. 93, the suffix k of w #k has an integer value in the range of 0 to b−1, and w #k indicates the coordinates of the signal point corresponding to the symbol y(k) in the range of the symbols y(0) to y(b−1).

Furthermore, in FIGS. 108 to 111, similarly to FIG. 93, the coordinates of the signal point corresponding to the symbol y(k+3b) in the range of the symbols y(3b) to y(4b−1) is indicated by −w #k.

However, in FIG. 93, the coordinates of the signal point corresponding to the symbol y(k+b) in the range of the symbols y(b) to y(2b−1) are indicated by −conj(w #k), and the coordinates of the signal point corresponding to the symbol y(k+2b) in the range from the symbol y(2b) to y(3b−1) are indicated by conj(w #k), but in FIGS. 108 to 111, the sign of conj is reversed.

That is, in FIGS. 108 to 111, the coordinates of the signal point corresponding to the symbol y(k+b) in the range of the symbols y(b) to y(2b−1) are indicated by conj(w #k), and the coordinates of the signal point corresponding to the symbol y(k+2b) in the range of the symbols y(2b) to y(3b−1) are indicated by −conj(w #k).

FIG. 112 is a diagram illustrating an example of the coordinates of the signal point of the 1024 QAM-1D-NUC that can be used for each of the new LDPC codes with an encoding rate r(CR) of 3/16, 5/16, 7/16, 9/16, 11/16, and 13/16 among the new LDPC codes with a code length N of 69120 of FIGS. 30 to 85.

That is, FIG. 112 is a diagram illustrating a relationship between the real part $Re(z_s)$ and the imaginary part $Im(z_s)$ of the complex number as the coordinates of the signal point $z_s$ of the 1024 QAM-1D-NUC and (the components u #k of) the position vector u.

FIGS. 113A and 1138 are diagrams illustrating a relationship between the symbol y of the 1024 QAM and (the components u #k of) the position vector u of FIG. 112.

That is, now, it is assumed that a 10-bit symbol y of the 1024 QAM is indicated by $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, $y_{9,s}$ from the leading bit (most significant bit) thereof.

FIG. 113A illustrates the correspondence between the odd-numbered 5 bits $y_{0,s}$, $y_{2,s}$, $y_{4,s}$, $y_{6,s}$, and $y_{8,s}$ of the 10-bit symbol y and the position vector u #k indicating the real part $Re(z_s)$ of (the coordinates of) the signal point $z_s$ corresponding to the symbol y.

FIG. 113B illustrates the correspondence between the even-numbered 5 bits $y_{1,s}$, $y_{3,s}$, $y_{5,s}$, $y_{7,s}$, and $y_{9,s}$ of the 10-bit symbol y and the position vector u #k indicating the imaginary part $Im(z_s)$ of the signal point $z_s$ corresponding to the symbol y.

The method of obtaining the coordinates of the signal point $z_s$ when the 10-bit symbol y of the 1024 QAM is mapped to the signal point $z_s$ of the 1024 QAM-1D-NUC defined in FIGS. 112, 113A, and 113B is similar to that of the case described with reference to FIGS. 94, 95A, and 95B, and thus, the description thereof is omitted.

FIG. 114 is a diagram illustrating an example of the coordinates of the signal point of the 4096 QAM-1D-NUC which can be used for each of the new LDPC codes with an encoding rate r of 2/16, 4/16, 6/16, 8/16, 10/16, 12/16, and 14/16 among the new LDPC codes with a code length N of 69120 bits of FIGS. 30 to 85.

That is, FIG. 114 is a diagram illustrating a relationship between the real part $Re(z_s)$ and the imaginary part $Im(z_s)$ of a complex number as coordinates of the signal point $z_s$ of the 4096 QAM-1D-NUC, and the position vector u (u #k).

FIGS. 115 and 116 are diagrams illustrating a relationship between the symbol y of 4096 QAM and (the components u #k of) the position vector u of FIG. 114.

That is, now, The 12-bit symbols y of the 4096 QAM are represented by $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, $y_{9,s}$, $y_{10,s}$, $y_{11,s}$ from the bit (most significant bit) of the lead thereof.

FIG. 115 illustrates the correspondence between the odd-numbered 6 bits $y_{0,s}$, $y_{2,s}$, $y_{4,s}$, $y_{6,s}$, $y_{8,s}$, and $y_{10,s}$ of the 12-bit symbol y and the position vector u #k indicating the real part $Re(z_s)$ of the signal point $z_s$ corresponding to the symbol y.

FIG. 116 illustrates the correspondence between the even-numbered 6 bits $y_{1,s}$, $y_{3,s}$, $y_{5,s}$, $y_{7,s}$, $y_{9,s}$, and $y_{11,s}$ of the 12-bit symbol y and the position vector u #k indicating the imaginary part $Im(z_s)$ of the signal point $z_s$ corresponding to the symbol y.

The method of obtaining the coordinates of the signal point $z_s$ when the 12-bit symbol y of the 4096 QAM is mapped to the signal point $z_s$ of the 4096 QAM-1D-NUC defined in FIGS. 114 to 116 is similar to that of the case described with reference to FIGS. 94, 95A, and 95B, and thus, the description thereof is omitted.

In addition, the average power of the signal points on the constellation can be normalized in the transmission of (the data mapped to) the signal point of the NUC of FIGS. 108, 109, 110, 111, 112, 113A, 113B, 114, 115, and 116. Assuming that $P_{ave}$ indicates the root mean square of absolute values of all (the coordinates of) the signal points on the constellation, the normalization can be performed by multiplying each signal point $z_s$ on the constellation by the reciprocal $1/(\sqrt{P_{ave}})$ of the square root $\sqrt{P_{ave}}$ of the root mean square Pave. In addition, in FIGS. 95A and 95B described above, the odd-numbered bits of the symbol y are associated with the position vector u #k indicating the imaginary part $Im(z_s)$ of the signal point $z_s$, and the even-numbered bits of the symbol y are associated with the position vector u #k indicating the real part $Re(z_s)$ of the signal point $z_s$. However, in FIGS. 113A 113B, 115, and 116, conversely, the odd-numbered bits of the symbol y are associated with the position vector u #k indicating the real part $Re(z_s)$ of the signal point $z_s$, and the even-numbered bits of the symbol y are associated with the position vector u #k indicating the imaginary part $Im(z_s)$ of the signal point $z_s$.

<Block Interleaver 25>

Figure 117:
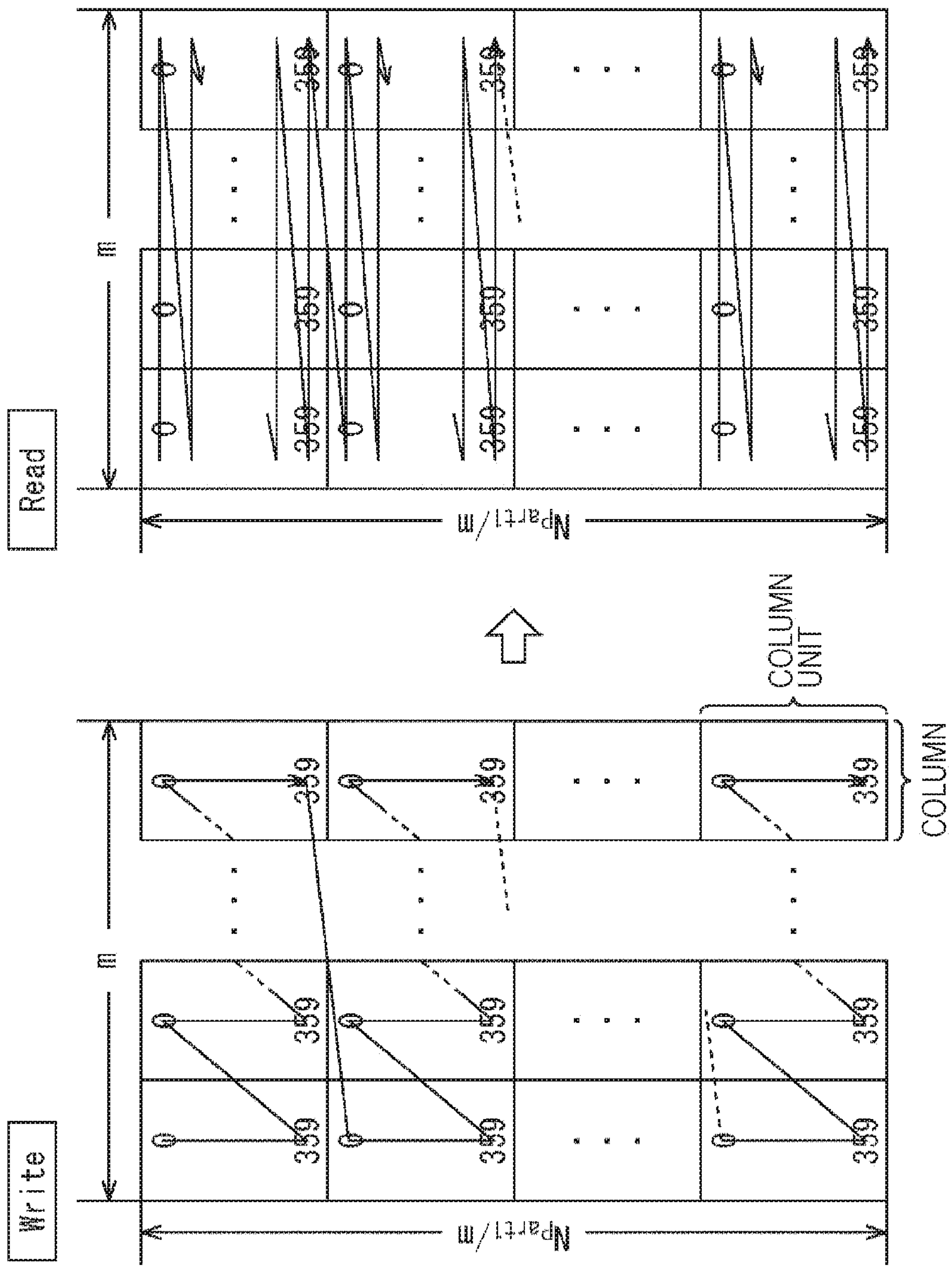
FIG. 117 is a diagram illustrating block interleaving performed by a block interleaver 25.

FIG. 117 is a diagram illustrating block interleaving performed by the block interleaver 25 of FIG. 9.

The block interleaving is performed by dividing the LDPC code of one code word into a portion called a Part 1 and a portion called a Part 2 from the lead thereof.

Assuming that the length (number of bits) of Part 1 is denoted by Npart1 and the length of Part 2 is denoted by Npart2, Npart1+Npart2 is equal to the code length N.

Conceptually, in the block interleaving, only the number of columns as a storage area for storing Npart1/m bits in the column (vertical) direction as one direction, which is equal to the number m of bits of symbols in the row direction perpendicular to the column direction, are arranged, and each column is divided into small units of 360 bits, which is the unit size P, from the top. The small unit of the column is also called a column unit.

In the block interleaving, as illustrated in FIG. 117, the writing of the Part 1 of an LDPC code of one code word in the downward direction (column direction) from the top of the first column unit of the column is performed in the column in the direction from the left to the right.

Then, when the writing to the first column unit of the rightmost column is completed, as illustrated in FIG. 117, the process returns to the leftmost column, and the writing in the downward direction from the top of the second column unit of the column is perform in the column in the direction from the left to the right. Hereinafter, in a similar manner, the writing of the Part 1 of the LDPC code of one code word is performed.

When the writing of the Part 1 of the LDPC code of one code word is completed, as illustrated in FIG. 117, the Part 1 of the LDPC code is read in units of m bits from the first row of all m columns in the row direction.

The m-bit unit of the Part 1 is supplied as an m-bit symbol from the block interleaver 25 to the mapper 117 (FIG. 8).

The reading of the Part 1 in units of m bits is sequentially performed toward the lower row of m columns, and when the reading of the Part 1 is completed, the Part 2 is divided in units of m bits from the lead, and symbols of m bits is supplied from the block interleaver 25 to the mapper 117.

Therefore, the Part 1 is symbolized while being interleaved, and the Part 2 is symbolized by being sequentially divided in units of m bits without being interleaved.

Npart1/m which is the length of the column is a multiple of 360 which is the unit size P, and the LDPC code of one code word is divided into the Part 1 and the Part 2 so that Npart1/m is a multiple of 360.

FIG. 118 is a diagram illustrating an example of a Part 1 and a Part 2 of an LDPC code with a code length N of 69120 bits in a case where the modulation scheme is QPSK, 16 QAM, 64 QAM, 256 QAM, 1024 QAM, and 4096 QAM.

In FIG. 118, in a case where the modulation scheme is 1024 QAM, the Part 1 is 68400 bits, and the Part 2 is 720 bits; and in a case where the modulation scheme is QPSK, 16 QAM, 64 QAM, 256 QAM, or 4096 QAM, in any case, the Part 1 is 69120 bits, and the Part 2 is 0 bits.

<Group-Wise Interleaving>

Figure 119:
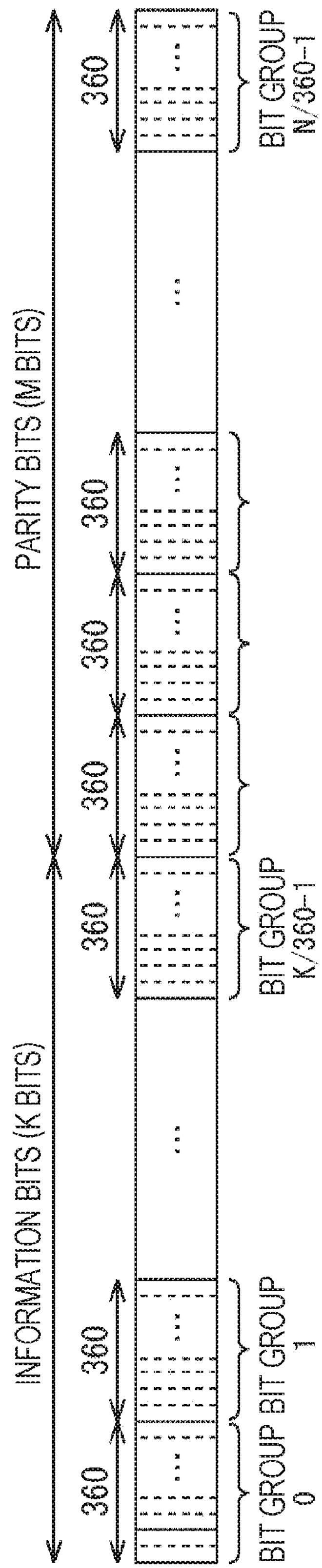
FIG. 119 is a diagram illustrating group-wise interleaving performed by a group-wise interleaver 24.

FIG. 119 is a diagram illustrating group-wise interleaving performed by the group-wise interleaver 24 in FIG. 9.

In the group-wise interleaving, as illustrated in FIG. 119, 360 bits of the one division obtained by dividing the LDPC codes of one code word in units of 360 bits which are equal to the unit size P from the lead thereof are set as a bit group, and the LDPC codes of one code word are interleaved in units of bit groups according to a predetermined pattern (hereinafter, also referred to as a GW pattern).

Herein, when the LDPC code of one code word is divided into the bit groups, an (i+1)-th bit group from the lead is hereinafter also referred to as a bit group i.

In a case where the unit size P is 360, for example, the LDPC code with a code length N of 1800 bits is divided into 5 (=1800/360) bit groups of the bit groups 0, 1, 2, 3, and 4. Furthermore, for example, the LDPC code with a code length N of 69120 bits is divided into 192 (=69120/360) bit groups of the bit groups 0, 1, . . . , and 191.

In addition, hereinafter, a GW pattern is indicated by an arrangement of numbers indicating a bit group. For example, for the LDPC code with a code length N of 1, 800 bits, for example, the GW patterns 4, 2, 0, 3, and 1 indicates interleaving (rearranging) the arrangement of the bit groups 0, 1, 2, 3, and 4 into the arrangement of the bit groups 4, 2, 0, 3, and 1.

For example, it is assumed that the (i+1)-th code bit from the lead of the LDPC code with a code length N of 1800 bits is indicated by xi.

In this case, according to the group-wise interleaving of the GW patterns 4, 2, 0, 3, and 1, the LDPC code $\{x_0, x_1, \ldots, x_{1799}\}$ of 1800 bits is interleaved into $\{x_{1440}, x_{1441}, \ldots, x_{1799}\}$ $\{x_{720}, x_{721}, \ldots, x_{1079}\}$ $\{x_0, x_1, \ldots, x_{359}\}$, $\{x_{1080}, x_{1081}, \ldots, x_{1439}\}$, and $\{x_{360}, x_{361}, \ldots x_{719}\}$.

The GW pattern can be set for each code length N of an LDPC code, each encoding rate r of an LDPC code, each modulation scheme, or each constellation or as a combination of two or more of the code length N, the encoding rate r, the modulation scheme, and the constellation.

<Example of GW Pattern for LDPC Code>

Figure 120:
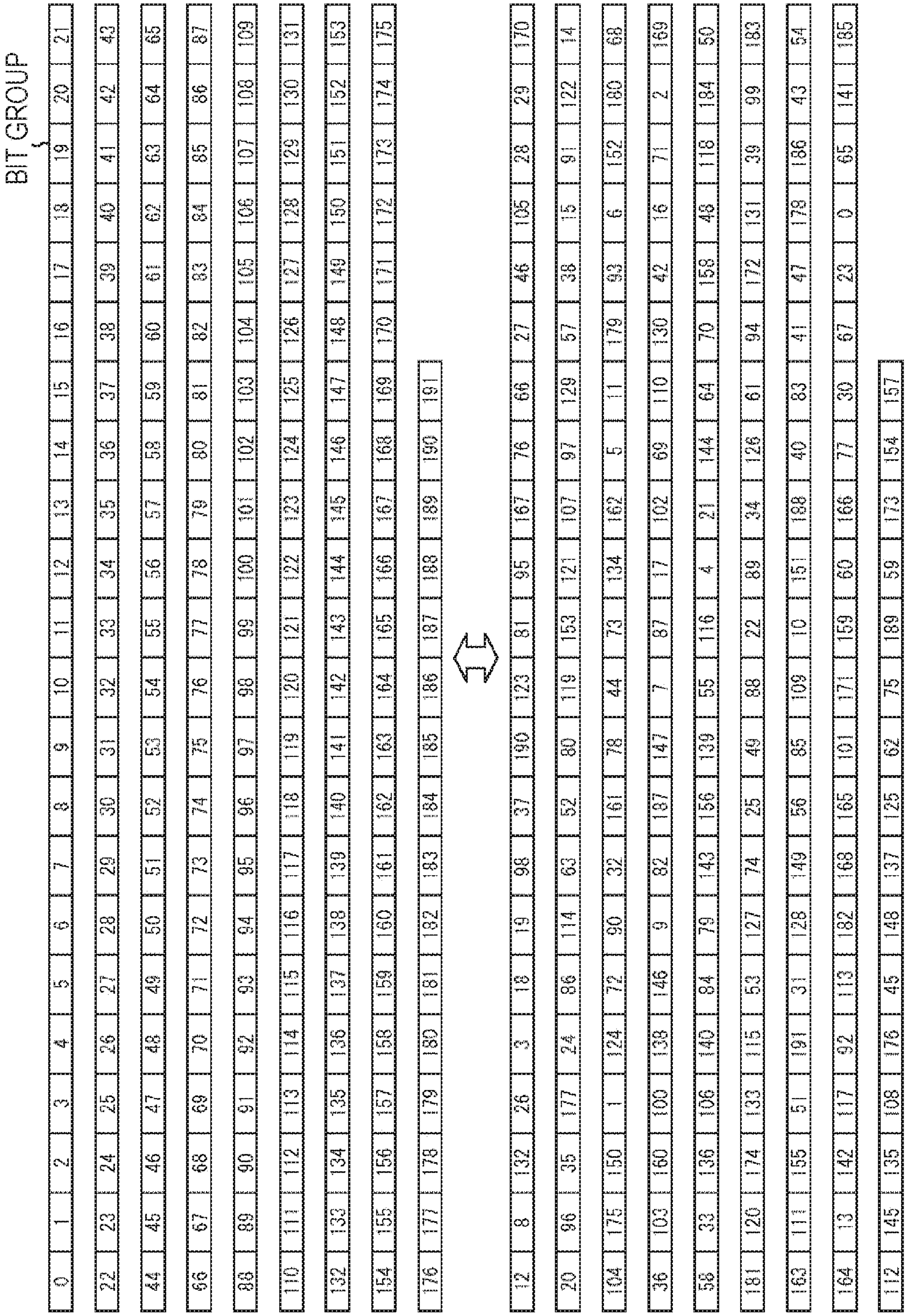

FIG. 120 is a diagram illustrating Example 1 of a GW pattern for an LDPC code with a code length N of 69120 bits.

According to the GW pattern of FIG. 120, the arrangement of bit groups 0 to 191 of the 69120-bit LDPC code is interleaved into an arrangement of a bit group 12, 8, 132, 26, 3, 18, 19, 98, 37, 190, 123, 81, 95, 167, 76, 66, 27, 46, 105, 28, 29, 170, 20, 96, 35, 177, 24, 86, 114, 63, 52, 80, 119, 153, 121, 107, 97, 129, 57, 38, 15, 91, 122, 14, 104, 175, 150, 1, 124, 72, 90, 32, 161, 78, 44, 73, 134, 162, 5, 11, 179, 93, 6, 152, 180, 68, 36, 103, 160, 100, 138, 146, 9, 82, 187, 147, 7, 87, 17, 102, 69, 110, 130, 42, 16, 71, 2, 169, 58, 33, 136, 106, 140, 84, 79, 143, 156, 139, 55, 116, 4, 21, 144, 64, 70, 158, 48, 118, 184, 50, 181, 120, 174, 133, 115, 53, 127, 74, 25, 49, 88, 22, 89, 34, 126, 61, 94, 172, 131, 39, 99, 183, 163, 111, 155, 51, 191, 31, 128, 149, 56, 85, 109, 10, 151, 188, 40, 83, 41, 47, 178, 186, 43, 54, 164, 13, 142, 117, 92, 113, 182, 168, 165, 101, 171, 159, 60, 166, 77, 30, 67, 23, 0, 65, 141, 185, 112, 145, 135, 108, 176, 45, 148, 137, 125, 62, 75, 189, 59, 173, 154, 157.

FIG. 121 is a diagram illustrating Example 2 of a GW pattern for an LDPC code with a code length N of 69120 bits.

According to the GW pattern of FIG. 121, the arrangement of bit groups 0 to 191 of the 69120-bit LDPC code is interleaved into an arrangement of a bit group 14, 119, 182, 5, 127, 21, 152, 11, 39, 164, 25, 69, 59, 140, 73, 9, 104, 148, 77, 44, 138, 89, 184, 35, 112, 150, 178, 26, 123, 133, 91, 76, 70, 0, 176, 118, 22, 147, 96, 108, 109, 139, 18, 157, 181, 126, 174, 179, 116, 38, 45, 158, 106, 168, 10, 97, 114, 129, 180, 52, 7, 67, 43, 50, 120, 122, 3, 13, 72, 185, 34, 83, 124, 105, 162, 87, 131, 155, 135, 42, 64, 165, 41, 71, 189, 159, 143, 102, 153, 17, 24, 30, 66, 137, 62, 55, 48, 98, 110, 40, 121, 187, 74, 92, 60, 101, 57, 33, 130, 173, 32, 166, 128, 54, 99, 111, 100, 16, 84, 132, 161, 4, 190, 49, 95, 141, 28, 85, 61, 53, 183, 6, 68, 2, 163, 37, 103, 186, 154, 171, 170, 78, 117, 93, 8, 145, 51, 56, 191, 90, 82, 151, 115, 175, 1, 125, 79, 20, 80, 36, 169, 46, 167, 63, 177, 149, 81, 12, 156, 142, 31, 47, 88, 65, 134, 94, 86, 160, 172, 19, 23, 136, 58, 146, 15, 75, 107, 188, 29, 113, 144, 27.

FIG. 122 is a diagram illustrating Example 3 of a GW pattern for an LDPC code with a code length N of 69120 bits.

According to the GW pattern of FIG. 122, the arrangement of bit groups 0 to 191 of the 69120-bit LDPC code is interleaved into an arrangement of a bit group 121, 28, 49, 4, 21, 191, 90, 101, 188, 126, 8, 131, 81, 150, 141, 152, 17, 82, 61, 119, 125, 145, 153, 45, 108, 22, 94, 48, 29, 12, 59, 140, 75, 169, 183, 157, 142, 158, 113, 79, 89, 186, 112, 80, 56, 120, 166, 15, 43, 2, 62, 115, 38, 123, 73, 179, 155, 171, 185, 5, 168, 172, 190, 106, 174, 96, 116, 91, 30, 147, 19, 149, 37, 175, 124, 156, 14, 144, 86, 110, 40, 68, 162, 66, 130, 74, 165, 180, 13, 177, 122, 23, 109, 95, 42, 117, 65, 3, 111, 18, 32, 52, 97, 184, 54, 46, 167, 136, 1, 134, 189, 187, 16, 36, 84, 132, 170, 34, 57, 24, 137, 100, 39, 127, 6, 102, 10, 25, 114, 146, 53, 99, 85, 35, 78, 148, 9, 143, 139, 92, 173, 27, 11, 26, 104, 176, 98, 129, 51, 103, 160, 71, 154, 118, 67, 33, 181, 87, 77, 47, 159, 178, 83, 70, 164, 44, 69, 88, 63, 161, 182, 133, 20, 41, 64, 76, 31, 50, 128, 105, 0, 135, 55, 72, 93, 151, 107, 163, 60, 138, 7, 58.

FIG. 123 is a diagram illustrating Example 4 of a GW pattern for an LDPC code with a code length N of 69120 bits.

According to the GW pattern of FIG. 123, the arrangement of bit groups 0 to 191 of the 69120-bit LDPC code is interleaved into an arrangement of a bit group 99, 59, 95, 50, 122, 15, 144, 6, 129, 36, 175, 159, 165, 35, 182, 181, 189, 29, 2, 115, 91, 41, 60, 160, 51, 106, 168, 173, 20, 138, 183, 70, 24, 127, 47, 5, 119, 171, 102, 135, 116, 156, 120, 105, 117, 136, 149, 128, 85, 46, 186, 113, 73, 103, 52, 82, 89, 184, 22, 185, 155, 125, 133, 37, 27, 10, 137, 76, 12, 98, 148, 109, 42, 16, 190, 84, 94, 97, 25, 11, 88, 166, 131, 48, 161, 65, 9, 8, 58, 56, 124, 68, 54, 3, 169, 146, 87, 108, 110, 121, 163, 57, 90, 100, 66, 49, 61, 178, 18, 7, 28, 67, 13, 32, 34, 86, 153, 112, 63, 43, 164, 132, 118, 93, 38, 39, 17, 154, 170, 81, 141, 191, 152, 111, 188, 147, 180, 75, 72, 26, 177, 126, 179, 55, 1, 143, 45, 21, 40, 123, 23, 162, 77, 62, 134, 158, 176, 31, 69, 114, 142, 19, 96, 101, 71, 30, 140, 187, 92, 80, 79, 0, 104, 53, 145, 139, 14, 33, 74, 157, 150, 44, 172, 151, 64, 78, 130, 83, 167, 4, 107, 174.

FIG. 124 is a diagram illustrating Example 5 of a GW pattern for an LDPC code with a code length N of 69120 bits.

According to the GW pattern of FIG. 124, the arrangement of bit groups 0 to 191 of the 69120-bit LDPC code is interleaved into an arrangement of a bit group 170, 45, 67, 94, 110, 153, 19, 38, 112, 176, 49, 138, 35, 114, 184, 159, 17, 41, 47, 189, 65, 125, 154, 57, 83, 6, 97, 167, 51, 59, 23, 81, 54, 46, 168, 178, 148, 5, 122, 129, 155, 179, 95, 102, 8, 119, 29, 113, 14, 60, 43, 66, 55, 103, 111, 88, 56, 7, 118, 63, 134, 108, 61, 187, 124, 31, 133, 22, 79, 52, 36, 144, 89, 177, 40, 116, 121, 135, 163, 92, 117, 162, 149, 106, 173, 181, 11, 164, 185, 99, 18, 158, 16, 12, 48, 9, 123, 147, 145, 169, 130, 183, 28, 151, 71, 126, 69, 165, 21, 13, 15, 62, 80, 182, 76, 90, 180, 50, 127, 131, 109, 3, 115, 120, 161, 82, 34, 78, 128, 142, 136, 75, 86, 137, 26, 25, 44, 91, 42, 73, 140, 146, 152, 27, 101, 93, 20, 166, 171, 100, 70, 84, 53, 186, 24, 98, 4, 37, 141, 190, 68, 150, 1, 72, 39, 87, 188, 191, 156, 33, 30, 160, 143, 64, 132, 77, 0, 58, 174, 157, 105, 175, 10, 172, 104, 2, 96, 139, 32, 85, 107, 74.

FIG. 125 is a diagram illustrating Example 6 of a GW pattern for an LDPC code with a code length N of 69120 bits.

According to the GW pattern of FIG. 125, the arrangement of bit groups 0 to 191 of the 69120-bit LDPC code is interleaved into an arrangement of a bit group 111, 156, 189, 11, 132, 114, 100, 154, 77, 79, 95, 161, 47, 142, 36, 98, 3, 125, 159, 120, 40, 160, 29, 153, 16, 39, 101, 58, 191, 46, 76, 4, 183, 176, 62, 60, 74, 7, 37, 127, 19, 186, 71, 50, 139, 27, 188, 113, 38, 130, 124, 26, 146, 131, 102, 110, 105, 147, 86, 150, 94, 162, 175, 88, 104, 55, 89, 181, 34, 69, 22, 92, 133, 1, 25, 0, 158, 10, 24, 116, 164, 165, 112, 72, 106, 129, 81, 66, 54, 49, 136, 118, 83, 41, 2, 56, 145, 28, 177, 168, 117, 9, 157, 173, 115, 149, 42, 103, 14, 84, 155, 187, 99, 6, 43, 70, 140, 73, 32, 78, 75, 167, 148, 48, 134, 178, 59, 15, 63, 91, 82, 33, 135, 166, 190, 152, 96, 137, 12, 182, 61, 107, 128, 119, 179, 45, 184, 65, 172, 138, 31, 57, 174, 17, 180, 5, 30, 170, 23, 85, 185, 35, 44, 123, 90, 20, 122, 8, 64, 141, 169, 121, 97, 108, 80, 171, 18, 13, 87, 163, 109, 52, 51, 21, 93, 67, 126, 68, 53, 143, 144, 151.

Figure 126:
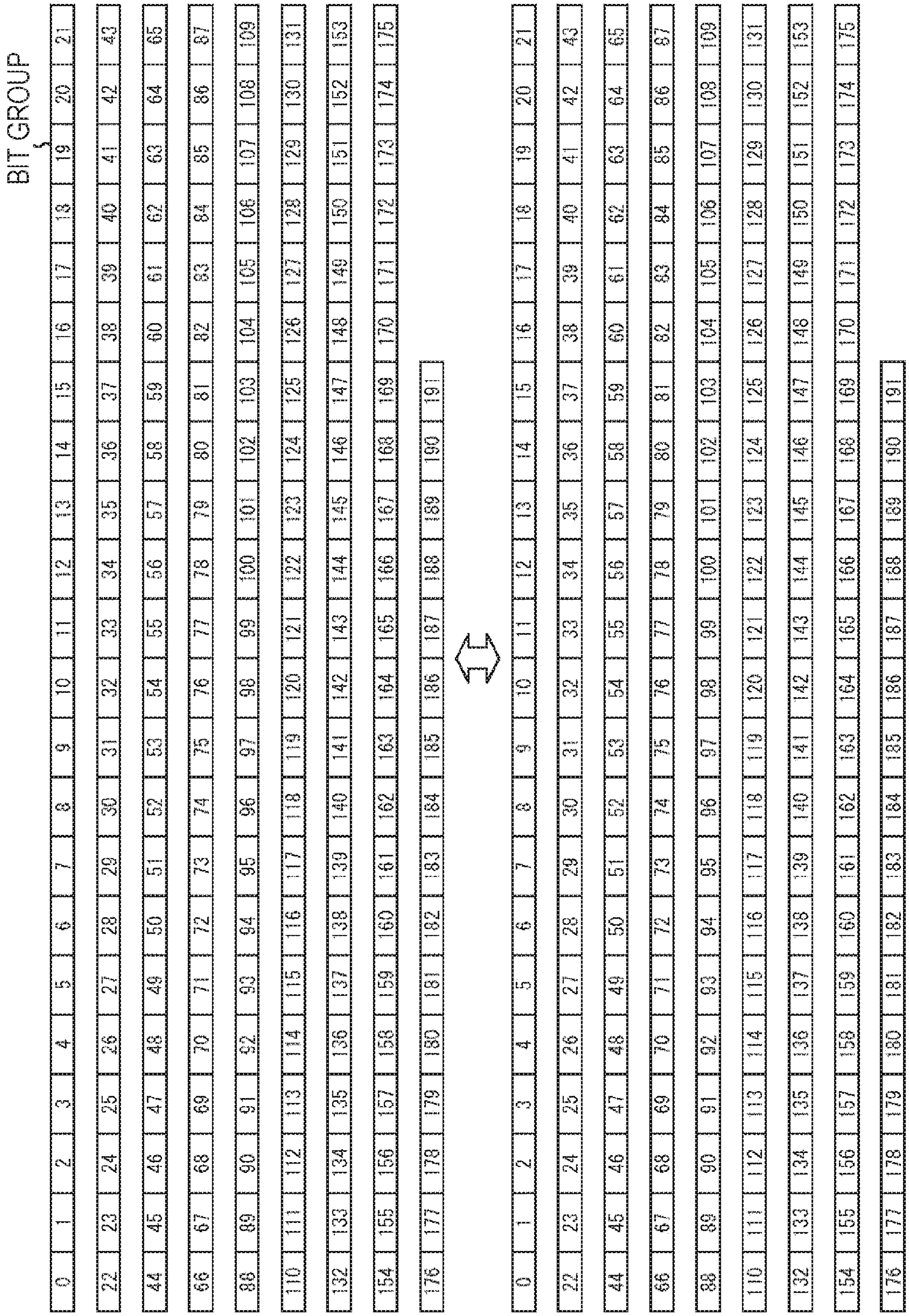

FIG. 126 is a diagram illustrating Example 7 of a GW pattern for an LDPC code with a code length N of 69120 bits.

According to the GW pattern of FIG. 126, the arrangement of bit groups 0 to 191 of the 69120-bit LDPC code is interleaved into an arrangement of a bit group 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191.

Figure 127:
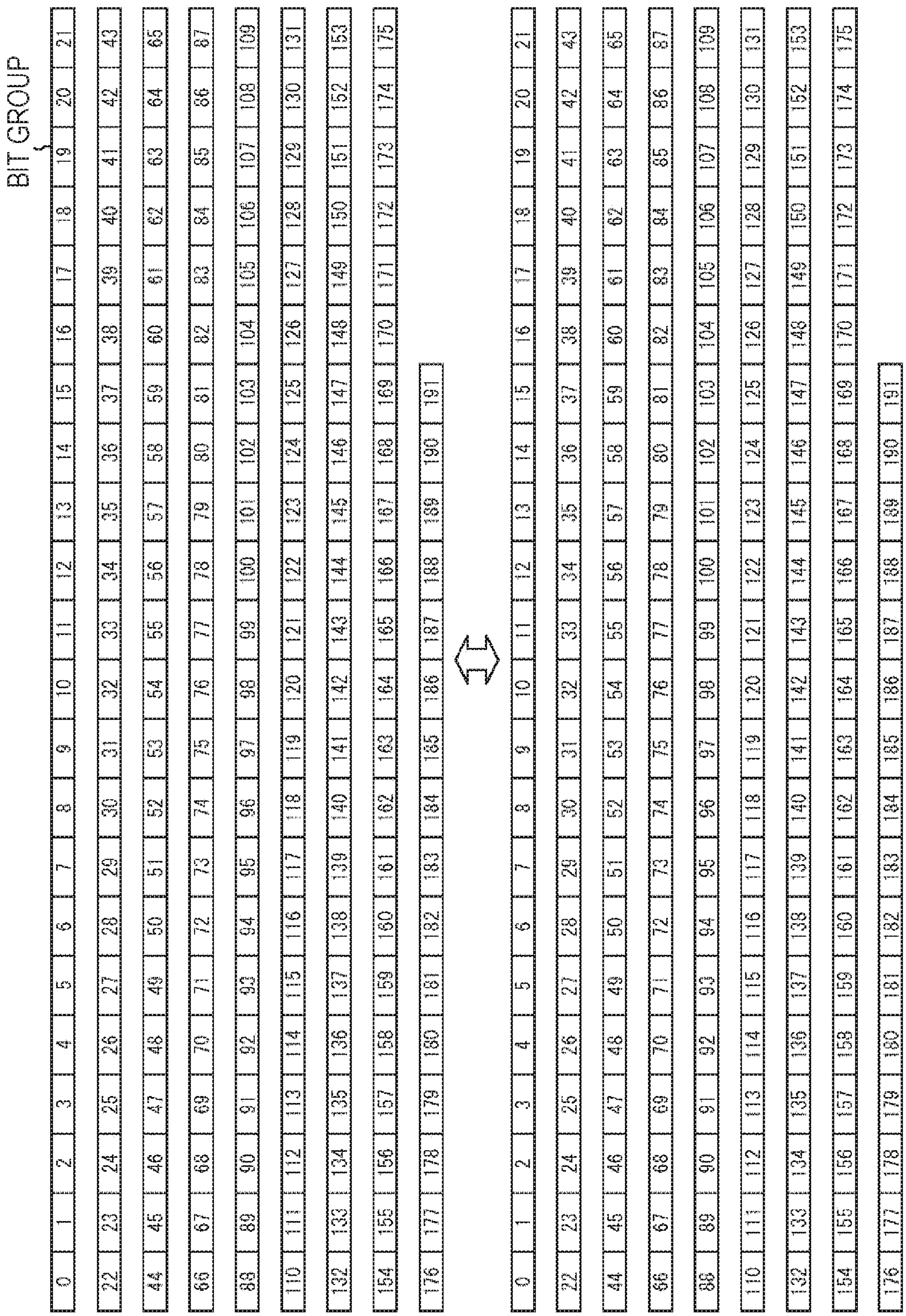

FIG. 127 is a diagram illustrating Example 8 of a GW pattern for an LDPC code with a code length N of 69120 bits.

According to the GW pattern of FIG. 127, the arrangement of bit groups 0 to 191 of the 69120-bit LDPC code is interleaved into an arrangement of a bit group 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191.

Figure 128:
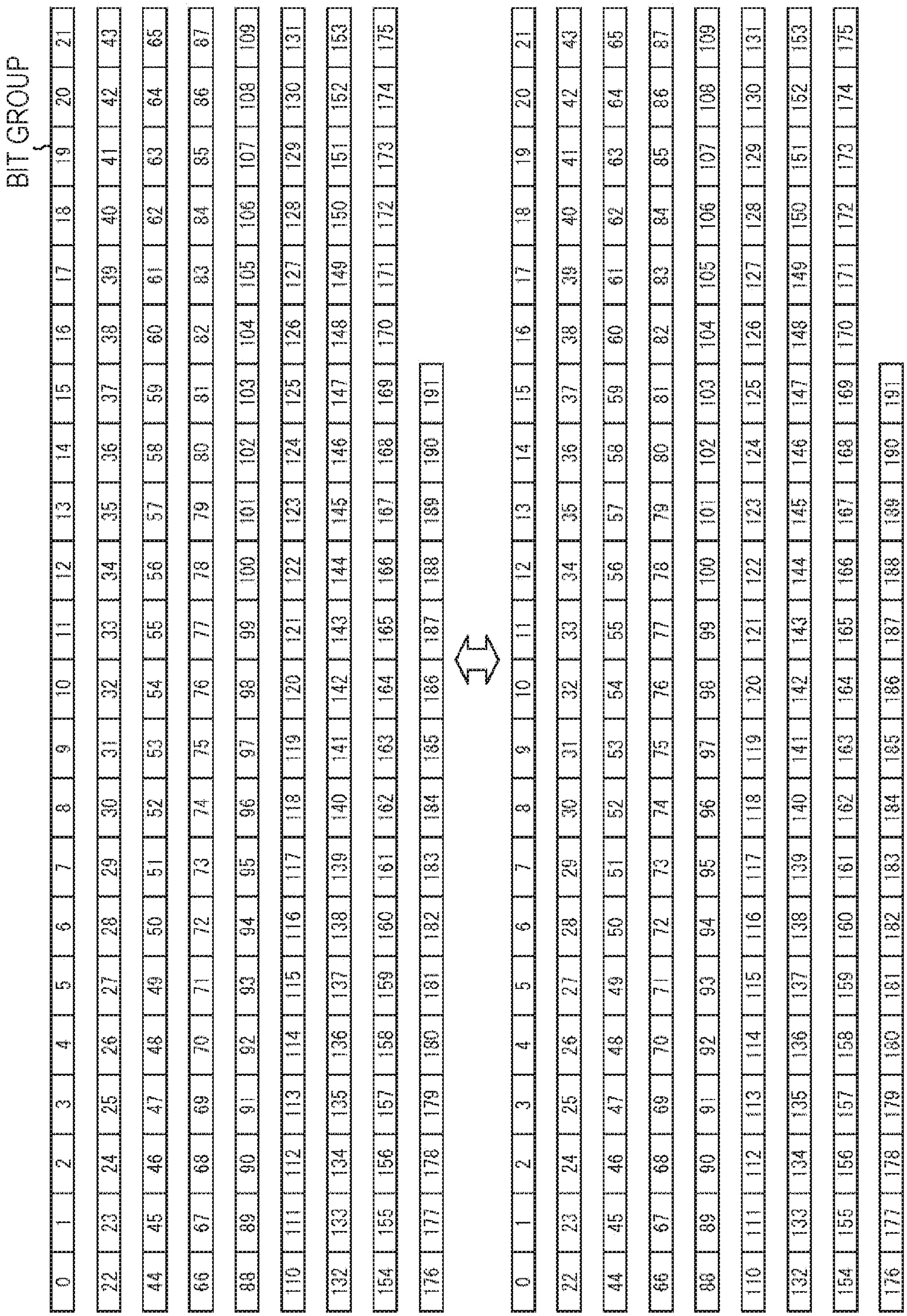

FIG. 128 is a diagram illustrating Example 9 of a GW pattern for an LDPC code with a code length N of 69120 bits.

According to the GW pattern of FIG. 128, the arrangement of bit groups 0 to 191 of the 69120-bit LDPC code is interleaved into an arrangement of a bit group 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191.

Figure 129:
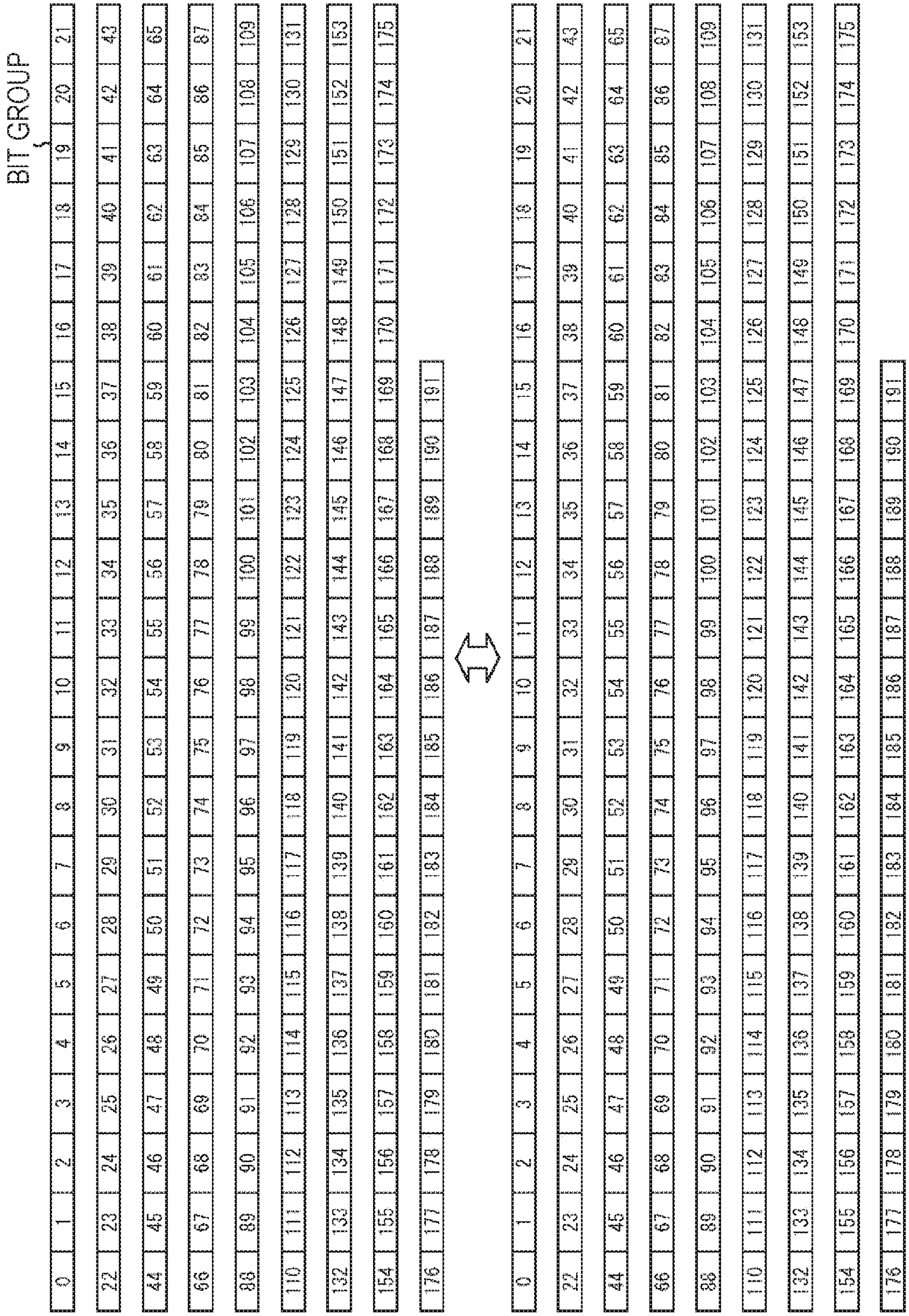

FIG. 129 is a diagram illustrating Example 10 of a GW pattern for an LDPC code with a code length N of 69120 bits.

According to the GW pattern of FIG. 129, the arrangement of bit groups 0 to 191 of the 69120-bit LDPC code is interleaved into an arrangement of a bit group 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191.

Figure 130:
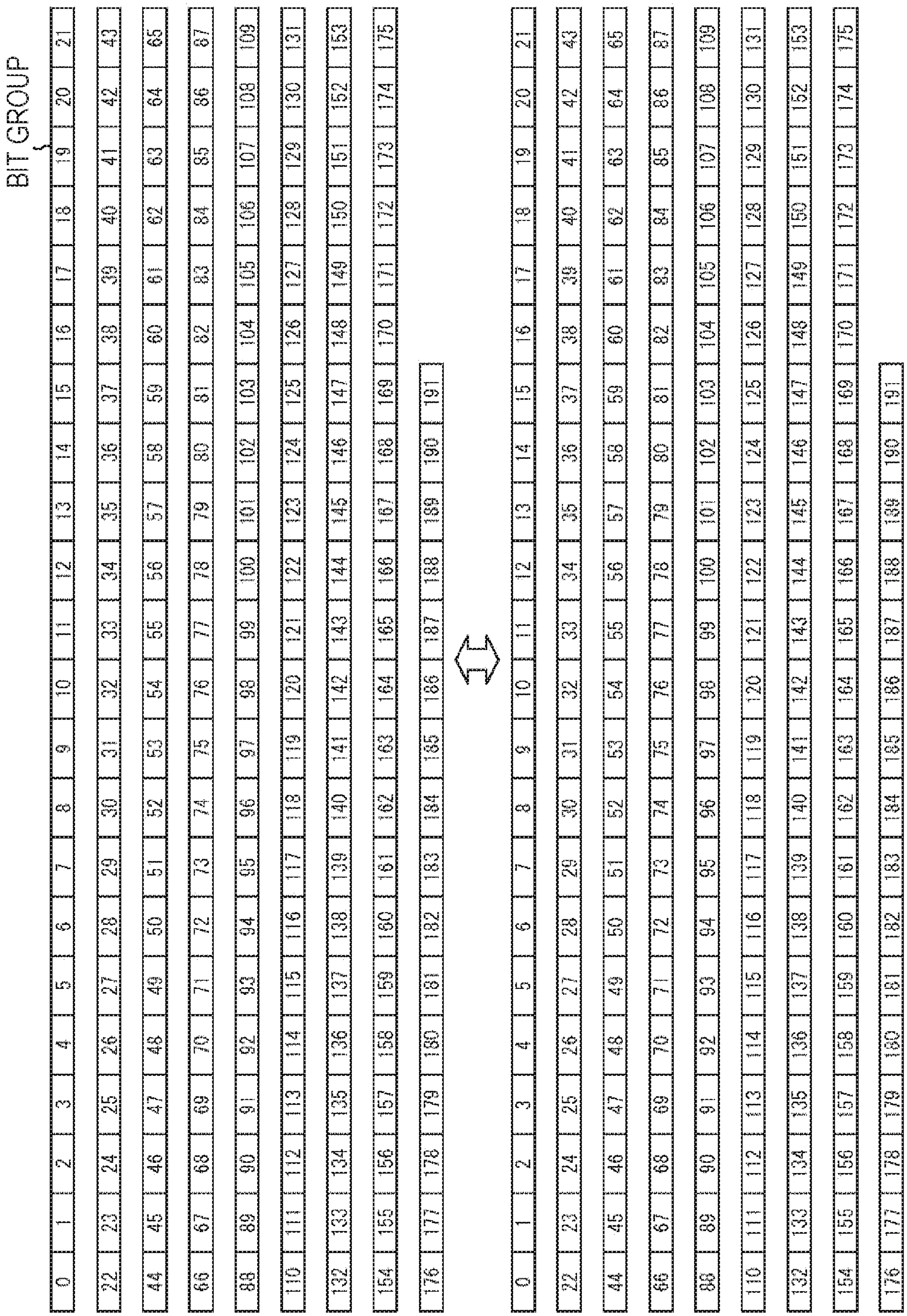

FIG. 130 is a diagram illustrating Example 11 of a GW pattern for an LDPC code with a code length N of 69120 bits.

According to the GW pattern of FIG. 130, the arrangement of bit groups 0 to 191 of the 69120-bit LDPC code is interleaved into an arrangement of a bit group 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191.

Figure 131:
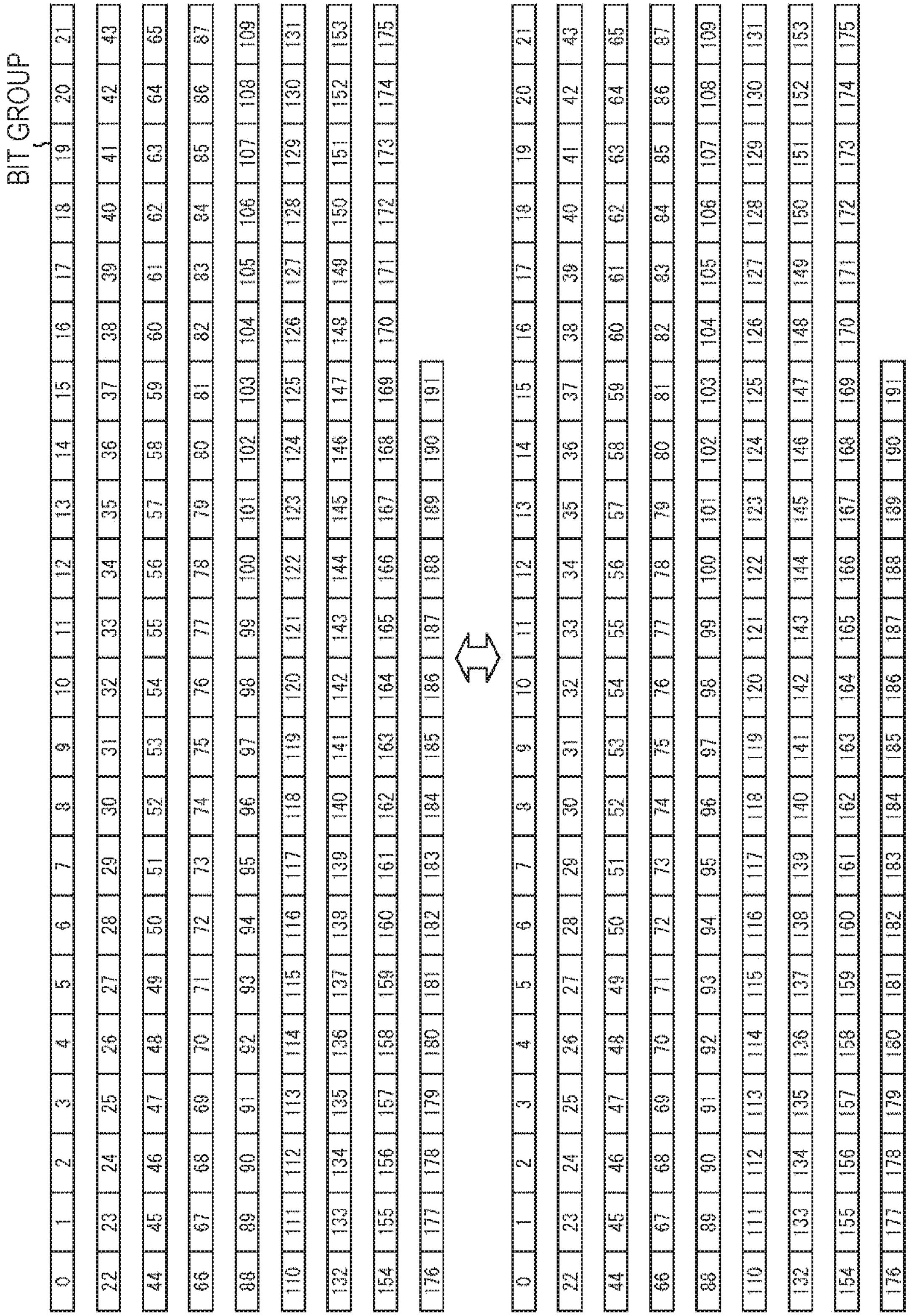

FIG. 131 is a diagram illustrating Example 12 of a GW pattern for an LDPC code with a code length N of 69120 bits.

According to the GW pattern of FIG. 131, the arrangement of bit groups 0 to 191 of the 69120-bit LDPC code is interleaved into an arrangement of a bit group 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191.

FIG. 132 is a diagram illustrating Example 13 of a GW pattern for an LDPC code with a code length N of 69120 bits.

According to the GW pattern of FIG. 132, the arrangement of bit groups 0 to 191 of the 69120-bit LDPC code is interleaved into an arrangement of a bit group 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191.

FIG. 133 is a diagram illustrating Example 14 of a GW pattern for an LDPC code with a code length N of 69120 bits.

According to the GW pattern of FIG. 133, the arrangement of bit groups 0 to 191 of the 69120-bit LDPC code is interleaved into an arrangement of a bit group 154, 106, 99, 177, 191, 55, 189, 181, 22, 62, 80, 114, 110, 141, 83, 103, 169, 156, 130, 186, 92, 45, 68, 126, 112, 185, 160, 158, 17, 145, 162, 127, 152, 174, 134, 18, 157, 120, 3, 29, 13, 135, 173, 86, 73, 150, 46, 153, 33, 61, 142, 102, 171, 168, 78, 77, 139, 85, 176, 163, 128, 101, 42, 2, 14, 38, 10, 125, 90, 30, 63, 172, 47, 108, 89, 0, 32, 94, 23, 34, 59, 35, 129, 12, 146, 8, 60, 27, 147, 180, 100, 87, 184, 167, 36, 79, 138, 4, 95, 148, 72, 54, 91, 182, 28, 133, 164, 175, 123, 107, 137, 88, 44, 116, 69, 7, 31, 124, 144, 105, 170, 6, 165, 15, 161, 24, 58, 70, 11, 56, 143, 111, 104, 74, 67, 109, 82, 21, 52, 9, 71, 48, 26, 117, 50, 149, 140, 20, 57, 136, 113, 64, 151, 190, 131, 19, 51, 96, 76, 1, 97, 40, 53, 84, 166, 75, 159, 98, 81, 49, 66, 188, 118, 39, 132, 187, 25, 119, 41, 122, 16, 5, 93, 115, 178, 65, 121, 37, 155, 183, 43, 179.

FIG. 134 is a diagram illustrating Example 15 of a GW pattern for an LDPC code with a code length N of 69120 bits.

According to the GW pattern of FIG. 134, the arrangement of bit groups 0 to 191 of the 69120-bit LDPC code is interleaved into an arrangement of a bit group 1, 182, 125, 0, 121, 47, 63, 154, 76, 99, 82, 163, 102, 166, 28, 189, 56, 67, 54, 39, 40, 185, 184, 65, 179, 4, 91, 87, 137, 170, 98, 71, 169, 49, 73, 37, 11, 143, 150, 123, 93, 62, 3, 50, 26, 140, 178, 95, 183, 33, 21, 53, 112, 128, 118, 120, 106, 139, 32, 130, 173, 132, 156, 119, 83, 176, 159, 13, 145, 36, 30, 113, 2, 41, 147, 174, 94, 88, 92, 60, 165, 59, 25, 161, 100, 85, 81, 61, 138, 48, 177, 77, 6, 22, 16, 43, 115, 23, 12, 66, 70, 9, 164, 122, 58, 105, 69, 42, 38, 19, 24, 180, 175, 74, 160, 34, 101, 72, 114, 142, 20, 8, 15, 190, 144, 104, 79, 172, 148, 31, 168, 10, 107, 14, 35, 52, 134, 126, 167, 149, 116, 186, 17, 162, 151, 5, 136, 55, 44, 110, 158, 46, 191, 29, 153, 155, 117, 188, 131, 97, 146, 103, 78, 109, 129, 57, 111, 45, 68, 157, 84, 141, 89, 64, 7, 108, 152, 75, 18, 96, 133, 171, 86, 181, 127, 27, 124, 187, 135, 80, 51, 90.

FIG. 135 is a diagram illustrating Example 16 of a GW pattern for an LDPC code with a code length N of 69120 bits.

According to the GW pattern of FIG. 135, the arrangement of bit groups 0 to 191 of the 69120-bit LDPC code is interleaved into an arrangement of a bit group 35, 75, 166, 145, 143, 184, 62, 96, 54, 63, 157, 103, 32, 43, 126, 187, 144, 91, 78, 44, 39, 109, 185, 102, 10, 68, 29, 42, 149, 83, 133, 94, 130, 27, 171, 19, 51, 165, 148, 28, 36, 33, 173, 136, 87, 82, 100, 49, 120, 152, 161, 162, 147, 71, 137, 57, 8, 53, 132, 151, 163, 123, 47, 92, 90, 60, 99, 79, 59, 108, 115, 72, 0, 12, 140, 160, 61, 180, 74, 37, 86, 117, 191, 101, 52, 15, 80, 156, 127, 81, 131, 141, 142, 31, 95, 4, 73, 64, 16, 18, 146, 70, 181, 7, 89, 124, 77, 67, 116, 21, 34, 41, 105, 113, 97, 2, 6, 55, 17, 65, 38, 48, 158, 159, 179, 5, 30, 183, 170, 135, 125, 20, 106, 186, 182, 188, 114, 1, 14, 3, 134, 178, 189, 167, 40, 119, 22, 190, 58, 23, 155, 138, 98, 84, 11, 110, 88, 46, 177, 175, 25, 150, 118, 121, 129, 168, 13, 128, 104, 69, 112, 169, 9, 45, 174, 93, 26, 56, 76, 50, 154, 139, 66, 85, 153, 107, 111, 172, 176, 164, 24, 122.

FIG. 136 is a diagram illustrating Example 17 of a GW pattern for an LDPC code with a code length N of 69120 bits.

According to the GW pattern of FIG. 136, the arrangement of bit groups 0 to 191 of the 69120-bit LDPC code is interleaved into an arrangement of a bit group 155, 188, 123, 132, 15, 79, 59, 119, 66, 68, 41, 175, 184, 78, 142, 32, 54, 111, 139, 134, 95, 34, 161, 150, 58, 141, 74, 112, 121, 99, 178, 179, 57, 90, 80, 21, 11, 29, 67, 104, 52, 87, 38, 81, 181, 160, 176, 16, 71, 13, 186, 171, 9, 170, 2, 177, 0, 88, 149, 190, 69, 33, 183, 146, 61, 117, 113, 6, 96, 120, 162, 23, 53, 140, 91, 128, 46, 93, 174, 126, 159, 133, 8, 152, 103, 102, 151, 143, 100, 4, 180, 166, 55, 164, 18, 49, 62, 20, 83, 7, 187, 153, 64, 37, 144, 185, 19, 114, 25, 116, 12, 173, 122, 127, 89, 115, 75, 101, 189, 124, 157, 108, 28, 165, 163, 65, 168, 77, 82, 27, 137, 86, 22, 110, 63, 148, 158, 97, 31, 105, 135, 98, 44, 70, 182, 191, 17, 156, 129, 39, 136, 169, 3, 145, 154, 109, 76, 5, 10, 106, 35, 94, 172, 45, 51, 60, 42, 50, 72, 85, 40, 118, 36, 14, 130, 131, 138, 43, 48, 125, 84, 24, 26, 1, 56, 107, 92, 147, 47, 30, 73, 167.

FIG. 137 is a diagram illustrating Example 18 of a GW pattern for an LDPC code with a code length N of 69120 bits.

According to the GW pattern of FIG. 137, the arrangement of bit groups 0 to 191 of the 69120-bit LDPC code is interleaved into an arrangement of a bit group 152, 87, 170, 33, 48, 95, 2, 184, 145, 51, 94, 164, 38, 90, 158, 70, 124, 128, 66, 111, 79, 42, 45, 141, 83, 73, 57, 119, 20, 67, 31, 179, 123, 183, 26, 188, 15, 163, 1, 133, 105, 72, 81, 153, 69, 182, 101, 180, 185, 190, 77, 6, 127, 138, 75, 59, 24, 175, 30, 186, 139, 56, 100, 176, 147, 189, 116, 131, 25, 5, 16, 117, 74, 50, 171, 114, 76, 44, 107, 135, 71, 181, 13, 43, 122, 78, 4, 58, 35, 63, 187, 98, 37, 169, 148, 7, 10, 49, 80, 161, 167, 28, 142, 46, 97, 92, 121, 112, 88, 102, 106, 173, 19, 27, 41, 172, 91, 191, 34, 118, 108, 136, 166, 155, 96, 3, 165, 103, 84, 109, 104, 53, 23, 0, 178, 17, 86, 9, 168, 134, 110, 18, 32, 146, 129, 159, 55, 154, 126, 40, 151, 174, 60, 52, 22, 149, 156, 113, 143, 11, 93, 62, 177, 64, 61, 160, 150, 65, 130, 82, 29, 115, 137, 36, 8, 157, 54, 89, 99, 120, 68, 21, 140, 14, 39, 132, 125, 12, 85, 162, 47, 144.

FIG. 138 is a diagram illustrating Example 19 of a GW pattern for an LDPC code with a code length N of 69120 bits.

According to the GW pattern of FIG. 138, the arrangement of bit groups 0 to 191 of the 69120-bit LDPC code is interleaved into an arrangement of a bit group 140, 8, 176, 13, 41, 165, 27, 109, 121, 153, 58, 181, 143, 164, 103, 115, 91, 66, 60, 189, 101, 4, 14, 102, 45, 124, 104, 159, 130, 133, 135, 77, 25, 59, 180, 141, 144, 62, 114, 182, 134, 148, 11, 20, 125, 83, 162, 75, 126, 67, 9, 178, 171, 152, 166, 69, 174, 15, 80, 168, 131, 95, 56, 48, 63, 82, 147, 51, 108, 52, 30, 139, 22, 37, 173, 112, 191, 98, 116, 149, 167, 142, 29, 154, 92, 94, 71, 117, 79, 122, 129, 24, 81, 105, 97, 137, 128, 1, 113, 170, 119, 7, 158, 76, 19, 183, 68, 31, 50, 118, 33, 72, 55, 65, 146, 185, 111, 145, 28, 21, 177, 160, 32, 61, 70, 106, 156, 78, 132, 88, 184, 35, 5, 53, 138, 47, 100, 10, 42, 36, 175, 93, 120, 190, 16, 123, 87, 54, 186, 18, 57, 84, 99, 12, 163, 157, 188, 64, 38, 26, 2, 136, 40, 169, 90, 107, 46, 172, 49, 6, 39, 44, 150, 85, 0, 17, 127, 155, 110, 34, 96, 74, 86, 187, 89, 151, 43, 179, 161, 73, 23, 3.

FIG. 139 is a diagram illustrating Example 20 of a GW pattern for an LDPC code with a code length N of 69120 bits.

According to the GW pattern of FIG. 139, the arrangement of bit groups 0 to 191 of the 69120-bit LDPC code is interleaved into an arrangement of a bit group 10, 61, 30, 88, 33, 60, 1, 102, 45, 103, 119, 181, 82, 112, 12, 67, 69, 171, 108, 26, 145, 156, 81, 152, 8, 16, 68, 13, 99, 183, 146, 27, 158, 147, 132, 118, 180, 120, 173, 59, 186, 49, 7, 17, 35, 104, 129, 75, 54, 72, 18, 48, 15, 177, 191, 51, 24, 93, 106, 22, 71, 29, 141, 32, 143, 128, 175, 86, 190, 74, 36, 43, 144, 46, 63, 65, 133, 31, 87, 44, 20, 117, 76, 187, 80, 101, 151, 47, 130, 116, 162, 127, 153, 100, 94, 2, 41, 138, 125, 131, 11, 50, 40, 21, 184, 167, 172, 85, 160, 105, 73, 38, 157, 53, 39, 97, 107, 165, 168, 89, 148, 126, 3, 4, 114, 161, 155, 182, 136, 149, 111, 98, 113, 139, 92, 109, 174, 185, 95, 56, 135, 37, 163, 154, 0, 96, 78, 122, 5, 179, 140, 83, 123, 77, 9, 19, 66, 42, 137, 14, 23, 159, 189, 110, 142, 84, 169, 166, 52, 91, 164, 28, 124, 121, 70, 115, 90, 170, 58, 6, 178, 176, 64, 188, 57, 34, 79, 62, 25, 134, 150, 55.

FIG. 140 is a diagram illustrating Example 21 of a GW pattern for an LDPC code with a code length N of 69120 bits.

According to the GW pattern of FIG. 140, the arrangement of bit groups 0 to 191 of the 69120-bit LDPC code is interleaved into an arrangement of a bit group 8, 165, 180, 182, 189, 61, 7, 140, 105, 78, 86, 75, 15, 28, 82, 1, 136, 130, 35, 24, 70, 152, 121, 11, 36, 66, 83, 57, 164, 111, 137, 128, 175, 156, 151, 48, 44, 147, 18, 64, 184, 42, 159, 3, 6, 162, 170, 98, 101, 29, 102, 21, 188, 79, 138, 45, 124, 118, 155, 125, 34, 27, 5, 97, 109, 145, 54, 56, 126, 187, 16, 149, 160, 178, 23, 141, 30, 117, 25, 69, 116, 131, 94, 65, 191, 99, 181, 185, 115, 67, 93, 106, 38, 71, 76, 113, 132, 172, 103, 95, 92, 107, 4, 163, 139, 72, 157, 0, 12, 52, 68, 88, 161, 183, 39, 14, 32, 49, 19, 77, 174, 47, 154, 17, 134, 133, 51, 120, 74, 177, 41, 108, 142, 143, 13, 26, 59, 100, 123, 55, 158, 62, 104, 148, 135, 9, 179, 53, 176, 33, 169, 129, 186, 43, 167, 87, 119, 84, 90, 150, 20, 10, 122, 114, 80, 50, 146, 144, 96, 171, 40, 73, 81, 168, 112, 190, 37, 173, 46, 110, 60, 85, 153, 2, 63, 91, 127, 89, 31, 58, 22, 166.

FIG. 141 is a diagram illustrating Example 22 of a GW pattern for an LDPC code with a code length N of 69120 bits.

According to the GW pattern of FIG. 141, the arrangement of bit groups 0 to 191 of the 69120-bit LDPC code is interleaved into an arrangement of a bit group 17, 84, 125, 70, 134, 63, 68, 162, 61, 31, 74, 137, 7, 138, 5, 60, 76, 105, 160, 12, 114, 81, 155, 112, 153, 191, 82, 148, 118, 108, 58, 159, 43, 161, 149, 96, 71, 30, 145, 174, 67, 77, 47, 94, 48, 156, 151, 141, 131, 176, 183, 41, 35, 83, 164, 55, 169, 98, 187, 124, 100, 54, 104, 40, 2, 72, 8, 85, 182, 103, 6, 37, 107, 39, 42, 123, 57, 106, 13, 150, 129, 46, 109, 188, 45, 113, 44, 90, 20, 165, 142, 110, 22, 28, 173, 38, 52, 16, 34, 0, 3, 144, 27, 49, 139, 177, 132, 184, 25, 87, 152, 119, 158, 78, 186, 167, 97, 24, 99, 69, 120, 122, 133, 163, 21, 51, 101, 185, 111, 26, 18, 10, 33, 170, 95, 65, 14, 130, 157, 59, 115, 127, 92, 56, 1, 80, 66, 126, 178, 147, 75, 179, 171, 53, 146, 88, 4, 128, 121, 86, 117, 19, 23, 168, 181, 11, 102, 93, 73, 140, 89, 136, 9, 180, 62, 36, 79, 91, 190, 143, 29, 154, 32, 64, 166, 116, 15, 189, 175, 50, 135, 172.

FIG. 142 is a diagram illustrating Example 23 of a GW pattern for an LDPC code with a code length N of 69120 bits.

According to the GW pattern of FIG. 142, the arrangement of bit groups 0 to 191 of the 69120-bit LDPC code is interleaved into an arrangement of a bit group 157, 20, 116, 115, 49, 178, 148, 152, 174, 130, 171, 81, 60, 146, 182, 72, 46, 22, 93, 101, 9, 55, 40, 163, 118, 30, 52, 181, 151, 31, 87, 117, 120, 82, 95, 190, 23, 36, 67, 62, 14, 167, 80, 27, 24, 43, 94, 0, 63, 5, 74, 78, 158, 88, 84, 109, 147, 112, 124, 110, 21, 47, 45, 68, 184, 70, 1, 66, 149, 105, 140, 170, 56, 98, 135, 61, 79, 123, 166, 185, 41, 108, 122, 92, 16, 26, 37, 177, 173, 113, 136, 89, 162, 85, 54, 39, 73, 58, 131, 134, 188, 127, 3, 164, 13, 132, 129, 179, 25, 18, 57, 32, 119, 111, 53, 155, 28, 107, 133, 144, 19, 160, 71, 186, 153, 103, 2, 12, 91, 106, 64, 175, 75, 189, 128, 142, 187, 76, 180, 34, 59, 169, 90, 11, 172, 97, 141, 38, 191, 17, 114, 126, 145, 83, 143, 125, 121, 10, 44, 137, 86, 29, 104, 154, 168, 65, 159, 15, 99, 35, 50, 48, 138, 96, 100, 102, 7, 42, 156, 8, 4, 69, 183, 51, 165, 6, 150, 77, 161, 33, 176, 139.

FIG. 143 is a diagram illustrating Example 24 of a GW pattern for an LDPC code with a code length N of 69120 bits.

According to the GW pattern of FIG. 143, the arrangement of bit groups 0 to 191 of the 69120-bit LDPC code is interleaved into an arrangement of a bit group 42, 168, 36, 37, 152, 118, 14, 83, 105, 131, 26, 120, 92, 130, 158, 132, 49, 72, 137, 100, 88, 24, 53, 142, 110, 102, 74, 188, 113, 121, 12, 173, 5, 126, 127, 3, 93, 46, 164, 109, 151, 2, 98, 153, 116, 89, 101, 136, 35, 80, 0, 133, 183, 162, 185, 56, 17, 87, 117, 184, 54, 70, 176, 91, 134, 51, 38, 73, 165, 99, 169, 43, 167, 86, 11, 144, 78, 58, 64, 13, 119, 33, 166, 6, 75, 31, 15, 28, 125, 148, 27, 114, 82, 45, 55, 191, 160, 115, 1, 69, 187, 122, 177, 32, 172, 52, 112, 171, 124, 180, 85, 150, 7, 57, 60, 94, 181, 29, 97, 128, 19, 149, 175, 50, 140, 10, 174, 68, 59, 39, 106, 44, 62, 71, 18, 107, 156, 159, 146, 48, 81, 111, 96, 103, 34, 161, 141, 154, 76, 61, 135, 20, 84, 77, 108, 23, 145, 182, 170, 139, 157, 47, 9, 63, 123, 138, 155, 79, 4, 30, 143, 25, 90, 66, 147, 186, 179, 129, 21, 65, 41, 95, 67, 22, 163, 190, 16, 8, 104, 189, 40, 178.

FIG. 144 is a diagram illustrating Example 25 of a GW pattern for an LDPC code with a code length N of 69120 bits.

According to the GW pattern of FIG. 144, the arrangement of bit groups 0 to 191 of the 69120-bit LDPC code is interleaved into an arrangement of a bit group 92, 132, 39, 44, 190, 21, 70, 146, 48, 13, 17, 187, 119, 43, 94, 157, 150, 98, 96, 47, 86, 63, 152, 158, 84, 170, 81, 7, 62, 191, 174, 99, 116, 10, 85, 113, 135, 28, 53, 122, 83, 141, 77, 23, 131, 4, 40, 168, 129, 109, 51, 130, 188, 147, 29, 50, 26, 78, 148, 164, 167, 103, 36, 134, 2, 177, 20, 123, 27, 90, 176, 5, 33, 133, 189, 138, 76, 41, 89, 35, 72, 139, 32, 73, 68, 67, 101, 166, 93, 54, 52, 42, 110, 59, 8, 179, 34, 171, 143, 137, 9, 126, 155, 108, 142, 120, 163, 12, 3, 75, 159, 107, 65, 128, 87, 6, 22, 57, 100, 24, 64, 106, 117, 19, 58, 95, 74, 180, 125, 136, 186, 154, 121, 161, 88, 37, 114, 102, 105, 160, 80, 185, 82, 124, 184, 15, 16, 18, 118, 173, 151, 11, 91, 79, 46, 140, 127, 1, 169, 0, 61, 66, 45, 162, 149, 115, 144, 30, 25, 175, 153, 183, 60, 38, 31, 111, 182, 49, 55, 145, 56, 181, 104, 14, 71, 178, 112, 172, 165, 69, 97, 156.

FIG. 145 is a diagram illustrating Example 26 of a GW pattern for an LDPC code with a code length N of 69120 bits.

According to the GW pattern of FIG. 145, the arrangement of bit groups 0 to 191 of the 69120-bit LDPC code is interleaved into an arrangement of a bit group 133, 96, 46, 148, 78, 109, 149, 161, 55, 39, 183, 54, 186, 73, 150, 180, 189, 190, 22, 135, 12, 80, 42, 130, 164, 70, 126, 107, 57, 67, 15, 157, 52, 88, 5, 23, 123, 66, 53, 147, 177, 60, 131, 108, 171, 191, 44, 140, 98, 154, 37, 118, 176, 92, 124, 138, 132, 167, 173, 13, 79, 32, 145, 14, 113, 30, 2, 0, 165, 182, 153, 24, 144, 87, 82, 75, 141, 89, 137, 33, 100, 106, 128, 168, 29, 36, 172, 11, 111, 68, 16, 10, 34, 188, 35, 160, 77, 83, 178, 58, 59, 7, 56, 110, 104, 61, 76, 85, 121, 93, 19, 134, 179, 155, 163, 115, 185, 125, 112, 71, 8, 119, 18, 47, 151, 26, 103, 122, 9, 170, 146, 99, 49, 72, 102, 31, 40, 43, 158, 142, 4, 69, 139, 28, 174, 101, 84, 129, 156, 74, 62, 91, 159, 41, 38, 45, 136, 169, 21, 51, 181, 97, 166, 175, 90, 27, 86, 65, 105, 143, 127, 17, 6, 116, 94, 117, 48, 50, 25, 64, 95, 63, 184, 152, 120, 1, 187, 162, 114, 3, 81, 20.

FIG. 146 is a diagram illustrating Example 27 of a GW pattern for an LDPC code with a code length N of 69120 bits.

According to the GW pattern of FIG. 146, the arrangement of bit groups 0 to 191 of the 69120-bit LDPC code is interleaved into an arrangement of a bit group 59, 34, 129, 18, 137, 6, 83, 139, 47, 148, 147, 110, 11, 98, 62, 149, 158, 14, 42, 180, 23, 128, 99, 181, 54, 176, 35, 130, 53, 179, 39, 152, 32, 52, 69, 82, 84, 113, 79, 21, 95, 7, 126, 191, 86, 169, 111, 12, 55, 27, 182, 120, 123, 88, 107, 50, 144, 49, 38, 165, 0, 159, 10, 43, 114, 187, 150, 19, 65, 48, 124, 8, 141, 171, 173, 17, 167, 92, 74, 170, 184, 67, 33, 172, 16, 119, 66, 57, 89, 106, 26, 78, 178, 109, 70, 2, 157, 15, 105, 22, 174, 127, 100, 71, 97, 163, 9, 77, 87, 41, 183, 117, 46, 40, 131, 85, 136, 72, 122, 1, 45, 13, 44, 56, 61, 146, 25, 132, 177, 76, 121, 160, 112, 5, 134, 73, 91, 135, 68, 3, 80, 90, 190, 60, 75, 145, 115, 81, 161, 156, 116, 166, 96, 28, 138, 94, 162, 140, 102, 4, 133, 30, 155, 189, 143, 64, 185, 164, 104, 142, 154, 118, 24, 31, 153, 103, 51, 108, 29, 37, 58, 186, 175, 36, 151, 63, 93, 188, 125, 101, 20, 168.

FIG. 147 is a diagram illustrating Example 28 of a GW pattern for an LDPC code with a code length N of 69120 bits.

According to the GW pattern of FIG. 147, the arrangement of bit groups 0 to 191 of the 69120-bit LDPC code is interleaved into an arrangement of a bit group 61, 110, 123, 127, 148, 162, 131, 71, 176, 22, 157, 0, 151, 155, 112, 189, 36, 181, 10, 46, 133, 75, 80, 88, 6, 165, 97, 54, 31, 174, 49, 139, 98, 4, 170, 26, 50, 16, 141, 187, 13, 109, 106, 120, 72, 32, 63, 59, 79, 172, 83, 100, 92, 24, 56, 130, 167, 81, 103, 111, 158, 159, 153, 175, 8, 41, 136, 70, 33, 45, 84, 150, 39, 166, 164, 99, 126, 190, 134, 40, 87, 64, 154, 140, 116, 184, 115, 183, 30, 35, 7, 42, 146, 86, 58, 12, 14, 149, 89, 179, 128, 160, 95, 171, 74, 25, 29, 119, 143, 178, 28, 21, 23, 90, 188, 96, 173, 93, 147, 191, 18, 62, 2, 132, 20, 11, 17, 135, 152, 67, 73, 108, 76, 91, 156, 104, 48, 121, 94, 125, 38, 65, 177, 68, 37, 124, 78, 118, 186, 34, 185, 113, 169, 9, 69, 82, 163, 114, 145, 168, 44, 52, 105, 51, 137, 1, 161, 3, 55, 182, 101, 57, 43, 77, 5, 47, 144, 180, 66, 53, 19, 117, 60, 138, 142, 107, 122, 85, 27, 129, 15, 102.

FIG. 148 is a diagram illustrating Example 29 of a GW pattern for an LDPC code with a code length N of 69120 bits.

According to the GW pattern of FIG. 148, the arrangement of bit groups 0 to 191 of the 69120-bit LDPC code is interleaved into an arrangement of a bit group 8, 174, 121, 46, 70, 106, 183, 9, 96, 109, 72, 130, 47, 168, 1, 190, 18, 90, 103, 135, 105, 112, 23, 33, 185, 31, 171, 111, 0, 115, 4, 159, 25, 65, 134, 146, 26, 37, 16, 169, 167, 74, 67, 155, 154, 83, 117, 53, 19, 161, 76, 12, 7, 131, 59, 51, 189, 42, 114, 142, 126, 66, 164, 191, 55, 132, 35, 153, 137, 87, 5, 100, 122, 150, 2, 49, 32, 172, 149, 177, 15, 82, 98, 34, 140, 170, 56, 78, 188, 57, 118, 186, 181, 52, 71, 24, 81, 22, 11, 156, 86, 148, 97, 38, 48, 64, 40, 165, 180, 125, 127, 143, 88, 43, 61, 158, 28, 162, 187, 110, 84, 157, 27, 41, 39, 124, 85, 58, 20, 44, 102, 36, 77, 147, 120, 179, 21, 60, 92, 138, 119, 173, 160, 144, 91, 99, 107, 101, 145, 184, 108, 95, 69, 63, 3, 89, 128, 136, 94, 129, 50, 79, 68, 151, 104, 163, 123, 182, 93, 29, 133, 152, 178, 80, 62, 54, 14, 141, 166, 176, 45, 30, 10, 6, 75, 73, 116, 175, 17, 113, 139, 13.

FIG. 149 is a diagram illustrating Example 30 of a GW pattern for an LDPC code with a code length N of 69120 bits.

According to the GW pattern of FIG. 149, the arrangement of bit groups 0 to 191 of the 69120-bit LDPC code is interleaved into an arrangement of a bit group 179, 91, 101, 128, 169, 69, 185, 35, 156, 168, 132, 163, 46, 28, 5, 41, 162, 112, 108, 130, 153, 79, 118, 102, 125, 176, 71, 20, 115, 98, 124, 75, 103, 21, 164, 173, 9, 36, 56, 134, 24, 16, 159, 34, 15, 42, 104, 54, 120, 76, 60, 33, 127, 88, 133, 137, 61, 19, 3, 170, 87, 190, 13, 141, 188, 106, 113, 67, 145, 146, 111, 74, 89, 62, 175, 49, 32, 99, 93, 107, 171, 66, 80, 155, 100, 152, 4, 10, 126, 109, 181, 154, 105, 48, 136, 161, 183, 97, 31, 12, 8, 184, 47, 142, 18, 14, 117, 73, 84, 70, 68, 0, 23, 96, 165, 29, 122, 81, 17, 131, 44, 157, 26, 25, 189, 83, 178, 37, 123, 82, 191, 39, 7, 72, 160, 64, 143, 149, 138, 65, 58, 119, 63, 166, 114, 95, 172, 43, 140, 57, 158, 186, 86, 174, 92, 45, 139, 144, 147, 148, 151, 59, 30, 85, 40, 51, 187, 78, 38, 150, 129, 121, 27, 94, 52, 177, 110, 182, 55, 22, 167, 90, 77, 6, 11, 1, 116, 53, 2, 50, 135, 180.

FIG. 150 is a diagram illustrating Example 31 of a GW pattern for an LDPC code with a code length N of 69120 bits.

According to the GW pattern of FIG. 150, the arrangement of bit groups 0 to 191 of the 69120-bit LDPC code is interleaved into an arrangement of a bit group 99, 59, 95, 50, 122, 15, 144, 6, 129, 36, 175, 159, 165, 35, 182, 181, 189, 29, 2, 115, 91, 41, 60, 160, 51, 106, 168, 173, 20, 138, 183, 70, 24, 127, 47, 5, 119, 171, 102, 135, 116, 156, 120, 105, 117, 136, 149, 128, 85, 46, 186, 113, 73, 103, 52, 82, 89, 184, 22, 185, 155, 125, 133, 37, 27, 10, 137, 76, 12, 98, 148, 109, 42, 16, 190, 84, 94, 97, 25, 11, 88, 166, 131, 48, 161, 65, 9, 8, 58, 56, 124, 68, 54, 3, 169, 146, 87, 108, 110, 121, 163, 57, 90, 100, 66, 49, 61, 178, 18, 7, 28, 67, 13, 32, 34, 86, 153, 112, 63, 43, 164, 132, 118, 93, 38, 39, 17, 154, 170, 81, 141, 191, 152, 111, 188, 147, 180, 75, 72, 26, 177, 126, 179, 55, 1, 143, 45, 21, 40, 123, 23, 162, 77, 62, 134, 158, 176, 31, 69, 114, 142, 19, 96, 101, 71, 30, 140, 187, 92, 80, 79, 0, 104, 53, 145, 139, 14, 33, 74, 157, 150, 44, 172, 151, 64, 78, 130, 83, 167, 4, 107, 174.

FIG. 151 is a diagram illustrating Example 32 of a GW pattern for an LDPC code with a code length N of 69120 bits.

According to the GW pattern of FIG. 151, the arrangement of bit groups 0 to 191 of the 69120-bit LDPC code is interleaved into an arrangement of a bit group
16, 133, 14, 114, 145, 191, 53, 80, 166, 68, 21, 184, 73, 165, 147, 89, 180, 55, 135, 94, 189, 78, 103, 115, 72, 24, 105, 188, 84, 148, 85, 32, 1, 131, 34, 134, 41, 167, 81, 54, 142, 141, 75, 155, 122, 140, 13, 17, 8, 23, 61, 49, 51, 74, 181, 162, 143, 42, 71, 123, 161, 177, 110, 149, 126, 0, 63, 178, 35, 175, 186, 52, 43, 139, 112, 10, 40, 150, 182, 164, 64, 83, 174, 38, 47, 30, 2, 116, 25, 128, 160, 144, 99, 5, 187, 176, 82, 60, 18, 185, 104, 169, 39, 183, 137, 22, 109, 96, 151, 46, 33, 29, 65, 132, 95, 31, 136, 159, 170, 168, 67, 79, 93, 111, 90, 97, 113, 92, 76, 58, 127, 26, 27, 156, 3, 6, 28, 77, 125, 173, 98, 138, 172, 86, 45, 118, 171, 62, 179, 100, 19, 163, 50, 57, 56, 36, 102, 121, 117, 154, 119, 66, 20, 91, 130, 69, 44, 70, 153, 152, 158, 88, 108, 12, 59, 4, 11, 120, 87, 101, 37, 129, 146, 9, 106, 48, 7, 15, 124, 190, 107, 157.

FIG. 152 is a diagram illustrating Example 33 of a GW pattern for an LDPC code with a code length N of 69120 bits.

According to the GW pattern of FIG. 152, the arrangement of bit groups 0 to 191 of the 69120-bit LDPC code is interleaved into an arrangement of a bit group
178, 39, 54, 68, 122, 20, 86, 137, 156, 55, 52, 72, 130, 152, 147, 12, 69, 48, 107, 44, 88, 23, 181, 174, 124, 81, 59, 93, 22, 46, 82, 110, 3, 99, 75, 36, 38, 119, 131, 51, 115, 78, 84, 33, 163, 11, 2, 188, 161, 34, 89, 50, 8, 90, 109, 136, 77, 103, 67, 41, 149, 176, 134, 189, 159, 184, 153, 53, 129, 63, 160, 139, 150, 169, 148, 127, 25, 175, 142, 98, 56, 144, 102, 94, 101, 85, 132, 76, 5, 177, 0, 128, 45, 162, 92, 62, 133, 30, 17, 9, 61, 70, 154, 4, 146, 24, 135, 104, 13, 185, 79, 138, 31, 112, 1, 49, 113, 106, 100, 65, 10, 83, 73, 26, 58, 114, 66, 126, 117, 96, 186, 14, 40, 164, 158, 118, 29, 121, 151, 168, 183, 179, 16, 105, 125, 190, 116, 165, 80, 64, 170, 140, 171, 173, 97, 60, 43, 123, 71, 182, 167, 95, 145, 141, 187, 166, 87, 143, 15, 74, 111, 157, 32, 172, 18, 57, 35, 191, 27, 47, 21, 6, 19, 155, 42, 120, 180, 37, 28, 91, 108, 7.

FIG. 153 is a diagram illustrating Example 34 of a GW pattern for an LDPC code with a code length N of 69120 bits.

According to the GW pattern of FIG. 153, the arrangement of bit groups 0 to 191 of the 69120-bit LDPC code is interleaved into an arrangement of a bit group
139, 112, 159, 99, 87, 70, 175, 161, 51, 56, 174, 143, 12, 36, 77, 60, 155, 167, 160, 73, 127, 82, 123, 145, 8, 76, 164, 178, 144, 86, 7, 124, 27, 187, 130, 162, 191, 182, 16, 106, 141, 38, 72, 179, 111, 29, 59, 183, 66, 52, 43, 121, 20, 11, 190, 92, 55, 166, 94, 138, 1, 122, 171, 119, 109, 58, 23, 31, 163, 53, 13, 188, 100, 158, 156, 136, 34, 118, 185, 10, 25, 126, 104, 30, 83, 47, 146, 63, 134, 39, 21, 44, 151, 28, 22, 79, 110, 71, 90, 2, 103, 42, 35, 5, 57, 4, 0, 107, 37, 54, 18, 128, 148, 129, 26, 75, 120, 19, 116, 117, 147, 114, 48, 96, 61, 46, 88, 67, 135, 65, 180, 9, 74, 176, 6, 149, 49, 50, 125, 64, 169, 168, 157, 153, 24, 108, 89, 98, 33, 132, 93, 40, 154, 62, 142, 41, 69, 105, 189, 115, 152, 45, 133, 3, 95, 17, 186, 184, 85, 165, 32, 173, 113, 172, 78, 181, 150, 170, 102, 97, 140, 81, 91, 15, 137, 101, 80, 68, 14, 177, 131, 84.

FIG. 154 is a diagram illustrating Example 35 of a GW pattern for an LDPC code with a code length N of 69120 bits.

According to the GW pattern of FIG. 154, the arrangement of bit groups 0 to 191 of the 69120-bit LDPC code is interleaved into an arrangement of a bit group
21, 20, 172, 86, 178, 25, 104, 133, 17, 106, 191, 68, 80, 190, 129, 29, 125, 108, 147, 23, 94, 167, 27, 61, 12, 166, 131, 120, 159, 28, 7, 62, 134, 59, 78, 0, 121, 149, 6, 5, 143, 171, 153, 161, 186, 35, 92, 113, 55, 163, 16, 54, 93, 79, 37, 44, 75, 182, 127, 148, 179, 95, 169, 141, 38, 168, 128, 56, 31, 57, 175, 140, 164, 24, 177, 88, 51, 112, 49, 185, 170, 87, 32, 60, 65, 77, 89, 3, 18, 116, 184, 45, 109, 53, 160, 9, 100, 8, 111, 69, 189, 36, 173, 33, 72, 144, 183, 115, 137, 98, 90, 142, 30, 154, 180, 122, 155, 130, 83, 138, 14, 41, 150, 132, 70, 152, 117, 11, 4, 124, 15, 42, 181, 58, 10, 22, 145, 99, 126, 107, 66, 174, 39, 13, 97, 63, 123, 84, 85, 67, 76, 158, 71, 46, 118, 81, 162, 146, 135, 2, 73, 50, 114, 82, 103, 188, 74, 101, 157, 151, 91, 119, 102, 48, 1, 40, 43, 64, 156, 34, 110, 52, 96, 136, 139, 165, 19, 176, 187, 47, 26, 105.

FIG. 155 is a diagram illustrating Example 36 of a GW pattern for an LDPC code with a code length N of 69120 bits.

According to the GW pattern of FIG. 155, the arrangement of bit groups 0 to 191 of the 69120-bit LDPC code is interleaved into an arrangement of a bit group
160, 7, 29, 39, 110, 189, 140, 143, 163, 130, 173, 71, 191, 106, 60, 62, 149, 135, 9, 147, 124, 152, 55, 116, 85, 112, 14, 20, 79, 103, 156, 167, 19, 45, 73, 26, 159, 44, 86, 76, 56, 12, 109, 117, 128, 67, 150, 151, 31, 27, 133, 17, 120, 153, 108, 180, 52, 187, 98, 63, 176, 186, 179, 113, 161, 32, 24, 111, 41, 95, 38, 10, 154, 97, 141, 2, 127, 40, 105, 34, 11, 185, 155, 61, 114, 74, 158, 162, 5, 177, 43, 51, 148, 137, 28, 181, 171, 13, 104, 42, 168, 93, 172, 144, 80, 123, 89, 81, 68, 75, 78, 121, 53, 65, 122, 142, 157, 107, 136, 66, 90, 23, 8, 1, 77, 54, 125, 174, 35, 88, 82, 134, 101, 131, 33, 50, 87, 36, 15, 47, 83, 18, 6, 21, 30, 94, 72, 145, 138, 184, 69, 84, 58, 49, 16, 48, 70, 183, 3, 92, 25, 115, 0, 182, 139, 91, 146, 102, 96, 100, 119, 129, 178, 46, 37, 57, 118, 126, 59, 165, 170, 190, 188, 175, 166, 99, 4, 22, 132, 164, 64, 169.

FIG. 156 is a diagram illustrating Example 37 of a GW pattern for an LDPC code with a code length N of 69120 bits.

According to the GW pattern of FIG. 156, the arrangement of bit groups 0 to 191 of the 69120-bit LDPC code is interleaved into an arrangement of a bit group
167, 97, 86, 166, 11, 57, 187, 169, 104, 102, 108, 63, 12, 181, 1, 71, 134, 152, 45, 144, 124, 22, 0, 51, 100, 150, 179, 54, 66, 79, 25, 172, 59, 48, 23, 55, 64, 185, 164, 123, 56, 80, 153, 9, 177, 176, 81, 17, 14, 43, 76, 27, 175, 60, 133, 91, 61, 41, 111, 163, 72, 95, 84, 67, 129, 52, 88, 121, 7, 49, 168, 154, 74, 138, 142, 158, 132, 127, 40, 139, 20, 44, 6, 128, 75, 114, 119, 2, 8, 157, 98, 118, 89, 46, 160, 190, 5, 165, 28, 68, 189, 161, 112, 173, 148, 183, 33, 131, 105, 186, 156, 70, 117, 170, 174, 36, 19, 135, 125, 122, 50, 113, 141, 37, 38, 31, 94, 149, 78, 32, 178, 34, 107, 13, 182, 146, 93, 10, 106, 109, 4, 77, 87, 3, 184, 83, 30, 180, 96, 15, 155, 110, 145, 191, 151, 101, 65, 99, 115, 140, 26, 147, 42, 136, 137, 18, 53, 116, 171, 16, 21, 92, 162, 130, 85, 69, 47, 35, 82, 120, 24, 73, 39, 58, 62, 126, 29, 90, 143, 159, 188, 103.

FIG. 157 is a diagram illustrating Example 38 of a GW pattern for an LDPC code with a code length N of 69120 bits.

According to the GW pattern of FIG. 157, the arrangement of bit groups 0 to 191 of the 69120-bit LDPC code is interleaved into an arrangement of a bit group
74, 151, 79, 49, 174, 180, 133, 106, 116, 16, 163, 62, 164, 45, 187, 128, 176, 2, 126, 136, 63, 28, 118, 173, 19, 46, 93, 121, 162, 88, 0, 147, 131, 54, 117, 138, 69, 182, 68, 143, 78, 15, 7, 59, 109, 32, 10, 179, 165, 90, 73, 71, 171, 135, 123, 125, 31, 22, 70, 185, 155, 60, 120, 113, 41, 154, 177, 85, 64, 55, 26, 129, 84, 38, 166, 44, 30, 183, 189, 191, 124, 77, 80, 98, 190, 167, 140, 52, 153, 43, 25, 188, 103, 152, 137, 76, 149, 34, 172, 122, 40, 168, 141, 96, 142, 58, 110, 65, 9, 36, 42, 50, 184, 105, 156, 127, 8, 61, 146, 169, 181, 5, 87, 150, 91, 17, 18, 24, 112, 81, 170, 95, 29, 100, 130, 48, 159, 72, 75, 160, 27, 108, 148, 66, 144, 97, 57, 115, 114, 1, 132, 4, 21, 92, 11, 107, 175, 67, 145, 14, 186, 20, 51, 39, 3, 86, 89, 47, 53, 102, 82, 139, 23, 104, 157, 99, 158, 12, 161, 35, 178, 37, 134, 83, 94, 101, 111, 119, 6, 33, 13, 56.

FIG. 158 is a diagram illustrating Example 39 of a GW pattern for an LDPC code with a code length N of 69120 bits.

According to the GW pattern of FIG. 158, the arrangement of bit groups 0 to 191 of the 69120-bit LDPC code is interleaved into an arrangement of a bit group 20, 118, 185, 106, 82, 53, 41, 40, 121, 180, 45, 10, 145, 175, 191, 160, 177, 172, 13, 29, 133, 42, 89, 51, 141, 99, 7, 134, 52, 48, 169, 162, 124, 25, 165, 128, 95, 148, 98, 171, 14, 75, 59, 26, 76, 47, 34, 122, 69, 131, 105, 60, 132, 63, 81, 109, 43, 189, 19, 186, 79, 62, 85, 54, 16, 46, 27, 44, 139, 113, 11, 102, 130, 184, 119, 1, 152, 146, 37, 178, 61, 150, 32, 163, 92, 166, 142, 67, 140, 157, 188, 18, 87, 149, 65, 183, 161, 5, 31, 71, 173, 73, 15, 138, 156, 28, 66, 170, 179, 135, 86, 39, 104, 17, 154, 174, 56, 153, 0, 97, 9, 72, 23, 167, 190, 80, 3, 38, 120, 4, 24, 159, 12, 103, 22, 125, 83, 50, 6, 77, 168, 74, 93, 49, 57, 147, 2, 155, 181, 96, 114, 107, 110, 30, 117, 127, 101, 94, 129, 35, 58, 70, 126, 182, 151, 111, 91, 64, 88, 144, 137, 143, 176, 84, 136, 8, 112, 123, 164, 115, 78, 36, 90, 100, 55, 108, 21, 158, 68, 33, 116, 187.

FIG. 159 is a diagram illustrating Example 40 of a GW pattern for an LDPC code with a code length N of 69120 bits.

According to the GW pattern of FIG. 159, the arrangement of bit groups 0 to 191 of the 69120-bit LDPC code is interleaved into an arrangement of a bit group 42, 43, 190, 119, 183, 103, 51, 28, 171, 20, 18, 25, 85, 22, 157, 99, 174, 5, 53, 62, 150, 128, 38, 153, 37, 148, 39, 24, 118, 102, 184, 49, 111, 48, 87, 76, 81, 40, 55, 82, 70, 105, 66, 115, 14, 86, 88, 135, 168, 139, 56, 80, 93, 95, 165, 13, 4, 100, 29, 104, 11, 72, 116, 83, 112, 67, 186, 169, 8, 57, 44, 17, 164, 31, 96, 84, 2, 125, 59, 3, 6, 173, 149, 78, 27, 160, 156, 187, 34, 129, 154, 79, 52, 117, 110, 0, 7, 113, 137, 26, 47, 12, 178, 46, 136, 97, 15, 188, 101, 58, 35, 71, 32, 16, 109, 163, 134, 75, 68, 98, 132, 90, 124, 189, 121, 123, 170, 158, 159, 77, 108, 63, 180, 36, 74, 127, 21, 146, 147, 54, 155, 10, 144, 130, 60, 1, 141, 23, 177, 133, 50, 126, 167, 151, 161, 191, 91, 114, 162, 30, 181, 182, 9, 94, 69, 176, 65, 142, 152, 175, 73, 140, 41, 179, 172, 145, 64, 19, 138, 131, 166, 33, 107, 185, 106, 122, 120, 92, 45, 143, 61, 89.

FIG. 160 is a diagram illustrating Example 41 of a GW pattern for an LDPC code with a code length N of 69120 bits.

According to the GW pattern of FIG. 160, the arrangement of bit groups 0 to 191 of the 69120-bit LDPC code is interleaved into an arrangement of a bit group 111, 33, 21, 133, 18, 30, 73, 139, 125, 35, 77, 105, 122, 91, 41, 86, 11, 8, 55, 71, 151, 107, 45, 12, 168, 51, 50, 59, 7, 132, 144, 16, 190, 31, 108, 89, 124, 110, 94, 67, 159, 46, 140, 87, 54, 142, 185, 85, 84, 120, 178, 101, 180, 20, 174, 47, 28, 145, 70, 24, 131, 4, 83, 56, 79, 37, 27, 109, 92, 52, 96, 177, 141, 188, 155, 38, 156, 169, 136, 81, 137, 112, 95, 93, 106, 149, 138, 15, 39, 170, 146, 103, 184, 43, 5, 9, 189, 34, 19, 63, 90, 36, 23, 78, 100, 75, 162, 42, 161, 119, 64, 65, 152, 62, 173, 104, 88, 118, 48, 44, 40, 60, 102, 61, 74, 99, 53, 10, 6, 172, 186, 163, 134, 14, 148, 3, 26, 1, 157, 150, 25, 123, 115, 116, 57, 175, 127, 82, 117, 114, 160, 164, 153, 176, 76, 13, 181, 68, 128, 0, 183, 49, 22, 166, 17, 191, 135, 165, 72, 158, 130, 154, 167, 66, 2, 147, 69, 58, 98, 97, 143, 32, 29, 179, 113, 80, 182, 129, 126, 171, 121, 187.

FIG. 161 is a diagram illustrating Example 42 of a GW pattern for an LDPC code with a code length N of 69120 bits.

According to the GW pattern of FIG. 161, the arrangement of bit groups 0 to 191 of the 69120-bit LDPC code is interleaved into an arrangement of a bit group 148, 32, 94, 31, 146, 15, 41, 7, 79, 58, 52, 167, 154, 4, 161, 38, 64, 127, 131, 78, 34, 125, 171, 173, 133, 122, 50, 95, 129, 57, 71, 37, 137, 69, 82, 107, 26, 10, 140, 156, 47, 178, 163, 117, 139, 174, 143, 138, 111, 11, 166, 43, 141, 114, 45, 39, 177, 103, 96, 123, 63, 23, 18, 20, 187, 27, 66, 130, 65, 142, 5, 135, 113, 90, 121, 54, 190, 134, 153, 147, 92, 157, 3, 97, 102, 106, 172, 91, 46, 89, 56, 184, 115, 99, 62, 93, 100, 88, 152, 109, 124, 182, 70, 74, 159, 165, 60, 183, 185, 164, 175, 108, 176, 2, 118, 72, 151, 0, 51, 33, 28, 80, 14, 128, 179, 84, 77, 42, 55, 160, 119, 110, 86, 22, 101, 13, 170, 36, 104, 189, 191, 169, 112, 12, 29, 30, 162, 136, 24, 68, 9, 81, 120, 145, 180, 144, 73, 21, 44, 1, 16, 67, 19, 158, 188, 181, 61, 35, 8, 53, 168, 150, 105, 59, 87, 6, 126, 75, 85, 17, 83, 98, 48, 132, 40, 76, 49, 25, 149, 186, 155, 116.

FIG. 162 is a diagram illustrating Example 43 of a GW pattern for an LDPC code with a code length N of 69120 bits.

According to the GW pattern of FIG. 162, the arrangement of bit groups 0 to 191 of the 69120-bit LDPC code is interleaved into an arrangement of a bit group 161, 38, 41, 138, 20, 24, 14, 35, 32, 179, 68, 97, 94, 142, 43, 53, 22, 28, 44, 81, 148, 187, 169, 89, 115, 144, 75, 40, 31, 152, 30, 124, 80, 135, 160, 8, 129, 147, 60, 112, 171, 0, 133, 100, 156, 180, 77, 110, 151, 69, 95, 25, 117, 127, 154, 64, 146, 143, 29, 168, 177, 183, 126, 10, 26, 3, 50, 92, 164, 163, 11, 109, 21, 37, 84, 122, 49, 71, 52, 15, 88, 149, 86, 61, 90, 155, 162, 9, 153, 67, 119, 189, 82, 131, 190, 4, 46, 118, 47, 178, 59, 150, 186, 123, 18, 79, 57, 120, 70, 62, 137, 23, 185, 167, 175, 16, 134, 73, 139, 166, 55, 165, 116, 76, 99, 182, 78, 93, 141, 33, 176, 101, 130, 58, 12, 17, 132, 45, 102, 7, 19, 145, 54, 91, 113, 36, 27, 114, 174, 39, 83, 140, 191, 74, 56, 87, 48, 158, 121, 159, 136, 63, 181, 34, 173, 103, 42, 125, 104, 107, 96, 65, 1, 13, 157, 184, 170, 105, 188, 108, 6, 2, 98, 72, 5, 66, 128, 106, 172, 111, 85, 51.

FIG. 163 is a diagram illustrating Example 44 of a GW pattern for an LDPC code with a code length N of 69120 bits.

According to the GW pattern of FIG. 163, the arrangement of bit groups 0 to 191 of the 69120-bit LDPC code is interleaved into an arrangement of a bit group 57, 73, 173, 63, 179, 186, 148, 181, 160, 163, 4, 109, 137, 99, 118, 15, 5, 115, 44, 153, 185, 40, 12, 169, 2, 37, 188, 97, 65, 67, 117, 90, 66, 135, 154, 159, 146, 86, 61, 182, 59, 83, 91, 175, 58, 138, 93, 43, 98, 22, 152, 96, 45, 120, 180, 10, 116, 170, 162, 68, 3, 13, 41, 131, 21, 172, 55, 24, 1, 79, 106, 189, 52, 184, 112, 53, 136, 166, 29, 62, 107, 128, 71, 111, 187, 161, 101, 49, 155, 28, 94, 70, 48, 0, 33, 157, 151, 25, 89, 88, 114, 134, 75, 87, 142, 6, 27, 64, 69, 19, 150, 38, 35, 130, 127, 76, 102, 123, 158, 129, 133, 110, 141, 95, 7, 126, 85, 108, 174, 190, 165, 156, 171, 54, 17, 121, 103, 14, 36, 105, 82, 8, 178, 51, 23, 84, 167, 30, 100, 42, 72, 149, 92, 77, 104, 183, 39, 125, 80, 143, 144, 56, 119, 16, 132, 139, 191, 50, 164, 122, 46, 140, 31, 176, 60, 26, 32, 11, 177, 124, 74, 145, 20, 34, 18, 81, 168, 9, 78, 113, 147, 47.

FIG. 164 is a diagram illustrating Example 45 of a GW pattern for an LDPC code with a code length N of 69120 bits.

According to the GW pattern of FIG. 164, the arrangement of bit groups 0 to 191 of the 69120-bit LDPC code is interleaved into an arrangement of a bit group 89, 123, 13, 47, 178, 159, 1, 190, 53, 12, 57, 109, 115, 19, 36, 143, 82, 96, 163, 66, 154, 173, 49, 65, 131, 2, 78, 15, 155, 90, 38, 130, 63, 188, 138, 184, 166, 102, 139, 28, 50, 186, 17, 20, 112, 41, 11, 8, 59, 79, 45, 162, 146, 40, 43, 129, 119, 18, 157, 37, 126, 124, 110, 191, 85, 165, 60, 142, 135, 74, 187, 179, 141, 164, 34, 69, 26, 33, 113, 120, 95, 169, 30, 0, 175, 70, 91, 104, 140, 25, 132, 23, 105, 158, 171, 6, 121, 56, 22, 127, 54, 68, 107, 133, 84, 81, 150, 99, 73, 185, 67, 29, 151, 87, 10, 167, 148, 72, 147, 5, 31, 125, 145, 4, 52, 44, 134, 83, 46, 75, 152, 62, 7, 86, 172, 180, 111, 61, 9, 58, 14, 116, 92, 170, 93, 77, 88, 42, 21, 106, 97, 144, 182, 108, 55, 94, 122, 114, 153, 64, 24, 80, 117, 3, 177, 149, 76, 128, 136, 39, 181, 160, 103, 174, 156, 27, 183, 16, 137, 101, 161, 176, 35, 118, 98, 168, 48, 100, 71, 189, 32, 51.

FIG. 165 is a diagram illustrating Example 46 of a GW pattern for an LDPC code with a code length N of 69120 bits.

According to the GW pattern of FIG. 165, the arrangement of bit groups 0 to 191 of the 69120-bit LDPC code is interleaved into an arrangement of a bit group 116, 157, 105, 191, 110, 149, 0, 186, 88, 165, 141, 179, 160, 121, 35, 170, 97, 7, 181, 31, 130, 123, 184, 34, 101, 167, 68, 135, 18, 91, 159, 81, 53, 36, 164, 139, 61, 162, 79, 4, 176, 127, 42, 148, 147, 150, 55, 109, 132, 124, 9, 66, 14, 128, 134, 27, 29, 59, 153, 22, 120, 13, 187, 112, 69, 163, 11, 70, 58, 15, 25, 102, 188, 182, 156, 20, 17, 10, 32, 76, 5, 28, 46, 166, 140, 143, 65, 63, 107, 119, 87, 145, 62, 108, 189, 114, 71, 78, 122, 93, 37, 12, 137, 118, 56, 67, 98, 113, 173, 169, 39, 51, 177, 1, 84, 40, 158, 2, 144, 73, 43, 82, 92, 16, 133, 129, 99, 86, 57, 47, 183, 171, 131, 33, 26, 168, 155, 178, 175, 64, 52, 100, 142, 90, 8, 106, 45, 19, 24, 80, 146, 136, 125, 95, 172, 104, 154, 138, 6, 85, 94, 74, 151, 44, 174, 115, 185, 89, 23, 190, 111, 72, 180, 54, 77, 75, 117, 126, 49, 103, 48, 60, 83, 3, 21, 50, 161, 30, 96, 152, 41, 38.

FIG. 166 is a diagram illustrating Example 47 of a GW pattern for an LDPC code with a code length N of 69120 bits.

According to the GW pattern of FIG. 166, the arrangement of bit groups 0 to 191 of the 69120-bit LDPC code is interleaved into an arrangement of a bit group 115, 167, 98, 128, 174, 73, 109, 79, 40, 6, 190, 113, 158, 56, 183, 61, 134, 13, 32, 133, 173, 1, 76, 151, 147, 70, 155, 77, 51, 150, 146, 12, 186, 33, 74, 171, 53, 11, 17, 68, 136, 9, 181, 91, 125, 161, 42, 124, 72, 96, 101, 81, 84, 107, 63, 55, 65, 5, 163, 157, 135, 18, 130, 120, 87, 85, 47, 187, 3, 46, 49, 112, 159, 188, 169, 127, 78, 25, 83, 45, 143, 182, 59, 36, 19, 110, 39, 43, 35, 15, 90, 180, 82, 145, 48, 34, 144, 178, 177, 86, 27, 103, 94, 62, 170, 57, 154, 166, 54, 164, 20, 185, 29, 2, 16, 60, 37, 75, 10, 162, 116, 92, 71, 106, 105, 175, 44, 108, 50, 26, 7, 176, 38, 99, 4, 122, 52, 66, 0, 140, 184, 24, 80, 97, 23, 114, 30, 126, 148, 64, 119, 165, 137, 123, 95, 111, 160, 8, 153, 149, 172, 121, 129, 28, 104, 156, 100, 189, 14, 138, 88, 118, 139, 93, 191, 31, 131, 179, 152, 89, 22, 41, 168, 117, 21, 69, 132, 102, 58, 67, 142, 141.

FIG. 167 is a diagram illustrating Example 48 of a GW pattern for an LDPC code with a code length N of 69120 bits.

According to the GW pattern of FIG. 167, the arrangement of bit groups 0 to 191 of the 69120-bit LDPC code is interleaved into an arrangement of a bit group 31, 178, 143, 125, 159, 168, 34, 127, 158, 157, 21, 124, 153, 162, 59, 156, 165, 40, 108, 43, 98, 119, 33, 13, 175, 166, 117, 25, 63, 111, 74, 1, 38, 169, 131, 100, 164, 0, 171, 101, 151, 113, 20, 185, 17, 86, 146, 11, 12, 19, 145, 85, 3, 80, 133, 93, 10, 72, 152, 172, 140, 45, 115, 79, 161, 39, 99, 5, 37, 110, 155, 170, 123, 70, 52, 81, 65, 160, 132, 103, 9, 88, 15, 130, 71, 129, 177, 128, 121, 150, 36, 35, 163, 83, 142, 105, 48, 64, 82, 46, 148, 138, 147, 149, 27, 56, 47, 50, 42, 54, 182, 23, 97, 89, 167, 141, 75, 32, 118, 44, 96, 66, 73, 190, 181, 191, 92, 53, 87, 176, 102, 144, 28, 134, 77, 184, 189, 67, 187, 174, 49, 94, 68, 18, 186, 26, 120, 62, 136, 24, 4, 16, 61, 179, 106, 95, 135, 41, 173, 154, 78, 2, 22, 139, 76, 58, 90, 137, 114, 126, 51, 84, 14, 91, 183, 180, 112, 122, 30, 29, 69, 107, 116, 55, 8, 104, 6, 60, 57, 7, 109, 188.

FIG. 168 is a diagram illustrating Example 49 of a GW pattern for an LDPC code with a code length N of 69120 bits.

According to the GW pattern of FIG. 168, the arrangement of bit groups 0 to 191 of the 69120-bit LDPC code is interleaved into an arrangement of a bit group 36, 20, 126, 165, 181, 59, 90, 186, 191, 120, 182, 170, 171, 137, 62, 84, 146, 106, 64, 129, 56, 136, 57, 108, 190, 74, 70, 10, 68, 139, 35, 104, 63, 16, 19, 66, 1, 15, 61, 97, 172, 72, 26, 141, 80, 151, 138, 156, 46, 82, 95, 142, 77, 76, 17, 102, 92, 60, 148, 99, 140, 2, 78, 145, 29, 174, 32, 103, 3, 133, 163, 23, 150, 155, 44, 185, 65, 134, 184, 11, 38, 119, 117, 167, 79, 5, 130, 94, 33, 157, 154, 109, 30, 31, 160, 96, 49, 178, 110, 128, 166, 7, 162, 48, 34, 55, 22, 143, 149, 121, 89, 114, 176, 107, 67, 73, 51, 53, 132, 83, 158, 69, 153, 180, 188, 101, 37, 179, 111, 71, 147, 189, 124, 43, 86, 98, 91, 45, 135, 168, 183, 42, 27, 81, 152, 164, 58, 100, 25, 4, 13, 144, 112, 122, 159, 187, 52, 85, 50, 9, 87, 127, 169, 173, 14, 93, 116, 175, 177, 24, 40, 0, 28, 12, 161, 105, 41, 75, 123, 39, 125, 18, 54, 6, 131, 118, 115, 88, 8, 113, 21, 47.

FIG. 169 is a diagram illustrating Example 50 of a GW pattern for an LDPC code with a code length N of 69120 bits.

According to the GW pattern of FIG. 169, the arrangement of bit groups 0 to 191 of the 69120-bit LDPC code is interleaved into an arrangement of a bit group 12, 183, 40, 66, 35, 155, 137, 58, 108, 93, 47, 78, 56, 122, 51, 114, 10, 164, 148, 190, 53, 76, 75, 11, 46, 2, 174, 146, 119, 170, 98, 22, 116, 28, 67, 63, 59, 154, 94, 105, 187, 9, 97, 166, 19, 125, 189, 185, 178, 115, 123, 150, 60, 77, 86, 69, 26, 145, 143, 134, 124, 111, 162, 141, 80, 34, 138, 130, 45, 33, 127, 37, 91, 84, 102, 13, 16, 172, 61, 182, 57, 55, 101, 142, 117, 87, 131, 188, 191, 113, 39, 54, 74, 72, 29, 48, 161, 139, 151, 180, 1, 160, 103, 173, 15, 52, 186, 133, 71, 132, 31, 135, 70, 81, 24, 112, 6, 175, 96, 3, 79, 156, 109, 8, 153, 90, 177, 49, 99, 128, 21, 7, 158, 89, 92, 126, 32, 121, 100, 88, 163, 136, 20, 83, 17, 42, 95, 129, 118, 43, 157, 50, 5, 179, 140, 147, 62, 38, 176, 149, 159, 44, 106, 152, 65, 14, 168, 184, 0, 107, 167, 36, 73, 110, 165, 120, 104, 23, 25, 82, 27, 41, 181, 169, 85, 144, 4, 18, 171, 30, 68, 64.

FIG. 170 is a diagram illustrating Example 51 of a GW pattern for an LDPC code with a code length N of 69120 bits.

According to the GW pattern in FIG. 170, the arrangement of bit groups 0 to 191 of the 69120-bit LDPC code is interleaved into an arrangement of a bit group 140, 166, 22, 87, 107, 121, 66, 80, 85, 109, 45, 13, 144, 63, 0, 52, 131, 122, 135, 173, 105, 98, 117, 168, 8, 123, 157, 93, 129, 37, 119, 143, 40, 59, 162, 21, 79, 102, 34, 36, 32, 41, 177, 48, 83, 94, 191, 78, 101, 155, 160, 189, 77, 57, 11, 148, 124, 65, 187, 110, 100, 114, 67, 150, 82, 156, 43, 5, 1, 126, 46, 167, 149, 72, 31, 161, 23, 113, 137, 132, 35, 76, 26, 61, 141, 15, 4, 25, 17, 182, 92, 29, 27, 73, 170, 53, 64, 127, 112, 171, 56, 106, 186, 183, 95, 165, 10, 103, 74, 84, 116, 20, 185, 6, 133, 147, 75, 62, 14, 142, 44, 181, 146, 164, 128, 9, 60, 50, 91, 88, 97, 145, 28, 7, 118, 99, 115, 39, 125, 136, 180, 179, 96, 175, 3, 47, 158, 172, 154, 138, 176, 33, 81, 134, 120, 174, 151, 49, 30, 108, 68, 38, 153, 2, 69, 111, 54, 130, 71, 24, 58, 178, 19, 42, 51, 190, 89, 16, 90, 169, 70, 18, 86, 184, 12, 188, 163, 55, 139, 104, 152, 159.

FIG. 171 is a diagram illustrating Example 52 of a GW pattern for an LDPC code with a code length N of 69120 bits.

According to the GW pattern of FIG. 171, the arrangement of bit groups 0 to 191 of the 69120-bit LDPC code is interleaved into an arrangement of a bit group 128, 120, 91, 121, 189, 30, 127, 35, 76, 26, 144, 45, 178, 93, 14, 31, 123, 155, 19, 28, 152, 174, 177, 168, 56, 169, 95, 7, 96, 133, 136, 146, 172, 187, 90, 44, 98, 150, 40, 20, 104, 191, 37, 61, 42, 43, 27, 159, 163, 100, 164, 151, 111, 102, 165, 132, 138, 180, 22, 70, 184, 62, 167, 134, 60, 160, 175, 157, 153, 77, 87, 185, 116, 115, 176, 78, 5, 39, 88, 33, 126, 13, 71, 188, 171, 135, 21, 16, 143, 51, 99, 182, 85, 129, 162, 66, 0, 55, 73, 117, 75, 181, 179, 53, 170, 1, 125, 69, 80, 83, 57, 38, 103, 109, 137, 63, 74, 9, 15, 118, 67, 2, 113, 124, 114, 6, 154, 141, 50, 149, 4, 46, 8, 130, 94, 34, 23, 54, 145, 81, 58, 82, 139, 156, 108, 140, 166, 36, 183, 110, 101, 161, 84, 119, 92, 3, 142, 186, 158, 173, 147, 49, 10, 32, 65, 89, 86, 131, 18, 47, 107, 79, 72, 25, 68, 122, 29, 11, 41, 190, 59, 52, 97, 148, 12, 24, 105, 17, 106, 48, 64, 112.

FIG. 172 is a diagram illustrating Example 53 of a GW pattern for an LDPC code with a code length N of 69120 bits.

According to the GW pattern of FIG. 172, the arrangement of bit groups 0 to 191 of the 69120-bit LDPC code is interleaved into an arrangement of a bit group 36, 180, 61, 100, 163, 168, 14, 24, 105, 104, 131, 56, 40, 73, 165, 157, 126, 47, 160, 181, 166, 161, 1, 81, 58, 182, 189, 177, 85, 17, 13, 46, 171, 149, 91, 79, 109, 133, 164, 125, 52, 77, 118, 186, 107, 150, 135, 33, 130, 87, 167, 158, 23, 83, 152, 114, 68, 12, 132, 178, 106, 184, 176, 72, 31, 53, 21, 110, 76, 146, 4, 18, 113, 65, 34, 179, 111, 185, 84, 144, 27, 39, 151, 50, 69, 30, 169, 175, 9, 42, 54, 43, 90, 22, 139, 129, 170, 115, 45, 140, 67, 25, 155, 82, 102, 29, 188, 108, 15, 80, 128, 48, 0, 64, 141, 93, 191, 190, 174, 32, 35, 119, 159, 41, 55, 162, 49, 59, 88, 156, 123, 136, 28, 60, 26, 16, 89, 147, 92, 98, 38, 20, 173, 71, 44, 94, 5, 7, 99, 75, 122, 120, 66, 121, 112, 62, 8, 137, 142, 103, 116, 117, 37, 63, 70, 86, 10, 74, 95, 11, 134, 154, 51, 101, 127, 183, 57, 97, 78, 148, 6, 172, 3, 138, 145, 153, 143, 19, 2, 96, 187, 124.

FIG. 173 is a diagram illustrating Example 54 of a GW pattern for an LDPC code with a code length N of 69120 bits.

According to the GW pattern of FIG. 173, the arrangement of bit groups 0 to 191 of the 69120-bit LDPC code is interleaved into an arrangement of a bit group 92, 83, 138, 67, 27, 88, 13, 26, 73, 16, 187, 18, 76, 28, 79, 130, 91, 58, 140, 38, 6, 43, 17, 168, 141, 96, 70, 147, 112, 164, 97, 161, 139, 65, 78, 95, 146, 3, 32, 158, 24, 0, 94, 120, 176, 128, 59, 81, 21, 102, 190, 8, 114, 113, 29, 45, 103, 56, 54, 173, 177, 12, 174, 108, 169, 148, 123, 129, 150, 77, 157, 184, 61, 127, 121, 156, 104, 111, 68, 160, 107, 117, 124, 84, 35, 10, 90, 106, 144, 66, 64, 15, 46, 125, 44, 37, 20, 135, 53, 71, 152, 183, 162, 50, 167, 11, 142, 149, 131, 191, 166, 31, 185, 134, 19, 178, 52, 188, 2, 75, 110, 145, 41, 159, 136, 100, 9, 62, 60, 34, 116, 23, 42, 105, 40, 118, 186, 4, 5, 182, 170, 87, 1, 22, 55, 126, 63, 14, 25, 153, 98, 49, 33, 69, 179, 171, 93, 36, 133, 57, 151, 82, 72, 163, 86, 47, 119, 48, 99, 30, 189, 115, 165, 101, 80, 175, 132, 89, 39, 181, 85, 51, 154, 137, 7, 180, 155, 74, 109, 122, 172, 143.

FIG. 174 is a diagram illustrating Example 55 of a GW pattern for an LDPC code with a code length N of 69120 bits.

According to the GW pattern of FIG. 174, the arrangement of bit groups 0 to 191 of the 69120-bit LDPC code is interleaved into an arrangement of a bit group 52, 117, 42, 131, 45, 120, 44, 63, 91, 0, 33, 176, 95, 36, 134, 170, 148, 32, 130, 20, 124, 51, 152, 96, 92, 90, 184, 103, 53, 14, 110, 80, 107, 145, 181, 137, 61, 149, 114, 126, 136, 161, 58, 162, 88, 8, 171, 178, 174, 94, 118, 19, 35, 1, 191, 115, 23, 10, 150, 67, 46, 56, 172, 129, 109, 98, 89, 68, 101, 121, 78, 182, 12, 173, 128, 77, 168, 156, 186, 165, 39, 187, 5, 158, 104, 2, 49, 154, 59, 82, 65, 30, 127, 17, 113, 164, 179, 34, 69, 189, 123, 147, 183, 21, 163, 143, 57, 100, 28, 185, 25, 140, 13, 66, 141, 62, 47, 54, 169, 106, 38, 86, 116, 151, 41, 4, 75, 108, 85, 153, 72, 125, 22, 135, 50, 70, 74, 11, 76, 138, 132, 55, 167, 40, 144, 31, 142, 37, 29, 99, 83, 26, 119, 64, 27, 9, 15, 97, 73, 133, 79, 190, 111, 43, 48, 102, 7, 139, 84, 24, 112, 177, 16, 180, 175, 81, 3, 60, 18, 188, 93, 105, 157, 87, 166, 159, 155, 122, 146, 6, 160, 71.

FIG. 175 is a diagram illustrating Example 56 of a GW pattern for an LDPC code with a code length N of 69120 bits.

According to the GW pattern of FIG. 175, the arrangement of bit groups 0 to 191 of the 69120-bit LDPC code is interleaved into an arrangement of a bit group 60, 117, 182, 104, 53, 26, 11, 121, 71, 32, 179, 34, 38, 145, 166, 65, 137, 7, 124, 58, 90, 29, 144, 116, 91, 88, 98, 161, 83, 177, 85, 154, 146, 178, 123, 76, 75, 3, 64, 151, 99, 118, 57, 106, 16, 61, 162, 19, 12, 94, 39, 93, 92, 73, 82, 138, 108, 139, 130, 163, 152, 159, 168, 189, 102, 134, 101, 66, 4, 171, 170, 188, 107, 23, 180, 35, 175, 18, 89, 181, 17, 97, 62, 56, 52, 128, 40, 25, 191, 74, 95, 143, 5, 8, 1, 132, 133, 135, 184, 33, 37, 45, 127, 122, 136, 190, 158, 72, 77, 114, 46, 55, 105, 78, 183, 103, 22, 20, 24, 155, 86, 63, 79, 164, 13, 174, 2, 14, 47, 126, 84, 165, 59, 142, 87, 153, 112, 43, 156, 50, 6, 0, 81, 51, 21, 9, 148, 111, 147, 48, 31, 36, 129, 167, 150, 70, 42, 15, 110, 119, 109, 125, 80, 27, 131, 49, 140, 187, 96, 120, 100, 141, 160, 186, 185, 68, 69, 28, 176, 169, 44, 173, 149, 54, 115, 113, 67, 10, 157, 41, 30, 172.

FIG. 176 is a diagram illustrating Example 57 of a GW pattern for an LDPC code with a code length N of 69120 bits.

According to the GW pattern of FIG. 176, the arrangement of bit groups 0 to 191 of the 69120-bit LDPC code is interleaved into an arrangement of a bit group 7, 156, 171, 76, 165, 68, 5, 72, 86, 57, 42, 98, 162, 130, 88, 31, 63, 170, 92, 100, 145, 146, 117, 62, 123, 55, 22, 138, 75, 99, 177, 83, 135, 190, 79, 84, 182, 140, 136, 0, 108, 77, 8, 154, 73, 37, 147, 14, 10, 128, 111, 168, 38, 159, 125, 32, 120, 132, 148, 27, 69, 96, 127, 103, 34, 110, 161, 41, 18, 35, 142, 116, 28, 121, 91, 112, 51, 178, 139, 95, 155, 20, 78, 33, 133, 29, 9, 54, 24, 176, 122, 3, 102, 56, 181, 175, 174, 81, 166, 30, 26, 43, 113, 137, 150, 89, 179, 70, 11, 2, 118, 183, 13, 50, 46, 12, 49, 40, 172, 17, 47, 65, 16, 74, 141, 129, 101, 48, 87, 187, 167, 134, 158, 15, 44, 53, 93, 152, 23, 126, 52, 97, 189, 36, 115, 169, 64, 25, 58, 82, 1, 45, 39, 191, 144, 173, 6, 60, 85, 149, 163, 21, 90, 4, 80, 105, 164, 180, 61, 114, 188, 151, 185, 94, 124, 104, 106, 119, 107, 160, 67, 71, 19, 131, 186, 153, 157, 66, 143, 184, 109, 59.

FIG. 177 is a diagram illustrating Example 58 of a GW pattern for an LDPC code with a code length N of 69120 bits.

According to the GW pattern of FIG. 177, the arrangement of bit groups 0 to 191 of the 69120-bit LDPC code is interleaved into an arrangement of a bit group 134, 124, 102, 133, 161, 34, 18, 17, 119, 172, 43, 25, 130, 84, 46, 167, 23, 100, 31, 121, 30, 15, 99, 127, 62, 20, 143, 103, 139, 171, 13, 42, 1, 26, 76, 159, 27, 82, 48, 146, 22, 156, 188, 69, 86, 177, 129, 160, 33, 67, 176, 148, 168, 158, 169, 0, 155, 118, 154, 110, 96, 191, 4, 36, 39, 56, 112, 14, 145, 182, 3, 88, 126, 91, 105, 174, 128, 157, 125, 74, 116, 61, 52, 187, 117, 98, 73, 95, 92, 181, 111, 65, 63, 152, 163, 147, 66, 178, 87, 179, 64, 93, 144, 83, 140, 8, 78, 2, 131, 115, 123, 47, 94, 186, 28, 68, 21, 135, 37, 151, 11, 104, 77, 81, 35, 71, 162, 97, 41, 58, 190, 101, 153, 85, 166, 7, 173, 44, 29, 10, 49, 54, 150, 32, 50, 51, 45, 183, 107, 113, 137, 80, 79, 175, 142, 141, 138, 40, 122, 75, 120, 53, 59, 60, 184, 5, 38, 6, 164, 189, 24, 16, 72, 19, 109, 106, 114, 108, 185, 165, 149, 9, 57, 170, 12, 90, 180, 89, 132, 136, 55, 70.

FIG. 178 is a diagram illustrating Example 59 of a GW pattern for an LDPC code with a code length N of 69120 bits.

According to the GW pattern of FIG. 178, the arrangement of bit groups 0 to 191 of the 69120-bit LDPC code is interleaved into an arrangement of a bit group 18, 161, 152, 30, 91, 138, 83, 88, 127, 54, 33, 46, 125, 120, 122, 169, 51, 150, 100, 52, 95, 186, 149, 81, 11, 53, 164, 130, 19, 176, 93, 107, 29, 86, 124, 65, 75, 71, 74, 68, 44, 82, 59, 104, 118, 103, 131, 101, 8, 96, 97, 119, 166, 77, 50, 34, 158, 21, 184, 24, 165, 171, 142, 36, 181, 45, 90, 175, 99, 13, 37, 10, 140, 3, 69, 16, 133, 172, 173, 27, 132, 79, 76, 111, 123, 7, 94, 70, 116, 174, 15, 156, 187, 110, 84, 185, 14, 72, 159, 143, 78, 135, 17, 12, 139, 67, 58, 151, 177, 73, 154, 145, 179, 25, 108, 148, 137, 85, 147, 61, 20, 89, 155, 183, 134, 128, 191, 26, 121, 126, 0, 141, 112, 62, 114, 48, 182, 146, 115, 64, 113, 189, 31, 1, 39, 168, 2, 43, 163, 188, 35, 129, 153, 66, 23, 40, 6, 5, 98, 56, 9, 63, 180, 157, 167, 162, 60, 42, 49, 28, 22, 80, 87, 92, 160, 55, 136, 170, 106, 117, 178, 32, 38, 105, 102, 41, 57, 109, 144, 47, 190, 4.

FIG. 179 is a diagram illustrating Example 60 of a GW pattern for an LDPC code with a code length N of 69120 bits.

According to the GW pattern of FIG. 179, the arrangement of bit groups 0 to 191 of the 69120-bit LDPC code is interleaved into an arrangement of a bit group 172, 48, 104, 60, 184, 162, 86, 185, 11, 132, 155, 50, 146, 178, 5, 28, 133, 169, 106, 90, 174, 95, 42, 10, 78, 177, 21, 112, 54, 153, 136, 12, 115, 108, 92, 152, 180, 151, 13, 62, 25, 51, 191, 84, 167, 139, 96, 111, 130, 150, 7, 143, 144, 117, 124, 27, 38, 72, 6, 128, 36, 39, 26, 156, 32, 127, 181, 122, 52, 131, 68, 140, 173, 182, 154, 190, 137, 61, 2, 138, 43, 110, 29, 116, 176, 30, 57, 189, 14, 4, 65, 80, 33, 75, 135, 20, 103, 98, 56, 179, 129, 105, 113, 71, 160, 85, 55, 0, 166, 59, 183, 142, 19, 22, 63, 125, 165, 88, 87, 93, 168, 77, 45, 69, 175, 100, 145, 31, 91, 141, 114, 157, 119, 16, 1, 34, 15, 147, 46, 188, 70, 74, 109, 126, 18, 64, 89, 134, 9, 161, 158, 44, 3, 47, 148, 187, 81, 164, 121, 35, 23, 24, 159, 82, 40, 94, 67, 163, 170, 58, 97, 8, 83, 53, 118, 149, 73, 107, 123, 79, 41, 99, 186, 101, 49, 120, 66, 76, 17, 171, 102, 37.

FIG. 180 is a diagram illustrating Example 61 of a GW pattern for an LDPC code with a code length N of 69120 bits.

According to the GW pattern of FIG. 180, the arrangement of bit groups 0 to 191 of the 69120-bit LDPC code is interleaved into an arrangement of a bit group 16, 133, 14, 114, 145, 191, 53, 80, 166, 68, 21, 184, 73, 165, 147, 89, 180, 55, 135, 94, 189, 78, 103, 115, 72, 24, 105, 188, 84, 148, 85, 32, 1, 131, 34, 134, 41, 167, 81, 54, 142, 141, 75, 155, 122, 140, 13, 17, 8, 23, 61, 49, 51, 74, 181, 162, 143, 42, 71, 123, 161, 177, 110, 149, 126, 0, 63, 178, 35, 175, 186, 52, 43, 139, 112, 10, 40, 150, 182, 164, 64, 83, 174, 38, 47, 30, 2, 116, 25, 128, 160, 144, 99, 5, 187, 176, 82, 60, 18, 185, 104, 169, 39, 183, 137, 22, 109, 96, 151, 46, 33, 29, 65, 132, 95, 31, 136, 159, 170, 168, 67, 79, 93, 111, 90, 97, 113, 92, 76, 58, 127, 26, 27, 156, 3, 6, 28, 77, 125, 173, 98, 138, 172, 86, 45, 118, 171, 62, 179, 100, 19, 163, 50, 57, 56, 36, 102, 121, 117, 154, 119, 66, 20, 91, 130, 69, 44, 70, 153, 152, 158, 88, 108, 12, 59, 4, 11, 120, 87, 101, 37, 129, 146, 9, 106, 48, 7, 15, 124, 190, 107, 157.

FIG. 181 is a diagram illustrating Example 62 of a GW pattern for an LDPC code with a code length N of 69120 bits.

According to the GW pattern of FIG. 181, the arrangement of bit groups 0 to 191 of the 69120-bit LDPC code is interleaved into an arrangement of a bit group 97, 121, 122, 73, 108, 167, 75, 156, 64, 49, 29, 18, 110, 171, 8, 27, 54, 41, 164, 15, 129, 157, 130, 111, 112, 120, 152, 12, 13, 101, 31, 69, 180, 143, 78, 125, 79, 172, 40, 116, 58, 71, 126, 55, 35, 191, 185, 159, 44, 86, 3, 80, 88, 145, 98, 144, 0, 62, 38, 150, 166, 114, 139, 60, 149, 10, 72, 155, 181, 26, 85, 128, 19, 25, 4, 170, 94, 175, 136, 117, 135, 102, 21, 89, 140, 138, 100, 33, 142, 74, 133, 56, 124, 17, 77, 65, 119, 59, 182, 105, 99, 158, 24, 96, 70, 83, 23, 81, 132, 7, 141, 61, 57, 82, 115, 162, 186, 103, 43, 148, 47, 176, 113, 151, 50, 184, 165, 109, 189, 90, 32, 20, 46, 127, 153, 161, 106, 11, 67, 36, 9, 28, 174, 160, 16, 93, 95, 6, 131, 66, 39, 14, 91, 163, 68, 48, 123, 137, 52, 5, 183, 76, 179, 22, 34, 147, 107, 168, 146, 42, 173, 53, 190, 104, 51, 118, 45, 30, 178, 134, 169, 37, 187, 177, 1, 2, 154, 87, 63, 92, 188, 84.

FIG. 182 is a diagram illustrating Example 63 of a GW pattern for an LDPC code with a code length N of 69120 bits.

According to the GW pattern of FIG. 182, the arrangement of bit groups 0 to 191 of the 69120-bit LDPC code is interleaved into an arrangement of a bit group 47, 85, 118, 136, 166, 98, 72, 163, 63, 116, 162, 169, 114, 124, 144, 110, 46, 152, 104, 88, 99, 106, 181, 109, 3, 10, 172, 107, 33, 100, 191, 75, 157, 79, 52, 128, 6, 12, 139, 30, 68, 111, 83, 5, 119, 1, 97, 56, 38, 117, 78, 80, 155, 141, 185, 20, 161, 123, 28, 180, 77, 50, 29, 64, 41, 121, 53, 36, 48, 127, 44, 22, 35, 165, 59, 147, 187, 153, 89, 154, 18, 55, 90, 69, 19, 148, 129, 188, 24, 8, 102, 151, 11, 74, 105, 81, 92, 70, 101, 7, 132, 120, 112, 145, 57, 96, 42, 45, 91, 71, 149, 164, 51, 130, 95, 140, 178, 9, 135, 34, 175, 21, 32, 25, 67, 17, 61, 58, 134, 43, 122, 2, 16, 183, 54, 86, 4, 39, 60, 184, 171, 94, 179, 13, 115, 49, 143, 158, 168, 159, 87, 73, 156, 15, 93, 125, 126, 131, 40, 66, 138, 76, 173, 65, 27, 170, 186, 182, 103, 108, 82, 37, 174, 167, 142, 26, 160, 84, 62, 190, 176, 31, 150, 189, 113, 137, 14, 23, 0, 146, 177, 133.

FIG. 183 is a diagram illustrating Example 64 of a GW pattern for an LDPC code with a code length N of 69120 bits.

According to the GW pattern of FIG. 183, the arrangement of bit groups 0 to 191 of the 69120-bit LDPC code is interleaved into an arrangement of a bit group 97, 39, 99, 33, 10, 6, 189, 179, 130, 172, 76, 185, 131, 40, 176, 159, 8, 17, 167, 116, 16, 160, 5, 174, 27, 115, 43, 41, 136, 175, 153, 144, 106, 29, 105, 84, 67, 35, 152, 191, 72, 56, 83, 168, 12, 184, 65, 146, 104, 80, 98, 79, 51, 26, 64, 137, 181, 165, 52, 129, 186, 48, 128, 154, 58, 141, 77, 187, 94, 109, 81, 119, 82, 38, 18, 188, 143, 170, 147, 2, 162, 95, 21, 11, 74, 151, 19, 59, 1, 138, 145, 7, 177, 30, 42, 44, 28, 20, 91, 14, 4, 70, 110, 31, 37, 61, 55, 85, 15, 183, 171, 96, 103, 101, 112, 161, 54, 178, 78, 87, 126, 57, 180, 88, 92, 113, 73, 90, 117, 93, 89, 122, 62, 25, 158, 148, 118, 45, 123, 60, 107, 173, 114, 166, 120, 13, 23, 139, 86, 135, 164, 47, 124, 149, 150, 46, 157, 100, 142, 0, 71, 50, 49, 36, 9, 127, 156, 75, 34, 163, 125, 190, 182, 155, 66, 69, 140, 32, 169, 132, 53, 68, 102, 63, 133, 111, 22, 134, 108, 3, 24, 121.

FIG. 184 is a diagram illustrating Example 65 of a GW pattern for an LDPC code with a code length N of 69120 bits.

According to the GW pattern of FIG. 184, the arrangement of bit groups 0 to 191 of the 69120-bit LDPC code is interleaved into an arrangement of a bit group 35, 75, 166, 145, 143, 184, 62, 96, 54, 63, 157, 103, 32, 43, 126, 187, 144, 91, 78, 44, 39, 109, 185, 102, 10, 68, 29, 42, 149, 83, 133, 94, 130, 27, 171, 19, 51, 165, 148, 28, 36, 33, 173, 136, 87, 82, 100, 49, 120, 152, 161, 162, 147, 71, 137, 57, 8, 53, 132, 151, 163, 123, 47, 92, 90, 60, 99, 79, 59, 108, 115, 72, 0, 12, 140, 160, 61, 180, 74, 37, 86, 117, 191, 101, 52, 15, 80, 156, 127, 81, 131, 141, 142, 31, 95, 4, 73, 64, 16, 18, 146, 70, 181, 7, 89, 124, 77, 67, 116, 21, 34, 41, 105, 113, 97, 2, 6, 55, 17, 65, 38, 48, 158, 159, 179, 5, 30, 183, 170, 135, 125, 20, 106, 186, 182, 188, 114, 1, 14, 3, 134, 178, 189, 167, 40, 119, 22, 190, 58, 23, 155, 138, 98, 84, 11, 110, 88, 46, 177, 175, 25, 150, 118, 121, 129, 168, 13, 128, 104, 69, 112, 169, 9, 45, 174, 93, 26, 56, 76, 50, 154, 139, 66, 85, 153, 107, 111, 172, 176, 164, 24, 122.

FIG. 185 is a diagram illustrating Example 66 of a GW pattern for an LDPC code with a code length N of 69120 bits.

According to the GW pattern of FIG. 185, the arrangement of bit groups 0 to 191 of the 69120-bit LDPC code is interleaved into an arrangement of a bit group 138, 38, 106, 76, 172, 27, 150, 95, 44, 187, 64, 18, 28, 98, 180, 101, 149, 146, 126, 26, 93, 178, 186, 70, 104, 131, 19, 45, 102, 122, 152, 66, 63, 173, 9, 55, 25, 1, 154, 85, 5, 51, 43, 82, 86, 151, 148, 48, 190, 179, 62, 60, 94, 174, 142, 39, 169, 170, 47, 125, 33, 128, 162, 2, 129, 57, 79, 118, 114, 69, 78, 167, 11, 136, 99, 155, 90, 21, 119, 10, 52, 91, 115, 185, 6, 110, 88, 96, 181, 143, 0, 160, 124, 130, 183, 71, 121, 182, 68, 191, 3, 32, 40, 189, 41, 156, 35, 159, 58, 89, 29, 67, 17, 109, 30, 111, 12, 46, 65, 177, 53, 77, 74, 56, 184, 15, 141, 135, 54, 163, 14, 145, 139, 134, 59, 147, 87, 107, 7, 61, 36, 113, 103, 188, 24, 165, 137, 22, 42, 49, 83, 73, 50, 161, 20, 166, 127, 157, 108, 171, 37, 72, 176, 112, 123, 144, 34, 175, 168, 117, 80, 81, 8, 31, 133, 92, 164, 132, 97, 158, 84, 100, 140, 16, 105, 23, 75, 13, 153, 116, 4, 120.

FIG. 186 is a diagram illustrating Example 67 of a GW pattern for an LDPC code with a code length N of 69120 bits.

According to the GW pattern of FIG. 186, the arrangement of bit groups 0 to 191 of the 69120-bit LDPC code is interleaved into an arrangement of a bit group 37, 136, 161, 62, 163, 129, 160, 73, 76, 66, 34, 162, 122, 5, 87, 94, 50, 105, 132, 32, 121, 47, 74, 189, 110, 45, 75, 175, 17, 29, 108, 191, 1, 153, 20, 113, 61, 42, 51, 2, 165, 124, 43, 186, 40, 86, 168, 180, 155, 16, 93, 26, 166, 119, 159, 56, 12, 44, 46, 143, 49, 25, 176, 158, 92, 147, 54, 172, 182, 64, 157, 112, 38, 39, 11, 6, 127, 48, 151, 82, 4, 36, 183, 88, 126, 117, 111, 188, 138, 65, 70, 170, 133, 137, 146, 128, 114, 148, 141, 125, 10, 41, 116, 33, 99, 81, 187, 130, 131, 107, 60, 90, 173, 13, 71, 15, 106, 3, 149, 154, 181, 174, 190, 27, 177, 18, 21, 22, 83, 91, 150, 14, 96, 53, 0, 145, 67, 68, 144, 184, 59, 23, 118, 115, 135, 55, 134, 102, 8, 169, 85, 156, 97, 63, 104, 95, 52, 98, 139, 24, 78, 179, 19, 28, 69, 58, 109, 57, 164, 31, 84, 140, 103, 77, 123, 171, 72, 79, 152, 35, 80, 7, 185, 167, 9, 100, 142, 89, 30, 120, 178, 101.

FIG. 187 is a diagram illustrating Example 68 of a GW pattern for an LDPC code with a code length N of 69120 bits.

According to the GW pattern of FIG. 187, the arrangement of bit groups 0 to 191 of the 69120-bit LDPC code is interleaved into an arrangement of a bit group 148, 189, 3, 121, 80, 135, 7, 96, 46, 109, 190, 111, 118, 23, 5, 149, 19, 140, 106, 36, 161, 71, 6, 176, 160, 76, 8, 168, 171, 173, 40, 37, 25, 50, 164, 108, 139, 31, 127, 142, 163, 177, 24, 20, 157, 83, 116, 42, 73, 69, 88, 184, 147, 136, 187, 49, 45, 35, 170, 62, 63, 181, 117, 123, 122, 72, 55, 53, 133, 159, 94, 175, 179, 158, 97, 93, 13, 130, 144, 81, 68, 2, 64, 155, 119, 43, 143, 1, 112, 18, 146, 172, 132, 191, 134, 61, 138, 9, 178, 103, 15, 47, 154, 17, 152, 153, 107, 115, 39, 166, 33, 104, 56, 52, 60, 131, 141, 78, 186, 162, 54, 0, 85, 12, 86, 77, 126, 34, 180, 10, 87, 38, 4, 26, 79, 27, 98, 66, 75, 67, 110, 101, 128, 16, 22, 28, 151, 21, 99, 74, 11, 100, 65, 58, 150, 145, 14, 59, 102, 51, 48, 113, 92, 167, 188, 174, 156, 114, 82, 125, 124, 70, 137, 90, 30, 44, 57, 105, 95, 165, 29, 89, 41, 169, 120, 91, 32, 183, 129, 182, 185, 84.

FIG. 188 is a diagram illustrating Example 69 of a GW pattern for an LDPC code with a code length N of 69120 bits.

According to the GW pattern of FIG. 188, the arrangement of bit groups 0 to 191 of the 69120-bit LDPC code is interleaved into an arrangement of a bit group 67, 20, 9, 75, 143, 94, 144, 122, 56, 88, 180, 72, 102, 100, 113, 157, 170, 59, 128, 162, 26, 38, 61, 156, 115, 117, 190, 77, 22, 74, 119, 12, 8, 179, 182, 85, 188, 191, 154, 41, 58, 142, 186, 107, 73, 189, 15, 130, 127, 160, 55, 19, 45, 137, 124, 133, 146, 43, 60, 183, 153, 177, 123, 181, 95, 49, 140, 4, 51, 3, 21, 164, 83, 187, 148, 11, 168, 149, 92, 65, 30, 90, 23, 116, 57, 161, 125, 175, 129, 126, 97, 14, 96, 66, 37, 178, 64, 173, 184, 80, 101, 34, 81, 131, 76, 147, 47, 135, 111, 121, 44, 68, 98, 48, 120, 40, 87, 176, 104, 106, 28, 163, 52, 1, 152, 79, 42, 139, 16, 2, 71, 7, 109, 114, 112, 54, 62, 169, 35, 150, 171, 110, 50, 108, 105, 69, 118, 84, 39, 132, 63, 31, 18, 134, 103, 185, 6, 145, 24, 70, 36, 29, 5, 93, 99, 33, 82, 89, 167, 174, 27, 165, 91, 138, 155, 32, 159, 141, 136, 151, 25, 158, 86, 17, 13, 172, 53, 10, 46, 166, 0, 78.

FIG. 189 is a diagram illustrating Example 70 of a GW pattern for an LDPC code with a code length N of 69120 bits.

According to the GW pattern of FIG. 189, the arrangement of bit groups 0 to 191 of the 69120-bit LDPC code is interleaved into an arrangement of a bit group 84, 126, 45, 76, 121, 91, 52, 162, 79, 187, 134, 108, 47, 16, 72, 119, 43, 107, 98, 135, 147, 110, 0, 60, 4, 61, 117, 24, 167, 65, 40, 55, 73, 112, 85, 35, 156, 95, 137, 171, 9, 11, 54, 131, 138, 157, 152, 111, 183, 161, 41, 69, 21, 94, 113, 8, 153, 39, 57, 143, 86, 12, 188, 184, 15, 30, 118, 136, 64, 169, 148, 22, 6, 68, 168, 78, 105, 101, 190, 3, 59, 124, 170, 62, 87, 46, 28, 29, 186, 2, 25, 177, 140, 53, 154, 37, 18, 189, 93, 114, 33, 1, 158, 122, 103, 5, 104, 80, 166, 34, 106, 51, 10, 180, 139, 125, 178, 100, 13, 70, 142, 185, 159, 50, 66, 102, 150, 127, 160, 92, 81, 173, 115, 144, 145, 128, 74, 88, 20, 116, 179, 96, 17, 155, 175, 75, 165, 7, 191, 149, 44, 23, 99, 48, 163, 42, 63, 164, 90, 120, 27, 31, 14, 19, 32, 174, 26, 67, 89, 97, 56, 146, 82, 133, 129, 109, 71, 58, 130, 182, 123, 176, 49, 36, 181, 38, 141, 151, 83, 77, 172, 132.

FIG. 190 is a diagram illustrating Example 71 of a GW pattern for an LDPC code with a code length N of 69120 bits.

According to the GW pattern of FIG. 190, the arrangement of bit groups 0 to 191 of the 69120-bit LDPC code is interleaved into an arrangement of a bit group 30, 127, 60, 115, 80, 50, 150, 39, 176, 171, 47, 104, 70, 33, 56, 3, 10, 26, 19, 149, 153, 141, 98, 46, 64, 71, 130, 107, 94, 16, 164, 169, 57, 168, 126, 157, 133, 12, 154, 135, 35, 53, 40, 183, 28, 1, 160, 67, 163, 134, 181, 59, 99, 186, 86, 36, 178, 152, 48, 117, 44, 14, 66, 172, 17, 31, 182, 166, 187, 55, 62, 143, 69, 77, 9, 113, 158, 91, 189, 84, 151, 74, 45, 97, 122, 114, 75, 41, 162, 90, 110, 106, 116, 131, 129, 188, 92, 11, 147, 108, 20, 159, 146, 51, 29, 109, 89, 6, 96, 155, 43, 111, 138, 85, 119, 5, 22, 105, 170, 4, 15, 148, 145, 63, 0, 156, 81, 68, 13, 137, 79, 103, 2, 179, 38, 180, 132, 123, 144, 167, 140, 174, 49, 37, 82, 128, 101, 21, 124, 177, 121, 8, 23, 136, 42, 27, 139, 72, 185, 18, 65, 161, 7, 125, 88, 34, 73, 184, 52, 190, 120, 102, 100, 87, 95, 118, 83, 112, 175, 78, 58, 24, 165, 54, 61, 25, 191, 76, 142, 93, 173, 32.

FIG. 191 is a diagram illustrating Example 72 of a GW pattern for an LDPC code with a code length N of 69120 bits.

According to the GW pattern of FIG. 191, the arrangement of bit groups 0 to 191 of the 69120-bit LDPC code is interleaved into an arrangement of a bit group 166, 161, 43, 77, 177, 54, 162, 185, 127, 62, 6, 64, 30, 12, 27, 89, 130, 116, 190, 28, 38, 135, 149, 164, 48, 173, 175, 71, 132, 68, 5, 111, 158, 24, 59, 26, 145, 118, 51, 37, 178, 69, 189, 163, 133, 98, 53, 29, 169, 188, 17, 180, 155, 73, 45, 22, 107, 104, 76, 143, 70, 88, 99, 124, 126, 34, 80, 10, 168, 66, 72, 123, 63, 140, 176, 49, 65, 50, 52, 122, 4, 181, 121, 57, 18, 101, 42, 179, 100, 157, 165, 106, 156, 95, 170, 174, 117, 109, 102, 186, 148, 3, 134, 96, 67, 150, 151, 153, 11, 83, 1, 105, 25, 144, 8, 108, 84, 78, 97, 141, 60, 16, 112, 7, 82, 93, 46, 137, 35, 103, 61, 113, 129, 20, 119, 92, 31, 154, 115, 56, 44, 90, 14, 131, 160, 2, 36, 21, 23, 110, 152, 187, 0, 184, 41, 183, 120, 146, 47, 114, 32, 81, 75, 39, 91, 136, 167, 172, 58, 147, 125, 86, 138, 94, 33, 79, 159, 87, 55, 171, 85, 182, 191, 9, 19, 74, 13, 142, 40, 139, 15, 128.

FIG. 192 is a diagram illustrating Example 73 of a GW pattern for an LDPC code with a code length N of 69120 bits.

According to the GW pattern of FIG. 192, the arrangement of bit groups 0 to 191 of the 69120-bit LDPC code is interleaved into an arrangement of a bit group 191, 38, 101, 9, 62, 79, 127, 18, 51, 6, 95, 114, 35, 123, 31, 99, 133, 81, 136, 106, 5, 130, 159, 124, 146, 41, 110, 150, 185, 8, 158, 178, 119, 171, 121, 129, 164, 168, 111, 52, 177, 190, 85, 179, 142, 174, 46, 61, 176, 23, 163, 49, 28, 86, 2, 143, 120, 166, 13, 87, 27, 39, 115, 131, 92, 117, 187, 56, 11, 180, 118, 30, 149, 60, 71, 44, 103, 140, 48, 162, 125, 122, 126, 29, 153, 77, 72, 4, 7, 165, 25, 89, 26, 68, 20, 12, 141, 37, 139, 15, 36, 82, 21, 137, 80, 3, 57, 128, 42, 43, 47, 93, 147, 70, 50, 170, 54, 96, 17, 152, 24, 172, 10, 22, 45, 169, 83, 69, 134, 78, 64, 183, 76, 189, 184, 112, 109, 33, 88, 32, 105, 175, 94, 53, 1, 90, 66, 100, 19, 108, 104, 113, 58, 40, 144, 97, 138, 154, 148, 157, 67, 145, 102, 132, 173, 84, 167, 0, 98, 182, 156, 63, 135, 14, 181, 73, 75, 65, 161, 116, 186, 55, 34, 151, 91, 160, 107, 16, 188, 74, 155, 59.

FIG. 193 is a diagram illustrating Example 74 of a GW pattern for an LDPC code with a code length N of 69120 bits.

According to the GW pattern of FIG. 193, the arrangement of bit groups 0 to 191 of the 69120-bit LDPC code is interleaved into an arrangement of a bit group 100, 152, 16, 39, 26, 58, 60, 6, 126, 7, 59, 75, 62, 47, 27, 113, 41, 115, 169, 30, 95, 189, 138, 136, 70, 140, 149, 187, 177, 141, 125, 171, 178, 134, 15, 154, 131, 183, 46, 35, 44, 11, 51, 170, 112, 20, 161, 159, 101, 52, 181, 71, 28, 128, 3, 167, 156, 123, 18, 139, 102, 13, 19, 37, 90, 105, 92, 135, 185, 121, 50, 158, 29, 104, 155, 12, 184, 93, 166, 14, 133, 146, 24, 191, 188, 116, 109, 89, 65, 45, 25, 21, 1, 76, 151, 180, 33, 124, 91, 107, 119, 5, 132, 118, 111, 96, 143, 150, 173, 108, 2, 122, 22, 148, 130, 142, 147, 67, 97, 103, 36, 63, 40, 117, 55, 68, 137, 144, 94, 83, 56, 79, 175, 0, 182, 114, 85, 86, 9, 10, 74, 106, 17, 190, 4, 34, 84, 98, 38, 88, 64, 78, 145, 77, 163, 42, 120, 69, 164, 48, 23, 129, 160, 81, 127, 82, 53, 72, 179, 31, 66, 32, 168, 110, 73, 186, 157, 172, 49, 165, 176, 80, 61, 174, 153, 162, 54, 99, 57, 87, 8, 43.

FIG. 194 is a diagram illustrating Example 75 of a GW pattern for an LDPC code with a code length N of 69120 bits.

According to the GW pattern of FIG. 194, the arrangement of bit groups 0 to 191 of the 69120-bit LDPC code is interleaved into an arrangement of a bit group 21, 5, 2, 24, 12, 28, 52, 118, 129, 3, 122, 149, 105, 16, 136, 99, 133, 171, 84, 79, 59, 62, 155, 78, 134, 20, 1, 51, 22, 161, 173, 46, 172, 162, 55, 148, 70, 57, 121, 86, 131, 114, 31, 72, 104, 120, 164, 127, 83, 179, 187, 7, 108, 40, 73, 144, 48, 68, 60, 190, 135, 61, 116, 106, 19, 35, 143, 180, 102, 76, 182, 117, 93, 191, 165, 23, 80, 146, 153, 42, 53, 139, 124, 64, 167, 96, 138, 132, 158, 90, 110, 82, 39, 175, 170, 66, 145, 94, 119, 130, 98, 63, 87, 32, 160, 34, 151, 77, 95, 109, 56, 113, 147, 50, 38, 15, 156, 11, 169, 185, 183, 92, 186, 107, 10, 101, 33, 4, 150, 41, 81, 89, 166, 0, 30, 54, 168, 26, 140, 74, 100, 9, 111, 126, 43, 112, 25, 88, 44, 189, 37, 178, 141, 49, 13, 29, 8, 69, 154, 45, 97, 47, 36, 75, 137, 6, 115, 188, 85, 174, 17, 142, 18, 91, 163, 157, 177, 103, 125, 71, 14, 181, 65, 184, 176, 159, 128, 152, 58, 27, 123, 67.

FIG. 195 is a diagram illustrating Example 76 of a GW pattern for an LDPC code with a code length N of 69120 bits.

According to the GW pattern of FIG. 195, the arrangement of bit groups 0 to 191 of the 69120-bit LDPC code is interleaved into an arrangement of a bit group 113, 23, 166, 150, 133, 130, 38, 18, 71, 115, 111, 44, 135, 11, 98, 96, 67, 114, 112, 87, 146, 119, 28, 86, 120, 49, 175, 14, 30, 144, 53, 165, 162, 128, 108, 39, 116, 158, 62, 110, 83, 93, 118, 80, 88, 173, 157, 102, 177, 132, 174, 59, 106, 34, 64, 22, 4, 29, 97, 155, 109, 9, 107, 92, 36, 24, 161, 50, 21, 137, 17, 43, 58, 124, 31, 37, 172, 100, 178, 129, 79, 160, 167, 32, 181, 154, 7, 183, 90, 54, 68, 191, 156, 104, 147, 10, 65, 81, 134, 169, 142, 57, 171, 78, 48, 47, 5, 40, 46, 51, 151, 77, 1, 72, 164, 152, 70, 141, 2, 89, 13, 182, 85, 52, 41, 66, 75, 63, 185, 148, 179, 138, 61, 73, 180, 189, 76, 84, 8, 27, 184, 105, 42, 69, 153, 188, 19, 131, 121, 26, 159, 45, 16, 186, 25, 176, 82, 103, 163, 99, 101, 122, 187, 20, 136, 126, 168, 145, 6, 91, 55, 117, 35, 56, 143, 140, 190, 125, 127, 74, 95, 94, 12, 149, 33, 0, 139, 3, 123, 170, 15, 60.

FIG. 196 is a diagram illustrating Example 77 of a GW pattern for an LDPC code with a code length N of 69120 bits.

According to the GW pattern of FIG. 196, the arrangement of bit groups 0 to 191 of the 69120-bit LDPC code is interleaved into an arrangement of a bit group 131, 148, 141, 17, 53, 138, 45, 97, 112, 111, 77, 184, 129, 135, 27, 122, 2, 123, 156, 128, 80, 116, 40, 89, 84, 41, 105, 42, 39, 187, 145, 18, 54, 44, 183, 57, 136, 13, 65, 162, 51, 178, 59, 104, 163, 70, 87, 152, 94, 126, 23, 169, 9, 179, 177, 139, 130, 38, 35, 20, 86, 180, 48, 108, 47, 133, 167, 75, 168, 25, 67, 185, 91, 165, 157, 158, 110, 127, 82, 58, 50, 64, 76, 31, 159, 8, 79, 78, 146, 71, 69, 3, 36, 155, 160, 21, 29, 49, 28, 150, 81, 154, 149, 182, 24, 30, 72, 109, 173, 33, 113, 43, 55, 189, 132, 176, 120, 172, 166, 143, 90, 125, 7, 5, 66, 12, 98, 83, 10, 62, 11, 175, 85, 0, 63, 181, 188, 74, 171, 117, 106, 61, 153, 174, 147, 93, 190, 34, 142, 100, 6, 1, 140, 191, 161, 19, 151, 14, 73, 99, 121, 119, 92, 95, 115, 118, 186, 60, 144, 22, 32, 52, 164, 15, 88, 46, 114, 101, 124, 26, 96, 4, 107, 103, 16, 37, 102, 56, 170, 68, 134, 137.

FIG. 197 is a diagram illustrating Example 78 of a GW pattern for an LDPC code with a code length N of 69120 bits.

According to the GW pattern of FIG. 197, the arrangement of bit groups 0 to 191 of the 69120-bit LDPC code is interleaved into an arrangement of a bit group 93, 61, 37, 170, 63, 60, 135, 5, 158, 47, 65, 179, 76, 182, 72, 20, 104, 7, 181, 11, 117, 152, 184, 172, 143, 92, 109, 177, 191, 119, 132, 1, 98, 10, 148, 35, 126, 9, 18, 70, 190, 38, 66, 54, 62, 122, 100, 3, 2, 189, 144, 153, 165, 14, 154, 44, 161, 113, 147, 12, 90, 167, 112, 34, 39, 139, 142, 41, 159, 149, 82, 131, 88, 106, 138, 105, 55, 163, 71, 168, 80, 96, 108, 40, 50, 25, 114, 79, 103, 141, 151, 69, 74, 110, 36, 24, 67, 145, 26, 8, 56, 180, 13, 17, 134, 28, 129, 185, 85, 121, 137, 136, 68, 86, 188, 0, 124, 120, 127, 32, 94, 83, 133, 97, 31, 58, 33, 57, 166, 162, 183, 186, 81, 111, 19, 107, 155, 42, 84, 6, 43, 130, 48, 123, 64, 78, 53, 173, 95, 75, 45, 174, 178, 160, 15, 187, 102, 23, 150, 156, 101, 99, 91, 157, 128, 175, 59, 125, 22, 46, 115, 164, 52, 16, 21, 30, 176, 146, 51, 116, 87, 140, 77, 73, 89, 169, 4, 171, 27, 49, 29, 118.

The first to 45 Examples of the GW pattern for the LDPC code with a code length N of 69120 bits can be applied to any combination of the LDPC code with a code length N of 69120 bits and an arbitrary encoding rate r, an arbitrary modulation scheme, and an arbitrary constellation.

However, for the group-wise interleaving, the error rate can be further improved for each combination by setting the GW pattern to be applied to a combination of the code length N of the LDPC code, the encoding rate r of the LDPC code, the modulation scheme, and the constellation.

The GW pattern of FIG. 120 is applied to, for example, a combination of the LDPC code (LDPC code with a code length N of 69120 and an encoding rate r of 2/16) with N=69120 and r=2/16 of FIG. 30 (corresponding to the check matrix initial value table), the QPSK, and the QPSK-UC of FIGS. 96 and 97, so that a particularly good error rate can be achieved.

The GW pattern of FIG. 121 is applied to, for example, a combination of the LDPC code with N=69120 and r=3/16 of FIGS. 31 and 32, QPSK, and QPSK-UC of FIGS. 96 and 97, so that a particularly good error rate can be achieved.

The GW pattern of FIG. 122 is applied to, for example, a combination of the LDPC code with N=69120 and r=4/16 of FIG. 33, QPSK, and QPSK-UC of FIGS. 96 and 97, so that a particularly good error rate can be achieved.

The GW pattern of FIG. 123 is applied to, for example, a combination of the LDPC code with N=69120 and r=5/16 of FIGS. 34 and 35, QPSK, and QPSK-UC of FIGS. 96 and 97, so that a particularly good error rate can be achieved.

The GW pattern of FIG. 124 is applied to, for example, a combination of the LDPC code with N=69120 and r=6/16 of FIGS. 36 and 37, QPSK, and QPSK-UC of FIGS. 96 and 97, so that a particularly good error rate can be achieved.

The GW pattern of FIG. 125 is applied to, for example, a combination of the LDPC code with N=69120 and r=7/16 of FIGS. 38 and 39, QPSK, and QPSK-UC of FIGS. 96 and 97, so that a particularly good error rate can be achieved.

The GW pattern of FIG. 126 is applied to, for example, a combination of the LDPC code with N=69120 and r=8/16 of FIGS. 46 and 47, QPSK, and QPSK-UC of FIGS. 96 and 97, so that a particularly good error rate can be achieved.

The GW pattern of FIG. 127 is applied to, for example, a combination of the LDPC code with N=69120 and r=9/16 of FIGS. 50 to 52, QPSK, and QPSK-UC of FIGS. 96 and 97, so that a particularly good error rate can be achieved.

The GW pattern of FIG. 128 is applied to, for example, a combination of the LDPC code with N=69120 and r=10/16 of FIGS. 56 to 58, QPSK, and QPSK-UC of FIGS. 96 and 97, so that a particularly good error rate can be achieved.

The GW pattern of FIG. 129 is applied to, for example, a combination of the LDPC code with N=69120 and r=11/16 of FIGS. 62 to 64, QPSK, and QPSK-UC of FIGS. 96 and 97, so that a particularly good error rate can be achieved.

The GW pattern of FIG. 130 is applied to, for example, a combination of the LDPC code with N=69120 and r=12/16 of FIGS. 68 to 70, QPSK, and QPSK-UC of FIGS. 96 and 97, so that a particularly good error rate can be achieved.

The GW pattern of FIG. 131 is applied to, for example, a combination of the LDPC code with N=69120 and r=13/16 of FIGS. 74 to 76, QPSK, and QPSK-UC of FIGS. 96 and 97, so that a particularly good error rate can be achieved.

The GW pattern of FIG. 132 is applied to, for example, a combination of the LDPC code with N=69120 and r=14/16 of FIGS. 80 to 82, QPSK, and QPSK-UC of FIGS. 96 and 97, so that a particularly good error rate can be achieved.

The GW pattern of FIG. 133 is applied to, for example, a combination of the LDPC code with N=69120 and r=3/16 of FIGS. 31 and 32 and 16 QAM, and 16 QAM-UC of FIGS. 98 and 99, so that a particularly good error rate can be achieved.

The GW pattern of FIG. 134 is applied to, for example, a combination of the LDPC code with N=69120 and r=5/16 of FIGS. 34 and 35, 16 QAM, and 16 QAM-UC of FIGS. 98 and 99, so that a particularly good error rate can be achieved.

The GW pattern of FIG. 135 is applied to, for example, a combination of the LDPC code with N=69120 and r=7/16 of FIGS. 38 and 39, 16 QAM, and 16 QAM-UC of FIGS. 98 and 99, so that a particularly good error rate can be achieved.

The GW pattern of FIG. 136 is applied to, for example, a combination of the LDPC code with N=69120 and r=9/16 of FIGS. 50 to 52, 16 QAM, and 16 QAM-UC of FIGS. 98 and 99, so that a particularly good error rate can be achieved.

The GW pattern of FIG. 137 is applied to, for example, a combination of the LDPC code with N=69120 and r=11/16 of FIGS. 62 to 64, 16 QAM, and 16 QAM-UC of FIGS. 98 and 99, so that a particularly good error rate can be achieved.

The GW pattern of FIG. 138 is applied to, for example, a combination of the LDPC code with N=69120 and r=13/16 of FIGS. 74 to 76, 16 QAM, and 16 QAM-UC of FIGS. 98 and 99, so that a particularly good error rate can be achieved.

The GW pattern of FIG. 139 is applied to, for example, a combination of the LDPC code with N=69120 and r=2/16 of FIG. 30, 64 QAM, and 64 QAM-UC of FIGS. 100 and 101, so that a particularly good error rate can be achieved.

The GW pattern of FIG. 140 is applied to, for example, a combination of the LDPC code with N=69120 and r=4/16 of FIG. 33, 64 QAM, and 64 QAM-UC of FIGS. 100 and 101, so that a particularly good error rate can be achieved.

The GW pattern of FIG. 141 is applied to, for example, a combination of the LDPC code with N=69120 and r=6/16 of FIGS. 36 and 37, 64 QAM, and 64 QAM-UC of FIGS. 100 and 101, so that a particularly good error rate can be achieved.

The GW pattern of FIG. 142 is applied to, for example, a combination of the LDPC code with N=69120 and r=8/16 of FIGS. 46 and 47, 64 QAM, and 64 QAM-UC of FIGS. 100 and 101, so that a particularly good error rate can be achieved.

The GW pattern of FIG. 143 is applied to, for example, a combination of the LDPC code with N=69120 and r=10/16 of FIGS. 56 to 58, 64 QAM, and 64 QAM-UC of FIGS. 100 and 101, so that a particularly good error rate can be achieved.

The GW pattern of FIG. 144 is applied to, for example, a combination of the LDPC code with N=69120 and r=12/16 of FIGS. 68 to 70, 64 QAM, and 64 QAM-UC of FIGS. 100 and 101, so that a particularly good error rate can be achieved.

The GW pattern of FIG. 145 is applied to, for example, a combination of the LDPC code with N=69120 and r=14/16 of FIGS. 80 to 82, 64 QAM, and 64 QAM-UC of FIGS. 100 and 101, so that a particularly good error rate can be achieved.

The GW pattern of FIG. 146 is applied to, for example, a combination of the LDPC code with N=69120 and r=3/16 of FIGS. 31 and 32, 256 QAM, and 256 QAM-UC of FIGS. 102 and 103, so that a particularly good error rate can be achieved.

The GW pattern of FIG. 147 is applied to, for example, a combination of the LDPC code with N=69120 and r=5/16 of FIGS. 34 and 35, 256 QAM, and 256 QAM-UC of FIGS. 102 and 103, so that a particularly good error rate can be achieved.

The GW pattern of FIG. 148 is applied to, for example, a combination of the LDPC code with N=69120 and r=7/16 of FIGS. 38 and 39, 256 QAM, and 256 QAM-UC of FIGS. 102 and 103, so that a particularly good error rate can be achieved.

The GW pattern of FIG. 149 is applied to, for example, a combination of the LDPC code with N=69120 and r=9/16 of FIGS. 50 to 52, 256 QAM, and 256 QAM-UC of FIGS. 102 and 103, so that a particularly good error rate can be achieved.

The GW pattern of FIG. 150 is applied to, for example, a combination of the LDPC code with N=69120 and r=11/16 of FIGS. 62 to 64, 256 QAM, and 256 QAM-UC of FIGS. 102 and 103, so that a particularly good error rate can be achieved.

The GW pattern of FIG. 151 is applied to, for example, a combination of the LDPC code with N=69120 and r=13/16 of FIGS. 74 to 76, 256 QAM, and 256 QAM-UC of FIGS. 102 and 103, so that a particularly good error rate can be achieved.

The GW pattern of FIG. 152 is applied to, for example, a combination of the LDPC code with N=69120 and r=2/16 of FIG. 30, 1024 QAM, and 1024 QAM-UC of FIGS. 104 and 105, so that a particularly good error rate can be achieved.

The GW pattern of FIG. 153 is applied to, for example, a combination of the LDPC code with N=69120 and r=4/16 of FIG. 33, 1024 QAM, and 1024 QAM-UC of FIGS. 104 and 105, so that a particularly good error rate can be achieved.

The GW pattern of FIG. 154 is applied to, for example, a combination of the LDPC code with N=69120 and r=6/16 of FIGS. 36 and 37, 1024 QAM, and 1024 QAM-UC of FIGS. 104 and 105, so that a particularly good error rate can be achieved.

The GW pattern of FIG. 155 is applied to, for example, a combination of the LDPC code with N=69120 and r=8/16 of FIGS. 46 and 47, 1024 QAM, and 1024 QAM-UC of FIGS. 104 and 105, so that a particularly good error rate can be achieved.

The GW pattern of FIG. 156 is applied to, for example, a combination of the LDPC code with N=69120 and r=10/16 of FIGS. 56 to 58, 1024 QAM, and 1024 QAM-UC of FIGS. 104 and 105, so that a particularly good error rate can be achieved.

The GW pattern of FIG. 157 is applied to, for example, a combination of the LDPC code with N=69120 and r=12/16 of FIGS. 68 to 70, 1024 QAM, and 1024 QAM-UC of FIGS. 104 and 105, so that a particularly good error rate can be achieved.

The GW pattern of FIG. 158 is applied to, for example, a combination of the LDPC code with N=69120 and r=14/16 of FIGS. 80 to 82, 1024 QAM, and 1024 QAM-UC of FIGS. 104 and 105, so that a particularly good error rate can be achieved.

The GW pattern of FIG. 159 is applied to, for example, a combination of the LDPC code with N=69120 and r=3/16 of FIGS. 31 and 32, 4096 QAM, and 4096 QAM-UC of FIGS. 106 and 107, so that a particularly good error rate can be achieved.

The GW pattern of FIG. 160 is applied to, for example, a combination of the LDPC code with N=69120 and r=5/16 of FIGS. 34 and 35, 4096 QAM, and 4096 QAM-UC of FIGS. 106 and 107, so that a particularly good error rate can be achieved.

The GW pattern of FIG. 161 is applied to, for example, a combination of the LDPC code with N=69120 and r=7/16 of FIGS. 38 and 39, 4096 QAM, and 4096 QAM-UC of FIGS. 106 and 107, so that a particularly good error rate can be achieved.

The GW pattern of FIG. 162 is applied to, for example, a combination of the LDPC code with N=69120 and r=9/16 of FIGS. 50 to 52, 4096 QAM, and 4096 QAM-UC of FIGS. 106 and 107, so that a particularly good error rate can be achieved.

The GW pattern of FIG. 163 is applied to, for example, a combination of the LDPC code with N=69120 and r=11/16 of FIGS. 62 to 64, 4096 QAM, and 4096 QAM-UC of FIGS. 106 and 107, so that a particularly good error rate can be achieved.

The GW pattern of FIG. 164 is applied to, for example, a combination of the LDPC code with N=69120 and r=13/16 of FIGS. 74 to 76, 4096 QAM, and 4096 QAM-UC of FIGS. 106 and 107, so that a particularly good error rate can be achieved.

The GW pattern of FIG. 165 is applied to, for example, a combination of the LDPC code with N=69120 and r=2/16 of FIG. 30, 16 QAM, and 16 QAM-2D-NUC of FIG. 108, so that a particularly good error rate can be achieved.

The GW pattern of FIG. 166 is applied to, for example, a combination of the LDPC code with N=69120 and r=4/16 of FIG. 33, 16 QAM, and 16 QAM-2D-NUC of FIG. 108, so that a particularly good error rate can be achieved.

The GW pattern of FIG. 167 is applied to, for example, a combination of the LDPC code with N=69120 and r=6/16 of FIGS. 36 and 37, 16 QAM, and 16 QAM-2D-NUC of FIG. 108, so that a particularly good error rate can be achieved.

The GW pattern of FIG. 168 is applied to, for example, a combination of the LDPC code with N=69120 and r=8/16 of FIGS. 46 and 47, 16 QAM, and 16 QAM-2D-NUC of FIG. 108, so that a particularly good error rate can be achieved.

The GW pattern of FIG. 169 is applied to, for example, a combination of the LDPC code with N=69120 and r=10/16 of FIGS. 56 to 58, 16 QAM, and 16 QAM-2D-NUC of FIG. 108, so that a particularly good error rate can be achieved.

The GW pattern of FIG. 170 is applied to, for example, a combination of the LDPC code with N=69120 and r=12/16 of FIGS. 68 to 70, 16 QAM, and 16 QAM-2D-NUC of FIG. 108, so that a particularly good error rate can be achieved.

The GW pattern of FIG. 171 is applied to, for example, a combination of the LDPC code with N=69120 and r=14/16 of FIGS. 80 to 82, 16 QAM, and 16 QAM-2D-NUC of FIG. 108, so that a particularly good error rate can be achieved.

The GW pattern of FIG. 172 is applied to, for example, a combination of the LDPC code with N=69120 and r=3/16 of FIGS. 31 and 32, 64 QAM, and 64 QAM-2D-NUC of FIG. 109, so that a particularly good error rate can be achieved.

The GW pattern of FIG. 173 is applied to, for example, a combination of the LDPC code with N=69120 and r=5/16 of FIGS. 34 and 35, 64 QAM, and 64 QAM-2D-NUC of FIG. 109, so that a particularly good error rate can be achieved.

The GW pattern of FIG. 174 is applied to, for example, a combination of the LDPC code with N=69120 and r=7/16 of FIGS. 38 and 39, 64 QAM, and 64 QAM-2D-NUC of FIG. 109, so that a particularly good error rate can be achieved.

The GW pattern of FIG. 175 is applied to, for example, a combination of the LDPC code with N=69120 and r=9/16 of FIGS. 50 to 52, 64 QAM, and 64 QAM-2D-NUC of FIG. 109, so that a particularly good error rate can be achieved.

The GW pattern of FIG. 176 is applied to, for example, a combination of the LDPC code with N=69120 and r=11/16 of FIGS. 62 to 64, 64 QAM, and 64 QAM-2D-NUC of FIG. 109, so that a particularly good error rate can be achieved.

The GW pattern of FIG. 177 is applied to, for example, a combination of the LDPC code with N=69120 and r=13/16 of FIGS. 74 to 76, 64 QAM, and 64 QAM-2D-NUC of FIG. 109, so that a particularly good error rate can be achieved.

The GW pattern of FIG. 178 is applied to, for example, a combination of the LDPC code with N=69120 and r=2/16 of FIG. 30, 256 QAM, and 256 QAM-2D-NUC of FIGS. 110 and 111, so that a particularly good error rate can be achieved.

The GW pattern of FIG. 179 is applied to, for example, a combination of the LDPC code with N=69120 and r=4/16 of FIG. 33, 256 QAM, and 256 QAM-2D-NUC of FIGS. 110 and 111, so that a particularly good error rate can be achieved.

The GW pattern of FIG. 180 is applied to, for example, a combination of the LDPC code with N=69120 and r=6/16 of FIGS. 36 and 37, 256 QAM, and 256 QAM-2D-NUC of FIGS. 110 and 111, so that a particularly good error rate can be achieved.

The GW pattern of FIG. 181 is applied to, for example, a combination of the LDPC code with N=69120 and r=8/16 of FIGS. 46 and 47, 256 QAM, and 256 QAM-2D-NUC of FIGS. 110 and 111, so that a particularly good error rate can be achieved.

The GW pattern of FIG. 182 is applied to, for example, a combination of the LDPC code with N=69120 and r=10/16 of FIGS. 56 to 58, 256 QAM, and 256 QAM-2D-NUC of FIGS. 110 and 111, so that a particularly good error rate can be achieved.

The GW pattern of FIG. 183 is applied to, for example, a combination of the LDPC code with N=69120 and r=12/16 of FIGS. 68 to 70, 256 QAM, and 256 QAM-2D-NUC of FIGS. 110 and 111, so that a particularly good error rate can be achieved.

The GW pattern of FIG. 184 is applied to, for example, a combination of the LDPC code with N=69120 and r=14/16 of FIGS. 80 to 82, 256 QAM, and 256 QAM-2D-NUC of FIGS. 110 and 111, so that a particularly good error rate can be achieved.

The GW pattern of FIG. 185 is applied to, for example, a combination of the LDPC code with N=69120 and r=3/16 of FIGS. 31 and 32, 1024 QAM, and 1024 QAM-1D-NUC of FIGS. 112, 113A and 113B, so that a particularly good error rate can be achieved.

The GW pattern of FIG. 186 is applied to, for example, a combination of the LDPC code with N=69120 and r=5/16 of FIGS. 34 and 35, 1024 QAM, and 1024 QAM-1D-NUC of FIGS. 112, 113A, and 113B, so that a particularly good error rate can be achieved.

The GW pattern of FIG. 187 applied to, for example, a combination of the LDPC code with N=69120 and r=7/16 of FIGS. 38 and 39, 1024 QAM, and 1024 QAM-1D-NUC of FIGS. 112, 113A and 113B, so that a particularly good error rate can be achieved.

The GW pattern of FIG. 188 is applied to, for example, a combination of the LDPC code with N=69120 and r=9/16 of FIGS. 50 to 52, 1024 QAM, and 1024 QAM-1D-NUC of FIGS. 112, 113A and 113B, so that a particularly good error rate can be achieved.

The GW pattern of FIG. 189 is applied to, for example, a combination of the LDPC code with N=69120 and r=11/16 of FIGS. 62 to 64, 1024 QAM, and 1024 QAM-1D-NUC of FIGS. 112, 113A and 113B, so that a particularly good error rate can be achieved.

The GW pattern of FIG. 190 is applied to, for example, a combination of the LDPC code with N=69120 and r=13/16 of FIGS. 74 to 76, 1024 QAM, and 1024 QAM-1D-NUC of FIGS. 112, 113A and 113B, so that a particularly good error rate can be achieved.

The GW pattern of FIG. 191 is applied to, for example, a combination of the LDPC code with N=69120 and r=2/16 of FIG. 30, 4096 QAM, and 4096 QAM-1D-NUC of FIGS. 114 to 116, so that a particularly good error rate can be achieved.

The GW pattern of FIG. 192 is applied to, for example, a combination of the LDPC code with N=69120 and r=4/16 of FIG. 33, 4096 QAM, and 4096 QAM-1D-NUC of FIGS. 114 to 116, so that a particularly good error rate can be achieved.

The GW pattern of FIG. 193 is applied to, for example, a combination of the LDPC code with N=69120 and r=6/16 of FIGS. 36 and 37, 4096 QAM, and 4096 QAM-1D-NUC of FIGS. 114 to 116, so that a particularly good error rate can be achieved.

The GW pattern of FIG. 194 is applied to, for example, a combination of the LDPC code with N=69120 and r=8/16 of FIGS. 46 and 47, 4096 QAM, and 4096 QAM-1D-NUC of FIGS. 114 to 116, so that a particularly good error rate can be achieved.

The GW pattern of FIG. 195 is applied to, for example, a combination of the LDPC code with N=69120 and r=10/16 of FIGS. 56 to 58, 4096 QAM, and 4096 QAM-1D-NUC of FIGS. 114 to 116, so that a particularly good error rate can be achieved.

The GW pattern of FIG. 196 is applied to, for example, a combination of the LDPC code with N=69120 and r=12/16 of FIGS. 68 to 70, 4096 QAM, and 4096 QAM-1D-NUC of FIGS. 114 to 116, so that a particularly good error rate can be achieved.

The GW pattern of FIG. 197 is applied to, for example, a combination of the LDPC code with N=69120 and r=14/16 of FIGS. 80 to 82, 4096 QAM, and 4096 QAM-1D-NUC of FIGS. 114 to 116, so that a particularly good error rate can be achieved.

<Configuration Example of Reception Device 12>

FIG. 198 is a block diagram illustrating a configuration example of the reception device 12 of FIG. 7.

An OFDM processing unit (OFDM operation) 151 receives an OFDM signal from the transmission device 11 (FIG. 7) and performs signal processing on the OFDM signal. Data obtained by the OFDM processing unit 151 performing signal processing is supplied to a frame management unit 152.

The frame management unit 152 processes (frames interprets) a frame configured with the data supplied from the OFDM processing unit 151 and supplies a signal of target data obtained as a result thereof and a signal of control data to frequency deinterleavers 161 and 153, respectively.

The frequency deinterleaver 153 performs frequency deinterleaving in units of a symbol on the data from the frame management unit 152 and supplies the data obtained as a result thereof to a demapper 154.

The demapper 154 performs demapping (decoding of the arrangement of signal points) and quadrature demodulation on the data (data on the constellation) from the frequency deinterleaver 153 on the basis of the arrangement (constellation) of the signal points determined by the quadrature modulation performed on the transmission device 11 side and supplies the data ((the likelihood of) the LDPC code) obtained as a result thereof to an LDPC decoder 155.

The LDPC decoder 155 performs LDPC decoding on the LDPC code from the demapper 154 and supplies the LDPC target data (herein, BCH code) obtained as a result thereof to a BCH decoder 156.

The BCH decoder 156 performs BCH decoding on the LDPC target data from the LDPC decoder 155 and outputs a control data (signaling) obtained as a result.

On the other hand, the frequency deinterleaver 161 performs frequency deinterleaving in units of a symbol on the data from the frame management unit 152 and supplies the data obtained as a result thereof to an SISO/MISO decoder 162.

The SISO/MISO decoder 162 performs space-time decoding on the data from the frequency deinterleaver 161 and supplies the data obtained as a result thereof to a time deinterleaver 163.

The time deinterleaver 163 performs time deinterleaving in units of a symbol on the data from the SISO/MISO decoder 162 and supplies the data obtained as a result thereof to a demapper 164.

The demapper 164 performs demapping (decoding of the arrangement of signal points) and quadrature demodulation on the data (data on the constellation) from the time deinterleaver 163 on the basis of the arrangement (constellation) of the signal points determined by the quadrature modulation performed on the transmission device 11 side and supplies the data obtained as a result thereof to a bit deinterleaver 165.

The bit deinterleaver 165 performs bit deinterleaving on the data from the demapper 164 and supplies (the likelihood of) the LDPC code that is the data after the bit deinterleaving to an LDPC decoder 166.

The LDPC decoder 166 performs LDPC decoding on the LDPC code from the bit deinterleaver 165 and supplies the LDPC target data (here, the BCH code) obtained as a result thereof to a BCH decoder 167.

The BCH decoder 167 performs BCH decoding on the LDPC target data from the LDPC decoder 155 and supplies the data obtained as a result thereof to a BB descrambler 168.

The BB descrambler 168 performs BB descrambling on the data from the BCH decoder 167 and supplies the data obtained a result thereof to a null deletion unit 169.

The null deletion unit 169 deletes the null inserted in the padder 112 of FIG. 8 from the data from the BB descrambler 168 and supplies the data obtained as a result thereof to a demultiplexer 170.

The demultiplexer 170 separates each of one or more streams (target data) multiplexed into the data from the null deletion unit 169, performs necessary processing, and outputs the data obtained as a result thereof as an output stream.

In addition, the reception device 12 can be configured without providing a portion of the blocks illustrated in FIG. 198. That is, for example, in a case where the transmission device 11 (FIG. 8) is configured without the time interleaver 118, the SISO/MISO encoder 119, the frequency interleaver 120, and the frequency interleaver 124, the reception device 12 can be configured without providing a time deinterleaver 163, an SISO/MISO decoder 162, a frequency deinterleaver 161, and a frequency deinterleaver 153 which are blocks corresponding to the time interleaver 118, the SISO/MISO encoder 119, the frequency interleaver 120, and the frequency interleaver 124 of the transmission device 11, respectively.

<Configuration Example of Bit Deinterleaver 165>

FIG. 199 is a block diagram illustrating a configuration example of the bit deinterleaver 165 of FIG. 198.

The bit deinterleaver 165 includes a block deinterleaver 54 and a group-wise deinterleaver 55, and performs (bit) deinterleaving of symbol bits of symbols that are data from the demapper 164 (FIG. 198).

That is, the block deinterleaver 54 performs block deinterleaving (reverse processing of block interleaving) corresponding to the block interleaving performed by the block interleaver 25 of FIG. 9 on the symbol bits of the symbols from the demapper 164, that is, block deinterleaving to return the position of (the likelihood of) the code bits of the LDPC code rearranged by the block interleaving to the original position and supplies the LDPC code obtained as a result thereof to the group-wise deinterleaver 55.

The group-wise deinterleaver 55 performs group-wise deinterleaving (a reverse process of the group-wise interleaving) corresponding to the group-wise interleaving performed by the group-wise interleaver 24 of FIG. 9 on the LDPC code from the block deinterleaver 54, that is, group-wise deinterleaving to return the code bits of the LDPC code rearranged in units of bit groups by the group-wise interleaving described with reference to, for example, FIG. 119 to the original arrangement by rearranging in units of bit groups.

Herein, in a case where the parity interleaving, the group-wise interleaving, and the block interleaving are performed on the LDPC code supplied from the demapper 164 to the bit deinterleaver 165, the bit deinterleaver 165 can perform all of the parity deinterleaving (a reverse process of the parity interleaving, that is, the parity deinterleaving to return the code bits of the LDPC code rearranged by the parity interleaving to the original arrangement) corresponding to the parity interleaving, the block deinterleaving corresponding to the block interleaving, and the group-wise deinterleaving corresponding to the group-wise interleaving.

However, in the bit deinterleaver 165 of FIG. 199, although the block deinterleaver 54 that performs the block deinterleaving corresponding to the block interleaving and the group-wise deinterleaver 55 that performs the group-wise deinterleaving corresponding to the group-wise interleaving are provided, a block that performs the parity deinterleaving corresponding to the parity interleaving is not provided, and the parity deinterleaving is not performed.

Therefore, an LDPC code on which the block deinterleaving and the group-wise deinterleaving are performed and the parity deinterleaving is not performed is supplied from the bit deinterleaver 165 (group-wise deinterleaver 55) to the LDPC decoder 166.

The LDPC decoder 166 performs the LDPC decoding on the LDPC code from the bit deinterleaver 165 by using the transformed check matrix obtained by performing at least the column permutation corresponding to the parity interleaving on the check matrix H of the type-B scheme used by the LDPC encoder 115 of FIG. 8 or the transformed check matrix (FIG. 29) obtained by performing the row permutation on the check matrix of the type-A scheme (FIG. 27) and outputs the data obtained as a result thereof as a result of the decoding of the LDPC target data.

FIG. 200 is a flowchart illustrating processing performed by the demapper 164, the bit deinterleaver 165, and the LDPC decoder 166 of FIG. 199.

In step S111, the demapper 164 performs demapping and quadrature demodulation on the data (data on the constellation mapped to the signal point) from the time deinterleaver 163 and supplies the data obtained as a result thereof to the bit deinterleaver 165, and the process proceeds to step S112.

In step S112, the bit deinterleaver 165 performs the deinterleaving (bit deinterleaving) on the data from the demapper 164, and the process proceeds to step S113.

That is, in step S112, in the bit deinterleaver 165, the block deinterleaver 54 performs the block deinterleaving on the data (symbols) from the demapper 164 and supplies the code bits of the LDPC code obtained as a result thereof to the group-wise deinterleaver 55.

The group-wise deinterleaver 55 performs the group-wise deinterleaving on the LDPC code from the block deinterleaver 54 and supplies (the likelihood of) the resulting LDPC code to the LDPC decoder 166.

In step S113, the LDPC decoder 166 performs LDPC decoding on the LDPC code from the group-wise deinterleaver 55 by using the check matrix H used in the LDPC encoding by the LDPC encoder 115 of FIG. 8, that is, by using, for example, the transformed check matrix obtained from the check matrix and outputs the data obtained as a result thereof to the BCH decoder 167 as a result of the decoding of the LDPC target data.

In addition, in FIG. 199, similarly to the case of FIG. 9, for the convenience of description, the block deinterleaver 54 for performing the block deinterleaving and the group-wise deinterleaver 55 for performing the group-wise deinterleaving are separately configured. However, the block deinterleaver 54 and the group-wise deinterleaver 55 can be integrally configured.

In addition, in a case where the group-wise interleaving is not performed in the transmission device 11, the reception device 12 can be configured without providing the group-wise deinterleaver 55 for performing the group-wise deinterleaving.

<LDPC Decoding>

The LDPC decoding performed by the LDPC decoder 166 of FIG. 198 will be further described.

The LDPC decoder 166 in FIG. 198, as described above, performs the LDPC decoding of the LDPC codes, on which the block deinterleaving and the group-wise deinterleaving from the group-wise deinterleaver 55 are performed and the parity deinterleaving is not performed, by using the transformed check matrix obtained by performing at least the column permutation corresponding to the parity interleaving on the check matrix H of the type-B scheme used for the LDPC encoding by the LDPC encoder 115 in FIG. 8 or the transformed check matrix (FIG. 29) obtained by performing the row permutation on the check matrix (FIG. 27) of the type-A scheme.

Herein, LDPC decoding that can refrain an operating frequency to a sufficiently feasible range while suppressing the circuit scale by performing the LDPC decoding by using a transformed check matrix, has been proposed previously (for example, refer to U.S. Pat. No. 4,224,777).

Therefore, first, the LDPC decoding using the transformed check matrix, which has been previously proposed, will be described with reference to FIGS. 201 to 204.

FIG. 201 is a diagram illustrating an example of a check matrix H of an LDPC code with a code length N of 90 and an encoding rate of 2/3.

Note that, in FIG. 201 (similar to FIGS. 202 and 203 described later), 0 is represented by a period (.).

In the check matrix H of FIG. 201, the parity matrix has a staircase structure.

FIG. 202 is a diagram illustrating a check matrix H' obtained by performing the row permutation of Formula (11) and the column permutation of Formula (12) on the check matrix H of FIG. 201.

$$\text{Row Permutation: } (6s+t+1)\text{-th Row} \rightarrow (5t+s+1)\text{-th Row} \quad (11)$$

$$\text{Column Permutation: } (6x+y+61)\text{-th Column} \rightarrow (5y+x+61)\text{-th Column} \quad (12)$$

However, in Formulas (11) and (12), s, t, x, and y are integers in the ranges of 0≤s<5, 0≤t<6, 0≤x<5, and 0≤t<6, respectively.

According to the row permutation of Formula (11), permutation is performed such that the 1st, 7th, 13th, 19th and 25th rows of which the remainders of division by 6 are 1 become the 1st, 2nd, 3rd, 4th, and 5th rows, respectively, and the 2nd, 8th, 14th, 20th, and 26th rows of which the remainders of division by 6 are 2 become 6th, 7th, 8th, 9th, and 10th rows, respectively.

In addition, according to the column permutation of Formula (12), permutation is performed such that, for the 61st and subsequent columns (parity matrix), the 61st, 67th, 73rd, 79th, and 85th columns of which the remainders of division by 6 are 1 become the 61st, 62nd, 63rd, 64th, and 65th columns, respectively, and the 62nd, 68th, 74th, 80th, and 86th columns of which the remainders of division by 6 are 2 become the 66th, 67th, 68th, 69th, and 70, respectively.

Thus, the matrix obtained by performing row permutation and column permutation on the check matrix H of FIG. 201 is the check matrix H' of FIG. 202.

Herein, the row permutation of the check matrix H does not affect the arrangement of code bits of the LDPC code.

In addition, the column permutation of Formula (12) corresponds to the parity interleaving when the information length K is set to 60, the unit size P is set to 5, and the divisor q (=M/P) of the parity length M (herein, 30) is set to 6 in the above-described parity interleaving in which the (K+qx+y+1)-th code bit is interleaved at the position of the (K+Py+x+1)-th code bit.

Therefore, the check matrix H' of FIG. 202 is a transformed check matrix obtained by performing at least column permutation of permuting the (K+qx+y+1)-th column of the check matrix (hereinafter, appropriately referred to as the original check matrix) H of FIG. 201 to the (K+Py+x+1)-th column.

By multiplying the LDPC code of the original check matrix H of FIG. 201 by a result obtained by performing the same permutation as that of Formula (12) on the transformed check matrix H' of FIG. 202, a zero vector is output. That is, if the row vector obtained by performing the column permutation of Formula (12) on the row vector c as the LDPC code (one code word) of the original check matrix H is indicated by c', according to the properties of the check matrix, the $Hc^T$ becomes a zero vector, and thus, the H'c'T naturally also becomes a zero vector.

From the above description, the transformed check matrix H' of FIG. 202 is a check matrix of the LDPC code c' obtained by performing the column permutation of Formula (12) on the LDPC code c of the original check matrix H.

Therefore, by performing the column permutation of Formula (12) on the LDPC code c of original check matrix H, decoding (LDPC decoding) the LDPC code c' after the column permutation by using the transformed check matrix H' of FIG. 202, and performing reverse permutation of the column permutation of Formula (12) on the decoding result, it is possible to obtain the decoding result similar to that of the case of decoding the LDPC code of the original check matrix H by using the check matrix H.

FIG. 203 is a diagram illustrating the transformed check matrix H' of FIG. 202, which is spaced in units of 5×5 matrices.

In FIG. 203, the transformed check matrix H' is represented by a combination of 5×5 (=P×P) unit matrices having a unit size P, matrices (hereinafter, appropriately referred to quasi-unit matrices) in which one or more of 1's of the unit matrix become 0, matrices (hereinafter, appropriately referred to as shift matrices) obtained by cyclically shifting of the unit matrix or the quasi-unit matrix, matrices (hereinafter, appropriately referred to as summatrices), each of which is a sum of two or more of the unit matrices, the quasi-unit matrices, or the shift matrices, and 5×5 zero matrices.

The transformed check matrix H' of FIG. 203 may include 5×5 unit matrices, 5×5 quasi-unit matrices, 5×5 shift matrices, 5×5 summatrices, and 5×5 zero matrices. Therefore, hereinafter, these 5×5 matrices (unit matrices, quasi-unit matrices, shift matrices, sum matrices, and zero matrices) constituting the transformed check matrix H' are appropriately referred to as configuration matrices.

For the decoding of the LDPC code of the check matrix indicated by a P×P configuration matrix, an architecture that simultaneously performs P check node operations and variable node operations can be used.

FIG. 204 is a block diagram illustrating a configuration example of a decoding device that performs such decoding.

That is, FIG. 204 illustrates the configuration example of the decoding device that performs the decoding of the LDPC code by using the transformed check matrix H' of FIG. 203 obtained by performing at least the column permutation of Formula (12) on the original check matrix H of FIG. 201.

The decoding device illustrated in FIG. 204 includes a branch data storage memory 300 including six FIFOs $\mathbf{300}_1$ to $\mathbf{300}_6$, a selector 301 for selecting the FIFOs $\mathbf{300}_1$ to $\mathbf{300}_6$, a check node calculation unit 302, two cyclic shift circuits 303 and 308, a branch data storage memory 304 including 18 FIFOs $\mathbf{304}_1$ to $\mathbf{304}_{18}$, a selector 305 for selecting the FIFOs $\mathbf{304}_1$ to $\mathbf{304}_{18}$, a received data memory 306 for storing received data, a variable node calculation unit 307, a decoded word calculation unit 309, a received data rearrangement unit 310, and a decoded data rearrangement unit 311.

First, a method of storing data in the branch data storage memories 300 and 304 will be described.

The branch data storage memory 300 includes six FIFOs $\mathbf{300}_1$ to $\mathbf{300}_6$ of which the number is obtained by dividing the number 30 of rows of the transformed check matrix H' of FIG. 203 by the number 5 of rows (unit size P) of the configuration matrix. The FIFO $\mathbf{300}_y$ (y=1, 2, . . . , 6) includes a plurality of stages of storage areas, and for each stage storage area, messages corresponding to five branches of which the number is the number of rows and the number of columns of the configuration matrix (unit size P) can be read and written simultaneously. In addition, the number of stages of the storage areas of the FIFO $\mathbf{300}_y$ is 9, which is the maximum number of 1's (Hamming weights) in the row direction of the transformed check matrix of FIG. 203.

The FIFO $\mathbf{300}_1$ stores the data (message $v_i$ from the variable node) corresponding to the positions of 1's in the first to fifth rows of the transformed check matrix H' in FIG. 203 in the form where all the rows are packed in the horizontal direction (in the form ignoring 0). That is, if the j-th row and the i-th column are denoted by (j, i), the first stage storage area of the FIFO $\mathbf{300}_1$ stores the data corresponding to the positions of 1's of the 5×5 unit matrix of (1, 1) to (5, 5) of the transformed check matrix H'. The second stage storage area stores the data corresponding to the positions of 1's of the shift matrix (the shift matrix obtained by cyclically shifting the 5×5 unit matrix in the right direction by 3) of (1, 21) to (5, 25) of the transformed check matrix H'. Similarly, the third to eighth stage storage areas also stores the data in association with the transformed check matrix H'. Then, the ninth stage storage area stores the data corresponding to the positions of 1's of the shift matrix (the shift matrix obtained by cyclically shifting to the left by 1 by replacing 1 in the first row of the 5×5 unit matrix with 0) of (1, 86) to (5, 90) of the transformed check matrix H'.

The FIFO $\mathbf{300}_2$ stores the data corresponding to the positions of 1's in the 6th to 10th rows of the transformed check matrix H' of FIG. 203. That is, the first stage storage area of the FIFO $\mathbf{300}_2$ stores the data corresponding to the positions of 1's of the first shift matrix constituting the sum matrix (the sum matrix which is the sum of the first shift matrix obtained by cyclically shifting the 5×5 unit matrix by one to the right and the second shift matrix obtained by cyclically shifting the 5×5 unit matrix by two to the right) of (6, 1) to (10, 5) of the transformed check matrix H'. In addition, the second stage storage area stores the data corresponding to the positions of 1's of the second shift matrix constituting the sum matrix of (6, 1) to (10, 5) of the transformed check matrix H'.

That is, for a configuration matrix having a weight of 2 or more, when the configuration matrix is represented in the form of a sum of a plurality of matrices among P×P unit matrices having a weight of 1, quasi-unit matrices in which one or more of the elements of 1's of the unit matrix becomes 0, or shift matrices obtained by cyclically shifting the unit matrix or the quasi-unit matrix, the data (messages corresponding to branches belonging to the unit matrices, the quasi-unit matrices, or the shift matrices) corresponding to the positions of 1's of the unit matrices having a weight of 1, the quasi-unit matrices, or the shift matrices are stored in the same address (the same FIFO among the FIFOs $\mathbf{300}_1$ to $\mathbf{300}_6$).

Hereinafter, the third to ninth stage storage areas also store the data in association with the transformed check matrix H'.

Similarly, the FIFOs $\mathbf{300}_3$ to $\mathbf{300}_6$ store the data in association with the transformed check matrix H'.

The branch data storage memory 304 includes 18 FIFOs $\mathbf{304}_1$ to $\mathbf{304}_{18}$ of which the number is obtained by dividing the number 90 of columns of the transformed check matrix H' by the number 5 of columns (unit size P) of the configuration matrix. The FIFO $\mathbf{304}_x$ (x=1, 2, . . . , 18) includes a plurality of storage areas, and for each stage storage areas, messages corresponding to five branches of which the number is the number of rows and the number of columns of the configuration matrix (unit size P) can be read and written simultaneously.

The FIFO $\mathbf{304}_1$ stores the data (message $u_j$ from the check node) corresponding to the positions of 1's in the first to fifth columns of the transformed check matrix H' of FIG. 203 in the form where all the columns are packed in the vertical direction (in the form of ignoring 0). That is, the first stage storage area of the FIFO $\mathbf{304}_1$ stores the data corresponding to the positions of 1's of the 5×5 unit matrix of (1, 1) to (5, 5) of the transformed check matrix H'. The second stage storage area stores the data corresponding to the positions of 1's of the first shift matrix constituting the sum matrix (the sum matrix which is the sum of the first shift matrix obtained by cyclically shifting the 5×5 unit matrix to the right by one and the second shift matrix obtained by cyclically shifting the 5×5 unit matrix to the right by two) of (6, 1) to (10, 5) of the transformed check matrix H'. In addition, the third stage storage area also stores the data corresponding to the positions of 1's of the second shift matrix constituting the sum matrix of (6, 1) to (10, 5) of the transformed check matrix H'.

That is, for a configuration matrix having a weight of 2 or more, when the configuration matrix is represented in the form of a sum of a plurality of matrices among P×P unit matrices having a weight of 1, quasi-unit matrices in which one or more of the elements of 1's of the unit matrix becomes 0, or shift matrices obtained by cyclically shifting the unit matrix or the quasi-unit matrix, the data (messages corresponding to branches belonging to the unit matrices, the quasi-unit matrices, or the shift matrices) corresponding to the positions of 1's of the unit matrices having a weight of 1, the quasi-unit matrices, or the shift matrices are stored in the same address (the same FIFO among the FIFOs 304$_1$ to 304$_{18}$).

Hereinafter, the fourth and fifth stage storage areas also store the data in association with the transformed check matrix H'. The number of stages of the storage areas of the FIFO 304$_1$ is 5, which is the maximum number of 1's (Hamming weights) in the row direction in the first to fifth columns of the transformed check matrix H'.

Similarly, the FIFOs 304$_2$ and 304$_3$ also store the data in association with the transformed check matrix H', and each has a length (number of stages) of 5. Similarly, the FIFOs 304$_4$ to 304$_{12}$ also store the data in association with the transformed check matrix H', and each has a length of 3. Similarly, the FIFOs 304$_{13}$ to 304$_{18}$ also store the data in association with the transformed check matrix H', and each has a length of 2.

Next, the operations of the decoding device in FIG. 204 will be described.

The branch data storage memory 300 includes six FIFOs 300$_1$ to 300$_6$ and selects the FIFOs for storing the data from the FIFOs 300$_1$ to 300$_6$ according to information (matrix data) D312 on which rows of the transformed check matrix H' of FIG. 203 the five messages D311 supplied from the cyclic shift circuit 308 in the previous stage belong to and collectively and sequentially stores the five messages D311 in the selected FIFOs. In addition, when reading the data, the branch data storage memory 300 sequentially reads the five messages D300$_1$ from the FIFO 300$_1$ and supplies the messages to the selector 301 of the next stage. The branch data storage memory 300 sequentially reads the messages from the FIFOs 300$_2$ to 300$_6$ after the end of the reading of the messages from the FIFO 300$_1$ and supplies the messages to the selector 301.

The selector 301 selects five messages from the FIFO, from which the data is currently being read, among the FIFOs 300$_1$ to 300$_6$ according to the selection signal D301 and supplies the messages as the messages D302 to the check node calculation unit 302.

The check node calculation unit 302 includes five check node calculators 302$_1$ to 302$_5$, and The check node calculation unit 302 performs the check node operation by using messages D302 (D302$_1$ to D302$_5$) (messages $v_i$ of Formula (7)) supplied through the selector 301 according to Formula (7) and supplies five messages D303 (D303$_1$ to D303$_5$) (messages u of Formula (7)) obtained as a result of the check node operation to the cyclic shift circuit 303.

The cyclic shift circuit 303 cyclically shifts the five messages D303$_1$ to D303$_5$ obtained by the check node calculation unit 302 on the basis of information (matrix data) D305 as to which times of cyclically shifting are performed on the unit matrix (or quasi-unit matrix) in the transformed check matrix H' in which corresponding branches are original and supplies messages D304 obtained as a result thereof to the branch data storage memory 304.

The branch data storage memory 304 includes 18 FIFOs 304$_1$ to 304$_{18}$ and selects the FIFOs for storing the data from the FIFOs 304$_1$ to 304$_{18}$ according to the information D305 on which rows of the transformed check matrix H' the five messages D304 supplied from the cyclic shift circuit 303 in the previous stage belong to and collectively and sequentially stores the five messages D304 in the selected FIFOs. In addition, when reading the data, the branch data storage memory 304 sequentially reads five messages D306$_1$ from the FIFO 304$_1$ and supplies the messages to the selector 305 of the next stage. The branch data storage memory 304 sequentially reads the messages from the FIFOs 304$_2$ to 304$_{18}$ and supplies the messages to the selector 305 after the end of the reading of the data from the FIFO 304$_1$.

The selector 305 selects five messages from the FIFO from which the data is currently being read, among the FIFOs 304$_1$ to 304$_{18}$ according to the selection signal D307 and supplies the messages as messages D308 to the variable node calculation unit 307 and the decoded word calculation unit 309.

On the other hand, the received data rearrangement unit 310 rearranges the LDPC code D313 corresponding to the check matrix H of FIG. 201 received via the communication line 13 by performing the column permutation of Formula (12) and supplies a received data D314 to the received data memory 306. The received data memory 306 calculates and stores reception LLRs (log likelihood ratios) from the received data D314 supplied from the received data rearrangement unit 310, groups the five reception LLRs into reception values D309, and supplies the reception values to the variable node calculation unit 307 and the decoded word calculation unit 309.

The variable node calculation unit 307 includes five variable node calculation units 307$_1$ to 307$_5$ and performs the variable node operation according to Formula (1) by using the messages D308 (D308$_1$ to D308$_5$) (messages $u_j$ of Formula (1)) supplied through the selector 305 and the five reception values D309 (the reception values $u_{0i}$ of Formula (1)) supplied from the received data memory 306 and supplies the messages D310 (D310$_1$ to D310$_5$) obtained as a result of the operation (messages $v_i$ of Formula (1)) to the cyclic shift circuit 308.

The cyclic shift circuit 308 cyclically shifts the messages D310$_1$ to D310$_5$ calculated by the variable node calculation unit 307 on the basis of information as to which times of cyclically shifting are performed on the unit matrix (or quasi-unit matrix) in the transformed check matrix H' in which corresponding branches are original and supplies messages D311 obtained as a result thereof to the branch data storage memory 300.

By one cycle of the above operations, one decoding (variable node operation and check node operation) of the LDPC code can be performed. After the decoding the LDPC code a predetermined number of times, the decoding device of FIG. 204 obtains and outputs a final decoding result in the decoded word calculation unit 309 and the decoded data rearrangement unit 311.

That is, the decoded word calculation unit 309 includes five decoded word calculators 309$_1$ to 309$_5$, and the decoded word calculation unit 309 calculates the decoding result (decoded word) on the basis of Formula (5) as the final stage of multiple times of decoding by using the five messages D308 (D308$_1$ to D308$_5$) (messages $u_j$ of Formula (5)) output from the selector 305 and the five reception values D309 (reception values $u_{0i}$ of Formula (5)) supplied from the received data memory 306 and supplies a decoded data D315 obtained as a result thereof to the decoded data rearrangement unit 311.

The decoded data rearrangement unit 311 rearranges the order by performing reverse permutation of the column permutation of Formula (12) on the decoded data D315 supplied from the decoded word calculation unit 309 and outputs the final decoding result D316.

As described above, by performing one or both of the row permutation and the column permutation on the check matrix (original check matrix) to be converted into a check matrix (transformed check matrix) that can be represented by a combination of P×P unit matrices, quasi-unit matrices in which one or more of the elements of 1's of the unit matrix becomes 0, shift matrices obtained by cyclically shifting the unit matrix or the quasi-unit matrix, sum matrices, each of which is a sum of a plurality of the unit matrices, the quasi-unit matrices, or the shift matrices, and P×P zero matrices, that is, a combination of configuration matrices, it is possible to adopt an architecture in which P check node operations and P variable node operations are simultaneously performed with the number P being smaller than the number of rows or the number of columns of the check matrix for the decoding of the LDPC code. In the case of adopting an architecture in which P node operations (check node operations and variable node operations) are simultaneously performed with the number P of node operations being smaller than the number of rows or the number of columns of the check matrix, as compared with the case of simultaneously performing the node operations of which the number is equal to the number of rows or the number columns of the check matrix, it is possible to perform a large number of times of repetition of the decoding while refraining an operating frequency within a feasible range.

For example, similarly to the decoding device of FIG. 204, the LDPC decoder 166 constituting the reception device 12 of FIG. 198 performs the LDPC decoding by simultaneously performing P check node operations and P variable node operations.

That is, for simplifying the description, if the check matrix of the LDPC code output from the LDPC encoder 115 constituting the transmission device 11 of FIG. 8 is assumed to be a check matrix H in which the parity matrix has a staircase structure, for example, as illustrated in FIG. 201, the parity interleaver 23 of the transmission device 11 performs the parity interleaving of interleaving the (K+qx+y+1)-th code bit to the position of the (K+Py+x+1)-th code bit in a state where the information length K is set to 60, the unit size P is set to 5, and the divisor q (=M/P) of the parity length M is set to 6, respectively.

Since this parity interleaving corresponds to the column permutation of Formula (12) as described above, the LDPC decoder 166 does not need to perform the column permutation of Formula (12).

For this reason, in the reception device 12 of FIG. 198, as described above, the group-wise deinterleaver 55 supplies, to the LDPC decoder 166, the LDPC code on which the parity deinterleaving has not been performed, that is, the LDPC code in a state where the column permutation of Formula (12) is performed. And the LDPC decoder 166 performs the processing similar to that of the decoding device of FIG. 204 except that the column permutation of Formula (12) is not performed.

That is, FIG. 205 is a diagram illustrating a configuration example of the LDPC decoder 166 of FIG. 198.

In FIG. 205, the LDPC decoder 166 is configured in a manner similar to the decoding device in FIG. 204 except that the received data rearrangement unit 310 of FIG. 204 is not provided. And, the LDPC decoder 166 performs similar processing to that of the decoding device of FIG. 204 except that the column permutation of Formula (12) is not performed, and thus, the description is omitted.

As described above, since the LDPC decoder 166 can be configured without providing the received data rearrangement unit 310, the size can be reduced compared with the decoding device in FIG. 204.

In addition, in FIGS. 201 to 205, for simplifying the description, the code length N of the LDPC code is set to 90, the information length K is set to 60, the unit size (the number of rows and the number of columns of the configuration matrix) P is set to 5, and the divisor q (=M/P) of the parity length M is set to 6, respectively, but the code length N, information length K, unit size P, and the divisor q (=M/P) are not limited to the values described above.

That is, in the transmission device 11 of FIG. 8, the output of the LDPC encoder 115 is an LDPC code, for example, with a code length N of 64800, 16200, 69120, or the like, information length K of N−Pq (=N−M), and a unit size P of 360, and a divisor q of M/P. The LDPC decoder 166 of FIG. 205 can be applied to the case of performing the LDPC decoding by simultaneously performing the P check node operations and the P variable node operations on such an LDPC code.

In addition, after the decoding of the LDPC code in the LDPC decoder 166, in a case where the portion of the parity of the decoding result is unnecessary and only the information bit of the decoding result is output, the LDPC decoder 166 can be configured without the decoded data rearrangement unit 311.

<Configuration Example of Block Deinterleaver 54>

FIG. 206 is a diagram illustrating the block deinterleaving performed by the block deinterleaver 54 of FIG. 199.

In the block deinterleaving, the arrangement of code bits of the LDPC code is returned (restored) to the original arrangement by performing processing reverse to the block interleaving of the block interleaver 25 described with reference to FIG. 117.

That is, in the block deinterleaving, for example, similarly to the block interleaving, the arrangement of the LDPC code is returned to the original arrangement by writing and reading the LDPC code with respect to m columns equal to the bit number m of the symbol.

However, in the block deinterleaving, the writing of the LDPC code is performed in the order of the reading of the LDPC code in the block interleaving. Furthermore, in the block deinterleaving, the reading of the LDPC code is performed in the order of the writing of the LDPC code in the block interleaving.

That is, for the Part 1 of the LDPC code, as illustrated in FIG. 206, the Part 1 of the LDPC code which is configured with m-bit symbol units is written in the row direction from the first row of all m columns. That is, the code bits of the LDPC code, which are m-bit symbols, are written in the row direction.

The writing of the Part 1 in units of m bits is sequentially performed toward the lower row of the m columns, and if the writing of the Part 1 is ended, as illustrated in FIG. 206, the reading of the Part 1 downward from the top of the first column unit of the column is performed from the left towards the right column.

If the reading up to the rightmost column is ended, as illustrated in FIG. 206, the process returns to the leftmost column, and the reading of the Part 1 downward from the top of the second column unit of the column is performed from the left towards the right column, and in a similar manner, the reading of the Part 1 of the LDPC code of one code word is performed.

If the reading of the Part 1 of the LDPC code of one code word is ended, with respect to the Part 2 which are configured with m-bit symbol units, the m-bit symbol units are sequentially concatenated after the Part 1, so that the LDPC code of the symbol units is returned to an arrangement of code bits of the original LDPC code of one code word (LDCP code before the block interleaving).

<Another Configuration Example of Bit Deinterleaver 165>

FIG. 207 is a block diagram illustrating another configuration example of the bit deinterleaver 165 of FIG. 198.

Note that, in the figure, the portions corresponding to the case of FIG. 199 are denoted by the same reference numerals, and the description thereof will be appropriately omitted below.

That is, the bit deinterleaver 165 of FIG. 207 is configured to be similar to the case of FIG. 199 except that a parity deinterleaver 1011 is newly provided.

In FIG. 207, the bit deinterleaver 165 includes a block deinterleaver 54, a group-wise deinterleaver 55, and a parity deinterleaver 1011 and performs bit deinterleaving of code bits of the LDPC code from the demapper 164.

That is, the block deinterleaver 54 performs block deinterleaving (reverse processing of block interleaving) corresponding to the block interleaving performed by the block interleaver 25 of the transmission device 11 on the LDPC code from the demapper 164, that is, performs returning the positions of the code bits replaced by the block interleaving to the original positions and supplies the LDPC code obtained as the result to the group-wise deinterleaver 55.

The group-wise deinterleaver 55 performs group-wise deinterleaving corresponding to the group-wise interleaving as rearrangement processing performed by the group-wise interleaver 24 of the transmission device 11 on the LDPC code from the block deinterleaver 54.

The LDPC code obtained as a result of the group-wise deinterleaving is supplied from the group-wise deinterleaver 55 to the parity deinterleaver 1011.

The parity deinterleaver 1011 performs parity deinterleaving (reverse processing of parity interleaving) corresponding to the parity interleaving performed by the parity interleaver 23 of the transmission device 11 on the code bits after the group-wise deinterleaving in the group-wise deinterleaver 55, that is, performs parity deinterleaving to return the code bits of the LDPC code rearranged by the parity interleaving to the original code bits.

The LDPC code obtained as a result of the parity deinterleaving is supplied from the parity deinterleaver 1011 to the LDPC decoder 166.

Therefore, in the bit deinterleaver 165 of FIG. 207, the LDPC code on which the block deinterleaving, the group-wise deinterleaving, and the parity deinterleaving have be performed, that is, the LDPC code obtained by the LDPC encoding according to the check matrix H is supplied to the LDPC decoder 166.

The LDPC decoder 166 performs the LDPC decoding of the LDPC code from the bit deinterleaver 165 by using the check matrix H used by the LDPC encoder 115 of the transmission device 11 for the LDPC encoding.

That is, for the type-B scheme, the LDPC decoder 166 performs the LDPC decoding of the LDPC code from the bit deinterleaver 165 by using the check matrix H itself (of the type-B scheme) used for the LDPC encoding by the LDPC encoder 115 of the transmission device 11 or the transformed check matrix obtained by performing at least the column permutation corresponding to the parity interleaving on the check matrix H. In addition, for the type-A scheme, the LDPC decoder 166 performs the LDPC decoding of the LDPC code from the bit deinterleaver 165 by using the check matrix (FIG. 28) obtained by the column permutation on the check matrix (FIG. 27) (of the type-A scheme) uses for the LDPC encoding by the LDPC encoder 115 of the transmission device 11 or the transformed check matrix (FIG. 29) obtained by performing the row permutation on the check matrix (FIG. 27) used for the LDPC encoding.

Herein, in FIG. 207, since (the parity deinterleaver 1011 of) the bit deinterleaver 165 supplies the LDPC code obtained by the LDPC encoding according to the check matrix H to the LDPC decoder 166, in a case where the LDPC decoding of the LDPC code is performed by using the check matrix H of type-B scheme itself used for the LDPC encoding by the LDPC encoder 115 of the transmission device 11 or the check matrix (FIG. 28) obtained by performing the column permutation on the check matrix of the type-A scheme (FIG. 27) used for the LDPC encoding, the LDPC decoder 166 may be configured with a decoding device that performs the LDPC decoding, for example, in a full serial decoding scheme in which operations of the messages (check node message and variable node message) are sequentially performed on one node by one node or a decoding device that performs the LDPC decoding in a full parallel decoding scheme in which the operations of the messages simultaneously (in parallel) performed on all nodes.

In addition, in a case where the LDPC decoder 166 performs the LDPC decoding of the LDPC codes by using the transformed check matrix obtained by performing at least the column permutation corresponding to the parity interleaving on the check matrix H of the type-B scheme used for the LDPC encoding by the LDPC encoder 115 of the transmission device 11 or the transformed check matrix (FIG. 29) obtained by performing the row permutation on the check matrix of the type-A scheme (FIG. 27) used for the LDPC encoding, the LDPC decoder 166 may be configured with a decoding device having an architecture that simultaneously performs check node operations and variable node operation P (or a divisor of P other than 1) times as the decoding device (FIG. 204) including the received data rearrangement unit 310 that rearranges the code bits of the LDPC code by performing the column permutation, which is similar to the column permutation (parity interleaving) for obtaining the transformed check matrix, on the LDPC code.

Note that, in FIG. 207, for the convenience of description, the block deinterleaver 54 for performing the block deinterleaving, the group-wise deinterleaver 55 for performing the group-wise deinterleaving, and the parity deinterleaver 1011 for performing the parity deinterleaving are separately configured. However, two or more of the block deinterleaver 54, the group-wise deinterleaver 55, and the parity deinterleaver 1011 can be integrally configured, similarly to the parity interleaver 23, the group-wise interleaver 24, and the block interleaver 25 of the transmission device 11.

<Example of Configuration of Reception System>

FIG. 208 is a block diagram illustrating a first configuration example of a reception system to which the reception device 12 can be applied.

In FIG. 208, the reception system includes an acquisition unit 1101, a transmission-line decoding processing unit 1102, and an information-source decoding processing unit 1103.

The acquisition unit 1101 acquires a signal including an LDPC code obtained by performing at least LDPC encoding on an LDPC target data such as an image data and an audio data of a program via a transmission line (communication line) (not illustrated) of, for example, a terrestrial digital broadcast, a satellite digital broadcast, a CATV network, the Internet, other networks, or the like and supplies the signal to the transmission-line decoding processing unit 1102.

Herein, in a case where the signal acquired by the acquisition unit 1101 is broadcasted from, for example, a broadcasting station via terrestrial wave lines, satellite waves, cable television (CATV) networks, or the like, the acquisition unit 1101 may be configured with a tuner, a set-top box (STB), or the like. In addition, in a case where the signal acquired by the acquisition unit 1101 is transmitted from, for example, the web server by multicast such as internet protocol television (IPTV), the acquisition unit 1101 may be configured with a network interface (I/F) of, for example, a network interface card (NIC) or the like.

The transmission-line decoding processing unit 1102 corresponds to the reception device 12. The transmission-line decoding processing unit 1102 performs transmission-line decoding processing including at least processing for correcting an error occurring in the transmission line on the signal acquired by the acquisition unit 1101 via the transmission line and supplies a signal obtained as a result thereof to the information-source decoding processing unit 1103.

That is, the signal acquired by the acquisition unit 1101 via the transmission line is a signal obtained by performing at least error correction coding for correcting an error occurring in the transmission line, and the transmission-line decoding processing unit 1102 performs, for example, transmission-line decoding processing such as error correction processing on such a signal.

Herein, as the error correction coding, for example, there are LDPC encoding, BCH encoding, and the like. Herein, at least the LDPC encoding is performed as the error correction coding.

In addition, the transmission-line decoding processing may include demodulation of a modulated signal and the like.

The information-source decoding processing unit 1103 performs information-source decoding processing including at least processing of decompressing compressed information into original information on the signal on which the transmission-line decoding processing has been performed.

That is, in some cases, in order to reduce the amount of data such as an image and an audio as information, compression encoding for compressing the information may be performed on the signal acquired by the acquisition unit 1101 via the transmission line. In this case, the information-source decoding processing unit 1103 performs information-source decoding processing such as processing (decompression processing) of decompressing compressed information into original information on the signal on which the transmission-line decoding processing has been performed.

In addition, in a case where the compression encoding is not performed on the signal acquired by the acquisition unit 1101 via the transmission line, the information-source decoding processing unit 1103 performs the decompressing process on the compressed information to the original information.

Herein, as the decompression process, for example, there are MPEG decoding and the like. In addition to the decompression processing, the transmission-line decoding processing may include descrambling and the like.

In the reception system configured as described above, in the acquisition unit 1101, for example, the compression encoding such as MPEG encoding is performed on the data such as an image and an audio, and in addition, the signal formed by performing the error correction coding such as LDPC encoding is acquired via the transmission line and supplied to the transmission-line decoding processing unit 1102.

In the transmission-line decoding processing unit 1102, for example, processing similar to that performed by the reception device 12 or the like is performed as transmission-line decoding processing on the signal from the acquisition unit 1101, and a signal obtained as a result thereof is supplied to the information-source decoding processing unit 1103.

In the information-source decoding processing unit 1103, information-source decoding processing such as MPEG decoding is performed on the signal from the transmission-line decoding processing unit 1102, and an image or an audio obtained as a result thereof is output.

The reception system of FIG. 208 as described above can be applied to, for example, a television tuner or the like that receives television broadcasting as digital broadcast.

In addition, each of the acquisition unit 1101, the transmission-line decoding processing unit 1102, and the information-source decoding processing unit 1103 is configured as one independent device (hardware (integrated circuit (IC) or the like) or software module).

In addition, for the acquisition unit 1101, the transmission-line decoding processing unit 1102, and the information-source decoding processing unit 1103, a set of the acquisition unit 1101 and the transmission-line decoding processing unit 1102, a set of the transmission-line decoding processing unit 1102 and the information-source decoding processing unit 1103, and a set of the acquisition unit 1101, the transmission-line decoding processing unit 1102, and the information-source decoding processing unit 1103 can be configured as one independent device.

FIG. 209 is a block diagram illustrating a second configuration example of a reception system to which the reception device 12 can be applied.

In addition, in the figure, the portions corresponding to those of the case of FIG. 208 are denoted by the same reference numerals, and the description thereof will be appropriately omitted below.

The reception system of FIG. 209 is the same as the case of FIG. 208 in that the reception system includes the acquisition unit 1101, the transmission-line decoding processing unit 1102, and the information-source decoding processing unit 1103 and is different from the case of FIG. 208 in that an output unit 1111 is newly provided.

The output unit 1111 is, for example, a display device for displaying an image or a speaker for outputting an audio and outputs an image, an audio, or the like as a signal output from the information-source decoding processing unit 1103. That is, the output unit 1111 displays an image or outputs an audio.

The reception system of FIG. 209 as described above can be applied to, for example, a television (TV) set that receives television broadcasting as digital broadcast, a radio receiver that receives radio broadcast, and the like.

In addition, in a case where compression encoding is not performed on the signal acquired by the acquisition unit 1101, the signal output from the transmission-line decoding processing unit 1102 is supplied to the output unit 1111.

FIG. 210 is a block diagram illustrating a third configuration example of a reception system to which the reception device 12 can be applied.

In addition, in the figure, the portions corresponding to those of the case of FIG. 208 are denoted by the same reference numerals, and the description thereof will be appropriately omitted below.

The reception system of FIG. 210 is the same as the case of FIG. 208 in that the reception system includes the acquisition unit 1101 and the transmission-line decoding processing unit 1102.

However, the reception system of FIG. 210 is different from the case of FIG. 208 in that the information-source decoding processing unit 1103 is not provided and a recording unit 1121 is newly provided.

The recording unit 1121 records a signal (for example, a TS packet of TS of MPEG) output by the transmission-line decoding processing unit 1102 on a recording (storage) medium such as an optical disk, a hard disk (magnetic disk), or a flash memory.

The reception system of FIG. 210 as described above can be applied to a recorder or the like that records television broadcasting.

In addition, in FIG. 210, the reception system is configured by providing the information-source decoding processing unit 1103 and can record the signal after the information-source decoding processing is performed in the information-source decoding processing unit 1103, that is, an image or an audio obtained by decoding in the recording unit 1121.

<One Embodiment of Computer>

Next, a series of processes described above can be performed by hardware or software. In a case where the series of processes are performed by software, a program constituting the software is installed in a general-purpose computer or the like.

Thus, FIG. 211 illustrates a configuration example of an embodiment of a computer in which a program executing the series of processes described above is installed.

The program can be recorded in advance in a hard disk 705 or a ROM 703 as a recording medium built in the computer.

Alternatively, the program can be temporarily or permanently stored (recorded) in a removable recording medium 711 such as a flexible disc, a compact disc read only memory (CD-ROM), a magneto optical disc (MO), a digital versatile disc (DVD), a magnetic disc, or a semiconductor memory. Such removable recording medium 711 can be provided as so-called package software.

Note that, besides the program that is installed on the computer from the removable recording medium 711 as described above, the program may be wirelessly transferred from a download site to the computer via an artificial satellite for digital satellite broadcasting or may be transferred by wire to the computer via a network such as a local area network (LAN) or the Internet, and the computer can receive the program transferred as such by the communication unit 708 and install the program in the built-in hard disk 705.

The computer incorporates a central processing unit (CPU) 702. An input/output interface 710 is connected to the CPU 702 via a bus 701. When a command of operating an input unit 707 including a keyboard, a mouse, a microphone, and the like is input by the user via the input/output interface 710, the CPU 702 executes a program stored in the read only memory (ROM) 703 according to the command. Alternatively, in addition, the CPU 702 loads a program stored in the hard disk 705, a program transferred from a satellite or a network, received by the communication unit 708, and installed in the hard disk 705, or a program read from the removable recording medium 711 mounted on the drive 709 and installed in the hard disk 705 to a random access memory (RAM) 704 and executes the program. Thus, the CPU 702 performs the processing according to the above-described flowchart or the processing performed by the configurations of the above-described block diagrams. Then, the CPU 702 outputs the processing result from the output unit 706 configured with a liquid crystal display (LCD), a speaker, or the like, transmits the processing result from the communication unit 708, or records the processing result on the hard disk 705 or the like, for example, via the input/output interface 710 as necessary.

Herein, in the present specification, processing steps for describing a program for causing a computer to perform various processing are not necessarily processed in time series in accordance with the order described as a flowchart, and the present invention also includes the processing (for example, parallel processing or processing by objects) to be performed in parallel or individually.

In addition, the program may be processed by one computer or may be distributed and processed by a plurality of computers. Furthermore, the program may be transferred to a remote computer for execution.

In addition, the embodiments of the present technology are not limited to the above-described embodiments, and various modifications can be made without departing from the scope of the present technology.

For example, the above-described new LDPC code (check matrix initial value table) and GW pattern can be used for a satellite line, a terrestrial wave line, a cable (wired line), and other communication lines 13 (FIG. 7). Furthermore, the new LDPC code and GW pattern can be used for data transmission other than digital broadcasting.

In addition, the effects described in this specification are only examples and not limited, and there may be other effects.

REFERENCE SIGNS LIST

11 Transmission device
12 Reception device
23 Parity interleaver
24 Group-wise interleaver
25 Block interleaver
54 Block deinterleaver
55 Group-wise deinterleaver
111 Mode adaptation/multiplexer
112 Padder
113 BB scrambler
114 BCH encoder
115 LDPC encoder
116 Bit interleaver
117 Mapper
118 Time interleaver
119 SISO/MISO encoder
120 Frequency interleaver
121 BCH encoder
122 LDPC encoder
123 Mapper
124 Frequency interleaver
131 Frame builder & resource allocation unit
132 OFDM generation unit
151 OFDM processing unit
152 Frame management unit
153 Frequency deinterleaver

154 Demapper
155 LDPC decoder
156 BCH decoder
161 Frequency deinterleaver
162 SISO/MISO decoder
163 Time deinterleaver
164 Demapper
165 Bit deinterleaver
166 LDPC decoder
167 BCH decoder
168 BB descrambler
169 Null deletion unit
170 Demultiplexer
300 Branch data storage memory
301 Selector
302 Check node calculation unit
303 Cyclic shift circuit
304 Branch data storage memory
305 Selector
306 Received data memory
307 Variable node calculation unit
308 Cyclic shift circuit
309 Decoded word calculation unit
310 Received data rearrangement unit
311 Decoded data rearrangement unit
601 Encoding processing unit
602 Storage unit
611 Encoding rate setting unit
612 Initial value table reading unit
613 Check matrix generation unit
614 Information bit reading unit
615 Encoding parity calculation unit
616 Control unit
701 Bus
702 CPU
703 ROM
704 RAM
705 Hard disk
706 Output unit
707 Input unit
708 Communication unit
709 Drive
710 Input/output interface
711 Removable recording medium
1001 Reverse replacement unit
1002 Memory
1011 Parity deinterleaver
1101 Acquisition unit
1102 Transmission-line decoding processing unit
1103 Information-source decoding processing section
1111 Output unit
1121 Recording unit

The invention claimed is:

1. A transmission method, comprising:

an encoding step of performing LDPC encoding based on a check matrix of an LDPC code with a code length N of 69120 bits and an encoding rate r of 2/16;

a group-wise interleaving step of performing group-wise interleaving of interleaving the LDPC code in units of bit groups of 360 bits; and a mapping step of mapping the LDPC code in one of 4096 signal points of 1D-non-uniform constellation (NUC) of 4096 QAM in units of 12 bits, wherein in the group-wise interleaving, (i+1)-th bit group from a lead of the LDPC code is set as a bit group i, and an arrangement of bit groups 0 to 191 of the 69120-bit LDPC code is interleaved into an arrangement of a bit group 166, 161, 43, 77, 177, 54, 162, 185, 127, 62, 6, 64, 30, 12, 27, 89, 130, 116, 190, 28, 38, 135, 149, 164, 48, 173, 175, 71, 132, 68, 5, 111, 158, 24, 59, 26, 145, 118, 51, 37, 178, 69, 189, 163, 133, 98, 53, 29, 169, 188, 17, 180, 155, 73, 45, 22, 107, 104, 76, 143, 70, 88, 99, 124, 126, 34, 80, 10, 168, 66, 72, 123, 63, 140, 176, 49, 65, 50, 52, 122, 4, 181, 121, 57, 18, 101, 42, 179, 100, 157, 165, 106, 156, 95, 170, 174, 117, 109, 102, 186, 148, 3, 134, 96, 67, 150, 151, 153, 11, 83, 1, 105, 25, 144, 8, 108, 84, 78, 97, 141, 60, 16, 112, 7, 82, 93, 46, 137, 35, 103, 61, 113, 129, 20, 119, 92, 31, 154, 115, 56, 44, 90, 14, 131, 160, 2, 36, 21, 23, 110, 152, 187, 0, 184, 41, 183, 120, 146, 47, 114, 32, 81, 75, 39, 91, 136, 167, 172, 58, 147, 125, 86, 138, 94, 33, 79, 159, 87, 55, 171, 85, 182, 191, 9, 19, 74, 13, 142, 40, 139, 15, 128, the check matrix includes:

an A matrix of M1 rows and K columns in an upper left of the check matrix, wherein the A matrix is indicated by a value M1 and an information length K of the LDPC code, and K=N×r;

a B matrix of M1 rows and M1 columns, wherein the B matrix has a staircase structure adjacent to the right of the A matrix;

a Z matrix of M1 rows and (N−K−M1) columns, wherein the Z matrix is a zero matrix adjacent to the right of the B matrix;

a C matrix of (N−K−M1) rows and (K+M1) columns, wherein the C matrix is adjacent and below each of the A matrix and the B matrix; and a D matrix of (N−K−M1) rows and (N−K−M1) columns, wherein the D matrix is a unit matrix adjacent to the right of the C matrix, the value M1 is 1800, the A matrix and the C matrix are represented by a check matrix initial value table, the check matrix initial value table represents positions of elements of 1's of the A matrix and the C matrix every 360 columns, and the check matrix is

---

1617 1754 1768 2501 6874 12486 12872 16244 18612 19698 21649
30954 33221 33723 34495 37587 38542 41510 42268 52159 59780
206 610 991 2665 4994 5681 12371 17343 25547 26291 26678 27791
27828 32437 33153 35429 39943 45246 46732 53342 60451
119 682 963 3339 6794 7021 7295 8856 8942 10842 11318 14050
14474 27281 28637 29963 37861 42536 43865 48803 59969
175 201 355 5418 7990 10567 10642 12987 16685 18463 21861 24307
25274 27515 39631 40166 43058 47429 55512 55519 59426
117 839 1043 1960 6896 19146 24022 26586 29342 29906 33129
33647 33883 34113 34550 38720 40247 45651 51156 53053 56614
135 236 257 7505 9412 12642 19752 20201 26010 28967 31146 37156
44685 45667 50066 51283 54365 55475 56501 58763 59121
109 840 1573 5523 19968 23924 24644 27064 29410 31276 31526
32173 38175 43570 43722 46655 46660 48353 54025 57319 59818
522 1236 1573 6563 11625 13846 17570 19547 22579 22584 29338
30497 33124 33152 35407 36364 37726 41426 53800 57130
504 1330 1481 13809 15761 20050 26339 27418 29630 32073 33762
34354 36966 43315 47773 47998 48824 50535 53437 55345
348 1244 1492 9626 9655 15638 22727 22971 28357 28841 31523
37543 41100 42372 48983 50354 51434 54574 55031 58193
742 1223 1459 20477 21731 23163 23587 30829 31144 32186 32235
32593 34130 40829 42217 42294 42753 44058 49940 51993
841 860 1534 5878 7083 7113 9658 10508 12871 12964 14023 21055

-continued 22680 23927 32701 35168 40986 42139 50708 55350
657 1018 1690 6454 7645 7698 8657 9615 16462 18030 19850 19857
33265 33552 42208 44424 48965 52762 55439 58299
14 511 1376 2586 6797 9409 9599 10784 13076 18509 27363 27667
30262 34043 37043 38143 40246 53811 58872 59250
315 883 1487 2067 7537 8749 10785 11820 15702 20232 22850 23540
30247 41182 44884 50601 52140 55970 57879 58514
256 1442 1534 2342 9734 10789 15334 15356 20334 20433 22923
23521 29391 30553 35406 35643 35701 37968 39541 58097
260 1238 1557 14167 15271 18046 20588 23444 25820 26660
30619 31625 33258 38554 40401 46471 53589 54904 56455 60016
591 885 1463 3411 14043 17083 17372 23029 23365 24691 25527
26389 28621 29999 40343 40359 40394 45685 46209 54887
1119 1411 1664 7879 17732 27000 28506 32237 32445 34100 34926
36470 42848 43126 44117 48780 49519 49592 51901 56580
147 1333 1560 6045 11526 14867 15647 19496 26626 27600 28044
30446 35920 37523 42907 42974 46452 52480 57061 60152
304 591 680 5557 6948 13550 19689 19697 22417 23237 25813 31836
32736 36321 36493 36671 46756 53311 59230 59248
586 777 1018 2393 2817 4057 8068 10632 12430 13193 16433 17344
24526 24902 27693 39301 39776 42300 45215 52149
684 1425 1732 2436 4279 7375 8493 10023 14908 20703 25656 25757
27251 27316 33211 35741 38872 42908 55079 58753
962 981 1773 2814 3799 6243 8163 12655 21226 31370 32506 35372
36697 47037 49095 55400 57506 58743 59678 60422
6229 6484 8795 8981 13576 28622 35526 36922 37284 42155 43443
44080 44446 46649 50824 52987 59033
2742 5176 10231 10336 16729 17273 18474 25875 28227 34891 39826
42595 48600 52542 53023 53372 57331
3512 4163 4725 8375 8585 19795 22844 28615 28649 29481 41484
41657 53255 54222 54229 57258 57647
3358 5239 9423 10858 15636 17937 20678 22427 31220 37069 38770
42079 47256 52442 55152 56964 59169
2243 10090 12309 15437 19426 23065 24872 36192 36336 36949
41387 49915 50155 54338 54422 56561 57984.

2. A reception device, comprising:

a group-wise deinterleaving unit configured to return an arrangement of an LDPC code after group-wise interleaving, wherein the LDPC code is obtained from data transmitted from a transmission device to an original arrangement, the transmission device includes:

an encoding unit configured to perform an LDPC encoding process based on a check matrix of the LDPC code with a code length N of 69120 bits and an encoding rate r of 2/16, a group-wise interleaving unit configured to perform group-wise interleaving process, wherein in the group-wise interleaving process, the group-wise interleaving unit is further configured to interleave the LDPC code in units of bit groups of 360 bits; and a mapping unit configured to map the LDPC code in one of 4096 signal points of 1D-non-uniform constellation (NUC) of 4096 QAM in units of 12 bits, in the group-wise interleaving process, the group-wise interleaving unit is further configured to:

set (i+1)-th bit group from a lead of the LDPC code is set as a bit group i, and interleave an arrangement of bit groups 0 to 191 of the 69120-bit LDPC code into an arrangement of a bit group 166, 161, 43, 77, 177, 54, 162, 185, 127, 62, 6, 64, 30, 12, 27, 89, 130, 116, 190, 28, 38, 135, 149, 164, 48, 173, 175, 71, 132, 68, 5, 111, 158, 24, 59, 26, 145, 118, 51, 37, 178, 69, 189, 163, 133, 98, 53, 29, 169, 188, 17, 180, 155, 73, 45, 22, 107, 104, 76, 143, 70, 88, 99, 124, 126, 34, 80, 10, 168, 66, 72, 123, 63, 140, 176, 49, 65, 50, 52, 122, 4, 181, 121, 57, 18, 101, 42, 179, 100, 157, 165, 106, 156, 95, 170, 174, 117, 109, 102, 186, 148, 3, 134, 96, 67, 150, 151, 153, 11, 83, 1, 105, 25, 144, 8, 108, 84, 78, 97, 141, 60, 16, 112, 7, 82, 93, 46, 137, 35, 103, 61, 113, 129, 20, 119, 92, 31, 154, 115, 56, 44, 90, 14, 131, 160, 2, 36, 21, 23, 110, 152, 187, 0, 184, 41, 183, 120, 146, 47, 114, 32, 81, 75, 39, 91, 136, 167, 172, 58, 147, 125, 86, 138, 94, 33, 79, 159, 87, 55, 171, 85, 182, 191, 9, 19, 74, 13, 142, 40, 139, 15, 128, the check matrix includes:

an A matrix of M1 rows and K columns in an upper left of the check matrix, wherein the A matrix is indicated by a value M1 and an information length K=N×r of the LDPC code, and K=N×r;

a B matrix of M1 rows and M1 columns, wherein the B matrix has a staircase structure adjacent to the right of the A matrix;

a Z matrix of M1 rows and (N−K−M1) columns, wherein the Z matrix is a zero matrix adjacent to the right of the B matrix;

a C matrix of (N−K−M1) rows and (K+M1) columns, wherein the C matrix is adjacent and below each of the A matrix and the B matrix; and a D matrix of (N−K−M1) rows and (N−K−M1) columns, wherein the D matrix is a unit matrix adjacent to the right of the C matrix, the value M1 is 1800, the A matrix and the C matrix are represented by a check matrix initial value table, the check matrix initial value table represents positions of elements of 1's of the A matrix and the C matrix every 360 columns, and the check matrix is 1617 1754 1768 2501 6874 12486 12872 16244 18612 19698 21649 30954 33221 33723 34495 37587 38542 41510 42268 52159 59780
206 610 991 2665 4994 5681 12371 17343 25547 26291 26678 27791 27828 32437 33153 35429 39943 45246 46732 53342 60451
119 682 963 3339 6794 7021 7295 8856 8942 10842 11318 14050 14474 27281 28637 29963 37861 42536 43865 48803 59969
175 201 355 5418 7990 10567 10642 12987 16685 18463 21861 24307 25274 27515 39631 40166 43058 47429 55512 55519 59426
117 839 1043 1960 6896 19146 24022 26586 29342 29906 33129 33647 33883 34113 34550 38720 40247 45651 51156 53053 56614
135 236 257 7505 9412 12642 19752 20201 26010 28967 31146 37156 44685 45667 50066 51283 54365 55475 56501 58763 59121
109 840 1573 5523 19968 23924 24644 27064 29410 31276 31526 32173 38175 43570 43722 46655 46660 48353 54025 57319 59818
522 1236 1573 6563 11625 13846 17570 19547 22579 22584 29338 30497 33124 33152 35407 36364 37726 41426 53800 57130
504 1330 1481 13809 15761 20050 26339 27418 29630 32073 33762 34354 36966 43315 47773 47998 48824 50535 53437 55345
348 1244 1492 9626 9655 15638 22727 22971 28357 28841 31523 37543 41100 42372 48983 50354 51434 54574 55031 58193
742 1223 1459 20477 21731 23163 23587 30829 31144 32186 32235 32593 34130 40829 42217 42294 42753 44058 49940 51993
841 860 1534 5878 7083 7113 9658 10508 12871 12964 14023 21055 22680 23927 32701 35168 40986 42139 50708 55350
657 1018 1690 6454 7645 7698 8657 9615 16462 18030 19850 19857 33265 33552 42208 44424 48965 52762 55439 58299
14 511 1376 2586 6797 9409 9599 10784 13076 18509 27363 27667 30262 34043 37043 38143 40246 53811 58872 59250
315 883 1487 2067 7537 8749 10785 11820 15702 20232 22850 23540 30247 41182 44884 50601 52140 55970 57879 58514
256 1442 1534 2342 9734 10789 15334 15356 20334 20433 22923 23521 29391 30553 35406 35643 35701 37968 39541 58097

-continued

| |
|---|
| 260 1238 1557 14167 15271 18046 20588 23444 25820 26660 30619 31625 33258 38554 40401 46471 53589 54904 56455 60016 |
| 591 885 1463 3411 14043 17083 17372 23029 23365 24691 25527 26389 28621 29999 40343 40359 40394 45685 46209 54887 |
| 1119 1411 1664 7879 17732 27000 28506 32237 32445 34100 34926 36470 42848 43126 44117 48780 49519 49592 51901 56580 |
| 147 1333 1560 6045 11526 14867 15647 19496 26626 27600 28044 30446 35920 37523 42907 42974 46452 52480 57061 60152 |
| 304 591 680 5557 6948 13550 19689 19697 22417 23237 25813 31836 32736 36321 36493 36671 46756 53311 59230 59248 |
| 586 777 1018 2393 2817 4057 8068 10632 12430 13193 16433 17344 24526 24902 27693 39301 39776 42300 45215 52149 |
| 684 1425 1732 2436 4279 7375 8493 10023 14908 20703 25656 25757 27251 27316 33211 35741 38872 42908 55079 58753 |
| 962 981 1773 2814 3799 6243 8163 12655 21226 31370 32506 35372 36697 47037 49095 55400 57506 58743 59678 60422 |
| 6229 6484 8795 8981 13576 28622 35526 36922 37284 42155 43443 44080 44446 46649 50824 52987 59033 |
| 2742 5176 10231 10336 16729 17273 18474 25875 28227 34891 39826 42595 48600 52542 53023 53372 57331 |
| 3512 4163 4725 8375 8585 19795 22844 28615 28649 29481 41484 41657 53255 54222 54229 57258 57647 |
| 3358 5239 9423 10858 15636 17937 20678 22427 31220 37069 38770 42079 47256 52442 55152 56964 59169 |
| 2243 10090 12309 15437 19426 23065 24872 36192 36336 36949 41387 49915 50155 54338 54422 56561 57984. |

3. A transmission method, comprising:

an encoding step of performing LDPC encoding based on a check matrix of an LDPC code with a code length N of 69120 bits and an encoding rate r of 4/16;

a group-wise interleaving step of performing group-wise interleaving of interleaving the LDPC code in units of bit groups of 360 bits; and a mapping step of mapping the LDPC code in one of 4096 signal points of 1D-non-uniform constellation (NUC) of 4096 QAM in units of 12 bits, wherein in the group-wise interleaving, (i+1)-th bit group from a lead of the LDPC code is set as a bit group i, and an arrangement of bit groups 0 to 191 of the 69120-bit LDPC code is interleaved into an arrangement of a bit group 191, 38, 101, 9, 62, 79, 127, 18, 51, 6, 95, 114, 35, 123, 31, 99, 133, 81, 136, 106, 5, 130, 159, 124, 146, 41, 110, 150, 185, 8, 158, 178, 119, 171, 121, 129, 164, 168, 111, 52, 177, 190, 85, 179, 142, 174, 46, 61, 176, 23, 163, 49, 28, 86, 2, 143, 120, 166, 13, 87, 27, 39, 115, 131, 92, 117, 187, 56, 11, 180, 118, 30, 149, 60, 71, 44, 103, 140, 48, 162, 125, 122, 126, 29, 153, 77, 72, 4, 7, 165, 25, 89, 26, 68, 20, 12, 141, 37, 139, 15, 36, 82, 21, 137, 80, 3, 57, 128, 42, 43, 47, 93, 147, 70, 50, 170, 54, 96, 17, 152, 24, 172, 10, 22, 45, 169, 83, 69, 134, 78, 64, 183, 76, 189, 184, 112, 109, 33, 88, 32, 105, 175, 94, 53, 1, 90, 66, 100, 19, 108, 104, 113, 58, 40, 144, 97, 138, 154, 148, 157, 67, 145, 102, 132, 173, 84, 167, 0, 98, 182, 156, 63, 135, 14, 181, 73, 75, 65, 161, 116, 186, 55, 34, 151, 91, 160, 107, 16, 188, 74, 155, 59, the check matrix includes:

an A matrix of M1 rows and K columns in an upper left of the check matrix, wherein the A matrix is indicated by a predetermined value M1 and an information length K of the LDPC code, and K=N×r;

a B matrix of M1 rows and M1 columns, wherein the B matrix has a staircase structure adjacent to the right of the A matrix;

a Z matrix of M1 rows and (N−K−M1) columns, wherein the Z matrix is a zero matrix adjacent to the right of the B matrix;

a C matrix of (N−K−M1) rows and (K+M1) columns, wherein the C matrix is adjacent and below each of the A matrix and the B matrix; and a D matrix of (N−K−M1) rows and (N−K−M1) columns, wherein the D matrix is a unit matrix adjacent to the right of the C matrix, the value M1 is 1800, the A matrix and the C matrix are represented by a check matrix initial value table, the check matrix initial value table is a table representing positions of elements of 1's of the A matrix and the C matrix every 360 columns, and the check matrix is

| |
|---|
| 561 825 1718 4745 7515 13041 13466 18039 19065 21821 32596 32708 35323 36399 36450 41124 43036 43218 43363 44875 49948 |
| 56 102 1779 2427 5381 8768 15336 26473 35717 38748 39066 45002 50720 |
| 694 1150 1533 2177 5801 6610 7601 16657 18949 33472 47746 49581 50668 |
| 90 1122 1472 2085 2593 4986 8200 9175 15502 44084 46057 48546 50487 |
| 521 619 708 6915 8978 14211 17426 23058 23463 27440 29822 33443 42871 |
| 449 912 1471 8058 9344 11928 20533 20600 20737 26557 26970 27616 33791 |
| 355 700 1528 6478 9588 10790 20992 33122 34283 41295 43439 46249 47763 |
| 997 1543 1679 5874 7973 7975 11113 28275 28812 29864 35070 36864 50676 |
| 85 326 1392 4186 10855 11005 12913 19263 22984 31733 33787 37567 48173 |
| 986 1144 1508 19864 28918 29117 33609 36452 47975 48432 48842 49274 51533 |
| 437 1190 1413 3814 6695 17541 22060 25845 28431 37453 38912 44170 49231 |
| 327 1171 1204 6952 11880 16469 25058 28956 31523 36770 40189 43422 46481 |
| 123 605 619 8118 8455 19550 20529 21762 21950 28485 30946 34755 34765 |
| 113 896 971 6400 27059 33383 34537 35827 38796 40582 42594 43098 48525 |
| 162 854 1015 2938 10659 12085 13040 32772 33023 35878 49674 51060 51333 |
| 100 452 1703 1932 4208 5127 12086 14549 16084 17890 20870 41364 48498 |
| 1569 1633 1666 12957 18611 22499 38418 38719 42135 46815 48274 50947 51387 |
| 119 691 1190 2457 3865 7468 12512 30782 31811 33508 36586 41789 47426 |
| 867 1117 1666 4376 13263 13466 33524 37440 38136 39800 41454 41620 42510 |
| 378 900 1754 16303 25369 27103 28360 30958 35316 44165 46682 47016 50004 |

-continued 1321 1549 1570 16276 17284 19431 23482 23920 27386 27517 46253 48617 50118
37 383 1418 15792 22551 28843 36532 36718 38805 39226 45671 47712 51769
150 787 1441 17828 19396 21576 21805 24048 31868 32891 42486 43020 45492
1095 1214 1744 2445 5773 10209 11526 29604 30121 36526 45786 47376 49366
412 448 1281 11164 14501 15538 15773 23305 31960 32721 40744 45731 50269
183 626 837 4491 12237 13705 15177 15973 21266 25374 41232 44147 50529
618 1550 1594 5474 9260 16552 18122 26061 30420 30922 32661 34390 43236
135 496 757 9327 15659 20738 24327 26688 29063 38993 46155 49532 50001
64 126 1714 5561 8921 11300 12688 14454 16857 19585 20528 24107 27252
528 687 1730 9735 11737 16396 19200 33712 34271 38241 42027 44471 45581
69 646 1447 8603 19706 22153 22398 23840 24638 27254 29107 30368 41419
673 845 1285 9100 11064 14804 15425 17357 27248 31223 32410 35444 48018
124 1531 1677 3672 3673 3786 8886 9557 10003 11053 13053 22458 25413
102 1154 1758 5721 6034 14567 17772 28670 33380 34284 35356 47480 48123
48 351 760 2078 9797 22956 26120 34119 39658 41039 45237 47861 49022
254 445 841 6835 18340 19021 20053 22874 32639 36679 42004 45696 49530
16 802 903 6218 16206 22068 23049 28201 30377 33947 44358 44739 49303
153 1542 1629 7992 29900 34931 36927 38651 39981 41085 41327 50185 51484
525 1291 1765 9425 20271 31229 37444 38996 39145 41711 43188 45203 51255
2 244 1648 12321 14991 17426 18456 20126 29915 32581 38880 39516 49013
23 452 705 9414 11862 13764 18179 35458 37892 40471 46041 46494 48746
509 1201 1328 8921 9867 10947 19476 22693 32636 34301 38356 39238 51797
246 249 1390 12438 13266 24060 33628 37130 42923 43298 43709 43721 45413
117 257 748 9419 9461 11350 12790 16724 33147 34168 34683 37884 42699
619 646 740 7468 7604 8152 16296 19120 27614 27748 40170 40289 49366
914 1360 1716 10817 17672 18919 26146 29631 40903 46716 49502 51576 51657
68 702 1552 10431 10925 12856 24516 26440 30834 31179 32277 35019 44108
588 880 1524 6641 9453 9653 13679 14488 20714 25865 42217 42637 48312
6380 12240 12558 12816 21460 24206 26129 28555 41616 51767
8889 16221 21629 23476 33954 40572 43494 44666 44885 49813
16938 17727 17913 18898 21754 32515 35686 36920 39898 43560
9170 11747 14681 22874 24537 24685 26989 28947 33592 34621
2427 10241 29649 30522 37700 37789 41656 44020 49801 51268.

4. A reception device, comprising:

a group-wise deinterleaving unit configured to return an arrangement of an LDPC code after group-wise interleaving, wherein the LDPC code is obtained from data transmitted from a transmission device to an original arrangement, the transmission device includes:

an encoding unit configured to perform LDPC encoding process based on a check matrix of the LDPC code with a code length N of 69120 bits and an encoding rate r of 4/16;

a group-wise interleaving unit configured to perform group-wise interleaving process, wherein in the group-wise interleaving process, the group-wise interleaving unit is further configured to interleave the LDPC code in units of bit groups of 360 bits;

a mapping unit configured to map that maps the LDPC code in one of 4096 signal points of 1D-non-uniform constellation (NUC) of 4096 QAM in units of 12 bits, in the group-wise interleaving process, the group-wise interleaving unit is further configured to:

set (i+1)-th bit group from a lead of the LDPC code as a bit group i, and interleave an arrangement of bit groups 0 to 191 of the 69120-bit LDPC code into an arrangement of a bit group 191, 38, 101, 9, 62, 79, 127, 18, 51, 6, 95, 114, 35, 123, 31, 99, 133, 81, 136, 106, 5, 130, 159, 124, 146, 41, 110, 150, 185, 8, 158, 178, 119, 171, 121, 129, 164, 168, 111, 52, 177, 190, 85, 179, 142, 174, 46, 61, 176, 23, 163, 49, 28, 86, 2, 143, 120, 166, 13, 87, 27, 39, 115, 131, 92, 117, 187, 56, 11, 180, 118, 30, 149, 60, 71, 44, 103, 140, 48, 162, 125, 122, 126, 29, 153, 77, 72, 4, 7, 165, 25, 89, 26, 68, 20, 12, 141, 37, 139, 15, 36, 82, 21, 137, 80, 3, 57, 128, 42, 43, 47, 93, 147, 70, 50, 170, 54, 96, 17, 152, 24, 172, 10, 22, 45, 169, 83, 69, 134, 78, 64, 183, 76, 189, 184, 112, 109, 33, 88, 32, 105, 175, 94, 53, 1, 90, 66, 100, 19, 108, 104, 113, 58, 40, 144, 97, 138, 154, 148, 157, 67, 145, 102, 132, 173, 84, 167, 0, 98, 182, 156, 63, 135, 14, 181, 73, 75, 65, 161, 116, 186, 55, 34, 151, 91, 160, 107, 16, 188, 74, 155, 59, the check matrix includes:

an A matrix of M1 rows and K columns in an upper left of the check matrix, wherein the A matrix is indicated by a value M1 and an information length K of the LDPC code, and K=N×r;

a B matrix of M1 rows and M1 columns, wherein the B matrix has a staircase structure adjacent to the right of the A matrix;

a Z matrix of M1 rows and (N−K−M1) columns, wherein the Z matrix is a zero matrix adjacent to the right of the B matrix;

a C matrix of (N−K−M1) rows and (K+M1) columns, wherein the C matrix is adjacent and below each of the A matrix and the B matrix; and a D matrix of (N−K−M1) rows and (N−K−M1) columns, wherein the D matrix is a unit matrix adjacent to the right of the C matrix, the value M1 is 1800, the A matrix and the C matrix are represented by a check matrix initial value table, the check matrix initial value table represents positions of elements of 1's of the A matrix and the C matrix every 360 columns, and the check matrix is 561 825 1718 4745 7515 13041 13466 18039 19065 21821 32596 32708 35323 36399 36450 41124 43036 43218 43363 44875 49948
56 102 1779 2427 5381 8768 15336 26473 35717 38748 39066 45002 50720
694 1150 1533 2177 5801 6610 7601 16657 18949 33472 47746 49581 50668
90 1122 1472 2085 2593 4986 8200 9175 15502 44084 46057 48546 50487
521 619 708 6915 8978 14211 17426 23058 23463 27440 29822 33443 42871
449 912 1471 8058 9344 11928 20533 20600 20737 26557 26970 27616 33791
355 700 1528 6478 9588 10790 20992 33122 34283 41295 43439 46249 47763
997 1543 1679 5874 7973 7975 11113 28275 28812 29864 35070 36864 50676
85 326 1392 4186 10855 11005 12913 19263 22984 31733 33787 37567 48173
986 1144 1508 19864 28918 29117 33609 36452 47975 48432 48842 49274 51533
437 1190 1413 3814 6695 17541 22060 25845 28431 37453 38912 44170 49231
327 1171 1204 6952 11880 16469 25058 28956 31523 36770 40189 43422 46481
123 605 619 8118 8455 19550 20529 21762 21950 28485 30946 34755 34765
113 896 971 6400 27059 33383 34537 35827 38796 40582 42594 43098 48525
162 854 1015 2938 10659 12085 13040 32772 33023 35878 49674 51060 51333
100 452 1703 1932 4208 5127 12086 14549 16084 17890 20870 41364 48498
1569 1633 1666 12957 18611 22499 38418 38719 42135 46815 48274 50947 51387
119 691 1190 2457 3865 7468 12512 30782 31811 33508 36586 41789 47426
867 1117 1666 4376 13263 13466 33524 37440 38136 39800 41454 41620 42510
378 900 1754 16303 25369 27103 28360 30958 35316 44165 46682 47016 50004
1321 1549 1570 16276 17284 19431 23482 23920 27386 27517 46253 48617 50118
37 383 1418 15792 22551 28843 36532 36718 38805 39226 45671 47712 51769
150 787 1441 17828 19396 21576 21805 24048 31868 32891 42486 43020 45492
1095 1214 1744 2445 5773 10209 11526 29604 30121 36526 45786 47376 49366
412 448 1281 11164 14501 15538 15773 23305 31960 32721 40744 45731 50269
183 626 837 4491 12237 13705 15177 15973 21266 25374 41232 44147 50529
618 1550 1594 5474 9260 16552 18122 26061 30420 30922 32661 34390 43236
135 496 757 9327 15659 20738 24327 26688 29063 38993 46155 49532 50001
64 126 1714 5561 8921 11300 12688 14454 16857 19585 20528 24107 27252
528 687 1730 9735 11737 16396 19200 33712 34271 38241 42027 44471 45581
69 646 1447 8603 19706 22153 22398 23840 24638 27254 29107 30368 41419
673 845 1285 9100 11064 14804 15425 17357 27248 31223 32410 35444 48018
124 1531 1677 3672 3673 3786 8886 9557 10003 11053 13053 22458 25413
102 1154 1758 5721 6034 14567 17772 28670 33380 34284 35356 47480 48123
48 351 760 2078 9797 22956 26120 34119 39658 41039 45237 47861 49022
254 445 841 6835 18340 19021 20053 22874 32639 36679 42004 45696 49530
16 802 903 6218 16206 22068 23049 28201 30377 33947 44358 44739 49303
153 1542 1629 7992 29900 34931 36927 38651 39981 41085 41327 50185 51484
525 1291 1765 9425 20271 31229 37444 38996 39145 41711 43188 45203 51255
2 244 1648 12321 14991 17426 18456 20126 29915 32581 38880 39516 49013
23 452 705 9414 11862 13764 18179 35458 37892 40471 46041 46494 48746
509 1201 1328 8921 9867 10947 19476 22693 32636 34301 38356 39238 51797
246 249 1390 12438 13266 24060 33628 37130 42923 43298 43709 43721 45413
117 257 748 9419 9461 11350 12790 16724 33147 34168 34683 37884 42699
619 646 740 7468 7604 8152 16296 19120 27614 27748 40170 40289 49366
914 1360 1716 10817 17672 18919 26146 29631 40903 46716 49502 51576 51657
68 702 1552 10431 10925 12856 24516 26440 30834 31179 32277 35019 44108
588 880 1524 6641 9453 9653 13679 14488 20714 25865 42217 42637 48312
6380 12240 12558 12816 21460 24206 26129 28555 41616 51767
8889 16221 21629 23476 33954 40572 43494 44666 44885 49813
16938 17727 17913 18898 21754 32515 35686 36920 39898 43560
9170 11747 14681 22874 24537 24685 26989 28947 33592 34621
2427 10241 29649 30522 37700 37789 41656 44020 49801 51268.

5. A transmission method, comprising:

an encoding step of performing LDPC encoding based on a check matrix of an LDPC code with a code length N of 69120 bits and an encoding rate r of 6/16;

a group-wise interleaving step of performing group-wise interleaving of interleaving the LDPC code in units of bit groups of 360 bits; and a mapping step of mapping the LDPC code in one of 4096 signal points of 1D-non-uniform constellation (NUC) of 4096 QAM in units of 12 bits, wherein in the group-wise interleaving, (i+1)-th bit group from a lead of the LDPC code is set as a bit group i, and an arrangement of bit groups 0 to 191 of the 69120-bit LDPC code is interleaved into an arrangement of a bit group 100, 152, 16, 39, 26, 58, 60, 6, 126, 7, 59, 75, 62, 47, 27, 113, 41, 115, 169, 30, 95, 189, 138, 136, 70, 140, 149, 187, 177, 141, 125, 171, 178, 134, 15, 154, 131, 183, 46, 35, 44, 11, 51, 170, 112, 20, 161, 159, 101, 52, 181, 71, 28, 128, 3, 167, 156, 123, 18, 139, 102, 13, 19, 37, 90, 105, 92, 135, 185, 121, 50, 158, 29, 104, 155, 12, 184, 93, 166, 14, 133, 146, 24, 191, 188, 116, 109, 89, 65, 45, 25, 21, 1, 76, 151, 180, 33, 124, 91, 107, 119, 5, 132, 118, 111, 96, 143, 150, 173, 108, 2, 122, 22, 148, 130, 142, 147, 67, 97, 103, 36, 63, 40, 117, 55, 68, 137, 144, 94, 83, 56, 79, 175, 0, 182, 114, 85, 86, 9, 10, 74, 106, 17, 190, 4, 34, 84, 98, 38, 88, 64, 78, 145, 77, 163, 42, 120, 69, 164, 48, 23, 129, 160, 81, 127, 82, 53, 72, 179, 31, 66, 32, 168, 110, 73, 186, 157, 172, 49, 165, 176, 80, 61, 174, 153, 162, 54, 99, 57, 87, 8, 43, the check matrix includes:

an A matrix of M1 rows and K columns in an upper left of the check matrix, wherein the A matrix is indicated by a value M1 and an information length K of the LDPC code, and K=N×r;

a B matrix of M1 rows and M1 columns, wherein the B matrix has a staircase structure adjacent to the right of the A matrix;

a Z matrix of M1 rows and (N−K−M1) columns, wherein the Z matrix is a zero matrix adjacent to the right of the B matrix;

a C matrix of (N−K−M1) rows and (K+M1) columns, wherein the C matrix is adjacent and below each of the A matrix and the B matrix; and a D matrix of (N−K−M1) rows and (N−K−M1) columns, wherein the D matrix is a unit matrix adjacent to the right of the C matrix, the value M1 is 1800, the A matrix and the C matrix are represented by a check matrix initial value table, the check matrix initial value table represents positions of elements of 1's of the A matrix and the C matrix every 360 columns, and the check matrix initial value table is 608 1394 3635 14404 15203 19848 22161 23175 26651 31945 41227
481 570 11088 11673 11866 17145 17247 17564 21607 25992 31286
1207 1257 1870 8472 8855 10511 15656 17064 22720 28352 30914
1171 1585 6218 7621 10121 11374 13184 22714 27207 27959 38572
244 548 2073 4937 7509 11840 12850 18762 25618 27902 37150
15 1352 7060 7886 8151 10574 14172 15258 24838 30827 35337
1009 1651 13300 13958 26240 29983 32340 40743 41553 42475 42873
638 1405 5544 6797 10001 14934 24766 35758 40719 41787 42342
1467 1481 3202 11324 14048 15217 17608 22544 26736 32073 33405
1274 1343 3576 4166 8712 10756 21175 26866 37021 40341 42064

-continued 1232 1590 4409 8705 13307 28481 30893 36031 36780 37697 39149
189 1678 9943 10774 11765 25520 26133 27351 27353 40664 41534
125 1421 5009 9365 12792 15933 16231 25975 27076 27997 32429
1361 1764 5376 11071 14456 16324 20318 26168 28445 30392 34235
1017 1303 3312 6738 7813 18149 25506 29032 36789 38742 43116
463 967 10876 13874 14303 16789 21656 26555 38738 39195 40668
630 1104 3029 3165 5157 12880 14175 16498 35121 38917 40944
716 1054 10011 11739 16913 19396 20892 23370 24392 27614 38467
1081 1238 2872 10259 13618 16943 17363 23570 29721 32411 38969
775 1002 2978 9202 16618 22697 30716 31750 36517 37294 40454
25 497 10687 13308 15302 17525 17539 21865 22279 24516 26992
781 878 6426 8551 12328 21375 27626 28192 29731 35423 35606
729 1734 3479 6850 14347 14776 21998 33617 34690 38597 38704
122 1378 1660 7448 7659 11900 13039 13796 19908
504 716 1551 5655 6245 8365 9825 16627 29100
88 900 1057 2620 16729 17278 17444 26106 26587
30 1697 1736 8718 11664 20885 27043 42569 42913
293 634 1188 4005 5266 6205 26756 30207 37757
254 755 1187 4631 13433 25055 28354 28583 30446
316 1381 1522 3131 4340 27284 28246 28282 43174
84 293 645 2148 7925 13104 25010 36836 39033
982 1486 1660 4287 5335 18350 26913 30774 31280
418 1028 1039 3334 4577 6553 7011 17259 31922
1324 1361 1690 5991 7740 16880 18479 25713 31823
735 1322 1727 8629 14655 15815 16762 23263 36859
19 928 1561 11161 12894 14226 21331 41128 41883
327 940 1004 13616 15894 31400 34106 34443 37957
576 953 1226 2122 4900 5002 10248 25476 30787
249 632 1240 5432 23019 29225 31719 36658 41360
980 1154 1783 4351 10245 23347 27442 28328 38555
581 863 1552 5057 7572 14544 20482 29482 31672
4 502 1450 4883 5176 6824 10430 32680 39581
81 761 1558 2269 5391 13213 24184 25523 39429
1085 1163 1244 7694 9125 17387 22223 26343 37933
204 1127 1483 18302 19939 20576 31599 32619 42911
345 387 591 8727 18080 20628 32251 34562 42821
957 1126 1133 4099 12272 15595 20906 23606 34564
409 1310 1335 2761 11952 26853 27941 29262 31647
329 818 1527 3890 5238 8742 15586 28739 43015
231 1158 1677 4314 15937 17526 18391 22963 39232
34 275 526 2975 4742 16109 17346 29145 37673
497 735 1261 7468 8769 17342 19763 32646 33497
879 1233 1633 11612 22941 23723 31969 35571 39510
886 954 1355 5532 8283 26965 29267 30820 40402
356 1199 1452 8833 14845 21722 23840 26539 27970
553 1570 1732 8249 16820 23181 23234 30754 40399
457 1304 1698 2774 11357 32906 34484 38700 41799
456 579 1155 23844 27261 29172 30980 35000 40984
301 1290 1782 6798 9735 23655 31040 35554 36366
228 483 561 12346 16698 32688 34518 38648 41677
35 184 997 4915 7077 9878 16772 26263 27270
181 193 1255 7548 17103 34511 36590 38107 42065
697 1024 1541 2164 15638 20061 32499 32667 32732
654 968 1632 3215 4901 6286 12414 13963 29636
89 150 450 5771 10863 29809 36886 37914 42983
517 1046 1153 5458 18093 25579 31084 37779 42050
345 914 1372 4548 6720 13678 13755 15422 41938
301 518 1107 3603 6076 9265 19580 41645 42621
155 1013 1441 10166 10545 22042 30084 33026 34505
899 1308 1766 22228 24520 24589 30833 32126 37147
177 230 349 6309 9642 25713 30455 34964 40524
802 1364 1703 3573 17317 20364 22849 24265 24925
3952 10609 11011 16296 31430 39995 40207 41606 42424
16548 19896 22579 23043 23126 24141 34331 34959 37990
12197 15244 22990 23110 25507 30011 37681 38902 39432
2292 11871 15562 22304 33059 35126 39158 41206 41866
3497 7847 11510 16212 19408 26780 27967 33953 34451.

6. A reception device, comprising:

a group-wise deinterleaving unit configured to return an arrangement of an LDPC code after group-wise interleaving, wherein the LDPC is obtained from data transmitted from a transmission device to an original arrangement, the transmission device includes:

an encoding unit configured to perform LDPC encoding process based of a check matrix of the LDPC code with a code length N of 69120 bits and an encoding rate r of 6/16;

a group-wise interleaving unit configured to perform group-wise interleaving process, wherein in the group-wise interleaving process, the group-wise interleaving unit is further configured to interleave the LDPC code in units of bit groups of 360 bits; and a mapping unit configured to map the LDPC code in one of 4096 signal points of 1D-non-uniform constellation (NUC) of 4096 QAM in units of 12 bits, in the group-wise interleaving, the group-wise interleaving unit is further configured to:

set (i+1)-th bit group from a lead of the LDPC code as a bit group i, and interleave an arrangement of bit groups 0 to 191 of the 69120-bit LDPC code into an arrangement of a bit group 100, 152, 16, 39, 26, 58, 60, 6, 126, 7, 59, 75, 62, 47, 27, 113, 41, 115, 169, 30, 95, 189, 138, 136, 70, 140, 149, 187, 177, 141, 125, 171, 178, 134, 15, 154, 131, 183, 46, 35, 44, 11, 51, 170, 112, 20, 161, 159, 101, 52, 181, 71, 28, 128, 3, 167, 156, 123, 18, 139, 102, 13, 19, 37, 90, 105, 92, 135, 185, 121, 50, 158, 29, 104, 155, 12, 184, 93, 166, 14, 133, 146, 24, 191, 188, 116, 109, 89, 65, 45, 25, 21, 1, 76, 151, 180, 33, 124, 91, 107, 119, 5, 132, 118, 111, 96, 143, 150, 173, 108, 2, 122, 22, 148, 130, 142, 147, 67, 97, 103, 36, 63, 40, 117, 55, 68, 137, 144, 94, 83, 56, 79, 175, 0, 182, 114, 85, 86, 9, 10, 74, 106, 17, 190, 4, 34, 84, 98, 38, 88, 64, 78, 145, 77, 163, 42, 120, 69, 164, 48, 23, 129, 160, 81, 127, 82, 53, 72, 179, 31, 66, 32, 168, 110, 73, 186, 157, 172, 49, 165, 176, 80, 61, 174, 153, 162, 54, 99, 57, 87, 8, 43, the check matrix includes:

an A matrix of M1 rows and K columns in an upper left of the check matrix, wherein the A matrix is indicated by a value M1 and an information length K=N×r of the LDPC code, and K=N×r;

a B matrix of M1 rows and M1 columns, wherein the B matrix has a staircase structure adjacent to the right of the A matrix;

a Z matrix of M1 rows and (N−K−M1) columns, wherein the Z matrix is a zero matrix adjacent to the right of the B matrix;

a C matrix of (N−K−M1) rows and (K+M1) columns, wherein the C matrix is adjacent and below each of the A matrix and the B matrix; and a D matrix of (N−K−M1) rows and (N−K−M1) columns, wherein the D matrix is a unit matrix adjacent to the right of the C matrix, the value M1 is 1800, the A matrix and the C matrix are represented by a check matrix initial value table, and the check matrix initial value table represents positions of elements of 1's of the A matrix and the C matrix every 360 columns, and the check matrix initial value table is 608 1394 3635 14404 15203 19848 22161 23175 26651 31945 41227
481 570 11088 11673 11866 17145 17247 17564 21607 25992 31286

-continued 1207 1257 1870 8472 8855 10511 15656 17064 22720 28352 30914
1171 1585 6218 7621 10121 11374 13184 22714 27207 27959 38572
244 548 2073 4937 7509 11840 12850 18762 25618 27902 37150
15 1352 7060 7886 8151 10574 14172 15258 24838 30827 35337
1009 1651 13300 13958 26240 29983 32340 40743 41553 42475 42873
638 1405 5544 6797 10001 14934 24766 35758 40719 41787 42342
1467 1481 3202 11324 14048 15217 17608 22544 26736 32073 33405
1274 1343 3576 4166 8712 10756 21175 26866 37021 40341 42064
1232 1590 4409 8705 13307 28481 30893 36031 36780 37697 39149
189 1678 9943 10774 11765 25520 26133 27351 27353 40664 41534
125 1421 5009 9365 12792 15933 16231 25975 27076 27997 32429
1361 1764 5376 11071 14456 16324 20318 26168 28445 30392 34235
1017 1303 3312 6738 7813 18149 25506 29032 36789 38742 43116
463 967 10876 13874 14303 16789 21656 26555 38738 39195 40668
630 1104 3029 3165 5157 12880 14175 16498 35121 38917 40944
716 1054 10011 11739 16913 19396 20892 23370 24392 27614 38467
1081 1238 2872 10259 13618 16943 17363 23570 29721 32411 38969
775 1002 2978 9202 16618 22697 30716 31750 36517 37294 40454
25 497 10687 13308 15302 17525 17539 21865 22279 24516 26992
781 878 6426 8551 12328 21375 27626 28192 29731 35423 35606
729 1734 3479 6850 14347 14776 21998 33617 34690 38597 38704
122 1378 1660 7448 7659 11900 13039 13796 19908
504 716 1551 5655 6245 8365 9825 16627 29100
88 900 1057 2620 16729 17278 17444 26106 26587
30 1697 1736 8718 11664 20885 27043 42569 42913
293 634 1188 4005 5266 6205 26756 30207 37757
254 755 1187 4631 13433 25055 28354 28583 30446
316 1381 1522 3131 4340 27284 28246 28282 43174
84 293 645 2148 7925 13104 25010 36836 39033
982 1486 1660 4287 5335 18350 26913 30774 31280
418 1028 1039 3334 4577 6553 7011 17259 31922
1324 1361 1690 5991 7740 16880 18479 25713 31823
735 1322 1727 8629 14655 15815 16762 23263 36859
19 928 1561 11161 12894 14226 21331 41128 41883
327 940 1004 13616 15894 31400 34106 34443 37957
576 953 1226 2122 4900 5002 10248 25476 30787
249 632 1240 5432 23019 29225 31719 36658 41360
980 1154 1783 4351 10245 23347 27442 28328 38555
581 863 1552 5057 7572 14544 20482 29482 31672
4 502 1450 4883 5176 6824 10430 32680 39581
81 761 1558 2269 5391 13213 24184 25523 39429
1085 1163 1244 7694 9125 17387 22223 26343 37933
204 1127 1483 18302 19939 20576 31599 32619 42911
345 387 591 8727 18080 20628 32251 34562 42821
957 1126 1133 4099 12272 15595 20906 23606 34564
409 1310 1335 2761 11952 26853 27941 29262 31647
329 818 1527 3890 5238 8742 15586 28739 43015
231 1158 1677 4314 15937 17526 18391 22963 39232
34 275 526 2975 4742 16109 17346 29145 37673
497 735 1261 7468 8769 17342 19763 32646 33497
879 1233 1633 11612 22941 23723 31969 35571 39510
886 954 1355 5532 8283 26965 29267 30820 40402
356 1199 1452 8833 14845 21722 23840 26539 27970
553 1570 1732 8249 16820 23181 23234 30754 40399
457 1304 1698 2774 11357 32906 34484 38700 41799
456 579 1155 23844 27261 29172 30980 35000 40984
301 1290 1782 6798 9735 23655 31040 35554 36366
228 483 561 12346 16698 32688 34518 38648 41677
35 184 997 4915 7077 9878 16772 26263 27270
181 193 1255 7548 17103 34511 36590 38107 42065
697 1024 1541 2164 15638 20061 32499 32667 32732
654 968 1632 3215 4901 6286 12414 13963 29636
89 150 450 5771 10863 29809 36886 37914 42983
517 1046 1153 5458 18093 25579 31084 37779 42050
345 914 1372 4548 6720 13678 13755 15422 41938
301 518 1107 3603 6076 9265 19580 41645 42621
155 1013 1441 10166 10545 22042 30084 33026 34505
899 1308 1766 22228 24520 24589 30833 32126 37147
177 230 349 6309 9642 25713 30455 34964 40524
802 1364 1703 3573 17317 20364 22849 24265 24925
3952 10609 11011 16296 31430 39995 40207 41606 42424
16548 19896 22579 23043 23126 24141 34331 34959 37990
12197 15244 22990 23110 25507 30011 37681 38902 39432
2292 11871 15562 22304 33059 35126 39158 41206 41866
3497 7847 11510 16212 19408 26780 27967 33953 34451.

7. A transmission method, comprising:

an encoding step of performing LDPC encoding based on a check matrix of an LDPC code with a code length N of 69120 bits and an encoding rate r of 8/16;

a group-wise interleaving step of performing group-wise interleaving of interleaving the LDPC code in units of bit groups of 360 bits; and a mapping step of mapping the LDPC code in one of 4096 signal points of 1D-non-uniform constellation (NUC) of 4096 QAM in units of 12 bits, wherein in the group-wise interleaving, (i+1)-th bit group from a lead of the LDPC code is set as a bit group i, and an arrangement of bit groups 0 to 191 of the 69120-bit LDPC code is interleaved into an arrangement of a bit group 21, 5, 2, 24, 12, 28, 52, 118, 129, 3, 122, 149, 105, 16, 136, 99, 133, 171, 84, 79, 59, 62, 155, 78, 134, 20, 1, 51, 22, 161, 173, 46, 172, 162, 55, 148, 70, 57, 121, 86, 131, 114, 31, 72, 104, 120, 164, 127, 83, 179, 187, 7, 108, 40, 73, 144, 48, 68, 60, 190, 135, 61, 116, 106, 19, 35, 143, 180, 102, 76, 182, 117, 93, 191, 165, 23, 80, 146, 153, 42, 53, 139, 124, 64, 167, 96, 138, 132, 158, 90, 110, 82, 39, 175, 170, 66, 145, 94, 119, 130, 98, 63, 87, 32, 160, 34, 151, 77, 95, 109, 56, 113, 147, 50, 38, 15, 156, 11, 169, 185, 183, 92, 186, 107, 10, 101, 33, 4, 150, 41, 81, 89, 166, 0, 30, 54, 168, 26, 140, 74, 100, 9, 111, 126, 43, 112, 25, 88, 44, 189, 37, 178, 141, 49, 13, 29, 8, 69, 154, 45, 97, 47, 36, 75, 137, 6, 115, 188, 85, 174, 17, 142, 18, 91, 163, 157, 177, 103, 125, 71, 14, 181, 65, 184, 176, 159, 128, 152, 58, 27, 123, 67, the LDPC code includes information bits and parity bits, the check matrix includes an information matrix portion corresponding to the information bits and a parity matrix portion corresponding to the parity bits, the information matrix portion is represented by a check matrix initial value table, the check matrix initial value table represents positions of elements of 1's of the information matrix portion every 360 columns, and the check matrix initial value table is 1850 4176 4190 7294 8168 8405 9258 9710 13440 16304 16600 18184 18834
19899 22513 25068 26659 27137 27232 29186 29667 30549 31428 33634
2477 2543 5094 8081 9573 10269 11276 11439 13016 13327 16717 18042
19362 19721 20089 20425 20503 21396 24677 24722 28703 32486 32759 33630
1930 2158 2315 2683 3818 4883 5252 5505 8760 9580 11867 13117 14566
15639 17273 18820 21069 24945 25667 26785 30678 31271 33003 33244
1279 1491 2038 2347 2432 4336 4905 6588 7507 7666 8775 9172 10405 12249
12270 12373 12936 13046 13364 15130 17597 22855 27548 32895
620 1897 3775 5552 6799 7621 10167 10172 10615 11367 12093 13241 15426
16623 19467 19792 22069 22370 24472 24594 25205 25954 27800 29422
582 1618 4673 5809 6318 6883 8051 12335 12409 13176 14078 15206 17580
18624 18876 19079 20786 21177 25894 26395 27377 27757 30167 31971
1157 2189 4160 4480 5055 8961 9171 9444 10533 11581 12904 14256 14620
15773 16232 17598 19756 21134 21443 22559 23258 25137 25555 28150
987 1258 1269 2394 4859 5642 5705 6093 6408 7734 8804 10657 11946 16132
20267 25402 26505 26548 27060 29767 29780 31915 31966 33590
1010 1363 1626 5283 6356 10961 12418 14332 14362 16288 16303 16592
17096 20115 20285 20478 21774 22165 22425 23198 25048 25596 31540 32841
895 2743 2912 4971 8803 11183 14500 14617 14638 16776 17901 18622 20244
20845 22214 25676 26161 26281 29978 30392 30922 31542 32038 32443
188 260 411 2823 5512 5645 10019 11856 12671 14273 14673 16091 16169
22333 22934 22945 23542 26503 27159 27279 28277 30114 31626 32722
357 516 3530 4317 8587 9491 10348 11330 13446 14533 15423 17003 17217
19127 20088 20750 21767 22386 24021 27749 29008 29376 30329 32940
2909 3036 4875 9967 10632 12069 12410 14004 14628 15605 15852 18231
18657 19705 20620 22241 29575 29656 31246 32190 32781 33489 33842 34492
4242 5461 5577 7662 11130 13663 17240 17773 18339 19400 22905 24219
25464 25890 26359 27121 27318 27840 30800 32587 32924 33427 33940 34058
421 2222 3457 5257 5600 10147 12754 17380 18854 20333 20345 20752 24578
25196 25638 25725 25822 27610 28006 28563 29632 29973 29991 34166
41 207 1043 4650 5387 6826 7261 8687 9092 10775 11446 12596 16613 19463
20923 24155 24927 25384 26064 27377 28094 32578 32639 34115
1050 5731 15820 16281 26130 29314
5980 6161 14479 22181 22537 32924
7828 9134 11297 17143 25449 29674
8299 10457 14486 21548 22510 32039
1527 7792 10424 19166 29302 29768
5823 13974 21254 21506 25658 29491
6285 9873 12846 14474 17005 29377
1740 4929 8285 20994 32271 34522
12862 16827 22427 23369 27051 30378
4787 10372 10408 12091 20349 26162
6659 22752 24697 28261 28917 32536
6788 15367 21778 28916 30324 33927
7181 12373 21912 24703 28680 34045
2238 4945 14336 19270 29574 33459
10283 15311 17440 24599 24867 28293
324 5264 5375 6581 24348 30288
3112 7656 23825
21624 22318 22633
5284 19790 22758
2700 4039 12576
17028 17520 19579
11914 17834 33989

-continued

| |
|---|
| 2199 5502 7184 |
| 22 20701 26497 |
| 5551 27014 32876 |
| 4019 26547 28521 |
| 7580 10016 33855 |
| 4328 11674 34018 |
| 8491 9956 10029 |
| 6167 11267 24914 |
| 5317 9049 29657 |
| 20717 28724 33012 |
| 16841 21647 31096 |
| 11931 16278 20287 |
| 9402 10557 11008 |
| 11826 15349 34420 |
| 14369 17031 20597 |
| 19164 27947 29775 |
| 15537 18796 33662 |
| 5404 21027 26757 |
| 6269 12671 24309 |
| 8601 29048 29262 |
| 10099 20323 21457 |
| 15952 17074 30434 |
| 7597 20987 33095 |
| 11298 24182 29217 |
| 12055 16250 16971 |
| 5350 9354 31390 |
| 8168 14168 18570 |
| 5448 13141 32381 |
| 3921 21113 28176 |
| 8756 19895 27917 |
| 9391 16617 25586 |
| 3357 18527 34238 |
| 2378 16840 28948 |
| 7470 27466 32928 |
| 8366 19376 30916 |
| 3116 7267 18016 |
| 15309 18445 21799 |
| 4731 23773 34546 |
| 260 4898 5180 |
| 8897 22266 29587 |
| 2539 23717 33142 |
| 19233 28750 29724 |
| 9937 15384 16599 |
| 10234 17089 26776 |
| 8869 9425 13658 |
| 6197 24086 31929 |
| 9237 20931 27785 |
| 10403 13822 16734 |
| 20038 21196 26868 |
| 13170 27813 28875 |
| 1110 20329 24508 |
| 11844 22662 28987 |
| 2891 2918 14512 |
| 15707 27399 34135 |
| 8687 20019 26178 |
| 6847 8903 16307 |
| 23737 23775 27776 |
| 17388 27970 31983. |

8. A reception device, comprising:

a group-wise deinterleaving unit configured to return an arrangement of an LDPC code after group-wise interleaving, wherein the LDPC code is obtained from data transmitted from a transmission device to an original arrangement, and the transmission device includes:

an encoding unit is configured to perform LDPC encoding process based on a check matrix of the LDPC code with a code length N of 69120 bits and an encoding rate r of 8/16, a group-wise interleaving unit is configured to perform that performs group-wise interleaving process, wherein in the group-wise interleaving process, the group-wise interleaving unit is further configured to interleave the LDPC code in units of bit groups of 360 bits; and a mapping unit configured to map the LDPC code in one of 4096 signal points of 1D-non-uniform constellation (NUC) of 4096 QAM in units of 12 bits, in the group-wise interleaving, the group-wise interleaving unit is further configured to:

set (i+1)-th bit group from a lead of the LDPC code as a bit group i, and interleave an arrangement of bit groups 0 to 191 of the 69120-bit LDPC code into an arrangement of a bit group 21, 5, 2, 24, 12, 28, 52, 118, 129, 3, 122, 149, 105, 16, 136, 99, 133, 171, 84, 79, 59, 62, 155, 78, 134, 20, 1, 51, 22, 161, 173, 46, 172, 162, 55, 148, 70, 57, 121, 86, 131, 114, 31, 72, 104, 120, 164, 127, 83, 179, 187, 7, 108, 40, 73, 144, 48, 68, 60, 190, 135, 61, 116, 106, 19, 35, 143, 180, 102, 76, 182, 117, 93, 191, 165, 23, 80, 146, 153, 42, 53, 139, 124, 64, 167, 96, 138, 132, 158, 90, 110, 82, 39, 175, 170, 66, 145, 94, 119, 130, 98, 63, 87, 32, 160, 34, 151, 77, 95, 109, 56, 113, 147, 50, 38, 15, 156, 11, 169, 185, 183, 92, 186, 107, 10, 101, 33, 4, 150, 41, 81, 89, 166, 0, 30, 54, 168, 26, 140, 74, 100, 9, 111, 126, 43, 112, 25, 88, 44, 189, 37, 178, 141, 49, 13, 29, 8, 69, 154, 45, 97, 47, 36, 75, 137, 6, 115, 188, 85, 174, 17, 142, 18, 91, 163, 157, 177, 103, 125, 71, 14, 181, 65, 184, 176, 159, 128, 152, 58, 27, 123, 67, the LDPC code includes information bits and parity bits, the check matrix includes an information matrix portion corresponding to the information bits and a parity matrix portion corresponding to the parity bits, the information matrix portion is represented by a check matrix initial value table, the check matrix initial value table represents positions of elements of 1's of the information matrix portion every 360 columns, and the check matrix initial value is 1850 4176 4190 7294 8168 8405 9258 9710 13440 16304 16600 18184 18834
19899 22513 25068 26659 27137 27232 29186 29667 30549 31428 33634
2477 2543 5094 8081 9573 10269 11276 11439 13016 13327 16717 18042
19362 19721 20089 20425 20503 21396 24677 24722 28703 32486 32759 33630
1930 2158 2315 2683 3818 4883 5252 5505 8760 9580 11867 13117 14566
15639 17273 18820 21069 24945 25667 26785 30678 31271 33003 33244
1279 1491 2038 2347 2432 4336 4905 6588 7507 7666 8775 9172 10405 12249
12270 12373 12936 13046 13364 15130 17597 22855 27548 32895
620 1897 3775 5552 6799 7621 10167 10172 10615 11367 12093 13241 15426
16623 19467 19792 22069 22370 24472 24594 25205 25954 27800 29422
582 1618 4673 5809 6318 6883 8051 12335 12409 13176 14078 15206 17580
18624 18876 19079 20786 21177 25894 26395 27377 27757 30167 31971
1157 2189 4160 4480 5055 8961 9171 9444 10533 11581 12904 14256 14620
15773 16232 17598 19756 21134 21443 22559 23258 25137 25555 28150
987 1258 1269 2394 4859 5642 5705 6093 6408 7734 8804 10657 11946 16132
20267 25402 26505 26548 27060 29767 29780 31915 31966 33590
1010 1363 1626 5283 6356 10961 12418 14332 14362 16288 16303 16592
17096 20115 20285 20478 21774 22165 22425 23198 25048 25596 31540 32841
895 2743 2912 4971 8803 11183 14500 14617 14638 16776 17901 18622 20244
20845 22214 25676 26161 26281 29978 30392 30922 31542 32038 32443
188 260 411 2823 5512 5645 10019 11856 12671 14273 14673 16091 16169
22333 22934 22945 23542 26503 27159 27279 28277 30114 31626 32722
357 516 3530 4317 8587 9491 10348 11330 13446 14533 15423 17003 17217
19127 20088 20750 21767 22386 24021 27749 29008 29376 30329 32940
2909 3036 4875 9967 10632 12069 12410 14004 14628 15605 15852 18231
18657 19705 20620 22241 29575 29656 31246 32190 32781 33489 33842 34492
4242 5461 5577 7662 11130 13663 17240 17773 18339 19400 22905 24219
25464 25890 26359 27121 27318 27840 30800 32587 32924 33427 33940 34058
421 2222 3457 5257 5600 10147 12754 17380 18854 20333 20345 20752 24578
25196 25638 25725 25822 27610 28006 28563 29632 29973 29991 34166
41 207 1043 4650 5387 6826 7261 8687 9092 10775 11446 12596 16613 19463
20923 24155 24927 25384 26064 27377 28094 32578 32639 34115
1050 5731 15820 16281 26130 29314
5980 6161 14479 22181 22537 32924
7828 9134 11297 17143 25449 29674
8299 10457 14486 21548 22510 32039
1527 7792 10424 19166 29302 29768
5823 13974 21254 21506 25658 29491
6285 9873 12846 14474 17005 29377
1740 4929 8285 20994 32271 34522
12862 16827 22427 23369 27051 30378
4787 10372 10408 12091 20349 26162
6659 22752 24697 28261 28917 32536
6788 15367 21778 28916 30324 33927
7181 12373 21912 24703 28680 34045
2238 4945 14336 19270 29574 33459
10283 15311 17440 24599 24867 28293
324 5264 5375 6581 24348 30288

-continued

| |
|---|
| 3112 7656 23825 |
| 21624 22318 22633 |
| 5284 19790 22758 |
| 2700 4039 12576 |
| 17028 17520 19579 |
| 11914 17834 33989 |
| 2199 5502 7184 |
| 22 20701 26497 |
| 5551 27014 32876 |
| 4019 26547 28521 |
| 7580 10016 33855 |
| 4328 11674 34018 |
| 8491 9956 10029 |
| 6167 11267 24914 |
| 5317 9049 29657 |
| 20717 28724 33012 |
| 16841 21647 31096 |
| 11931 16278 20287 |
| 9402 10557 11008 |
| 11826 15349 34420 |
| 14369 17031 20597 |
| 19164 27947 29775 |
| 15537 18796 33662 |
| 5404 21027 26757 |
| 6269 12671 24309 |
| 8601 29048 29262 |
| 10099 20323 21457 |
| 15952 17074 30434 |
| 7597 20987 33095 |
| 11298 24182 29217 |
| 12055 16250 16971 |
| 5350 9354 31390 |
| 8168 14168 18570 |
| 5448 13141 32381 |
| 3921 21113 28176 |
| 8756 19895 27917 |
| 9391 16617 25586 |
| 3357 18527 34238 |
| 2378 16840 28948 |
| 7470 27466 32928 |
| 8366 19376 30916 |
| 3116 7267 18016 |
| 15309 18445 21799 |
| 4731 23773 34546 |
| 260 4898 5180 |
| 8897 22266 29587 |
| 2539 23717 33142 |
| 19233 28750 29724 |
| 9937 15384 16599 |
| 10234 17089 26776 |
| 8869 9425 13658 |
| 6197 24086 31929 |
| 9237 20931 27785 |
| 10403 13822 16734 |
| 20038 21196 26868 |
| 13170 27813 28875 |
| 1110 20329 24508 |
| 11844 22662 28987 |
| 2891 2918 14512 |
| 15707 27399 34135 |
| 8687 20019 26178 |
| 6847 8903 16307 |
| 23737 23775 27776 |
| 17388 27970 31983. |

9. A transmission method, comprising:

an encoding step of performing LDPC encoding based on a check matrix of an LDPC code with a code length N of 69120 bits and an encoding rate r of 10/16;

a group-wise interleaving step of performing group-wise interleaving of interleaving the LDPC code in units of bit groups of 360 bits; and a mapping step of mapping the LDPC code in any one of 4096 signal points of 1D-non-uniform constellation (NUC) of 4096 QAM in units of 12 bits, wherein in the group-wise interleaving, (i+1)-th bit group from a lead of the LDPC code is set as a bit group i, and an arrangement of bit groups 0 to 191 of the 69120-bit LDPC code is interleaved into an arrangement of a bit group 113, 23, 166, 150, 133, 130, 38, 18, 71, 115, 111, 44, 135, 11, 98, 96, 67, 114, 112, 87, 146, 119, 28, 86, 120, 49, 175, 14, 30, 144, 53, 165, 162, 128, 108, 39, 116, 158, 62, 110, 83, 93, 118, 80, 88, 173, 157, 102, 177, 132, 174, 59, 106, 34, 64, 22, 4, 29, 97, 155, 109, 9, 107, 92, 36, 24, 161, 50, 21, 137, 17, 43, 58, 124, 31, 37, 172, 100, 178, 129, 79, 160, 167, 32, 181, 154, 7, 183, 90, 54, 68, 191, 156, 104, 147, 10, 65, 81, 134, 169, 142, 57, 171, 78, 48, 47, 5, 40, 46, 51, 151, 77, 1, 72, 164, 152, 70, 141, 2, 89, 13, 182, 85, 52, 41, 66, 75, 63, 185, 148, 179, 138, 61, 73, 180, 189, 76, 84, 8, 27, 184, 105, 42, 69, 153, 188, 19, 131, 121, 26, 159, 45, 16, 186, 25, 176, 82, 103, 163, 99, 101, 122, 187, 20, 136, 126, 168, 145, 6, 91, 55, 117, 35, 56, 143, 140, 190, 125, 127, 74, 95, 94, 12, 149, 33, 0, 139, 3, 123, 170, 15, 60, the LDPC code includes information bits and parity bits, the check matrix includes an information matrix portion corresponding to the information bits and a parity matrix portion corresponding to the parity bits, the information matrix portion is represented by a check matrix initial value table, the check matrix initial value table is a table representing positions of elements of 1's of the information matrix portion every 360 columns, and the check matrix initial value table is 200 588 3305 4771 6288 8400 11092 11126 14245 14255 17022 17190 19241
20350 20451 21069 25243
80 2914 4126 5426 6129 7790 9546 12909 14660 17357 18278 19612 21168
22367 23314 24801 24907
1216 2713 4897 6540 7016 7787 8321 9717 9934 12295 18749 20344 21386
21682 21735 24205 24825
6784 8163 8691 8743 10045 10319 10767 11141 11756 12004 12463 13407
14682 15458 20771 21060 22914
463 1260 1897 2128 2908 5157 7851 14177 16187 17463 18212 18221 19212
21864 24198 25318 25450
794 835 1163 4551 4597 5792 6092 7809 8576 8862 10986 12164 13053 14459
15978 23829 25072
144 4258 4342 7326 8165 9627 11432 12552 17582 17621 18145 19201 19372
19718 21036 25147 25774
617 2639 2749 2898 3414 4305 4802 6183 8551 9850 13679 20759 22501
24244 24331 24631 25587
1622 2258 4257 6069 10343 10642 11003 12520 13993 17086 18236 18522
24679 25361 25371 25595
1826 3926 5021 5905 6192 6839 7678 9136 9188 9716 10986 11191 12551
14648 16169 16234
2175 2396 2473 8548 9753 12115 12208 13469 15438 16985 19350 20424
21357 22819 22830 25671
265 397 6675 7152 8074 13030 13161 13336 15843 16917 17930 18014 18660
19218 22236 24940
5744 6883 7780 7839 8485 10016 10548 12131 12158 16211 16793 18749
20570 21757 22255 24489
2082 4768 7025 8803 10237 10932 13885 14266 14370 14982 16411 18443
18773 19570 21420 23311
1040 1376 2823 2998 3789 6636 7755 9819 13705 13868 14176 16202 16247
24943 25196 25489
223 1967 3289 4541 7420 9881 11086 12868 13550 14760 15434 18287 19098
20909 22905 25887
1906 2049 2147 2756 2845 4773 8337 8832 9363 12375 13651 16366 17546
20486 21624 22664
1619 1955 2393 3078 3208 3593 5246 8565 10956 11335 11865 14837 15006
15544 18820 22687
2086 3409 3586 4269 6587 8650 10165 11241 15624 16728 17814 18392 18667
19859 21132 25339
382 1160 1912 3700 3783 12069 14672 16842 18053 19626 20724 21244 21792
22679 23873 24517
1217 1486 5139 6774 7413 10622 11571 11697 13406 13487 20713 22436
22610 22806 23522 23632
1225 2927 6221 6247 8197 9322 11826 11948 12230 13899 15820 16791 17444
23155 24543 24650
1056 2975 6018 7698 7736 7940 11870 12964 17498 17577 19541 20124 20705
22693 23151 25627
658 790 1559 3683 6060 9059 12347 12990 13095 16317 17801 18816 20050
20979 23584 25472
1133 3343 6895 7146 7261 8340 9115 11248 14543 16030 16291 17972 22369
22479 24388 25280
1907 4021 8277 17631
7807 8063 10076 24958
5455 8638 13801 18832
15525 24030 24978
7854 21083 21197

-continued 8416 15614 24639
9382 13998 24091
1244 19468 24804
5100 14187 21263
12267 18441 22757
185 23294 23412
5136 24218 25509
6159 12323 19472
7490 9770 19813
1457 2204 4186
14200 15609 18700
4544 6337 17759
3697 13810 14537
10853 16611 23001
504 12709 23116
1338 21523 22880
1098 8530 23846
13699 19776 25783
3299 3629 16222
1821 2402 12416
11177 20793 24292
21580 24038 24094
11769 13819 13950
5388 9428 13527
20320 23996 24752
2923 14906 18768
911 10059 17607
1535 3090 22968
3398 8243 12265
9801 10001 20184
11839 15703 16757
1834 13797 14101
4469 11503 14694
4047 8684 23737
15682 21342 21898
7345 8077 22245
4108 20676 24406
8787 19625 22194
8536 15518 20879
3339 15738 19592
2916 13483 23680
3853 12107 18338
16962 21265 25429
10181 18667 25563
2867 21873 23535
8601 19728 23807
4484 17647 22060
6457 17641 23777
17432 18680 20224
3046 14453 19429
807 2064 12639
17630 20286 21847
13703 13720 24044
8382 9588 10339
18818 23311 24714
5397 13213 24988
4077 9348 21707
10628 15352 21292
1075 7625 18287
5771 20506 20926
13545 18180 21566
12022 19203 25134
86 12306 20066
7797 10752 15305
2986 4186 9128
9099 17285 24986
3530 17904 21836
2283 20216 25272
22562 24667 25143
1673 3837 5198
4188 13181 22061
17800 20341 22591
3466 4433 24958
145 7746 23940
4718 15618 19372
2735 11877 13719
3560 6483 10536
4167 7567 8558
4511 5862 16331

-continued

| |
|---|
| 3268 6965 25578 |
| 5552 20627 24489 |
| 1425 2331 4414 |
| 3352 12606 19595 |
| 4653 8383 20029 |
| 9163 22097 24174 |
| 7324 16151 20228 |
| 280 4353 25404 |
| 5173 7657 25604 |
| 6910 13531 22225 |
| 18274 19994 21778. |

10. A reception device, comprising:

a group-wise deinterleaving unit configured to return an arrangement of an LDPC code after group-wise interleaving, wherein the LDPC code is obtained from data transmitted from a transmission device to an original arrangement, and the transmission device includes:

an encoding unit configured to perform LDPC encoding process based on a check matrix of the LDPC code with a code length N of 69120 bits and an encoding rate r of 10/16;

a group-wise interleaving unit configured to perform group-wise interleaving process, wherein in the group-wise interleaving process, the group-wise interleaving unit is further configured to interleave the LDPC code in units of bit groups of 360 bits; and a mapping unit configured to map the LDPC code in any one of 4096 signal points of 1D-non-uniform constellation (NUC) of 4096 QAM in units of 12 bits, in the group-wise interleaving, the group-wise interleaving unit is further configured to:

set (i+1)-th bit group from a lead of the LDPC code as a bit group i, and interleave an arrangement of bit groups 0 to 191 of the 69120-bit LDPC code into an arrangement of a bit group 113, 23, 166, 150, 133, 130, 38, 18, 71, 115, 111, 44, 135, 11, 98, 96, 67, 114, 112, 87, 146, 119, 28, 86, 120, 49, 175, 14, 30, 144, 53, 165, 162, 128, 108, 39, 116, 158, 62, 110, 83, 93, 118, 80, 88, 173, 157, 102, 177, 132, 174, 59, 106, 34, 64, 22, 4, 29, 97, 155, 109, 9, 107, 92, 36, 24, 161, 50, 21, 137, 17, 43, 58, 124, 31, 37, 172, 100, 178, 129, 79, 160, 167, 32, 181, 154, 7, 183, 90, 54, 68, 191, 156, 104, 147, 10, 65, 81, 134, 169, 142, 57, 171, 78, 48, 47, 5, 40, 46, 51, 151, 77, 1, 72, 164, 152, 70, 141, 2, 89, 13, 182, 85, 52, 41, 66, 75, 63, 185, 148, 179, 138, 61, 73, 180, 189, 76, 84, 8, 27, 184, 105, 42, 69, 153, 188, 19, 131, 121, 26, 159, 45, 16, 186, 25, 176, 82, 103, 163, 99, 101, 122, 187, 20, 136, 126, 168, 145, 6, 91, 55, 117, 35, 56, 143, 140, 190, 125, 127, 74, 95, 94, 12, 149, 33, 0, 139, 3, 123, 170, 15, 60, the LDPC code includes information bits and parity bits, the check matrix includes an information matrix portion corresponding to the information bits and a parity matrix portion corresponding to the parity bits, the information matrix portion is represented by a check matrix initial value table, the check matrix initial value table represents positions of elements of 1's of the information matrix portion every 360 columns, and the check matrix initial value table is

| |
|---|
| 200 588 3305 4771 6288 8400 11092 11126 14245 14255 17022 |
| 17190 19241 20350 20451 21069 25243 |
| 80 2914 4126 5426 6129 7790 9546 12909 14660 17357 18278 |
| 19612 21168 22367 23314 24801 24907 |
| 1216 2713 4897 6540 7016 7787 8321 9717 9934 12295 18749 |
| 20344 21386 21682 21735 24205 24825 |
| 6784 8163 8691 8743 10045 10319 10767 11141 11756 12004 |
| 12463 13407 14682 15458 20771 21060 22914 |
| 463 1260 1897 2128 2908 5157 7851 14177 16187 17463 18212 |
| 18221 19212 21864 24198 25318 25450 |
| 794 835 1163 4551 4597 5792 6092 7809 8576 8862 10986 12164 |
| 13053 14459 15978 23829 25072 |
| 144 4258 4342 7326 8165 9627 11432 12552 17582 17621 18145 |
| 19201 19372 19718 21036 25147 25774 |
| 617 2639 2749 2898 3414 4305 4802 6183 8551 9850 13679 20759 |
| 22501 |
| 24244 24331 24631 25587 |
| 1622 2258 4257 6069 10343 10642 11003 12520 13993 17086 18236 |
| 18522 24679 25361 25371 25595 |
| 1826 3926 5021 5905 6192 6839 7678 9136 9188 9716 10986 11191 |
| 12551 14648 16169 16234 |
| 2175 2396 2473 8548 9753 12115 12208 13469 15438 16985 19350 |
| 20424 21357 22819 22830 25671 |
| 265 397 6675 7152 8074 13030 13161 13336 15843 16917 17930 |
| 18014 18660 19218 22236 24940 |
| 5744 6883 7780 7839 8485 10016 10548 12131 12158 16211 16793 |
| 18749 20570 21757 22255 24489 |
| 2082 4768 7025 8803 10237 10932 13885 14266 14370 14982 16411 |
| 18443 18773 19570 21420 23311 |
| 1040 1376 2823 2998 3789 6636 7755 9819 13705 13868 14176 16202 |
| 16247 24943 25196 25489 |
| 223 1967 3289 4541 7420 9881 11086 12868 13550 14760 15434 |
| 18287 19098 20909 22905 25887 |
| 1906 2049 2147 2756 2845 4773 8337 8832 9363 12375 13651 16366 |
| 17546 20486 21624 22664 |
| 1619 1955 2393 3078 3208 3593 5246 8565 10956 11335 11865 |
| 14837 15006 15544 18820 22687 |
| 2086 3409 3586 4269 6587 8650 10165 11241 15624 16728 17814 |
| 18392 18667 19859 21132 25339 |
| 382 1160 1912 3700 3783 12069 14672 16842 18053 19626 20724 |
| 21244 21792 22679 23873 24517 |
| 1217 1486 5139 6774 7413 10622 11571 11697 13406 13487 20713 |
| 22436 22610 22806 23522 23632 |
| 1225 2927 6221 6247 8197 9322 11826 11948 12230 13899 15820 |
| 16791 17444 23155 24543 24650 |
| 1056 2975 6018 7698 7736 7940 11870 12964 17498 17577 19541 |
| 20124 20705 22693 23151 25627 |
| 658 790 1559 3683 6060 9059 12347 12990 13095 16317 17801 |
| 18816 20050 20979 23584 25472 |
| 1133 3343 6895 7146 7261 8340 9115 11248 14543 16030 16291 |
| 17972 22369 22479 24388 25280 |
| 1907 4021 8277 17631 |
| 7807 8063 10076 24958 |
| 5455 8638 13801 18832 |
| 15525 24030 24978 |
| 7854 21083 21197 |
| 8416 15614 24639 |
| 9382 13998 24091 |

1244 19468 24804
5100 14187 21263
12267 18441 22757
185 23294 23412
5136 24218 25509
6159 12323 19472
7490 9770 19813
1457 2204 4186
14200 15609 18700
4544 6337 17759
3697 13810 14537
10853 16611 23001
504 12709 23116
1338 21523 22880
1098 8530 23846
13699 19776 25783
3299 3629 16222
1821 2402 12416
11177 20793 24292
21580 24038 24094
11769 13819 13950
5388 9428 13527
20320 23996 24752
2923 14906 18768
911 10059 17607
1535 3090 22968
3398 8243 12265
9801 10001 20184
11839 15703 16757
1834 13797 14101
4469 11503 14694
4047 8684 23737
15682 21342 21898
7345 8077 22245
4108 20676 24406
8787 19625 22194
8536 15518 20879
3339 15738 19592
2916 13483 23680
3853 12107 18338
16962 21265 25429
10181 18667 25563
2867 21873 23535
8601 19728 23807
4484 17647 22060
6457 17641 23777
17432 18680 20224
3046 14453 19429
807 2064 12639
17630 20286 21847
13703 13720 24044
8382 9588 10339
18818 23311 24714
5397 13213 24988
4077 9348 21707
10628 15352 21292
1075 7625 18287
5771 20506 20926
13545 18180 21566
12022 19203 25134
86 12306 20066
7797 10752 15305
2986 4186 9128
9099 17285 24986
3530 17904 21836
2283 20216 25272
22562 24667 25143
1673 3837 5198
4188 13181 22061
17800 20341 22591
3466 4433 24958
145 7746 23940
4718 15618 19372
2735 11877 13719
3560 6483 10536
4167 7567 8558
4511 5862 16331
3268 6965 25578
5552 20627 24489

1425 2331 4414
3352 12606 19595
4653 8383 20029
9163 22097 24174
7324 16151 20228
280 4353 25404
5173 7657 25604
6910 13531 22225
18274 19994 21778.

11. A transmission method, comprising:

an encoding step of performing LDPC encoding based on a check matrix of an LDPC code with a code length N of 69120 bits and an encoding rate r of 12/16;

a group-wise interleaving step of performing group-wise interleaving of interleaving the LDPC code in units of bit groups of 360 bits; and a mapping step of mapping the LDPC code in one of 4096 signal points of 1D-non-uniform constellation (NUC) of 4096 QAM in units of 12 bits, wherein in the group-wise interleaving, (i+1)-th bit group from a lead of the LDPC code is set as a bit group i, and an arrangement of bit groups 0 to 191 of the 69120-bit LDPC code is interleaved into an arrangement of a bit group 131, 148, 141, 17, 53, 138, 45, 97, 112, 111, 77, 184, 129, 135, 27, 122, 2, 123, 156, 128, 80, 116, 40, 89, 84, 41, 105, 42, 39, 187, 145, 18, 54, 44, 183, 57, 136, 13, 65, 162, 51, 178, 59, 104, 163, 70, 87, 152, 94, 126, 23, 169, 9, 179, 177, 139, 130, 38, 35, 20, 86, 180, 48, 108, 47, 133, 167, 75, 168, 25, 67, 185, 91, 165, 157, 158, 110, 127, 82, 58, 50, 64, 76, 31, 159, 8, 79, 78, 146, 71, 69, 3, 36, 155, 160, 21, 29, 49, 28, 150, 81, 154, 149, 182, 24, 30, 72, 109, 173, 33, 113, 43, 55, 189, 132, 176, 120, 172, 166, 143, 90, 125, 7, 5, 66, 12, 98, 83, 10, 62, 11, 175, 85, 0, 63, 181, 188, 74, 171, 117, 106, 61, 153, 174, 147, 93, 190, 34, 142, 100, 6, 1, 140, 191, 161, 19, 151, 14, 73, 99, 121, 119, 92, 95, 115, 118, 186, 60, 144, 22, 32, 52, 164, 15, 88, 46, 114, 101, 124, 26, 96, 4, 107, 103, 16, 37, 102, 56, 170, 68, 134, 137, the LDPC code includes information bits and parity bits, the check matrix includes an information matrix portion corresponding to the information bits and a parity matrix portion corresponding to the parity bits, the information matrix portion is represented by a check matrix initial value table, the check matrix initial value table represents positions of elements of 1's of the information matrix portion every 360 columns, and the check matrix initial value table is 1507 1536 2244 4721 6374 7839 11001 12684 13196 13602 14245
14383 14398 16182 17248
623 696 1186 1370 4409 5237 5911 8278 9539 12139 12810 13422
15525 16232 16252
530 1953 3745 5512 6676 9069 9433 10683 11530 12263 12519
14931 15326 15581 16208
273 685 3132 5872 6388 7149 7316 7367 9041 11102 11211 12059
15189 15973 16435
814 1297 1896 6018 7801 8810 9701 9992 10314 13618 13771 14934
15198 16340 16742
58 803 2553 3967 6032 8374 9168 10047 10073 10909 12701 12748
13543 14111 17043
1082 1577 2108 2344 5035 5051 10038 10356 12156 12308 13815
15453 15830 16305 17234

-continued 1882 3731 5182 5554 6330 6605 7126 10195 10508 12151 12191
12241 12288 13755 16472
85 604 1278 3768 4831 6820 9471 10773 10873 12785 12973 13623
14562 14697 16811
928 1864 6027 7023 7644 8279 8580 9221 9417 9883 12032 12483
12734 14335 15842
2104 2752 4530 4820 5662 9197 9464 9972 10057 11079 12408
13005 13684 15507 16295
82 752 3374 4026 7265 8112 12236 12434 12460 13110 13495 15110
15299 15359 17221
1137 1411 1546 1614 1835 6053 6151 8618 9059 14057 14941 15670
16321 16965
447 1960 2369 2861 3047 3508 4077 4358 4370 5806 12517 13658
14371 14749
420 981 1657 2313 3353 4699 5094 5184 10076 10530 11521 13040
15960 16853
3572 3851 3870 5218 6400 6780 9167 9603 10328 10543 12892 13722
16910 16929
203 2588 4522 4692 5399 6840 7417 8896 9045 9188 10390 12507
12615 16386
543 1262 2536 4358 7658 7714 9392 11079 12283 12694 14734 16195
16317 16751
905 1059 3393 4347 4554 4758 5568 8652 9991 10717 10975 11146
12824 16373
1229 2308 4876 5329 5424 5906 6227 6667 7141 7697 12055 12969
13582 16638
697 1864 2560 4190 5097 5288 6565 9150 9282 9519 10727 12492
13292
16924
363 3152 3715 3722 4582 5050 8399 9413 9851 10305 12116 13471
15318 16018
338 2342 2404 4733 6189 6792 7251 7921 8509 8579 8729 11921
12900 15546
1630 1867 2018 3038 3202 6364 7648 8692 9496 9705 10433 13508
14583 16341
1041 2754 3015 3427 3512 4351 5174 6539 8100 8639 9912 11911
12666
14187
1134 1619 4758 5545 6842 7045 8421 10373 10390
12672 13484 15178 16697
16727
589 652 1174 2157 3951 4733 5278 5859 7619 9488 11665 12335
15516 16024
1457 1832 2525 3690 5093 6000 6276 7974 8652 9759 10434 15025
15267 16448
932 3328 3349 3511 4776 6266 6711 7761 8674 9748 11167 12134 12942
14354
1939 1979 3141 4238 6715 7148 7673 12025 12455 14829 14989 15081
16491 17242
1363 2451
1953 10230
6218 7655
9302 15856
10461 10503
9005 16075
878 14223 15181
3535 5327 14405
8116 8396 9828
2864 6306 14832
24 11009 16377
7064 11014 16139
4318 8353 14997
583 5626 10217
11196 13669 16585
6123 7518 9304
2258 8250 12082
7564 14195 15236
10104 10233 13778
2044 7801 11705
10906 11443 13227
1592 7853 14796
3054 8887 13077
6486 7003 9238
424 9055 13390
618 4077 11120
11159 13405 16070
2927 8689 17210
723 5842 12062
4817 9269 10820
208 6947 12903

-continued 2987 10116 11520
3522 6321 15637
148 3087 12764
262 1613 14121
7236 10798 11759
3193 4958 11292
7537 12439 15202
8000 9580 17269
9665 9691 15654
5946 14246 16040
4283 8145 10944
1082 1829 11267
1272 6119 13182
20 11943 14128
4591 8403 16530
2212 13724 13933
2079 10365 14633
1269 11307 16370
2467 4744 10714
6256 7915 9724
8799 11433 16880
459 6799 10102
3795 6930 13350
1295 13018 14967
3542 7310 10974
6905 15080 16105
2673 3143 12349
4698 4801 14770
7512 15844 15965
3276 4069 10099
1893 4676 6679
1985 7244 10163
6333 12760 12912
852 5954 11771
6958 9242 10613
5651 10089 12309
4124 7455 13224
503 6787 10720
10594 12717 14007
4501 5311 8067
4507 5620 13932
9133 11025 13866
5021 16201 16217
6166 7438 17185
1324 5671 11586
2266 6335 7716
512 9515 11595
869 6096 13886
10049 12536 14474
470 8286 8306
1268 5478 6424
8178 8817 14506
11460 15128 16761
6364 10121 16806
9347 15211 16915
1587 3591 15546
17 4132 17071
1677 8810 15764
3862 7633 13685
3855 11931 12792
2652 13909 17080
5581 13919 16126
7129 8976 11152
6662 7845 13424
9751 9965 13847
3662 9308 9534
4283 7474 7682
2418 8774 13433
508 3864 6859
12098 13920 15326
1129 3271 16892
5072 8819 10323
4749 4984 6390
212 13603 14893
4966 8895 9320
1012 3677 5711
6654 9969 15178
4596 5147 5905
1541 4149 15594

-continued

| |
|---|
| 8005 8604 15147 |
| 2519 10882 11961 |
| 190 8417 13600 |
| 3543 4639 14618. |

12. A reception device, comprising:

a group-wise deinterleaving unit configured to return an arrangement of an LDPC code after group-wise interleaving, wherein the LDPC code is obtained from data transmitted from a transmission device to an original arrangement, the transmission device includes:

an encoding unit configured to perform LDPC encoding process based on a check matrix of the LDPC code with a code length N of 69120 bits and an encoding rate r of 12/16;

a group-wise interleaving unit configured to perform group-wise interleaving, wherein in the group-wise interleaving process, the group-wise interleaving unit is further configured to interleave the LDPC code in units of bit groups of 360 bits; and a mapping unit configured to map the LDPC code in one of 4096 signal points of 1D-non-uniform constellation (NUC) of 4096 QAM in units of 12 bits, in the group-wise interleaving process, the group-wise interleaving unit is further configured to:

set (i+1)-th bit group from a lead of the LDPC code is set as a bit group i, and interleave an arrangement of bit groups 0 to 191 of the 69120-bit LDPC code into an arrangement of a bit group 131, 148, 141, 17, 53, 138, 45, 97, 112, 111, 77, 184, 129, 135, 27, 122, 2, 123, 156, 128, 80, 116, 40, 89, 84, 41, 105, 42, 39, 187, 145, 18, 54, 44, 183, 57, 136, 13, 65, 162, 51, 178, 59, 104, 163, 70, 87, 152, 94, 126, 23, 169, 9, 179, 177, 139, 130, 38, 35, 20, 86, 180, 48, 108, 47, 133, 167, 75, 168, 25, 67, 185, 91, 165, 157, 158, 110, 127, 82, 58, 50, 64, 76, 31, 159, 8, 79, 78, 146, 71, 69, 3, 36, 155, 160, 21, 29, 49, 28, 150, 81, 154, 149, 182, 24, 30, 72, 109, 173, 33, 113, 43, 55, 189, 132, 176, 120, 172, 166, 143, 90, 125, 7, 5, 66, 12, 98, 83, 10, 62, 11, 175, 85, 0, 63, 181, 188, 74, 171, 117, 106, 61, 153, 174, 147, 93, 190, 34, 142, 100, 6, 1, 140, 191, 161, 19, 151, 14, 73, 99, 121, 119, 92, 95, 115, 118, 186, 60, 144, 22, 32, 52, 164, 15, 88, 46, 114, 101, 124, 26, 96, 4, 107, 103, 16, 37, 102, 56, 170, 68, 134, 137, the LDPC code includes information bits and parity bits, the check matrix includes an information matrix portion corresponding to the information bits and a parity matrix portion corresponding to the parity bits, the information matrix portion is represented by a check matrix initial value table, the check matrix initial value table represents positions of elements of 1's of the information matrix portion every 360 columns, and the check matrix portion is

| |
|---|
| 1507 1536 2244 4721 6374 7839 11001 12684 13196 13602 14245 14383 14398 16182 17248 |
| 623 696 1186 1370 4409 5237 5911 8278 9539 12139 12810 13422 15525 16232 16252 |
| 530 1953 3745 5512 6676 9069 9433 10683 11530 12263 12519 14931 15326 15581 16208 |
| 273 685 3132 5872 6388 7149 7316 7367 9041 11102 11211 12059 15189 15973 16435 |
| 814 1297 1896 6018 7801 8810 9701 9992 10314 13618 13771 14934 15198 16340 16742 |
| 58 803 2553 3967 6032 8374 9168 10047 10073 10909 12701 12748 13543 14111 17043 |
| 1082 1577 2108 2344 5035 5051 10038 10356 12156 12308 13815 15453 15830 16305 17234 |
| 1882 3731 5182 5554 6330 6605 7126 10195 10508 12151 12191 12241 12288 13755 16472 |
| 85 604 1278 3768 4831 6820 9471 10773 10873 12785 12973 13623 14562 14697 16811 |
| 928 1864 6027 7023 7644 8279 8580 9221 9417 9883 12032 12483 12734 14335 15842 |
| 2104 2752 4530 4820 5662 9197 9464 9972 10057 11079 12408 13005 13684 15507 16295 |
| 82 752 3374 4026 7265 8112 12236 12434 12460 13110 13495 15110 15299 15359 17221 |
| 1137 1411 1546 1614 1835 6053 6151 8618 9059 14057 14941 15670 16321 16965 |
| 447 1960 2369 2861 3047 3508 4077 4358 4370 5806 12517 13658 14371 14749 |
| 420 981 1657 2313 3353 4699 5094 5184 10076 10530 11521 13040 15960 16853 |
| 3572 3851 3870 5218 6400 6780 9167 9603 10328 10543 12892 13722 16910 16929 |
| 203 2588 4522 4692 5399 6840 7417 8896 9045 9188 10390 12507 12615 16386 |
| 543 1262 2536 4358 7658 7714 9392 11079 12283 12694 14734 16195 16317 16751 |
| 905 1059 3393 4347 4554 4758 5568 8652 9991 10717 10975 11146 12824 16373 |
| 1229 2308 4876 5329 5424 5906 6227 6667 7141 7697 12055 12969 13582 16638 |
| 697 1864 2560 4190 5097 5288 6565 9150 9282 9519 10727 12492 13292 |
| 16924 |
| 363 3152 3715 3722 4582 5050 8399 9413 9851 10305 12116 13471 15318 16018 |
| 338 2342 2404 4733 6189 6792 7251 7921 8509 8579 8729 11921 12900 15546 |
| 1630 1867 2018 3038 3202 6364 7648 8692 9496 9705 10433 13508 14583 16341 |
| 1041 2754 3015 3427 3512 4351 5174 6539 8100 8639 9912 11911 12666 14187 |
| 1134 1619 4758 5545 6842 7045 8421 10373 10390 12672 13484 15178 16697 16727 |
| 589 652 1174 2157 3951 4733 5278 5859 7619 9488 11665 12335 15516 16024 |
| 1457 1832 2525 3690 5093 6000 6276 7974 8652 9759 10434 15025 15267 16448 |
| 932 3328 3349 3511 4776 6266 6711 7761 8674 9748 11167 12134 12942 14354 |
| 1939 1979 3141 4238 6715 7148 7673 12025 12455 14829 14989 15081 16491 17242 |
| 1363 2451 |
| 1953 10230 |
| 6218 7655 |
| 9302 15856 |
| 10461 10503 |
| 9005 16075 |
| 878 14223 15181 |
| 3535 5327 14405 |
| 8116 8396 9828 |
| 2864 6306 14832 |
| 24 11009 16377 |
| 7064 11014 16139 |
| 4318 8353 14997 |
| 583 5626 10217 |
| 11196 13669 16585 |
| 6123 7518 9304 |
| 2258 8250 12082 |

-continued 7564 14195 15236
10104 10233 13778
2044 7801 11705
10906 11443 13227
1592 7853 14796
3054 8887 13077
6486 7003 9238
424 9055 13390
618 4077 11120
11159 13405 16070
2927 8689 17210
723 5842 12062
4817 9269 10820
208 6947 12903
2987 10116 11520
3522 6321 15637
148 3087 12764
262 1613 14121
7236 10798 11759
3193 4958 11292
7537 12439 15202
8000 9580 17269
9665 9691 15654
5946 14246 16040
4283 8145 10944
1082 1829 11267
1272 6119 13182
20 11943 14128
4591 8403 16530
2212 13724 13933
2079 10365 14633
1269 11307 16370
2467 4744 10714
6256 7915 9724
8799 11433 16880
459 6799 10102
3795 6930 13350
1295 13018 14967
3542 7310 10974
6905 15080 16105
2673 3143 12349
4698 4801 14770
7512 15844 15965
3276 4069 10099
1893 4676 6679
1985 7244 10163
6333 12760 12912
852 5954 11771
6958 9242 10613
5651 10089 12309
4124 7455 13224
503 6787 10720
10594 12717 14007
4501 5311 8067
4507 5620 13932
9133 11025 13866
5021 16201 16217
6166 7438 17185
1324 5671 11586
2266 6335 7716
512 9515 11595
869 6096 13886
10049 12536 14474
470 8286 8306
1268 5478 6424
8178 8817 14506
11460 15128 16761
6364 10121 16806
9347 15211 16915
1587 3591 15546
17 4132 17071
1677 8810 15764
3862 7633 13685
3855 11931 12792
2652 13909 17080
5581 13919 16126
7129 8976 11152
6662 7845 13424
9751 9965 13847

-continued 3662 9308 9534
4283 7474 7682
2418 8774 13433
508 3864 6859
12098 13920 15326
1129 3271 16892
5072 8819 10323
4749 4984 6390
212 13603 14893
4966 8895 9320
1012 3677 5711
6654 9969 15178
4596 5147 5905
1541 4149 15594
8005 8604 15147
2519 10882 11961
190 8417 13600
3543 4639 14618.

13. A transmission method, comprising:

an encoding step of performing LDPC encoding based on a check matrix of an LDPC code with a code length N of 69120 bits and an encoding rate r of 14/16;

a group-wise interleaving step of performing group-wise interleaving of interleaving the LDPC code in units of bit groups of 360 bits; and a mapping step of mapping the LDPC code in one of 4096 signal points of 1D-non-uniform constellation (NUC) of 4096 QAM in units of 12 bits, wherein in the group-wise interleaving, (i+1)-th bit group from a lead of the LDPC code is set as a bit group i, and an arrangement of bit groups 0 to 191 of the 69120-bit LDPC code is interleaved into an arrangement of a bit group 93, 61, 37, 170, 63, 60, 135, 5, 158, 47, 65, 179, 76, 182, 72, 20, 104, 7, 181, 11, 117, 152, 184, 172, 143, 92, 109, 177, 191, 119, 132, 1, 98, 10, 148, 35, 126, 9, 18, 70, 190, 38, 66, 54, 62, 122, 100, 3, 2, 189, 144, 153, 165, 14, 154, 44, 161, 113, 147, 12, 90, 167, 112, 34, 39, 139, 142, 41, 159, 149, 82, 131, 88, 106, 138, 105, 55, 163, 71, 168, 80, 96, 108, 40, 50, 25, 114, 79, 103, 141, 151, 69, 74, 110, 36, 24, 67, 145, 26, 8, 56, 180, 13, 17, 134, 28, 129, 185, 85, 121, 137, 136, 68, 86, 188, 0, 124, 120, 127, 32, 94, 83, 133, 97, 31, 58, 33, 57, 166, 162, 183, 186, 81, 111, 19, 107, 155, 42, 84, 6, 43, 130, 48, 123, 64, 78, 53, 173, 95, 75, 45, 174, 178, 160, 15, 187, 102, 23, 150, 156, 101, 99, 91, 157, 128, 175, 59, 125, 22, 46, 115, 164, 52, 16, 21, 30, 176, 146, 51, 116, 87, 140, 77, 73, 89, 169, 4, 171, 27, 49, 29, 118, the LDPC code includes information bits and parity bits, the check matrix includes an information matrix portion corresponding to the information bits and a parity matrix portion corresponding to the parity bits, the information matrix portion is represented by a check matrix initial value table, the check matrix initial value table represents positions of elements of 1's of the information matrix portion every 360 columns, and the check matrix initial value table is 387 648 945 3023 3889 4856 5002 5167 6868 7477 7590 8165 8354
42 406 1279 1968 3016 4196 4599 4996 5019 6350 6785 7051 8529
534 784 1034 1160 2530 5033 5171 5469 6167 6372 6913 7718 8621
944 2506 2806 3149 3559 5101 6076 6083 6092 6147 6866 7908 8155
308 1869 1888 2569 3297 4742 5232 5442 6135 6814 7284 8238 8405

-continued 34 464 667 899 2421 3425 5382 6258 6373 6399 6489 7367 7922
2276 3014 3525 3829 4135 4276 4611 4733 4738 4956 6025 7152 8155
1047 1370 2406 2819 4600 4991 5017 5590 6199 6483 6556 6834 7760
66 380 2033 3698 4068 6096 6223 6238 6757 7541 7641 7677 8595
562 697 782 808 921 1703 3032 4300 7027 7481 7839 8160 8526
236 962 1557 2023 2135 2190 2892 3072 4523 6254 6838 7209 7381
196 1167 1179 1426 1675 1763 2345 2560 2613 5024 5761 6522 7973
512 822 1778 1924 2610 3445 4570 4805 5263 5299 8439 8448 8464
1923 2270 3204 3698 4456 4522 4601 5161 5207 6260 6310 6441 6851
104 281 622 1276 2172 2334 2731 3417 3854 4698 8095 8195 8333
451 528 1269 2169 2274 2393 3853 5002 5543 6121 6351 7364 8139
1685 2675 2790 2953 3103 3560 4336 5372 5495 5568 6429 6492 8206
604 1190 1279 2427 2714 3283 3312 3855 4566 6045 6664 6788 8317
338 917 1873 2102 2561 2655 4635 4765 5370 6249 6724 7668 8456
184 1166 1583 1859 2376 2521 3093 4181 4713 4926 5146 6070 8004
175 1227 2367 3402 3628 3982 4265 4282 4355 5972 6434 7280 7765
801 922 1029 1531 1606 3170 3824 4358 4732 4849 5225 6759 8183
509 1507 1704 1765 2183 2574 3271 4050 4299 4964 5968 6324 7091
567 795 1376 2390 2767 3424 5195 6355 6726 7607 8346 8352
308 1060 1973 2364 2937 3526 4221 4745 5185 5845 6146 7762
323 590 732 917 2636 3008 3792 3990 4322 4893 5211 8014
471 1249 1674 1841 2567 3124 3130 4885 5575 7521 7648 8227
1582 1669 1772 2386 3340 3387 3881 4322 6018 6055 6488 7177
976 1003 2127 3575 3816 6225 7404 7499 7542 8237 8421 8630
675 961 1957 3825 3858 4646 5248 5801 5940 6533 7040 8037
79 639 1363 1436 1763 2570 3874 4876 6870 6886 7104 8399
20 297 1330 2264 3287 3534 4441 4746 6569 6971 6976 8179
482 1125 1589 2892 3759 3871 4635 6038 6214 6796 6816 7621
1127 3336 3867 3929 4269 4794 5054 5842 6471 6547 7039 8560
217 1521
1983 8283
3731 4402
208 6703
242 4988
4170 5038
4108 8035
3301 8543
3168 8249
5028 5838
3470 8597
2901 5264
2505 4505
934 5117
1712 5819
3165 7273
3274 6115
4576 6330 7327
5380 6732 8439
2474 3723 7782
384 2783 5846
1453 4436 6625
3220 4261 4835
163 3117 7554
502 2119 4059
2200 4263 4930
2378 6294 7713
743 5501 6809
1364 6062 7808
4680 6468 7895
3469 3602 7304
1609 5386 5647
267 2921 3206
2565 3020 6269
1651 5224 5718
1128 5058 8579
286 3396 7660
1497 5171 6519
1894 6349 7924
1306 7744 8083
3096 3438 3836
2556 7409 8570
3273 4245 7935
1633 2023 3125
584 4914 6062
2015 2915 3435
1457 6366 6461
23 3576 8132
5322 6300 6520
5715 7113 7822

-continued 2044 5053 6607
63 5432 7850
5353 6355 8637
346 590 2648
4780 5997 6991
2556 2583 6537
661 2497 8350
7610 8307 8441
671 860 5986
1133 3158 5891
4360 5802 6547
4782 5688 6955
447 5030 6268
1501 5163 7232
1133 2743 3214
959 4100 7554
5712 7643 8385
1442 3180 8008
697 3078 8421
137 922 5123
597 2879 6340
824 2071 7882
1827 4411 5941
3846 5970 6398
1561 1580 7668
4335 6936 8042
4504 5309 6737
1846 3273 3333
272 4885 6718
1835 4761 6931
2141 3760 5129
3975 5012 6504
1258 2822 6030
242 4947 7668
559 6100 8425
1655 1962 4401
2369 2476 2765
114 156 3195
1651 4154 4448
4669 6064 7317
4988 5567 6697
2963 5578 5679
2064 2286 7790
289 4639 7582
1258 4312 5340
2428 4219 7268
1752 2321 6806
118 7302 8603
4170 4280 4445
2207 5067 7257
2 55 7413
1141 4791 7149
3407 5649 8075
2773 3198 3720
6970 7222 8633
2498 4764 5281
1048 2093 5031
2500 2851 8396
1694 3795 6666
2565 3343 4688
4228 4374 5947
2267 6745 7172
175 2662 3926
90 1517 6056
4069 5439 7648
1679 3394 4707
2136 4553 8265
482 2100 2302
3306 3729 8063
5263 7710 8240
1001 1335 4500
576 6736 7250
181 3601 3755
5899 7515 7714
1181 5332 7197
542 1150 1196
1386 2156 5873
656 3019 3213
263 1117 5957

-continued

| |
|---|
| 4495 5904 6462 |
| 2547 2786 4215 |
| 4954 5848 6225 |
| 940 4478 7633 |
| 2124 3347 7069. |

14. A reception device, comprising:

a group-wise deinterleaving unit configured to return that returns an arrangement of an LDPC code after group-wise interleaving, wherein the LDPC code is obtained from data transmitted from a transmission device to an original arrangement, and the transmission device includes:

an encoding unit configured to perform LDPC encoding process based on a check matrix of the LDPC code with a code length N of 69120 bits and an encoding rate r of 14/16;

a group-wise interleaving unit configured to perform group-wise interleaving process, wherein in the group-wise interleaving process, the group-wise interleaving unit is further configured to interleave the LDPC code in units of bit groups of 360 bits; and a mapping unit configured to map that maps the LDPC code in any one of 4096 signal points of 1D-non-uniform constellation (NUC) of 4096 QAM in units of 12 bits, in the group-wise interleaving process, the group-wise interleaving unit is further configured to:

set (i+1)-th bit group from a lead of the LDPC code is set as a bit group i, and interleave an arrangement of bit groups 0 to 191 of the 69120-bit LDPC code is into an arrangement of a bit group 93, 61, 37, 170, 63, 60, 135, 5, 158, 47, 65, 179, 76, 182, 72, 20, 104, 7, 181, 11, 117, 152, 184, 172, 143, 92, 109, 177, 191, 119, 132, 1, 98, 10, 148, 35, 126, 9, 18, 70, 190, 38, 66, 54, 62, 122, 100, 3, 2, 189, 144, 153, 165, 14, 154, 44, 161, 113, 147, 12, 90, 167, 112, 34, 39, 139, 142, 41, 159, 149, 82, 131, 88, 106, 138, 105, 55, 163, 71, 168, 80, 96, 108, 40, 50, 25, 114, 79, 103, 141, 151, 69, 74, 110, 36, 24, 67, 145, 26, 8, 56, 180, 13, 17, 134, 28, 129, 185, 85, 121, 137, 136, 68, 86, 188, 0, 124, 120, 127, 32, 94, 83, 133, 97, 31, 58, 33, 57, 166, 162, 183, 186, 81, 111, 19, 107, 155, 42, 84, 6, 43, 130, 48, 123, 64, 78, 53, 173, 95, 75, 45, 174, 178, 160, 15, 187, 102, 23, 150, 156, 101, 99, 91, 157, 128, 175, 59, 125, 22, 46, 115, 164, 52, 16, 21, 30, 176, 146, 51, 116, 87, 140, 77, 73, 89, 169, 4, 171, 27, 49, 29, 118, the LDPC code includes information bits and parity bits, the check matrix includes an information matrix portion corresponding to the information bits and a parity matrix portion corresponding to the parity bits, the information matrix portion is represented by a check matrix initial value table, the check matrix initial value table represents positions of elements of 1's of the information matrix portion every 360 columns, and the check matrix value table is

| |
|---|
| 387 648 945 3023 3889 4856 5002 5167 6868 7477 7590 8165 8354 |
| 42 406 1279 1968 3016 4196 4599 4996 5019 6350 6785 7051 8529 |
| 534 784 1034 1160 2530 5033 5171 5469 6167 6372 6913 7718 8621 |
| 944 2506 2806 3149 3559 5101 6076 6083 6092 6147 6866 7908 8155 |
| 308 1869 1888 2569 3297 4742 5232 5442 6135 6814 7284 8238 8405 |
| 34 464 667 899 2421 3425 5382 6258 6373 6399 6489 7367 7922 |
| 2276 3014 3525 3829 4135 4276 4611 4733 4738 4956 6025 7152 8155 |
| 1047 1370 2406 2819 4600 4991 5017 5590 6199 6483 6556 6834 7760 |
| 66 380 2033 3698 4068 6096 6223 6238 6757 7541 7641 7677 8595 |
| 562 697 782 808 921 1703 3032 4300 7027 7481 7839 8160 8526 |
| 236 962 1557 2023 2135 2190 2892 3072 4523 6254 6838 7209 7381 |
| 196 1167 1179 1426 1675 1763 2345 2560 2613 5024 5761 6522 7973 |
| 512 822 1778 1924 2610 3445 4570 4805 5263 5299 8439 8448 8464 |
| 1923 2270 3204 3698 4456 4522 4601 5161 5207 6260 6310 6441 6851 |
| 104 281 622 1276 2172 2334 2731 3417 3854 4698 8095 8195 8333 |
| 451 528 1269 2169 2274 2393 3853 5002 5543 6121 6351 7364 8139 |
| 1685 2675 2790 2953 3103 3560 4336 5372 5495 5568 6429 6492 8206 |
| 604 1190 1279 2427 2714 3283 3312 3855 4566 6045 6664 6788 8317 |
| 338 917 1873 2102 2561 2655 4635 4765 5370 6249 6724 7668 8456 |
| 184 1166 1583 1859 2376 2521 3093 4181 4713 4926 5146 6070 8004 |
| 175 1227 2367 3402 3628 3982 4265 4282 4355 5972 6434 7280 7765 |
| 801 922 1029 1531 1606 3170 3824 4358 4732 4849 5225 6759 8183 |
| 509 1507 1704 1765 2183 2574 3271 4050 4299 4964 5968 6324 7091 |
| 567 795 1376 2390 2767 3424 5195 6355 6726 7607 8346 8352 |
| 308 1060 1973 2364 2937 3526 4221 4745 5185 5845 6146 7762 |
| 323 590 732 917 2636 3008 3792 3990 4322 4893 5211 8014 |
| 471 1249 1674 1841 2567 3124 3130 4885 5575 7521 7648 8227 |
| 1582 1669 1772 2386 3340 3387 3881 4322 6018 6055 6488 7177 |
| 976 1003 2127 3575 3816 6225 7404 7499 7542 8237 8421 8630 |
| 675 961 1957 3825 3858 4646 5248 5801 5940 6533 7040 8037 |
| 79 639 1363 1436 1763 2570 3874 4876 6870 6886 7104 8399 |
| 20 297 1330 2264 3287 3534 4441 4746 6569 6971 6976 8179 |
| 482 1125 1589 2892 3759 3871 4635 6038 6214 6796 6816 7621 |
| 1127 3336 3867 3929 4269 4794 5054 5842 6471 6547 7039 8560 |
| 217 1521 |
| 1983 8283 |
| 3731 4402 |
| 208 6703 |
| 242 4988 |
| 4170 5038 |
| 4108 8035 |
| 3301 8543 |
| 3168 8249 |
| 5028 5838 |
| 3470 8597 |
| 2901 5264 |
| 2505 4505 |
| 934 5117 |
| 1712 5819 |
| 3165 7273 |
| 3274 6115 |
| 4576 6330 7327 |
| 5380 6732 8439 |
| 2474 3723 7782 |
| 384 2783 5846 |
| 1453 4436 6625 |
| 3220 4261 4835 |
| 163 3117 7554 |
| 502 2119 4059 |
| 2200 4263 4930 |
| 2378 6294 7713 |
| 743 5501 6809 |
| 1364 6062 7808 |
| 4680 6468 7895 |
| 3469 3602 7304 |
| 1609 5386 5647 |
| 267 2921 3206 |
| 2565 3020 6269 |
| 1651 5224 5718 |
| 1128 5058 8579 |
| 286 3396 7660 |
| 1497 5171 6519 |
| 1894 6349 7924 |
| 1306 7744 8083 |
| 3096 3438 3836 |
| 2556 7409 8570 |
| 3273 4245 7935 |
| 1633 2023 3125 |

-continued

| | | | |
|---|---|---|---|
| 584 | 4914 | 6062 | |
| 2015 | 2915 | 3435 | |
| 1457 | 6366 | 6461 | |
| 23 | 3576 | 8132 | |
| 5322 | 6300 | 6520 | |
| 5715 | 7113 | 7822 | |
| 2044 | 5053 | 6607 | |
| 63 | 5432 | 7850 | |
| 5353 | 6355 | 8637 | |
| 346 | 590 | 2648 | |
| 4780 | 5997 | 6991 | |
| 2556 | 2583 | 6537 | |
| 661 | 2497 | 8350 | |
| 7610 | 8307 | 8441 | |
| 671 | 860 | 5986 | |
| 1133 | 3158 | 5891 | |
| 4360 | 5802 | 6547 | |
| 4782 | 5688 | 6955 | |
| 447 | 5030 | 6268 | |
| 1501 | 5163 | 7232 | |
| 1133 | 2743 | 3214 | |
| 959 | 4100 | 7554 | |
| 5712 | 7643 | 8385 | |
| 1442 | 3180 | 8008 | |
| 697 | 3078 | 8421 | |
| 137 | 922 | 5123 | |
| 597 | 2879 | 6340 | |
| 824 | 2071 | 7882 | |
| 1827 | 4411 | 5941 | |
| 3846 | 5970 | 6398 | |
| 1561 | 1580 | 7668 | |
| 4335 | 6936 | 8042 | |
| 4504 | 5309 | 6737 | |
| 1846 | 3273 | 3333 | |
| 272 | 4885 | 6718 | |
| 1835 | 4761 | 6931 | |
| 2141 | 3760 | 5129 | |
| 3975 | 5012 | 6504 | |
| 1258 | 2822 | 6030 | |
| 242 | 4947 | 7668 | |
| 559 | 6100 | 8425 | |
| 1655 | 1962 | 4401 | |
| 2369 | 2476 | 2765 | |
| 114 | 156 | 3195 | |
| 1651 | 4154 | 4448 | |
| 4669 | 6064 | 7317 | |

-continued

| | | |
|---|---|---|
| 4988 | 5567 | 6697 |
| 2963 | 5578 | 5679 |
| 2064 | 2286 | 7790 |
| 289 | 4639 | 7582 |
| 1258 | 4312 | 5340 |
| 2428 | 4219 | 7268 |
| 1752 | 2321 | 6806 |
| 118 | 7302 | 8603 |
| 4170 | 4280 | 4445 |
| 2207 | 5067 | 7257 |
| 2 | 55 | 7413 |
| 1141 | 4791 | 7149 |
| 3407 | 5649 | 8075 |
| 2773 | 3198 | 3720 |
| 6970 | 7222 | 8633 |
| 2498 | 4764 | 5281 |
| 1048 | 2093 | 5031 |
| 2500 | 2851 | 8396 |
| 1694 | 3795 | 6666 |
| 2565 | 3343 | 4688 |
| 4228 | 4374 | 5947 |
| 2267 | 6745 | 7172 |
| 175 | 2662 | 3926 |
| 90 | 1517 | 6056 |
| 4069 | 5439 | 7648 |
| 1679 | 3394 | 4707 |
| 2136 | 4553 | 8265 |
| 482 | 2100 | 2302 |
| 3306 | 3729 | 8063 |
| 5263 | 7710 | 8240 |
| 1001 | 1335 | 4500 |
| 576 | 6736 | 7250 |
| 181 | 3601 | 3755 |
| 5899 | 7515 | 7714 |
| 1181 | 5332 | 7197 |
| 542 | 1150 | 1196 |
| 1386 | 2156 | 5873 |
| 656 | 3019 | 3213 |
| 263 | 1117 | 5957 |
| 4495 | 5904 | 6462 |
| 2547 | 2786 | 4215 |
| 4954 | 5848 | 6225 |
| 940 | 4478 | 7633 |
| 2124 | 3347 | 7069. |

* * * * *